US012047761B2

United States Patent
Bok et al.

(10) Patent No.: US 12,047,761 B2
(45) Date of Patent: Jul. 23, 2024

(54) DISPLAY DEVICE

(71) Applicant: Samsung Display Co., LTD., Yongin-si (KR)

(72) Inventors: Seung Lyong Bok, Hwaseong-si (KR); Jong In Baek, Hwaseong-si (KR); Young Seok Seo, Seoul (KR); Sun Mi Yu, Seoul (KR); Jong Hyun Lee, Suwon-si (KR); Jin Oh Kwag, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/084,288

(22) Filed: Dec. 19, 2022

(65) Prior Publication Data

US 2023/0120673 A1 Apr. 20, 2023

Related U.S. Application Data

(62) Division of application No. 17/138,090, filed on Dec. 30, 2020, now Pat. No. 11,543,904.

(30) Foreign Application Priority Data

Dec. 31, 2019 (KR) ........................ 10-2019-0179953

(51) Int. Cl.
*G09G 5/00* (2006.01)
*G06F 3/041* (2006.01)
(Continued)

(52) U.S. Cl.
CPC ............. *H04R 7/04* (2013.01); *G06F 3/0412* (2013.01); *G06F 3/0443* (2019.05); *G06F 3/046* (2013.01);
(Continued)

(58) Field of Classification Search
CPC ...... G06F 3/0412; G06F 3/0443; G06F 3/046; G06F 3/045; G06F 2203/04105;
(Continued)

(56) References Cited

U.S. PATENT DOCUMENTS 6,891,962 B1 * 5/2005 Kuno ................ G06V 40/1324 359/837
2007/0211036 A1 9/2007 Perkins
(Continued)

FOREIGN PATENT DOCUMENTS

CN 107480639 12/2017
CN 109144319 1/2019
(Continued)

*Primary Examiner* — Jennifer T Nguyen
(74) *Attorney, Agent, or Firm* — KILE PARK REED & HOUTTEMAN PLLC

(57) ABSTRACT

A display device includes a thin-film transistor layer disposed on a substrate and including thin-film transistors; and an emission material layer disposed on the thin-film transistor layer. The emission material layer includes light-emitting elements each including a first light-emitting electrode, an emissive layer and a second light-emitting electrode, light-receiving elements each including a first light-receiving electrode, a light-receiving semiconductor layer and a second light-receiving electrode, and a first bank disposed on the first light-emitting electrode and defining an emission area of each of the light-emitting elements. The light-receiving elements are disposed on the first bank.

19 Claims, 188 Drawing Sheets

(51) Int. Cl.

| | |
|---|---|
| ***G06F 3/044*** | (2006.01) |
| ***G06F 3/046*** | (2006.01) |
| ***G06V 10/10*** | (2022.01) |
| ***G06V 40/13*** | (2022.01) |
| ***H01L 27/12*** | (2006.01) |
| ***H01L 31/105*** | (2006.01) |
| ***H01L 31/12*** | (2006.01) |
| ***H04R 7/04*** | (2006.01) |
| ***H10K 50/80*** | (2023.01) |
| ***H10K 50/844*** | (2023.01) |
| ***H10K 50/856*** | (2023.01) |
| ***H10K 59/122*** | (2023.01) |
| ***H10K 59/65*** | (2023.01) |
| *G06F 3/045* | (2006.01) |
| *H04R 1/02* | (2006.01) |

(52) U.S. Cl.

CPC .......... *G06V 10/17* (2022.01); *G06V 40/1306* (2022.01); *G06V 40/1318* (2022.01); *H01L 27/1214* (2013.01); *H01L 31/1055* (2013.01); *H01L 31/12* (2013.01); *H10K 50/844* (2023.02); *H10K 50/856* (2023.02); *H10K 50/868* (2023.02); *H10K 59/122* (2023.02); *H10K 59/65* (2023.02); *G06F 3/045* (2013.01); *G06F 2203/04105* (2013.01); *G06F 2203/04107* (2013.01); *H04R 1/025* (2013.01); *H04R 2499/15* (2013.01)

(58) Field of Classification Search

CPC ...... G06F 2203/04107; G06V 40/1306; G06V 40/1318; H01L 27/1214; H01L 27/3234; H01L 27/3246; H01L 31/1055; H01L 31/12; H01L 51/5253; H01L 51/5271; H01L 51/5293; H04R 1/025; H04R 2499/15

USPC .......................................................... 345/174

See application file for complete search history.

(56) References Cited

U.S. PATENT DOCUMENTS

| | | | | |
|---|---|---|---|---|
| 2008/0225254 | A1* | 9/2008 | Komine | G03F 9/7076 430/5 |
| 2016/0211307 | A1 | 6/2016 | Kim et al. | |
| 2017/0315657 | A1* | 11/2017 | Lai | G06F 3/04164 |
| 2019/0013368 | A1 | 1/2019 | Chung et al. | |
| 2019/0123112 | A1 | 4/2019 | Lee et al. | |
| 2019/0252456 | A1 | 8/2019 | Li et al. | |
| 2019/0303640 | A1* | 10/2019 | Song | G06V 40/1318 |
| 2019/0348482 | A1 | 11/2019 | Bae et al. | |
| 2020/0143134 | A1* | 5/2020 | Wang | H04M 1/026 |
| 2020/0403168 | A1* | 12/2020 | Li | H10K 77/10 |
| 2021/0020810 | A1* | 1/2021 | Lius | H01L 33/483 |
| 2021/0072588 | A1* | 3/2021 | Tang | G02F 1/133308 |
| 2021/0141487 | A1 | 5/2021 | Huang | |
| 2022/0004734 | A1* | 1/2022 | Chen | G06V 40/1318 |

FOREIGN PATENT DOCUMENTS

| | | |
|---|---|---|
| CN | 109255278 | 1/2019 |
| CN | 109585513 | 4/2019 |
| JP | 5643173 | 12/2014 |
| JP | 6126184 | 5/2017 |
| KR | 10-0771258 | 10/2007 |
| KR | 10-2015-0131944 | 11/2015 |
| KR | 10-1904471 | 10/2018 |

* cited by examiner

340 : 1341,1342,1343,1344

DISPLAY DEVICE

CROSS REFERENCE TO RELATED APPLICATION(S)

This is a divisional application of U.S. patent application Ser. No. 17/138,090, filed Dec. 30, 2020 (now pending), the disclosure of which is incorporated herein by reference in its entirety. U.S. patent application Ser. No. 17/138,090 claims priority to and benefits of Korean Patent Application No. 10-2019-0179953 under 35 U.S.C. § 119, filed on Dec. 31, 2019 in the Korean Intellectual Property Office, the entire contents of which are incorporated herein by reference.

BACKGROUND

1. Technical Field

The disclosure relates to a display device.

2. Description of the Related Art

Demands for display devices are ever increasing with the evolution of information-oriented societies. For example, display devices are being employed by a variety of electronic devices such as smart phones, digital cameras, laptop computers, navigation devices, and smart televisions.

A display device may include a display panel for displaying images, an optical sensor for detecting light, an ultrasonic sensor for detecting ultrasonic waves, a fingerprint sensor for detecting a fingerprint, for example. As display devices are employed by various electronic devices, display devices may be required to have various designs. For example, there is a demand for a display device having a wider display area for displaying images by removing sensor devices such as an optical sensor, an ultrasonic sensor and a fingerprint sensor from the display device.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments may provide a display device having a larger display area where images may be displayed by way of incorporating sensor devices into a display panel, such as an optical sensor that detects light, a capacitive fingerprint sensor that recognizes fingerprints, and an ultrasonic sensor that detects ultrasonic waves.

Additional features of embodiments will be set forth in the description which follows, and in part may be apparent from the description, or may be learned by practice of an embodiment herein.

According to an embodiment, a display device may include a thin-film transistor layer disposed on a substrate and comprising thin-film transistors; and an emission material layer disposed on the thin-film transistor layer. The emission material layer may include light-emitting elements each including a first light-emitting electrode, an emissive layer, and a second light-emitting electrode; light-receiving elements each including a first light-receiving electrode, a light-receiving semiconductor layer, and a second light-receiving electrode; and a first bank disposed on the first light-emitting electrode and defining an emission area of each of the light-emitting elements. The light-receiving elements may be disposed on the first bank.

The emission material layer may further include a second bank disposed on the first bank; and a third bank disposed on the light-receiving elements.

The first light-receiving electrode may be disposed on the first bank, the light-receiving semiconductor layer may be disposed on the first light-receiving electrode, and the second light-receiving electrode may be disposed on the light-receiving semiconductor layer and the second bank.

The emission material layer may include a light-receiving connection electrode, the light-receiving connection electrode and the first light-emitting electrode being disposed on a same layer and including a same material, and the second light-receiving electrode may be electrically connected to the light-receiving connection electrode through a contact hole that may penetrate the first bank and the second bank and may expose the light-receiving connection electrode.

The emissive layer may be disposed on the first light-emitting electrode, and the second light-emitting electrode may be disposed on the emissive layer and the third bank.

The light-receiving semiconductor layer may include an n-type semiconductor layer electrically connected to the first light-receiving electrode; a p-type semiconductor layer electrically connected to the second light-receiving electrode; and an i-type semiconductor layer disposed between the first light-receiving electrode and the second light-receiving electrode in a thickness direction of the substrate.

Each of the i-type semiconductor layer and the n-type semiconductor layer may include amorphous silicon carbide (a-SiC) or amorphous silicon germanium (a-SiGe), and the p-type semiconductor layer may include amorphous silicon (a-Si).

At least one of the first light-receiving electrode, the p-type semiconductor layer, the i-type semiconductor layer, the n-type semiconductor layer and the second light-receiving electrode may include an uneven surface.

The light-receiving semiconductor layer may include an i-type semiconductor layer electrically connected to the first light-receiving electrode; and a p-type semiconductor layer electrically connected to the second light-receiving electrode.

The i-type semiconductor layer may include amorphous silicon carbide (a-SiC) or amorphous silicon germanium (a-SiGe), and the p-type semiconductor layer may include amorphous silicon (a-Si).

The first light-emitting electrode may not overlap the first light-receiving electrode, the light-receiving semiconductor layer, and the second light-receiving electrode in a thickness direction of the substrate.

The second light-emitting electrode may overlap the first light-receiving electrode, the light-receiving semiconductor layer, and the second light-receiving electrode in a thickness direction of the substrate.

The first light-emitting electrode and the first light-receiving electrode may include an opaque conductive material, and the first light-receiving electrode and the second light-receiving electrode may include a transparent conductive material.

The first light-emitting electrode, the second light-emitting electrode, the first light-receiving electrode, and the second light-receiving electrode may include a transparent conductive material.

The emission material layer may include a reflective electrode disposed on the second light-emitting electrode and in the emission area, the reflective electrode may include an opaque material.

The emission material layer may include a transmissive area that may not overlap the emission area of each of the light-emitting elements in a thickness direction of the substrate.

A light-receiving area of each of the light-receiving elements may be located in the transmissive area.

An encapsulation layer may be disposed on the emission material layer; and a reflective layer may be disposed on the encapsulation layer and may not overlap the emission area of each of the light-emitting elements and a light-receiving area of each of the light-receiving elements in a thickness direction of the substrate.

An encapsulation layer may be disposed on the emission material layer; and a reflective layer may be disposed on the encapsulation layer and may not overlap the emission area of each of the light-emitting elements, wherein the reflective layer may overlap a light-receiving area of each of the light-receiving elements in a thickness direction of the substrate.

The reflective layer may include a first reflective layer not overlapping the light-receiving area of each of the light-receiving elements in the thickness direction of the substrate; and a second reflective layer overlapping the light-receiving area of each of the light-receiving elements in the thickness direction of the substrate.

A thickness of the first reflective layer may be larger than a thickness of the second reflective layer.

The display device may further include an encapsulation layer disposed on the emission material layer; and a sensor electrode layer disposed on the encapsulation layer and including sensor electrodes.

The sensor electrode layer may include a light-blocking electrode disposed on the encapsulation layer; a first sensor insulating layer disposed on the light-blocking electrode; and a second sensor insulating layer disposed on the sensor electrodes that may be disposed on the first sensor insulating layer.

The display device may further include a polarizing film disposed on the sensor electrode layer; and a cover window disposed on the polarizing film, wherein the polarizing film may include a light-transmitting area overlapping the light-receiving elements in a thickness direction of the substrate.

The substrate may be bent with a predetermined curvature.

The display device may further include a first roller that may roll the substrate; a housing in which the first roller may be accommodated; and a transmission window overlapping the first roller in a thickness direction of the substrate.

The substrate may be rolled around the first roller and the light-receiving elements may overlap the transmission window in the thickness direction of the substrate.

According to an embodiment, a display device may include a thin-film transistor layer including thin-film transistors disposed on a substrate; and an emission material layer disposed on the thin-film transistor layer and including light-emitting elements. The thin-film transistor layer may include an active layer of the thin-film transistors; a gate insulating layer disposed on the active layer; a gate electrode of the thin-film transistors disposed on the gate insulating layer; a first interlayer dielectric layer disposed on the gate electrode; and light-receiving elements disposed on the first interlayer dielectric layer.

The thin-film transistor layer may include a second interlayer dielectric layer disposed on the first interlayer dielectric layer; and a source electrode and a drain electrode of each of the thin-film transistors disposed on the second interlayer dielectric layer. Each of the light-receiving elements may include a first light-receiving electrode disposed on the first interlayer dielectric layer; a light-receiving semiconductor layer disposed on the first light-receiving electrode; and a second light-receiving electrode disposed on the light-receiving semiconductor layer.

The light-receiving semiconductor layer may include an n-type semiconductor layer electrically connected to the first light-receiving electrode; a p-type semiconductor layer electrically connected to the second light-receiving electrode; and an i-type semiconductor layer disposed between the first light-receiving electrode and the second light-receiving electrode in a thickness direction of the substrate.

Each of the active layer and the gate electrode may overlap the first light-receiving electrode, the light-receiving semiconductor layer, and the second light-receiving electrode in the thickness direction of the substrate.

One of the source electrode and the drain electrode may be electrically connected to the second light-receiving electrode through a contact hole that may penetrate the second interlayer dielectric layer and may expose the second light-receiving electrode.

The display device may further include a second interlayer dielectric layer disposed on the first interlayer dielectric layer, wherein the light-receiving element may be disposed on the second interlayer dielectric layer.

The thin-film transistor layer may include a second interlayer dielectric layer disposed on the first interlayer dielectric layer; and a source electrode and a drain electrode of each of the thin-film transistors disposed on the second interlayer dielectric layer, wherein each of the light-receiving elements may include a light-receiving gate electrode disposed on the first interlayer dielectric layer; a light-receiving semiconductor layer disposed on the second interlayer dielectric layer; and a light-receiving source electrode and a light-receiving drain electrode disposed on the light-receiving semiconductor layer.

The light-receiving semiconductor layer may include an oxide semiconductor material.

Each of the active layer and the gate electrode may overlap the light-receiving gate electrode and the light-receiving semiconductor layer in a thickness direction of the substrate.

According to an embodiment, a display device may include a display panel including a substrate and a display layer disposed on a surface of the substrate; and an optical sensor disposed on another surface of the substrate. The display layer may include a first pin hole transmitting light. The optical sensor may include a light-receiving area overlapping the first pin hole in a thickness direction of the substrate.

The display layer may include a light-blocking layer disposed on the substrate; a buffer layer disposed on the light-blocking layer; an active layer of a thin-film transistor disposed on the buffer layer and overlapping the light-blocking layer of the thin-film transistor in a thickness direction of the substrate; a gate insulating layer disposed on the active layer; a gate electrode of the thin-film transistor disposed on the gate insulating layer; an interlayer dielectric layer disposed on the gate electrode; and a source electrode and a drain electrode of the thin-film transistor disposed on the interlayer dielectric layer, wherein at least one of the light-blocking layer, the gate electrode, the source electrode and the drain electrode may form the first pin hole.

The display layer may further include a pressure sensing electrode including a second pin hole overlapping the first pin hole in the thickness direction of the substrate.

An area of the second pin hole may be larger than an area of the first pin hole.

The pressure sensing electrode and the light-blocking layer may be disposed on a same layer and may include a same material.

The display device may further include a pressure sensing unit that may detect a change in resistance or capacitance of the pressure sensing electrode upon an application of pressure upon the pressure sensing electrode.

The display layer may further include alignment patterns that do not overlap the optical sensor in the thickness direction of the substrate.

The display layer may further include a light-blocking pattern disposed between two adjacent alignment patterns.

The display layer may further include inspection patterns arranged alongside each other in a direction.

The alignment patterns, the light-blocking pattern, and the inspection patterns, and the light-blocking layer may be disposed on a same layer and may include a same material.

A side of the optical sensor may be inclined by an acute angle with respect to a direction in which a side of the substrate may be extended.

The display device may further include a transparent adhesive layer that attaches the optical sensor to the another surface of the substrate.

The light-blocking layer may form the first pin hole.

The display device may further include a light-blocking adhesive layer attached to the another surface of the substrate, the light-blocking adhesive layer being disposed on an edge of the transparent adhesive layer, wherein the light-blocking adhesive layer may not overlap the optical sensor in the thickness direction of the substrate.

The display device may further include a light-blocking resin disposed on the light-blocking adhesive layer.

The display device may further include a panel bottom cover disposed on the another surface of the substrate and including a cover hole where the optical sensor is disposed; and a sensor circuit board disposed on a lower surface of the optical sensor.

The sensor circuit board may overlap the cover hole.

The display device may further include a pin hole array disposed between the substrate and the optical sensor and including an opening overlapping the first pin hole in the thickness direction of the substrate.

The display device may further include a cover window disposed on the display layer; and a light source disposed below an edge of the cover window and irradiating light onto the cover window.

A side surface of the cover window may have a rounded predetermined curvature.

A lower surface of the cover window may include a light path conversion pattern that may overlap the light source in the thickness direction of the substrate and may convert a path of light output from the light source.

The display device may further include a digitizer layer disposed between the substrate and the optical sensor, wherein the digitizer layer may include a base film; first electrodes disposed on a surface of the base film; and second electrodes disposed on an opposite surface of the base film, and the first pin hole may not overlap the first electrodes and the second electrodes in the thickness direction of the substrate.

According to an embodiment, a display device may include a display panel including a display area and a sensor area; and a first optical sensor disposed on a surface of the display panel, wherein the first optical sensor may overlap the sensor area in a thickness direction of the display panel. Each of the display area and the sensor area may include emission areas. A number of the emission areas per unit area in the display area may be greater than a number of display pixels per unit area in the sensor area.

The sensor area of the display panel may include a transmissive area where the display pixels are not disposed.

The sensor area may include transparent emission areas that may transmit and emit light, and an area of each of the emission areas may be larger than an area of each of the transparent emission areas.

The sensor area of the display panel may include an optical sensor area overlapping the first optical sensor in the thickness direction of the display panel; and a light compensation area around the optical sensor area, and the display device may further include a light compensation device overlapping the light compensation area in the thickness direction of the display panel.

The light compensation device may include a light-emitting circuit board; and a light-emitting device disposed on the light-emitting circuit board and may surround the first optical sensor.

The light source may include a first light source emitting light of a first color; a second light source emitting light of a second color; and a third light source emitting light of a third color.

The light compensation device may further include a light guide member disposed on the light sources.

The display device may further include a light-blocking resin disposed on an opposite surface of the light-emitting circuit board.

The display device may further include a light compensation device disposed on a surface of the display panel and emitting light, wherein the first optical sensor and the light compensation device may be disposed alongside each other in a direction.

The display device may further include a moving member movable in the direction, wherein the first optical sensor and the light compensation device may be disposed on the moving member, and at least one of the first optical sensor and the light compensation device may overlap the sensor area of the display panel in the thickness direction of the display panel by movement of the moving member.

The display device may further include a second optical sensor or light source disposed on a surface of the display panel and overlapping the sensor area of the display panel in the thickness direction of the display panel.

The second optical sensor may include a back electrode, a semiconductor layer, and a front electrode, and the semiconductor layer may include a p-type semiconductor layer, an i-type semiconductor layer, and an n-type semiconductor layer that are sequentially stacked.

The second optical sensor may include a light-emitting unit and a light-sensing unit.

According to an embodiment, a display device may include a substrate including a top portion and a first side portion extending from a side of the top portion; a display layer disposed on a surface of the substrate in the top portion and the side portion of the substrate; a sensor electrode layer including sensor electrodes and disposed on the display layer in the top portion of the substrate; and an optical sensor disposed on an opposite surface of the substrate in the top portion of the substrate.

The display device may further include a conductive pattern disposed on the display layer in the side portion of the substrate, wherein the conductive pattern may be an antenna.

The display device may further include a pressure sensor disposed on the opposite surface of the substrate in the side portion of the substrate.

The pressure sensor may include a first base member and a second base member facing each other; a driving electrode and a sensing electrode disposed on the first base member; and a ground potential layer disposed on the second base member and overlapping the driving electrode and the sensing electrode in a thickness direction of the substrate.

The pressure sensor may include a first base member and a second base member facing each other; a driving electrode and a sensing electrode disposed on the first base member; and a pressure sensing layer disposed on the second base member and overlapping the driving electrode and the sensing electrode in a thickness direction of the substrate, wherein the pressure sensing layer may include fine metal particles in a polymer resin.

The display device may further include a sound generator disposed on an opposite surface of the substrate in the top portion of the substrate, wherein the sound generator may output sound by vibrating the substrate.

According to an embodiment, a display device may include a display panel including a first display area, a second display area, and a folding area disposed between the first display area and the second display area; and an optical sensor disposed on a surface of the display panel. The first display area and the second display area may overlap each other when the display panel is folded at the folding area. The optical sensor may be disposed in a sensor area of the first display area.

The optical sensor may include a light-receiving area overlapping a pin hole or a transmissive area of the first display area in a thickness direction of the display panel.

The optical sensor may include a light-receiving area overlapping a pin hole or a transmissive area of the second display area in the thickness direction of the display panel when the display panel is folded at the folding area.

According to an embodiment, a display device may include a display layer including light-emitting elements disposed on a substrate; and a sensor electrode layer including sensor electrodes and fingerprint sensor electrodes disposed on the display layer. The sensor electrodes may be electrically separated from the fingerprint sensor electrodes. Each of the fingerprint sensor electrodes may be surrounded by a sensor electrode.

The fingerprint sensor electrodes may be electrically connected to fingerprint sensor lines.

The fingerprint sensor electrodes and the sensor electrodes may be disposed on a same layer and may include a same material.

The fingerprint sensor electrodes and the sensor electrodes may be disposed on a different layer.

The sensor electrodes may include sensing electrodes electrically connected in a first direction and arranged alongside each other in a second direction intersecting the first direction; driving electrodes electrically connected in the second direction and arranged alongside each other in the first direction; and a connection portion connecting the driving electrodes adjacent to each other in the second direction.

The sensor electrode layer may include a first sensor insulating layer overlapping the connection portion disposed on the display layer; and a second sensor insulating layer overlapping the driving electrodes and the sensing electrodes disposed on the first sensor insulating layer, wherein each of the driving electrodes adjacent to each other in the second direction may be electrically connected to the connection portion through a sensor contact hole penetrating the first sensor insulating layer.

The fingerprint sensor electrodes may be disposed on the second sensor insulating layer.

The sensor electrode layer may be disposed on the first sensor insulating layer and may include shielding electrodes, and the shielding electrodes, the driving electrodes, and the sensing electrodes may include a same material.

Each of the shielding electrodes may overlap the fingerprint sensor electrode in a thickness direction of the substrate.

The fingerprint sensor electrodes may include fingerprint sensing electrodes electrically connected to one another in the first direction; fingerprint driving electrodes electrically connected to one another in the second direction intersecting the first direction; and a fingerprint connection portion between the fingerprint driving electrodes.

The fingerprint connection portion may be disposed on the display layer, and the fingerprint connection portion and the connection portion may include a same material.

The fingerprint sensing electrodes and the fingerprint driving electrodes may be disposed on the first sensor insulating layer, and the driving electrodes and the sensing electrodes may include a same material.

The sensor electrode layer may further include a conductive pattern surrounded by another one of the sensor electrodes.

The conductive pattern may be disposed on the first sensor insulating layer, and the conductive pattern, the driving electrodes, and the sensing electrodes may include a same material.

The conductive pattern may be disposed on the second sensor insulating layer.

According to an embodiment, a display device may include a display layer including light-emitting elements disposed on a substrate; and a sensor electrode layer disposed on the display layer and including sensor electrodes disposed in touch sensing areas of the sensor electrode layer; and fingerprint sensor electrodes disposed in fingerprint sensing areas of the sensor electrode layer. The fingerprint sensor electrodes may include fingerprint driving electrodes and fingerprint sensing electrodes. The fingerprint driving electrodes and the fingerprint sensing electrodes may be disposed on different layers.

The fingerprint sensing electrodes may overlap the fingerprint driving electrodes in a thickness direction of the substrate.

The fingerprint driving electrodes and the fingerprint sensing electrodes may intersect a predetermined number of times.

According to an embodiment, a display device may include a substrate; and emission areas disposed on the substrate and including light-emitting elements. Each of the light-emitting elements may include an anode electrode; a cathode electrode; and an emissive layer disposed between the anode electrode and the cathode electrode. The cathode electrode may include a first cathode electrode overlapping a predetermined number of the emission areas; and a second cathode electrode overlapping a predetermined number of other emission areas.

A first driving voltage may be applied to the first cathode electrode and the second cathode electrode during a display period, and a driving pulse may be applied to the first cathode electrode and then the driving pulse may be applied to the second cathode electrode during a fingerprint sensing period.

The display device may further include a bank defining each of the emission areas; and an auxiliary electrode disposed on the substrate and electrically connected to the first cathode electrode or the second cathode electrode through a connection contact hole penetrating the bank.

The auxiliary electrode and the anode electrode may be disposed on a same layer and may include a same material.

According to an embodiment, a display device may include a display panel including a substrate and a display layer disposed on a surface of the substrate; and an ultrasonic sensor disposed on an opposite surface of the substrate, wherein the ultrasonic sensor may output sound by vibrating the display panel in a sound output mode, and may output or may sense ultrasonic waves in an ultrasonic sensing mode.

The ultrasonic sensor may include sound converters symmetrically disposed with respect to a sensor area where a fingerprint may be placed.

The sound converters may include first sound converters disposed on a side of the sensor area; and second sound converters disposed on another side of the sensor area, the first sound converters may output the ultrasonic waves by vibration, and the second sound converters may sense the ultrasonic waves output from the first sound converters in the ultrasonic sensing mode.

The display device may further include a panel bottom cover disposed on the opposite surface of the substrate and may include a cover hole, wherein the sound converters may be disposed in the cover hole.

According to an embodiment, a display device may include a display panel including a substrate and a display layer disposed on a surface of the substrate; an ultrasonic sensor disposed on another surface of the substrate that senses ultrasonic waves; and a sound generator disposed on the another surface of the substrate that may output sound by vibration.

The display device may further include a panel bottom cover disposed on the another surface of the substrate and including a first cover hole and a second cover hole, wherein the ultrasonic sensor may be disposed in the first cover hole, and the sound generator may be disposed in the second cover hole.

The display device may further include a flexible film attached to a side of the display panel, bent and disposed below the display panel, and including a film hole in which the ultrasonic sensor is disposed.

The display device may further include a display circuit board attached to a side of the flexible film; and a pressure sensor disposed on an opposite surface of the display circuit board opposite to a surface facing the display panel.

The pressure sensor may include a first base member and a second base member facing each other; a pressure driving electrode disposed on a surface of the first base member facing the second base member; a sensing driving electrode disposed on a surface of the second base member facing the first base member; and a cushion layer disposed between the pressure driving electrode and the sensing driving electrode.

According to an embodiment, a display device may include a display panel including a display layer disposed on a surface of a substrate; and a sensor electrode layer including sensor electrodes disposed on the display layer; and an ultrasonic sensor disposed on another surface of the substrate that may detect ultrasonic waves, wherein the sensor electrode layer may include a first conductive pattern that is an antenna.

The sensor electrodes may include sensing electrodes electrically connected in a first direction and arranged alongside each other in a second direction intersecting the first direction; driving electrodes electrically connected in the second direction and arranged alongside each other in the first direction; and a connection portion connecting the driving electrodes adjacent to each other in the second direction.

The sensor electrode layer may include a first sensor insulating layer overlapping the connection portion disposed on the display layer; and a second sensor insulating layer overlapping the driving electrodes and the sensing electrodes disposed on the first sensor insulating layer, wherein each of the driving electrodes adjacent to each other in the second direction may be electrically connected to the connection portion through a sensor contact hole penetrating the first sensor insulating layer.

The first conductive pattern may be disposed on the first sensor insulating layer, and the first conductive pattern, the driving electrodes, and the sensing electrodes may include a same material.

The first conductive pattern may be disposed on the second sensor insulating layer.

The sensor electrode layer may include pressure driving electrodes and pressure sensing electrodes alternately arranged in a direction; a pressure sensing layer overlapping the pressure driving electrodes and the pressure sensing electrodes disposed on the display layer; and a sensor insulating layer disposed on the pressure sensing layer.

The first conductive pattern and the sensor electrodes may be disposed on the sensor insulating layer and may include a same material.

According to an embodiment, a display device may include a display panel including a substrate and a display layer disposed on a surface of the substrate; an ultrasonic sensor disposed on another surface of the substrate and sensing ultrasonic waves; and a digitizer layer overlapping the ultrasonic sensor in a thickness direction of the substrate. The digitizer layer may include a base film; first electrodes disposed on a surface of the base film; and second electrodes disposed on another surface of the base film, wherein a pin hole of the display layer may not overlap the first electrodes and the second electrodes in the thickness direction of the substrate.

The display panel may include conductive patterns disposed on the display layer, and the conductive patterns may be an antenna.

The display panel may further include a sensor electrode layer including sensor electrodes disposed on the display layer; and the conductive patterns.

The conductive patterns and the sensor electrodes may include a same material.

According to an embodiment, in a case that a person's finger is placed on a cover window, light emitted from emission areas may be reflected at valleys and absorbed at ridges of the fingerprint of a person's finger. Light reflected at the fingerprint may be received by the light-receiving element of each of the light-receiving areas. Therefore, the fingerprint of a person's finger may be recognized through the sensor pixels including the light-receiving elements built in the display panel.

According to an embodiment, the light-receiving gate electrode and the light-receiving semiconductor layer may overlap the gate electrode and the active layer of one of the driving transistor and the first to sixth transistors of the display pixels in the thickness direction of the substrate. Thus, no additional space for the light-receiving elements may be required, separately from the space for the thin-film transistors, and accordingly it may be possible to prevent the space where the thin-film transistors may be disposed from being reduced due to the light-receiving elements.

According to an embodiment, a transmissive area or a reflective area may be included in the display panel of the display device, so that the light-receiving areas may be disposed in the transmissive area or the reflective area. As a result, no additional space for the light-receiving areas may be required, separately from the space for the emission areas. Therefore, it may be possible to prevent the space for the emission areas from being reduced due to the light-receiving areas.

According to an embodiment, a first pin hole of a display pixel, an opening of a pin hole array, and a light-receiving area of an optical sensor overlap in the thickness direction of the substrate, so that light can reach the light-receiving area of the optical sensor through the first pin hole of the display pixel and the opening of the pin hole array. Therefore, the light sensor can sense light incident from above the display panel.

According to an embodiment, a first pin hole of a display pixel, a second pin hole of a pressure sensing electrode and a light-receiving area of an optical sensor overlap in the thickness direction of the substrate, so that light can reach the light-receiving area of the optical sensor through the first pin hole of the display pixel and the second pin hole of the pressure sensing electrode. Therefore, the light sensor can sense light incident from above the display panel.

According to an embodiment, a shorter side of an optical sensor is inclined by a first angle with respect to a side of the display panel, and thus the optical sensor can recognize the pattern of a fingerprint, with the moiré pattern reduced.

According to an embodiment, a light compensation device for providing light is included in a sensor area, so that it may be possible to compensate for the luminance of the sensor area that may be reduced due to the transmissive areas of the sensor area.

According to an embodiment, one of the optical sensors of a display device is a solar cell, so that electric power for driving the display device may be generated by light incident on the sensor area.

According to an embodiment, in a case that a pressure sensor is disposed on a side portion of a display panel extended from the top portion, it may be possible to sense a pressure applied by a user and also to sense the user's touch input using the pressure sensor. Therefore, conductive patterns utilized as an antenna may be formed on the side portion of the display panel instead of the sensor electrodes of the sensor electrode layer for sensing a user's touch input. The conductive patterns may be disposed on the same layer and made of the same or similar material as the sensor electrodes of the sensor electrode layer in the top portion of the display panel, the conductive patterns may be formed without any additional process. Moreover, even if the wavelengths of the electromagnetic waves transmitted or received by the conductive patterns is short, like those for 5G mobile communications, they do not need to pass through the metal layers of the display panel. Therefore, electromagnetic waves transmitted or received by the conductive patterns may be stably radiated toward the upper side of the display device or may be stably received by the display device.

According to an embodiment, a touch sensor area includes fingerprint sensor electrodes as well as the driving electrodes and the sensing electrodes. Therefore, it may be possible to sense a touch of an object using the mutual capacitance between the driving electrodes and the sensing electrodes, and it is also possible to sense a person's fingerprint using the capacitance of the fingerprint sensor electrodes.

According to an embodiment, a self-capacitance of each of the fingerprint sensor electrodes is formed by applying a driving signal applied through a fingerprint sensor line, and the amount of change in the self-capacitance is measured, thereby sensing a person's fingerprint.

According to an embodiment, fingerprint sensor electrodes include fingerprint driving electrodes and fingerprint sensing electrodes. A mutual capacitance is formed between the fingerprint driving electrodes and the fingerprint sensing electrodes by applying a driving signal, and the amount of change in the mutual capacitance is measured, thereby sensing a person's fingerprint.

According to an embodiment, q fingerprint sensor lines may be electrically connected to a single main fingerprint sensor line using a multiplexer, so that the number of the fingerprint sensor lines may be reduced to 1/q. As a result, it may be possible to avoid the number of sensor pads from increasing due to the fingerprint sensor electrodes.

According to an embodiment, a touch sensor area includes driving electrodes, sensing electrodes, fingerprint sensor electrodes and pressure sensing electrodes. Therefore, it may be possible to sense a touch of an object using the mutual capacitance between the driving electrodes and the sensing electrodes, it is also possible to sense a person's fingerprint using the capacitance of the fingerprint sensor electrodes, and it may be possible to sense a pressure (force) applied by a user using the resistance of the pressure sensing electrodes.

According to an embodiment, a touch sensor area includes driving electrodes, sensing electrodes, fingerprint sensor electrodes and conductive patterns. Therefore, it may be possible to sense a touch of an object using the mutual capacitance between the driving electrodes and the sensing electrodes, it is also possible to sense a person's fingerprint using the capacitance of the fingerprint sensor electrodes, and it may be possible to conduct lineless communications using the conductive patterns.

According to an embodiment, fingerprint driving signals are sequentially applied to second light-emitting electrodes, so that the self-capacitance of each of the second light-emitting electrodes may be sensed by self-capacitance sensing. By detecting the difference between the value of the self-capacitance of the second light-emitting electrodes at the ridges of a person's fingerprint and the value of the self-capacitance of the second light-emitting electrodes at the valleys of the fingerprint, it may be possible to recognize the person's fingerprint.

According to an embodiment, it may be possible to recognize a person's fingerprint by sensing the capacitance of the fingerprint sensor electrodes, as well as to recognize the fingerprint using an optical or ultrasonic fingerprint sensor. Since it may be possible to recognize a person's fingerprint by capacitive sensing as well as optical sensing or ultrasonic sensing, the person's fingerprint may be recognized more accurately.

According to an embodiment, first sensor areas including the fingerprint sensor electrodes are uniformly distributed over the entire display area, and thus even if a person's finger is disposed anywhere in the display area, it may be possible to recognize the person's finger by the first sensor areas. Even if a number of fingers are placed on the display area, it may be possible to prevent recognize the fingerprints of the fingers by the first sensor areas. In a case that the display device is applied to a medium-large display device such as a television, a laptop computer and a monitor, the lines of a person's palm may be recognized by the first sensor areas in addition to the fingerprint of the person's finger F.

According to an embodiment, the sound converters of the ultrasonic sensor can output ultrasonic waves to a person's finger placed in the sensor area and sense ultrasonic waves reflected from the fingerprints of the finger.

According to an embodiment, it may be possible to sense a user's fingerprint using an ultrasonic sensor and also to determine whether the user's fingerprint is a biometric fingerprint based on the blood flow of the finger. In other words, it may be possible to increase the security level of the display device by determining the blood flow of the finger together with fingerprint recognition.

Other features and embodiments may be apparent from the following detailed description, the drawings, and the claims.

It is to be understood that both the foregoing description and the following detailed description are not to be construed as limiting of an embodiment as described or claimed herein.

BRIEF DESCRIPTION OF THE DRAWINGS

The accompanying drawings, which are included to provide a further understanding of the disclosure, illustrate embodiments in which:

FIG. 121 is a schematic cross-sectional view showing an example of the driving electrode, the sensing electrode and the connection portion of FIG. 119.

FIG. 122 is a schematic cross-sectional view showing an example of the fingerprint sensor electrode of FIG. 120.

FIG. 123 is a schematic cross-sectional view showing another example of the fingerprint sensor electrodes of FIG. 120.

FIG. 124 is a view showing a method of recognizing a fingerprint by fingerprint sensor electrodes driven by self-capacitance sensing.

FIG. 125 is a schematic cross-sectional view showing another example of the fingerprint sensor electrodes of FIG. 120.

FIG. 126 is a view showing a layout of a first sensor area of the sensor electrode layer of FIG. 117.

FIG. 127 is a view showing an example of a layout of the driving electrodes, the sensing electrodes and the connection portions of FIG. 126.

FIG. 128 is a view showing an example of a layout of the fingerprint driving electrode and the fingerprint sensing electrode of FIG. 126.

FIG. 129 is a schematic cross-sectional view showing an example of the fingerprint driving electrode, the fingerprint sensing electrode and the fingerprint connection portion of FIG. 128.

FIG. 130 is a view showing an example of a method of recognizing a fingerprint by fingerprint sensor electrodes driven by mutual capacitance sensing.

FIG. 131 is a view showing a layout of a sensor electrode layer of a display panel according to an embodiment.

FIG. 132 is a view showing an example of a layout of the fingerprint sensor electrodes of the first sensor area of FIG. 131.

Figure 131:
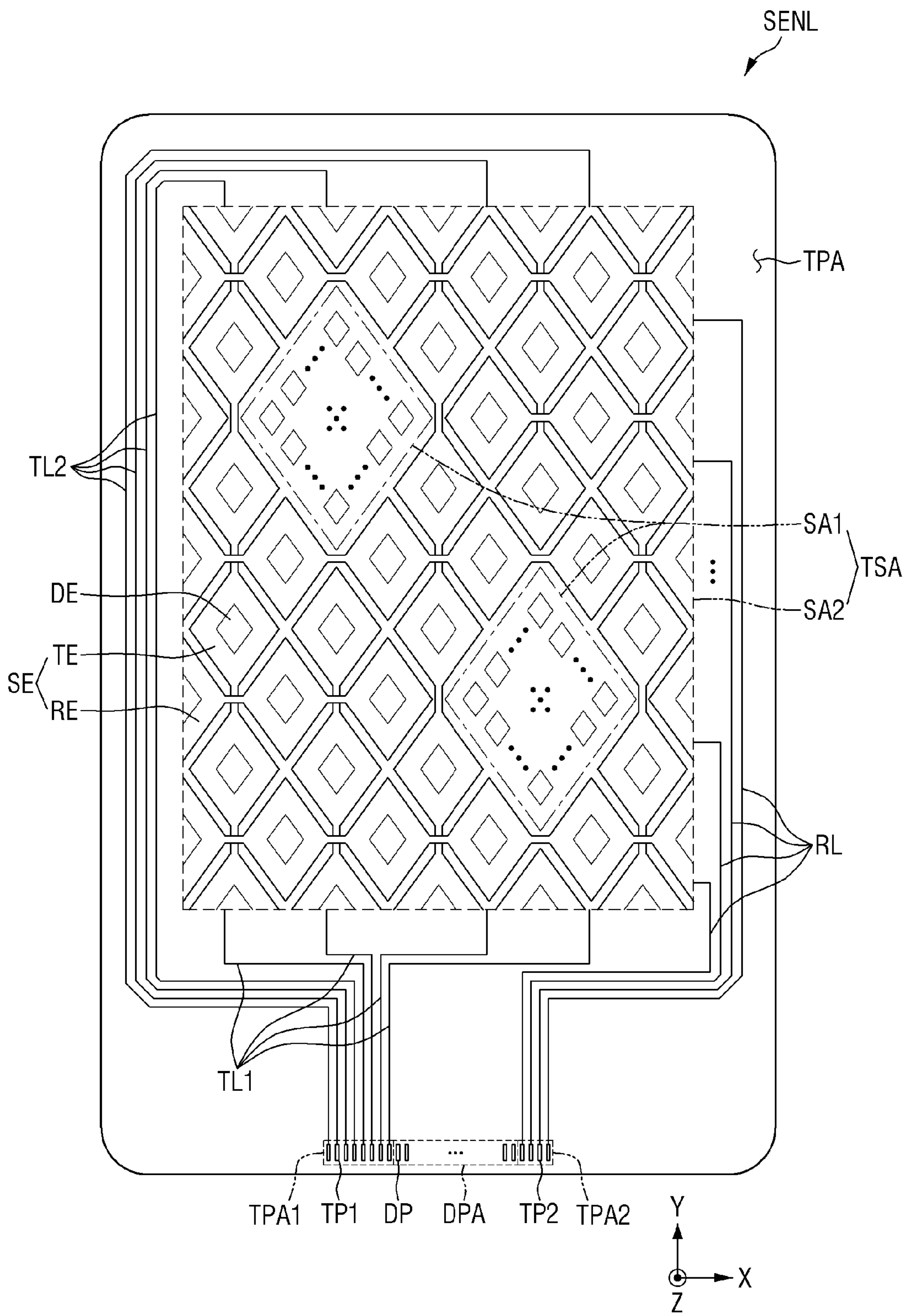
Figure 133:
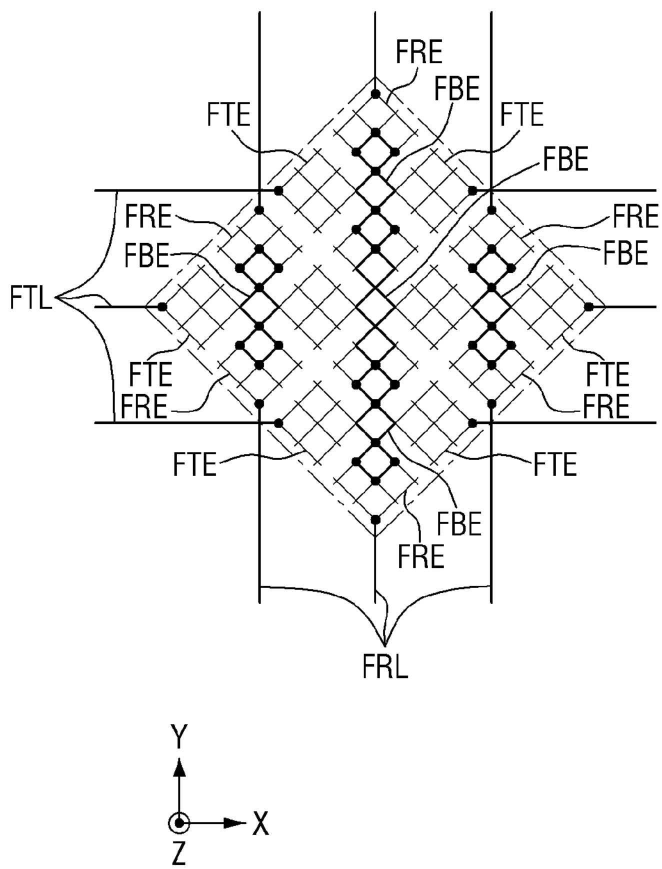

FIG. 133 is a view showing another example of a layout of the fingerprint sensor electrodes of the first sensor area of FIG. 131.

Figure 134A:
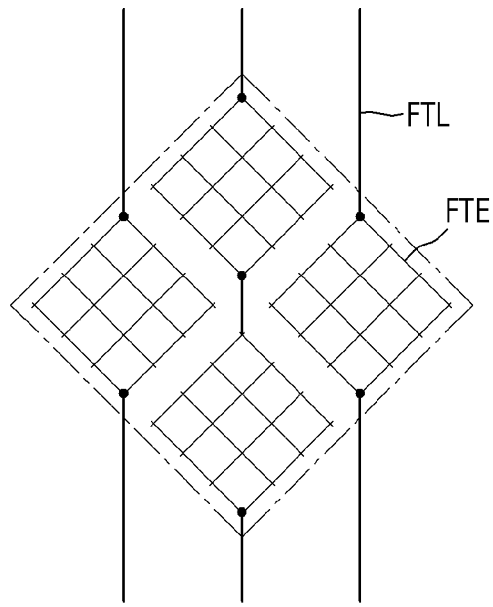
Figure 134B:
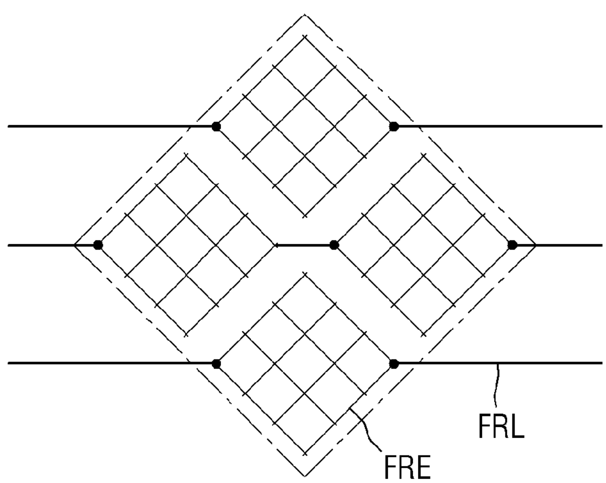

FIGS. 134A and 134B are views showing other examples of the layout of the fingerprint sensor electrodes of the first sensor area of FIG. 131.

Figure 135A:
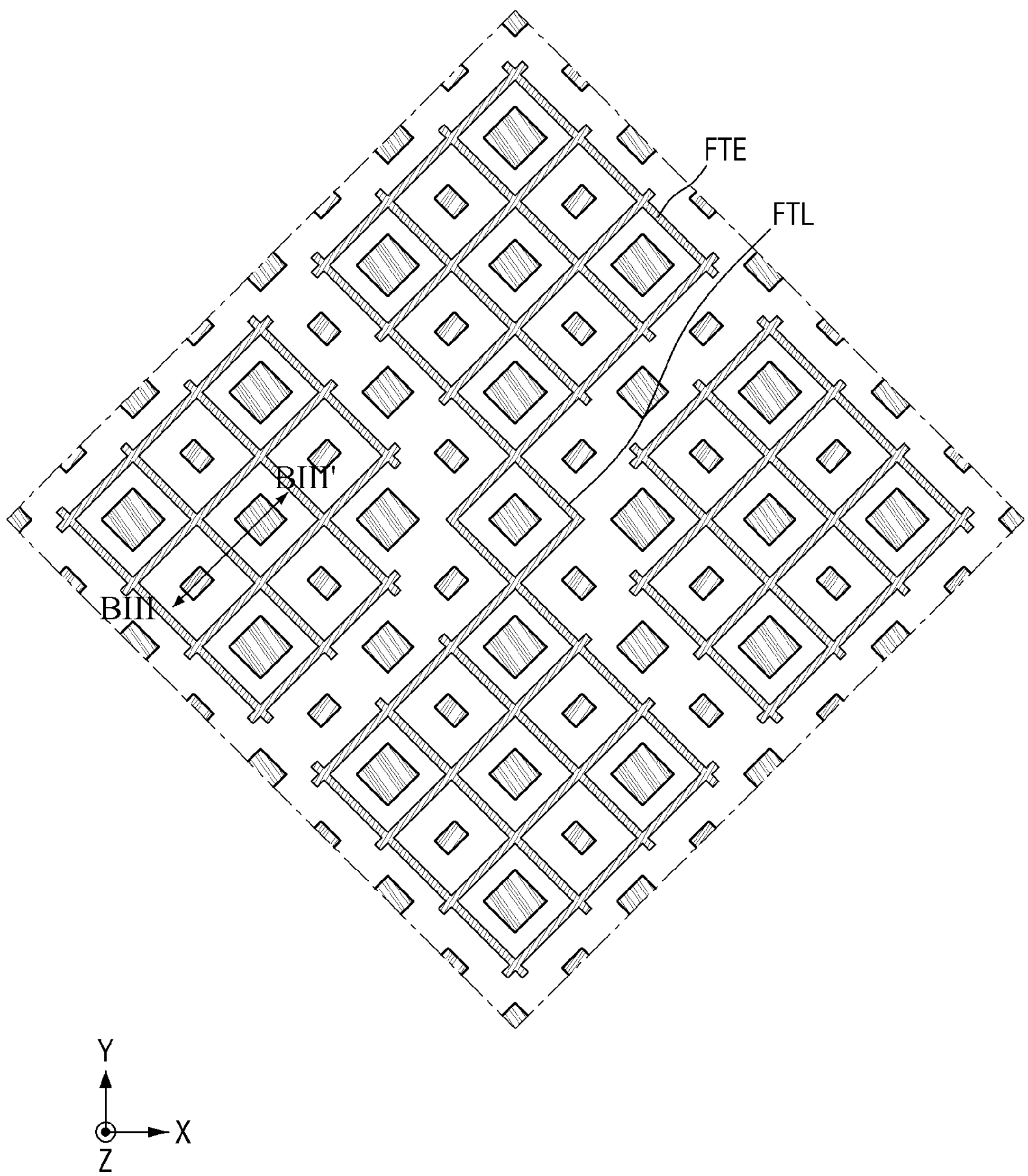
Figure 135B:
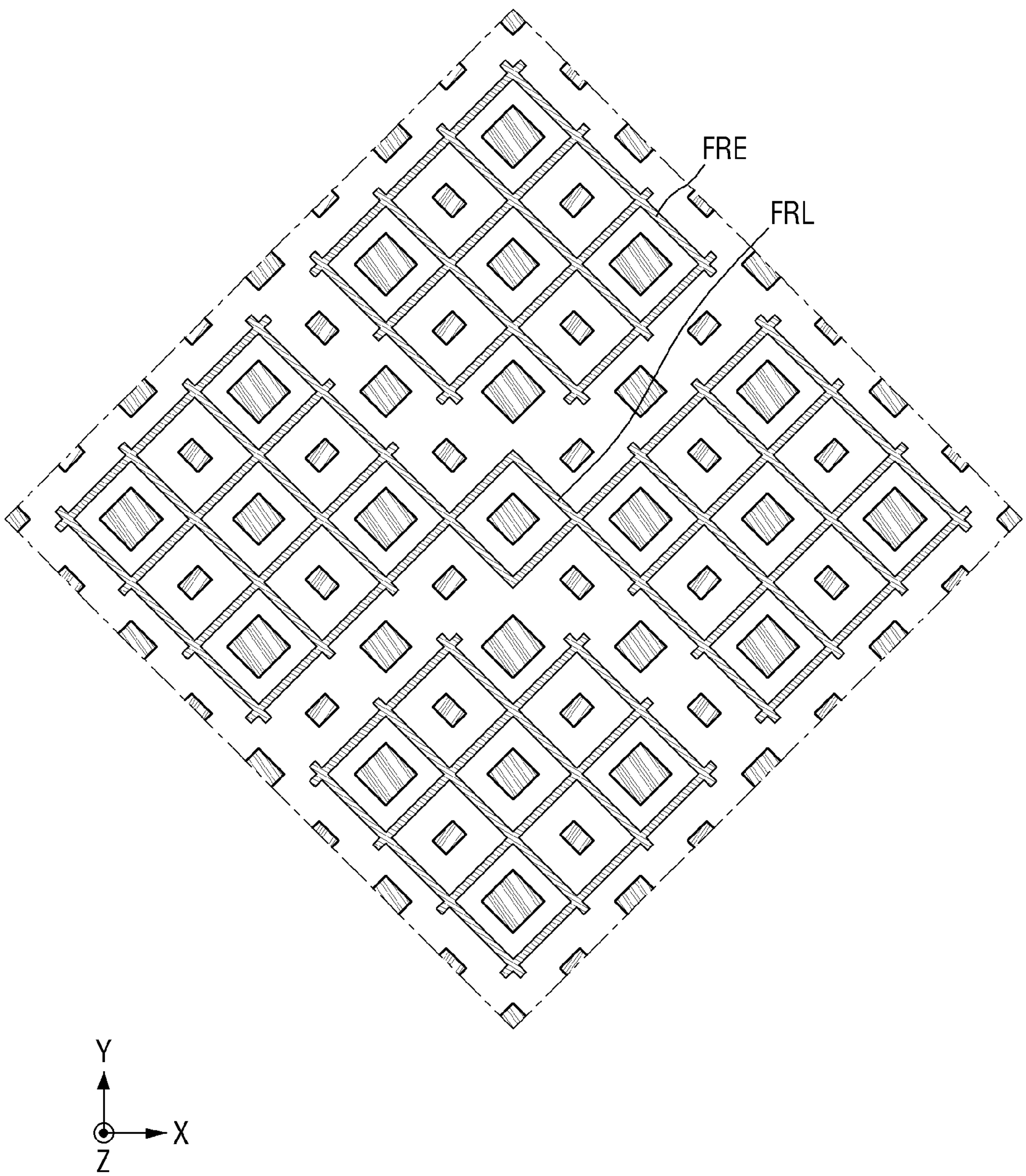

FIGS. 135A and 135B are views showing an example of a layout of the fingerprint driving electrode and the fingerprint sensing electrode of FIGS. 134A and 134B.

Figure 136:
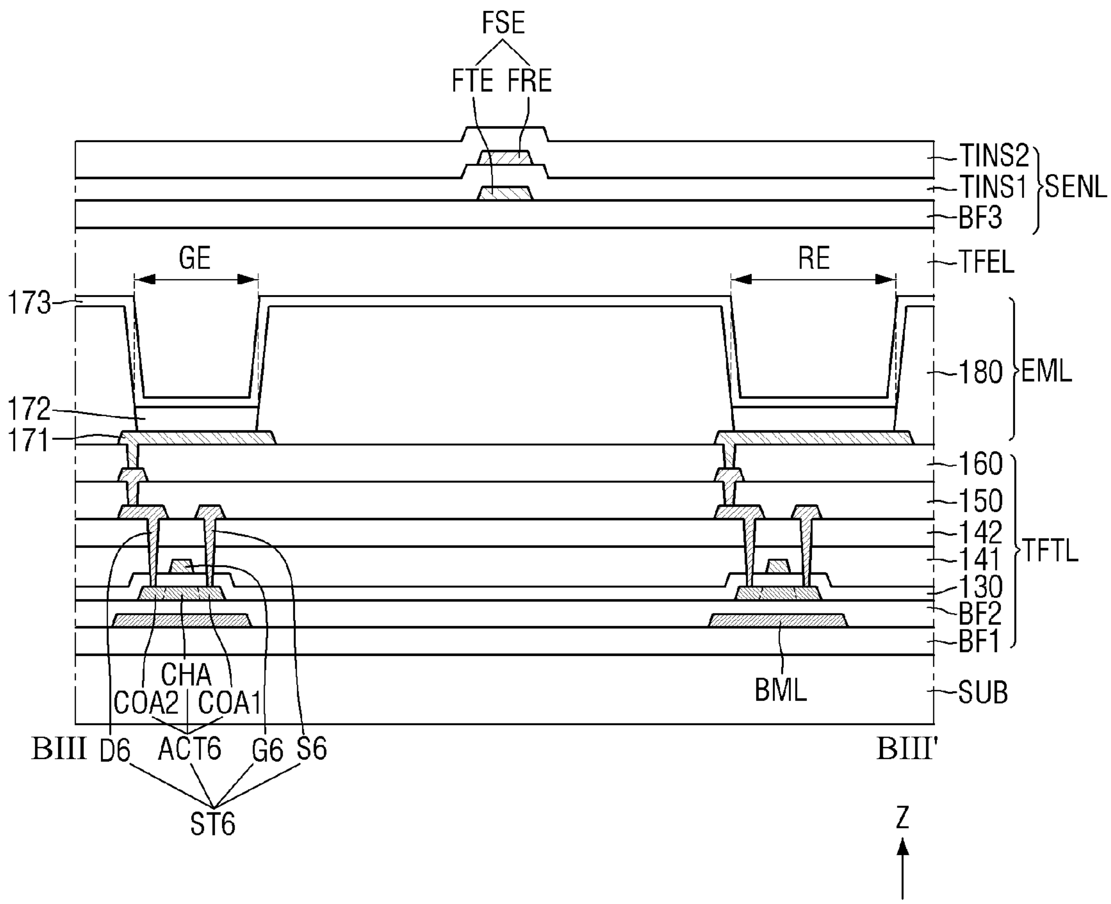

FIG. 136 is a schematic cross-sectional view showing an example of the fingerprint driving electrodes and the fingerprint sensing electrodes of FIGS. 135A and 135B.

Figure 137:
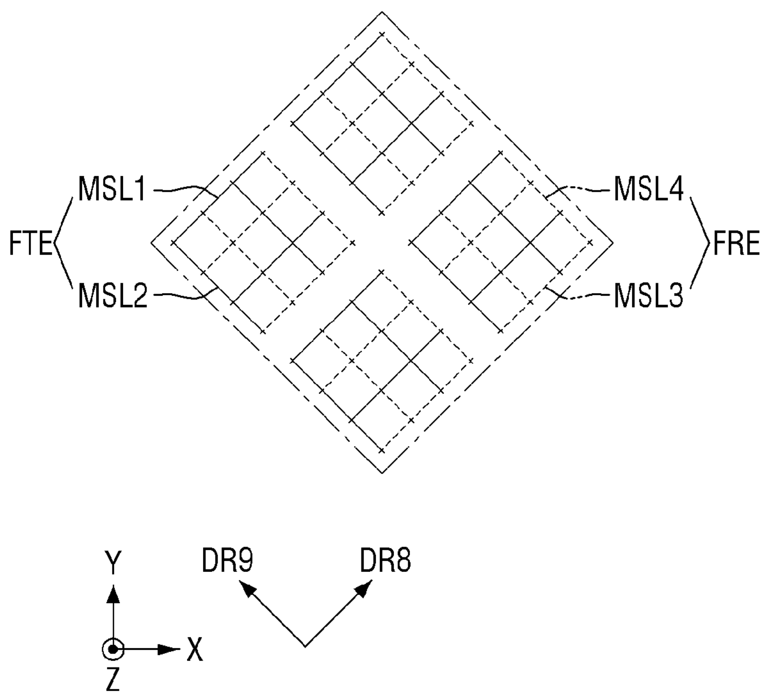

FIG. 137 is a view showing another example of a layout of the fingerprint sensor electrodes of the first sensor area of FIG. 131.

Figure 138:
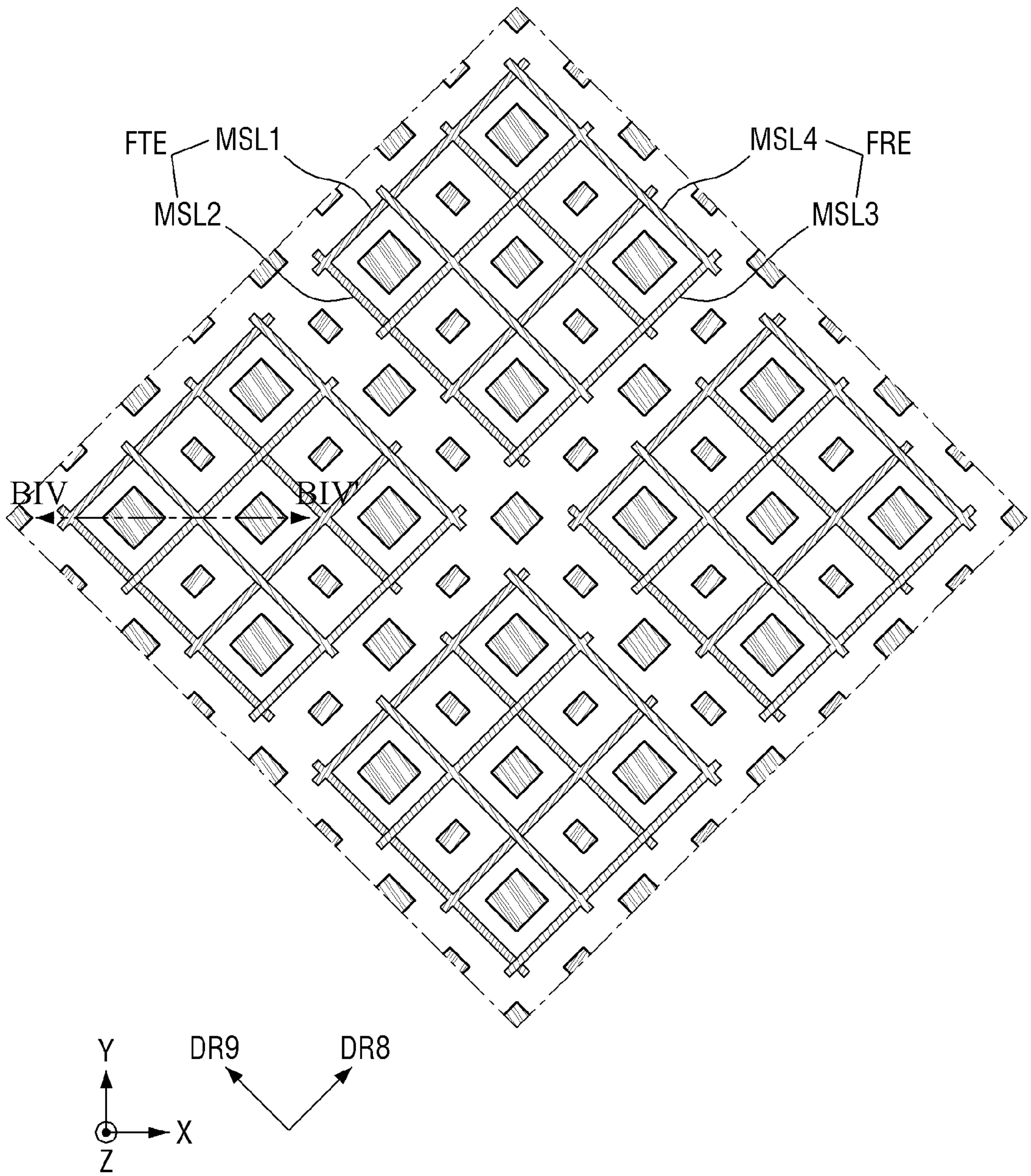

FIG. 138 is a view showing an example of a layout of the fingerprint driving electrode and the fingerprint sensing electrode of FIG. 137.

Figure 139:
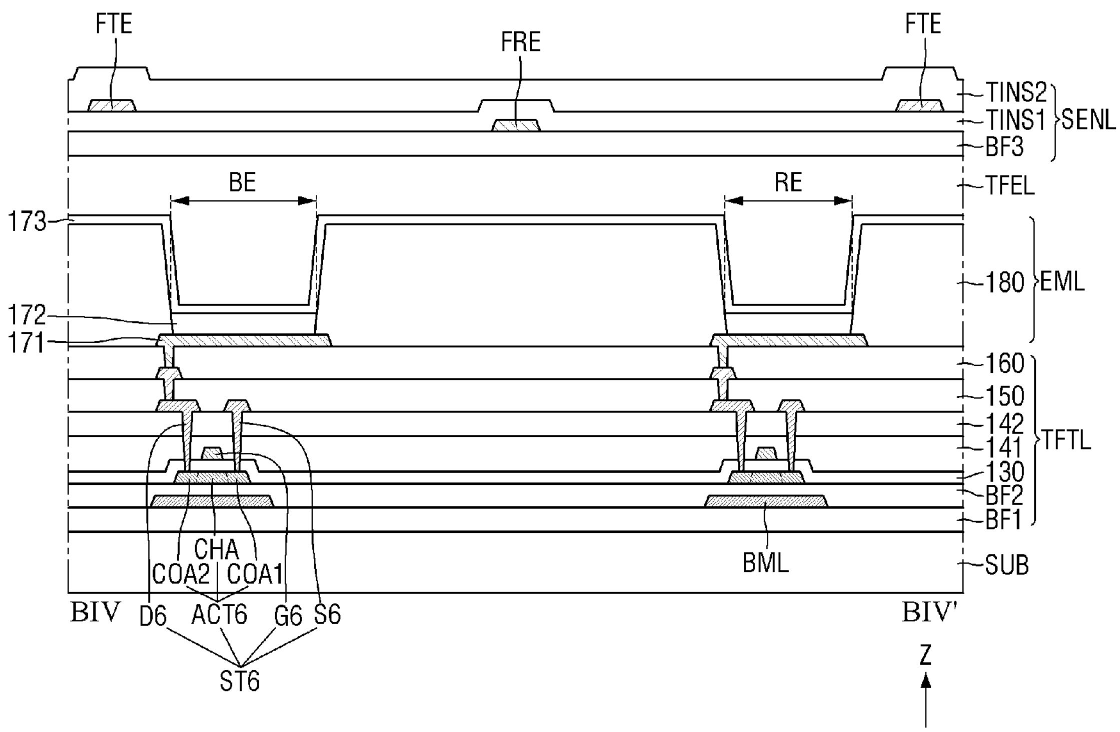

FIG. 139 is a schematic cross-sectional view showing an example of the fingerprint driving electrodes and the fingerprint sensing electrodes of FIG. 137.

Figure 140:
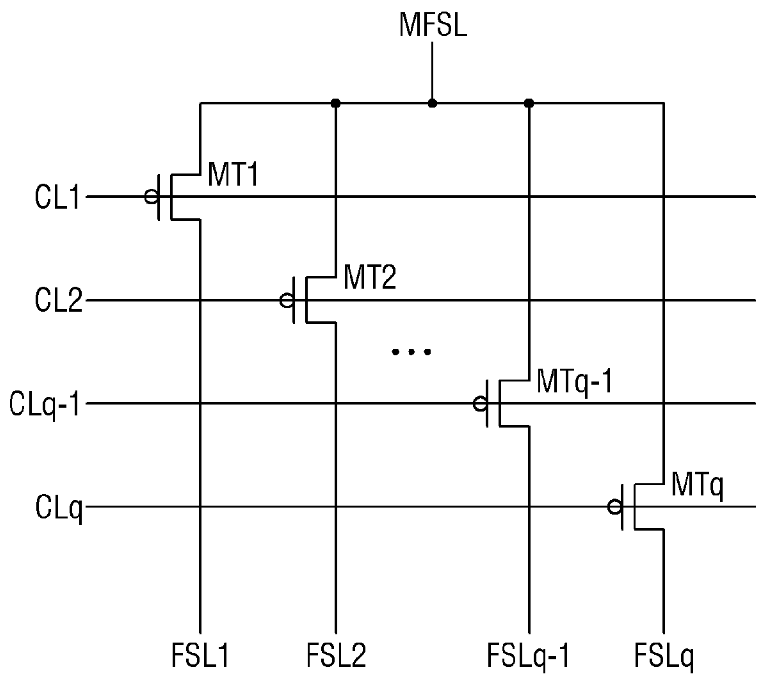

FIG. 140 is a view showing an example of a layout of fingerprint sensor lines electrically connected to fingerprint sensor electrodes and a multiplexer according to an embodiment.

Figure 141:
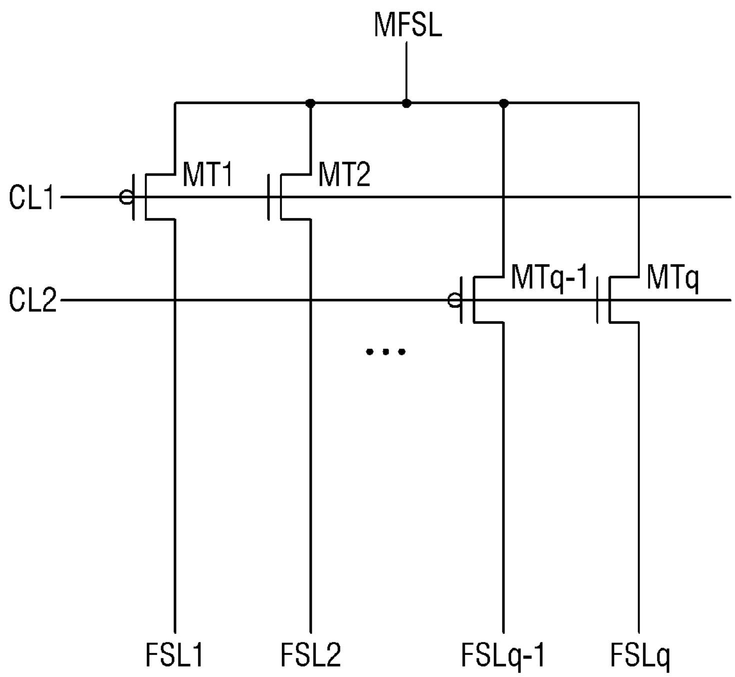

FIG. 141 is a view showing an example of a layout of fingerprint sensor lines electrically connected to fingerprint sensor electrodes and a multiplexer according to another embodiment.

Figure 142:
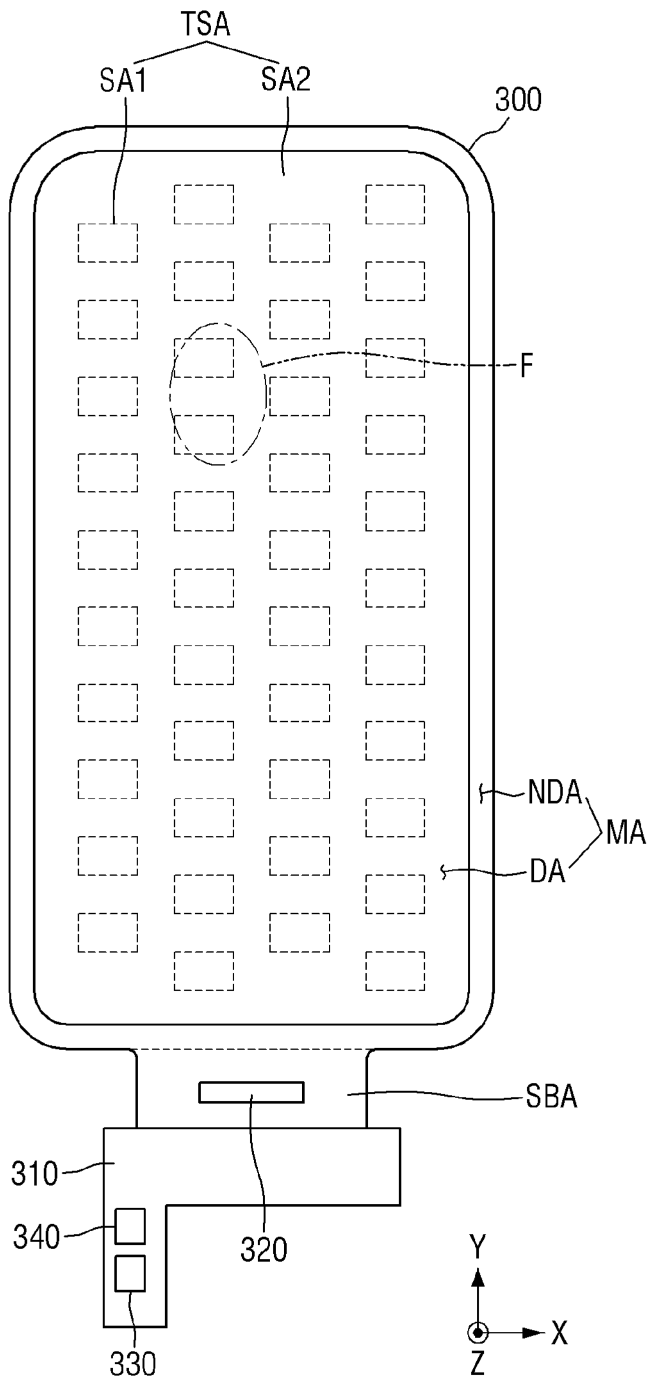

FIG. 142 is a plan view showing a display area, a non-display area and sensor areas of a display panel of a display device according to an embodiment.

Figure 143:
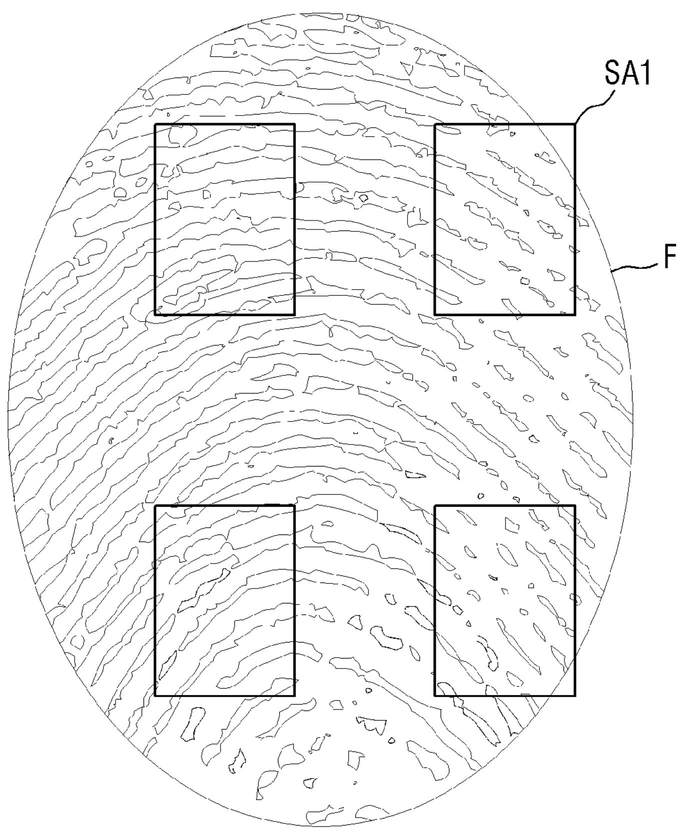

FIG. 143 is a view showing the first sensor areas of FIG. 142 and a person's fingerprint.

Figure 144:
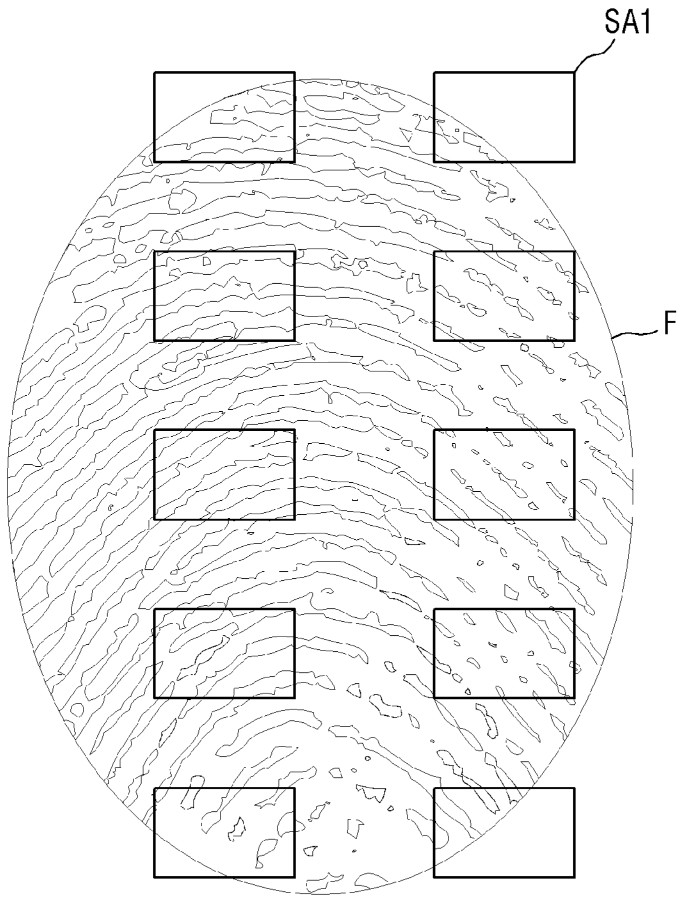

FIG. 144 is a view showing the first sensor areas of FIG. 142 and a person's fingerprint.

Figure 145:
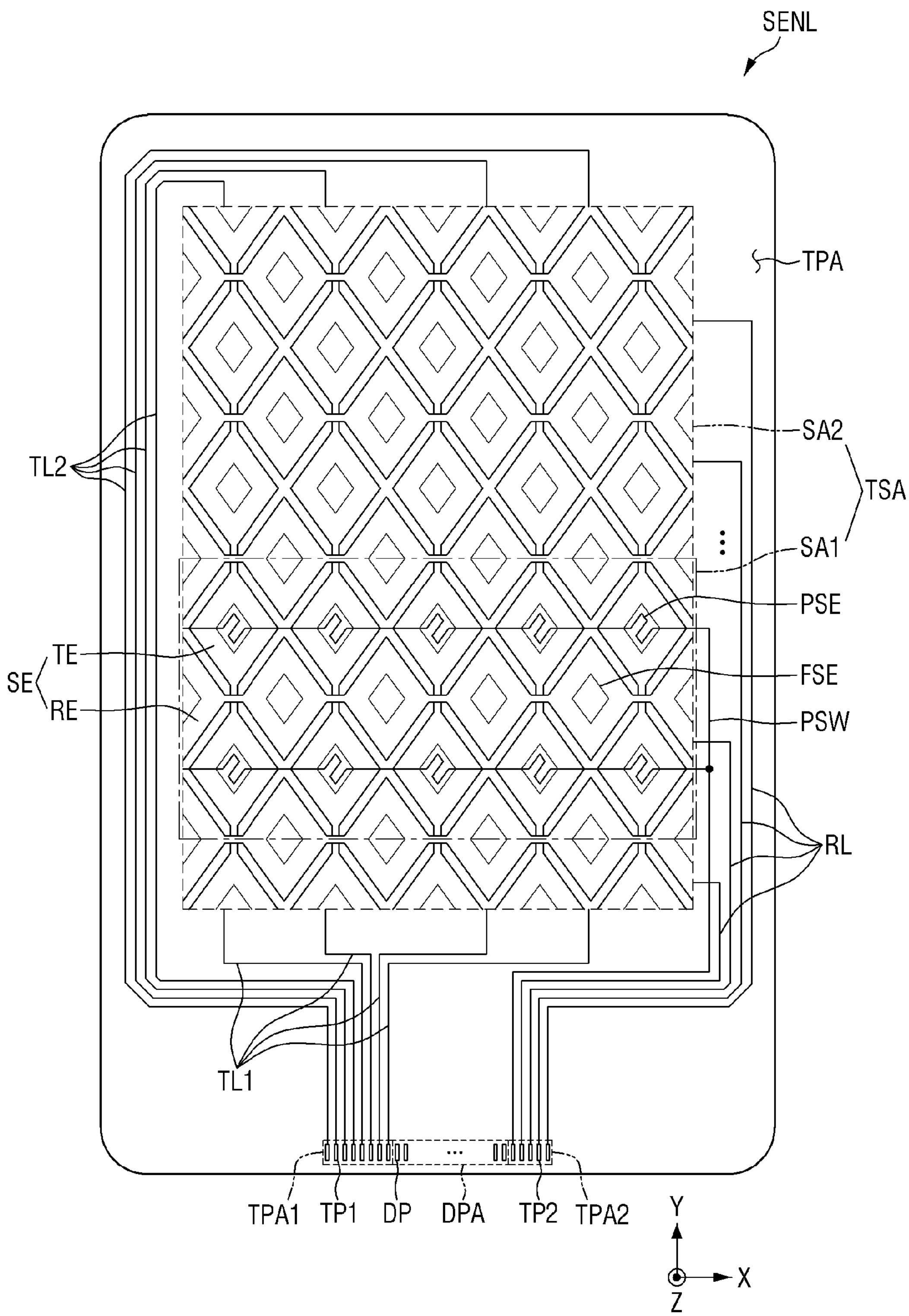

FIG. 145 is a view showing a layout of a sensor electrode layer of a display panel according to an embodiment.

Figure 146:
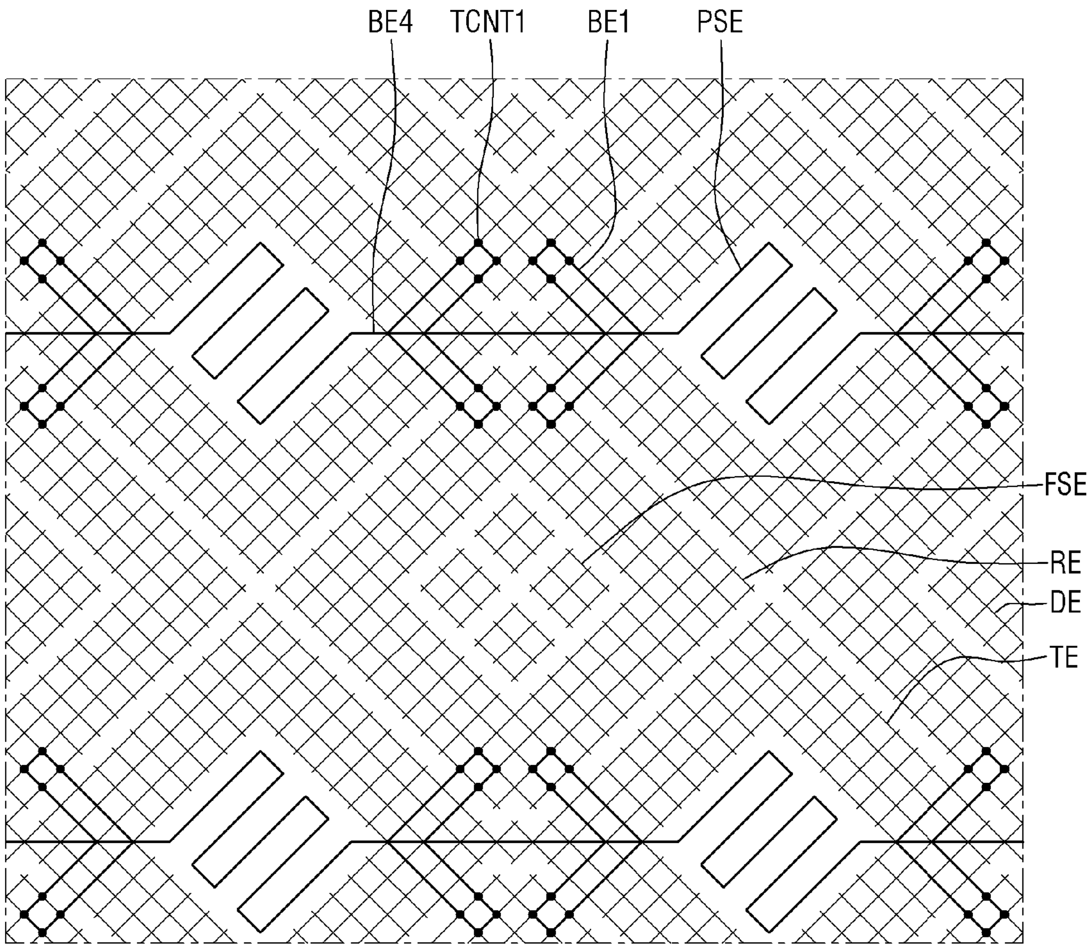

FIG. 146 is a view showing a layout of sensor electrodes of the sensor electrode layer of FIG. 145.

Figure 147:
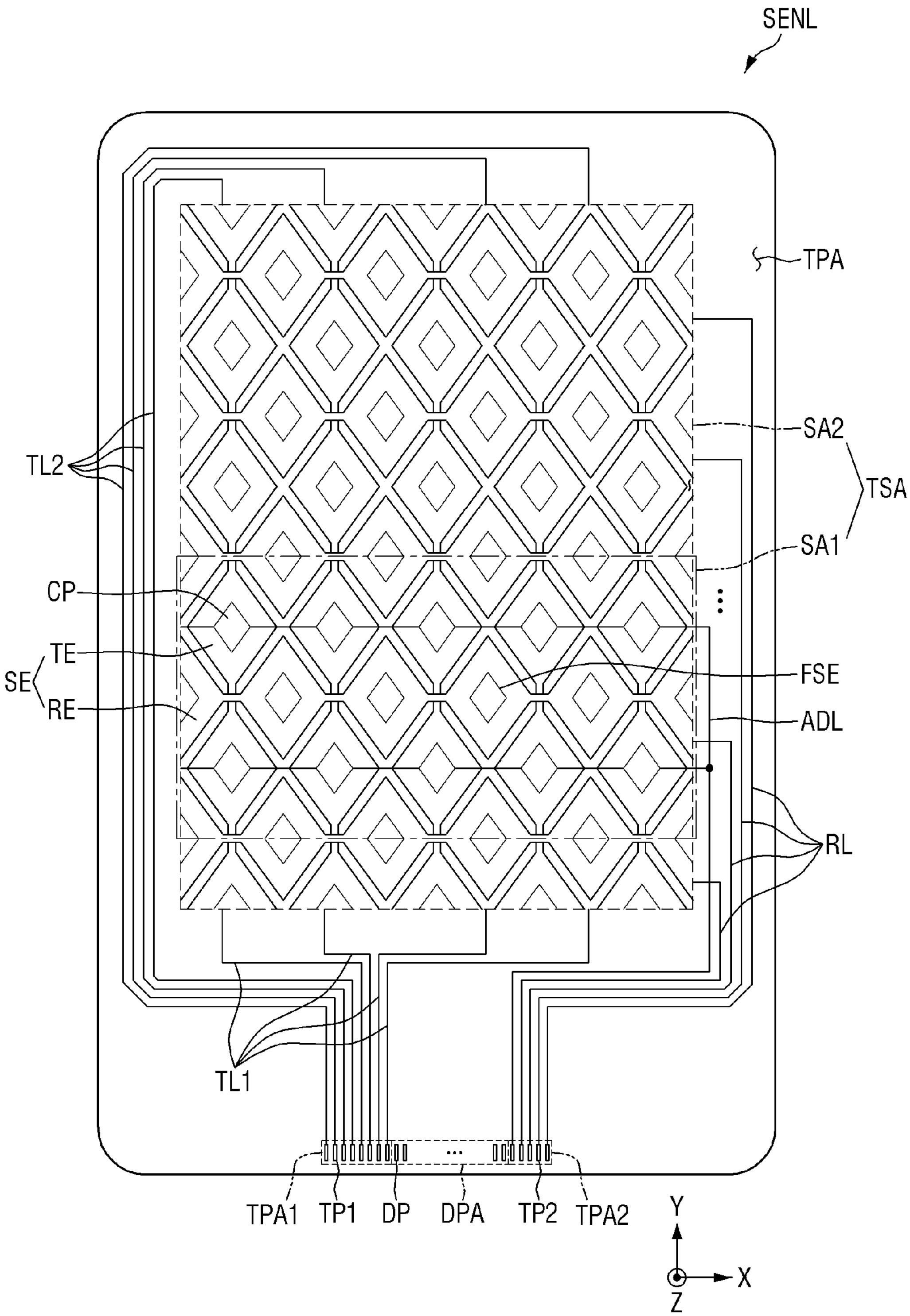

FIG. 147 is a view showing a layout of a sensor electrode layer of a display panel according to an embodiment.

Figure 148:
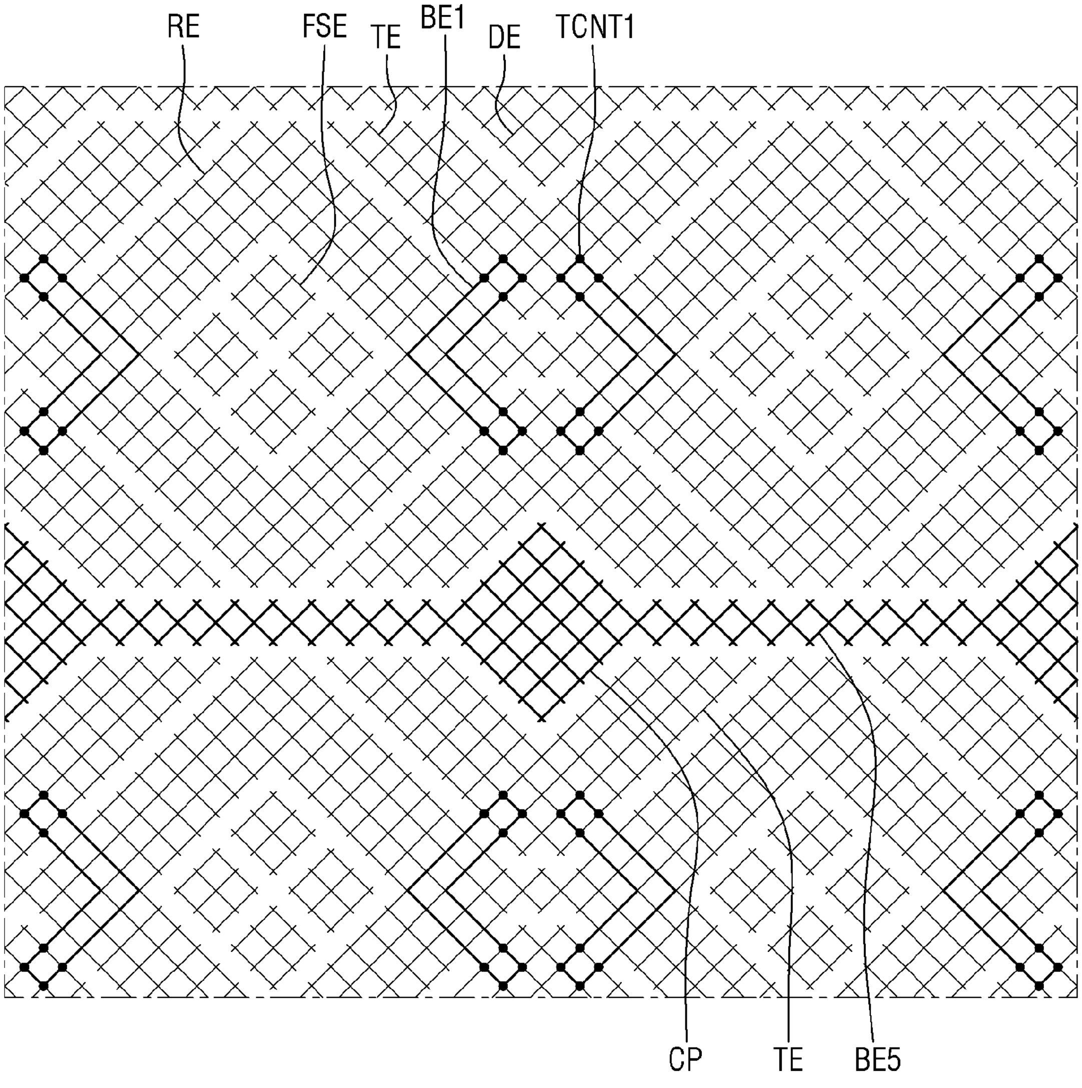

FIG. 148 is a view showing a layout of sensor electrodes of the sensor electrode layer of FIG. 147.

Figure 149:
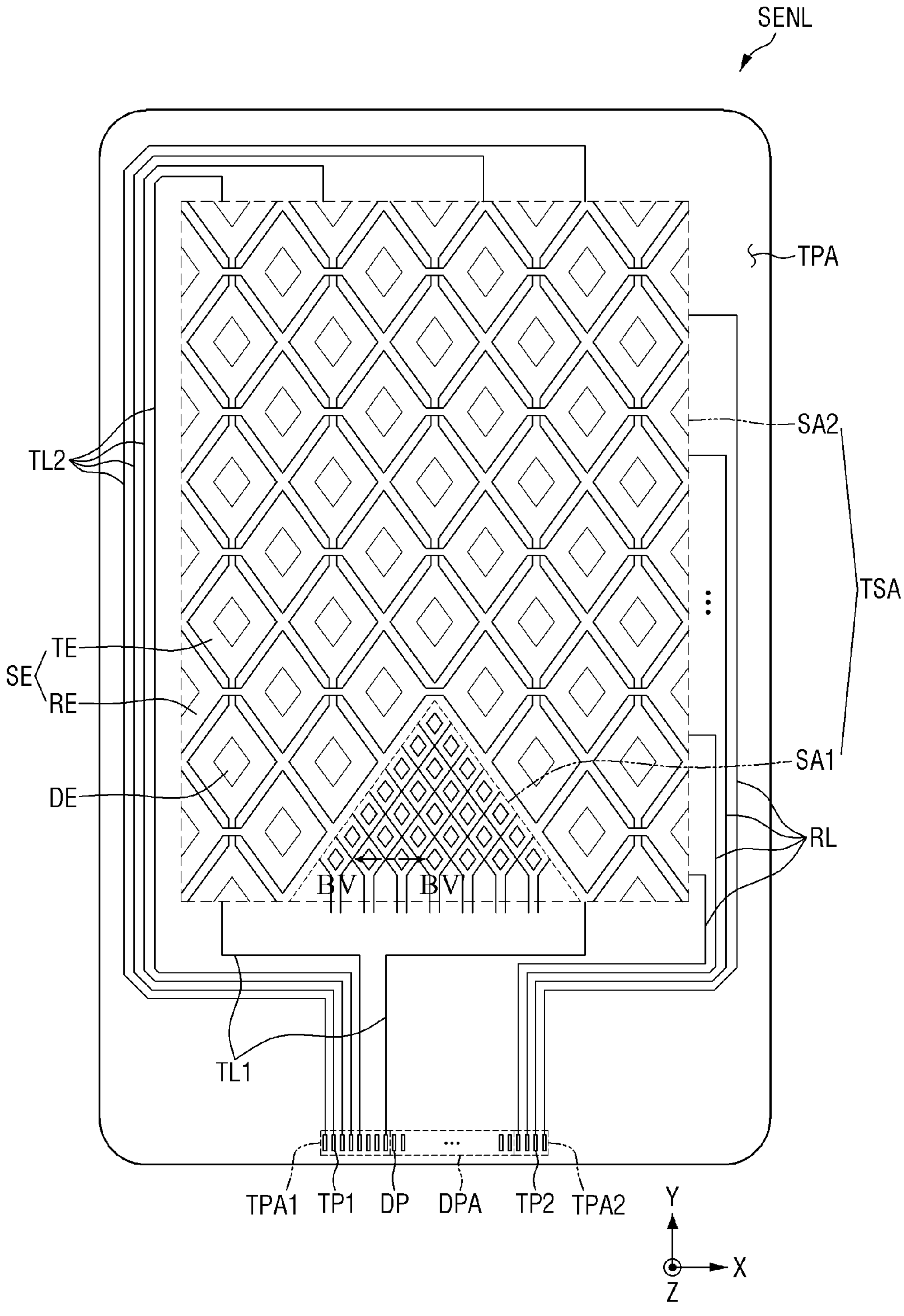

FIG. 149 is a view showing a layout of a sensor electrode layer of a display panel according to an embodiment.

Figure 150:
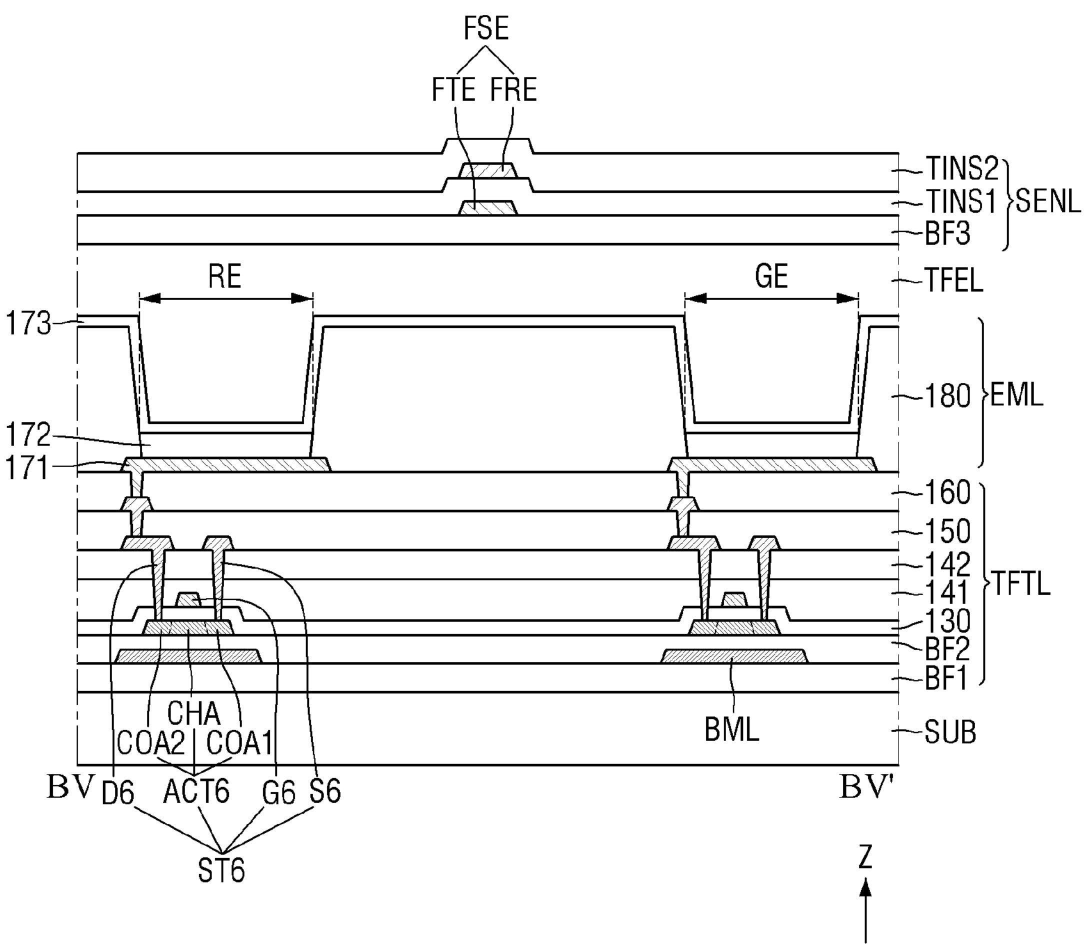

FIG. 150 is a schematic cross-sectional view showing an example of the fingerprint driving electrodes and the fingerprint sensing electrodes of FIG. 149.

Figure 151:
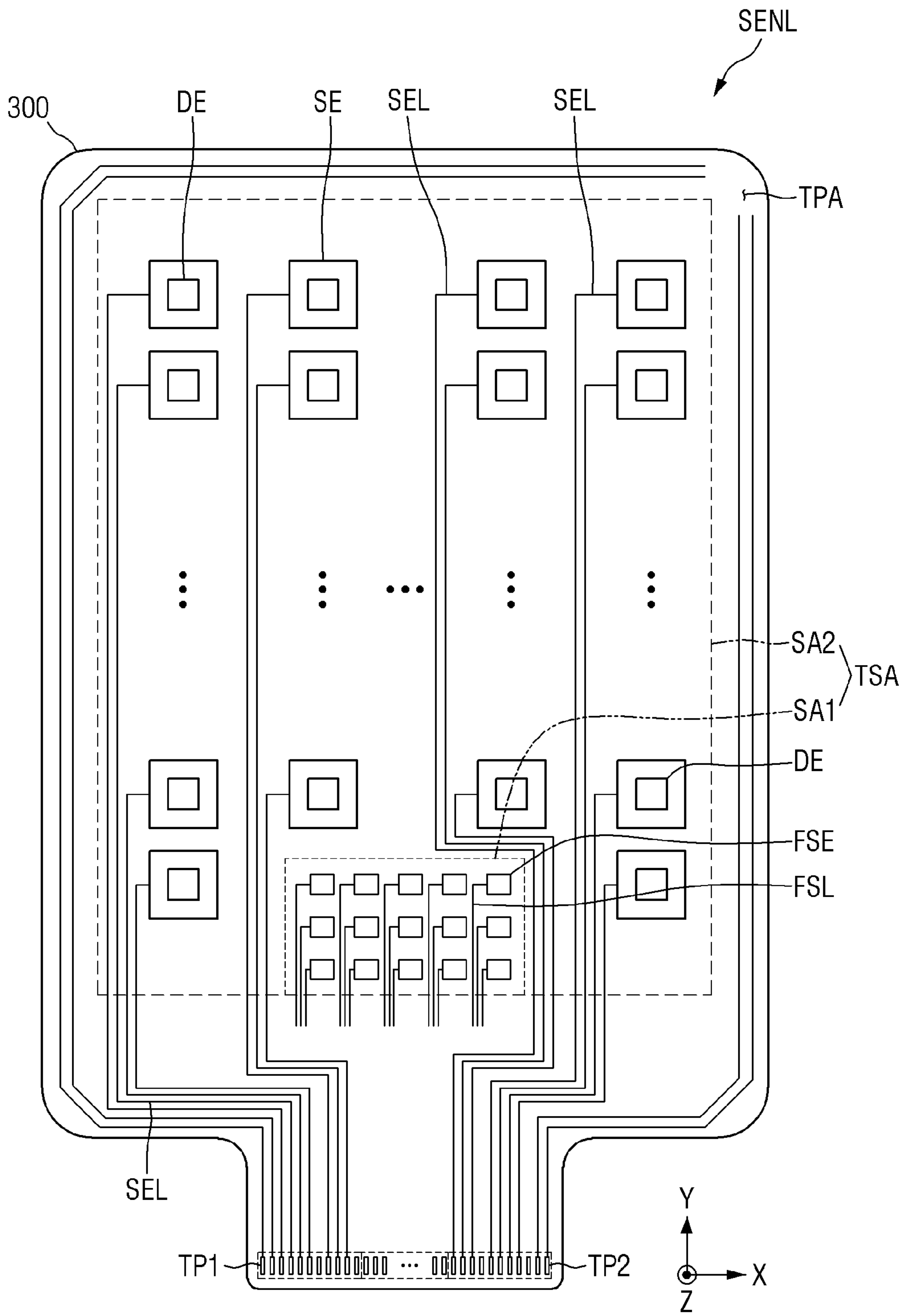

FIG. 151 is a view showing a layout of a sensor electrode layer of a display panel according to an embodiment.

Figure 152:
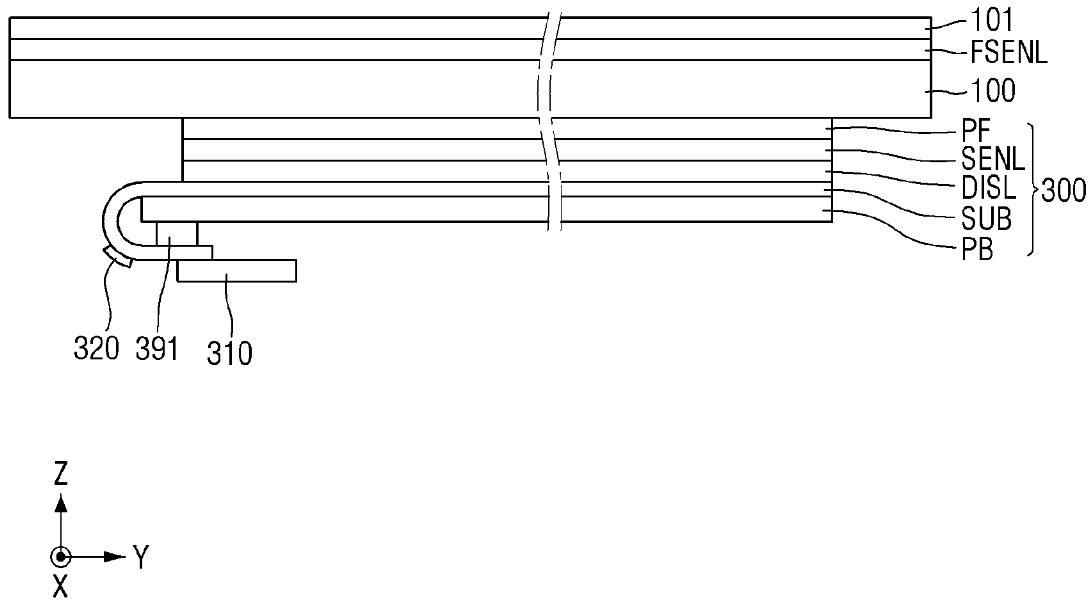

FIG. 152 is a schematic cross-sectional view showing a display panel and a cover window according to an embodiment.

Figure 153:
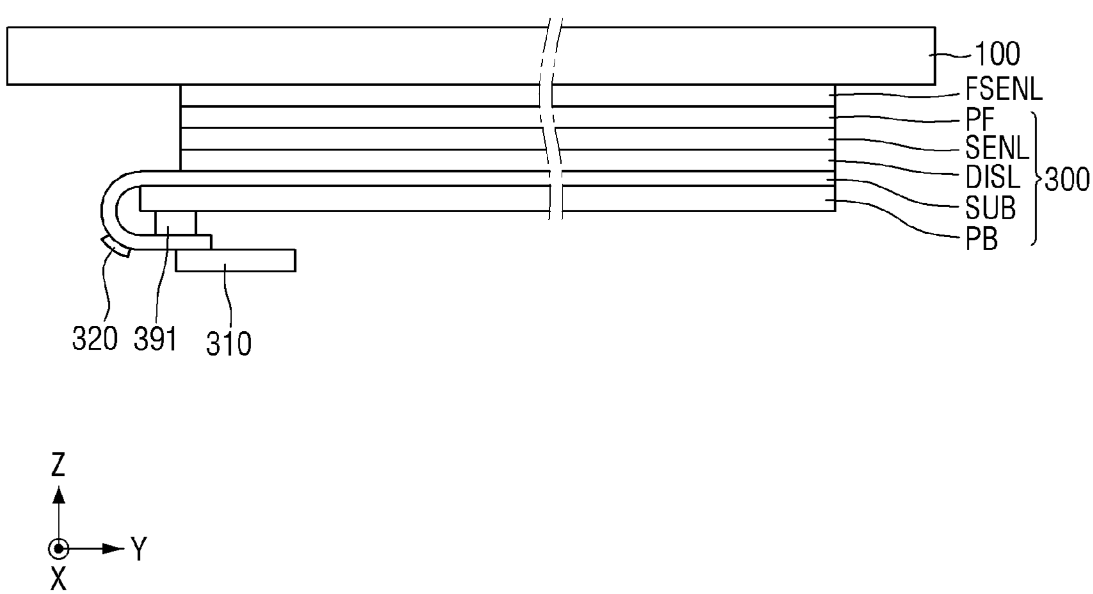

FIG. 153 is a schematic cross-sectional view showing a display panel and a cover window according to an embodiment.

Figure 154:
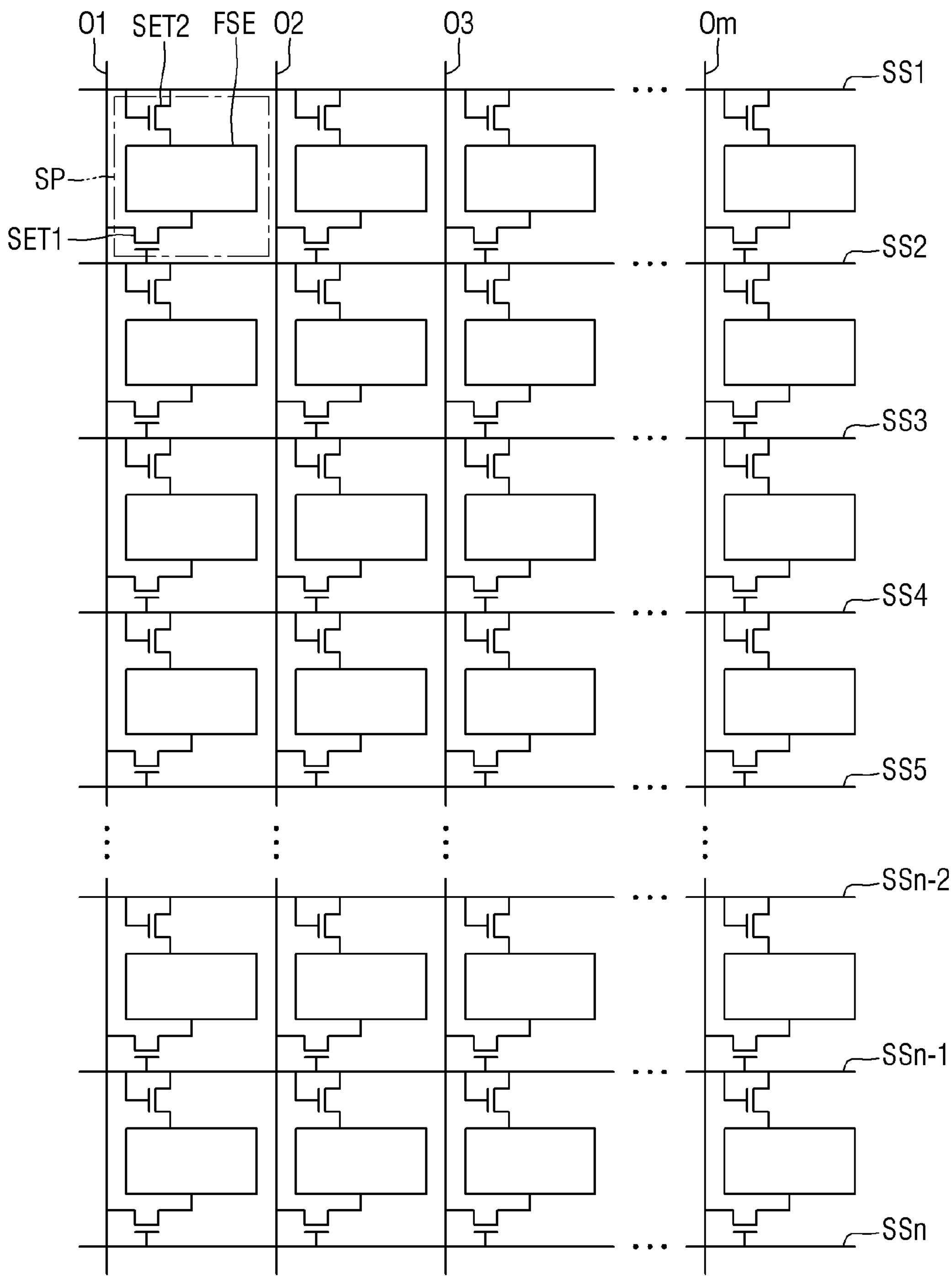

FIG. 154 is a view showing an example of a layout of the fingerprint sensor layer of FIG. 152.

Figure 155:
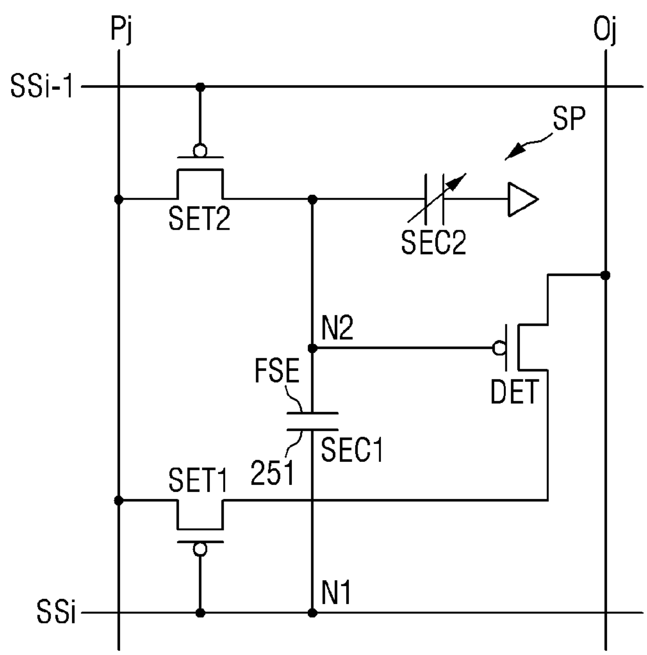

FIG. 155 is an equivalent circuit diagram showing an example of a sensor pixel of the fingerprint sensor layer of FIG. 154.

Figure 156:
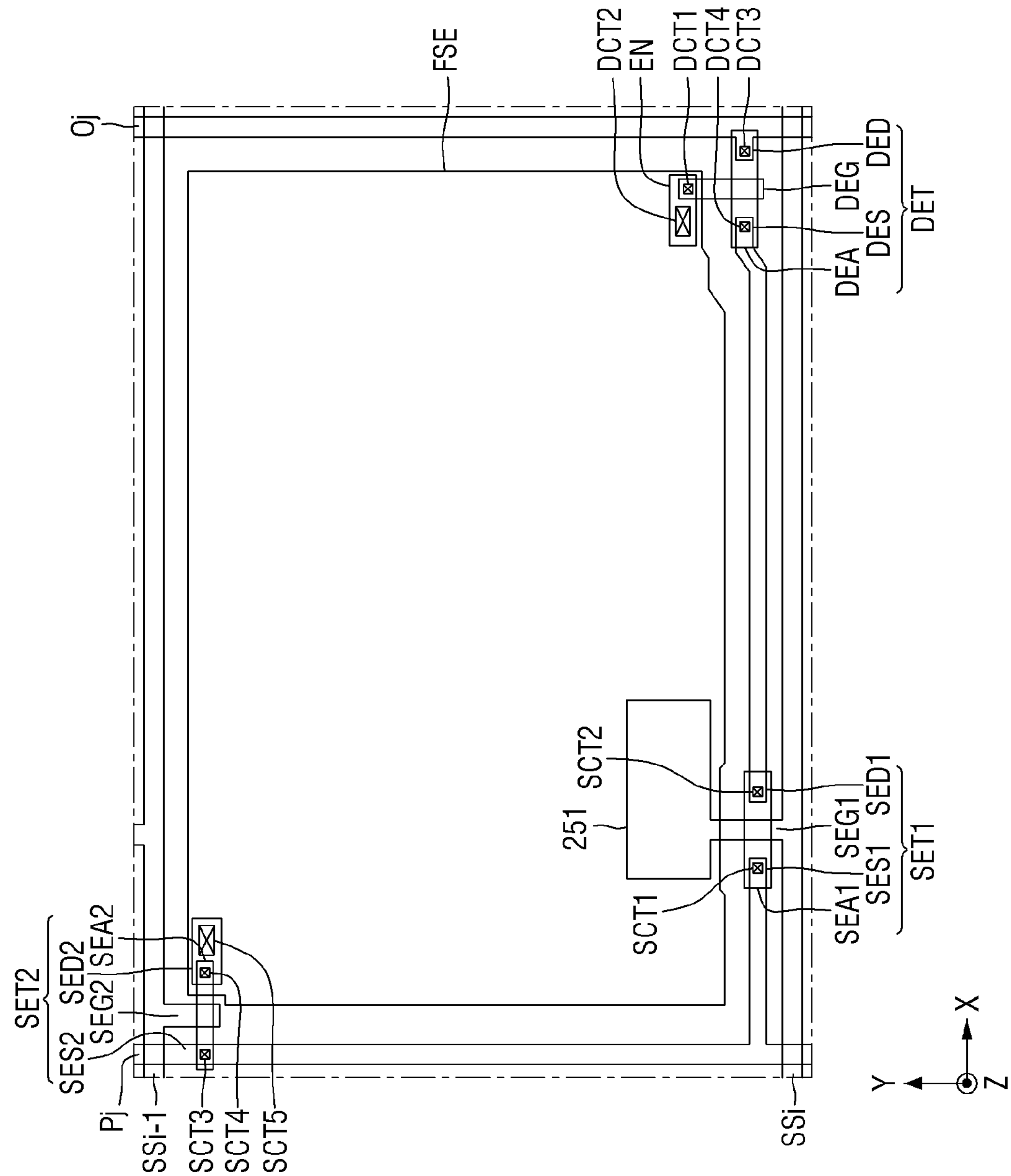

FIG. 156 is a view showing an example of a layout of a sensor pixel of the fingerprint sensor layer of FIG. 155.

Figure 157:
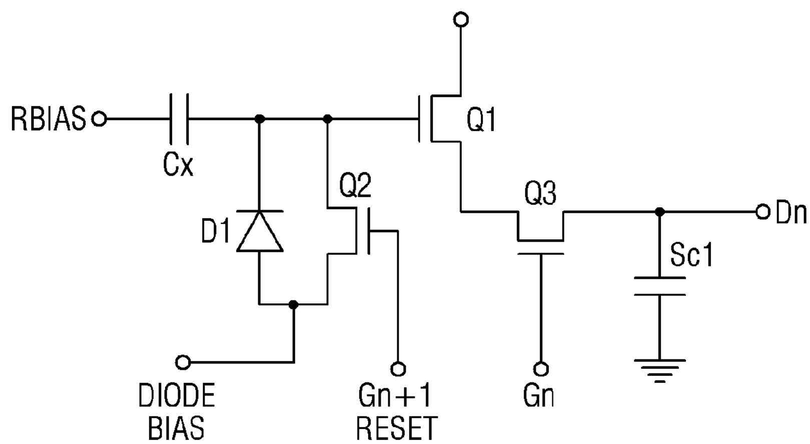

FIG. 157 is an equivalent circuit diagram showing another example of a sensor pixel of the fingerprint sensor layer of FIG. 154.

Figure 158:
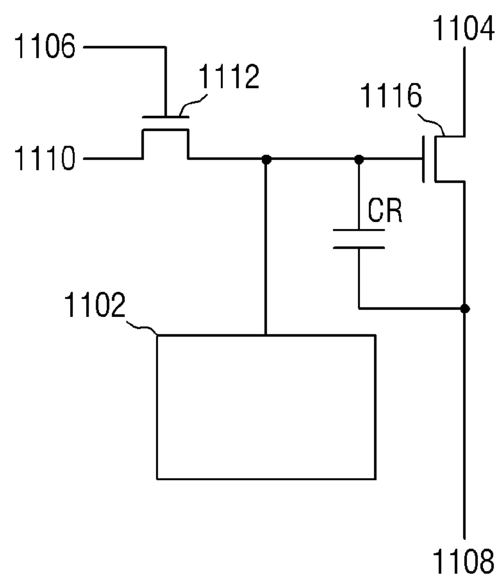

FIG. 158 is an equivalent circuit diagram showing another example of a sensor pixel of the fingerprint sensor layer of FIG. 154.

Figure 159:
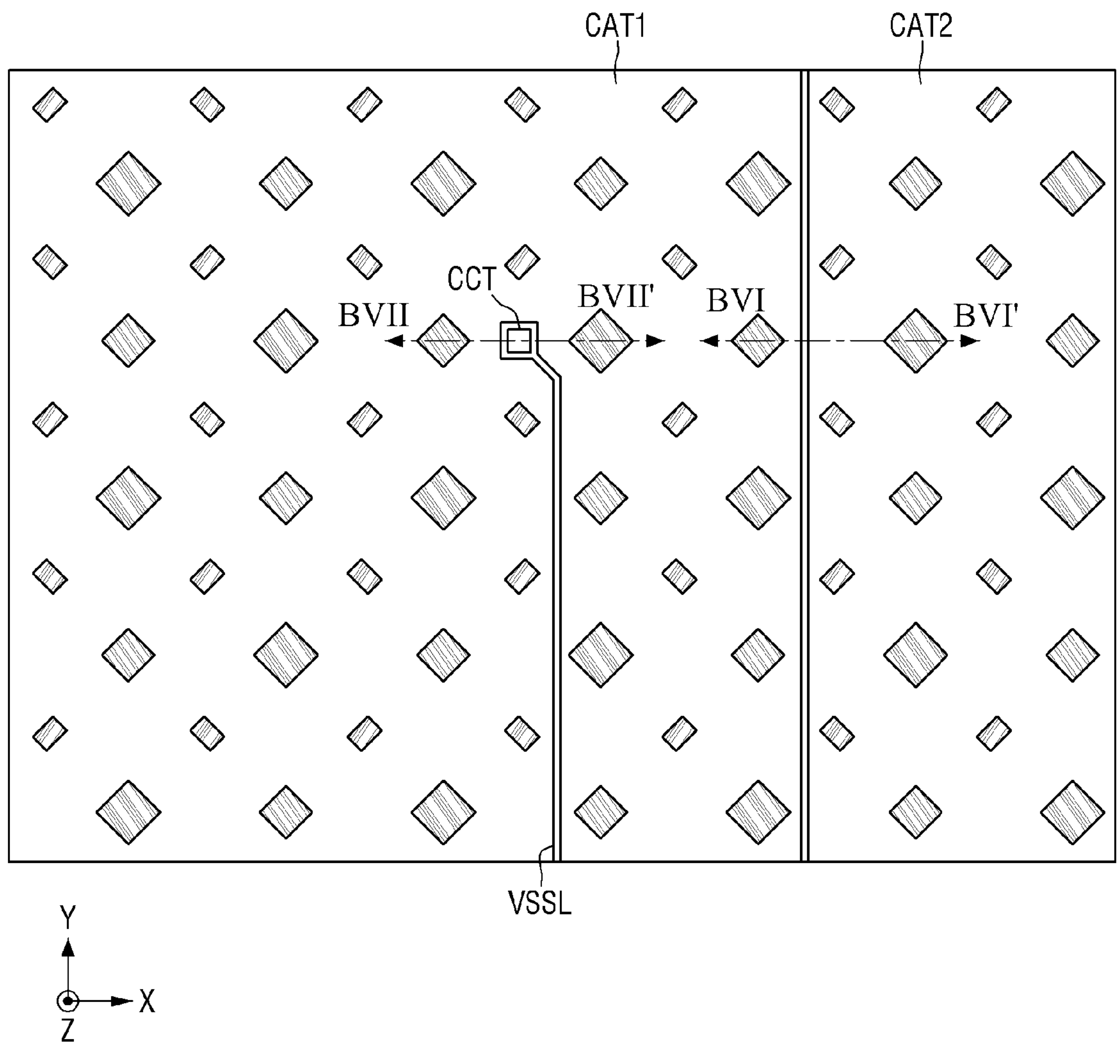

FIG. 159 is a view showing a layout of emission areas and second light-emitting electrodes of a display panel according to an embodiment.

Figure 160:
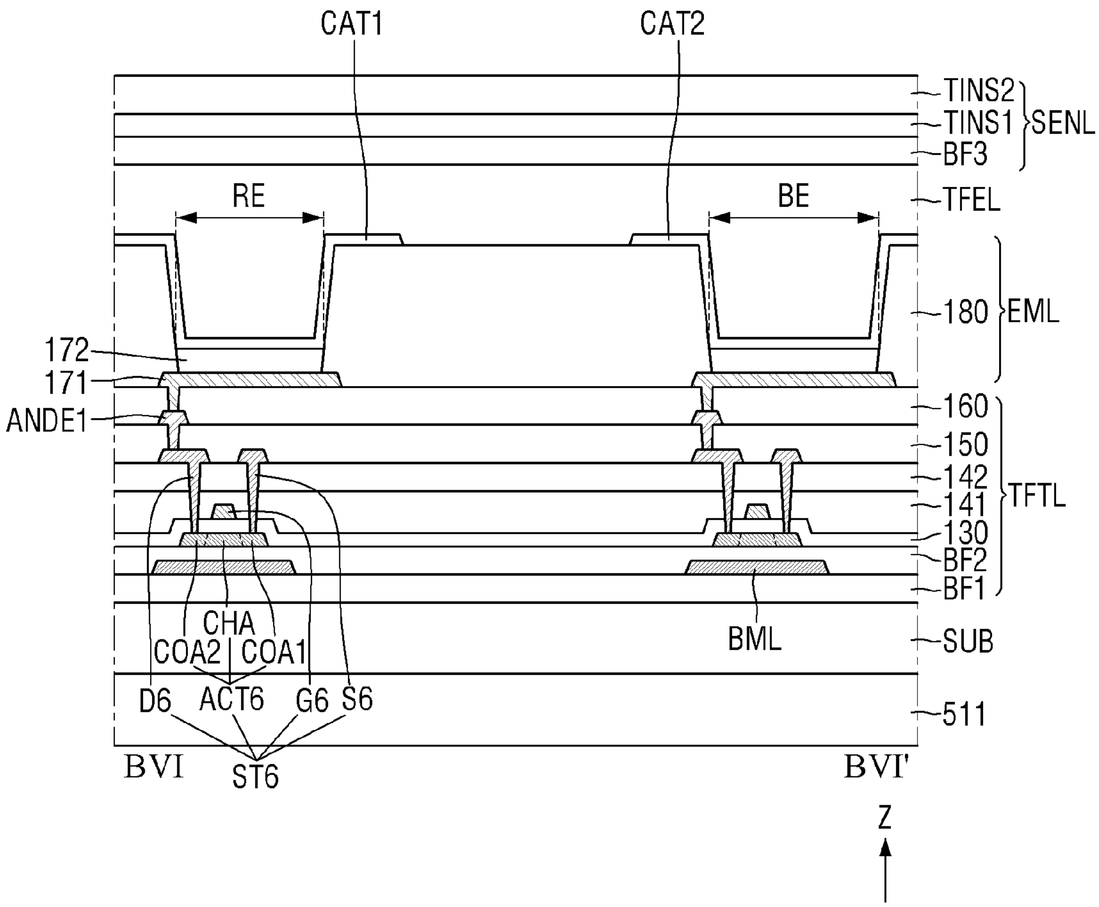
Figure 161:
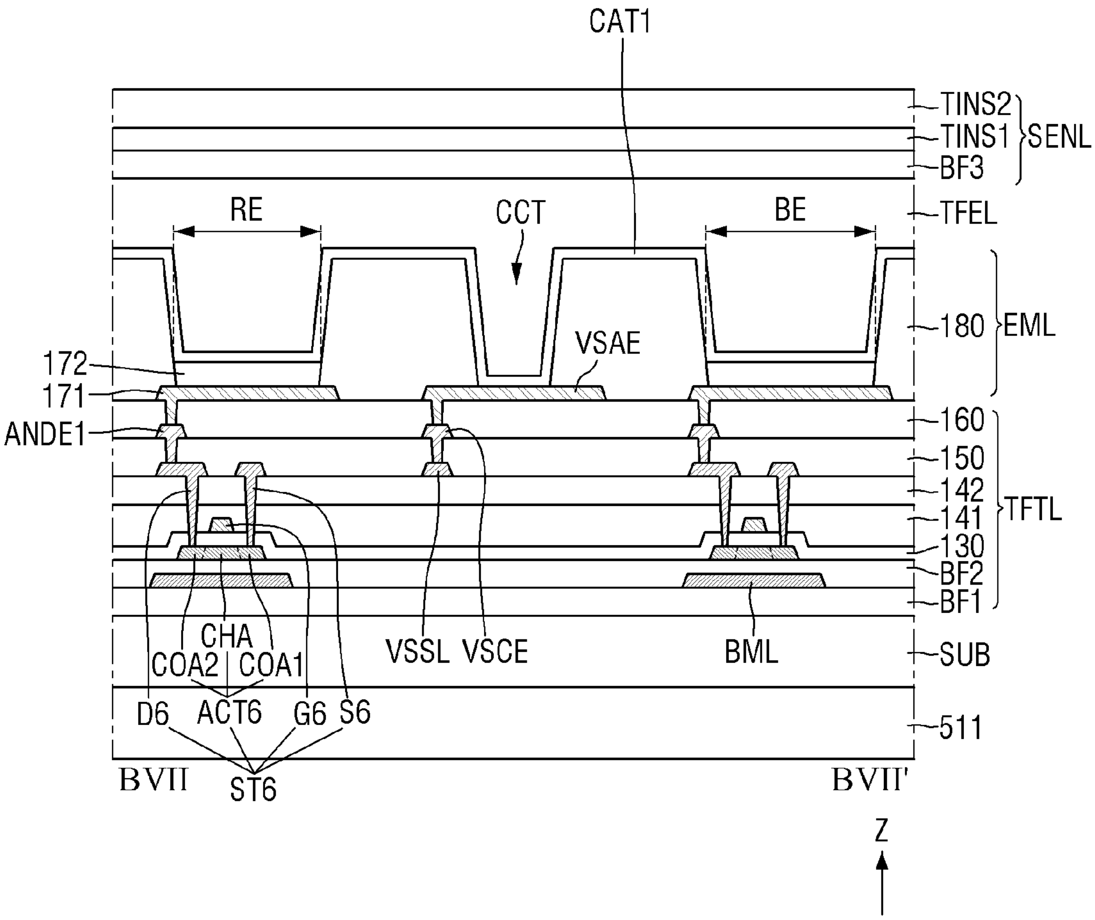

FIGS. 160 and 161 are schematic cross-sectional views showing an example of the emission areas and second light-emitting electrodes of the display panel of FIG. 159.

Figure 162:
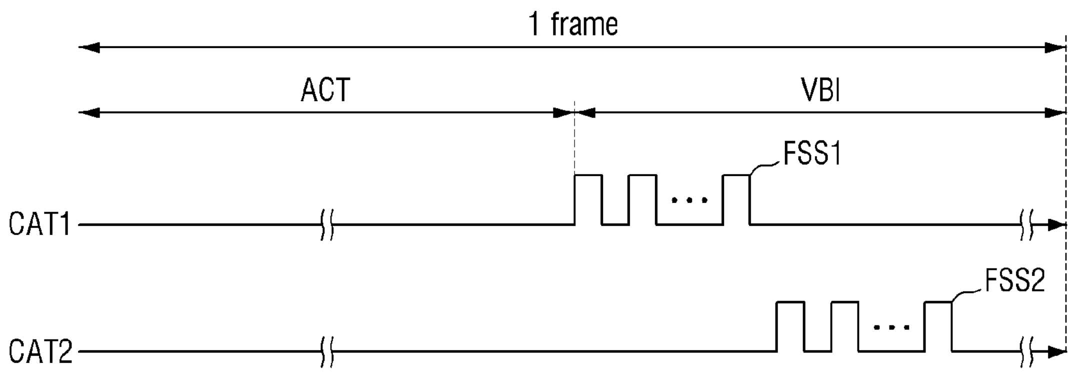

FIG. 162 is a waveform diagram showing cathode voltages applied to second light-emitting electrodes during an active period and a blank period of a single frame.

Figure 163:
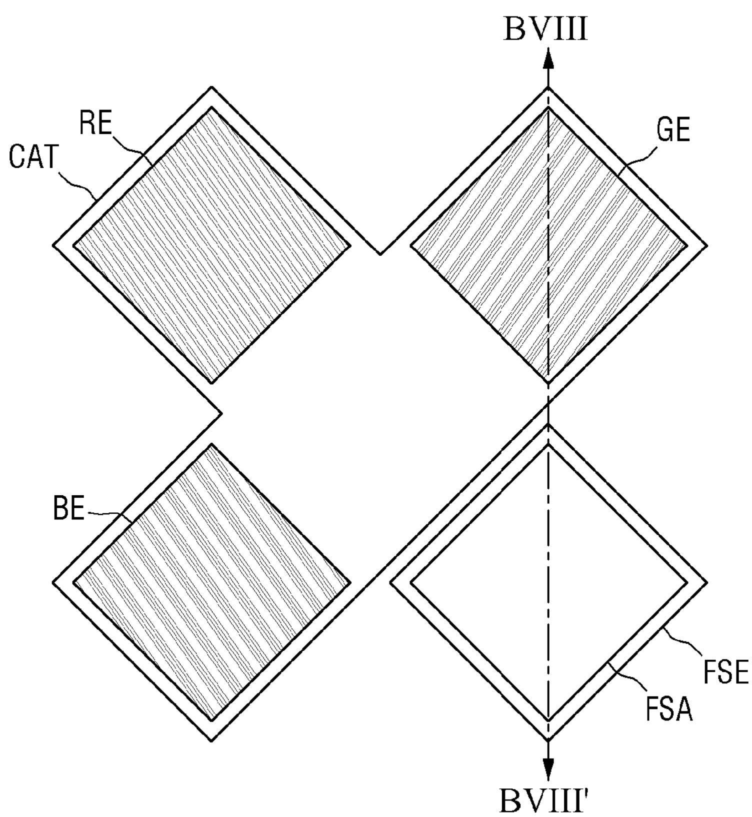

FIG. 163 is a view showing a layout of emission areas and second light-emitting electrodes of a display panel according to another embodiment.

Figure 164:
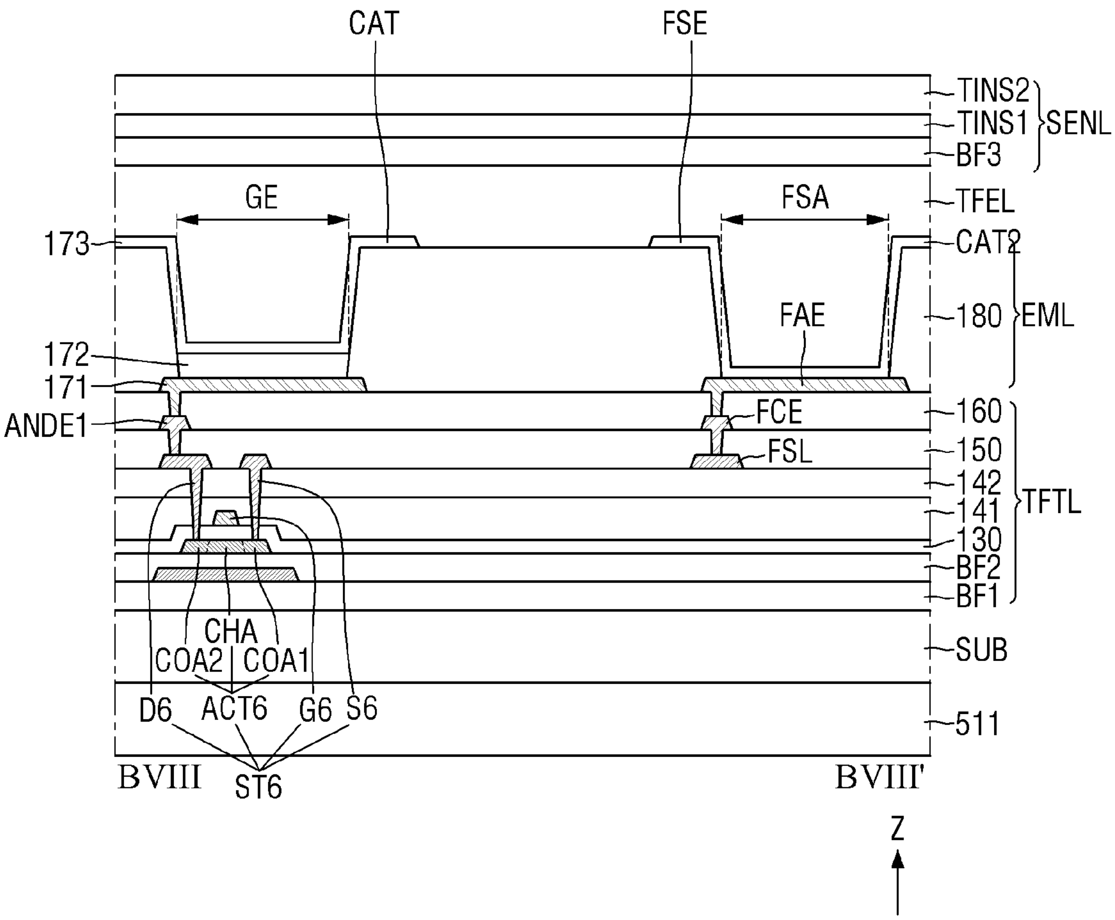

FIG. 164 is a schematic cross-sectional view showing an example of the emission areas and second light-emitting electrodes of the display panel of FIG. 163.

Figure 165:
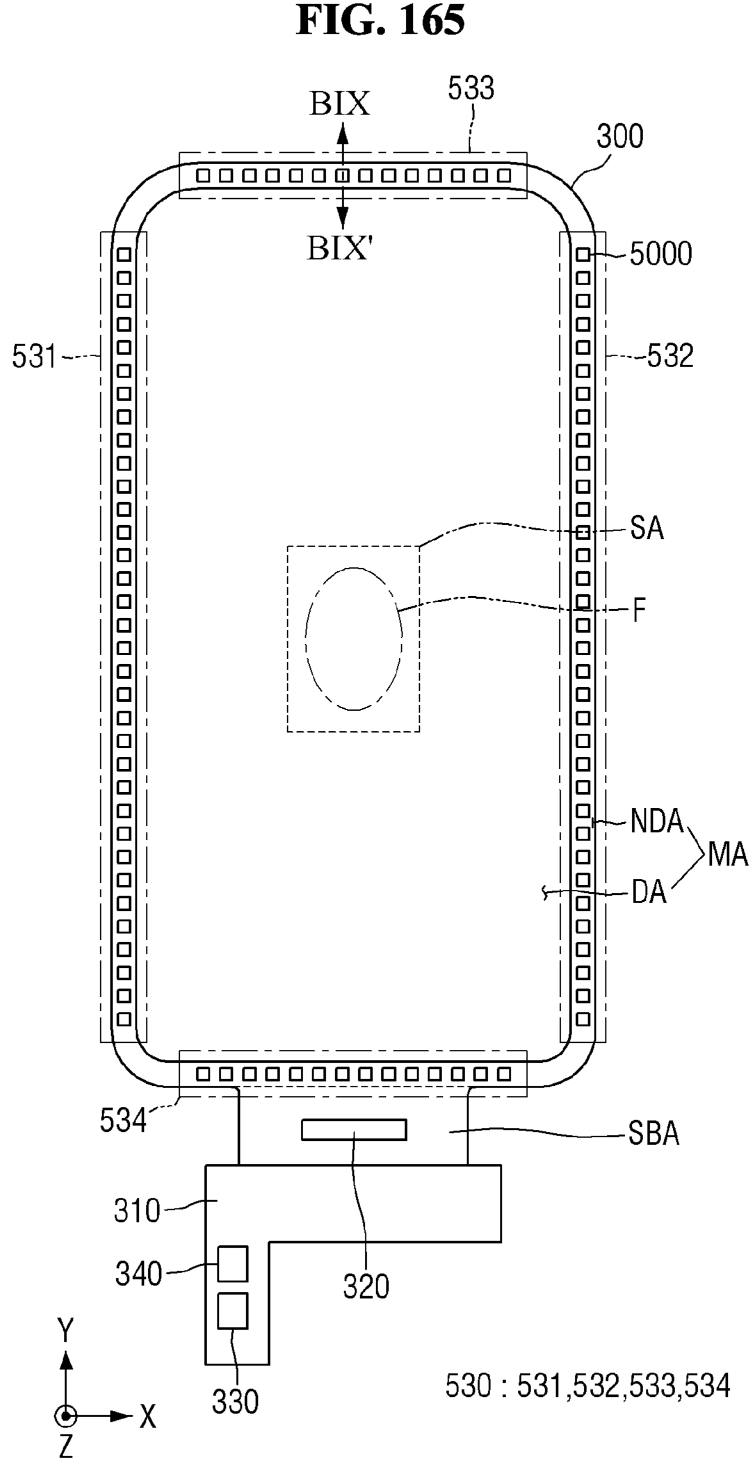

FIG. 165 is a view showing a layout of a display area and a non-display area of a display panel and an ultrasonic sensor according to an embodiment.

Figure 166:
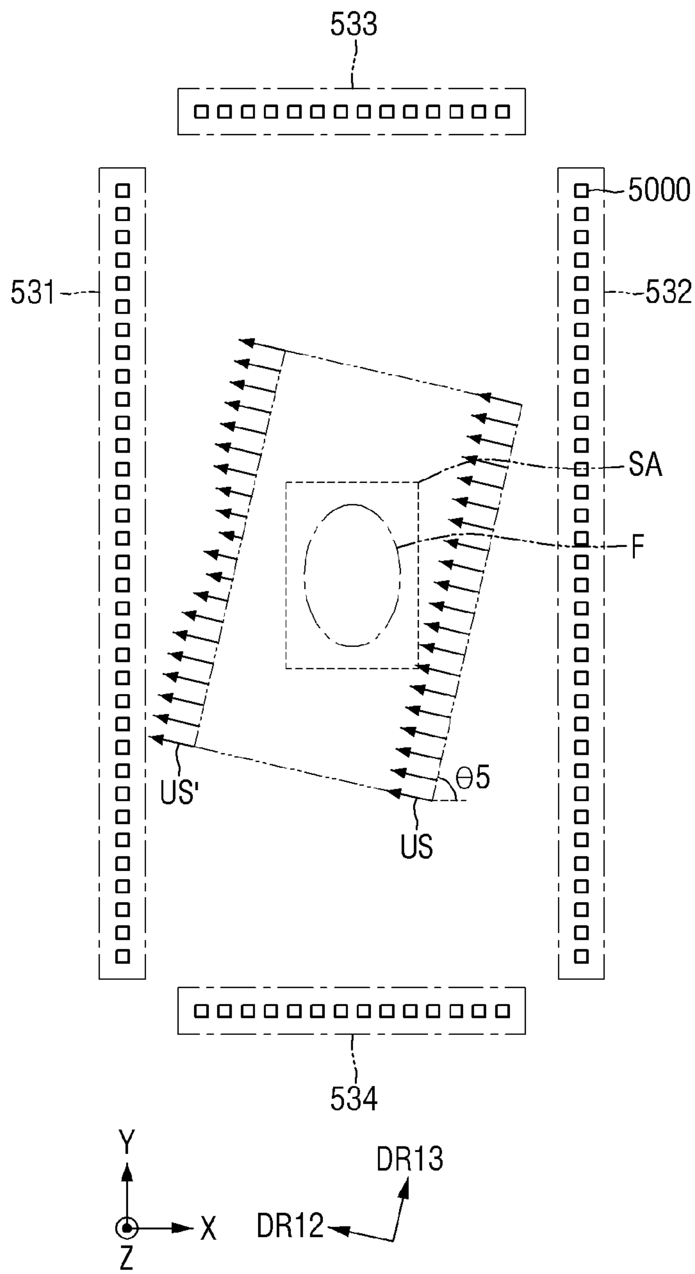

FIG. 166 is a view showing an example of a method of sensing ultrasonic waves using ultrasonic signals of the sound converts of FIG. 165.

Figure 167:
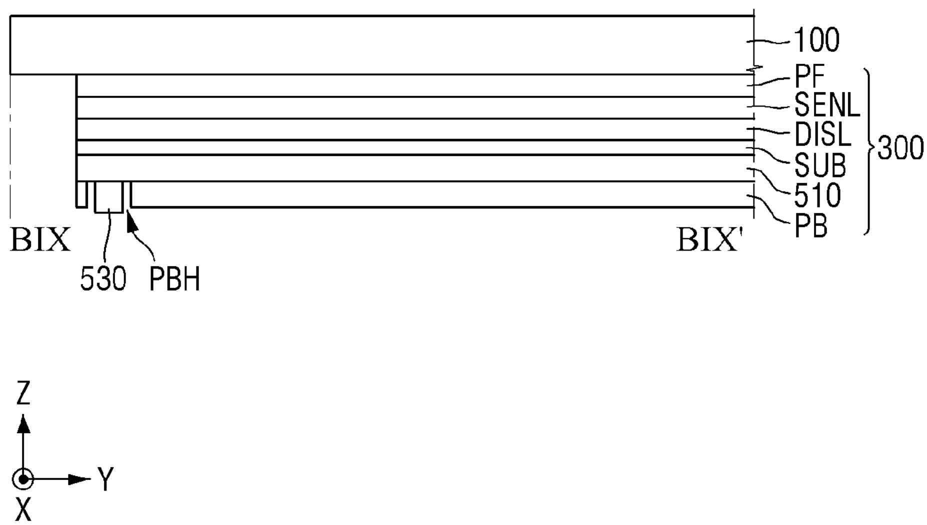

FIG. 167 is a schematic cross-sectional view showing the display panel and the sound converters of FIG. 165.

Figure 168:
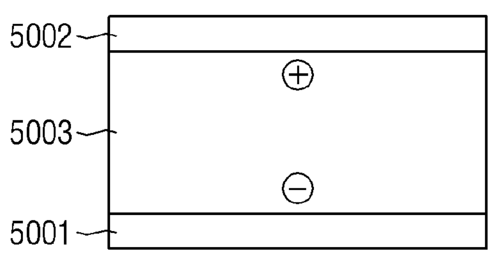

FIG. 168 is a schematic cross-sectional view showing an example of the sound converters of FIG. 165.

Figure 169:
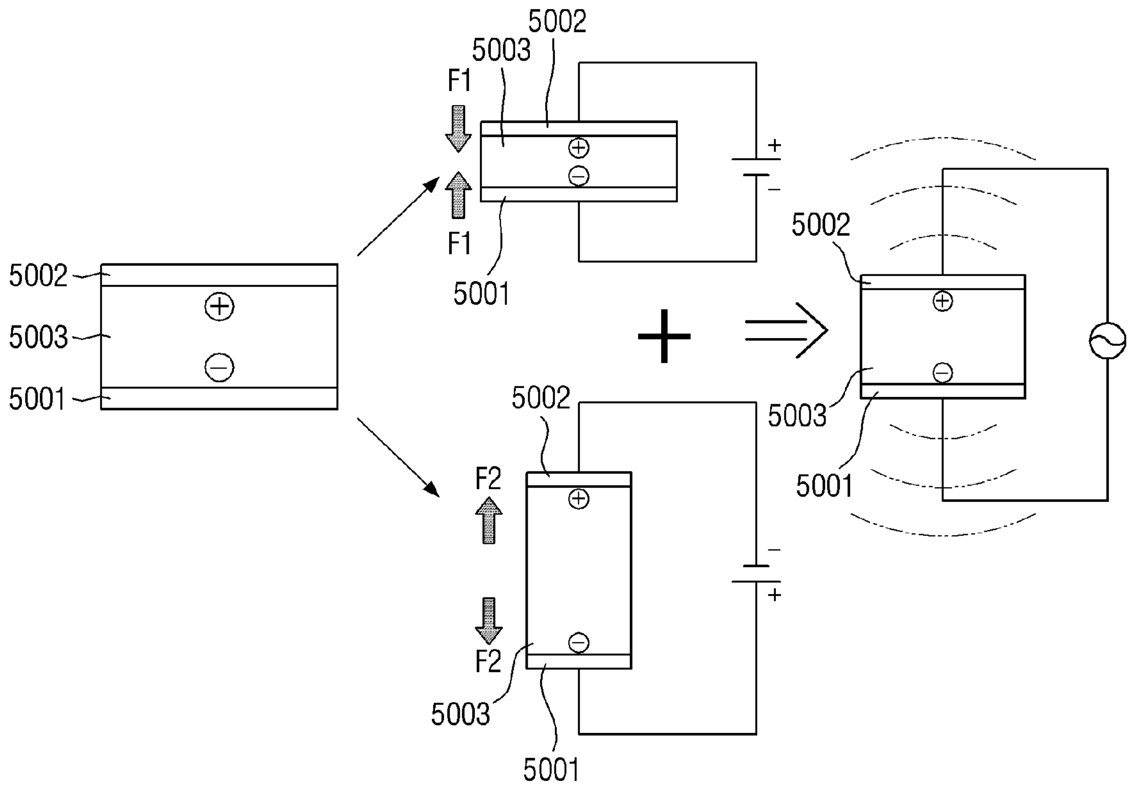

FIG. 169 is a view showing an example of a method of vibrating a vibration layer disposed between a first branch electrode and a second branch electrode of the sound converter of FIG. 168.

Figure 170:
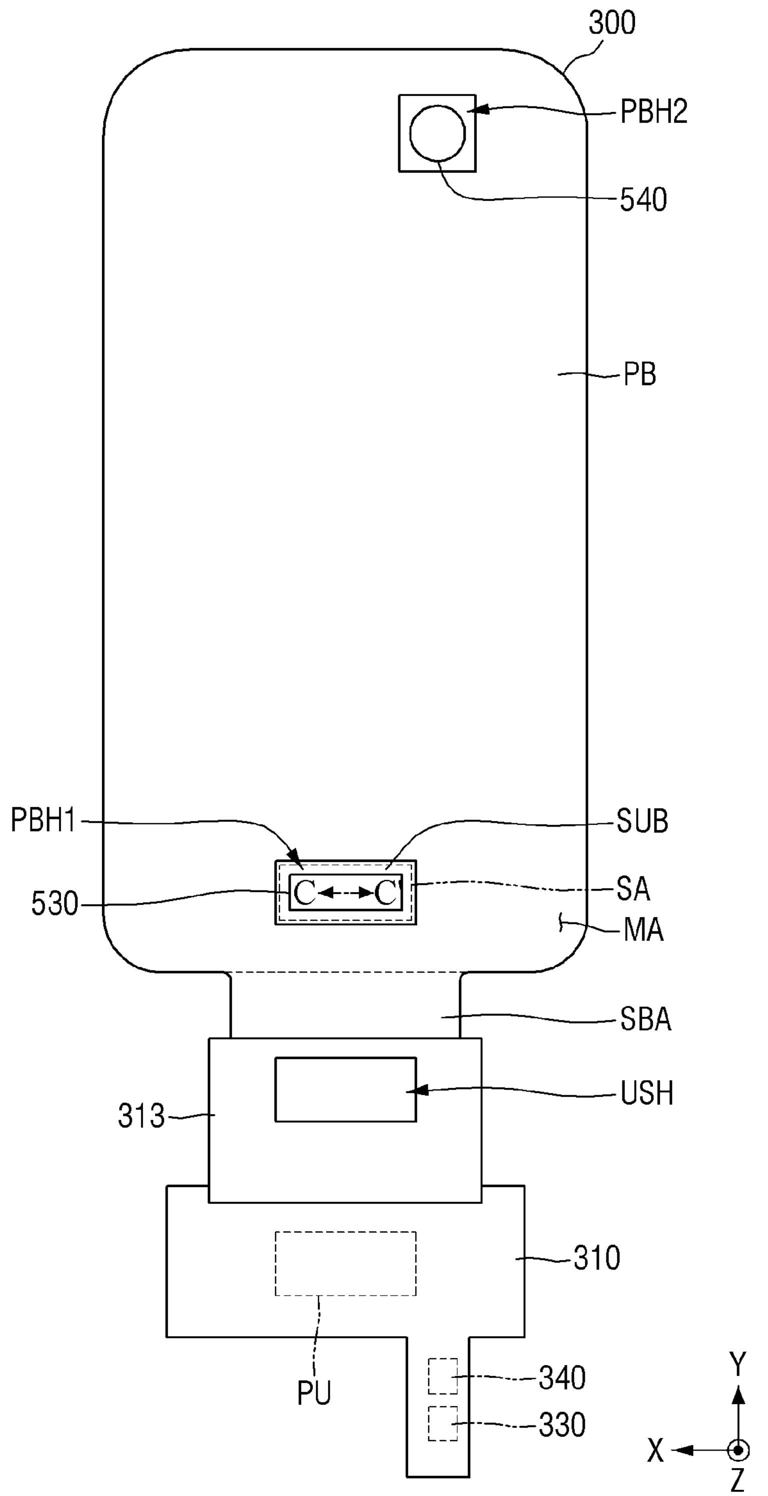
Figure 171:
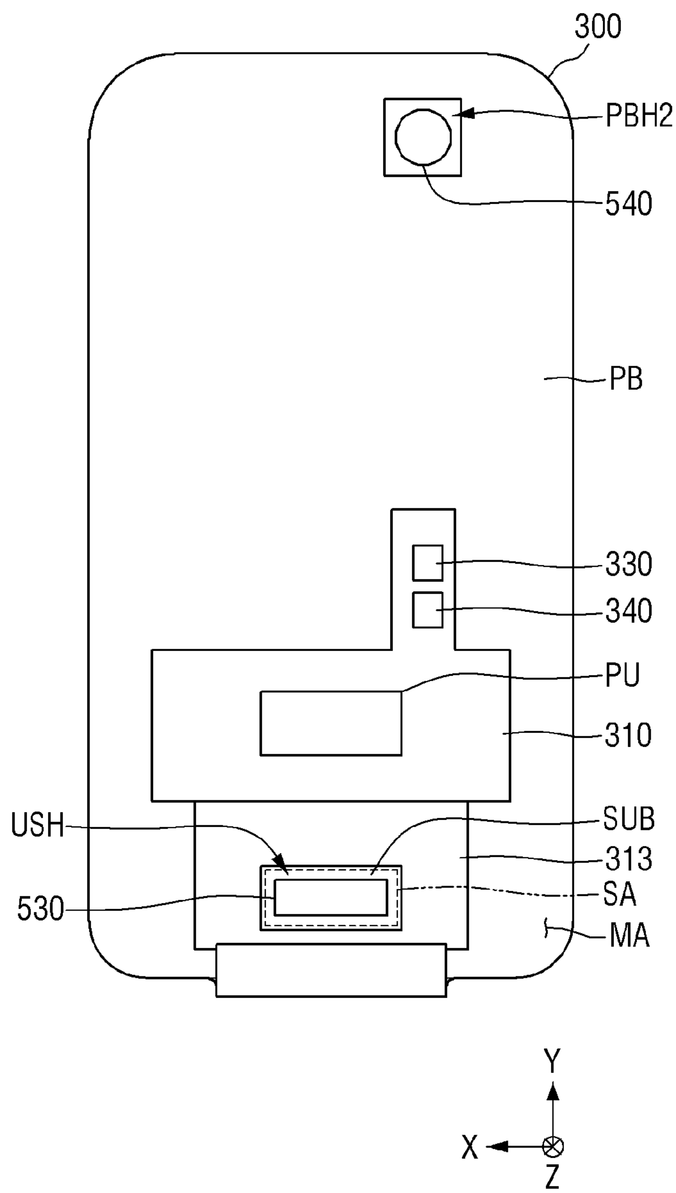

FIGS. 170 and 171 are bottom views showing a display panel according to an embodiment.

Figure 172:
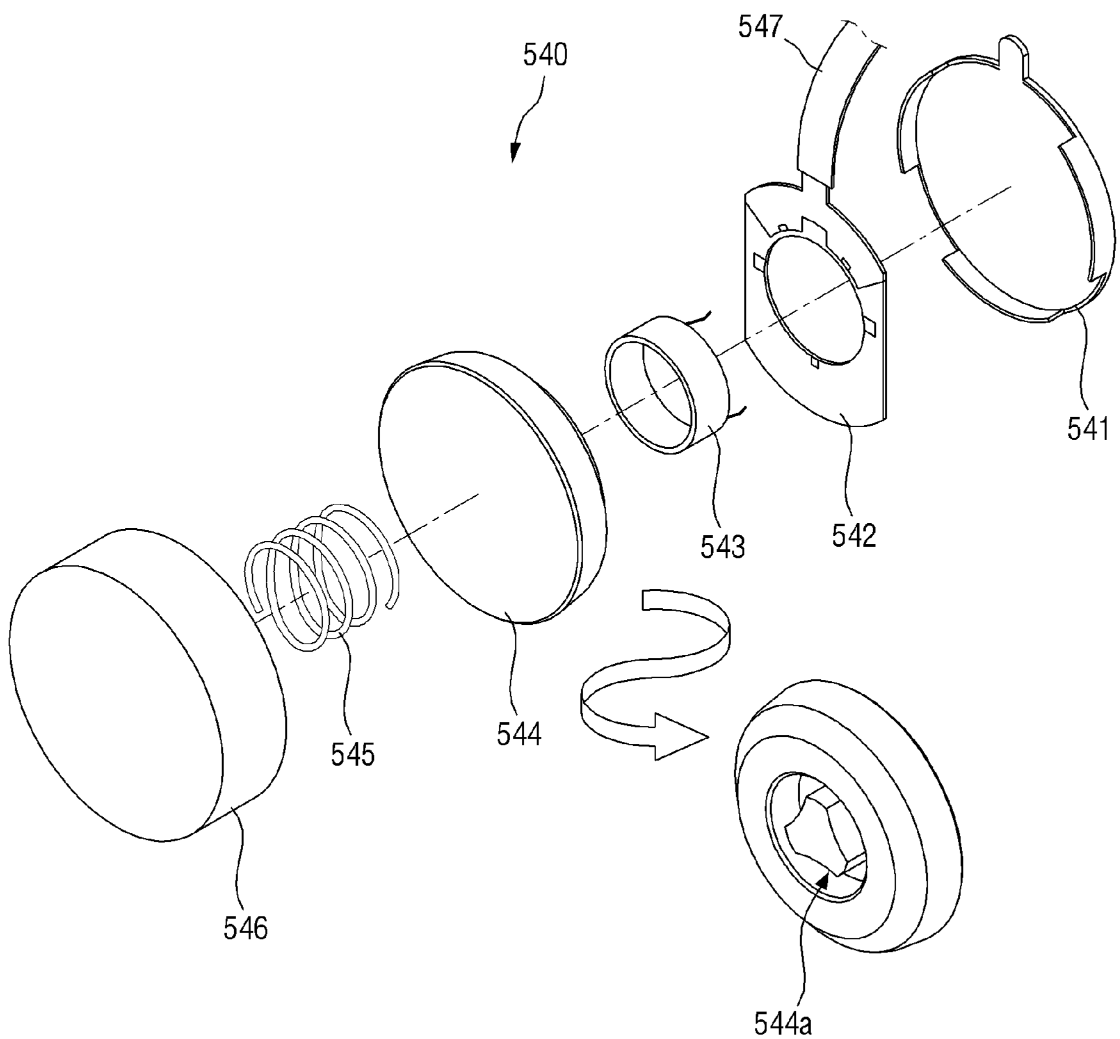

FIG. 172 is a perspective view showing an example of the sound generator of FIGS. 170 and 171.

Figure 173:
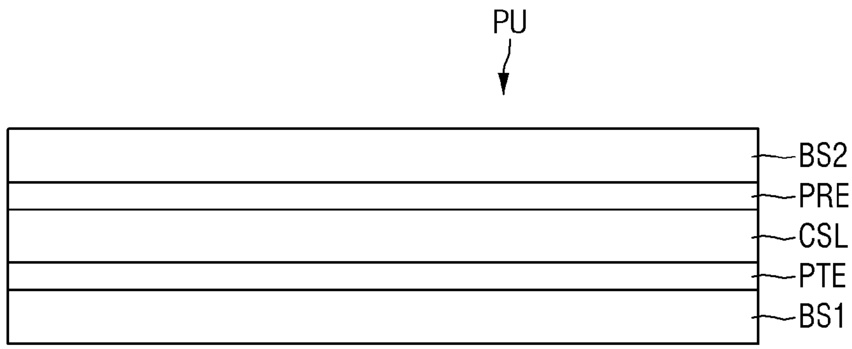

FIG. 173 is a schematic cross-sectional view showing an example of the pressure sensor of FIGS. 170 and 171.

Figure 174:
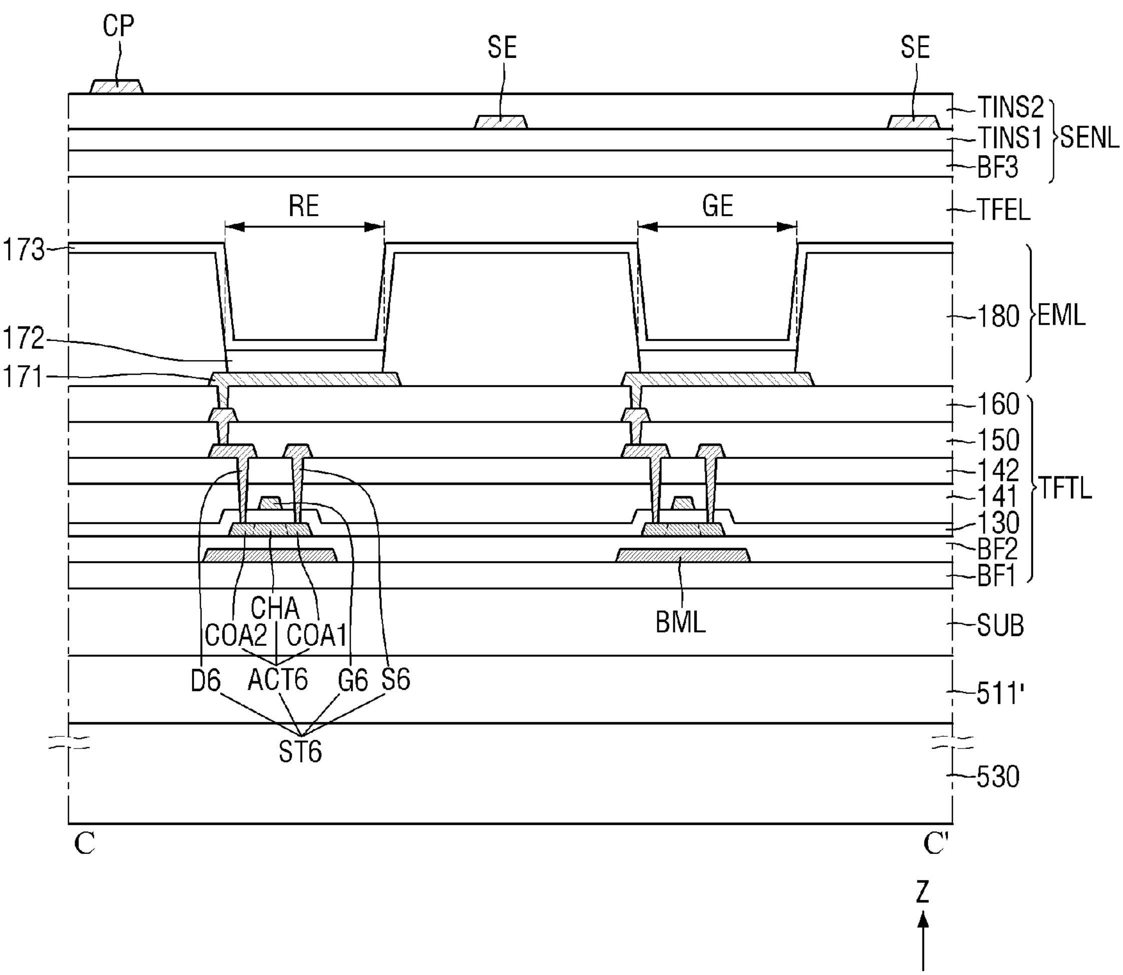

FIG. 174 is a schematic cross-sectional view showing an example of the display panel of FIGS. 170 and 171.

Figure 175:
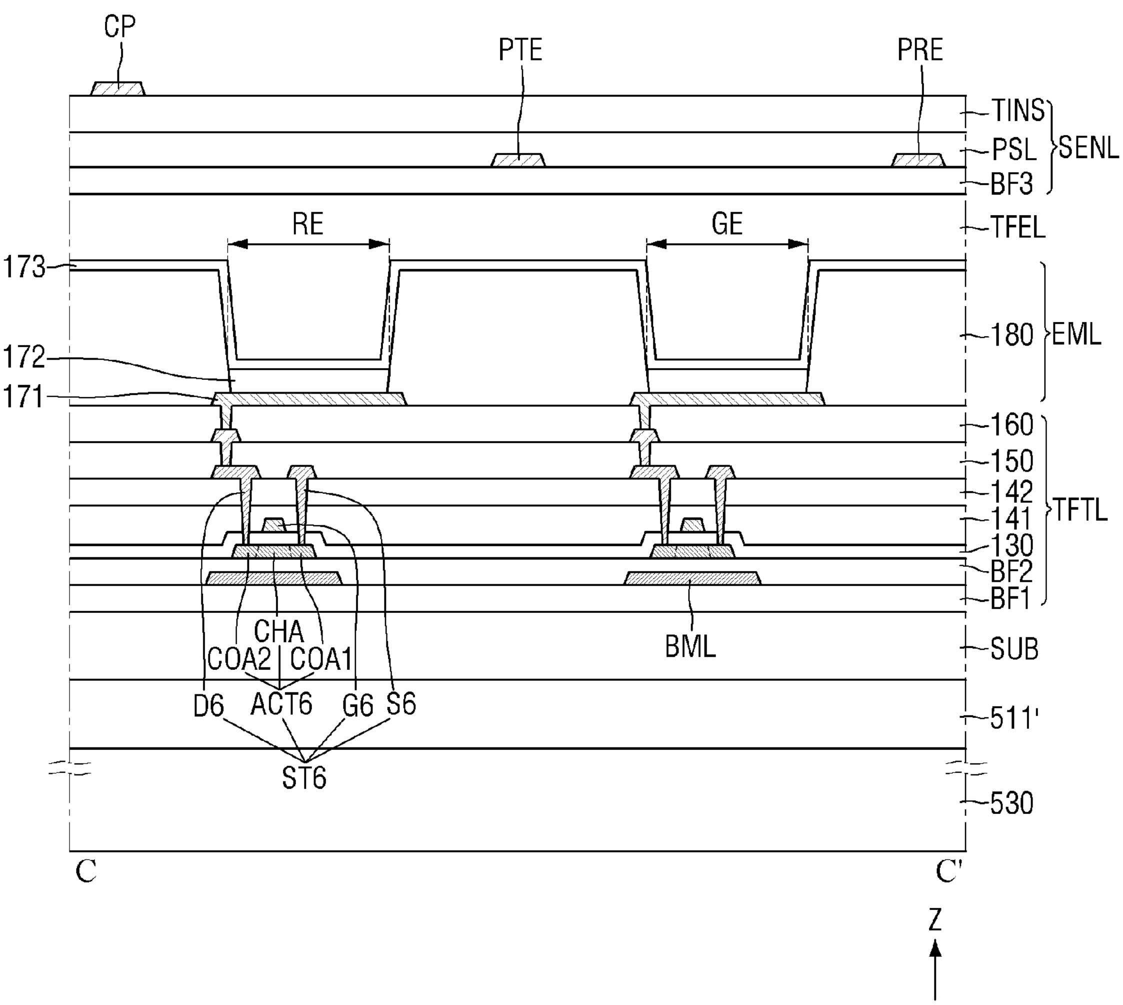

FIG. 175 is a schematic cross-sectional view showing another example of the display panel of FIGS. 170 and 171.

Figure 176:
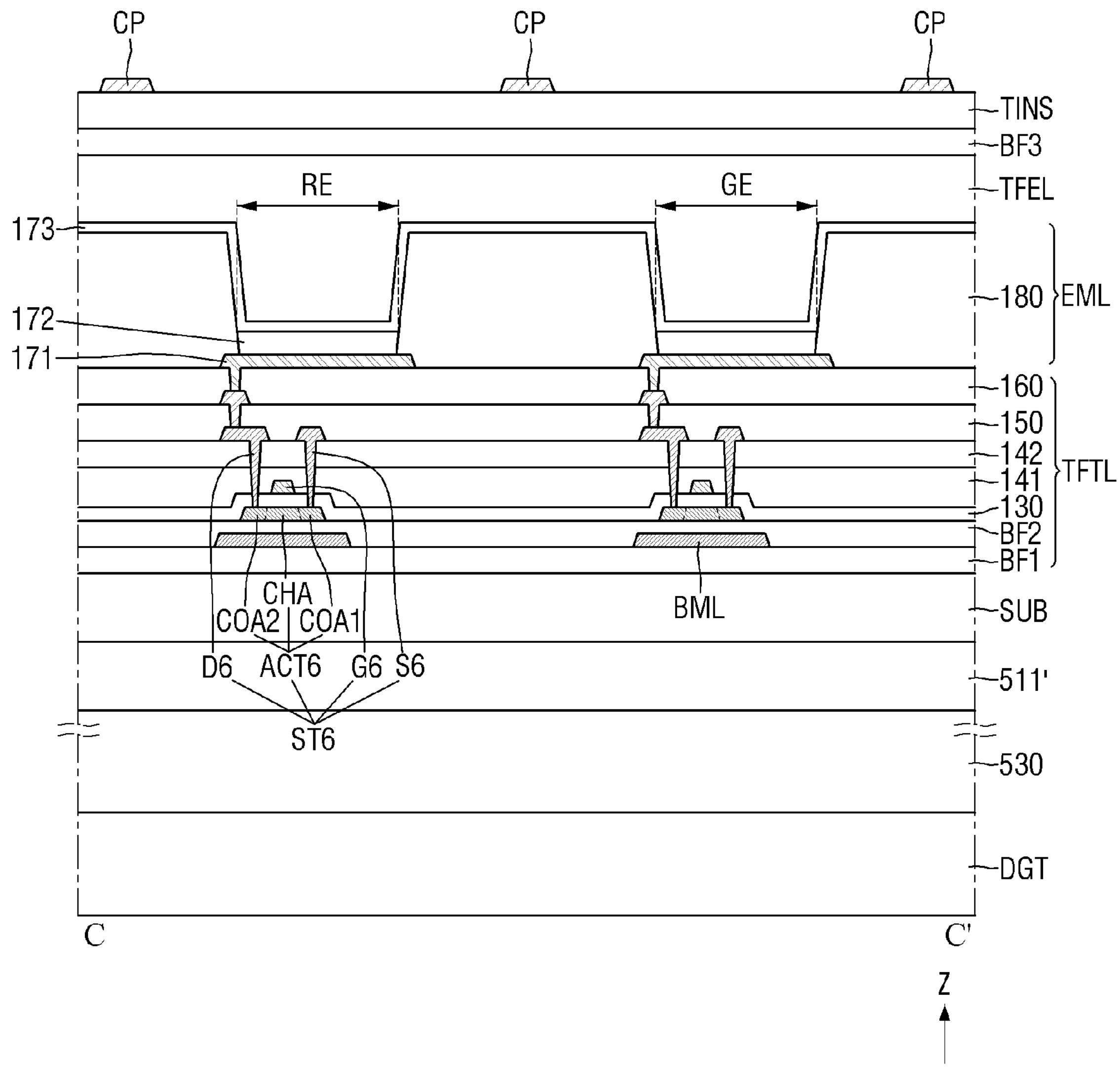

FIG. 176 is a schematic cross-sectional view showing another example of the display panel of FIGS. 170 and 171.

Figure 177:
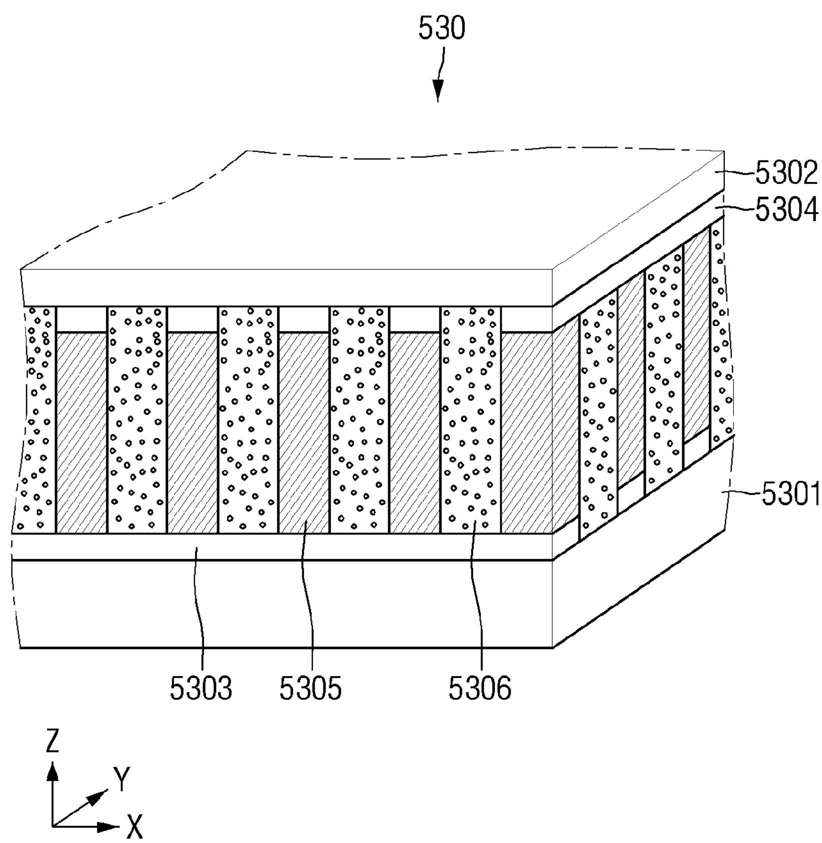

FIG. 177 is a perspective view showing an example of the ultrasonic sensor of FIGS. 170 and 171.

Figure 178:
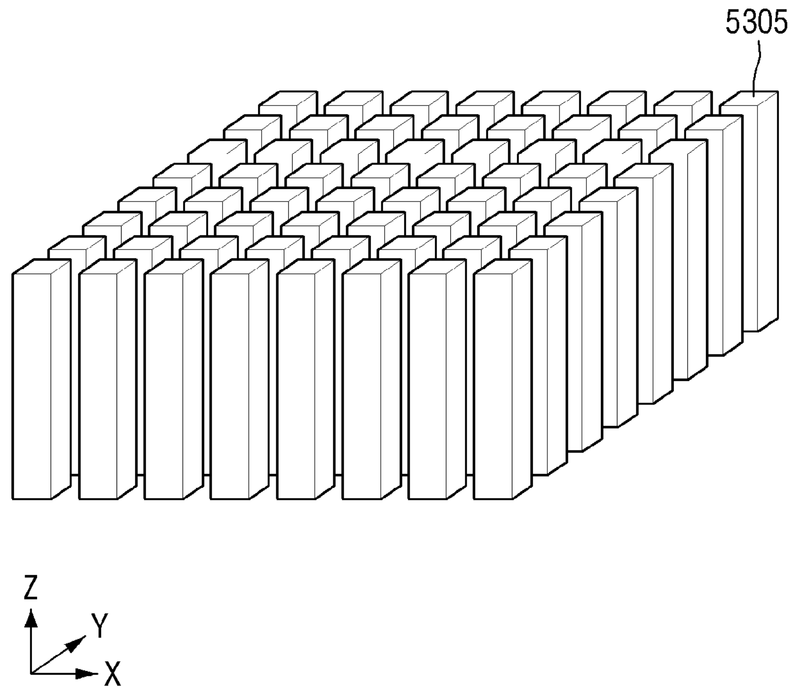

FIG. 178 is a view showing an arrangement of vibration elements of the ultrasonic sensor of FIG. 177.

Figure 179:
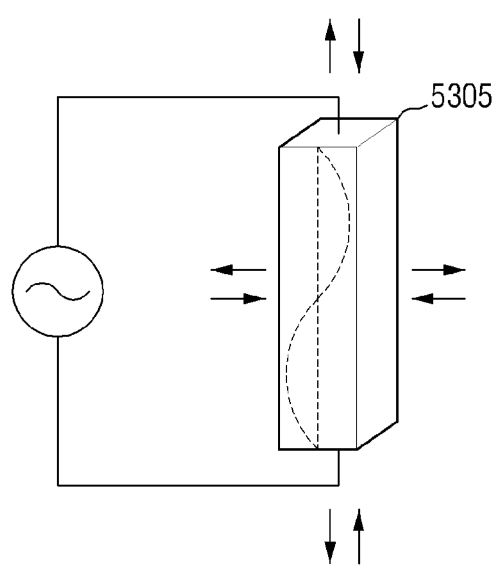

FIG. 179 is a view showing an example a method of vibrating a vibration element of the ultrasonic sensor of FIG. 177.

Figure 180:
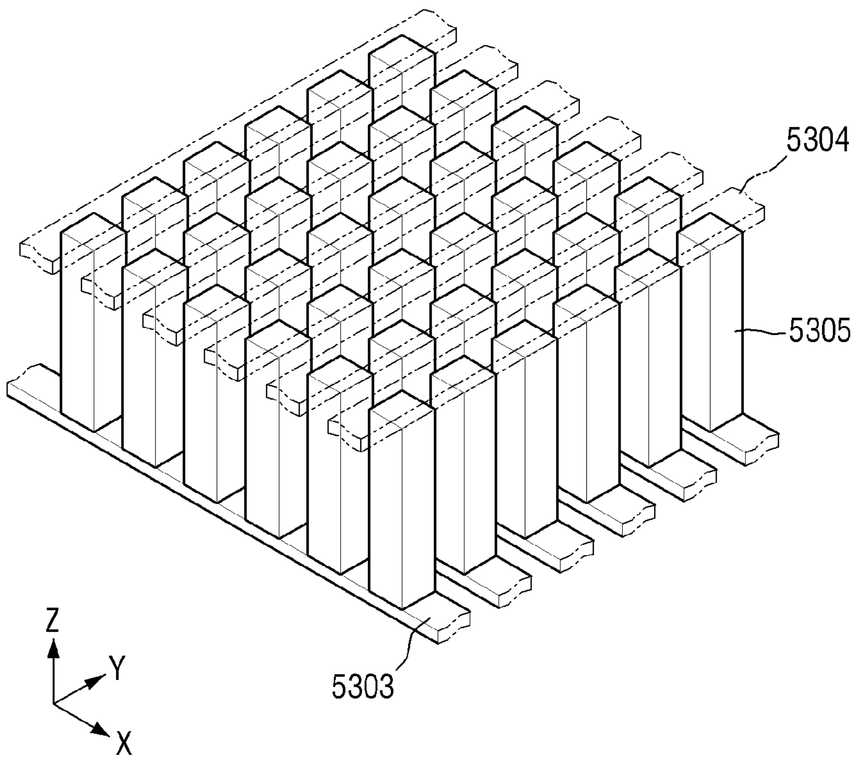

FIG. 180 is a view showing the first ultrasound electrodes, the second ultrasound electrodes and vibration elements of the ultrasound sensor of FIG. 177.

Figure 181:
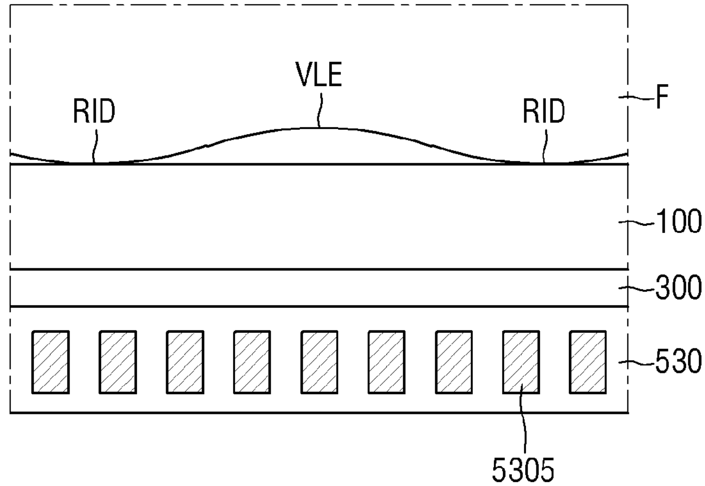

FIG. 181 is a view showing an example of a finger placed to overlap an ultrasonic sensor in order to recognize a fingerprint of the finger.

Figure 182:
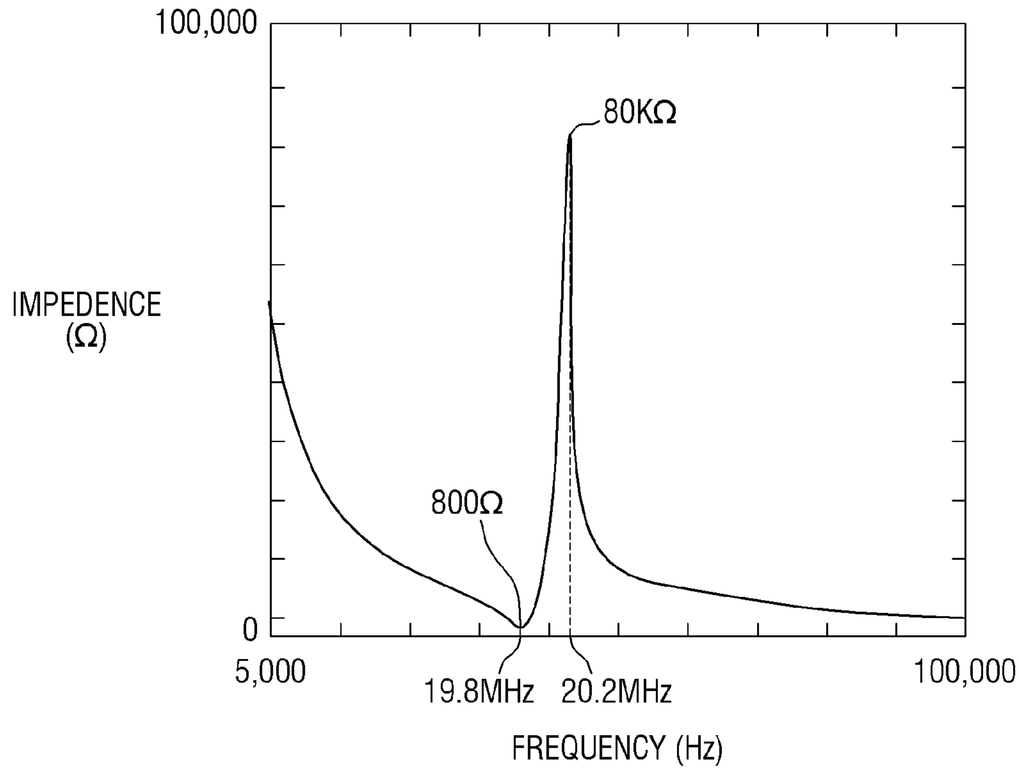
Figure 183:
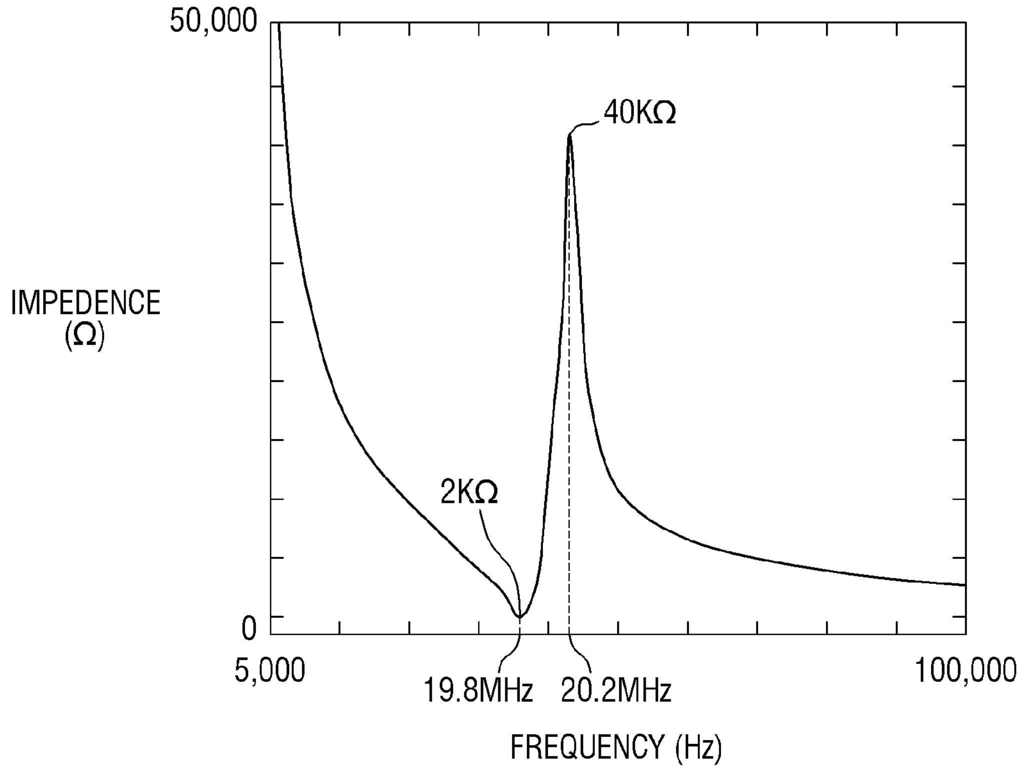

FIGS. 182 and 183 are graphs showing the impedance of a vibration element according to frequency acquired from the ridges and valleys of a person's fingerprint.

Figure 184:
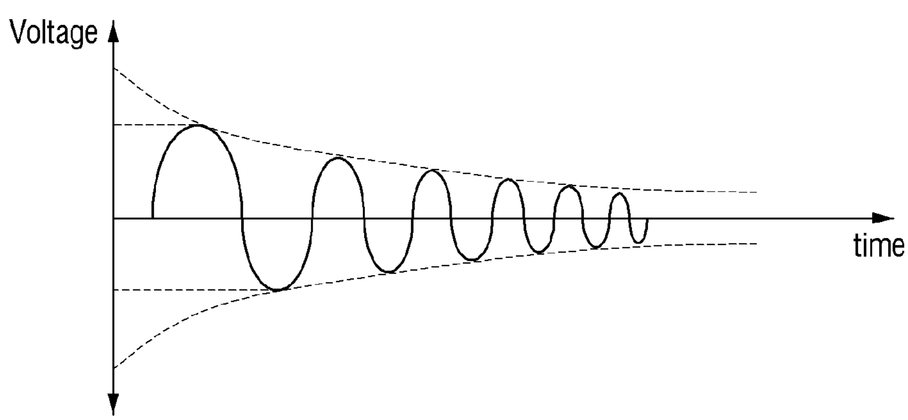

FIG. 184 is a waveform diagram showing an ultrasonic sensing signal sensed by a vibration element in an attenuation voltage mode.

Figure 185:
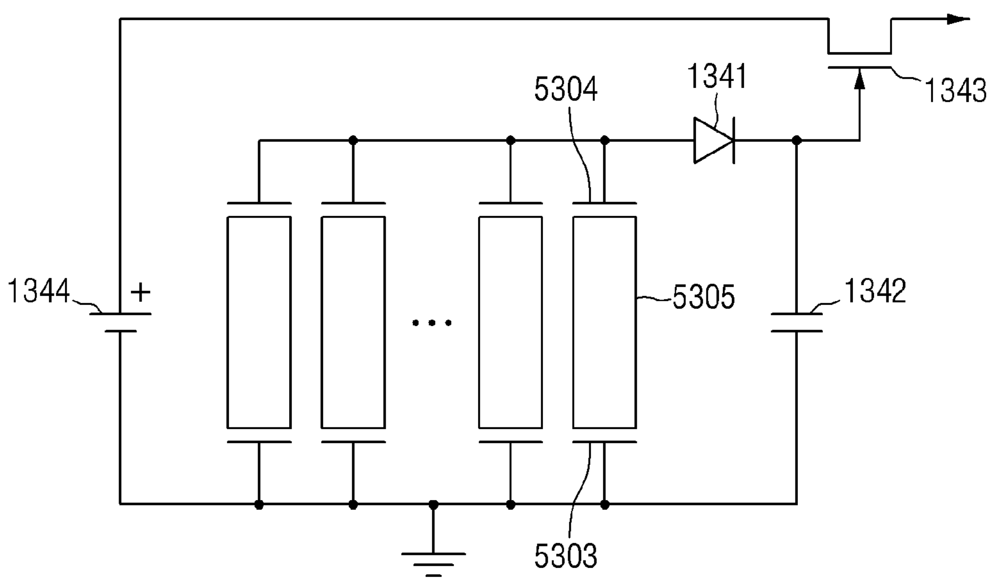

FIG. 185 is a view showing an example of an ultrasonic sensor in a pressure sensing mode.

Figure 186:
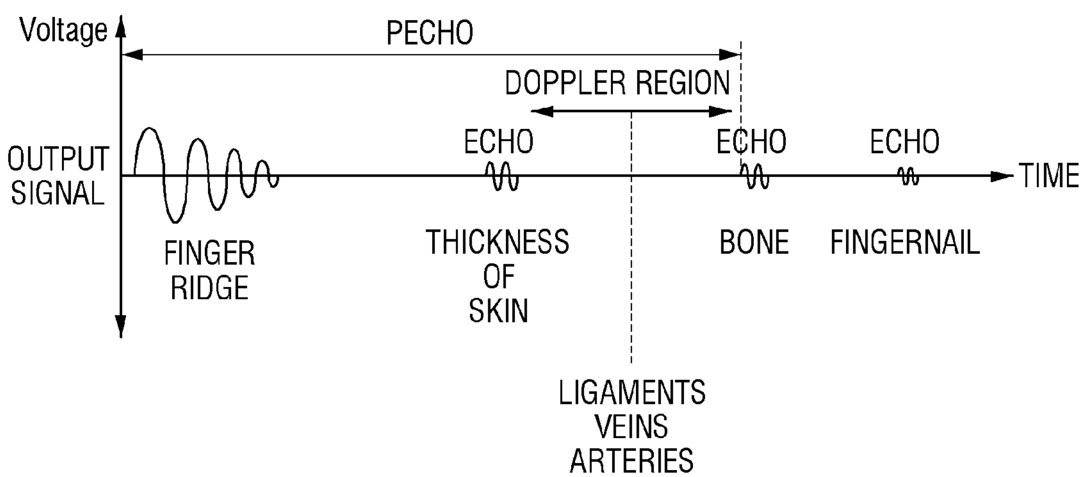

FIG. 186 is a waveform diagram showing an ultrasonic sensing signal sensed by a vibration element in an echo mode and a Doppler shift mode.

Figure 187:
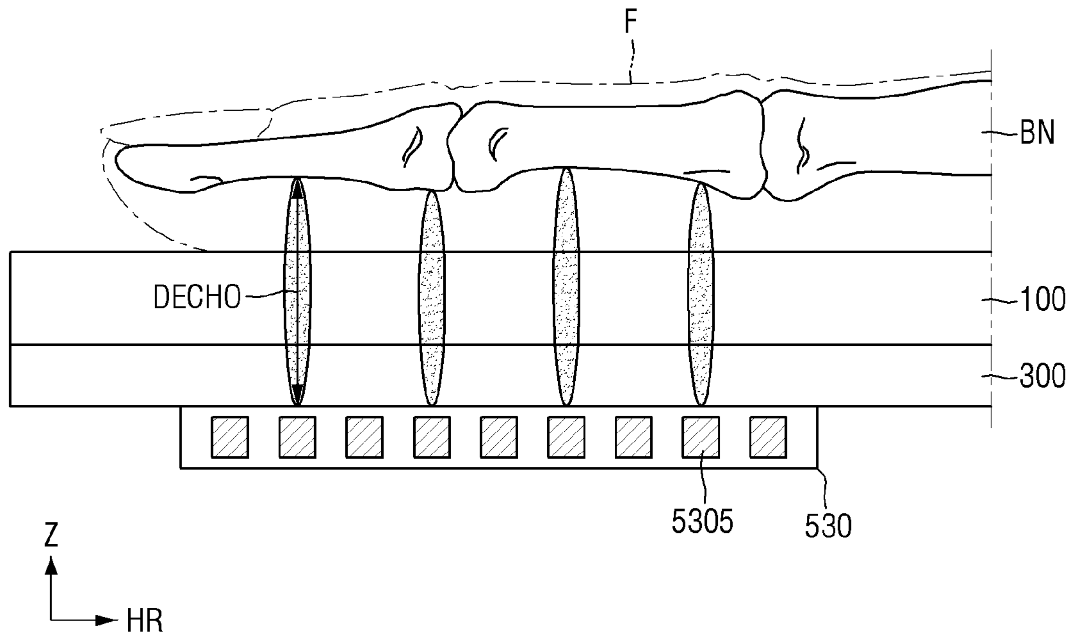

FIG. 187 is a view showing an example of an ultrasound sensor and bones of a person's finger in the echo mode.

Figure 188:
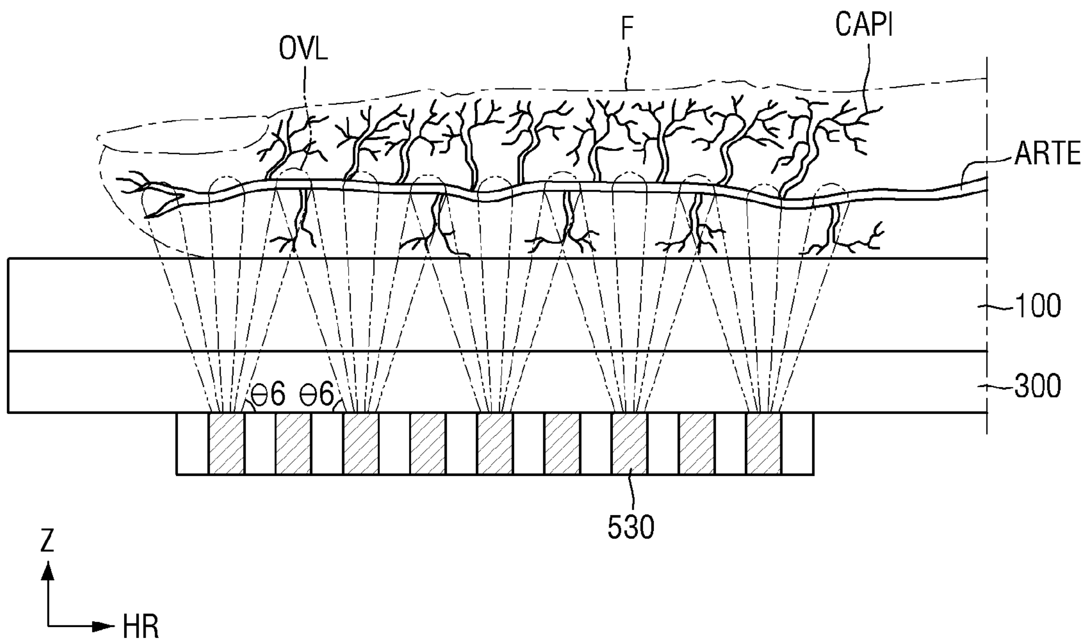

FIG. 188 is a view showing an example of an ultrasound sensor and arterioles of a person's finger in the Doppler shift mode.

Figure 189:
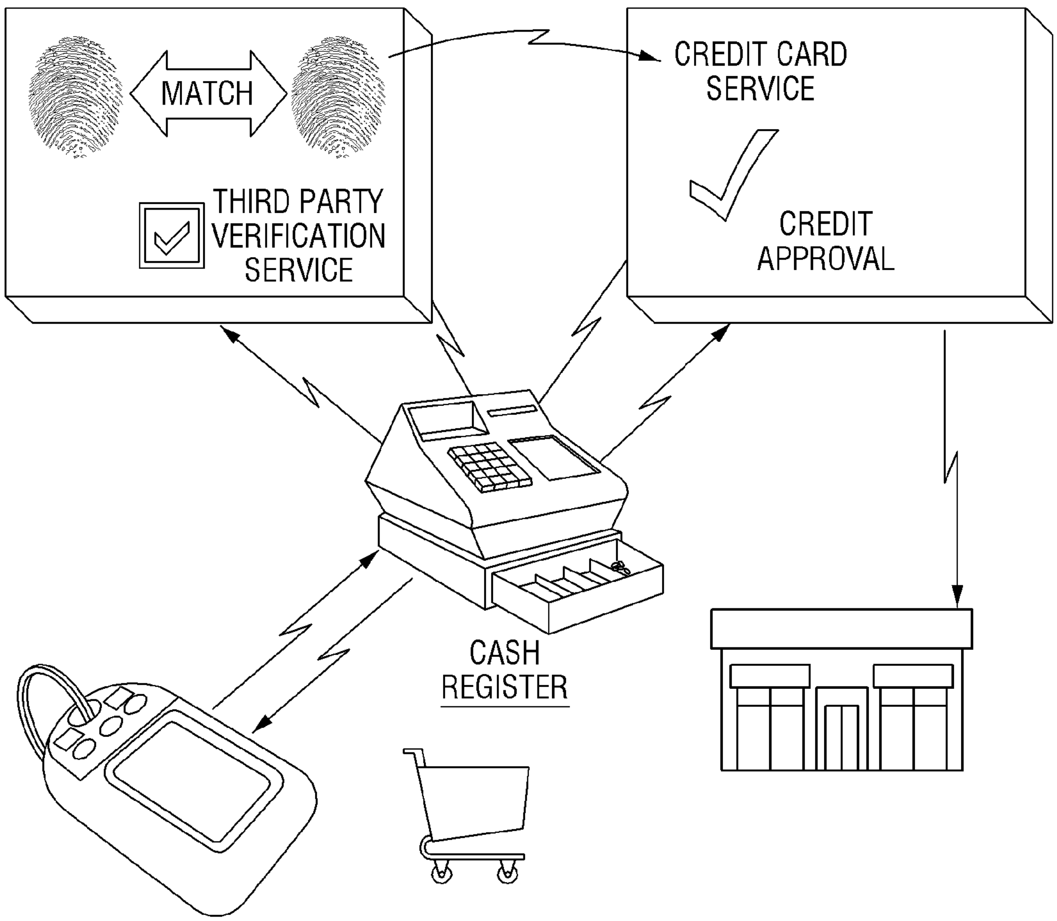

FIG. 189 is a view showing an example of a lineless biometric device including the ultrasonic sensor of FIG. 177.

Figure 190:
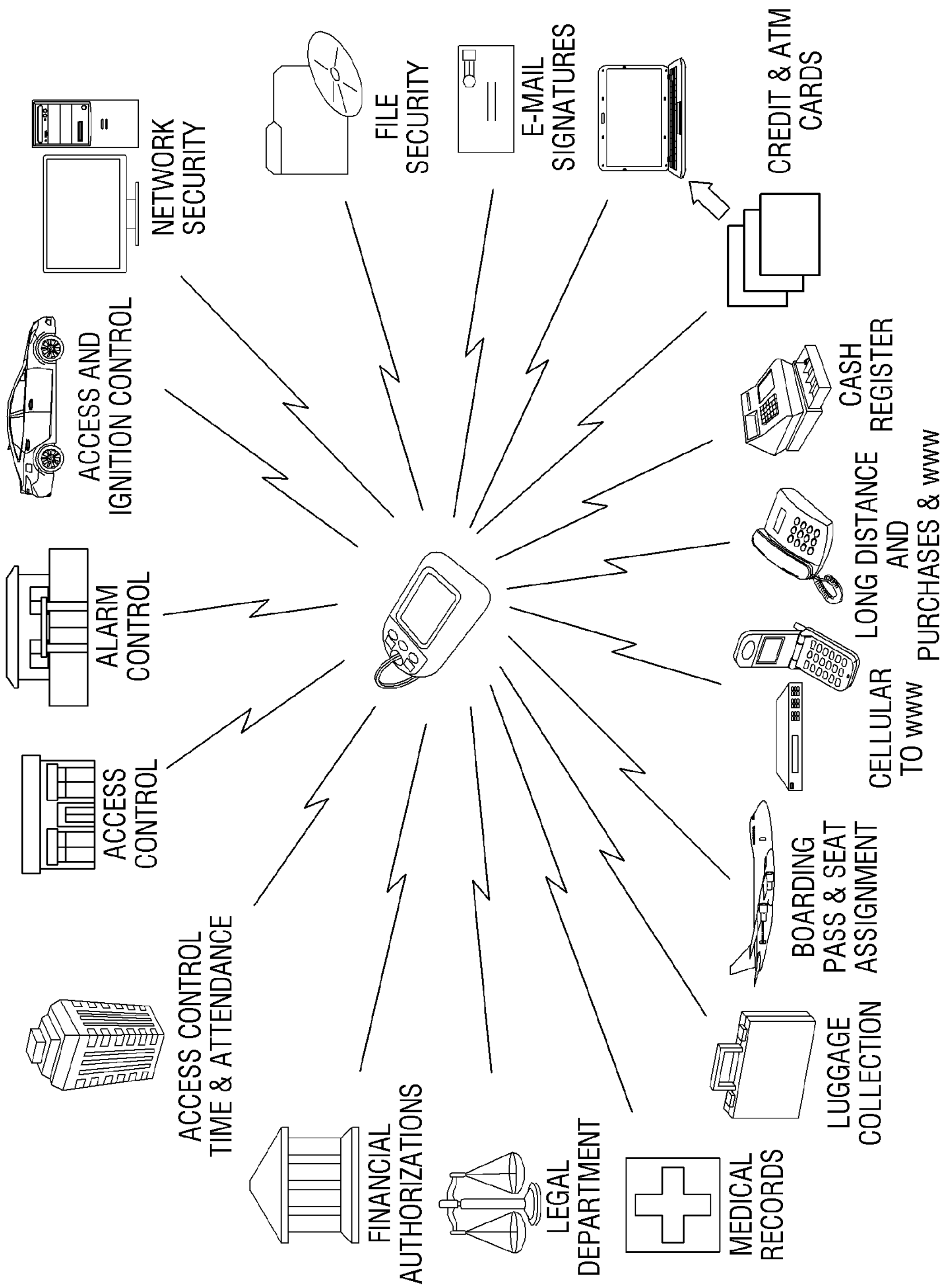

FIG. 190 is a view showing applications of a lineless biometric device including the ultrasonic sensor of FIG. 177.

Figure 191:
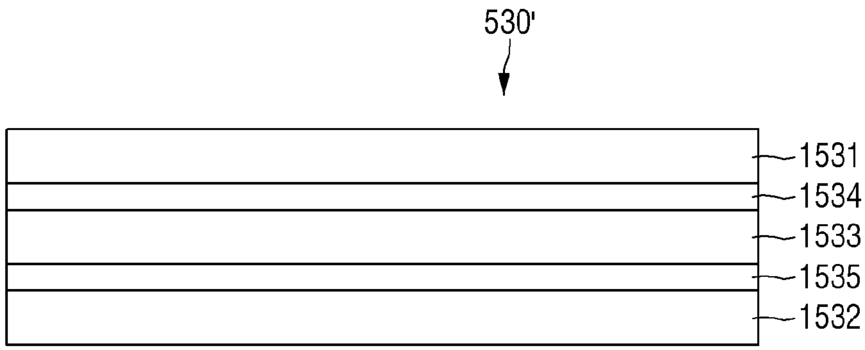

FIG. 191 is a side view showing another example of the ultrasonic sensor of FIGS. 170 and 171.

Figure 192:
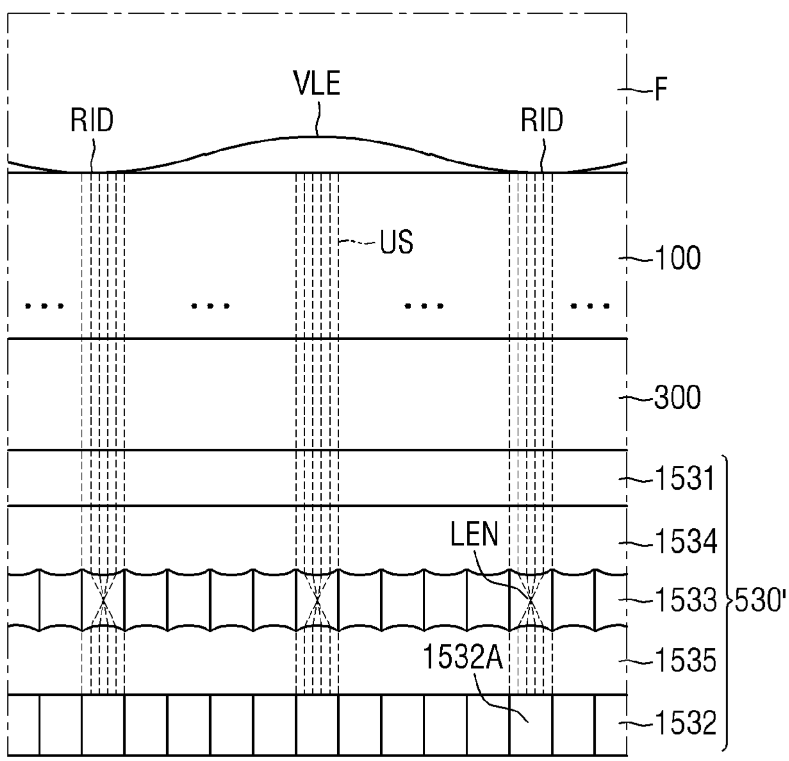

FIG. 192 is a schematic cross-sectional view showing an example of the ultrasonic sensor of FIG. 191.

Figure 193:
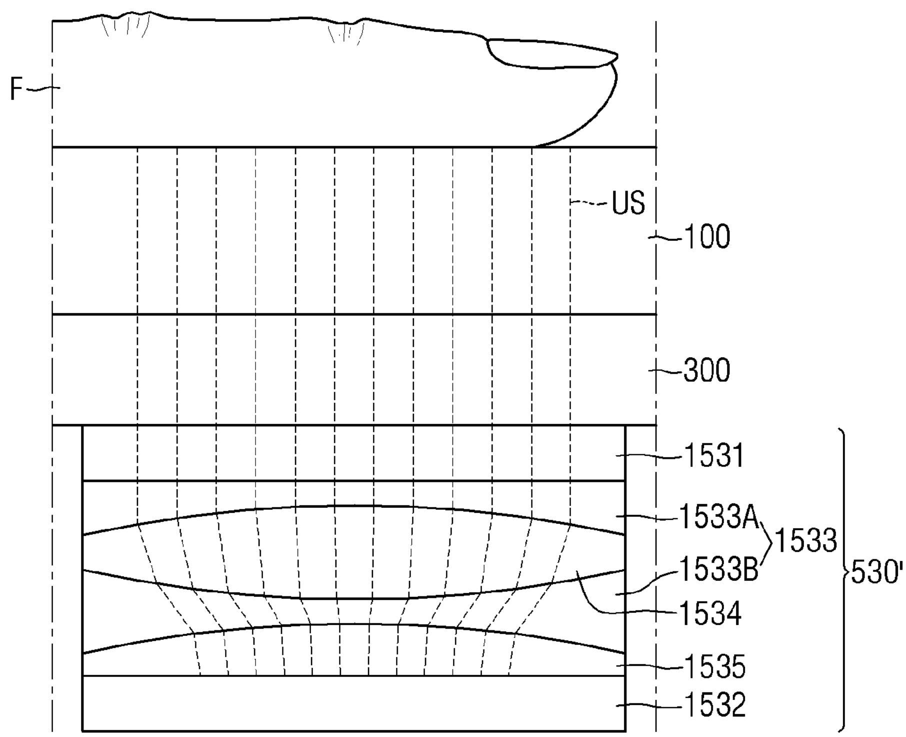

FIG. 193 is a schematic cross-sectional view showing another example of the ultrasonic sensor of FIG. 191.

Figure 194:
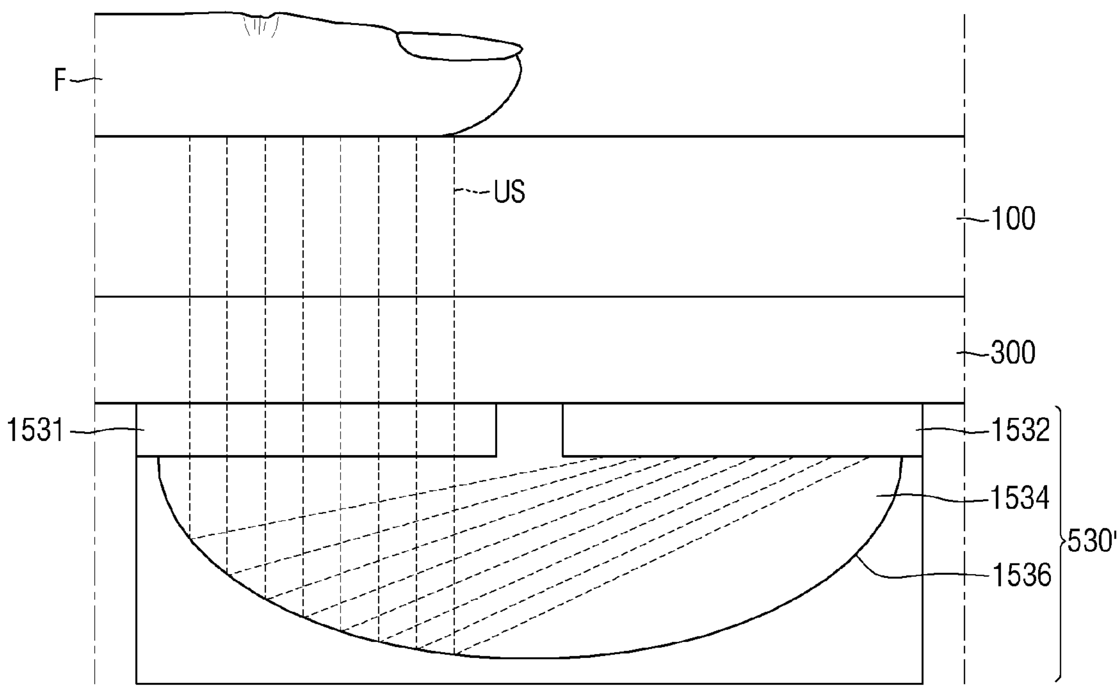

FIG. 194 is a schematic cross-sectional view showing another example of the ultrasonic sensor of FIG. 191.

Figure 195:
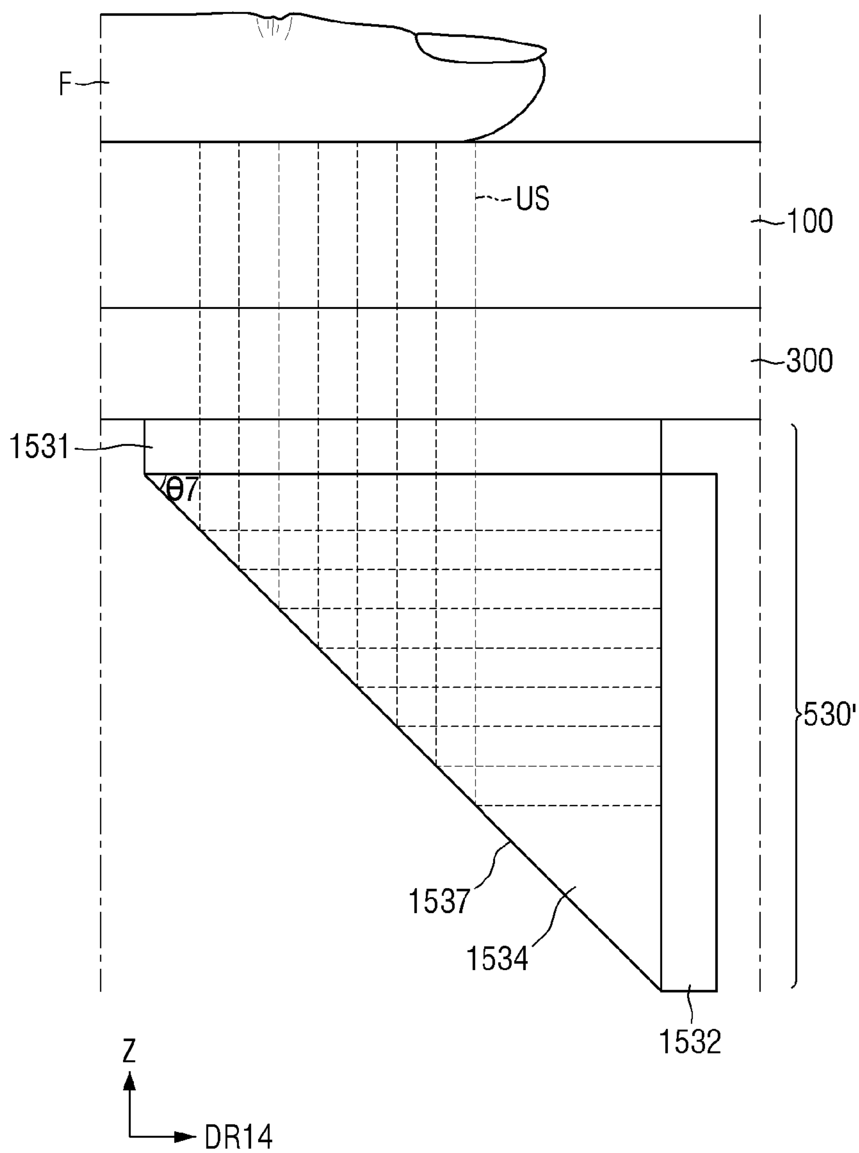

FIG. 195 is a schematic cross-sectional view showing another example of the ultrasonic sensor of FIG. 191.

Figure 196:
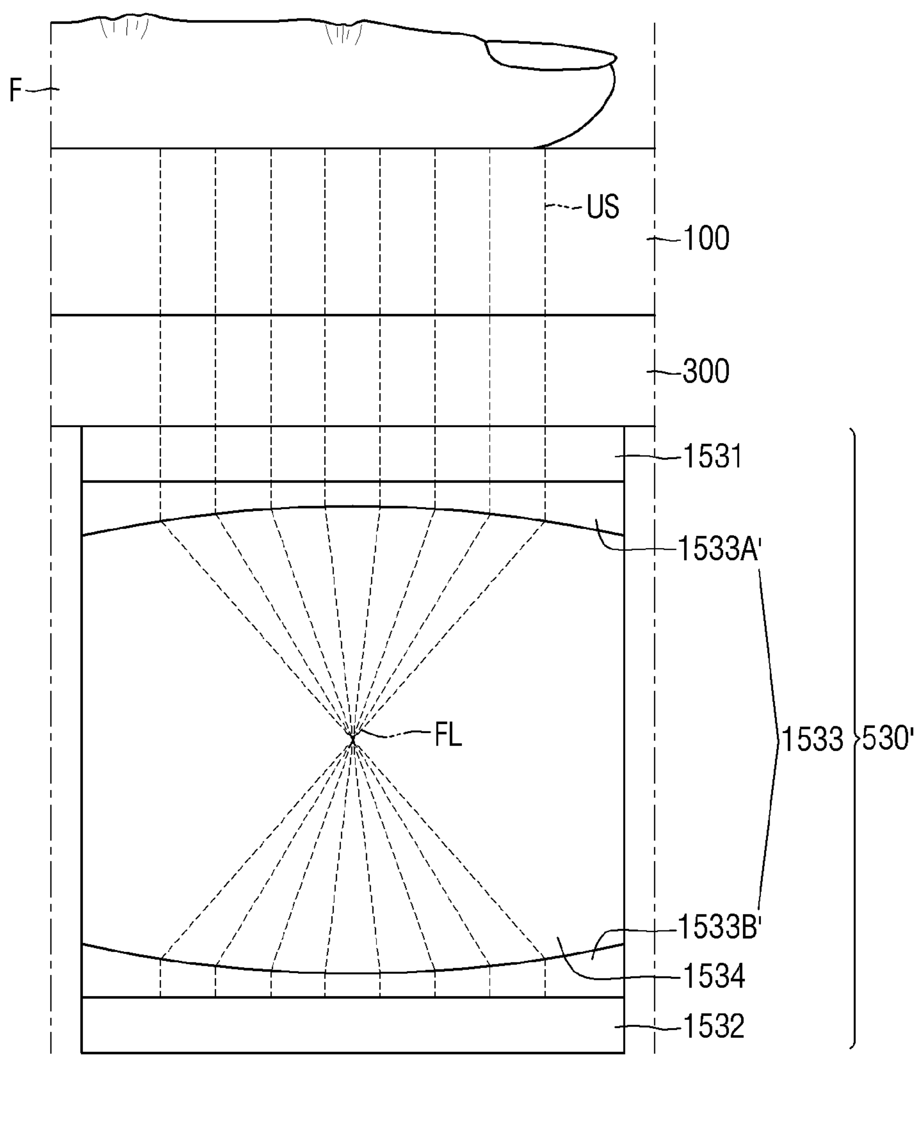

FIG. 196 is a schematic cross-sectional view showing another example of the ultrasonic sensor of FIG. 191.

Figure 197:
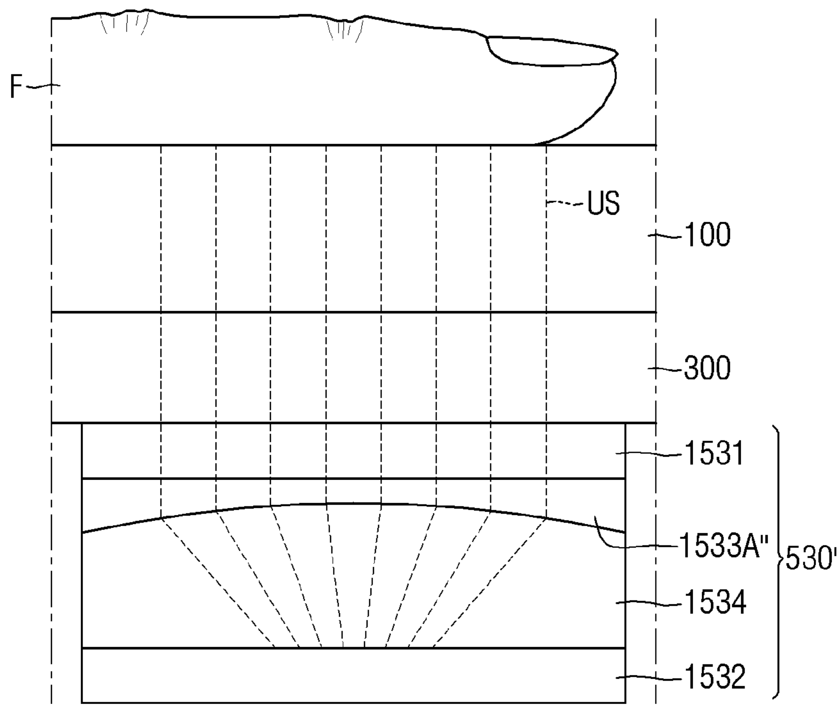

FIG. 197 is a schematic cross-sectional view showing another example of the ultrasonic sensor of FIG. 191.

Figure 198:
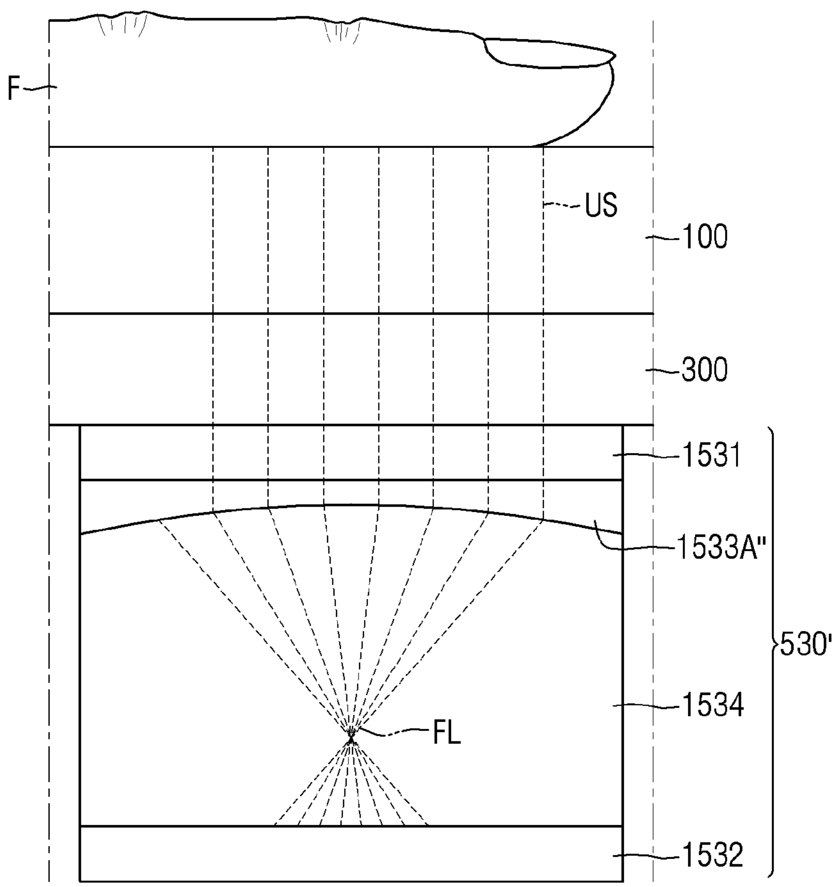

FIG. 198 is a schematic cross-sectional view showing another example of the ultrasonic sensor of FIG. 191.

Figure 199:
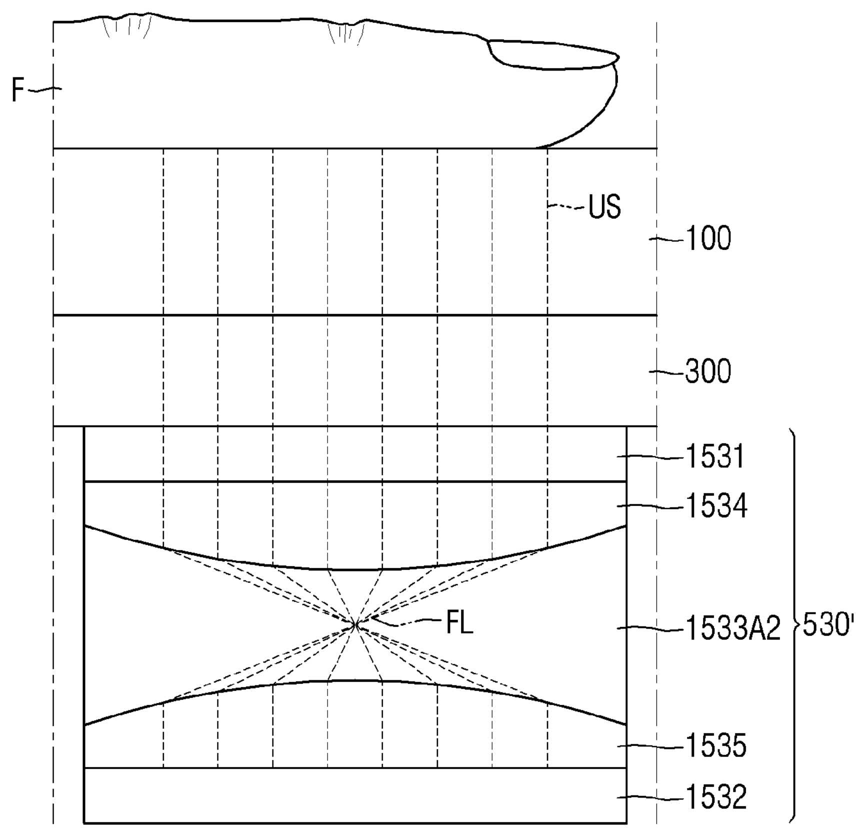

FIG. 199 is a schematic cross-sectional view showing another example of the ultrasonic sensor of FIG. 191.

Figure 200:
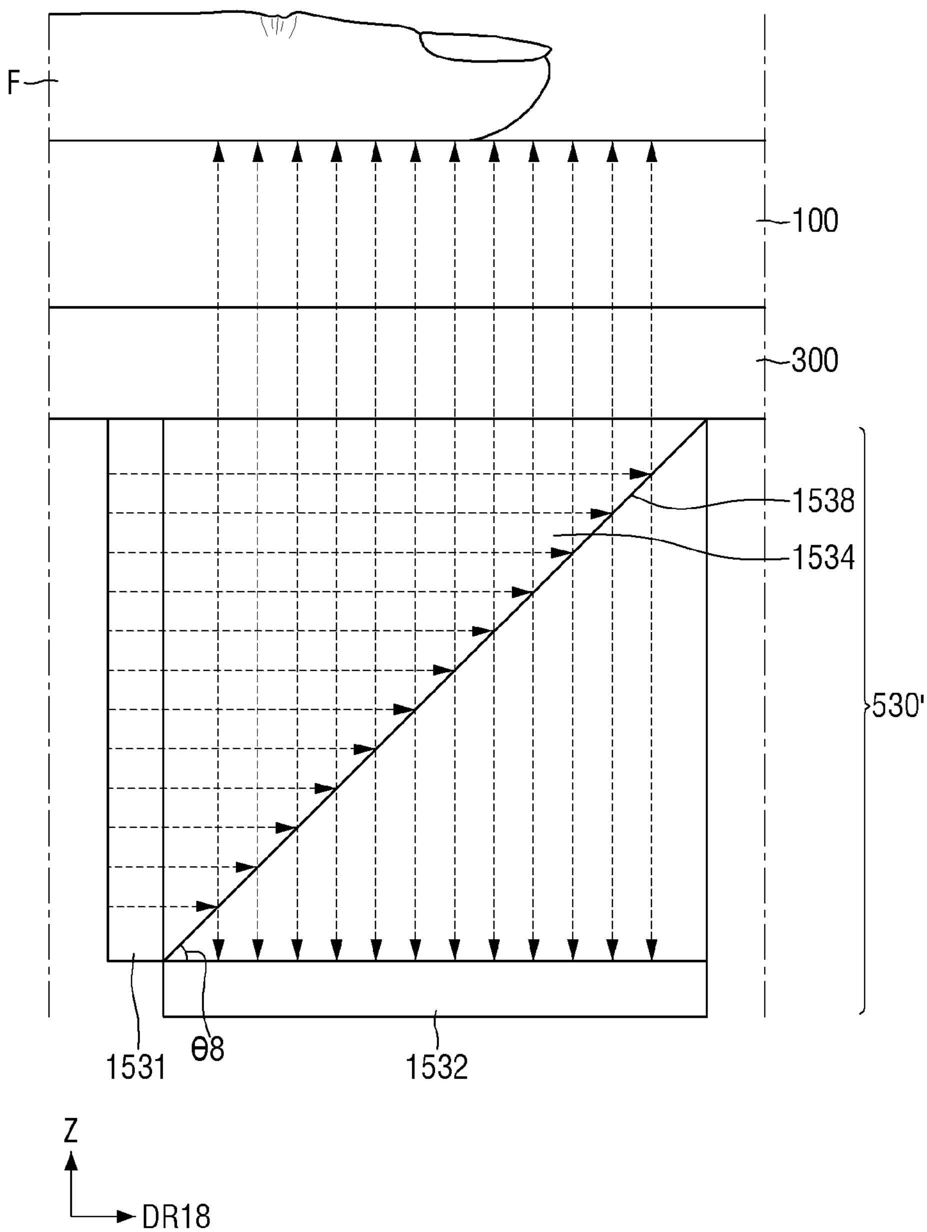

FIG. 200 is a schematic cross-sectional view showing another example of the ultrasonic sensor of FIG. 191.

Figure 201:
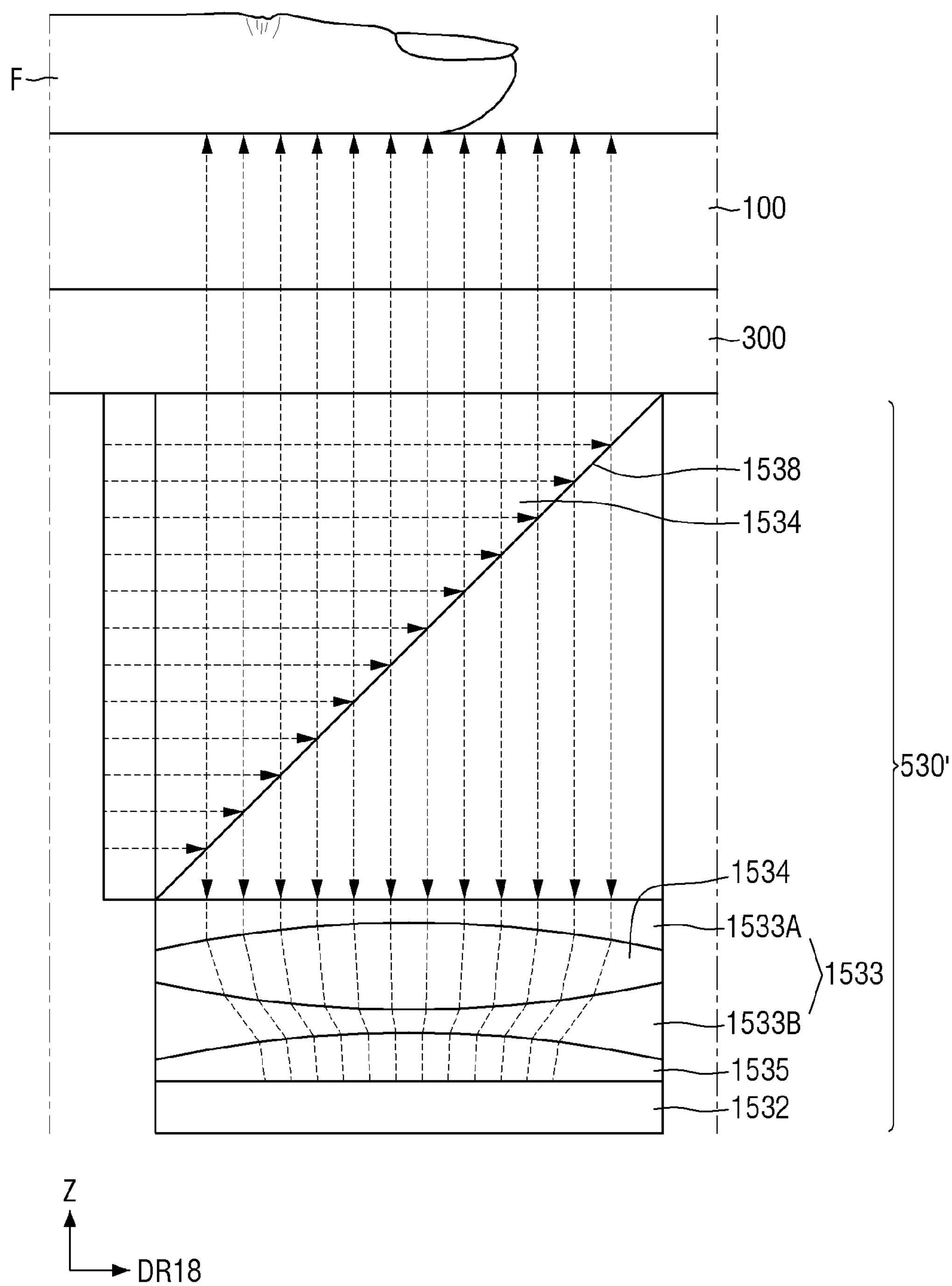

FIG. 201 is a schematic cross-sectional view showing another example of the ultrasonic sensor of FIG. 191.

Figure 202:
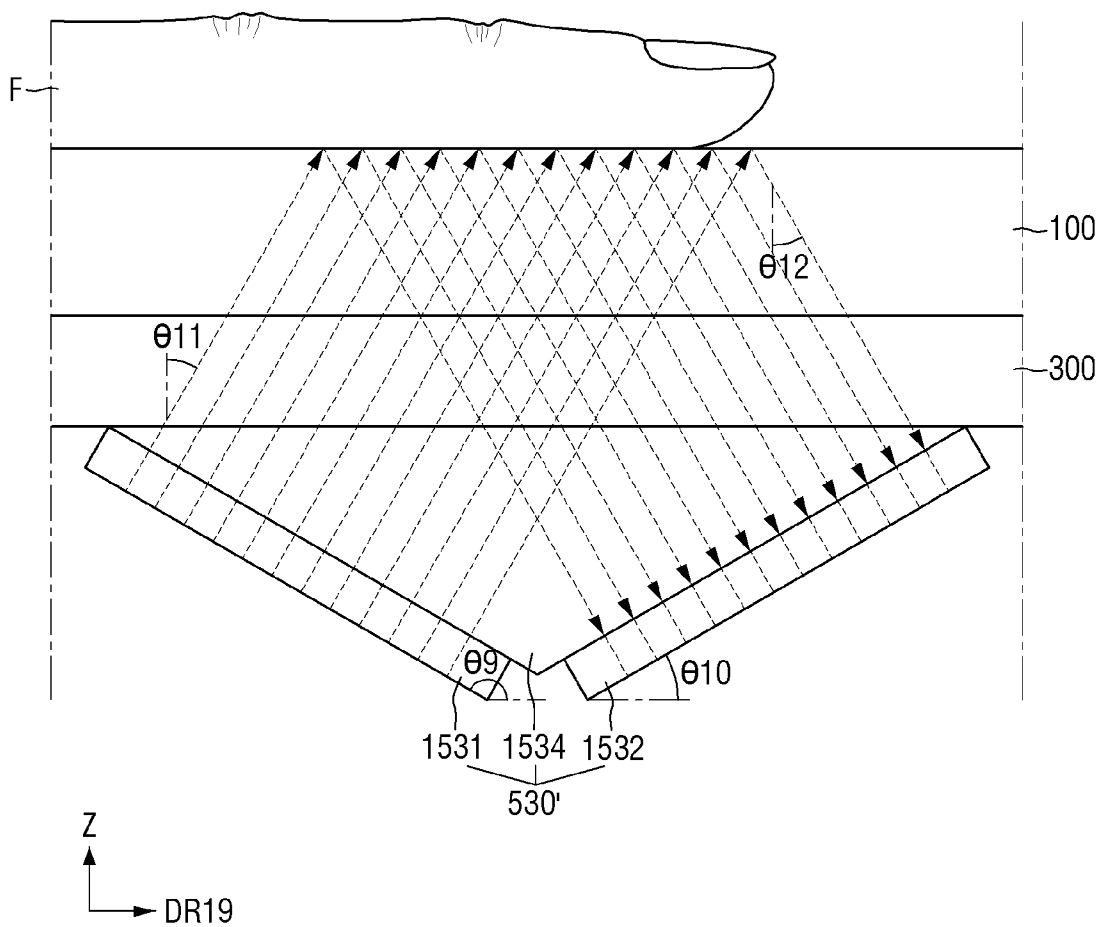

FIG. 202 is a schematic cross-sectional view showing another example of the ultrasonic sensor of FIG. 191.

Figure 203:
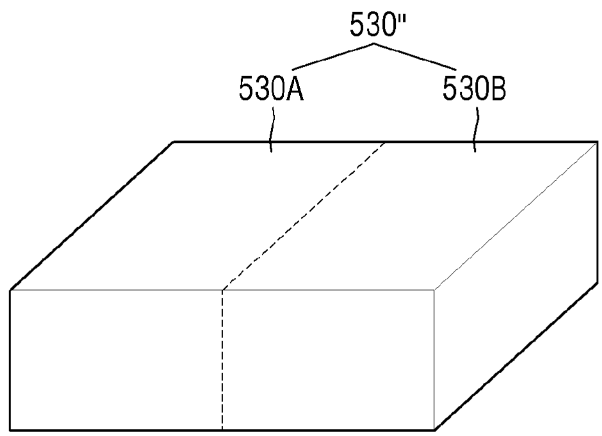

FIG. 203 is a perspective view showing another example of the ultrasonic sensor of FIGS. 170 and 171.

Figure 204:
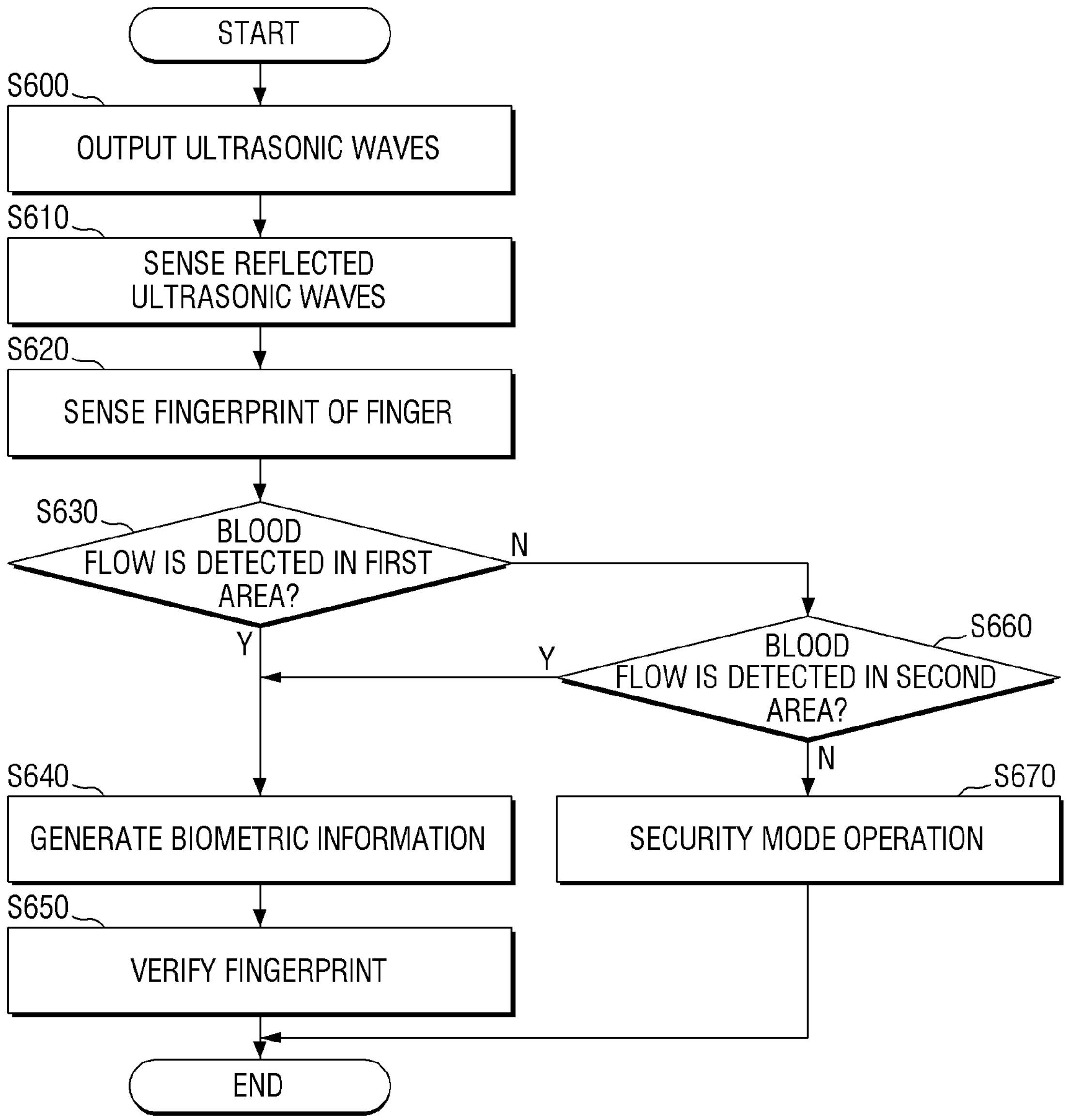

FIG. 204 is a flowchart illustrating a method of recognizing a fingerprint and sensing blood flow using an ultrasonic sensor according to an embodiment.

DETAILED DESCRIPTION OF THE EMBODIMENTS

Advantages and features of the disclosure and methods to achieve them will become apparent from the descriptions of embodiments hereinbelow with reference to the accompanying drawings. However, the disclosure is not limited to the embodiments disclosed herein but may be implemented in various different ways. The embodiments are provided for making the disclosure thorough and for fully conveying the scope of the disclosure to those skilled in the art. It is to be noted that the scope of the disclosure is defined by the claims.

Some of the parts which are not associated with the description may not be provided in order to describe embodiments of the disclosure and like reference numerals refer to like elements throughout the specification.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

As used herein, a phrase "an element A on an element B" refers to that the element A may be disposed directly on the element B and/or the element A may be disposed indirectly on the element B via another element C. Like reference numerals denote like elements throughout the descriptions. The figures, dimensions, ratios, angles, numbers of elements given in the drawings are merely illustrative and are not limiting.

Further, in the specification, the phrase "in a plan view" means when an object portion is viewed from above, and the phrase "in a schematic cross-sectional view" means when a schematic cross-section taken by vertically cutting an object portion is viewed from the side.

Although terms such as first, second, etc. are used to distinguish arbitrarily between the elements such terms describe, and thus these terms are not necessarily intended to indicate temporal or other prioritization of such elements. These terms are used to merely distinguish one element from another. Accordingly, as used herein, a first element may be a second element within the technical scope of the disclosure.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "includes" and/or "including", "have" and/or "having" are used in this specification, they or it may specify the presence of stated features, integers, steps, operations, elements and/or components, but do not preclude the presence or addition of other features, integers, steps, operations, elements, components, and/or any combination thereof.

Also, when an element is referred to as being "in contact" or "contacted" or the like to another element, the element may be in "electrical contact" or in "physical contact" with another element; or in "indirect contact" or in "direct contact" with another element.

As used herein, the singular forms "a," "an" and "the" are intended to include the plural forms as well, unless the context clearly indicates otherwise.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

As used herein, the term "unit" or "module" denotes a structure or element as illustrated in the drawings and as described in the specification. However, the disclosure is not limited thereto. The term "unit" or "module" is not to be limited to that which is illustrated in the drawings In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that may not be perpendicular to one another.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Features of embodiments may be combined partially or totally. As will be clearly appreciated by those skilled in the art, technically various interactions and operations are possible. Various embodiments may be practiced individually or in combination.

Hereinafter, embodiments will be described with reference to the accompanying drawings.

Figure 1:
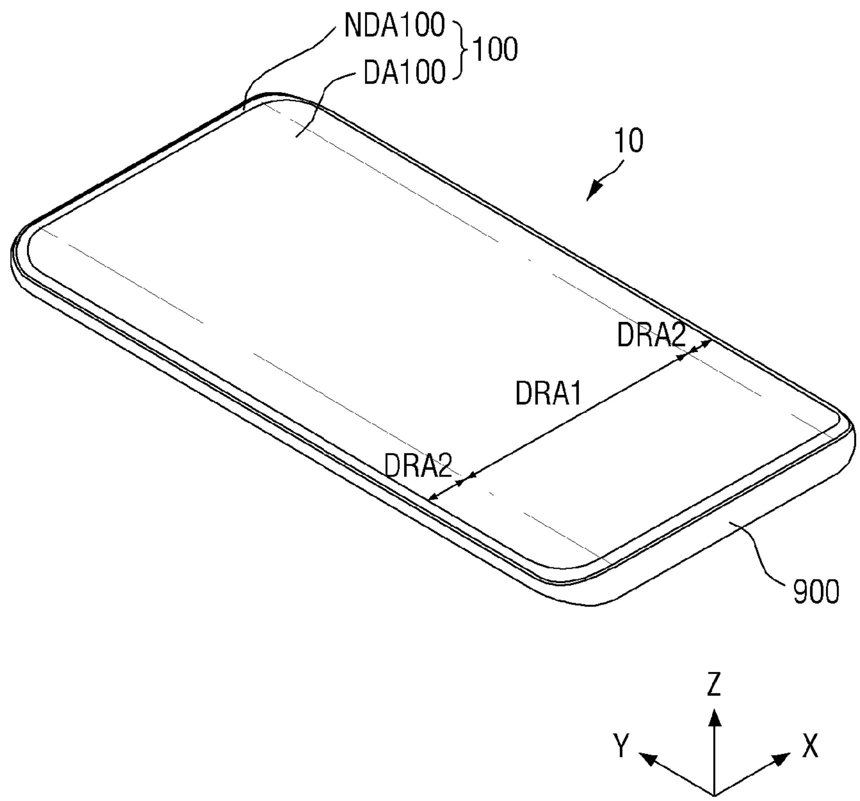
FIG. 1 is a perspective view of a display device according to an embodiment.
Figure 2:
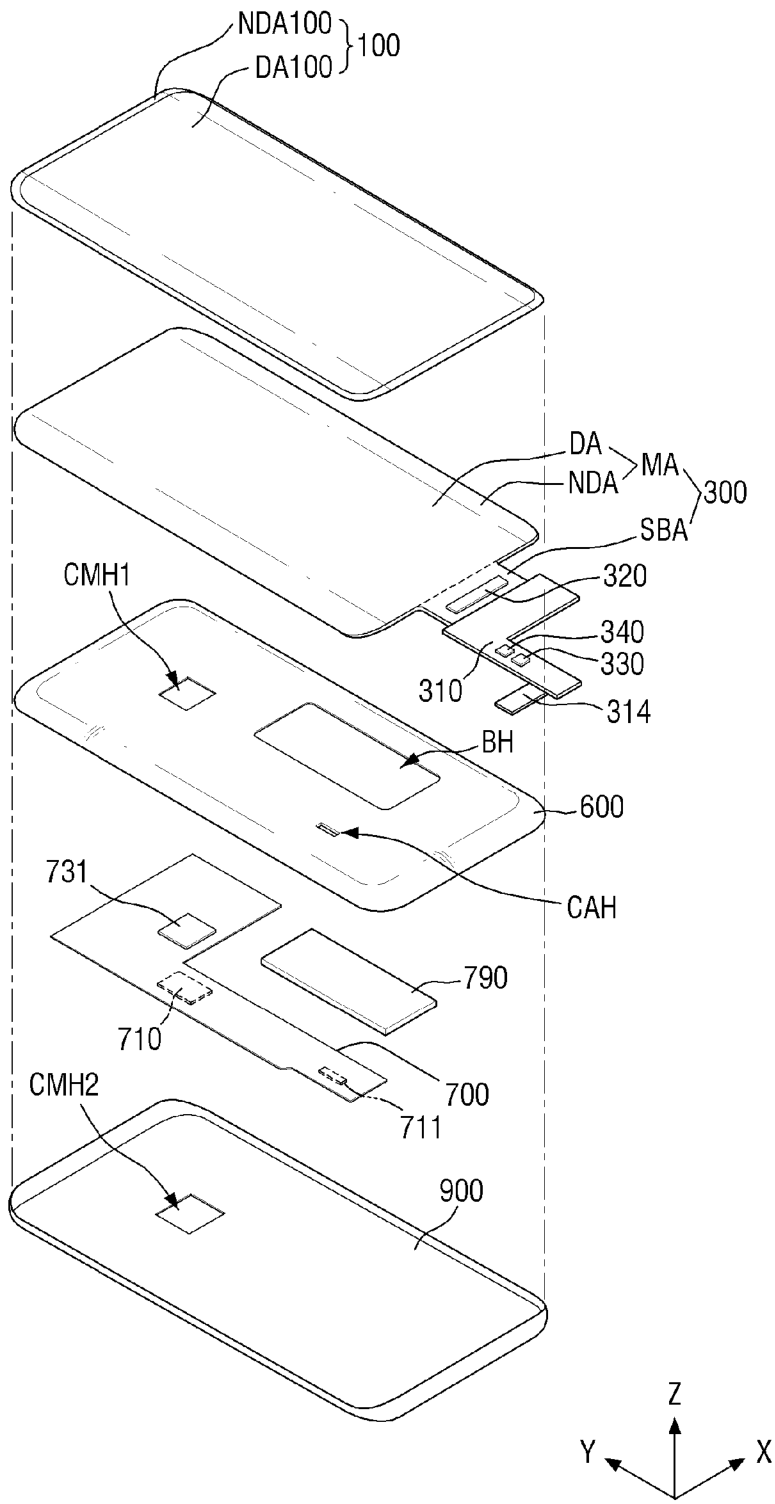
FIG. 2 is an exploded, perspective view of a display device according to an embodiment.
Figure 3:
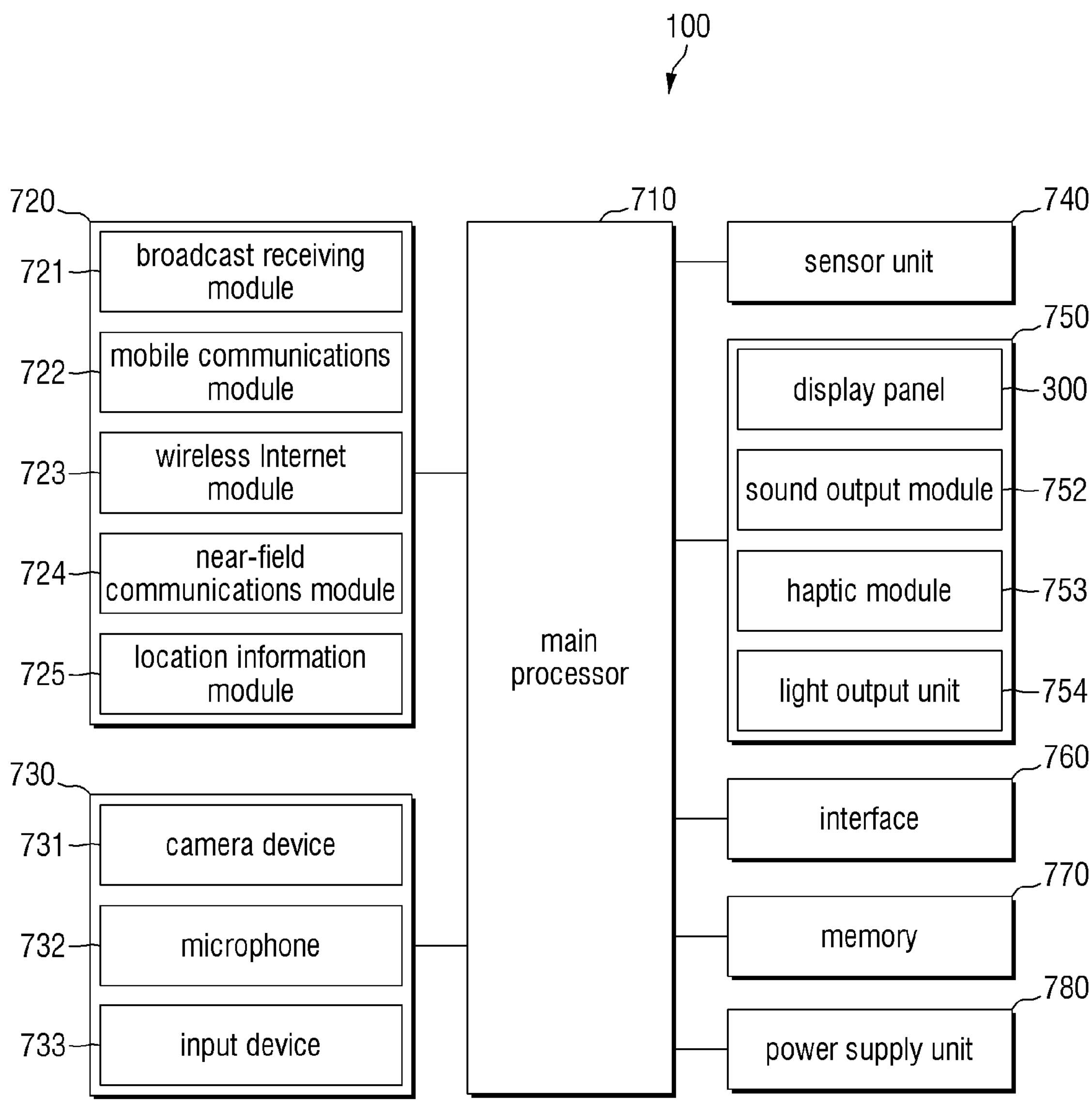
FIG. 3 is a block diagram showing a display device according to an embodiment.

FIG. 1 is a perspective view of a display device according to an embodiment. FIG. 2 is an exploded, perspective view of a display device according to an embodiment. FIG. 3 is a block diagram showing a display device according to an embodiment.

Referring to FIGS. 1 and 2, a display device 10 according to an embodiment is for displaying moving images or still images. The display device 10 may be used as the display screen of portable electronic devices such as a mobile phone, a smart phone, a tablet PC, a mobile communications terminal, an electronic notebook, an electronic book, a portable multimedia player (PMP), a navigation device and an ultra mobile PC (UMPC), as well as the display screen of various products such as a television, a notebook, a monitor, a billboard and the Internet of Things. The display device 10 according to the embodiment may be applied to wearable devices such as a smart watch, a watch phone, a glasses-type display, and a head-mounted display (TIMID) device. The display device 10 according to an embodiment may be used as a center information display (CID) disposed at the instrument cluster and the center fascia or the dashboard of a vehicle, as a room mirror display on the behalf of the side mirrors of a vehicle, as a display placed on the back of each of the front seats that may be the entertainment system for passengers at the rear seats of a vehicle.

In the example shown in FIGS. 1 and 2, the display device 10 according to the embodiment is applied to a smart phone for convenience of illustration. The display device 10 according to the embodiment includes a cover window 100, a display panel 300, a display circuit board 310, a display driver 320, a touch driver 330, a sensor driver 340, a bracket 600, a main circuit board 700, a battery 790 and a bottom cover 900.

As used herein, the first direction (x-axis direction) may be parallel to the shorter sides of the display device 10, for example, the horizontal direction of the display device 10. The second direction (y-axis direction) may be parallel to the longer sides of the display device 10, for example, the vertical direction of the display device 10. The third direction (z-axis direction) may refer to the thickness direction of the display device 10.

The display device 10 may have a substantially rectangular shape in a case that the display device 10 is viewed from the top. For example, the display device 10 may have a substantially rectangular shape having shorter sides in a first direction (x-axis direction) and longer sides in a second direction (y-axis direction) in a case that the display device 10 is viewed from the top as shown in FIG. 1. Each of the corners where the short side in the first direction (x-axis direction) meets the longer side in the second direction (y-axis direction) may be rounded with a predetermined curvature or may be a right angle. The shape of the display device 10 in a case that the display device 10 viewed from the top is not limited to a substantially rectangular shape but may be formed in another polygonal shape, a circular shape, or an elliptical shape.

The display device 10 may include a first area DRA1, and second areas DRA2 extended from the right and left sides of the first area DRA1, respectively. The first area DRA1 may be either flat or curved. The second areas DRA2 may be either flat or curved. In a case that both the first area DRA1 and the second areas DRA2 are formed as curved surfaces, the curvature of the first area DRA1 may be different from the curvature of the second areas DRA2. In a case that the first area DRA1 is formed as a curved surface, it may have a constant curvature or a varying curvature. In a case that the second areas DRA2 are formed as curved surfaces, they may have a constant curvature or a varying curvature. In a case that both the first area DRA1 and the second areas DRA2 are formed as flat surfaces, the angle between the first area DRA1 and the second areas DRA2 may be an obtuse angle.

Although the second areas DRA2 may be extended from the left and right sides of the first area DRA1, respectively, in FIG. 1, this is merely illustrative. For example, the second area DRA2 may be extended from only one of the right and left sides of the first area DRA1. Alternatively, the second area DRA2 may be extended from at least one of upper and lower sides of the first area DRA1, as well as the left and right sides. Alternatively, the second areas DRA2 may be eliminated, and the display device 10 may include only the first area DRA1.

The cover window 100 may be disposed on the display panel 300 to cover or overlap the upper surface of the display panel 300. The cover window 100 may protect the upper surface of the display panel 300.

The cover window 100 may be made of a transparent material and may include glass or plastic. For example, the cover window 100 may include ultra thin glass (UTG)

having a thickness of about 0.1 mm or less. The cover window 100 may include a transparent polyimide film.

The cover window 100 may include a transmissive area DA100 that transmits light and a non-transmissive area NDA100 that blocks light. The non-transmissive area NDA100 may include a pattern layer in which a predetermined pattern is formed.

The display panel 300 may be disposed under or below the cover window 100. The display panel 300 may be disposed in the first area DRA1 and the second areas DRA2. A user can see images displayed on the display panel 300 in the first area DRA1 as well as the second areas DRA2.

The display panel 300 may be a light-emitting display panel including light-emitting elements. For example, the display panel 300 may be an organic light-emitting display panel using organic light-emitting diodes including organic emissive layer, a micro light-emitting diode display panel using micro LEDs, a quantum-dot light-emitting display panel including quantum-dot light-emitting diodes including an quantum-dot emissive layer, or an inorganic light-emitting display panel using inorganic light-emitting elements including an inorganic semiconductor.

The display panel 300 may be a rigid display panel that may be rigid and thus may not be easily bent, or a flexible display panel that may be flexible and thus may be easily bent, folded or rolled. For example, the display panel 300 may be a foldable display panel that may be folded and unfolded, a curved display panel having a curved display surface, a bended display panel having a bent area other than the display surface, a rollable display panel that may be rolled and unrolled, and a stretchable display panel that may be stretched.

The display panel 300 may be implemented as a transparent display panel to allow a user to see an object or a background under or below the display panel 300 from above the display panel 300 through it. Alternatively, the display panel 300 may be implemented as a reflective display panel that can reflect an object or a background on the upper surface of the display panel 300.

As shown in FIG. 2, the display panel 300 may include a main area MA, and a subsidiary area SBA protruding from one side of the main area MA.

The main area MA may include a display area DA where images are displayed, and a non-display area NDA around the display area DA. The display area DA may occupy most of the main area MA. The display area DA may be disposed at the center of the main area MA. The non-display area NDA may be disposed on the outer side of the display area DA. The non-display area NDA may be defined as an edge of the display panel 300.

Figure 5:
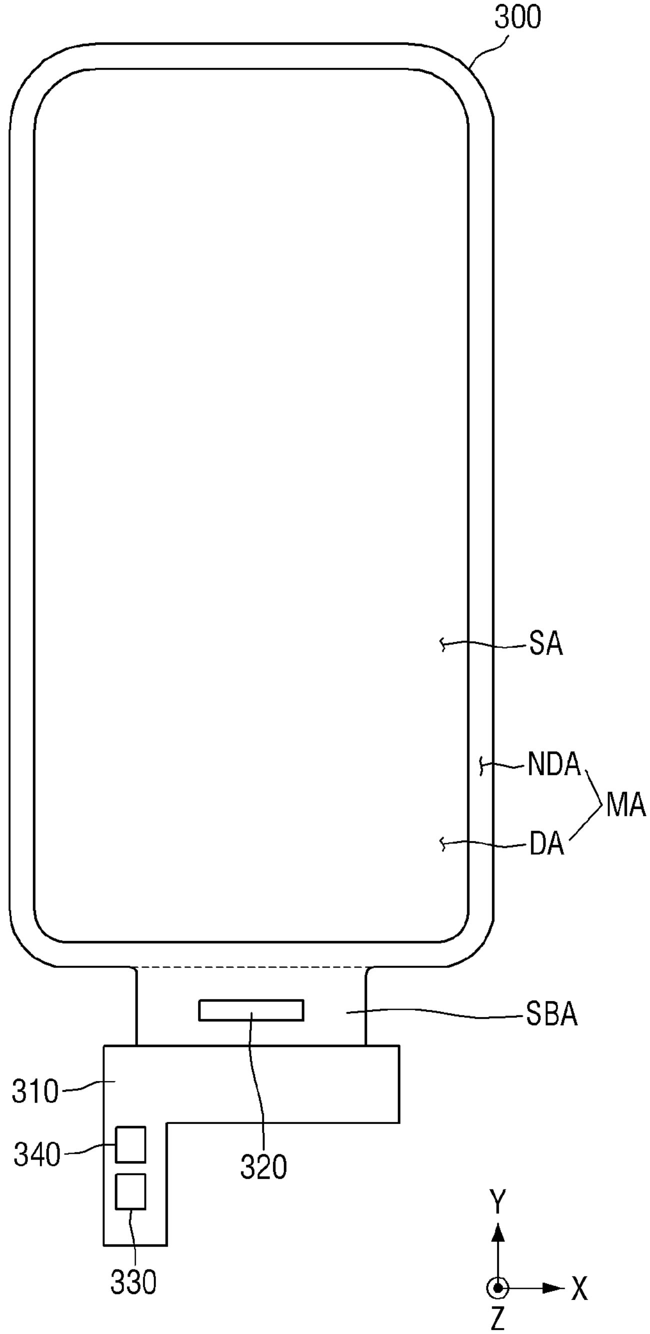
FIG. 5 is a plan view showing a display area, a non-display area and a sensor area of a display panel of a display device according to another embodiment.

The subsidiary area SBA may protrude from one side of the main area MA in the second direction (y-axis direction). As shown in FIG. 2, the length of the subsidiary area SBA in the first direction (x-axis direction) may be smaller than the length of the main area MA in the first direction (x-axis direction). The length of the subsidiary area SBA in the second direction (y-axis direction) may be smaller than the length of the main area MA in the second direction (y-axis direction). It is, however, to be understood that the disclosure is not limited thereto. The subsidiary area SBA may be bent and disposed on the lower surface of the display panel 300, as shown in FIG. 5. The subsidiary area SBA may overlap the main area MA in the thickness direction (z-axis direction).

The display circuit board 310 may be attached to the subsidiary area SBA of the display panel 300. The display circuit board 310 may be attached on the display pads in the subsidiary area SBA of the display panel 300 using an anisotropic conductive film. The display circuit board 310 may be a flexible printed circuit board (FPCB) that may be bent, a rigid printed circuit board (PCB) that may be rigid and not bendable, or a hybrid printed circuit board including a rigid printed circuit board and a flexible printed circuit board.

The display driver 320 may be disposed on the subsidiary area SBA of the display panel 300. The display driver 320 may receive control signals and supply voltages and may generate and output signals and voltages for driving the display panel 300. The display driver 320 may be implemented as an integrated circuit (IC).

The touch driver 330 and the sensor driver 340 may be disposed on the display circuit board 310. Each of the touch driver 330 and the sensor driver 340 may be implemented as an integrated circuit. Alternatively, the touch driver 330 and the sensor driver 340 may be implemented as a single integrated circuit. The touch driver 330 and the sensor driver 340 may be attached on the display circuit board 310.

The touch driver 330 may be electrically connected to sensor electrodes of a sensor electrode layer of the display panel 300 through the display circuit board 310, and thus it may output touch driving signals to the sensor electrodes and may sense the voltage charged in the mutual capacitance.

The sensor electrode layer of the display panel 300 may sense a touch of an object using at least one of a variety of touch sensing schemes such as resistive sensing and capacitive sensing. For example, in a case that a touch of an object is sensed by using the sensor electrode layer of the display panel 300 by the capacitive sensing, the touch driver 330 applies driving signals to the driving electrodes among the sensor electrodes, and senses the voltages charged in the mutual capacitance between the driving electrodes and the sensing electrodes through the sensing electrodes among the sensor electrodes, thereby determining whether there is a touch of the object. Touch inputs may include a physical contact and a near proximity. A physical contact refers to that an object such as the user's finger or a pen is brought into contact with the cover window 100 disposed on the sensor electrode layer. A near proximity refers to that an object such as a person's finger or a pen is close to but is spaced apart from the cover window 100, such as hovering over it. The touch driver 330 may transmit touch data to the main processor 710 based on the sensed voltages, and the main processor 710 may analyze the touch data to calculate the coordinates of the position where the touch input is made.

The sensor driver 340 may be electrically connected to a sensor disposed in the display panel 300 or a separate sensor attached to the display panel 300 through the display circuit board 310. The sensor driver 340 may convert voltages detected by the light-receiving elements of the display panel 300 or the sensor attached to the display panel 300 into sensing data, which is digital data, and may transmit it to the main processor 710.

On the display circuit board 310, a power supply for supplying driving voltages for driving the display pixels and the display driver 320 of the display panel 300 may be disposed. Alternatively, the power supply may be integrated with the display driver 320, in which case, the display driver 320 and the power supply may be implemented as a single integrated circuit.

The bracket 600 for supporting the display panel 300 may be disposed under or below the display panel 300. The bracket 600 may include plastic, metal, or both plastic and metal. In the bracket 600, a first camera hole CMH1 in which a camera device 731 may be inserted may be disposed, a battery hole BH in which the battery 790 may be disposed, a cable hole CAH through which a cable 314 connected to the display circuit board 310 may pass, for example.

The main circuit board 700 and the battery 790 may be disposed under or below the bracket 600. The main circuit board 700 may be either a printed circuit board or a flexible printed circuit board.

The main circuit board 700 may include a main processor 710, a camera device 731, and a main connector 711. The main processor 710 may be an integrated circuit. The camera device 731 may be disposed on both the upper and lower surfaces of the main circuit board 700, and the main processor 710 and the main connector 711 may be disposed on one of the upper and lower surfaces of the main circuit board 700.

The main processor 710 may control all the functions of the display device 10. For example, the main processor 710 may output digital video data to the display driver 320 through the display circuit board 310 so that the display panel 300 displays images. The main processor 710 may receive detection data from the sensor driver 340. The main processor 710 may determine whether there is a user's touch based on the detection data, and may execute an operation associated with the user's physical contact or near proximity if determined. For example, the main processor 710 may calculate the coordinates of the user's touch by analyzing the detection data, and then may run an application indicated by an icon touched by the user or perform the operation. The main processor 710 may be an application processor, a central processing unit, or a system chip as an integrated circuit.

The camera device 731 processes image frames such as still image and video obtained by the image sensor in the camera mode and outputs them to the main processor 710. The camera device 731 may include at least one of a camera sensor (for example, CCD, CMOS, within the spirit and the scope of the disclosure), a photo sensor (or an image sensor), and a laser sensor.

The cable 314 passing through the cable hole CAH of the bracket 600 may be connected to the main connector 711, and thus the main circuit board 700 may be electrically connected to the display circuit board 310.

In addition to the main processor 710, the camera device 731 and the main connector 711, the main circuit board 700 may include a wireless communications unit 720, at least one input unit 730, at least one sensor unit 740, at least one output unit 750, at least one interface 760, a memory 770, and a power supply unit 780, shown in FIG. 3.

For example, the wireless communications unit 720 may include at least one of a broadcasting receiving module 721, a mobile communications module 722, a wireless Internet module 723, a near-field communications module 724, and a location information module 725.

The broadcast receiving module 721 receives a broadcast signal and/or broadcast related information from an external broadcast managing server through a broadcast channel. The broadcasting channel may include a satellite channel and a terrestrial channel.

The mobile communications module 722 transmits/receives wireless signals to/from at least one of a base station, an external terminal and a server in a mobile communications network established according to technical standards or communications schemes for mobile communications (for example, global system for mobile communications (GSM), code division multi access (CDMA), code division multi access 2000 (CDMA2000), enhanced voice-data optimized or enhanced voice-data only (EV-DO), wideband CDMA (WCDMA), high speed downlink packet access (HSDPA), high speed uplink packet access (HSUPA), long term evolution (LTE), long term evolution-advanced (LTE-A), within the spirit and the scope of the disclosure). The wireless signals may include a voice call signal, a video call signal, or a variety of types of data depending on transmission and reception of a text/multimedia message.

The wireless Internet module 723 refers to a module for wireless Internet connection. The wireless Internet module 723 may transmit and receive wireless signals in a communications network according to wireless Internet technologies. Examples of wireless Internet technologies include wireless LAN (WLAN), wireless-fidelity (Wi-Fi), wireless fidelity (Wi-Fi) Direct, digital living network alliance (DLNA), within the spirit and the scope of the disclosure.

The near-field communications module 724 is for near field communications, and may support near field communications by using at least one of: Bluetooth™, radio frequency identification (RFID), infrared data association (IrDA), ultra wideband (UWB), ZigBee, near-field communications (NFC), Wi-Fi, Wi-Fi Direct and wireless universal serial bus (Wireless USB). The near-field communications module 724 may support wireless communications between the display device 10 and a wireless communications system, between the display device 10 and another electronic device, or between the display device 10 and a network where another electronic device (or an external server) may be located over wireless area networks. The wireless area network may be a wireless personal area network. Another electronic device may be a wearable device capable of exchanging (or interworking) data with the display device 10.

The location information module 725 is a module for acquiring the location (or current location) of the display device 10. Examples of the location information module 725 include a global positioning system (GPS) module or a wireless fidelity (Wi-Fi) module. For example, the display device 10 utilizing a GPS module may acquire its location by using signals transmitted from GPS satellites. By utilizing a Wi-Fi module, the display device 10 may acquire its location based on the information of wireless access points (APs) that transmit/receive wireless signals to/from the Wi-Fi module. The location information module 725 refers to any module that may be used to acquire the location (or current location) of the display device 10 and is not limited to a module that calculates or acquires the location of the display device 10 by itself.

The input unit 730 may include an image input unit for inputting an image signal, such as a camera device 731, an audio input unit for inputting an audio signal, such as a microphone 732, and an input device 733 for receiving information from a user.

The camera device 731 processes an image frame such as a still image or a moving image obtained by an image sensor in a video call mode or a recording mode. The processed image frames may be displayed on the display panel 300 or stored in the memory 770.

The microphone 732 processes external sound signals into electrical voice data. The processed voice data may be utilized in a variety of ways depending on a function or an application being executed on the display device 10. In the microphone 732, a variety of algorithms for removing different noises generated during a process of receiving an external sound signal may be implemented.

The main processor 710 may control the operation of the display device 10 in response to the information input through the input device 733. The input device 733 may include a mechanical input means or a touch input means such as a button, a dome switch, a jog wheel, a jog switch, for example, positioned on the rear or side surface of the display device 10. The touch input means may be implemented with the sensor electrode layer of the display panel 300.

The sensor unit 740 may include one or more sensors that sense at least one of information in the display device 10, the environment information surrounding the display device 10, and user information, and generate a sensing signal associated with it. The main processor 710 may control driving or operation of the display device 10 or may perform data processing, function, or operation associated with an application installed on the display device 10 based on the sensing signal. The sensor unit 740 may include at least one of: a proximity sensor, an illumination sensor, an acceleration sensor, a magnetic sensor, a gravity sensor (G-sensor), a gyroscope sensor, a motion sensor, a RGB sensor, an infrared sensors (IR sensor), a finger scan sensor, an ultrasonic sensor, an optical sensor, a battery gauge, an environmental sensor (for example, a barometer, a hygrometer, a thermometer, a radiation sensor, a heat sensor, a gas sensor, for example), and a chemical sensor (for example, an electronic nose, a healthcare sensor, a biometric sensor, for example)

The proximity sensor may refer to a sensor that may detect the presence of an object approaching a predetermined detection surface or a nearby object by using an electromagnetic force, an infrared ray, for example, without using a mechanical contact. Examples of the proximity sensor include a transmissive photoelectric sensor, a direct reflective photoelectric sensor, a mirror reflective photoelectric sensor, a high-frequency oscillation proximity sensor, a capacitive proximity sensor, a magnetic proximity sensor, an infrared proximity sensor, for example. The proximity sensor may detect not only a proximity touch but also a proximity touch pattern such as a proximity touch distance, a proximity touch direction, a proximity touch speed, a proximity touch time, a proximity touch position, and a proximity touch moving state. The main processor 710 may process data (or information) corresponding to the proximity touch operation and the proximity touch pattern detected by the proximity sensor, and may control the display panel 300 so that it displays visual information corresponding to the processed data. The ultrasonic sensor may recognize location information of an object using ultrasonic waves. The main processor 710 may calculate the location of an object based on information detected from the optical sensor and the ultrasonic sensors. Because the speed of the light is different from the speed of the ultrasonic waves, the position of the object may be calculated using the time taken for the light to reach the optical sensor and the time taken for the ultrasonic wave to reach the ultrasonic sensor.

The output unit 750 is for generating outputs associated with visual, auditory, tactile effects, and the like, may include at least one of the display panel 300, the sound output module 752, the haptic module 753 and the light output unit 754.

The display panel 300 displays (outputs) information processed by the display device 10. For example, the display panel 300 may display information on an application run on the screen of the display device 10, or user interface (UI) or graphic user interface (GUI) information according to the execution screen information. The display panel 300 may include a display layer for displaying images and a sensor electrode layer for sensing a user's touch input. As a result, the display panel 300 may work as one of the input devices 733 providing an input interface between the display device 10 and the user, and also work as one of the output units 750 for providing an output interface between the display device 10 and the user.

The sound output module 752 may output source data received from the wireless communications unit 720 or stored in the memory 770 in a call signal reception mode, a talking or recording mode, a voice recognition mode, a broadcast reception mode or the like within the spirit and the scope of the disclosure. The sound output module 752 may also output a sound signal associated with a function performed in the display device 10 (for example, a call signal reception sound, a message reception sound, for example.) The sound output unit 752 may include a receiver and a speaker. At least one of the receiver and the speaker may be a sound generator that may be attached under or below the display panel 300 and may vibrate the display panel 300 to output sound. The sound generator may be a piezoelectric element or a piezoelectric actuator that contracts or expands depending on a voltage applied thereto, or may be an exciter that generates a magnetic force using a voice coil to vibrate the display panel 300.

The haptic module 753 may generate a variety of tactile effects sensed by a user. The haptic module 753 may provide a user with vibration as the tactile effect. The intensity and pattern of the vibration generated by the haptic module 753 may be controlled by user selection or setting of the main processor 710. For example, the haptic module 753 may output different vibrations by synthesizing them or sequentially. In addition to the vibration, the haptic module 753 may generate various types of tactile effects, such as stimulus effects by a pin arrangement vertically moving on a skin, a spraying or suction force through a spraying or suction hole, a graze on a skin, contact of an electrode, and an electrostatic force, or effects of cold or hot feeling reproduced by using a device that absorbs or generates heat. The haptic module 753 may not only transmit a tactile effect through direct contact, but also may allow a user to feel the tactile effect through a muscle sense such as a finger or an arm.

The light output unit 754 outputs a signal for notifying occurrence of an event by using light of a light source. Examples of the events occurring in the display device 10 may include message reception, call signal reception, missed call, alarm, schedule notification, email reception, information reception through an application, within the spirit and the scope of the disclosure. The signal output from the light output unit 754 is produced as the display device 10 emits light of a single color or multiple colors through the front or the rear surface. The signal output may be terminated once the display device 10 detects that the user has checked the event.

The interface 760 serves as a path to various types of external devices connected to the display device 10. The interface 760 may include at least one of a wired/wireless headset port, an external charger port, a wired/wireless data port, a memory card port, a port for electrically connecting to a device including an identity module, an audio input/output (I/O) port, a video I/O port and an earphone port. In a case that an external device may be connected to the interface 760 of the display device 10, appropriate control associated with the connected external device may be carried out.

The memory 770 stores data supporting various functions of the display device 10. The memory 770 may store application programs that are run on the display device 10, and data items and instructions for operating the display device 10. At least some or a predetermined number of the application programs may be downloaded from an external server via wireless communications. The memory 770 may store an application program for operating the main processor 710, and may temporally store input/output data, for example, a phone book, a message, a still image, a moving picture, for example. therein. The memory 770 may store haptic data for vibration in different patterns provided to the haptic module 753 and acoustic data regarding various sounds provided to the sound output unit 752. The memory 770 may include at least one of a flash memory type storage medium, a hard disk type storage medium, a solid state disk (SSD) type storage medium, a silicon disk drive (SDD) type storage medium, a multimedia card micro type storage medium, a card type memory (for example, an SD or XD memory), a random access memory (RAM), a static random access memory (SRMA), a read-only memory (ROM), an electrically erasable programmable read-only memory (EEPROM), a programmable read-only memory (PROM), a magnetic memory, a magnetic disk, and an optical disk.

The power supply unit 780 may receive a power from an external power source and an internal power source to supply the power to each of elements included in the display device 10 under the control of the main processor 710. The power supply unit 780 may include the battery 790. The power supply unit 780 includes a connection port. The connection port may be an example of the interface 760 to which the external charger for supplying power for charging the battery 790 may be electrically connected. Alternatively, the power supply unit 780 may charge the battery 790 in a wireless manner without using the connection port. The battery 790 may receive power from an external wireless power transmitter using at least one of inductive coupling based on the magnetic induction phenomenon or magnetic resonance coupling based on the electromagnetic resonance phenomenon. The battery 790 may be disposed so that it does not overlap the main circuit board 700 in the third direction (z-axis direction). The battery 790 may overlap the battery hole BH of the bracket 600.

The bottom cover 900 may be disposed under or below the main circuit board 700 and the battery 790. The bottom cover 900 may be fastened and fixed to the bracket 600. The bottom cover 900 may form the exterior of the lower surface of the display device 10. The bottom cover 900 may include plastic, metal or plastic and metal.

A second camera hole CMH2 may be formed or disposed in the bottom cover 900 via which the lower surface of the camera device 731 is exposed. The positions of the camera device 731 and the first and second camera holes CMH1 and CMH2 in line with the camera device 731 are not limited to those of an embodiment shown in FIGS. 1 and 2.

Figure 4:
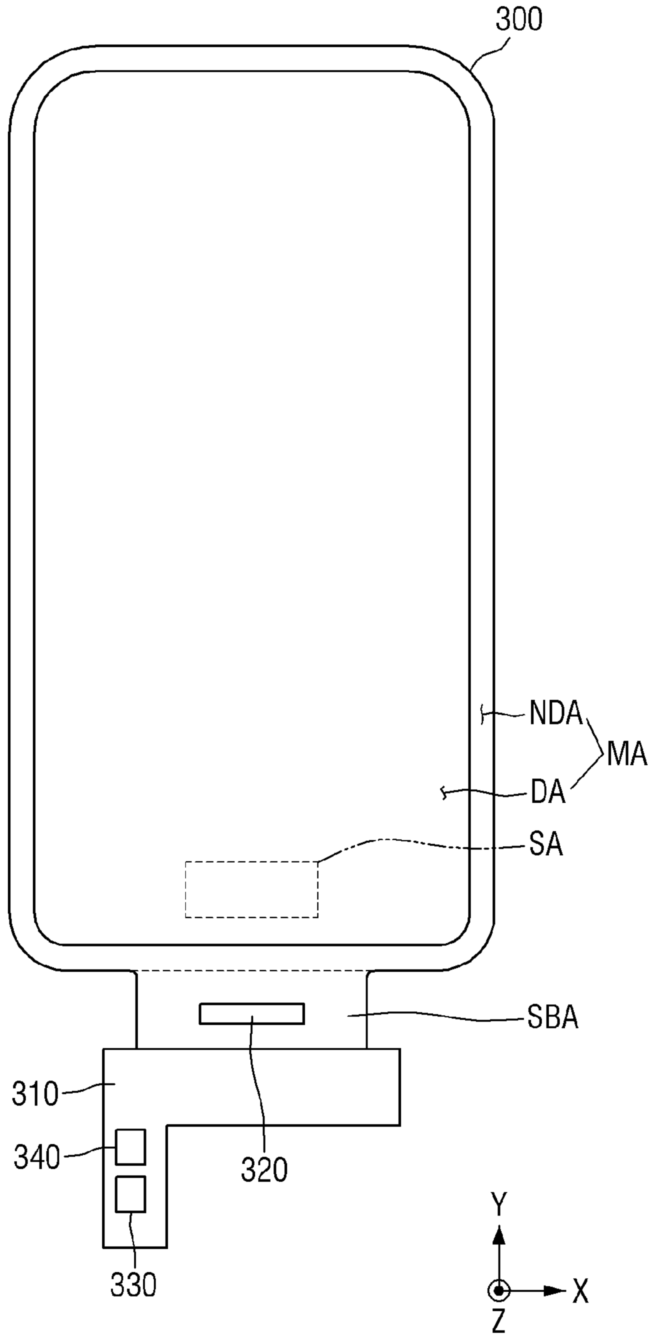
FIG. 4 is a plan view showing a display area, a non-display area and a sensor area of a display panel of a display device according to an embodiment.

FIG. 4 is a plan view showing a display area, a non-display area and a sensor area of a display panel of a display device according to an embodiment. FIG. 5 is a plan view showing a display area, a non-display area and a sensor area of a display panel of a display device according to another embodiment. In the plan views of FIGS. 4 and 5, the subsidiary area SBA of the display panel 300 is not bent but is unfolded.

Referring to FIGS. 4 and 5, the display panel 300 may include the main area MA and the subsidiary area SBA. The main area MA may include a display area DA where display pixels may be disposed to display images, and a non-display area NDA as a peripheral area of the display area DA where no image may be displayed.

The main area MA may include a sensor area SA in which an optical sensor that senses light, a capacitance sensor that senses a change in capacitance, or an ultrasonic sensor that senses ultrasonic waves may be disposed. For example, the optical sensor may be an optical fingerprint sensor, an illuminance sensor, or an optical proximity sensor. Alternatively, the optical sensor may be a solar cell. The capacitance sensor may be a capacitive fingerprint sensor. The ultrasonic sensor may be an ultrasonic fingerprint sensor or an ultrasonic proximity sensor.

In order to detect a person's fingerprint, the optical fingerprint sensor irradiates light onto the person's finger placed in the sensor area SA and detects light reflected off valleys and absorbed by ridges of the fingerprint of the finger. The illuminance sensor detects light incident from the outside to determine illuminance of the environment in which the display device 10 is disposed. In order to determine whether an object is disposed in close proximity to the display device 10, the optical proximity sensor irradiates light onto the display device 10 and detects light reflected by the object. The capacitive fingerprint sensor detects the fingerprint of a person's finger placed in the sensor area SA by detecting a difference in capacitance between the valleys and the ridges of the fingerprint of the finger.

The ultrasonic fingerprint sensor outputs an ultrasonic wave to the fingerprint of a person's finger placed in the sensor area SA, and detects the ultrasonic wave reflected off the valleys and the ridges of the fingerprint of the finger to detect the fingerprint. In order to determine whether an object is disposed in close proximity to the display device 10, the ultrasonic proximity sensor irradiates light onto the display device 10 and detects light reflected by the object.

The sensor area SA may overlap the display area DA. The sensor area SA may be defined as at least a part of the display area DA. For example, the sensor area SA may be a central area of the display area DA disposed close to one side of the display panel 300 as shown in FIG. 4. It is, however, to be understood that the disclosure is not limited thereto. Alternatively, the sensor area SA may be a part of the display area DA disposed on one side of the display panel 300.

Alternatively, the sensor area SA may be substantially the same as the display area DA as shown in FIG. 5. In such case, light may be detected at every position of the display area DA.

The subsidiary area SBA may protrude from one side of the main area MA in the second direction (y-axis direction). As shown in FIG. 4, the length of the subsidiary area SBA in the first direction (x-axis direction) may be smaller than the length of the main area MA in the first direction (x-axis direction). The length of the subsidiary area SBA in the second direction (y-axis direction) may be smaller than the length of the main area MA in the second direction (y-axis direction). It is, however, to be understood that the disclosure is not limited thereto. The subsidiary area SBA may be bent and disposed on the lower surface of the substrate SUB. The subsidiary area SBA may overlap the main area MA in the thickness direction of the substrate SUB, for example, the third direction (z-axis direction).

The display circuit board 310 and the display driver 320 may be disposed in the subsidiary area SBA. The display circuit board 310 may be disposed on the display pads disposed on one side of the subsidiary area SBA. The display circuit board 310 may be attached to the display pads in the subsidiary area SBA using an anisotropic conductive film.

Figure 6:
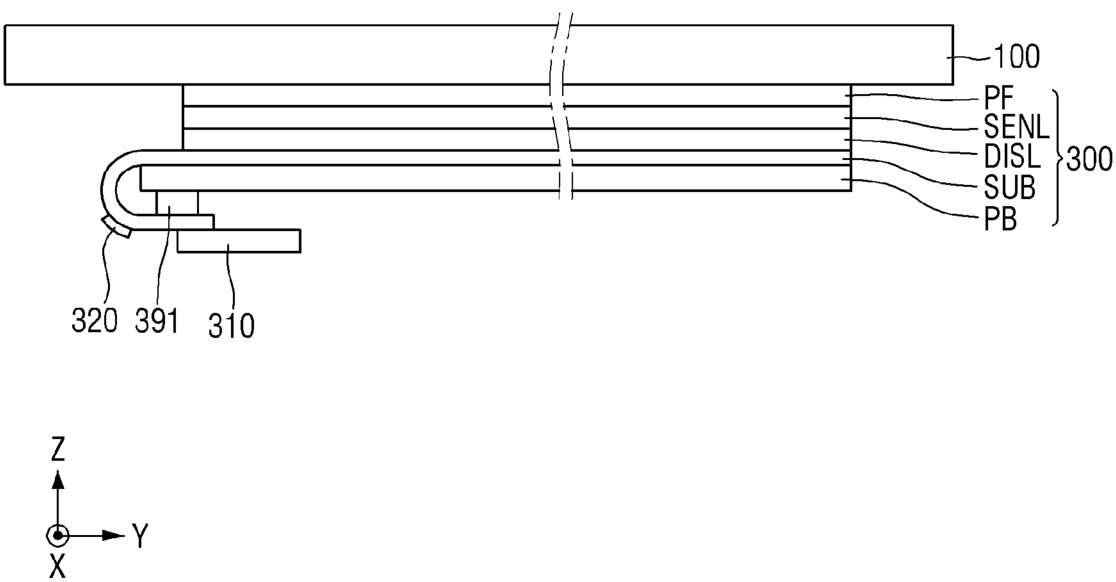
FIG. 6 is a schematic cross-sectional view showing a cover window and a display panel according to an embodiment.

FIG. 6 is a schematic cross-sectional view showing a cover window and a display panel according to an embodiment. FIG. 6 is a schematic cross-sectional view of the display panel 300 with the subsidiary area SBA of FIG. 4 bent and disposed on the lower surface of the display panel 300.

Referring to FIG. 6, the display panel 300 may include a substrate SUB, a display layer DISL, a sensor electrode layer SENL, a polarizing film PF, and a panel bottom cover PB.

The substrate SUB may be made of an insulating material such as glass, quartz and a polymer resin. The substrate SUB may be a rigid substrate or a flexible substrate that may be bent, folded, rolled, and so on.

The display layer DISL may be disposed on the main area MA of the substrate SUB. The display layer DISL may include the display pixels to display images. The display layer DISL may include sensor pixels to sense light incident from the outside. The display layer DISL may include a thin-film transistor layer on which thin-film transistors are formed, an emission material layer on which light-emitting elements emitting light are formed, and an encapsulation layer for encapsulating the emission material layer.

In addition to the display pixels, scan lines, data lines, power lines, for example, electrically connected to the display pixels may be disposed on the display layer DISL in the display area DA. In addition to the sensor pixels, sensing scan lines, lead-out lines, reset signal lines, for example, electrically connected to the sensor pixels may be disposed on the display layer DISL in the display area DA.

The scan driver, fan-out lines, for example, may be disposed on the display layer DISL in the non-display area NDA. The scan driver may apply scan signals to the scan lines, may apply sensing scan signals to the sensing scan lines, and may apply reset signals to reset signal lines. The fan-out lines may electrically connect the data lines with the display driver 320, and fan-out lines connecting the lead-out lines with the display pads may be disposed.

The sensor electrode layer SENL may be disposed on the display layer DISL. The sensor electrode layer SENL may include sensor electrodes and may sense whether there is a touch of an object.

The sensor electrode layer SENL may include a touch sensing region and a touch peripheral region. In the touch sensing region, the sensor electrodes are disposed to sense a touch input of an object. In the touch peripheral region, no sensor electrodes are disposed. The touch peripheral region may surround or be adjacent to the touch sensing region. The touch peripheral area may be formed on the outer side of the touch sensing region to be extended to the edge of the display panel 300. The sensor electrodes, the connectors, and conductive patterns may be disposed in the touch sensing region. Sensor lines electrically connected to the sensor electrodes may be disposed in the touch peripheral region.

The touch sensing region of the sensor electrode layer SENL may overlap the display area DA of the display layer DISL. The touch sensing region of the sensor electrode layer SENL may overlap the sensor area SA. The touch peripheral region of the sensor electrode layer SENL may overlap the non-display area NDA of the display layer DISL.

The polarizing film PF may be disposed on the sensor electrode layer SENL. The polarizing film PF may include a linear polarizer and a phase retardation film such as a $\lambda/4$ (quarter-wave) plate. The phase retardation film may be disposed on the sensor electrode layer SENL, and the linear polarizer may be disposed on the phase retardation film.

The cover window 100 may be disposed on the polarizing film PF. The cover window 100 may be attached onto the polarizing film PF by a transparent adhesive member such as an optically clear adhesive (OCA) film.

A panel bottom cover PB may be disposed under or below the substrate SUB. The panel bottom cover PB may be attached to the lower surface of the substrate SUB by an adhesive member. The adhesive member may be a pressure-sensitive adhesive (PSA). The panel bottom cover PB may include at least one of: a light-blocking member for absorbing light incident from outside, a buffer member for absorbing external impact, and a heat dissipating member for efficiently discharging heat from the display panel 300.

The light-blocking member may be disposed under or below the substrate SUB. The light-blocking member blocks the transmission of light to prevent the elements disposed thereunder from being seen from above the display panel 300, such as the display circuit board 310. The light-blocking member may include a light-absorbing material such as a black pigment and a black dye.

The buffer member may be disposed under or below the light-blocking member. The buffer member absorbs an external impact to prevent the display panel 300 from being damaged. The buffer member may be made up of a single layer or multiple layers. For example, the buffer member may be formed of a polymer resin such as polyurethane, polycarbonate, polypropylene and polyethylene, or may be formed of a material having elasticity such as a rubber and a sponge obtained by foaming a urethane-based material or an acrylic-based material.

The heat dissipating member may be disposed under or below the buffer member. The heat-dissipating member may include a first heat dissipation layer including graphite or carbon nanotubes, and a second heat dissipation layer formed of a thin metal film such as copper, nickel, ferrite and silver, which can block electromagnetic waves and have high thermal conductivity.

The subsidiary area SBA of the substrate SUB may be bent and accordingly disposed on the lower surface of the display panel 300. The subsidiary area SBA of the substrate SUB may be attached to the lower surface of the panel bottom cover PB by an adhesive layer 391. The adhesive layer 391 may be a pressure-sensitive adhesive (PSA).

Figure 7:
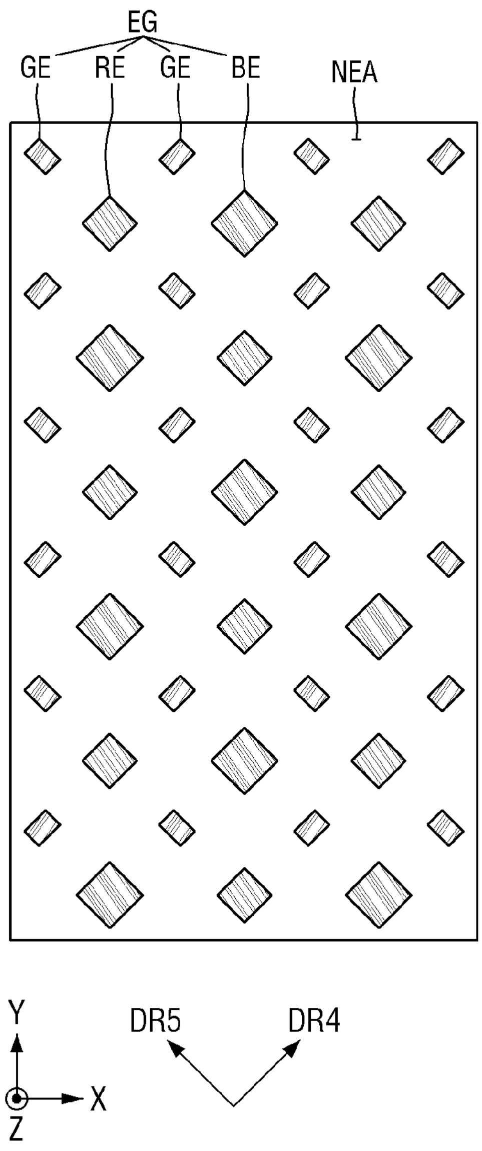
FIG. 7 is a view showing an example of a layout of emission areas of display pixels in the display area of FIG. 4.
Figure 8:
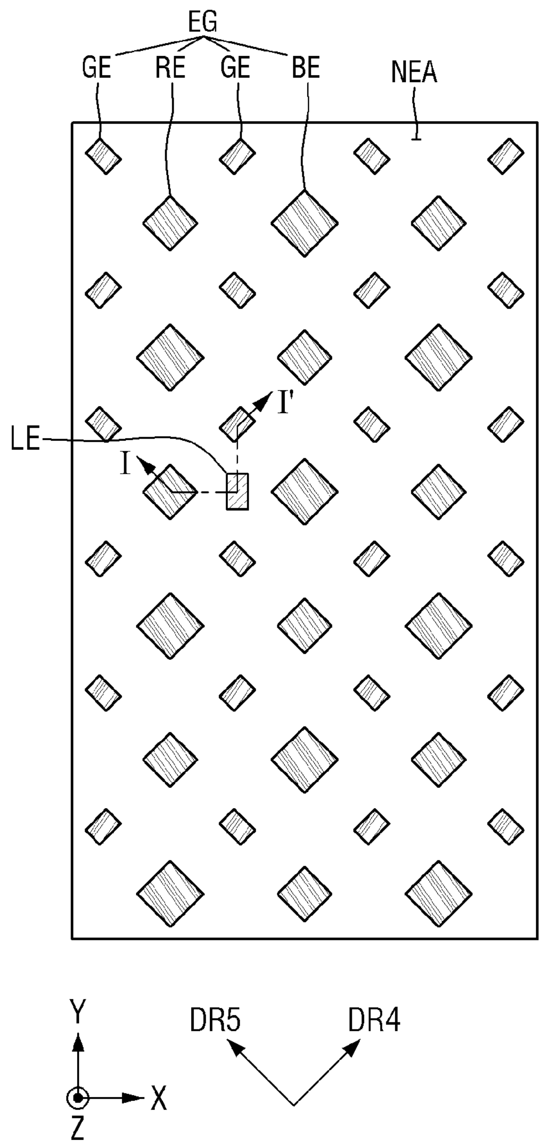
FIG. 8 is a view showing an example of a layout of emission areas of display pixels and light-receiving areas of sensor pixels in the sensor area of FIG. 4.

FIG. 7 is a plan view showing an example of emission areas of display pixels in the display area of FIG. 4. FIG. 8 is a plan view showing an example of emission areas of display pixels and light-receiving areas of sensor pixels in the sensor area of FIG. 4.

FIGS. 7 and 8 show first emission areas RE of a first display pixel, second emission areas GE of a second display pixel, third emission areas BE of a third display pixel, and a light-receiving area LE of a sensor pixel.

Referring to FIGS. 7 and 8, the sensor area SA may include the first to third emission areas RE, GE and BE, the light-receiving area LE, and a non-emission area NEA.

Each of the first emission areas RE may emit light of a first color, each of the second emission areas GE may emit light of a second color, and each of the third emission areas BE may emit light of a third color. For example, the first color may be red, the second color may be green, and the third color may be blue. It is, however, to be understood that the disclosure is not limited thereto.

In the example shown in FIGS. 7 and 8, each of the first emission areas RE, the second emission areas GE and the third emission areas BE may have a substantially diamond shape or a substantially rectangular shape in a case that each of the first emission areas RE, the second emission areas GE and the third emission areas BE are viewed from the top. It is, however, to be understood that the disclosure is not limited thereto. Each of the first emission areas RE, the second emission areas GE and the third emission areas BE may have other polygonal shape than a quadrangular shape, a circular shape or an elliptical shape in a case that the emission areas RE, GE and BE may be viewed from the top. Although the area of the third emission areas BE is the largest while the area of the second emission areas GE is the smallest in the example shown in FIGS. 7 and 8, the disclosure is not limited thereto.

One first emission area RE, two second emission areas GE and one third emission area BE may be defined as a single emission group EG for representing black-and-white or grayscale. For example, the black-and-white or grayscale may be represented by a combination of light emitted from one first emission area RE, light emitted from two second emission areas GE, and light emitted from one third emission area BE.

The second emission areas GE may be disposed in odd rows. The second emission areas GE may be arranged or disposed side by side in each of the odd rows in the first direction (x-axis direction). For every two adjacent, second emission areas GE arranged or disposed in the first direction (x-axis direction) in each of the odd rows, one may have longer sides in a fourth direction DR4 and shorter sides in a fifth direction DR5, while the other may have longer sides in the fifth direction DR5 and shorter sides in the fourth direction DR4. The fourth direction DR4 may refer to the direction between the first direction (x-axis direction) and the second direction (y-axis direction), and the fifth direction DR5 may refer to the direction crossing or intersecting the fourth direction DR4.

The first emission areas RE and the third emission areas BE may be arranged or disposed in even rows. The first emission areas RE and the third emission areas BE may be disposed side by side in each of the even rows in the first direction (x-axis direction). The first emission areas RE and the third emission areas BE may be arranged or disposed alternately in each of the even rows.

The second emission areas GE may be disposed in odd columns. The second emission areas GE may be arranged or disposed side by side in each of the odd columns in the second direction (y-axis direction). For every two adjacent, second emission areas GE arranged or disposed in the second direction (y-axis direction) in each of the odd columns, one may have longer sides in a fourth direction DR4 and shorter sides in a fifth direction DR5, while the other may have longer sides in the fifth direction DR5 and shorter sides in the fourth direction DR4.

The first emission areas RE and the third emission areas BE may be arranged or disposed in even columns. The first emission areas RE and the third emission areas BE may be disposed side by side in each of the even columns in the second direction (y-axis direction). The first emission areas RE and the third emission areas BE may be arranged or disposed alternately in each of the even columns.

The light-receiving area LE may sense light incident from the outside rather than emitting light. The light-receiving area LE may be included only in the sensor area SA but not in the display area DA except for the light-receiving area LE as shown in FIG. 8.

The light-receiving area LE may be disposed between the first emission area RE and the third emission area GE in the first direction (x-axis direction) and may be disposed between the second emission areas BE in the second direction (y-axis direction). Although the light-receiving area LE may have a substantially rectangular shape when viewed from the top in FIG. 8, the disclosure is not limited thereto. The light-receiving area LE may have other polygonal shape than a quadrangular shape, a circular shape, an elliptical shape. The area of the light-receiving area LE may be smaller than the area of the second emission area GE, but the disclosure is not limited thereto.

In a case that the sensor area SA may sense light incident from the outside to recognize a fingerprint of a person's finger, the number of the light-receiving areas LE in the sensor area SA may be less than the number of the first emission area RE, the number of the second emission areas GE and the number of the third emission areas BE. Since the distance between the ridges RID (see FIG. 15) of the fingerprint of a person's finger may be in a range of about 100 μm to about 150 μm, the light-receiving areas LE may be spaced apart from one another by approximately 100 μm to about 450 μm in the first direction (x-axis direction) and the second direction (y-axis direction). For example, in a case that the pitch of the emission areas RE, GE and BE in the first direction (x-axis direction) may be approximately 45 μm, the light-receiving area LE may be disposed every two to ten emission areas in the first direction (x-axis direction).

The length of a first pin hole PH1 in the first direction (x-axis direction) may be about 5 μm, and the length thereof in the second direction (y-axis direction) may be about 5 μm, so that the first pin hole PH1 may have a substantially square shape in a case that the first pin hole PH1 may be viewed from the top. It is, however, to be understood that the disclosure is not limited thereto.

The non-emission area NEA may refer to the area other than the first to third emission areas RE, GE and BE and the light-receiving area LE. In the non-emission area NEA, lines electrically connected to the first to third display pixels may be disposed so that the first to third emission areas RE, GE and BE can emit light. The non-emission area NEA may be disposed to surround or be adjacent to each of the first to third emission areas RE, GE and BE and the light-receiving area LE.

As shown in FIGS. 7 and 8, the sensor area SA of the display panel 300 may include the light-receiving areas LE in addition to the emission areas RE, GE, and BE. Therefore, light incident on the upper surface of the display panel 300 may be sensed by the light-receiving areas LE of the display panel 300.

For example, light reflected at the valleys of the fingerprint of a person's finger located or disposed on the upper surface of the cover window 100 may be sensed in each of the light-receiving areas LE. Therefore, the fingerprint of a person's finger may be recognized based on the amount of light detected in each of the light-receiving areas LE of the display panel 300. In other words, the fingerprint of the person's finger may be recognized through the sensor pixels including the light-receiving elements PD (see FIG. 14) built in the display panel 300.

Alternatively, light incident on the upper surface of the display panel 300 may be detected in each of the light-receiving areas LE. Therefore, the amount of light incident from the outside of the display device 10 may be determined based on the amount of light detected in each of the light-receiving areas LE of the display panel 300. For example, the illuminance of the environment in which the display device 10 may be disposed may be determined through the sensor pixels including the light-receiving elements PD built in the display panel 300.

Alternatively, light reflected from an object located or disposed near the upper surface of the cover window 100 may be detected in each of the light-receiving areas LE. Therefore, it may be possible to detect an object placed near the upper surface of the display device 10 based on the amount of light detected in each of the light-receiving areas LE of the display panel 300. For example, it may be possible to determine whether an object is placed near the upper surface of the display device 10 through the sensor pixels including the light-receiving elements PD built in the display panel 300.

Figure 9:
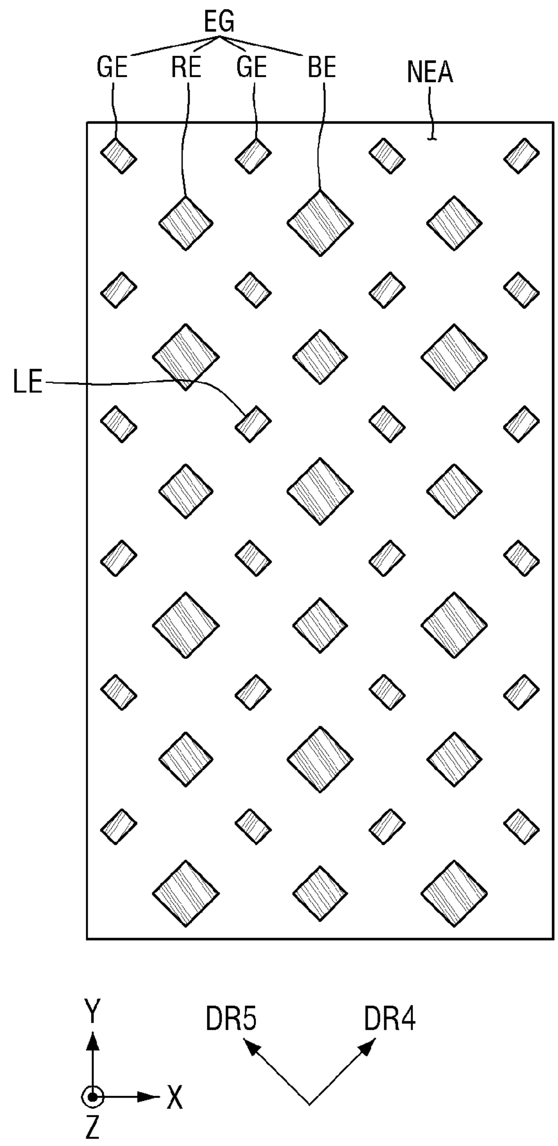
FIG. 9 is a view showing an example of a layout of emission areas of display pixels and light-receiving areas of sensor pixels in the sensor area of FIG. 4.

FIG. 9 is a plan view showing another example of display pixels and sensor pixels in the sensor area of FIG. 4.

An embodiment of FIG. 9 may be different from an embodiment of FIG. 8 in that one of the second emission areas GE may be eliminated and a light-receiving area LE may be disposed in place of the eliminated second emission area GE.

Referring to FIG. 9, the light-receiving areas LE may be arranged or disposed in parallel with the second emission areas GE in the first direction (x-axis direction) and the second direction (y-axis direction). For the second emission area GE and the light-receiving area LE adjacent to each other in the first direction (x-axis direction), one of them may have longer sides in the fourth direction DR4 and shorter sides in the fifth direction DR5, while the other one may have longer sides in the fifth direction DR5 and shorter sides in the fourth direction DR4. For the second emission area GE and the light-receiving area LE adjacent to each other in the second direction (y-axis direction), one of them may have longer sides in the fourth direction DR4 and shorter sides in the fifth direction DR5, while the other one may have longer sides in the fifth direction DR5 and shorter sides in the fourth direction DR4.

Although the area of the light-receiving area LE is substantially equal to the area of each of the second emission areas GE in FIG. 9, the disclosure is not limited thereto. The area of the light-receiving area LE may be larger or smaller than the area of each of the second emission areas GE.

In a case that the light-receiving area LE is disposed, the second emission area GE may be eliminated, and accordingly the emission group EG adjacent to the light-receiving area LE may include one first emission area RE, one second emission area GE and one third emission area BE. For example, the emission group EG adjacent to the light-receiving area LE may include one second emission area GE, while each of the other emission groups EG may include two second emission areas GE. Therefore, the second emission area GE of the emission group EG adjacent to the light-receiving area LE may have a higher luminance to compensate for its smaller area than that of the second emission area GE of each of the other emission groups EG.

As shown in FIG. 9, in a case that one of the second emission areas GE is eliminated and the light-receiving area LE is disposed instead of the second emission area GE, the area of the light-receiving area LE may be increased, so that the amount of light detected in the light-receiving area LE may increase. As a result, the accuracy of sensing light by the optical sensor may be increased.

Figure 10:
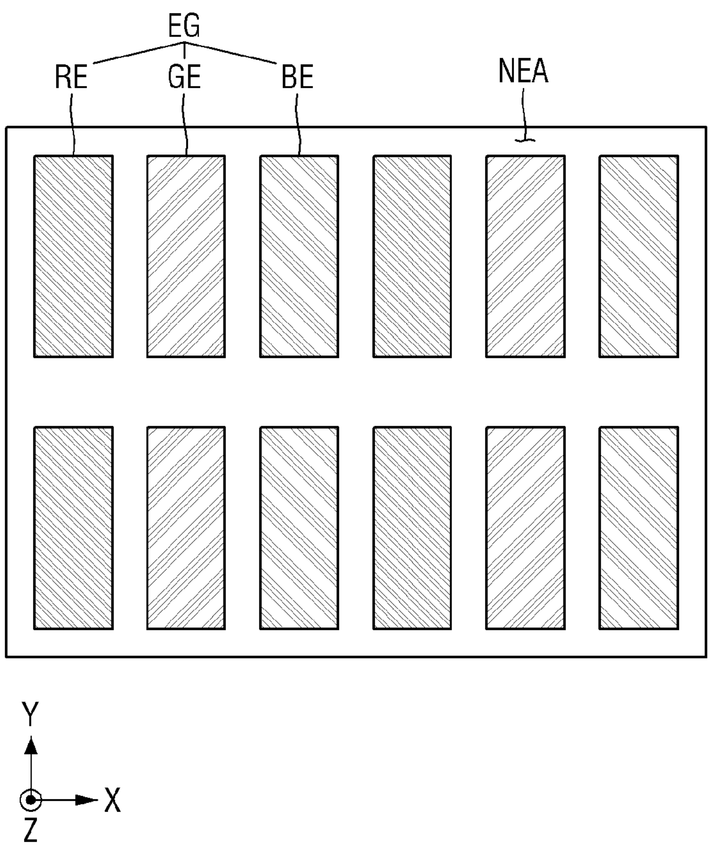
FIG. 10 is a view showing another example of a layout of emission areas of display pixels in the display area of FIG. 4.
Figure 11:
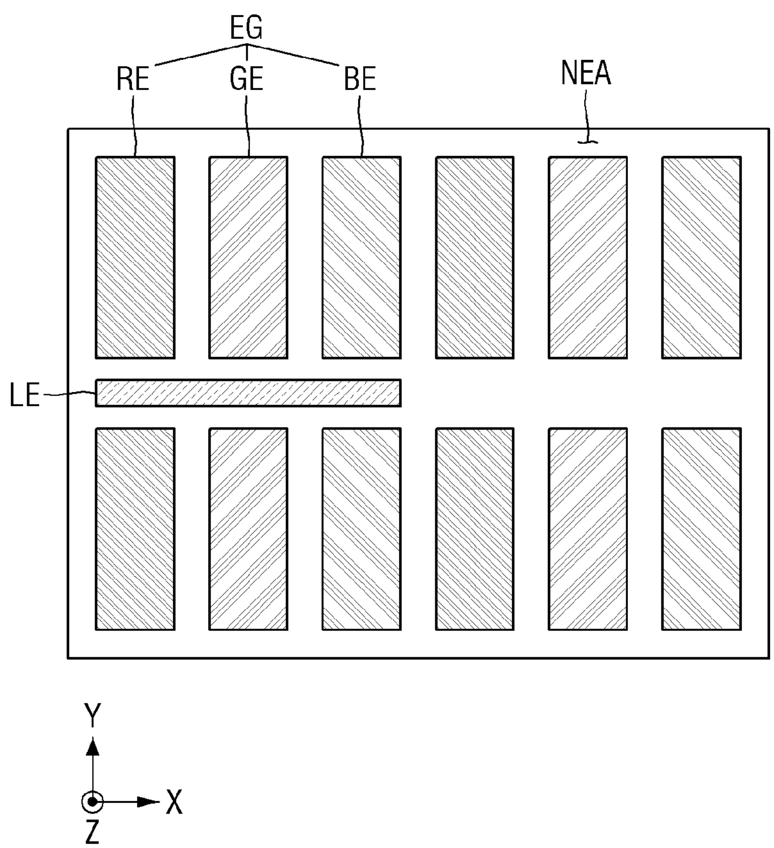
FIG. 11 is a view showing an example of a layout of emission areas of display pixels and light-receiving areas of sensor pixels in the sensor area of FIG. 4.

FIG. 10 is a plan view showing another example of emission areas of display pixels in the display area of FIG. 4. FIG. 11 is a plan view showing another example of emission areas of display pixels and light-receiving areas of sensor pixels in the sensor area of FIG. 4.

An embodiment of FIGS. 10 and 11 may be different from an embodiment of FIGS. 7 and 8 in that the first to third emission areas RE, GE and BE are arranged or disposed sequentially and repeatedly in the first direction (x-axis direction), while the first to third emission areas RE, GE and BE, respectively, are arranged or disposed side by side in the second direction (y-axis direction).

In the example shown in FIGS. 10 and 11, each of the first emission areas RE, the second emission areas GE and the third emission areas BE may have a substantially rectangular shape in a case that the emission areas RE, GE and BE may be viewed from the top. For example, each of the first emission areas RE, the second emission areas GE and the third emission areas BE may have a substantially rectangular shape having shorter sides in the first direction (x-axis direction) and longer sides in the second direction (y-axis direction) in a case that the emission areas RE, GE and BE may be viewed from the top. Alternatively, each of the first emission areas RE, the second emission areas GE and the third emission areas BE may have other polygonal shapes other than a quadrangular shape, a circular shape or an elliptical shape in a case that the emission areas RE, GE and BE may be viewed from the top. Although the first emission areas RE, the second emission areas GE and the third emission areas BE may have substantially the same area, the disclosure is not limited thereto.

One first emission area RE, one second emission area GE and one third emission area BE may be defined as a single emission group EG for representing black-and-white or grayscale. In other words, the black-and-white or grayscale may be represented by a combination of light emitted from one first emission area RE, light emitted from one second emission area GE, and light emitted from one third emission area BE.

The first emission areas RE, the second emission areas GE and the third emission areas BE may be arranged or disposed sequentially and repeatedly in the first direction (x-axis direction). For example, a first emission area RE, a second emission area GE, a third emission area BE, a first emission area RE, a second emission area GE, a third emission area BE, and so on may be arranged or disposed in the first direction (x-axis direction).

The first to third emission areas RE, GE and BE, respectively, may be arranged or disposed side by side in the second direction (y-axis direction). For example, the first emission areas RE may be arranged or disposed side by side in the second direction (y-axis direction), the second emission areas GE may be arranged or disposed side by side in the second direction (y-axis direction), and the third emission areas BE may be arranged or disposed side by side in the second direction (y-axis direction).

For example, the light-receiving area LE may be disposed between adjacent first emission areas RE in the second direction (y-axis direction), between adjacent second emission areas GE in the second direction (y-axis direction), and between adjacent third emission areas BE in the second direction (y-axis direction). Alternatively, the light-receiving area LE may be disposed at least one of an area between adjacent first emission areas RE in the second direction (y-axis direction), an area between adjacent second emission areas GE in the second direction (y-axis direction), and an area between adjacent third emission areas BE in the second direction (y-axis direction).

The light-receiving area LE may have a substantially rectangular shape in a case that the light-receiving area LE may be viewed from the top. For example, the light-receiving area LE may have a substantially rectangular shape having longer sides in the first direction (x-axis direction) and shorter sides in the second direction (y-axis direction) in a case that the light-receiving area LE may be viewed from the top. Alternatively, the light-receiving area LE may have other quadrangular shape than a substantially rectangular shape, other polygonal shape than a quadrangular shape, a circular shape, or an elliptical shape. The area of the light-receiving area LE may be smaller than the area of the first emission area RE, the area of the second emission area GE, and the area of the third emission area BE.

As shown in FIGS. 10 and 11, the sensor area SA of the display panel 300 may include the light-receiving areas LE in addition to the emission areas RE, GE, and BE. Therefore, light incident on the upper surface of the display panel 300 may be sensed by the light-receiving areas LE of the display panel 300.

Figure 12:
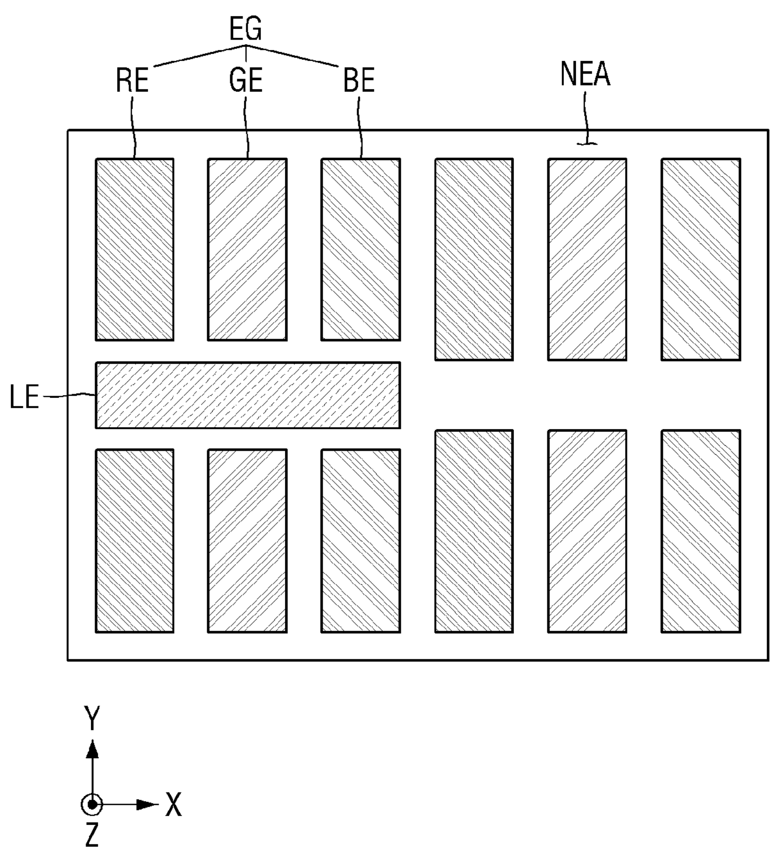
FIG. 12 is a view showing an example of a layout of emission areas of display pixels and light-receiving areas of sensor pixels in the sensor area of FIG. 4.

FIG. 12 is a plan view showing another example of emission areas of display pixels and light-receiving areas of sensor pixels in the sensor area of FIG. 4.

An embodiment shown in FIG. 12 may be different from an embodiment of FIG. 11 in that areas of the first emission area RE, the second emission area GE and the third emission area BE which may be disposed adjacent to the light-receiving area LE in the second direction (y-axis direction) may be respectively smaller than areas of the first emission area RE, the second emission area GE and the third emission area BE which may not be disposed adjacent to the light-receiving area LE in the second direction (y-axis direction).

Referring to FIG. 12, the length of the first emission area RE that may be disposed adjacent to the light-receiving area LE in the second direction (y-axis direction) may be smaller than the length of the first emission area RE that may not be disposed adjacent to the light-receiving area LE in the second direction (y-axis direction). In order to compensate for the smaller area, the first emission area RE that may be disposed adjacent to the light-receiving area LE in the second direction (y-axis direction) may emit light with a higher luminance than that of the first emission area RE that may not be disposed adjacent to the light-receiving area LE in the second direction (y-axis direction).

The length of the second emission area GE that may be disposed adjacent to the light-receiving area LE in the second direction (y-axis direction) may be smaller than the length of the second emission area GE that may not be disposed adjacent to the light-receiving area LE in the second direction (y-axis direction). In order to compensate for the smaller area, the second emission area GE that may be disposed adjacent to the light-receiving area LE in the second direction (y-axis direction) may emit light with a higher luminance than that of the second emission area GE that may not be disposed adjacent to the light-receiving area LE in the second direction (y-axis direction).

The length of the third emission area BE that may be disposed adjacent to the light-receiving area LE in the second direction (y-axis direction) may be smaller than the length of the third emission area BE that may not be disposed adjacent to the light-receiving area LE in the second direction (y-axis direction). In order to compensate for the smaller area, the third emission area BE that may be disposed adjacent to the light-receiving area LE in the second direction (y-axis direction) may emit light with a higher luminance than that of the third emission area BE that may not be disposed adjacent to the light-receiving area LE in the second direction (y-axis direction).

Although the light-receiving area LE is disposed between adjacent first emission areas RE in the second direction (y-axis direction), between adjacent second emission areas GE in the second direction (y-axis direction), and between adjacent third emission areas BE in the second direction (y-axis direction) in FIG. 12, the disclosure is not limited thereto. For example, the light-receiving area LE may be disposed at least one of an area between adjacent first emission areas RE in the second direction (y-axis direction), an area between adjacent second emission areas GE in the second direction (y-axis direction), and an area between adjacent third emission areas BE in the second direction (y-axis direction). In such case, the area of at least one of the first emission area RE, the second emission area GE and the third emission area BE which are disposed adjacent to the light-receiving area LE in the second direction (y-axis direction) may be smaller than the areas of the first emission area RE, the second emission area GE and the third emission area BE which are not disposed adjacent to the light-receiving area LE in the second direction (y-axis direction).

As shown in FIG. 12, as the areas of the first emission area RE, the second emission area GE and the third emission area BE which are disposed adjacent to the light-receiving area LE in the second direction (y-axis direction) are reduced, the area of the light-receiving area LE may be increased, so that the amount of light detected by the light-receiving area LE may be increased. As a result, the accuracy of sensing light by the optical sensor may be increased.

Figure 13:
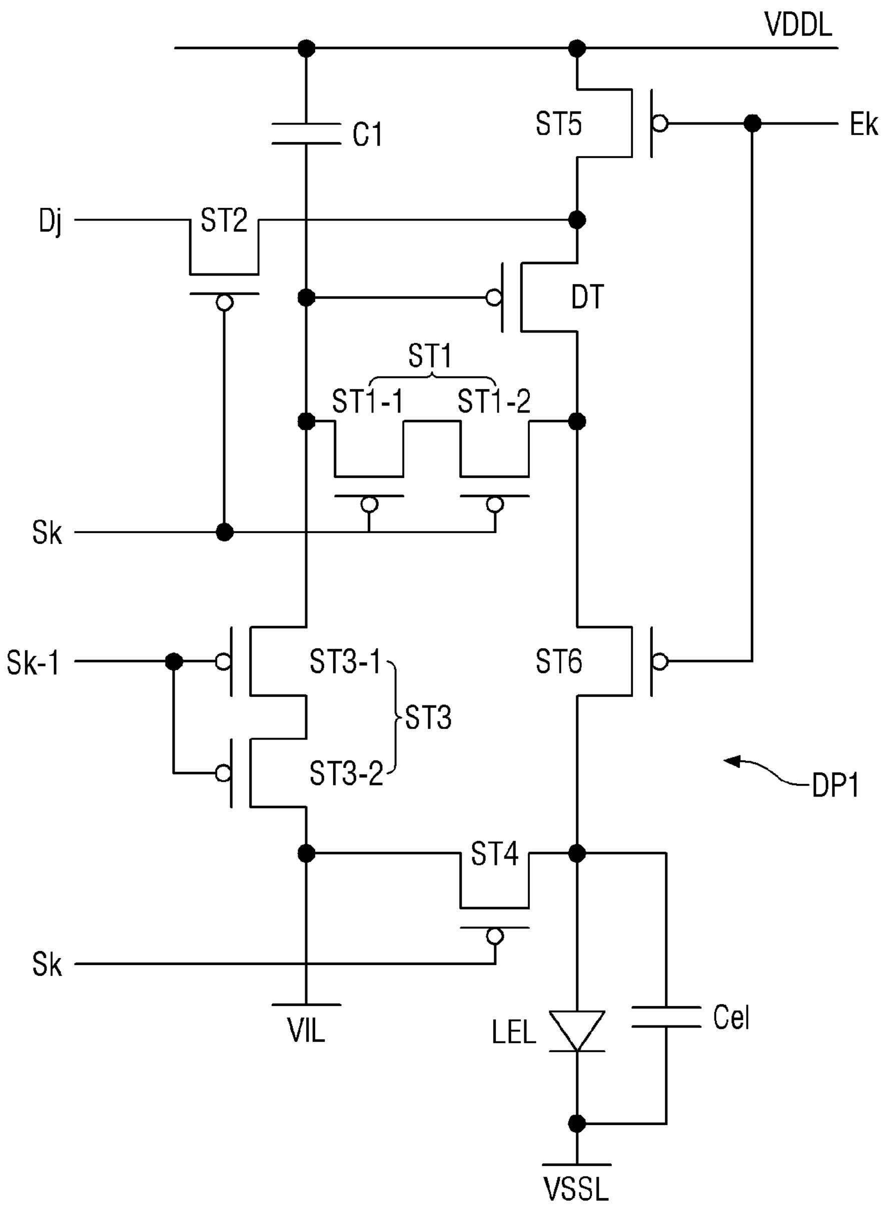
FIG. 13 is an equivalent circuit diagram showing an example of a display pixel in the display area of FIG. 7.

FIG. 13 is an equivalent circuit diagram showing an example of a first display pixel in the display area of FIG. 7.

Referring to FIG. 13, a first display pixel DP1 including the first emission area RE may be electrically connected to a $(k-1)^{th}$ scan line Sk−1, a $k^{th}$ scan line Sk, and a $j^{th}$ data line Dj, where k is a positive integer equal to or greater than two and j is a positive integer. The first display pixel DP1 may be electrically connected to a first supply voltage line VDDL from which the first supply voltage is supplied, an initializing voltage line VIL from which an initializing voltage is supplied, and a second supply voltage line VSSL from which the second supply voltage is supplied.

The first display pixel DP1 includes a driving transistor DT, a light-emitting element LEL, at least one switch element and a first capacitor C1. Although the at least one switch element includes first to sixth transistors ST1, ST2, ST3, ST4, ST5 and ST6 in the example shown in FIG. 13, the disclosure is not limited thereto. The at least one switch element may include one or more transistors.

The driving transistor DT may include a gate electrode, a first electrode and a second electrode. The drain-source current Ids (hereinafter referred to as "driving current") of driving transistor DT flowing between the first electrode and the second electrode is controlled according to the data voltage applied to the gate electrode. The driving current Ids flowing through the channel of the driving transistor DT is proportional to the square of the difference between the gate-source voltage Vsg and the threshold voltage Vth of the driving transistor DT, as shown in Equation 1 below:

$$Ids=k'\times(Vgs-Vth)^2 \quad \text{[Equation 1]}$$

where k' denotes a proportional coefficient determined by the structure and physical properties of the driving transistor DT, Vgs denotes the gate-source voltage of the driving transistor DT, and Vth denotes the threshold voltage of the driving transistor DT.

The light-emitting element LEL emits light as the driving current Ids flows therein. The amount of the light emitted from the light-emitting element LEL may be proportional to the driving current Ids.

The light-emitting element LEL may be an organic light-emitting diode including an anode electrode, a cathode electrode, and an organic emissive layer disposed between the anode electrode and the cathode electrode. Alternatively, the light-emitting element LEL may be an inorganic light-emitting element including an anode electrode, a cathode electrode, and an inorganic semiconductor element disposed between the anode electrode and the cathode electrode. Alternatively, the light-emitting element LEL may be a quantum-dot light-emitting element including an anode electrode, a cathode electrode, and a quantum-dot emissive layer disposed between the anode electrode and the cathode electrode. Alternatively, the light-emitting element LEL may be a micro light-emitting diode chip. In the following description, the anode electrode is a first light-emitting electrode 171 (see FIG. 15) and the cathode electrode is a second light-emitting electrode 173 (see FIG. 15) for convenience of illustration.

The first light-emitting electrode of the light-emitting element LEL may be electrically connected to the first electrode of the fourth transistor ST4 and the second electrode of the sixth transistor ST6, while the second light-emitting electrode may be connected to the second supply voltage line VSSL. A parasitic capacitance Cel may be formed between the first light-emitting electrode and the second light-emitting electrode of the light-emitting element LEL.

The first transistor ST1 may be a dual transistor including a (1-1) transistor ST1-1 and a (1-2) transistor ST1-2. The (1-1) transistor ST1-1 and the (1-2) transistor ST1-2 may be turned on by the scan signal from the $k^{th}$ scan line Sk to electrically connect the first electrode of the first transistor ST1 with the second electrode of the driving transistor DT. For example, in a case that the (1-1) transistor ST1-1 and the (1-2) transistor ST1-2 are turned on, the gate electrode of the driving transistor DT may be electrically connected to the second electrode of the driving transistor DT, and thus the driving transistor DT may function as a diode. The gate electrode of the (1-1) transistor ST1-1 may be electrically connected to the $k^{th}$ scan line Sk, the first electrode thereof may be electrically connected to the second electrode of the (1-2) transistor ST1-2, and the second electrode thereof may be electrically connected to the gate electrode of the driving transistor DT. The gate electrode of the (1-2) transistor ST1-2 may be electrically connected to the $k^{th}$ scan line Sk, the first electrode thereof may be electrically connected to the second electrode of the driving transistor DT, and the second electrode thereof may be electrically connected to the first electrode of the (1-1) transistor ST1-1.

The second transistor ST2 is turned on by the scan signal of the $k^{th}$ scan line Sk to electrically connect the first electrode of the driving transistor DT with the $j^{th}$ data line Dj. The gate electrode of the second transistor ST2 may be electrically connected to the $k^{th}$ scan line Sk, the first electrode thereof may be electrically connected to the first electrode of the driving transistor DT, and the second electrode thereof may be electrically connected to the $j^{th}$ data line Dj.

The third transistor ST3 may be implemented as a dual transistor including a (3-1) transistor ST3-1 and a (3-2) transistor ST3-2. The (3-1) transistor ST3-1 and the (3-2) transistor ST3-2 are turned on by the scan signal of the $(k-1)^{th}$ scan line Sk−1 to electrically connect the gate electrode of the driving transistor DT with the initialization voltage line VIL. The gate electrode of the driving transistor DT may be discharged to the initializing voltage of the initialization voltage line VIL. The gate electrode of the (3-1) transistor ST3-1 may be electrically connected to the $(k-1)^{th}$ scan line Sk−1, the first electrode thereof may be electrically connected to the second electrode of the driving transistor DT, and the second electrode thereof may be electrically connected to the first electrode of the (3-2) transistor ST3-2. The gate electrode of the (3-2) transistor ST3-2 may be electrically connected to the $(k-1)^{th}$ scan line Sk−1, the first electrode thereof may be electrically connected to the second electrode of the (3-1)transistor ST3-1, and the second electrode thereof may be electrically connected to the initialization voltage line VIL.

The fourth transistor ST4 is turned on by the scan signal of the $k^{th}$ scan line Sk to electrically connect the first light-emitting electrode of the light-emitting element LEL with the initialization voltage line VIL. The first light-emitting electrode of the light-emitting element LEL may be discharged to the initializing voltage. The gate electrode of the fourth transistor ST4 may be electrically connected to the $k^{th}$ scan line Sk, the first electrode thereof may be electrically connected to the first light-emitting electrode of the light-emitting element LEL, and the second electrode thereof may be electrically connected to the initializing voltage line VIL.

The fifth transistor ST5 is turned on by the emission control signal of the $k^{th}$ emission line Ek to electrically connect the first electrode of the driving transistor DT with the first supply voltage line VDDL. The gate electrode of the fifth transistor ST5 may be electrically connected to the $k^{th}$ emission line Ek, the first electrode thereof may be electrically connected to the first supply voltage line VDDL, and the second electrode thereof may be electrically connected to the first electrode of the driving transistor DT.

The sixth transistor ST6 may be electrically connected between the second electrode of the driving transistor DT and the first light-emitting electrode of the light-emitting element LEL. The sixth transistor ST6 is turned on by the emission control signal of the $k^{th}$ emission line Ek to electrically connect the second electrode of the driving transistor DT with the first light-emitting electrode of the light-emitting element LEL. The gate electrode of the sixth transistor ST6 may be electrically connected to the $k^{th}$ emission line Ek, the first electrode thereof may be electrically connected to the second electrode of the driving transistor DT, and the second electrode thereof may be electrically connected to the first light-emitting electrode of the light-emitting element LEL. In a case that the fifth transistor ST5 and the sixth transistor ST6 both are turned on, the driving current Ids may be supplied to the light-emitting element LEL.

The first capacitor C1 may be formed between the second electrode of the driving transistor DT and the first supply voltage line VDDL. One electrode of the first capacitor C1 may be electrically connected to the second electrode of the driving transistor DT while the other electrode thereof may be electrically connected to the first supply voltage line VDDL.

Figure 15:
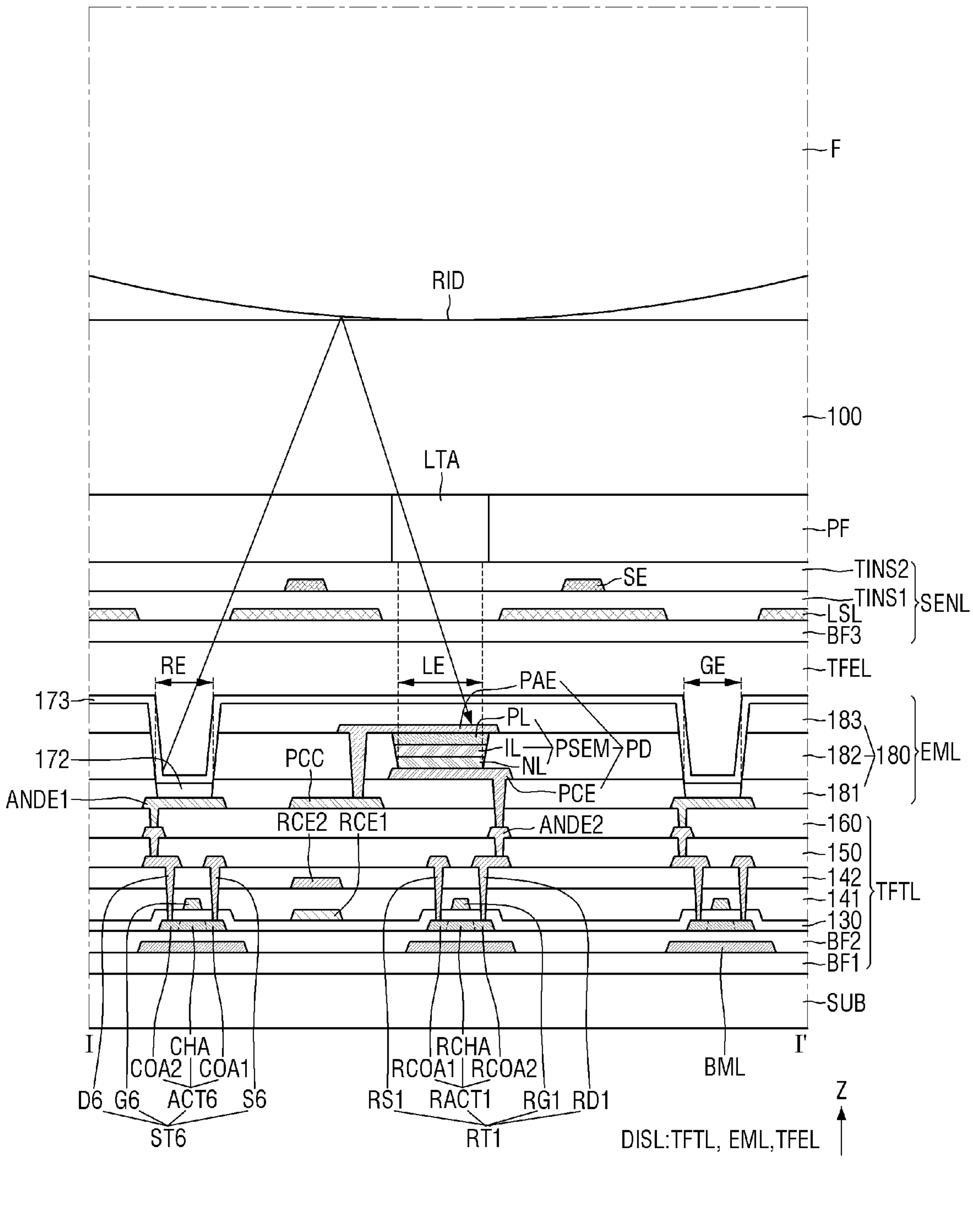
FIG. 15 is a schematic cross-sectional view showing an example of an emission area of a display pixel and a light-receiving area of a sensor pixel in the sensor area of FIG. 8.

Each of the first to sixth transistors ST1, ST2, ST3, ST4, ST5 and ST6, and the driving transistor DT may be formed as a thin-film transistor of the thin-film transistor layer TFTL (see FIG. 15). In a case that the first electrode of each of the first to sixth transistors ST1, ST2, ST3, ST4, ST5 and ST6 and the driving transistor DT may be a source electrode, the second electrode thereof may be a drain electrode. Alternatively, in a case that the first electrode of each of the first to sixth transistors ST1, ST2, ST3, ST4, ST5 and ST6 and the driving transistor DT may be a drain electrode, the second electrode thereof may be a source electrode.

The active layer of each of the first to sixth transistors ST1, ST2, ST3, ST4, ST5 and ST6 and the driving transistor DT may be made of one of poly silicon, amorphous silicon and oxide semiconductor. In a case that the active layer of each of the first to sixth transistors ST1 to ST6 and the driving transistor DT is made of poly silicon, a low-temperature poly silicon (LTPS) process may be employed.

Although the first to sixth transistors ST1, ST2, ST3, ST4, ST5 and ST6 and the driving transistor DT are of p-type metal oxide semiconductor field effect transistors (MOSFETs) in FIG. 13, this is merely illustrative. They may be of n-type MOSFETs.

The second display pixels DP2 including the second emission areas GE and the third display pixels DP3 including the third emission areas BE are substantially identical to the first display pixels DP1; and, therefore, the redundant description will be omitted.

Figure 14:
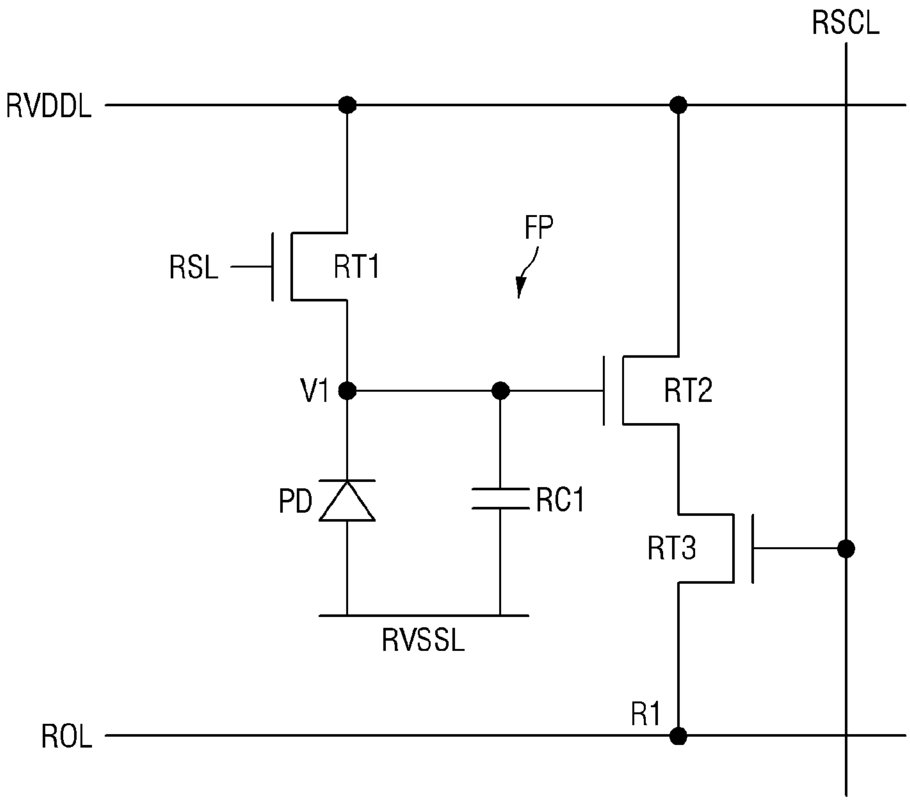
FIG. 14 is an equivalent circuit diagram showing an example of a sensor pixel in the sensor area of FIG. 8.

FIG. 14 is an equivalent circuit diagram showing an example of a sensor pixel in the sensor area of FIG. 8. Although the sensor pixel of the sensor area is a sensor pixel of an optical fingerprint sensor in the example shown in FIG. 14, the disclosure is not limited thereto.

Referring to FIG. 14, the sensor pixel FP including the light-receiving area LE may include a light-receiving element PD, first to third sensing transistors RT1, RT2 and RT3, and a sensing capacitor RC1.

The first sensing transistor RT1 may be a reset transistor that resets the voltage V1 at the first electrode of the sensing capacitor RC1 according to the reset signal of the reset signal line RSL. The gate electrode of the first sensing transistor RT1 may be electrically connected to the reset signal line RSL, the source electrode thereof may be electrically connected to the cathode electrode of the light-receiving element PD and the first electrode of the sensing capacitor RC1, and the drain electrode thereof may be electrically connected to the first sensing supply voltage line RVDDL from which the first sensing supply voltage is applied.

The second sensing transistor RT2 may be an amplifying transistor that converts the voltage V1 at the first electrode of the sensing capacitor RC1 into a current signal and amplifies the current signal. The gate electrode of the second sensing transistor RT2 may be electrically connected to the cathode electrode of the light-receiving element PD and the first electrode of the sensing capacitor RC1, the source electrode thereof may be electrically connected to the drain electrode of the third sensing transistor RT3, and the drain electrode thereof may be electrically connected to the first sensing supply voltage line RVDDL.

The third sensing transistor RT3 may be a select transistor that may be turned on in a case that the sensing scan signal may be applied to the sensing scan line RSCL so that the voltage V1 at the first electrode of the sensing capacitor RC1 amplified by the second sensing transistor RT2 may deliver to a readout line ROL. The gate electrode of the third sensing transistor RT3 may be electrically connected to the sensing scan line RSCL, the source electrode thereof may be electrically connected to the readout line ROL, and the drain electrode thereof may be electrically connected to the source electrode of the second sensing transistor RT2.

The light-receiving element PD may be, but is not limited to, a photodiode including a first light-receiving electrode corresponding to an anode electrode, a light-receiving semiconductor layer, and a second light-receiving electrode corresponding to a cathode electrode. The light-receiving element PD may be a photo transistor including a gate electrode, an active layer, a source electrode, and a drain electrode.

The second light-receiving electrode of the light-receiving element PD may be electrically connected to the first electrode of the sensing capacitor RC1, and the first light-receiving electrode may be electrically connected to the second sensing supply voltage line RVSSL from which a second sensing supply voltage lower than the first sensing supply voltage is applied. A p-i-n semiconductor layer of the light-receiving element PD may include a p-type semiconductor layer electrically connected to the anode electrode, an n-type semiconductor layer electrically connected to the cathode electrode, and an i-type semiconductor layer disposed between the p-type semiconductor layer and the n-type semiconductor layer.

Although the first to third sensing transistors RT1, RT2 and RT3 are n-type metal oxide semiconductor field effect transistors (MOSFETs) in the example shown in FIG. 14, this is merely illustrative. They may be p-type MOSFETs.

Hereinafter, the operation of the sensor pixel FP shown in FIG. 14 will be described in detail.

Firstly, in a case that the first sensing transistor RT1 is turned on by the reset signal of the reset signal line RSL, the voltage V1 at the first electrode of the sensing capacitor RC1 is reset to the first sensing supply voltage from the first sensing supply voltage line RVDDL.

Secondly, in a case that light reflected by the fingerprint of a person's finger is incident on the light-receiving element PD, a leakage current may flow through the light-receiving element PD. Charges may be charged in the sensing capacitor RC1 by the leakage current.

As the charges are charged in the sensing capacitor RC1, the voltage at the gate electrode of the second sensing transistor RT2 electrically connected to the first electrode of the sensing capacitor RC1 increases. In a case that the voltage at the gate electrode of the second sensing transistor RT2 becomes greater than the threshold voltage, the second sensing transistor RT2 may be turned on.

Thirdly, in a case that the sensing scan signal is applied to the sensing scan line RSCL, the third sensing transistor RT3 may be turned on. In a case that the third sensing transistor RT3 is turned on, a current signal flowing through the second sensing transistor RT2 may be delivered to the readout line ROL by the voltage V1 at the first electrode of the sensing capacitor RC1. As a result, the voltage R1 of the readout line ROL increases, so that the voltage R1 of the readout line ROL may be transmitted to the sensor driver 340. The sensor driver 340 may convert the voltage R1 of the readout line ROL into digital data through an analog-to-digital converter (ADC) and output the digital data.

The voltage R1 of the readout line ROL is proportional to the voltage V1 at the first electrode of the sensing capacitor RC1, i.e., the amount of charges charged in the sensing capacitor RC1, and the amount of charges stored in the sensing capacitor RC1 is proportional to the amount of light supplied to the light-receiving element PD. Therefore, it may be possible to determine the amount of light incident on the light-receiving element PD of the sensor pixel FP based on the voltage R1 of the readout line ROL. Since the sensor driver 340 can sense the amount of incident light for each sensor pixel FP, the sensor driver 340 can recognize a fingerprint pattern of a person's finger.

FIG. 15 is a schematic cross-sectional view showing an example of an emission area of a display pixel and a light-receiving area of a sensor pixel in the sensor area of FIG. 8.

Although the sensor pixel of the sensor area may be a sensor pixel of an optical fingerprint sensor in the example shown in FIG. 15, the disclosure is not limited thereto. FIG. 15 is a schematic cross-sectional view showing the first emission area RE, the light-receiving area LE, and the second emission area GE, taken along line I-I' of FIG. 8.

FIG. 15 shows the sixth transistor ST6 of each of the first display pixel DP1 and the second display pixel DP2, and the first sensing transistor RT1 and the sensing capacitor RC1 of the sensor pixel FP.

Referring to FIG. 15, a display layer DISL including a thin-film transistor layer TFTL, an emission material layer EML, and an encapsulation layer TFEL may be disposed on a substrate SUB, and a sensor electrode layer SENL including sensor electrodes SE may be disposed on the display layer DISL.

A first buffer layer BF1 may be disposed on one surface of the substrate SUB, and a second buffer layer BF2 may be disposed on the first buffer layer BF1. The first and second buffer layers BF1 and BF2 may be disposed on the or a surface of the substrate SUB in order to protect the thin-film transistors of the thin-film transistor layer TFTL and an emissive layer 172 of the emission material layer EML from moisture that may be likely to permeate through the substrate SUB. The buffer layers BF1 and BF2 may include multiple inorganic layers alternately stacked one on another. For example, each of the first and second buffer layers BF1 and BF2 may be made up of multiple layers in which one or more inorganic layers of a silicon nitride layer, a silicon oxynitride layer, a silicon oxide layer, a titanium oxide layer and an aluminum oxide layer may be alternately stacked one on another. The first buffer layer BF1 and/or the second buffer layer BF2 may be eliminated.

A first light-blocking layer BML may be disposed on the first buffer layer BF1. The first light-blocking layer BML may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. Alternatively, the first light-blocking layer BML may be an organic layer including a black pigment.

An active layer ACT6 of the sixth transistor ST6 of each of the first display pixel DP1 and the second display pixel DP2 may be disposed on the second buffer layer BF2. An active layer RACT1 of the first sensing transistor RT1 of the sensor pixel FP may be disposed on the second buffer layer BF2. The active layers of the driving transistor DT and the first to fifth transistors ST1 to ST5 of each of the first display pixel DP1 and the second display pixel DP2 as well as the active layers of the second and third sensing transistors RT2 and RT3 of the sensor pixel FP may be disposed on the second buffer layer BF2. The active layers ACT6 and RACT1 may include a material such as polycrystalline silicon, single crystal silicon, low-temperature polycrystalline silicon, amorphous silicon and an oxide semiconductor. In a case that the active layers ACT6 and RACT1 include a material such as polycrystalline silicon and an oxide semiconductor, the ion-doped regions in the active layers ACT6 and RACT1 may be conductive regions having conductivity.

Each of the active layers ACT6 and RACT1 may overlap the first light-blocking layer BML in the third direction (z-axis direction). Since light incident through the substrate SUB may be blocked by the first light-blocking layer BML, it may be possible to prevent leakage current from flowing into each of the active layers ACT6 and RACT1 by the light incident through the substrate SUB.

A gate insulating layer 130 may be formed or disposed on the active layer ACT6 of the sixth transistor ST6 of each of the first display pixel DP1 and the second display pixel DP2 and the active layer RACT1 of the first sensing transistor RT1 of the sensor pixel FP. The gate insulating layer 130 may be formed of an inorganic layer, for example, a silicon nitride layer, a silicon oxynitride layer, a silicon oxide layer, a titanium oxide layer, or an aluminum oxide layer.

A gate electrode G6 of the sixth transistor ST6 of each of the first display pixel DP1 and the second display pixel DP2 may be disposed on the gate insulating layer 130. The gate electrode G6 of the sixth transistor ST6 of each of the first display pixel DP1 and the second display pixel DP2 may overlap the active layer ACT6 in the third direction (z-axis direction). A part of the active layer ACT6 overlapping the gate electrode G6 in the third direction (z-axis direction) may be a channel region CHA. A gate electrode RG1 of the first sensing transistor RT1 and a first electrode RCE1 of the sensing capacitor RC1 may be disposed on the gate insulating layer 130. The gate electrode RG1 of the first sensing transistor RT1 may overlap the active layer RACT1 in the third direction (z-axis direction). A part of the active layer RACT1 overlapping the gate electrode RG1 in the third direction (z-axis direction) may be a channel region RCHA. In addition to the gate electrodes of the driving transistor DT and the first to fifth transistors ST1 to ST5 and the first electrode of the first capacitor C1 of each of the first display pixel DP1 and the second display pixel DP2, the gate electrodes of the second and third sensing transistors RT2 and RT3 of the sensor pixel FP may be disposed on the gate insulating layer 130. The gate electrodes G6 and RG1 and the first electrode RCE1 of the sensing capacitor RC1 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

A first interlayer dielectric layer 141 may be disposed on the gate electrodes G6 and RG1 and the first electrode RCE1 of the sensing capacitor RC1. The first interlayer dielectric layer 141 may be formed of an inorganic layer, for example, a silicon nitride layer, a silicon oxynitride layer, a silicon oxide layer, a titanium oxide layer, or an aluminum oxide layer. The first interlayer dielectric layer 141 may include a or any number of inorganic layers.

A second electrode RCE2 of the sensing capacitor RC1 may be disposed on the first interlayer dielectric layer 141. The second electrode RCE2 of the sensing capacitor RC1 may overlap the first electrode RCE1 of the sensing capacitor RC1 in the third direction (z-axis direction). A second electrode of the first capacitor C1 may be disposed on the first interlayer dielectric layer 141. The second electrode RCE2 of the sensing capacitor RC1 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

A second interlayer dielectric layer 142 may be disposed on the first interlayer dielectric layer 141. The second interlayer dielectric layer 142 may be formed of an inorganic layer, for example, a silicon nitride layer, a silicon oxynitride layer, a silicon oxide layer, a titanium oxide layer, or an aluminum oxide layer. The second interlayer dielectric layer 142 may include any number of inorganic layers. The first interlayer dielectric layer 141 and the second interlayer dielectric layer 142 may be collectively referred to as an interlayer dielectric layer 141 and 142.

A first electrode S6 and a second electrode D6 of the sixth transistor ST6 of each of the first display pixel DP1 and the second display pixel DP2 may be disposed on the second interlayer dielectric layer 142. A first electrode RS1 and a second electrode RD1 of the first sensing transistor RT1 of the sensor pixel FP may be disposed on the second interlayer dielectric layer 142. The first electrodes and the second electrodes of the driving transistor DT and the first to fifth transistors ST1 to ST5 of each of the first display pixel DP1 and the second display pixel DP2 as well as the first electrodes and the second electrodes of the second and third sensing transistors RT2 and RT3 the sensor pixel FP may be disposed on the second interlayer dielectric layer 142. The first electrodes S6 and RS1 and the second electrodes D6 and RD1 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The first electrode S6 of the sixth transistor ST6 may be electrically connected to a first conductive region COA1 disposed on a side of the channel region CHA of the active layer ACT6 through a contact hole penetrating through the gate insulating layer 130, the first interlayer dielectric layer 141 and the second interlayer dielectric layer 142. The second electrode D6 of the sixth transistor ST6 may be electrically connected to a second conductive region COA2 disposed on the other side of the channel region CHA of the active layer ACT6 through a contact hole penetrating through the gate insulating layer 130, the first interlayer dielectric layer 141 and the second interlayer dielectric layer 142. The first electrode RS1 of the first sensing transistor RT1 may be electrically connected to a first conductive region RCOA1 disposed on a side of the channel region CHA of the active layer RACT1 through a contact hole penetrating through the gate insulating layer 130, the first interlayer dielectric layer 141 and the second interlayer dielectric layer 142. The second electrode RD1 of the first sensing transistor RT1 may be electrically connected to a second conductive region RCOA2 disposed on the other side of the channel region CHA of the active layer RACT1 through a contact hole penetrating through the gate insulating layer 130, the first interlayer dielectric layer 141 and the second interlayer dielectric layer 142.

A first organic layer 150 may be disposed on the first electrodes S6 and RS1 and the second electrodes D6 and RD1 to provide a flat surface over the thin-film transistors. The first organic layer 150 may be formed as an organic layer such as an acryl resin layer, an epoxy resin layer, a phenolic resin layer, a polyamide resin layer and a polyimide resin layer.

A first connection electrode ANDE1 and a second connection electrode ANDE2 may be disposed on the first organic layer 150. The first connection electrode ANDE1 may be electrically connected to the second electrode D6 of the sixth transistor ST6 through a contact hole penetrating through the first organic layer 150. The second connection electrode ANDE2 may be electrically connected to the second electrode RD1 of the first sensing transistor RT1 through a contact hole penetrating through the first organic layer 150. Each of the first connection electrode ANDE1 and the second connection electrode ANDE2 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

A second organic layer 160 may be disposed on the first connection electrode ANDE1 and the second connection electrode ANDE2. The second organic layer 160 may be formed as an organic layer such as an acryl resin layer, an epoxy resin layer, a phenolic resin layer, a polyamide resin layer and a polyimide resin layer.

Although the sixth transistor ST6 of each of the first display pixel DP1 and the second display pixel DP2 and the first sensing transistor RT1 of the sensor pixel FP may be implemented as top-gate transistors in which the gate electrodes G6 and RG1 may be located or disposed above the active layers ACT6 and RACT1 in the example shown in FIG. 15, the disclosure is not limited thereto. For example, the sixth transistor ST6 of each of the first display pixel DP1 and the second display pixel DP2 and the first sensing transistor RT1 of the sensor pixel FP may be implemented as either bottom-gate transistors in which the gate electrodes G6 and RG1 may be located or disposed below the active layers ACT6 and RACT1, or as double-gate transistors in which the gate electrodes G6 and RG1 may be located or disposed above and below the active layers ACT6 and RACT1.

The emission material layer EML may be disposed on the thin-film transistor layer TFTL. The emission material layer EML may include light-emitting elements LEL, light-receiving elements PD, and banks 180.

Each of the light-emitting elements LEL may include a first light-emitting electrode 171, an emissive layer 172, and a second light-emitting electrode 173. Each of the light-receiving elements PD may include a first light-receiving electrode PCE, a light-receiving semiconductor layer PSEM, and a second light-receiving electrode PAE. The bank 180 may include a first bank 181, a second bank 182, and a third bank 183.

In each of the emission areas RE, GE and BE, the first light-emitting electrode 171, the emissive layer 172 and the second light-emitting electrode 173 may be sequentially stacked one on another, so that holes from the first light-emitting electrode 171 and electrons from the second light-emitting electrode 173 may be combined with each other in the emissive layer 172 to emit light. In such case, the first light-emitting electrode 171 may be an anode electrode, and the second light-emitting electrode 173 may be a cathode electrode.

In each of the light-receiving areas LE, a photodiode may be formed, in which the first light-receiving electrode PCE, the light-receiving semiconductor layer PSEM, and the second light-receiving electrode PAE may be sequentially stacked one on another. In such case, the first light-receiving electrode PCE may be an anode electrode, and the second light-receiving electrode PAE may be a cathode electrode.

The first light-emitting electrode 171 may be formed or disposed on the second organic layer 160. The first light-emitting electrode 171 may be electrically connected to the first connection electrode ANDE1 through a contact hole penetrating through the second organic layer 160.

In the top-emission structure where light exits from the emissive layer 172 toward the second light-emitting electrode 173, the first light-emitting electrode 171 may be made up of a single layer of molybdenum (Mo), titanium (Ti), copper (Cu) or aluminum (Al), or may be made up of a stack structure of aluminum and titanium (Ti/Al/Ti), a stack structure of aluminum and ITO (ITO/Al/ITO), an APC alloy and a stack structure of APC alloy and ITO (ITO/APC/ITO) in order to increase the reflectivity. The APC alloy is an alloy of silver (Ag), palladium (Pd) and copper (Cu).

The first bank 181 may serve to define each of the emission areas RE, GE and BE of the display pixels. To this end, the first bank 181 may be formed to expose a part of the first light-emitting electrode 171 on the second organic layer 160. The first bank 181 may cover or overlap an edge of the first light-emitting electrode 171. The first bank 181 may be disposed on the second organic layer 160. As a result, the contact hole penetrating through the second organic layer 160 may not be filled with the first bank 181. The first bank 181 may be formed as an organic layer such as an acryl resin layer, an epoxy resin layer, a phenolic resin layer, a polyamide resin layer and a polyimide resin layer.

The emissive layer 172 may be formed or disposed on the first light-emitting electrode 171. The emissive layer 172 may include an organic material and emit light of a certain color. For example, the emissive layer 172 may include a hole transporting layer, an organic material layer, and an electron transporting layer. The organic material layer may include a host and a dopant. The organic material layer may include a material that emits a predetermined light, and may be formed using a phosphor or a fluorescent material.

For example, the organic material layer of the emissive layer 172 in the first emission area RE that emits light of the first color may include a phosphor that may include a host material including 4,4'-bis(N-carbazolyl)biphenyl (CBP) or mCP (1,3-bis (carbazol-9-yl)benzene, and a dopant including at least one selected from the group consisting of: PIQIr(acac) (bis(1-phenylisoquinoline)acetylacetonate iridium), PQIr(acac)(bis(1-phenylquinoline)acetylacetonate iridium), PQIr(tris(1-phenylquinoline)iridium) and PtOEP (octaethylporphyrin platinum). Alternatively, the organic material layer of the emissive layer 172 of the first emission area RE may be, but is not limited to, a fluorescent material including PBD: $Eu(DBM)_3(Phen)$ or perylene.

The organic material layer of the emissive layer 172 of the second emission area GE, which emits light of the second color, may include a phosphor that may include a host material including CBP or mCP, and a dopant material including $Ir(ppy)_3$ (fac tris(2-phenylpyridine)iridium). Alternatively, the organic material layer of the emissive layer 172 of the second emission area GE emitting light of the second color may be, but is not limited to, a fluorescent material including $Alq_3$ (tris(8-hydroxyquinolino) aluminum).

The organic material layer of the emissive layer 172 of the third emission area BE, which emits light of the third color, may include, but is not limited to, a phosphor that includes a host material including CBP or mCP, and a dopant material including $(4,6\text{-}F_2ppy)_2Irpic$.

The second light-emitting electrode 173 may be formed or disposed on the emissive layer 172. The second light-emitting electrode 173 may be formed to cover or overlap the emissive layer 172. The second light-emitting electrode 173 may be a common layer formed or disposed across the display pixels. A capping layer may be formed or disposed on the second light-emitting electrode 173.

In the top-emission structure, the second light-emitting electrode 173 may be formed of a transparent conductive material (TCP) such as ITO and IZO that may transmit light, or a semi-transmissive conductive material such as magnesium (Mg), silver (Ag) and an alloy of magnesium (Mg) and silver (Ag). In a case that the second light-emitting electrode 173 is formed of a semi-transmissive conductive material, the light extraction efficiency may be increased by using microcavities.

The first light-receiving electrode PCE may be disposed on the first bank 181. The first light-receiving electrode PCE may be electrically connected to the second connection electrode ANDE2 through a contact hole penetrating through the second organic layer 160 and the first bank 181. The first light-receiving electrode PCE may be made up of a single layer of molybdenum (Mo), titanium (Ti), copper (Cu) or aluminum (Al), or may be made up of a stack structure of aluminum and titanium (Ti/Al/Ti), a stack structure of aluminum and ITO (ITO/Al/ITO), an APC alloy and a stack structure of an APC alloy and ITO (ITO/APC/ITO).

The second bank 182 may serve to define the light-receiving areas LE of the sensor pixels FP. To this end, the second bank 182 may be formed to expose a part of the first light-receiving electrode PCE on the first bank 181. The second bank 182 may cover or overlap an edge of the first light-receiving electrode PCE. The emissive layer 172 may be disposed in the contact hole penetrating through the first bank 181. As a result, the contact hole penetrating through the first bank 181 may be filled with the emissive layer 172. In an exemplary embodiment, the emission layer 172 may be further disposed in the contact hole penetrating the second bank 182. As a result, at least a portion of the contact hole penetrating the second bank 182 may be filled with the emission layer 172. The upper surface of the light-receiving semiconductor layer PSEM and the upper surface of the second bank 182 may be smoothly or seamlessly connected to each other. The second bank 182 may be formed as an organic layer such as an acryl resin layer, an epoxy resin layer, a phenolic resin layer, a polyamide resin layer and a polyimide resin layer.

The light-receiving semiconductor layer PSEM may be disposed on the first light-receiving electrode PCE. The light-receiving semiconductor layer PSEM may have a PIN structure in which a p-type semiconductor layer PL, an i-type semiconductor layer IL, and an n-type semiconductor layer NL may be sequentially stacked one on another. In a case that the light-receiving semiconductor layer PSEM has the PIN structure, the i-type semiconductor layer IL may be depleted by the p-type semiconductor layer PL and the n-type semiconductor layer NL so that an electric field may be generated therein. The holes and electrons, which may be generated by energy of natural light or sunlight, may be drifted by the electric field. Thus, the holes may be collected to the second light-receiving electrode PAE through the p-type semiconductor layer PL, while the electrons may be collected to the first light-receiving electrode PCE through the n-type semiconductor layer NL.

The p-type semiconductor layer PL may be disposed close to the surface on which the external light is incident, and the n-type semiconductor layer NL may be disposed distant from the surface on which the external light may be incident. Since the drift mobility of the holes may be lower than the drift mobility of the electrons, it may be preferable to form the p-type semiconductor layer PL closer to the surface on which the external light may be incident in order to increase the collection efficiency by the incident light.

Figure 16:
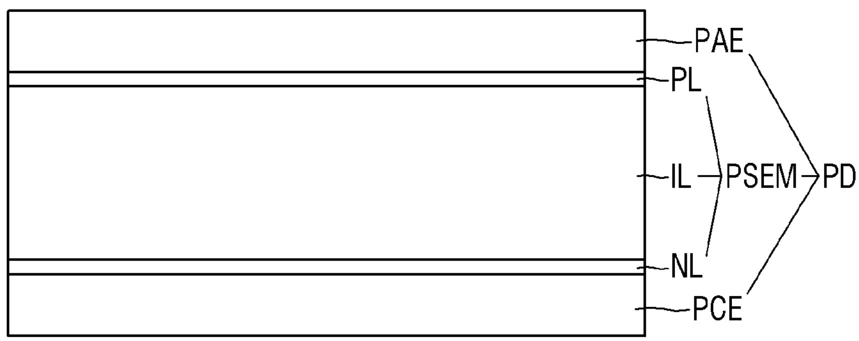
FIG. 16 is a schematic cross-sectional view showing an example of the light-receiving element of FIG. 15.

As shown in FIGS. 15 and 16, the n-type semiconductor layer NL may be disposed on the first light-receiving electrode PCE, the i-type semiconductor layer IL may be disposed on the n-type semiconductor layer NL, and the p-type semiconductor layer PL may be disposed on the i-type semiconductor layer IL. In such case, the p-type semiconductor layer PL may be formed by doping amorphous silicon (a-Si: H) with a p-type dopant. The i-type semiconductor layer IL may be made of amorphous silicon germanium (a-SiGe: H) or amorphous silicon carbide (a-SiC: H). The n-type semiconductor layer NL may be formed by doping amorphous silicon germanium (a-SiGe: H) or amorphous silicon carbide (a-SiC: H) with an n-type dopant. The p-type semiconductor layer PL and the n-type semiconductor layer NL may be formed to have a thickness of approximately 500 Å, and the i-type semiconductor layer IL may be formed to have a thickness in a range of about 5,000 to about 10,000 Å.

Figure 17:
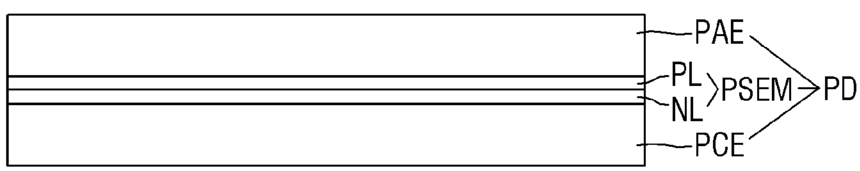
FIG. 17 is a schematic cross-sectional view showing another example of the light-receiving element of FIG. 14.

Alternatively, as shown in FIG. 17, the n-type semiconductor layer NL may be disposed on the first light-receiving electrode PCE, the i-type semiconductor layer IL may be eliminated, and the p-type semiconductor layer PL may be disposed on the n-type semiconductor layer NL. In such case, the p-type semiconductor layer PL may be formed by doping amorphous silicon (a-Si: H) with a p-type dopant. The n-type semiconductor layer NL may be formed by doping amorphous silicon germanium (a-SiGe: H) or amorphous silicon carbide (a-SiC: H) with an n-type dopant. The p-type semiconductor layer PL and the n-type semiconductor layer NL may be formed to having the thickness of about 500 Å.

Figure 18:
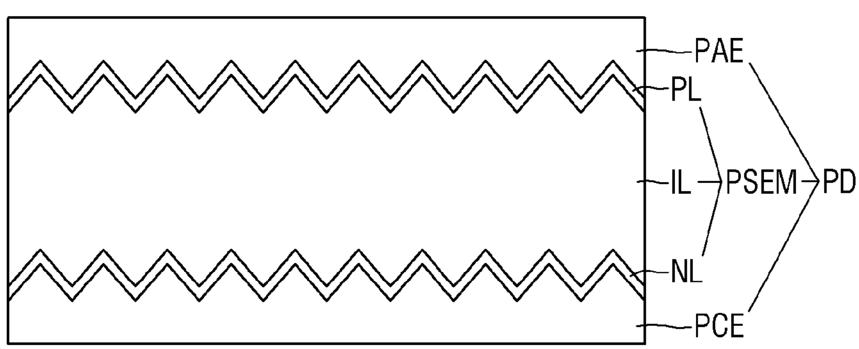
FIG. 18 is a schematic cross-sectional view showing another example of the light-receiving element of FIG. 14.

As shown in FIG. 18, the upper and lower surfaces of each of the first light-receiving electrode PCE, the p-type semiconductor layer PL, the i-type semiconductor layer IL, the n-type semiconductor layer NL and the second light-receiving electrode PAE may be subjected to a texturing process to have uneven surfaces in order to increase the efficiency of absorbing external light. The texturing process is to form a surface of a material uneven. At least one of the upper and lower surfaces of each of the first light-receiving electrode PCE, the p-type semiconductor layer PL, the i-type semiconductor layer IL, the n-type semiconductor layer NL and the second light-receiving electrode PAE may be subjected to the texturing process to have a shape like a surface of a fabric. The texturing process may be carried out via an etching process using photolithography, an anisotropic etching using chemical solution, or a groove forming process using mechanical scribing. In FIG. 18, the upper and lower surfaces of each of the p-type semiconductor layer PL, the i-type semiconductor layer IL, and the n-type semiconductor layer NL are formed to have unevenness, but the disclosure is not limited thereto. For example, one of the upper and lower surfaces of at least one of the p-type semiconductor layer PL, the i-type semiconductor layer IL and the n-type semiconductor layer NL may be formed to have unevenness.

The second light-receiving electrode PAE may be disposed on the p-type semiconductor layer PL and the second bank 182. The second light-receiving electrode PAE may be electrically connected to a third connection electrode (or referred to as a light-receiving connection electrode) PCC through a contact hole penetrating through the first bank 181 and the second bank 182. The second light-receiving electrode PAE may be made of a transparent conductive material (TCO) that can transmit light, such as ITO and IZO.

The third connection electrode PCC may be disposed on the second organic layer 160. The third connection electrode PCC may be disposed on the same layer and made of the same or similar material as the first light-emitting electrode 171. The third connection electrode PCC may be made up of a single layer of molybdenum (Mo), titanium (Ti), copper (Cu) or aluminum (Al), or may be made up of a stack structure of aluminum and titanium (Ti/Al/Ti), a stack structure of aluminum and ITO (ITO/Al/ITO), an APC alloy and a stack structure of an APC alloy and ITO (ITO/APC/ITO) in order to increase the reflectivity.

The third bank 183 may be disposed on the second light-receiving electrode PAE and the second bank 182. The third bank 183 may be formed as an organic layer such as an acryl resin layer, an epoxy resin layer, a phenolic resin layer, a polyamide resin layer and a polyimide resin layer.

The emissive layer 172 may be disposed on the upper surface of the first light-emitting electrode 171 and the inclined surfaces of the first bank 181. The emissive layer 172 may be disposed on the inclined surfaces of the second bank 182. The second light-emitting electrode 173 may be disposed on the upper surface of the emissive layer 172, the inclined surfaces of the second bank 182, and the upper and inclined surfaces of the third bank 183. The second light-emitting electrode 173 may overlap the first light-receiving electrode PCE, the light-receiving semiconductor layer PSEM, and the second light-receiving electrode PAE in the third direction (z-axis direction).

The encapsulation layer TFEL may be formed on the emission material layer EML. The encapsulation layer TFEL may include at least one inorganic layer to prevent permeation of oxygen or moisture into the emission material layer EML. The encapsulation layer TFEL may include at least one organic layer to protect the emission material layer EML from foreign substances such as dust.

Alternatively, a substrate may be disposed on the emission material layer EML instead of the encapsulation layer TFEL, so that the space between the emission material layer EML and the substrate may be empty, i.e., vacuous or may be filled with a filler film. The filler film may be an epoxy filler film or a silicon filler film.

The sensor electrode layer SENL is disposed on the encapsulation layer TFEL. The sensor electrode layer SENL may include a first reflective layer LSL and sensor electrodes SE.

The third buffer layer BF3 may be disposed on the encapsulation layer TFEL. The third buffer layer BF3 may include at least one inorganic layer. For example, the third buffer layer BF3 may be made up of multiple layers in which one or more inorganic layers of a silicon nitride layer, a silicon oxynitride layer, a silicon oxide layer, a titanium oxide layer and an aluminum oxide layer are alternately stacked one on another. The third buffer layer BF3 may be eliminated.

A first reflective layer LSL may be disposed on the third buffer layer BF3. The first reflective layer LSL is not disposed in the emission areas RE, GE and BE and the light-receiving areas LE. The first reflective layer LSL may be made up of a single layer of molybdenum (Mo), titanium (Ti), copper (Cu) or aluminum (Al), or may be made up of a stack structure of aluminum and titanium (Ti/Al/Ti), a stack structure of aluminum and ITO (ITO/Al/ITO), an APC alloy and a stack structure of an APC alloy and ITO (ITO/APC/ITO).

A first sensor insulating layer TINS1 may be disposed on the first reflective layer LSL. The first sensor insulating layer TINS1 may be formed of an inorganic layer, for example, a silicon nitride layer, a silicon oxynitride layer, a silicon oxide layer, a titanium oxide layer, or an aluminum oxide layer.

The sensor electrodes SE may be disposed on the first sensor insulating layer TINS1. The sensor electrodes SE are not disposed in the emission areas RE, GE and BE and the light-receiving areas LE. The sensor electrode SE may overlap the first reflective layer LSL in the third direction (z-axis direction). The width of the sensor electrode SE in a direction may be smaller than the width of the first reflective layer LSL in the direction. The sensor electrodes SE may be made up of a single layer of molybdenum (Mo), titanium (Ti), copper (Cu) or aluminum (Al), or may be made up of a stack structure of aluminum and titanium (Ti/Al/Ti), a stack structure of aluminum and ITO (ITO/Al/ITO), an APC alloy and a stack structure of an APC alloy and ITO (ITO/APC/ITO).

A second sensor insulating layer TINS2 may be disposed on the sensor electrodes SE. The second sensor insulating layer TINS2 may include at least one of an inorganic layer and an organic layer. The inorganic layer may be a silicon nitride layer, a silicon oxynitride layer, a silicon oxide layer, a titanium oxide layer, or an aluminum oxide layer. The organic layer may be an acryl resin layer, an epoxy resin layer, a phenolic resin layer, a polyamide resin layer and a polyimide resin layer.

The polarizing film PF may be disposed on the second sensor insulating layer TINS2. The polarizing film PF may include a linear polarizer and a retardation film such as a λ/4 (quarter-wave) plate. In a case that the polarizing film PF is disposed in the light-receiving area LE, the amount of light incident on the light-receiving area LE may be reduced. Therefore, the polarizing film PF may include a light-transmitting area LTA that overlaps the light-receiving area LE in the third direction (z-axis direction) and transmit light as it is. The area of the light-transmitting area LTA may be larger than the area of the light-receiving area LE. Therefore, the light-receiving area LE may completely overlap the light-transmitting area LTA in the third direction (z-axis direction). The cover window 100 may be disposed on the polarizing film PF.

As shown in FIG. 15, in a case that a person's finger F is placed on the cover window 100, light emitted from the emission areas RE, GE and BE may be reflected at valleys and ridges RID of the fingerprint of the finger F. The amount of light reflected from the ridge of the fingerprint of the finger F may be different from the amount of light reflected from the valley of the fingerprint of the finger F. Light reflected at the valleys and ridges of the fingerprint may be incident on the light-receiving element PD of each of the light-receiving areas LE. Therefore, the fingerprint of the person's finger F may be recognized through the sensor pixels FP including the light-receiving elements PD built in the display panel 300.

As shown in FIG. 15, the light reflected at the valleys of the fingerprint may be incident on the light-receiving element PD of each of the light-receiving areas LE through the light-transmitting area LTA of the polarizing film PF overlapping with the light-receiving area LE in the third direction (z-axis direction). Accordingly, it may be possible to avoid the amount of the light incident on the light-receiving areas LE from being reduced due to the polarizing film PF.

Figure 19:
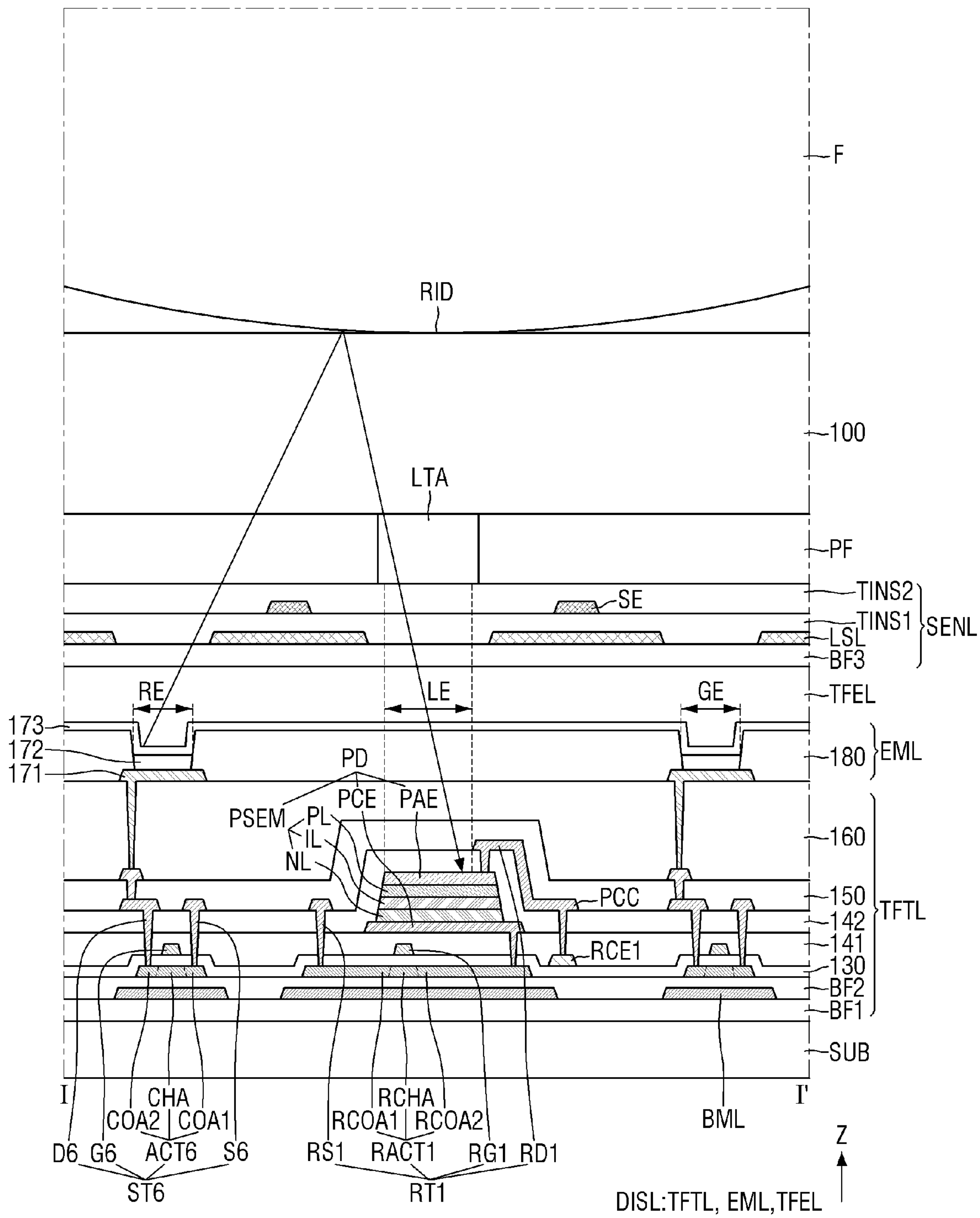
FIG. 19 is a schematic cross-sectional view showing an example of a display pixel and a sensor pixel in the sensor area of FIG. 8.

FIG. 19 is a schematic cross-sectional view showing an example of a display pixel and a sensor pixel in the sensor area of FIG. 8.

An embodiment of FIG. 19 may be different from an embodiment of FIG. 15 in that the light-receiving elements PD may be included in the thin-film transistor layer TFTL instead of the emission material layer EML, and that the bank 180 may be made up of a single layer.

Referring to FIG. 19, the first light-receiving electrode PCE may be disposed on the first interlayer dielectric layer 141. The first light-receiving electrode PCE may be electrically connected to the second conductive region RCOA2 disposed on the other side of the channel region RCHA of the active layer RACT1 through a contact hole penetrating through the gate insulating layer 130 and the first interlayer dielectric layer 141. The first light-receiving electrode PCE may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The light-receiving semiconductor layer PSEM may be disposed on the first light-receiving electrode PCE. The light-receiving semiconductor layer PSEM may have a PIN structure in which a p-type semiconductor layer PL, an i-type semiconductor layer IL, and an p-type semiconductor layer NL may be sequentially stacked one on another. In a case that the light-receiving semiconductor layer PSEM has the PIN structure, the i-type semiconductor layer IL may be depleted by the p-type semiconductor layer PL and the n-type semiconductor layer NL so that an electric field may be generated therein. The holes and electrons may be drifted by the electric field. Thus, the holes may be collected to the second light-receiving electrode PAE through the p-type semiconductor layer PL, while the electrons may be collected to the first light-receiving electrode PCE through the n-type semiconductor layer NL.

The p-type semiconductor layer PL may be disposed close to the surface on which the external light may be incident, and the n-type semiconductor layer NL may be disposed far away from the surface on which the external light may be incident. Since the drift mobility of the holes may be lower than the drift mobility of the electrons, it may be preferable to form the p-type semiconductor layer PL closer to the surface on which the external light may be incident in order to increase the collection efficiency by the incident light.

The second light-receiving electrode PAE may be disposed on the p-type semiconductor layer PL of the light-receiving semiconductor layer PSEM. The second light-receiving electrode PAE may be electrically connected to the third connection electrode PCC through a contact hole penetrating through the second interlayer dielectric layer 142. The second light-receiving electrode PAE may be made of a transparent conductive material (TCO) that may transmit light, such as ITO and IZO.

The third connection electrode PCC may be disposed on the second interlayer dielectric layer 142. The third connection electrode PCC may be electrically connected to the second light-receiving electrode PAE through a contact hole penetrating through the second interlayer dielectric layer 142. The third connection electrode PCC may be electrically connected to the first electrode RCE1 of the sensing capacitor RC1 disposed on the gate insulating layer 130 through a contact hole penetrating through the first interlayer dielectric layer 141 and the second interlayer dielectric layer 142. In such case, the second electrode RCE2 of the sensing capacitor RC1 disposed on the first interlayer dielectric layer 141 may be electrically connected to the second sensing supply voltage line RVSSL from which the second sensing supply voltage is applied.

Alternatively, in a case that the first electrode RCE1 of the sensing capacitor RC1 is disposed on the first interlayer dielectric layer 141, the third connection electrode PCC may be electrically connected to the first electrode RCE1 of the sensing capacitor RC1 through a contact hole penetrating through the second interlayer dielectric layer 142. In such case, the second electrode RCE2 of the sensing capacitor RC1 disposed on the gate insulating layer 130 may be electrically connected to the second sensing supply voltage line RVSSL from which the second sensing supply voltage is applied.

The third connection electrode PCC may be disposed on the same layer and may be made of the same or similar material as the first electrode S6 and the second electrode D6 of the sixth transistor ST6 of each of the first display pixel DP1 and the second display pixel DP2 and as the first electrode RS1 and the second electrode RD1 of the first sensing transistor RT1 of the sensor pixel FP. The third connection electrode PCC may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

As shown in FIG. 19, in a case that a person's finger F is placed on the cover window 100, light emitted from the emission areas RE, GE and BE may be reflected at valleys and absorbed at ridges RID of the fingerprint of the finger F.

Light reflected at the valleys of the fingerprint may be incident on the light-receiving element PD of each of the light-receiving areas LE. Therefore, the fingerprint of the person's finger F may be recognized through the sensor pixels FP including the light receiving elements PD built in the display panel 300.

Figure 20:
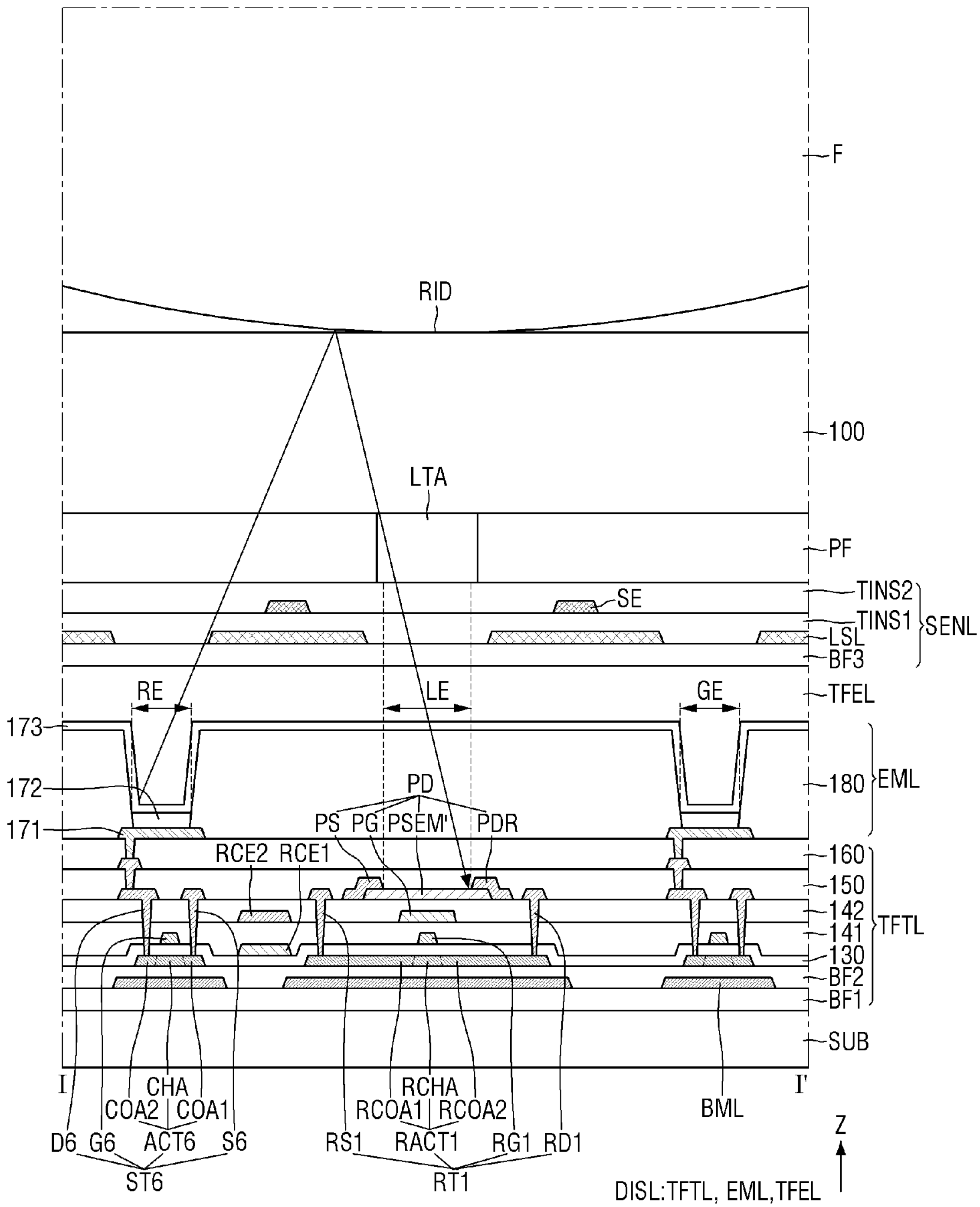
FIG. 20 is a schematic cross-sectional view showing an example of a display pixel and a sensor pixel in the sensor area of FIG. 8.

FIG. 20 is a schematic cross-sectional view showing an example of a display pixel and a sensor pixel in the sensor area of FIG. 8.

An embodiment of FIG. 20 may be different from an embodiment of FIG. 15 in that the light-receiving elements PD may be included in the thin-film transistor layer TFTL instead of the emission material layer EML, and that the bank 180 may be made up of a single layer.

Referring to FIG. 20, each of the light-receiving elements PD may include a light-receiving gate electrode PG, a light-receiving semiconductor layer PSEM', a light-receiving source electrode PS, and a light-receiving drain electrode PDR.

The light-receiving gate electrode PG may be disposed on the first interlayer dielectric layer 141. The light-receiving gate electrode PG may overlap the gate electrode RG1 and the active layer RACT1 of the first sensing transistor RT1 of the sensor pixel FP in the third direction (z-axis direction), but the disclosure is not limited thereto. The light-receiving gate electrode PG may overlap the gate electrode and the active layer of one of the second sensing transistor RT2 and the third sensing transistor RT3 of the sensor pixel FP in the third direction (z-axis direction), rather than the first sensing transistor RT1. The width of the light-receiving gate electrode PG in a direction may be greater than the width of the gate electrode RG1 of the first sensing transistor RT1 of the sensor pixel FP in the direction. The light-receiving gate electrode PG may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The second interlayer dielectric layer 142 may be disposed on the light-receiving gate electrode PG. The light-receiving semiconductor layer PSEM' may be disposed on the second interlayer dielectric layer 142. The light-receiving semiconductor layer PSEM' may overlap the light-receiving gate electrode PG in the third direction (z-axis direction).

The light-receiving semiconductor layer PSEM' may include an oxide semiconductor material. For example, the light-receiving semiconductor layer PSEM' may be made of an oxide semiconductor including indium (In), gallium (Ga) and oxygen (O). For example, the light-receiving semiconductor layer PSEM' may be made of IGZO (indium (In), gallium (Ga), zinc (Zn) and oxygen (O)), IGZTO (indium (In), gallium (Ga), zinc (Zn), tin (Sn) and oxygen (O)) or IGTO (indium (In), gallium (Ga), tin (Sn) and oxygen (O)).

Each of the light-receiving source electrode PS and the light-receiving drain electrode PDR may be disposed on the light-receiving semiconductor layer PSEM'. The light-receiving source electrode PS and the light-receiving drain electrode PDR may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

As shown in FIG. 20, in a case that a person's finger F is placed on the cover window 100, light emitted from the emission areas RE, GE and BE may be reflected at valleys and absorbed at ridges RID of the fingerprint of the finger F. Light reflected at the valleys of the fingerprint may be incident on the light-receiving element PD of each of the light-receiving areas LE. Therefore, the fingerprint of the person's finger F may be recognized through the sensor pixels FP including the light receiving elements PD built in the display panel 300.

As shown in FIG. 20, the light-receiving gate electrode PG and the light-receiving semiconductor layer PSEM' may overlap the gate electrode and the active layer of one of the first sensing transistor RT1 to the third sensing transistor RT3 of the sensor pixel FP in the third direction (z-axis direction). Thus, no additional space for the light-receiving elements PD is required, separately from the space for the thin-film transistors, and accordingly it may be possible to prevent the space where the thin-film transistors are disposed from being narrowed due to the light-receiving elements PD.

Figure 21:
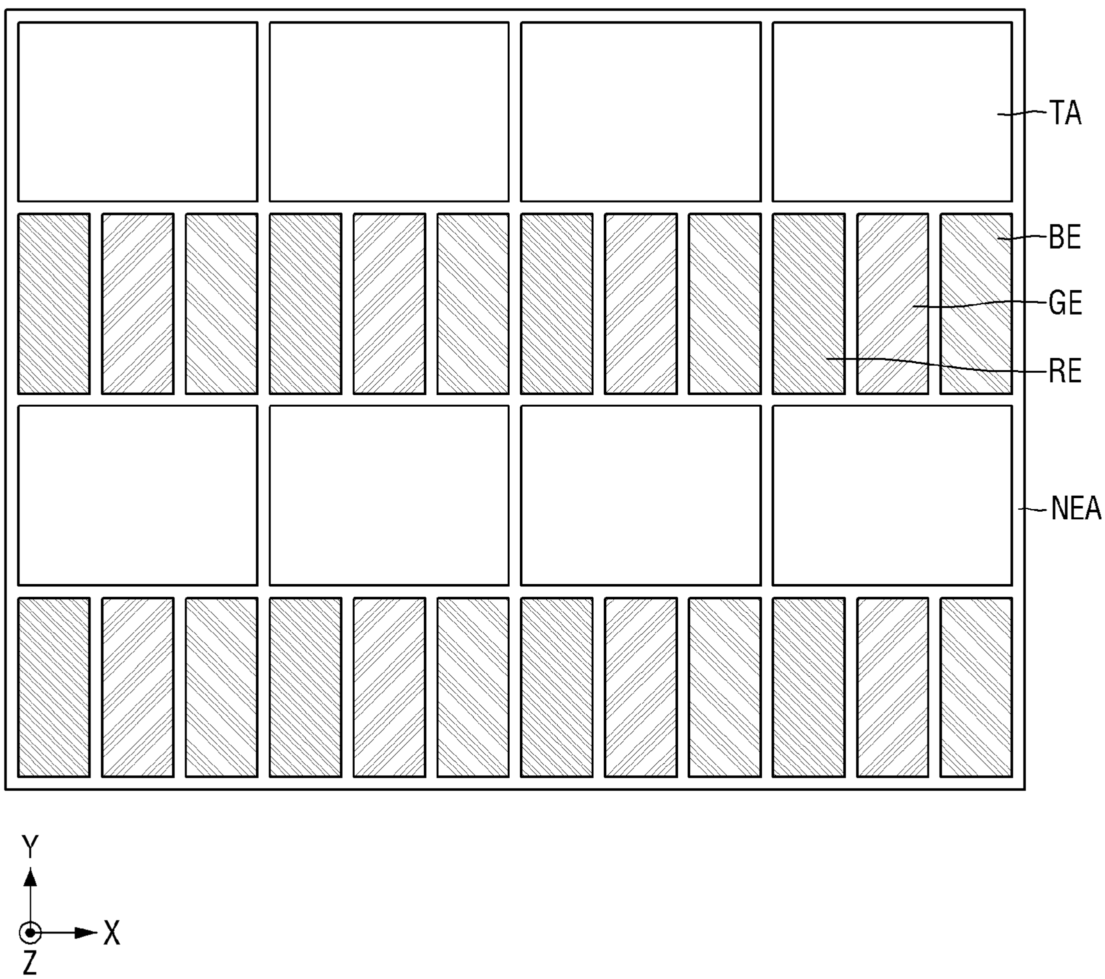
FIG. 21 is a view showing an example of a layout of emission areas of display pixels and transmissive areas in the display area of FIG. 4.
Figure 22:
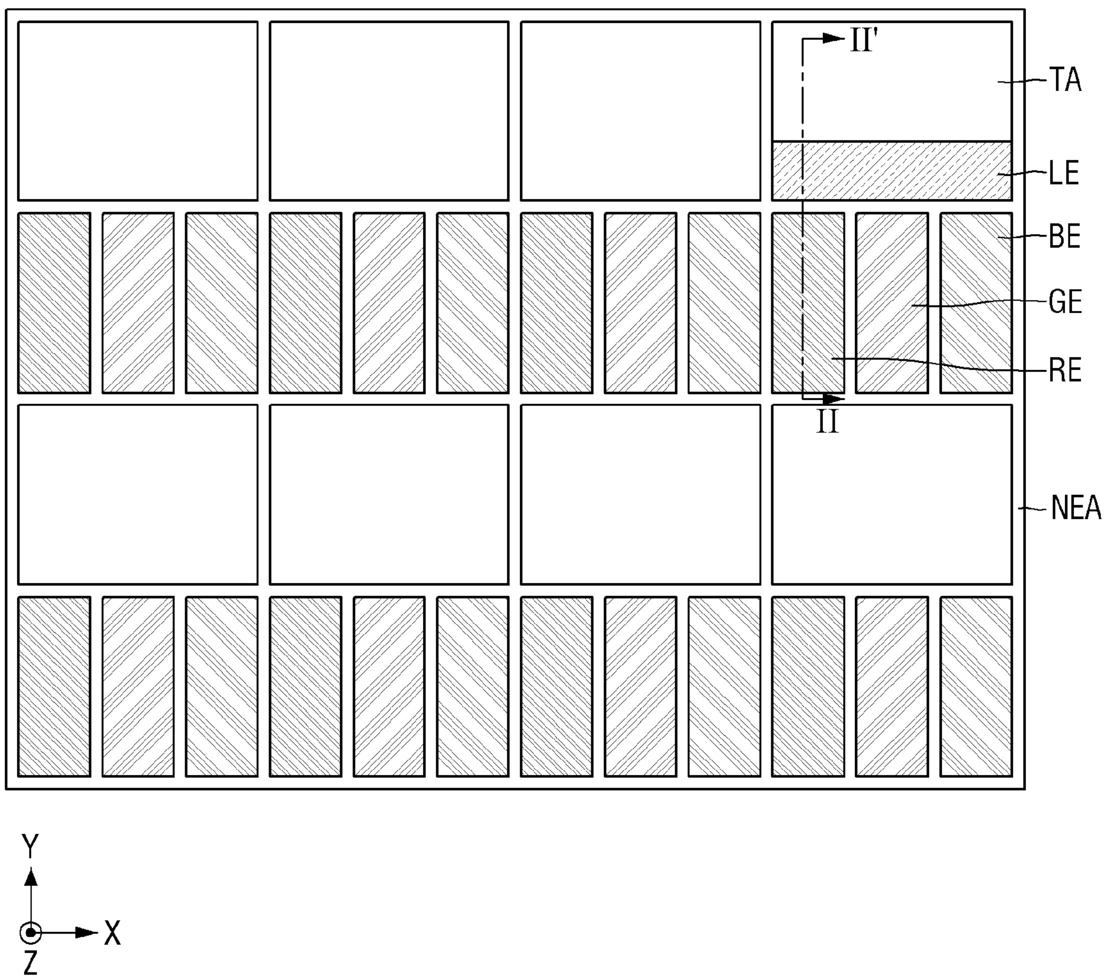
FIG. 22 is a view showing an example of a layout of emission areas of display pixels, a light-receiving area of a sensor pixel and transmissive areas in the sensor area of FIG. 4.

FIG. 21 is a plan view showing an example of emission areas of display pixels and transmissive areas in the display area of FIG. 4. FIG. 22 is a plan view showing an example of emission areas of display pixels, a light-receiving area of a sensor pixel and transmissive areas in the sensor area of FIG. 4.

An embodiment shown in FIGS. 21 and 22 may be different from an embodiment of FIGS. 10 and 11 in that a display area DA and a sensor area SA may include transmissive areas TA.

Referring to FIGS. 21 and 22, the display area DA may include first to third emission areas RE, GE and BE, the transmissive areas TA and a non-emission area NEA. The sensor area SA may include the first to third emission areas RE, GE and BE, a light-receiving area LE, transmissive areas TA and a non-emission area NEA.

The first emission areas RE, the second emission areas GE and the third emission areas BE are substantially identical to those described above with reference to FIGS. 10 and 11. Therefore, the first emission areas RE, the second emission areas GE and the third emission areas BE will not be described again.

The transmissive areas TA transmit light incident on the display panel 300 as it is. Due to the transmissive areas TA, a user may see an object or a background located on the lower side of the display panel 300 from the upper side of the display panel 300. Therefore, the display device 10 may be implemented as a transparent display device. Alternatively, due to the transmissive areas TA, an optical sensor of the display device 10 disposed on the lower side of the display panel 300 may detect light incident on the upper side of the display panel 300.

Each of the transmissive areas TA may be surrounded by the non-emission area NEA. Although the transmissive areas TA are arranged or disposed in the first direction (x-axis direction) in FIGS. 21 and 22, the disclosure is not limited thereto. The transmissive areas TA may be arranged or disposed in the second direction (y-axis direction). In a case that the transmissive areas TA are arranged or disposed in the first direction (x-axis direction), the transmissive areas TA may be disposed between adjacent first emission areas RE in the second direction (y-axis direction), between adjacent second emission areas GE in the second direction (y-axis direction), and between adjacent third emission areas BE in the second direction (y-axis direction).

The light-receiving area LE may overlap one of the transmission areas TA. One light-receiving area LE may be disposed in every U transmissive areas TA in the first direction (x-axis direction), where U is a positive integer equal to or greater than two. One light-receiving area LE may be disposed in every V transmissive areas TA in the second direction (y-axis direction), where V is a positive integer equal to or greater than two.

The light-receiving area LE may overlap the transmissive area TA in the third direction (z-axis direction). The length of the light-receiving area LE may be substantially equal to the length of the transmissive area TA of the first direction (x-axis direction). It is, however, to be understood that the disclosure is not limited thereto. The length of the light-receiving area LE may be smaller than the length of the transmissive area TA in the first direction (x-axis direction). The length of the light-receiving area LE may be smaller than the length of the transmissive area TA in the second direction (y-axis direction).

Figure 23A:
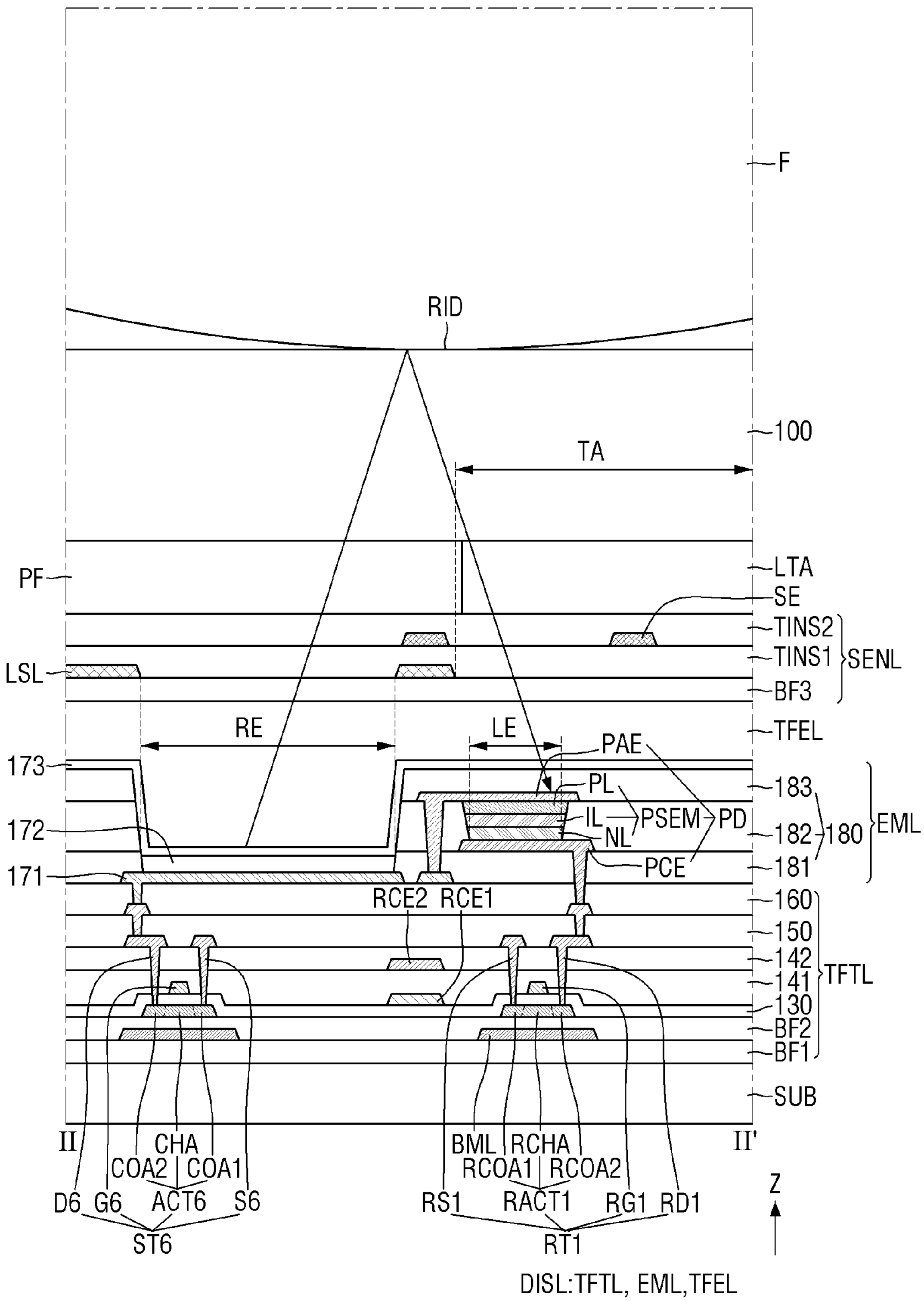
FIG. 23A is a schematic cross-sectional view showing an example of an emission area of a display pixel, a light-receiving area of a sensor pixel and a transmissive area in the sensor area of FIG. 22.

FIG. 23A is a schematic cross-sectional view showing an example of an emission area of a display pixel, a light-receiving area of a sensor pixel, and a transmissive area in the sensor area of FIG. 22.

Although the sensor pixel of the sensor area is a sensor pixel of an optical fingerprint sensor in the example shown in FIG. 23A, the disclosure is not limited thereto. FIG. 23A shows an example of a cross section of the first emission area RE, the light-receiving area LE, and the transmission area TA taken along line II-II' of FIG. 22. FIG. 23A shows only the sixth transistor ST6 of the first display pixel DP1 and the first sensing transistor RT1 and the sensing capacitor RC1 of the sensor pixel FP.

An embodiment of FIG. 23A may be different from the embodiment of FIG. 15 in that the light-receiving area LE may be disposed to overlap the transmissive area TA in the third direction (z-axis direction).

Referring to FIG. 23A, the first light-receiving electrode PCE of the light-receiving element PD of the light-receiving area LE may be made of an opaque conductive material, for example, may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. In such case, since the light-receiving area LE does not transmit light, some or a predetermined number of parts of the transmissive area TA overlapping the light-receiving area LE may not transmit light.

The light-transmitting area LTA of the polarizing film PF may overlap the transmissive area TA in the third direction (z-axis direction). In this manner, it may be possible to prevent the amount of light passing through the transmissive area TA from decreasing due to the polarizing film PF.

As shown in FIG. 23A, in a case that the display panel 300 includes the transmissive area TA, the light-receiving area LE may be disposed to overlap the transmissive area TA in the third direction (z-axis direction). Therefore, no additional space for the light-receiving area LE is required separately from the space for the emission areas RE, GE and BE. Therefore, it may be possible to prevent the space for the emission areas RE, GE and BE from being reduced because of the light-receiving area LE.

Figure 23B:
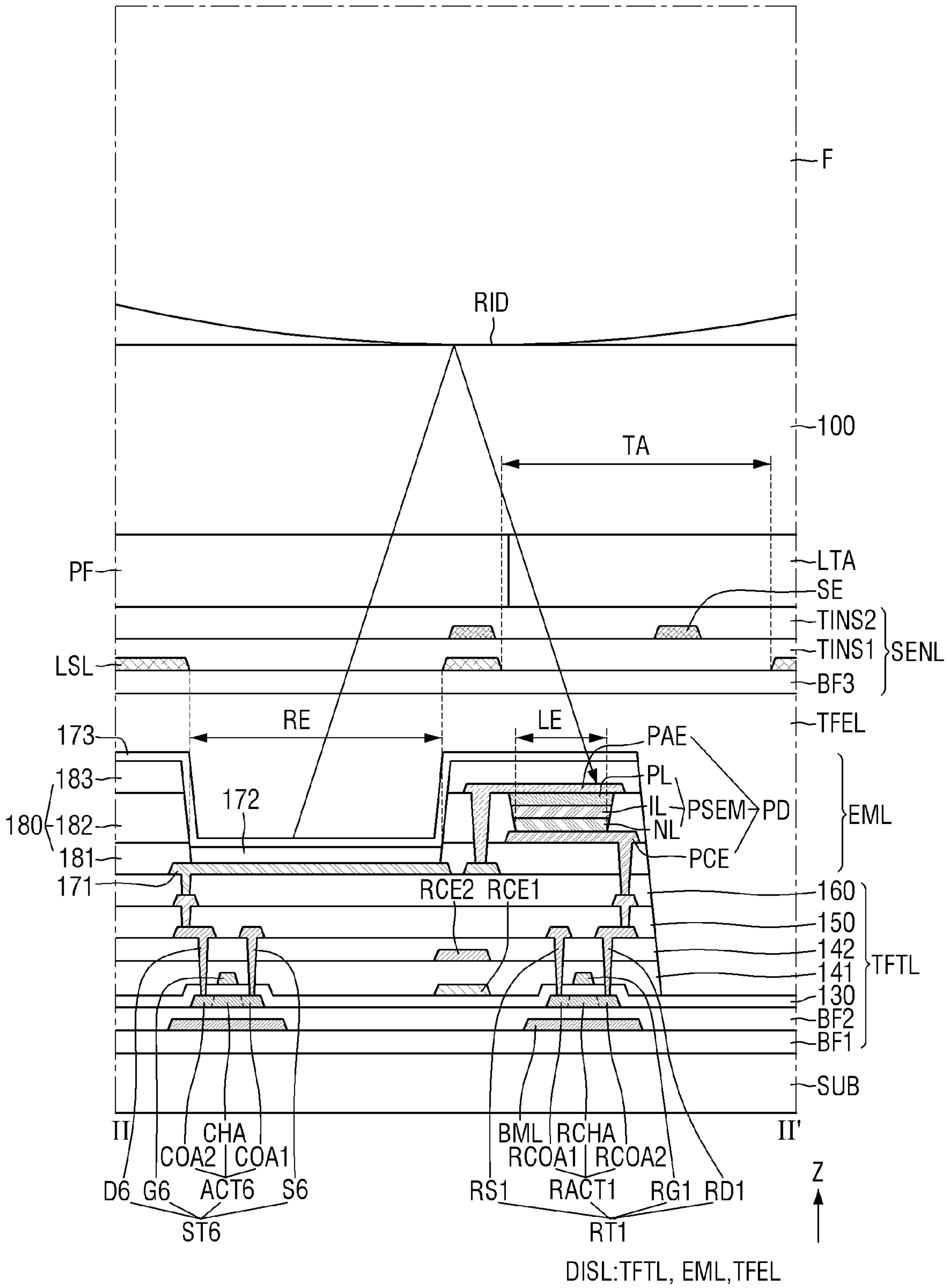
FIG. 23B is a schematic cross-sectional view showing another example of an emission area of a display pixel and a light-receiving area of a sensor pixel and a transmissive area in the sensor area of FIG. 22.

FIG. 23B is a schematic cross-sectional view showing another example of an emission area of a display pixel and a light-receiving area of a sensor pixel and a transmissive area in the sensor area of FIG. 22.

An embodiment of FIG. 23B may be different from an embodiment of FIG. 23A in that at least one electrode and insulating layer may be eliminated from the transmissive area TA.

Referring to FIG. 23B, a first interlayer dielectric layer 141, a second interlayer dielectric layer 142, a first organic layer 150, a second organic layer 160, a bank 180, and a second light-emitting electrode 173 may be made of a material that transmits light, with different refractive indexes. Therefore, by eliminating the first interlayer dielectric layer 141, the second interlayer dielectric layer 142, the first organic layer 150, the second organic layer 160, the bank 180 and the second light-emitting electrode 173 from the transmissive area TA, it may be possible to further increase the transmittance of the transmissive area TA.

Although the first buffer layer BF1, the second buffer layer BF2 and the gate insulating layer 130 are not eliminated from the transmissive area TA in the example shown in FIG. 23B, the disclosure is not limited thereto. At least one of the first buffer layer BF1, the second buffer layer BF2 and the gate insulating layer 130 may be eliminated from the transmissive area TA.

Figure 23C:
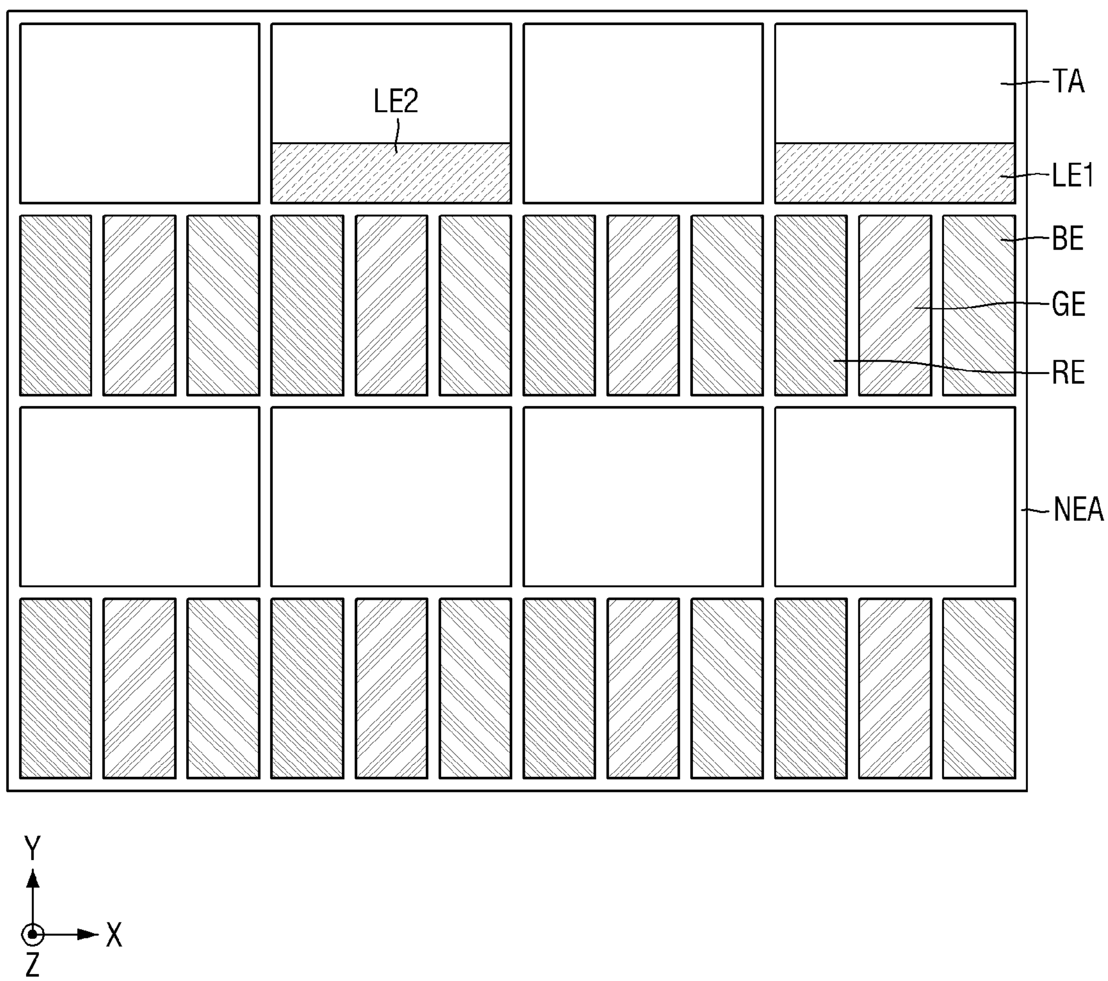
FIG. 23C is a view showing an example of a layout of emission areas of display pixels, a first light-receiving area of a first sensor pixel, and a second light-receiving area of a second sensor pixel in the sensor area of FIG. 4.

FIG. 23C is a view showing an example of a layout of emission areas of display pixels, a first light-receiving area of a first sensor pixel, and a second light-receiving area of a second sensor pixel in the sensor area of FIG. 4.

An embodiment of FIG. 23C may be different from an embodiment of FIG. 22 in that the former includes a second light-receiving area LE2.

Referring to FIG. 23C, the display area DA may include first to third emission areas RE, GE and BE, transmissive areas TA and a non-emission area NEA. The sensor area SA may include first to third emission areas RE, GE and BE, a first light-receiving area LE1, a second light-receiving area LE2, transmissive areas TA and a non-emission area NEA.

The second light-receiving area LE2 may overlap one of the transmission areas TA. One second light-receiving area LE2 may be disposed in every U transmissive areas TA in the first direction (x-axis direction), where U is a positive integer equal to or greater than two. One second light-receiving area LE2 may be disposed in every V transmissive areas TA in the second direction (y-axis direction), where V is a positive integer equal to or greater than two.

The second light-receiving area LE2 may overlap the transmissive area TA in the third direction (z-axis direction). The length of the second light-receiving area LE2 may be substantially equal to the length of the transmissive area TA of the first direction (x-axis direction). It is, however, to be understood that the disclosure is not limited thereto. The length of the second light-receiving area LE2 may be smaller than the length of the transmissive area TA in the first direction (x-axis direction). The length of the second light-receiving area LE2 may be smaller than the length of the transmissive area TA in the second direction (y-axis direction).

Although the first light-receiving area LE1 and the second light-receiving area LE2 are disposed in different transmission areas TA in the example shown in FIG. 23C, the disclosure is not limited thereto. The first light-receiving area LE1 and the second light-receiving area LE2 may be disposed in the same transmission area TA.

The first light-receiving area LE1 may serve as a light-receiving area of one of an optical fingerprint sensor, an illuminance sensor, an optical proximity sensor and a solar cell. The second light-receiving area LE2 may serve as another light-receiving area of one of an optical fingerprint sensor, an illuminance sensor, an optical proximity sensor and a solar cell.

Although the display panel 300 includes the first light-receiving area LE1 and the second light-receiving area LE2 having different features in the example shown in FIG. 23C, the disclosure is not limited thereto. The display panel 300 may include three or more light-receiving areas having different features.

The cross section of the second light-receiving area LE2 may be substantially identical to the cross section of the light-receiving area LE described above with reference to FIGS. 23A and 23B; and, therefore, the redundant description will be omitted.

Figure 24:
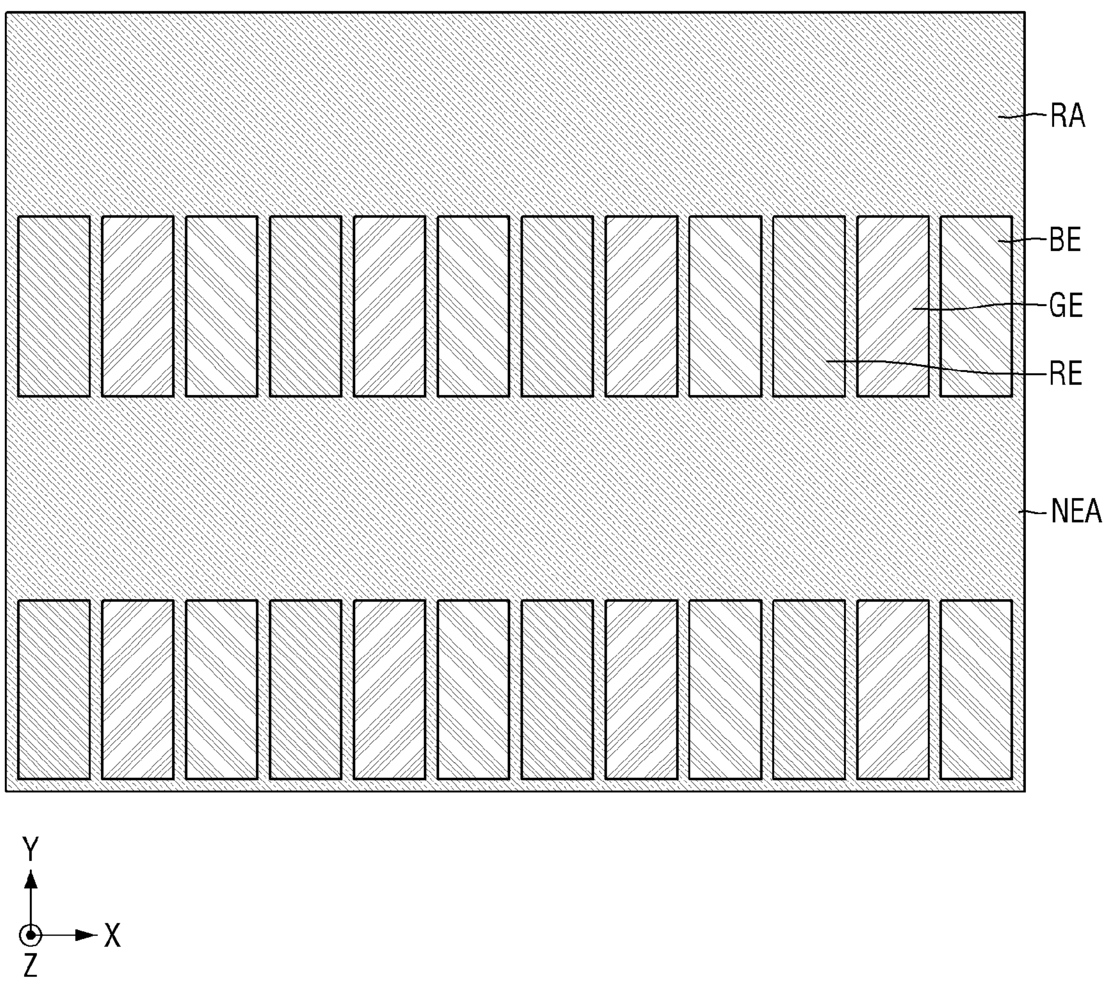
FIG. 24 is a view showing an example of a layout of emission areas of display pixels and a reflect area in the display area of FIG. 4.
Figure 25:
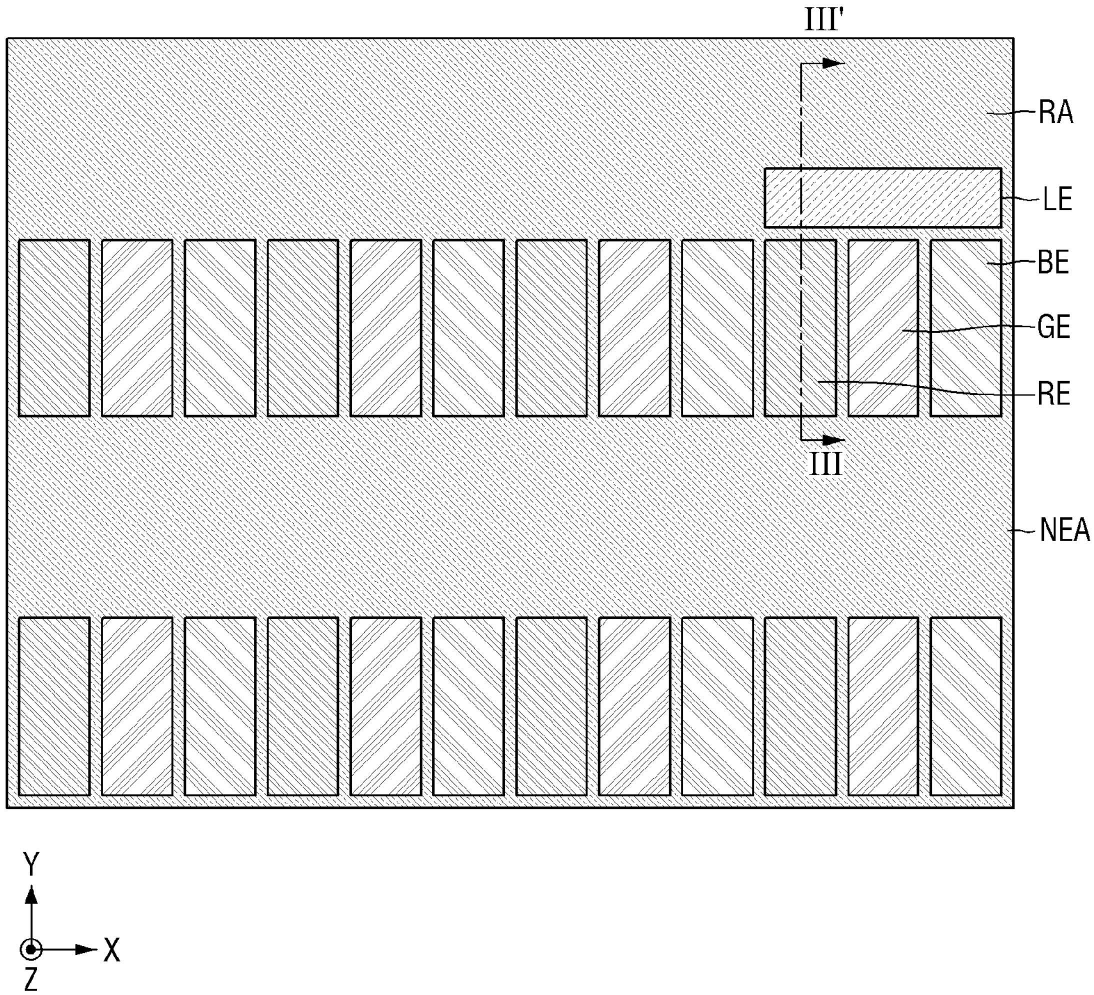
FIG. 25 is a view showing an example of a layout of emission areas of display pixels, a light-receiving area of a sensor pixel and a reflective area in the sensor area of FIG. 4.

FIG. 24 is a plan view showing an example of emission areas of display pixels and a reflective area in the display area of FIG. 4. FIG. 25 is a plan view showing an example of emission areas of display pixels, a light-receiving area of a sensor pixel and a reflective area in the sensor area of FIG. 4.

An embodiment shown in FIGS. 24 and 25 may be different from an embodiment of FIGS. 10 and 11 in that a display area DA and a sensor area SA may include a reflective area RA.

Referring to FIGS. 24 and 25, the display area DA may include first to third emission areas RE, GE and BE, a reflective area RA, and a non-emission area NEA. The sensor area SA may include first to third emission areas RE, GE and BE, a light-receiving area LE, a reflective area RA and a non-emission area NEA.

The first emission areas RE, the second emission areas GE and the third emission areas BE are substantially identical to those described above with reference to FIGS. 10 and 11. Therefore, the first emission areas RE, the second emission areas GE and the third emission areas BE will not be described again.

The reflective area RA reflects light incident on the upper surface of the display panel 300. Due to the reflective area RA, a user can see an object or a background reflected from the upper side of the display panel 300 from the upper side of the display panel 300. Therefore, the display device 10 may be implemented as a reflective display device.

The reflective area RA may be the area other than the first to third emission areas RE, GE and BE and the light-receiving area LE. The reflective area RA may surround the emission areas RE, GE and BE and the light-receiving area LE.

Figure 26:
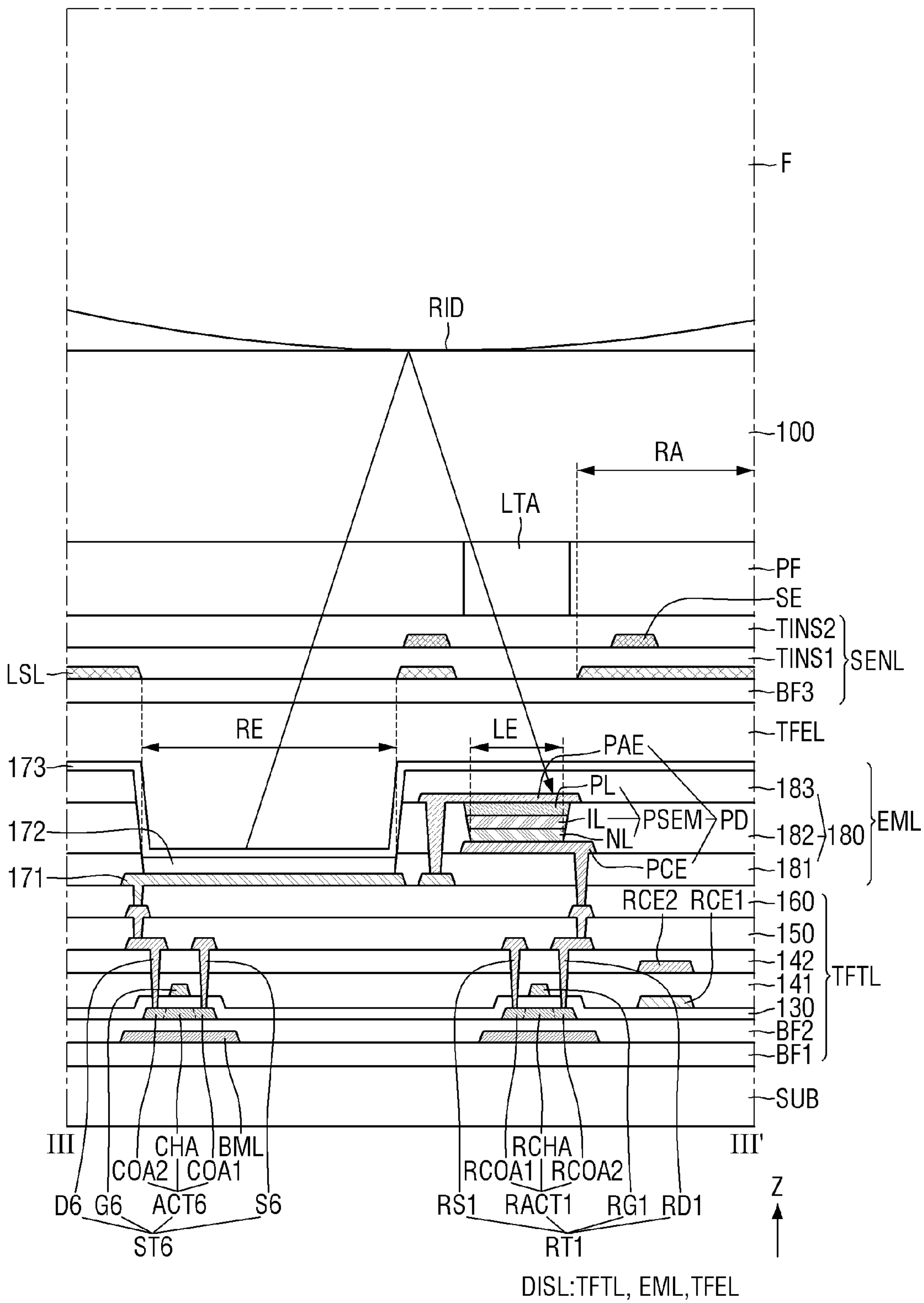
FIG. 26 is a view showing an example of a layout of an emission area of a display pixel, a light-receiving area of a sensor pixel and a reflective area in the sensor area of FIG. 25.

FIG. 26 is a schematic cross-sectional view showing an example of an emission area of a display pixel and a light-receiving area of a sensor pixel and a reflective area in the sensor area of FIG. 25.

Although the sensor pixel of the sensor area is a sensor pixel of an optical fingerprint sensor in the example shown in FIG. 26, the disclosure is not limited thereto. FIG. 26 is a schematic cross-sectional view showing the first emission area RE, the light-receiving area LE, and the reflective area RA, taken along line III-III' of FIG. 25. FIG. 26 shows only the sixth transistor ST6 of the first display pixel DP1 and the first sensing transistor RT1 and the sensing capacitor RC1 of the sensor pixel FP.

An embodiment of FIG. 26 may be different from an embodiment of FIG. 15 in that the reflective area RA may be further disposed.

Referring to FIG. 26, a first reflective layer LSL may be disposed in the reflective area RA. The first reflective layer LSL may include a metal material having high reflectance, for example, silver (Ag).

The light-transmitting area LTA of the polarizing film PF may overlap the light-receiving area LE in the third direction (z-axis direction). In this manner, it may be possible to prevent the amount of light passing through the light-transmitting area LTA from decreasing due to the polarizing film PF.

As shown in FIGS. 24 to 26, in a case that the display panel 300 includes the reflective area RA, the light-receiving area LE may be disposed to overlap the light-transmitting area LTA in the third direction (z-axis direction). Therefore, no additional space for the light-receiving area LE is required separately from the space for the emission areas RE, GE and BE. Therefore, it may be possible to prevent the space for the emission areas RE, GE and BE from being reduced because of the light-receiving area LE.

Figure 27:
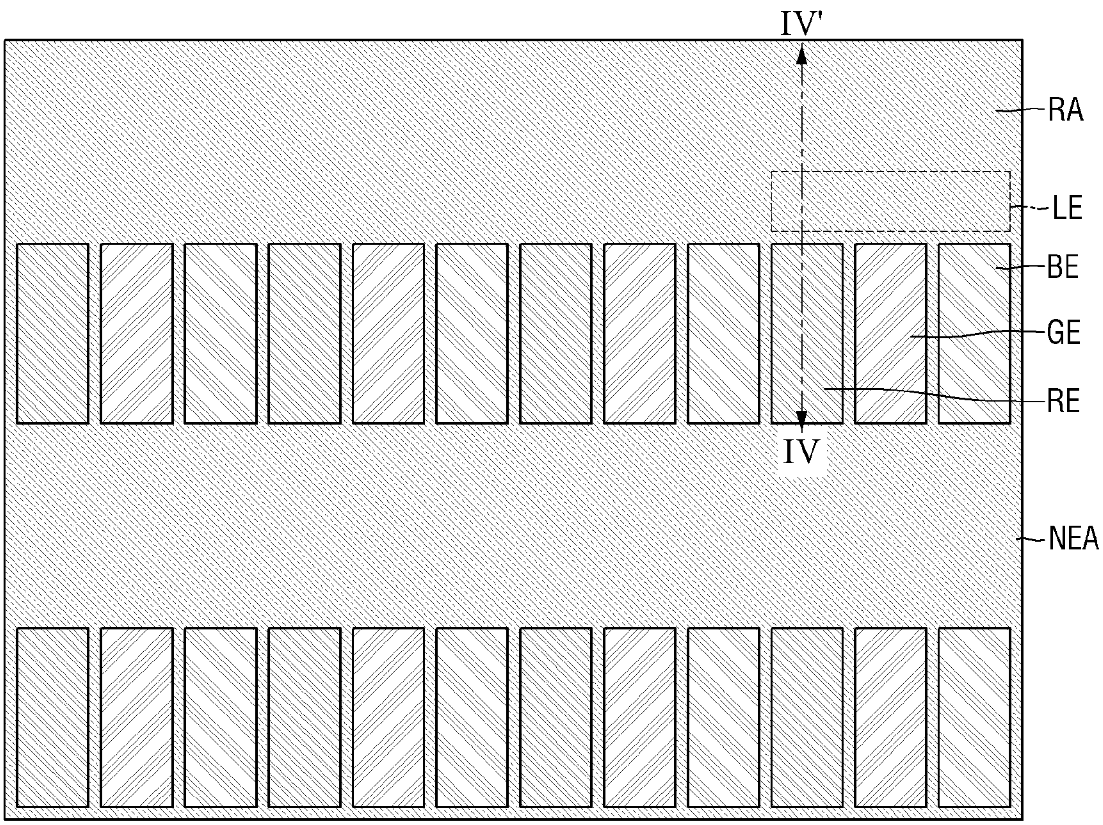
FIG. 27 is a view showing an example of a layout of emission areas of display pixels, a light-receiving area of a sensor pixel and a reflective area in the sensor area of FIG. 4.
Figure 28:
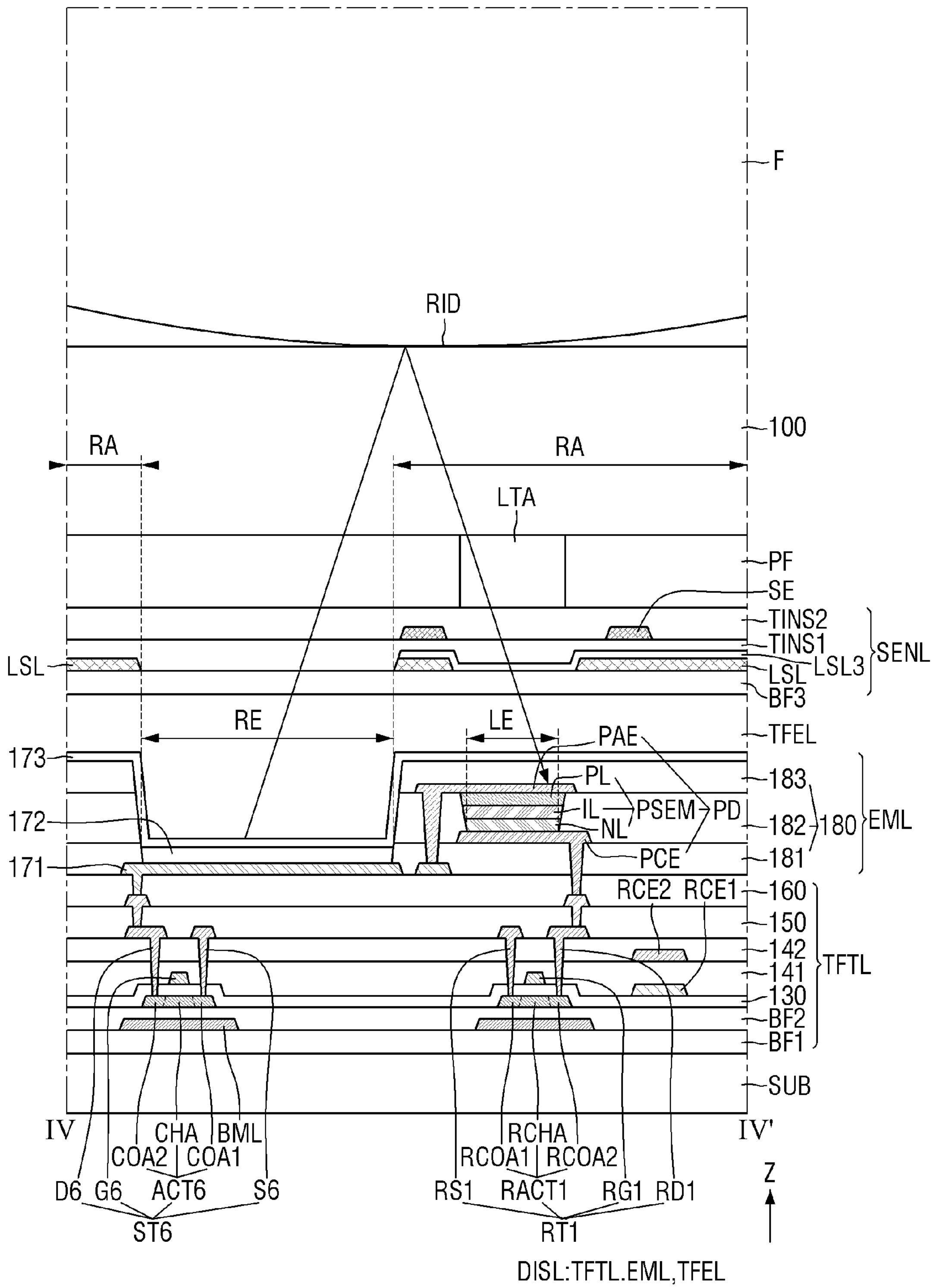
FIG. 28 is a schematic cross-sectional view showing an example of an emission area of a display pixel, a light-receiving area of a sensor pixel and a transmissive area in the sensor area of FIG. 27.

FIG. 27 is a plan view showing an example of emission areas of display pixels, a light-receiving area of a sensor pixel, and a reflective area in the sensor area of FIG. 4. FIG. 28 is a schematic cross-sectional view showing an example of an emission area of a display pixel, a light-receiving area of a sensor pixel, and a transmissive area in the sensor area of FIG. 27.

An embodiment of FIGS. 27 and 28 may be different from an embodiment of FIGS. 25 and 26 in that the light-receiving area LE may be disposed to overlap the reflective area RA in the third direction (z-axis direction).

Referring to FIGS. 27 and 28, the reflective area RA may be disposed to surround or may be adjacent to the emission areas RE, GE, and BE. A part of the reflective area RA may overlap the light-receiving area LE in the third direction (z-axis direction).

The reflective layer may include a first reflective layer LSL and a second reflective layer LSL3. The second reflective layer LSL3 may be disposed on the first reflective layer LSL in the reflective area RA. The first reflective layer LSL may not be disposed in the light-receiving area LE, but the second reflective layer LSL3 may be disposed on the third buffer layer BF3 in the light-receiving area LE.

The first reflective layer LSL and the second reflective layer LSL3 may include a metal material having high reflectance, for example, silver (Ag). The thickness of the second reflective layer LSL3 may be smaller than the thickness of the first reflective layer LSL. The thickness of the second reflective layer LSL3 may be equal to or less than about 1/10 of the thickness of the first reflective layer LSL. For example, in a case that the thickness of the first reflective layer LSL may be about 1,000 Å, the thickness of the second reflective layer LSL3 may be about 90 Å.

Since the second reflective layer LSL3 may be very or relatively thin, a part of the light traveling to the second reflective layer LSL3, for example, approximately 80% of the light traveling to the second reflective layer LSL3 may pass through the second reflective layer LSL3. Therefore, light incident on the upper surface of the display panel 300 may pass through the second reflective layer LSL3 to be detected through the light-receiving areas LE.

In a case that the reflective area RA includes the first reflective layer LSL as shown in FIG. 26, a moiré pattern may be perceived by the user due to the opening of the reflective area RA. As shown in FIG. 28, in a case that the second reflective layer LSL3 may be disposed in the light-receiving area LE to overlap with the opening of the first reflective layer LSL in the reflective area RA in the third direction (z-axis direction), it may be possible to prevent the moiré pattern from being perceived by the user.

The light-transmitting area LTA of the polarizing film PF may overlap the reflective area RA and the light-receiving area LE in the third direction (z-axis direction). In this manner, it may be possible to prevent the amount of light passing through the reflective area RA and the light-receiving area LE from decreasing due to the polarizing film PF.

Figure 29:
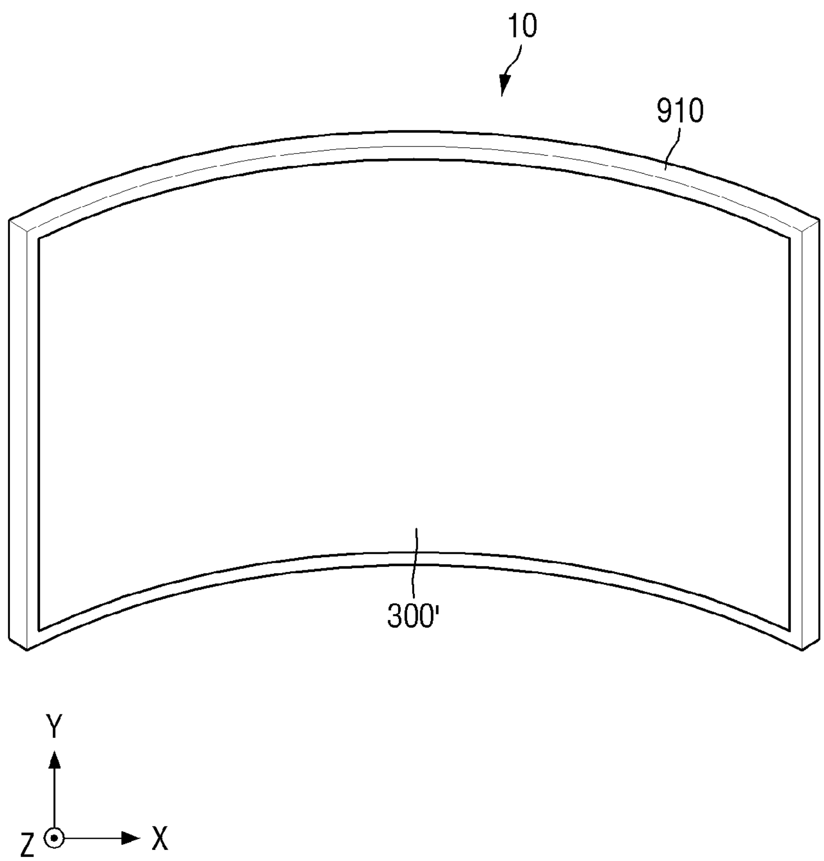
FIG. 29 is a perspective view showing a display device according to another embodiment.
Figure 30:
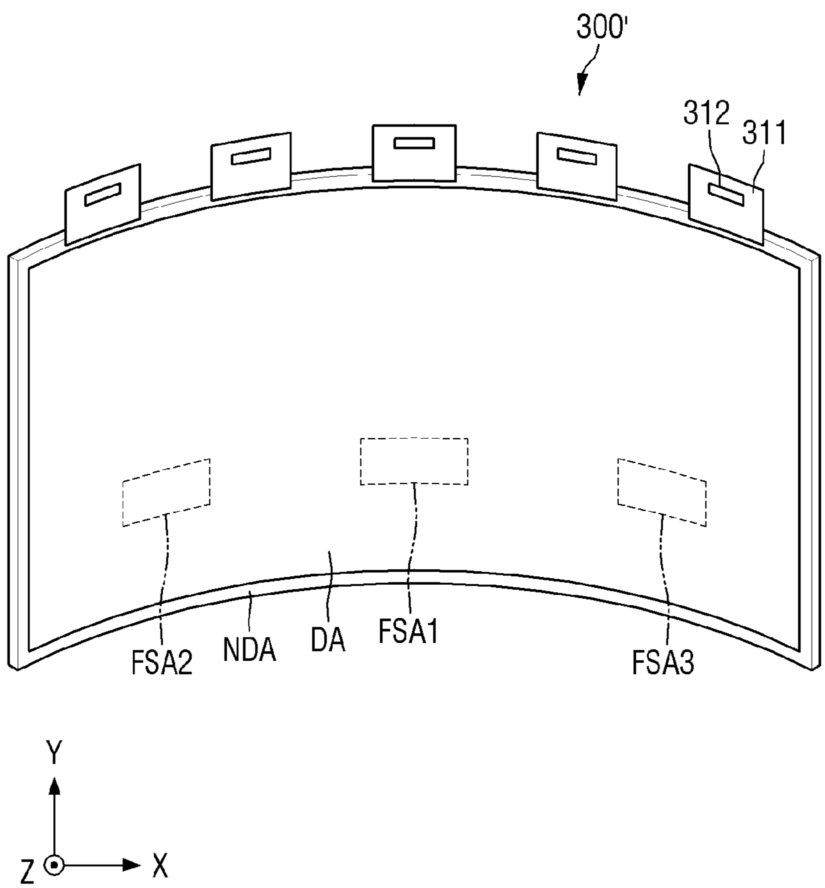
FIG. 30 is a perspective view showing a display area, a non-display area and a sensor area of a display panel of a display device according to an embodiment.

FIG. 29 is a perspective view showing a display device according to another embodiment. FIG. 30 is a perspective view showing a display area, a non-display area and a sensor area of a display panel of a display device according to an embodiment.

An embodiment of FIGS. 29 and 30 may be different from an embodiment of FIGS. 1 and 4 in that a display device 10 may be a curved display device having a predetermined curvature.

Referring to FIGS. 29 and 30, the display device 10 according to another embodiment is used as a television. The display device 10 according to this embodiment may include a display panel 300', flexible films 311, source drivers 312, and a cover frame 910.

The display device 10 may have a substantially rectangular shape having longer sides in the first direction (x-axis direction) and shorter sides in the second direction (y-axis direction) in a case that the display device 10 may be viewed from the top. The shape of the display device 10 in a case that the display device 10 may be viewed from the top is not limited to a substantially rectangular shape but may be formed in other quadrangular shape than a rectangular shape, other polygonal shape than quadrangular shape, a circular shape, or an elliptical shape.

As the display device 10 becomes larger and larger, there may be a larger difference between the viewing angle in a case that the user views the center area of the display area DA of the display device 10 and the viewing angle in a case that the user views the left and right ends of the display area DA of the display device 10. The viewing angle may be defined as an angle formed by the line of a user's sight and the tangent of the display device 10. In order to reduce such difference in the viewing angles, the display device 10 may be bent at a predetermined curvature from the first direction (x-axis direction). The display device 10 may be curved so that it is concave toward the user.

The display panel 300' may be a flexible display panel that may be easily bent, folded or rolled so that it may be bent in the first direction (x-axis direction) with a predetermined curvature.

The display panel 300' may include a display area DA where images may be displayed, and a non-display area NDA around or adjacent to the display area DA. The display panel 300' may include sensor areas FSA1, FSA2 and FSA3 that may sense light incident from the outside.

The sensor areas FSA1, FSA2 and FSA3 may include a first sensor area FSA1, a second sensor area FSA2, and a third sensor area FSA3. In FIGS. 29 and 30, the first sensor area FSA1 may be disposed in the center area of the display panel 300', the second sensor area FSA2 may be disposed in the left area of the display panel 300', and the third sensor area FSA3 may be disposed in the right area of the display panel 300'. In the example shown in FIGS. 29 and 30, the first sensor area FSA1, the second sensor area FSA2 and the third sensor area FSA3 are disposed closer to the lower edge of the display panel 300' than the upper edge. In the example shown in FIGS. 29 and 30, the second sensor area FSA2 and the third sensor area FSA3 are bilateral symmetric with respect to the first sensor area FSA1. It is, however, to be understood that the positions of the first sensor area FSA1, the second sensor area FSA2 and the third sensor area FSA3 are not limited to those shown in FIGS. 29 and 30.

The first sensor area FSA1, the second sensor area FSA2 and the third sensor area FSA3 may sense light to perform the same feature. For example, in order to serve as an optical fingerprint sensor for recognizing a person's fingerprint, each of the first sensor area FSA1, the second sensor area FSA2 and the third sensor area FSA3 may irradiate light onto the fingerprint of the person's finger F placed in the sensor area SA to detect the light reflected at the valleys and ridges of the fingerprint of the person's finger F. Alternatively, each of the first sensor area FSA1, the second sensor area FSA2 and the third sensor area FSA3 may serve as an illuminance sensor for detecting illuminance of the environment in which the display device 10 may be located or disposed. Alternatively, each of the first sensor area FSA1, the second sensor area FSA2 and the third sensor area FSA3 serves as an optical proximity sensor that detects whether an object is disposed in close proximity to the display device 10 by irradiating light onto the display device 10 to sense light reflected by the object.

Alternatively, the first sensor area FSA1, the second sensor area FSA2 and the third sensor area FSA3 may sense light to perform different features. For example, one of the first sensor area FSA1, the second sensor area FSA2 and the third sensor area FSA3 may work as an optical fingerprint sensor, another one of them may work as an illuminance sensor, and the other one of them may work as an optical proximity sensor. Alternatively, two of the first sensor area FSA1, the second sensor area FSA2 and the third sensor area FSA3 may work as one of an optical fingerprint sensor, an illuminance sensor and an optical proximity sensor, and the other one of them may work another one of an optical fingerprint sensor, an illuminance sensor and an optical proximity sensor.

The first sensor area FSA1, the second sensor area FSA2 and the third sensor area FSA3 of the display panel 300' may be substantially identical to those described above with reference to FIGS. 8, 9, 11, 12, 14 to 20.

The flexible films 311 may be attached to the non-display area NDA of the display panel 300'. The flexible films 311 may be attached on display pads of the non-display area NDA of the display panel 300' using an anisotropic conductive film. The flexible films 311 may be attached to the upper edge of the display panel 300'. Each of the flexible films 311 may be bent.

The source drivers 312 may be disposed on the flexible films 311, respectively. Each of the source drivers 312 may receive a source control signal and digital video data, generate data voltages, and output the data voltages to data lines of the display panel 300'. Each of the source drivers 312 may be implemented as an integrated circuit.

The cover frame 910 may be disposed to surround the side surfaces and the bottom surface of the display panel 300'. The cover frame 910 may form the exterior of the display device 10 on the side surfaces and the bottom surface. The cover frame 910 may include plastic, metal, or both plastic and metal.

As shown in FIGS. 29 and 30, even in a case that the display device 10 may be a curved display device with a predetermined curvature in the first direction (x-axis direction), light may be detected through the sensor areas FSA1, FSA2 and FSA3 of the display panel 300'. Accordingly, the sensor areas FSA1, FSA2 and FSA3 of the display panel 300' may work as at least one of an optical fingerprint sensor, an illuminance sensor, and an optical proximity sensor.

Figure 31:
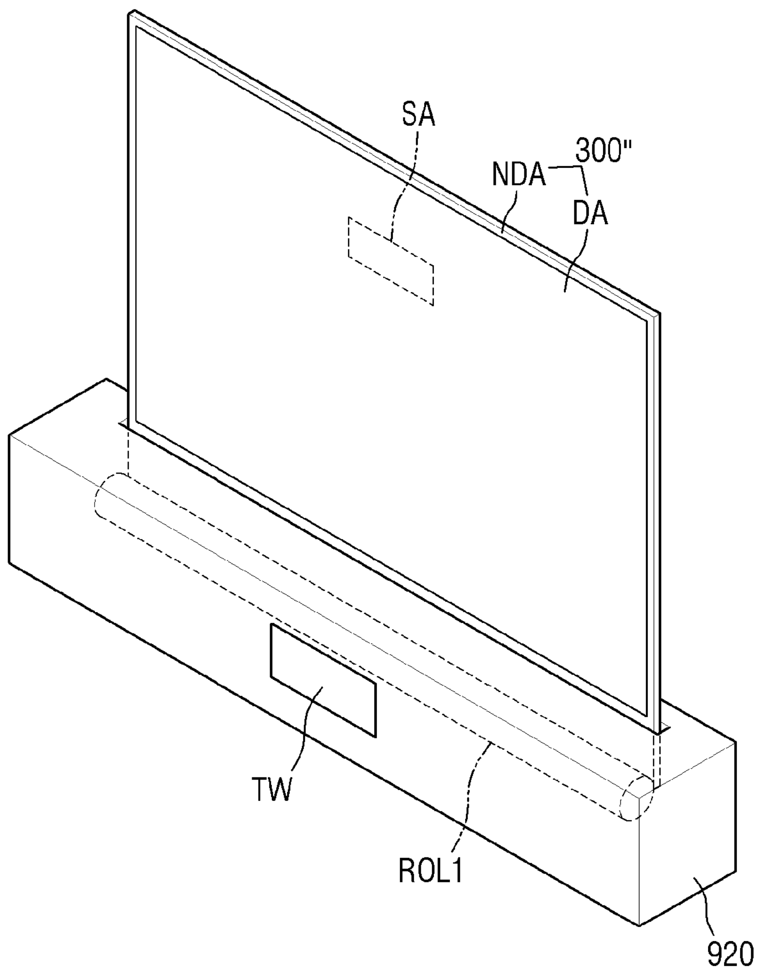
FIGS. 31 and 32 are perspective views showing a display device according to an embodiment.
Figure 32:
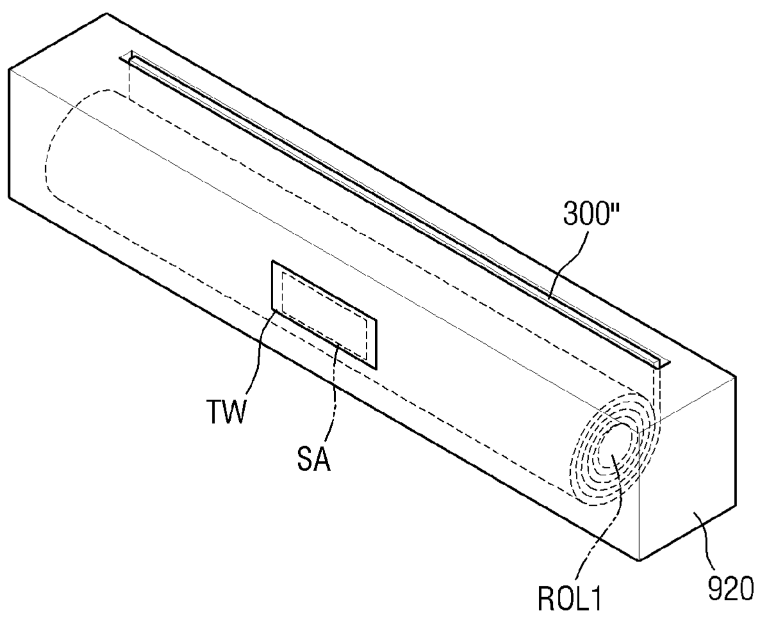

FIGS. 31 and 32 are perspective views showing a display device according to an embodiment.

An embodiment shown in FIGS. 31 and 32 may be different from an embodiment shown in FIGS. 1 and 4 in that the display device 10 may be a rollable display device that may be rolled or unrolled.

Referring to FIGS. 31 and 32, the display device 10 according to another embodiment is used as a television. The display device 10 according to this embodiment may include a display panel 300", a first roller ROL1 and a roller housing 920.

In a case that the display panel 300" is unrolled, it may have a substantially rectangular shape having longer sides in the first direction (x-axis direction) and shorter sides in the second direction (y-axis direction) in a case that the display panel 300" may be viewed from the top. The shape of the display device 10 when viewed from the top is not limited to a substantially rectangular shape but may be formed in other quadrangular shape than a rectangular shape, other polygonal shape than quadrangular shape, a circular shape, or an elliptical shape.

The display panel 300" may be a flexible display panel that may be easily bent, folded or rolled so that it may be rolled by the first roller ROL1. In a case that the display panel 300" is unrolled without being rolled around the first roller ROL1, it may be exposed to the outside from the upper side of the roller housing 920 as shown in FIG. 31. In a case that the display panel 300" is rolled by the first roller ROL1, it may be accommodated into the roller housing 920 as shown in FIG. 32. For example, the display panel 300" may be accommodated in the roller housing 920 or exposed from the upper side of the roller housing 920 as the user desires. Although the entire display panel 300" may be exposed from the roller housing 920 in the example shown in FIG. 31, the disclosure is not limited thereto. A part of the display panel 300" may be exposed from the roller housing 920, and only the exposed part of the display panel 300" may display images.

The first roller ROL1 may be connected to the lower edge of the display panel 300". Thus, as the first roller ROL1 is rotated, the display panel 300" may be rolled around the first roller ROL1 along the rotation direction of the first roller ROL1.

The first roller ROL1 may be accommodated in the roller housing 920. The first roller ROL1 may have a substantially columnar or substantially cylindrical shape. For example, the first roller ROL1 may be extended in the first direction (x-axis direction). The length of the first roller ROL1 in the first direction (x-axis direction) may be larger than the length of the display panel 300" in the first direction (x-axis direction).

The roller housing 920 may be disposed on the lower side of the display panel 300". The roller housing 920 may accommodate the first roller ROL1 and the display panel 300" rolled by the first roller ROL1.

The length of the roller housing 920 in the first direction (x-axis direction) may be larger than the length of the first roller ROL1 in the first direction (x-axis direction). The length of the roller housing 920 in the second direction (y-axis direction) may be larger than the length of the first roller ROL1 in the second direction (y-axis direction). The length of the roller housing 920 in the third direction (z-axis direction) may be larger than the length of the first roller ROL1 in the third direction (z-axis direction).

The roller housing 920 may include a transparent window (or referred to as a transmission window) TW through which the display panel 300" rolled around the first roller ROL1 may be seen. The transparent window TW may be disposed on the upper surface of the roller housing 920. The transparent window TW may be opened so that the inside of the roller housing 920 is accessible from the outside of the roller housing 920. Alternatively, a transparent protection member such as glass or plastic may be disposed in the transparent window TW to protect the inside of the roller housing 920.

The portion of the display panel 300" which is seen through the transparent window TW of the roller housing 920 in a case that the display panel 300" is rolled around the first roller ROL1 may be defined as the sensor area SA. The sensor area SA may be disposed in the central area of the display panel 300" adjacent to its upper side in a case that the display panel 300" is unfolded.

Since the sensor area SA includes display pixels and sensor pixels, it may display images and may also sense light from the outside. For example, the sensor area SA may serve as one of an optical fingerprint sensor, an illuminance sensor, and an optical proximity sensor.

In a case that the lower surface of the display panel 300" is connected to the first roller ROL1, the sensor area SA of the display panel 300" may display images on the upper surface of the display panel 300" in a case that it is rolled and unrolled, and light incident on the upper surface of the display panel 300" may be sensed. On the other hand, in a case that the upper surface of the display panel 300" is connected to the first roller ROL1, the sensor area SA of the display panel 300" may display images on the upper surface of the display panel 300" and may sense the light incident from the upper surface in a case that it is unrolled, while it may display images on the lower surface of the display panel 300" and may sense the light incident from the lower surface of the display panel 300" in a case that it is rolled. To this end, display pixels disposed in the sensor area SA of the display panel 300" may emit light toward the upper and lower surfaces of the display panel 300". In other words, the display panel 300" may be a dual-emission display panel that displays images on both the upper and lower surfaces. The sensor pixels disposed in the sensor area SA of the display panel 300" may sense the light incident from the upper surface of the display panel 300" as well as the light incident from the lower surface.

Figure 33:
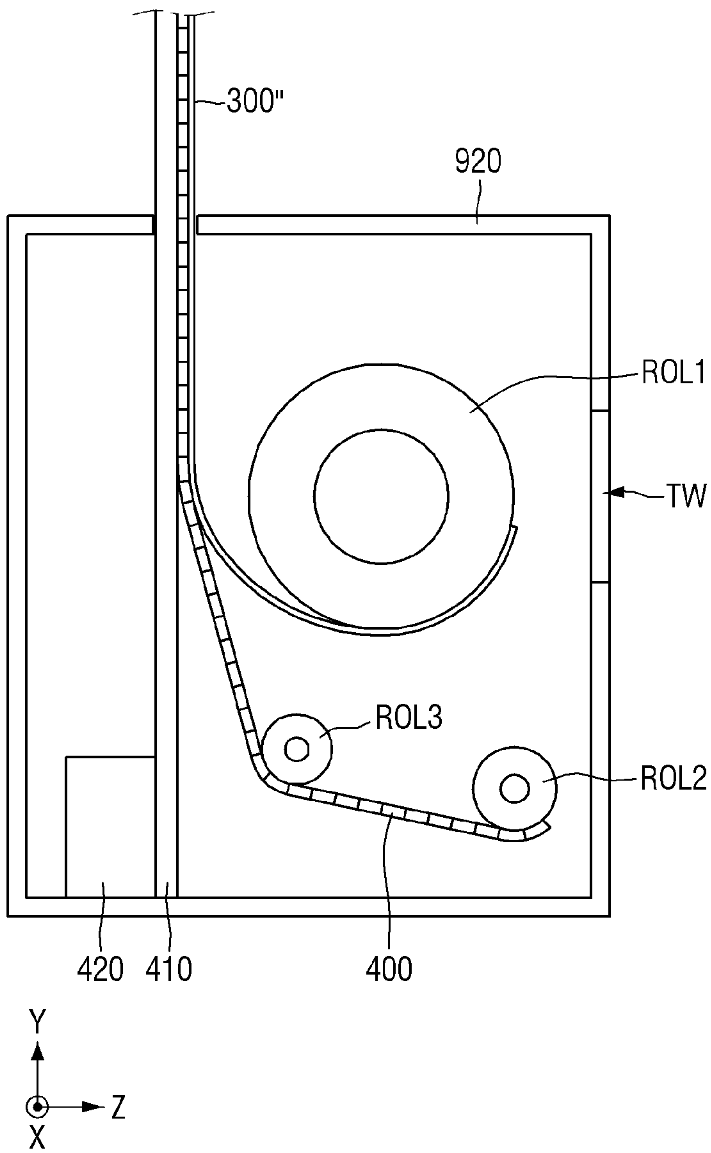
FIG. 33 is a view showing an example of a display panel, a panel support cover, a first roller and a second roller in a case that the display panel is unrolled as shown in FIG. 31.
Figure 34:
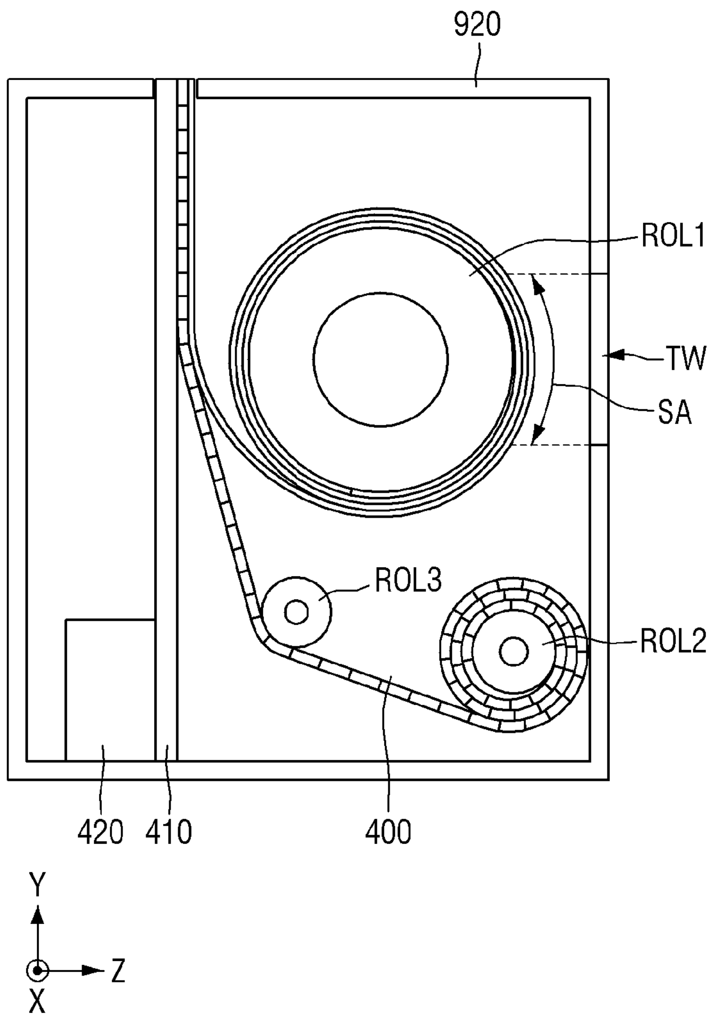
FIG. 34 is a view showing an example of a display panel, a panel support cover, a first roller and a second roller in a case that the display panel is rolled up as shown in FIG. 32.

FIG. 33 is a view showing an example of a display panel, a panel support cover, a first roller and a second roller in a case that the display panel is unrolled as shown in FIG. 31. FIG. 34 is a view showing an example of a display panel, a panel support cover, a first roller and a second roller in a case that the display panel is rolled up as shown in FIG. 32.

FIGS. 33 and 34 are schematic cross-sectional views of one side of the display device 10 including a display panel 300", a panel support cover 400, a first roller ROL1, a second roller ROL2, and a third roller ROL3.

Referring to FIGS. 33 and 34, the display device 10 may include the panel support cover 400, the second roller ROL2, the third roller ROL3, a link 410, and a motor 420.

In order to support the display panel 300" in a case that the display panel 300" is not rolled around the first roller ROL1 but is exposed to the upper side of the roller housing 920, the panel support cover 400 may be disposed on the lower surface of the display panel 300". To this end, the panel support cover 400 may include a material that may be light and may have a high strength. For example, panel support cover 400 may include aluminum or stainless steel.

The panel support cover 400 may be attached to/separated from the lower surface of the display panel 300". For example, the panel support cover 400 may be attached to the display panel 300" through an adhesive layer disposed on the upper surface of the panel support cover 400 facing the display panel 300". Alternatively, a magnet having a first polarity may be disposed on the lower surface of the display panel 300" and a magnet having a second polarity may be disposed on the upper surface of the panel support cover 400 so that the display panel 300" may be attached to the panel support cover 400.

The second roller ROL2 may be connected to the lower end of the panel support cover 400. Thus, as the second roller ROL2 is rotated, the panel support cover 400 may be rolled around the second roller ROL2 along the rotation direction of the second roller ROL2.

The second roller ROL2 may be accommodated in the roller housing 920 and may be disposed on the lower side of the first roller ROL1. The center of the second roller ROL2 may be disposed closer to the bottom surface of the roller housing 920 than the center of the first roller ROL1 is.

The second roller ROL2 may have a substantially columnar or substantially cylindrical shape. The second roller ROL2 may be extended in the first direction (x-axis direction). The length of the second roller ROL2 in the first direction (x-axis direction) may be larger than the length of the panel support cover 400 in the first direction (x-axis direction). The diameter of the bottom surface of the second roller ROL2 may be smaller than the diameter of the bottom surface of the first roller ROL1.

The third roller ROL3 serves to separate the display panel 300" from the panel support cover 400 so that the panel support cover 400 and the display panel 300" do not interfere with each other.

The third roller ROL3 may be accommodated in the roller housing 920 and may be disposed on the lower side of the first roller ROL1. The center of the third roller ROL3 may be disposed closer to the lower surface of the roller housing 920 than the center of the first roller ROL1 is.

The third roller ROL3 may have a substantially columnar or substantially cylindrical shape. The third roller ROL3 may be extended in the first direction (x-axis direction). The length of the third roller ROL3 in the first direction (x-axis direction) may be, but is not limited to being, larger than the length of the panel support cover 400 in the first direction (x-axis direction). The diameter of the bottom surface of the third roller ROL3 may be smaller than the diameter of the bottom surface of the second roller ROL2.

The force by which the display panel 300" is rolled around the first roller ROL1 may be greater than the adhesion between the display panel 300" and the panel support cover 400. The force by which the panel support cover 400 is rolled around the second roller ROL2 may be greater than the adhesion between the display panel 300" and the panel support cover 400.

The link 410 may be raised or lowered as the motor 420 is driven. Since the link 410 is coupled to the display panel 300" and the panel support cover 400, the display panel 300" and the panel support cover 400 may be raised or lowered along with the link 410. For example, the link 410 may be coupled to the upper surface of the display panel 300" and the upper surface of the panel support cover 400.

The motor 420 may apply a physical force to the link 410 to raise or lower the link 410. The motor 420 may be a device that receives an electric signal and converts it into a physical force.

As shown in FIG. 34, the sensor area SA may be seen through the transparent window TW of the roller housing 920 in a case that the display panel 300" is rolled around the first roller ROL1. In the example shown in FIGS. 33 and 34, the upper surface of the display panel 300" is connected to the first roller ROL1. In such case, the sensor area SA of the display panel 300" may display images on the upper surface of the display panel 300" and may sense light incident from the upper surface of the display panel 300" in a case that it is unfolded. On the other hand, the sensor area SA of the display panel 300" may display images on the lower surface of the display panel 300" and may sense light incident from the lower surface of the display panel 300" in a case that it is rolled.

Figure 35:
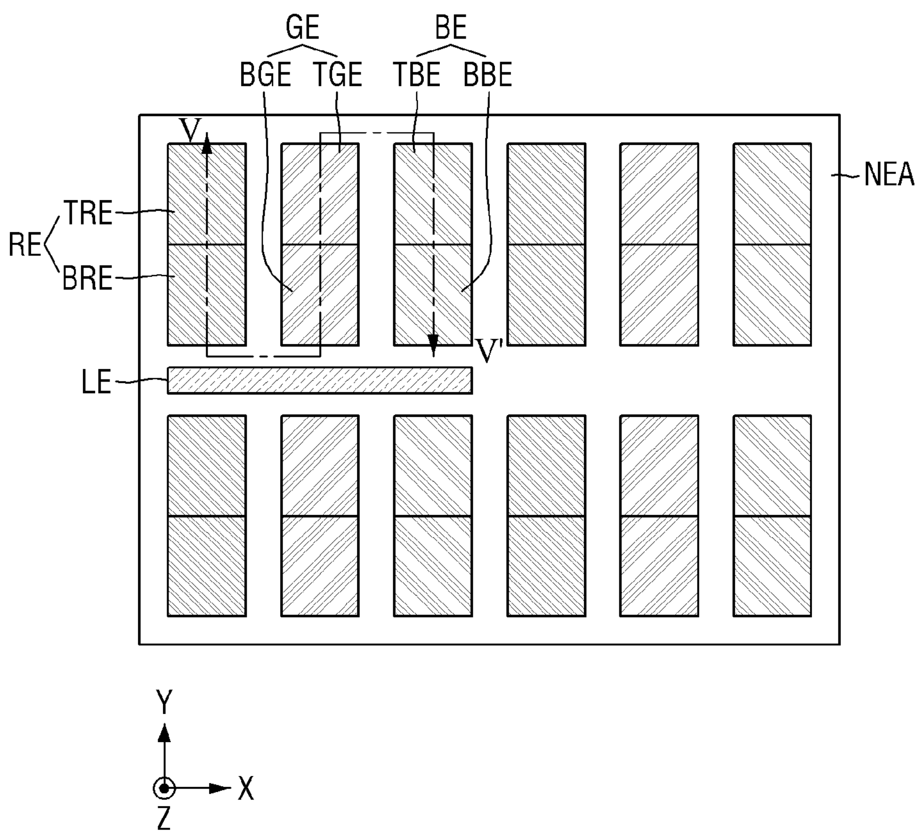
FIG. 35 is a view showing an example of a layout of the display pixel and the sensor pixel in the sensor area of FIGS. 33 and 34.
Figure 36:
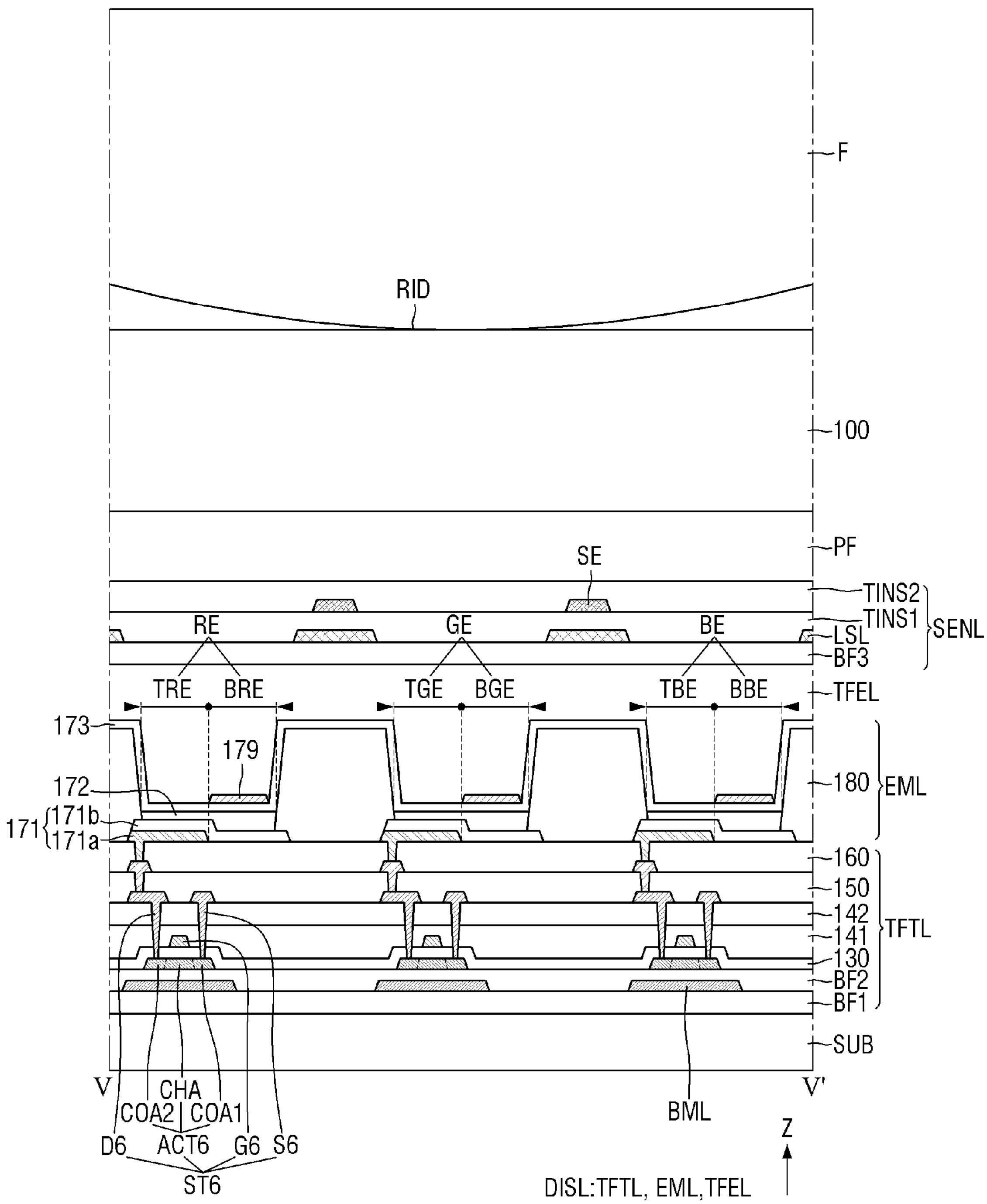
FIG. 36 is a schematic cross-sectional view showing an example of the display pixel and the sensor pixel in the sensor area of FIG. 34.

FIG. 35 is a plan view showing an example of the display pixel and the sensor pixel in the sensor area of FIGS. 33 and 34. FIG. 36 is a schematic cross-sectional view showing an example of the display pixel and the sensor pixel in the sensor area of FIG. 34. FIG. 36 is a schematic cross-sectional view showing the first emission area RE, the second emission area GE and the third emission area BE, taken along line V-V of FIG. 35.

An embodiment of FIGS. 35 and 36 may be different from an embodiment of FIGS. 11 and 15 in that the first emission area RE may include a first top emission area TRE and a first bottom emission area BRE, the second emission area GE may include a second top emission area TGE and the second bottom emission area BGE, and the third emission area BE may include a third top emission area TBE and a third bottom emission area BBE.

Referring to FIGS. 35 and 36, the first top emission area TRE may emit light of a first color toward the upper surface of the display panel 300", and the first bottom emission area BRE may emit light of the first color toward the lower surface of the display panel 300". The second top emission area TGE may emit light of a second color toward the upper surface of the display panel 300", and the second bottom emission area BGE may emit light of the second color toward the lower surface of the display panel 300". The third top emission area TBE may emit light of a third color toward the upper surface of the display panel 300", and the third bottom emission area BBE may emit light of the third color toward the lower surface of the display panel 300".

The first light-emitting electrode 171 may include a first subsidiary light-emitting electrode 171*a* and a second subsidiary light-emitting electrode 171*b*. The first subsidiary light-emitting electrode 171*a* may be disposed on the second organic layer 160. A part of the second subsidiary light-emitting electrode 171*b* may be disposed on the second organic layer 160, and the other part thereof may be disposed on the first subsidiary light-emitting electrode 171*a*. The first subsidiary light-emitting electrode 171*a* may be disposed in each of the first top emission area TRE, the second top emission area TGE, and the third top emission area TBE. The second subsidiary light-emitting electrode 171*b* may be formed in each of the first top emission area TRE, the second top emission area TGE, the third top emission area TBE, the first bottom emission area BRE, the second bottom emission area BGE, and the third bottom emission area BBE. The bank 180 may be disposed at an edge of the first subsidiary light-emitting electrode 171*a* and an edge of the second subsidiary light-emitting electrode 171*b*.

The first subsidiary light-emitting electrode 171*a* and the second subsidiary light-emitting electrode 171*b* may include different materials. The first subsidiary light-emitting electrode 171*a* may be made up of a single layer of molybdenum (Mo), titanium (Ti), copper (Cu) or aluminum (Al), or may be made up of a stack structure of aluminum and titanium (Ti/Al/Ti), a stack structure of aluminum and ITO (ITO/Al/ITO), an APC alloy and a stack structure of an APC alloy and ITO (ITO/APC/ITO) in order to increase the reflectivity. The second subsidiary light-emitting electrode 171*b* may be made of a transparent conductive material that can transmit light, such as ITO and IZO.

The emissive layer 172 may be disposed on the second subsidiary light-emitting electrode 171*b*. The second light-emitting electrode 173 may be disposed on the emissive layer 172. The second light-emitting electrode 173 may be made of a transparent conductive material that can transmit light, such as ITO and IZO.

A reflective electrode 179 may be disposed on the second light-emitting electrode 173. The reflective electrode 179 may be disposed in each of the first bottom emission area BRE, the second bottom emission area BGE, and the third bottom emission area BBE. The reflective electrode 179 may be made up of a single layer of molybdenum (Mo), titanium (Ti), copper (Cu) or aluminum (Al), or may be made up of a stack structure of aluminum and titanium (Ti/Al/Ti), a stack structure of aluminum and ITO (ITO/Al/ITO), an APC alloy and a stack structure of an APC alloy and ITO (ITO/APC/ITO) in order to increase the reflectivity.

As shown in FIGS. 35 and 36, in the first top emission area TRE, the second top emission area TGE and the third top emission area TBE, light emitted from the emissive layer 172 may be reflected from the first subsidiary light-emitting electrode 171*a* having a high reflectivity, may pass through the transparent second light-emitting electrode 173, and may exit toward the upper surface of the display panel 300". In the first bottom emission area BRE, the second bottom emission area BGE and the third bottom emission area BBE, light emitted from the emissive layer 172 may be reflected from the reflective electrode 179 having a high reflectivity, may pass through the transparent, second subsidiary light-emitting electrode 171*b*, and may exit toward the lower surface of the display panel 300". Therefore, the display panel 300" may be a dual-emission display panel that outputs light through the upper and lower surfaces thereof.

In FIG. 15, in a case that the first light-emitting electrode 171 is made of a transparent conductive material (TCO) such as ITO and IZO that can transmit light, the light emitted from the emissive layer 172 may pass through the first light-emitting electrode 171 to exit toward the lower surface of the display panel 300" and may pass through the second light-emitting electrode 173 to exit toward the upper surface of the display panel 300". In such case, the display panel 300" may be a dual-emission display panel that outputs light through the upper and lower surfaces thereof.

Figure 37:
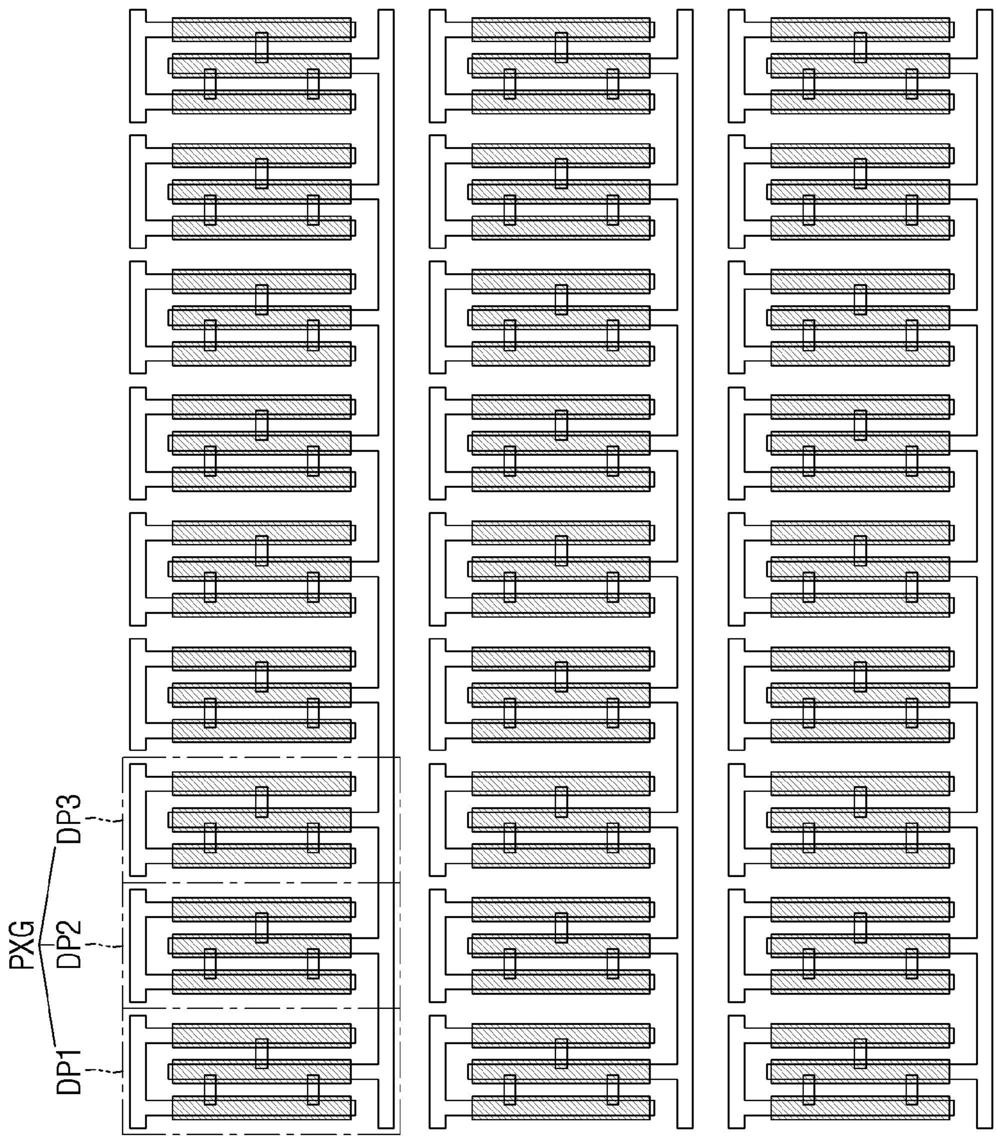
FIG. 37 is a view showing a layout of display pixels in a display area according to an embodiment.
Figure 38:
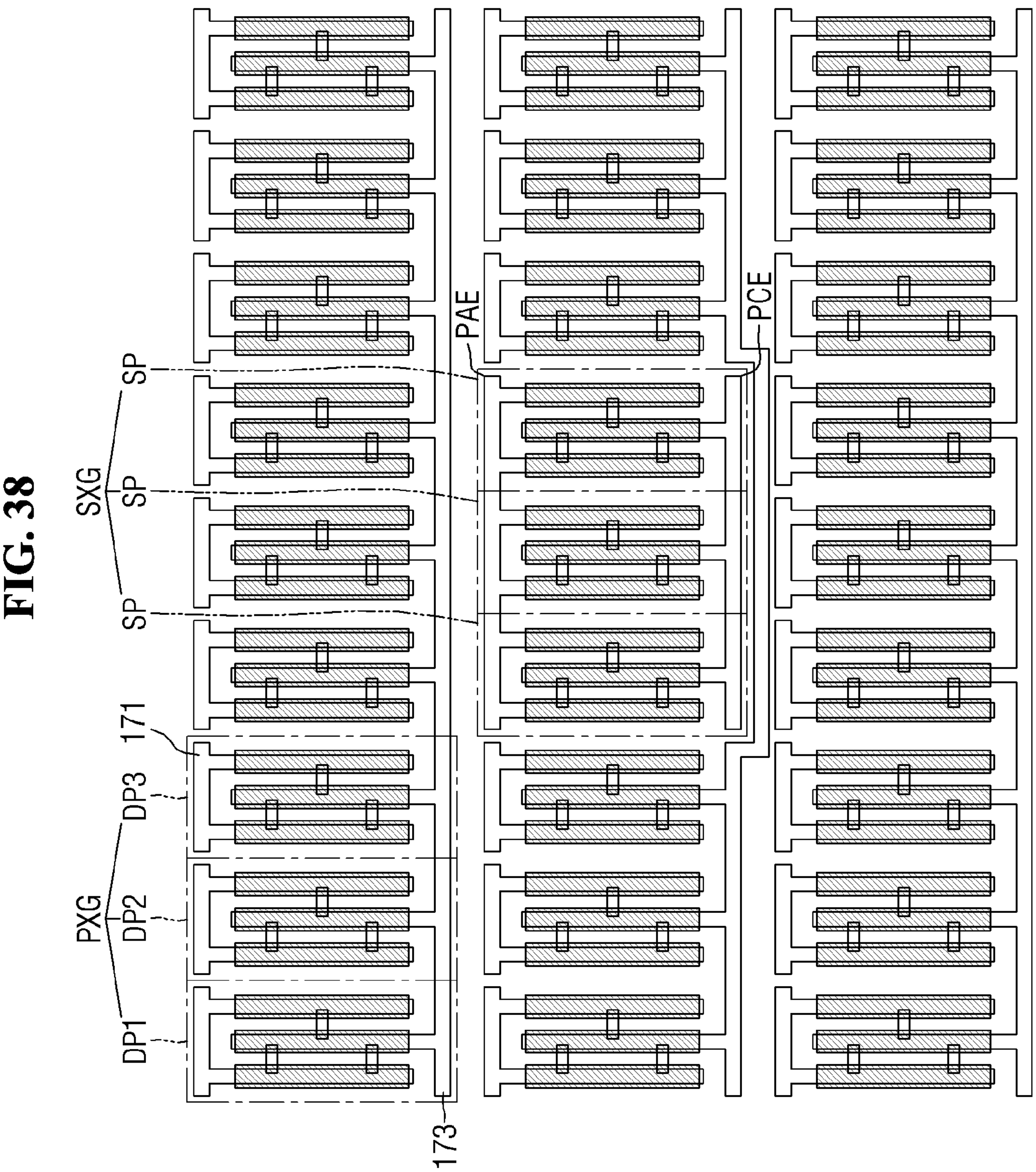
FIG. 38 is a view showing a layout of display pixels and sensor pixels in a sensor area according to an embodiment.
Figure 39:
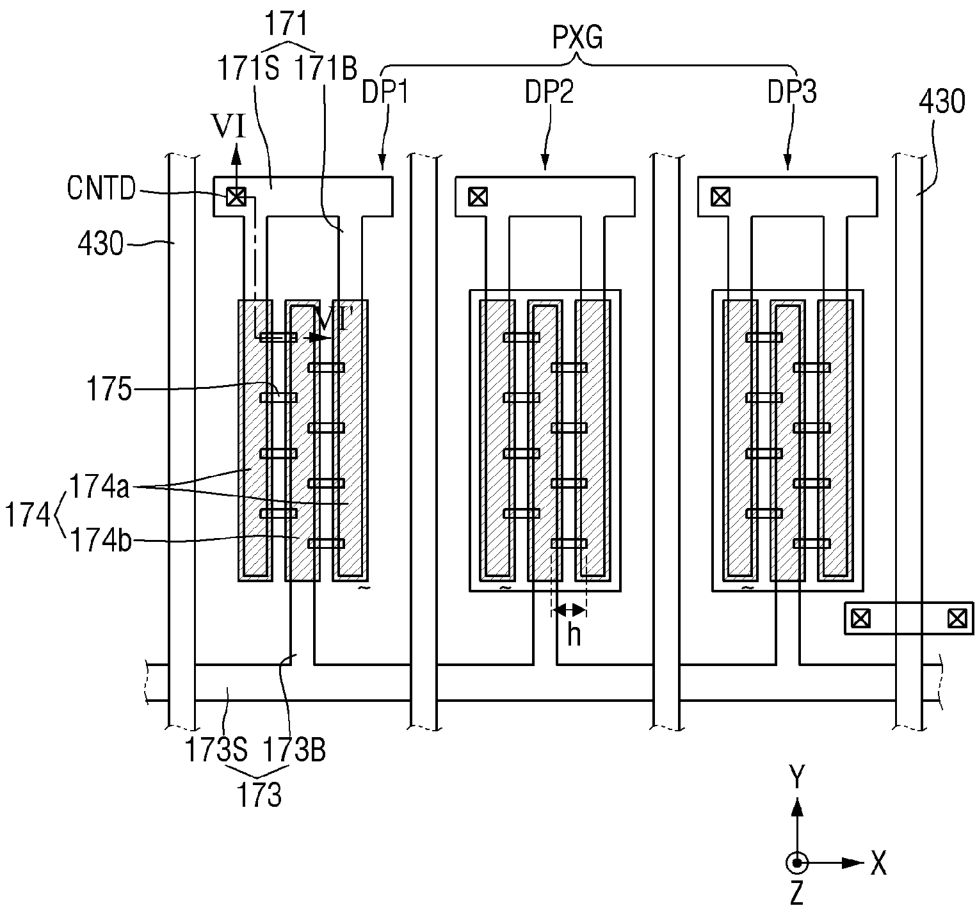
FIG. 39 is an enlarged view showing a layout of the display pixel of FIG. 37.
Figure 40:
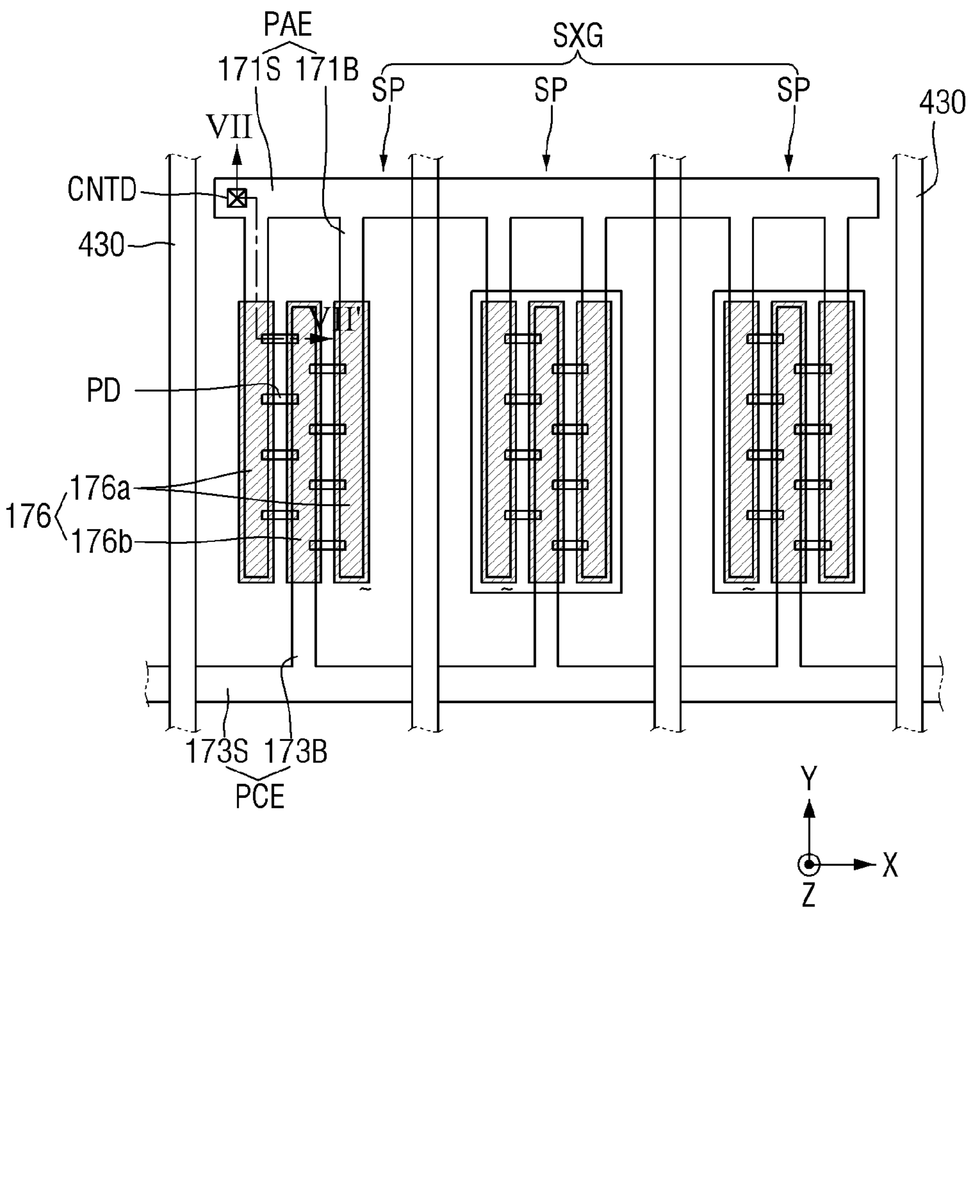
FIG. 40 is an enlarged view showing a layout of the sensor pixel of FIG. 38.

FIG. 37 is a plan view showing display pixels in a display area according to an embodiment. FIG. 38 is a plan view showing display pixels and sensor pixels in a sensor area according to an embodiment. FIG. 39 is an enlarged view showing the display area of FIG. 37. FIG. 40 is an enlarged view showing the sensor area of in FIG. 38.

FIGS. 37 to 40 show a display area and a sensor area of an inorganic light emitting display panel using an inorganic light emitting device including an inorganic semiconductor.

Referring to FIGS. 37 to 40, the display area DA may include display pixel groups PXG. The sensor area SA may include sensor pixels SP as well as the display pixel groups PXG.

Each of the display pixel groups PXG may include a first display pixel DP1, a second display pixel DP2, and a third display pixel DP3. The first display pixel DP1 may include a light emitting element 175 that may emit first light, the second display pixel DP2 may include a light emitting element 175 that may emit second light, and the third display pixel DP3 may include a light emitting element 175 that may emit third light.

As shown in FIGS. 37 and 39, in the display area DA, the first display pixels DP1, the second display pixels DP2 and the third display pixels DP3 may be arranged or disposed sequentially and repeatedly in the first direction (x-axis direction). The first display pixels DP1 may be arranged or disposed side by side in the second direction (y-axis direction), the second display pixels DP2 may be arranged or disposed side by side in the second direction (y-axis direction), and the third display pixels DP3 may be arranged or disposed side by side in the second direction (y-axis direction).

FIGS. 37 to 40 illustrate that three sensor pixels SP arranged or disposed in the first direction (x-axis direction) are defined as a single sensor pixel group SXG. It is, however, to be understood that the disclosure is not limited thereto. The sensor pixel group SXG may include at least one sensor pixel SP. The sensor pixel group SXG may be surrounded by the display pixel groups PXG.

In a case that the sensor area SA is an area that senses light incident from the outside to recognize a fingerprint of a person's finger F, the number of sensor pixels SP may be less than the number of the first display pixels DP1, the number of the second display pixels DP2 and the number of the third display pixels DP3 in the sensor area SA. Since the distance between the ridges RID of the fingerprint of a person's finger F may be approximately 100 μm to 150 μm, the sensor pixel groups SXG may be spaced apart from one another by approximately 100 μm to 450 μm in the first direction (x-axis direction) and the second direction (y-axis direction).

Figure 41:
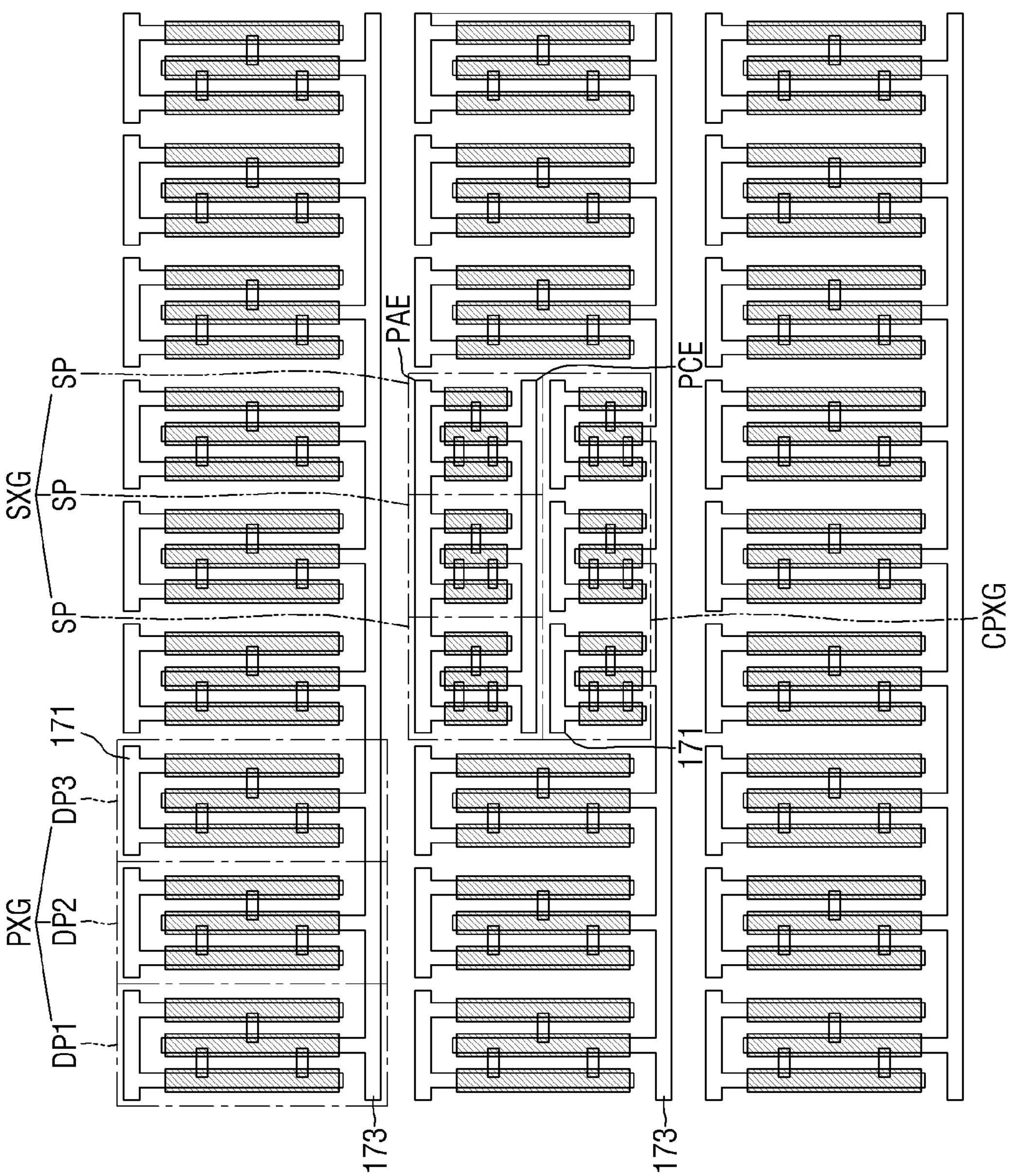
FIG. 41 is a view showing a layout of display pixels and sensor pixels in a sensor area according to another embodiment.

As shown in FIGS. 38 to 40, the area of each of the display pixel group PXG may be substantially equal to the area of each of the sensor pixel group SXG. It is, however, to be understood that the disclosure is not limited thereto. For example, as shown in FIG. 41, the area of the sensor pixel group SXG may be smaller than the area of the display pixel group PXG. In such case, a compensation display pixel group CPXG may be disposed in the remaining region except the sensor pixel group SXG. The area of the compensation display pixel group CPXG may vary depending on the area of the sensor pixel group SXG. As the area of the sensor pixel group SXG increases, the area of the compensation display pixel group CPXG may decrease.

Each of the display pixels DP1, DP2 and DP3 may include a first light-emitting electrode 171, a second light-emitting electrode 173, a light-emitting contact electrode 174, and a light-emitting element 175.

The first light-emitting electrode 171 may be a pixel electrode disposed in each of the display pixels DP1, DP2 and DP3, while the second light-emitting electrode 173 may be a common electrode connected across the display pixels DP1, DP2 and DP3. Alternatively, the first light-emitting electrode 171 may be an anode electrode of the light-emitting element 175, and the second light-emitting electrode 173 may be a cathode electrode of the light-emitting element 175.

The first light-emitting electrode 171 and the second light-emitting electrode 173 may include electrode stems 171S and 173S extended in the first direction (x-axis direction), respectively, and one or more electrode branches 171B and 173B branching off from the electrode stems 171S and 173S, respectively, and extended in the second direction (y-axis direction) intersecting the first direction (x-axis direction).

The first light-emitting electrode 171 may include the first electrode stem 171S extended in the first direction (x-axis direction), and at least one first electrode branch 171B branching off from the first electrode stem 171S and extended in the second direction (y-axis direction).

The first electrode stem 171S of a display pixel may be electrically separated from the first electrode stem 171S of another display pixel adjacent to the display pixel in the first direction (x-axis direction). The first electrode stem 171S of a display pixel may be spaced apart from the first electrode stem 171S of another display pixel adjacent to the display pixel in the first direction (x-axis direction). The first electrode stem 171S may be electrically connected to the thin-film transistor through a first electrode contact hole CNTD.

The first electrode branch 171B may be electrically separated from the second electrode stem 173S in the second direction (y-axis direction). The first electrode branch 171B may be spaced apart from the second electrode stem 173S in the second direction (y-axis direction).

The second light-emitting electrode 173 may include the second electrode stem 173S extended in the first direction (x-axis direction), and a second electrode branch 173B branching off from the second electrode stem 173S and extended in the second direction (y-axis direction).

The second light-emitting electrode 173 of the display pixel group PXG may be disposed to bypass the sensor pixel group SXG as shown in FIG. 38. The second light-emitting electrode 173 of the display pixel group PXG may be electrically separated from the first light-receiving electrode PCE of the sensor pixel group SXG. The second light-emitting electrode 173 of the display pixel group PXG may be spaced apart from the first light-receiving electrode PCE of the sensor pixel group SXG.

The second electrode stem 173S of a display pixel may be electrically connected to the second electrode stem 173S of another display pixel adjacent to the display pixel in the first direction (x-axis direction). The second electrode stem 173S may traverse the display pixels DP1, DP2 and DP3 in the first direction (x-axis direction).

The second electrode branch 173B may be spaced apart from the first electrode stem 171S in the second direction (y-axis direction). The second electrode branch 173B may be spaced apart from the first electrode branch 171B in the first direction (x-axis direction). The second electrode branch 173B may be disposed between the first electrode branches 171B in the first direction (x-axis direction).

Figure 42:
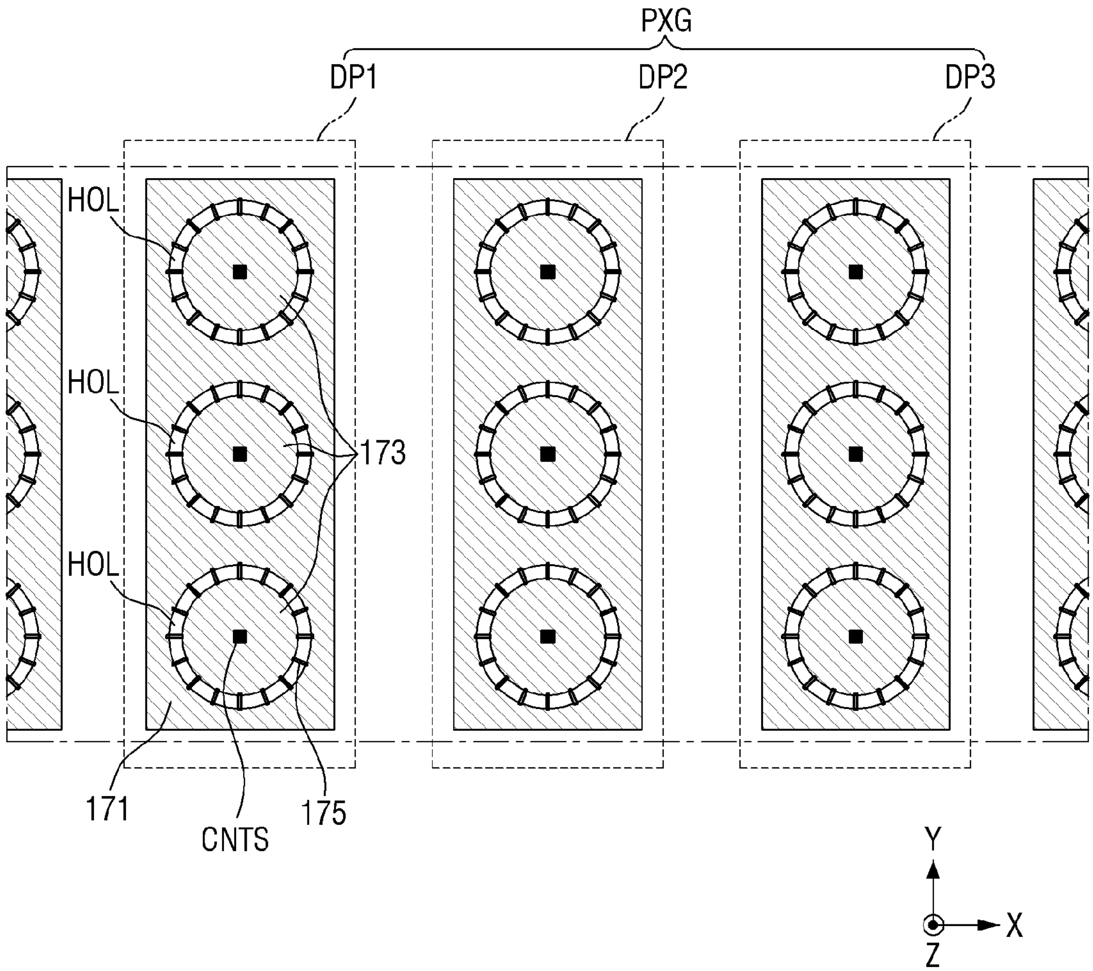
FIG. 42 is a view showing a layout of display pixels and sensor pixels in a sensor area according to another embodiment.

Although FIGS. 37 to 40 show that the first electrode branch 171B and the second electrode branch 173B are extended in the second direction (y-axis direction), but the disclosure is not limited thereto. For example, each of the first electrode branch 171B and the second electrode branch 173B may be partially curved or bent, and as shown in FIG. 42, one electrode may surround the other electrode. In the example shown in FIG. 42, the second light-emitting electrode 173 may have a substantially circular shape, the first light-emitting electrode 171 surrounds the second light-emitting electrode 173, a hole HOL having a substantially ring shape may be formed between the first light-emitting electrode 171 and the second light-emitting electrode 173, and the second light-emitting electrode 173 receives a cathode voltage through a second electrode contact hole CNTS. The shapes of the first electrode branch 171B and the second electrode branch 173B are not particularly limited as long as the first light-emitting electrode 171 and the second light-emitting electrode 173 are at least partially spaced apart from each other so that the light-emitting element 175 may be disposed in the space between the first light-emitting electrode 171 and the second light-emitting electrode 173.

The light-emitting element 175 may be disposed between the first light-emitting electrode 171 and the second light-emitting electrode 173. One end of the light-emitting element 175 may be electrically connected to the first light-emitting electrode 171, and the other end thereof may be electrically connected to the second light-emitting electrode 173. The light-emitting elements 175 may be spaced apart from each other. The light-emitting elements 175 may be arranged or disposed substantially in parallel.

The light-emitting element 175 may have a shape substantially of a rod, a line, a tube, for example, within the spirit and the scope of the disclosure. For example, the light-emitting element 175 may be formed in a substantially cylindrical shape or a substantially rod shape as shown in FIG. 39. It is to be understood that the shape of the light-emitting elements 175 is not limited thereto. The light-emitting elements 175 may have a substantially polygonal column shape such as a cube, a cuboid and a hexagonal column, or a shape that may be extended in a direction with partially inclined outer surfaces. The length h of the light-emitting element 175 may be in a range from about 1 μm to about 10 μm or in a range from about 2 μm to about 6 μm, and by way of example in a range from about 3 μm to about 5 μm. The diameter of the light-emitting element 175 may be in a range from about 300 nm to about 700 nm, and the aspect ratio of the light-emitting element 175 may be in a range from about 1.2 to about 100.

Each of the light emitting elements 175 of the first display pixel DP1 may emit first light, each of the light emitting elements 175 of the second display pixel DP2 may emit second light, and each of the light emitting element 175 of the third display pixel DP3 may emit third light. The first light may be red light having a center wavelength band in a range of 620 nm to 752 nm, the second light may be green light having a center wavelength band in a range of 495 nm to 570 nm, and the third light may be blue light having a center wavelength band in a range of 450 nm to 495 nm. Alternatively, the light-emitting element 175 of the first display pixel DP1, the light-emitting element 175 of the second display pixel DP2 and the light-emitting element 175 of the third display pixel DP3 may emit light of substantially the same color.

The light-emitting contact electrode 174 may include a first contact electrode 174*a* and a second contact electrode 174*b*. The first contact electrode 174*a* and the second contact electrode 174*b* may have a shape extended in the second direction (y-axis direction).

The first contact electrode 174*a* may be disposed on the first electrode branch 171B and electrically connected to the first electrode branch 171B. The first contact electrode 174*a* may be in contact with one end of the light-emitting element 175. The first contact electrode 174*a* may be disposed between the first electrode branch 171B and the light-emitting element 175. Accordingly, the light-emitting element 175 may be electrically connected to the first light-emitting electrode 171 through the first contact electrode 174*a*.

The second contact electrode 174*b* may be disposed on the second electrode branch 173B and electrically connected to the second electrode branch 173B. The second contact electrode 174*b* may be in contact with the other end of the light-emitting element 175. The second contact electrode 174*b* may be disposed between the second electrode branch 173B and the light-emitting element 175. Accordingly, the light-emitting element 175 may be electrically connected to the second light-emitting electrode 173 through the second contact electrode 174*b*.

The width (or length in the first direction (x-axis direction)) of the first contact electrode 174*a* may be greater than the width (or length in the first direction (x-axis direction)) of the first electrode branch 171B, and the width (or length in the first direction (x-axis direction)) of the second contact electrode 174*b* may be greater than the width (or length in the first direction (x-axis direction)) of the second electrode branch 173B.

Outer banks 430 may be disposed between the display pixels DP1, DP2 and DP3 and the sensor pixels SP. The outer banks 430 may be extended in the second direction (y-axis direction). The length of each of the display pixels DP1, DP2 and DP3 in the first direction (x-axis direction) may be defined as the distance between the outer banks 430.

Each of the sensor pixels SP may include a first light-receiving electrode PCE, a second light-receiving electrode PAE, a light-receiving contact electrode 176, and a light-receiving element PD.

Each of the first light-receiving electrode PCE and the second light-receiving electrode PAE may be a common electrode connected across the sensor pixels SP. The first and second light-receiving electrodes PCE and PAE may include electrode stems 171S and 173S and one or more electrode branches 171B and 173B, respectively.

The electrode stems 171S and 173S and the electrode branches 171B and 173B of the first light-receiving electrode PCE and the second light-receiving electrode PAE are substantially identical to the electrode stems 171S and 173S and the electrode branches 171B and 173B of the first light-emitting electrode 171 and the second light-emitting electrode 173; and, therefore, the redundant description will be omitted Similar to the example shown in FIG. 42, the first light-receiving electrode PCE may have a substantially circular shape, the second light-receiving electrode PAE surrounds the first light-receiving electrode PCE, a hole HOL having a substantially ring shape may be formed between the first light-receiving electrode PCE and the second light-receiving electrode PAE, and the first light-receiving electrode PCE receives a cathode voltage through a second electrode contact hole CNTS. The shapes of the first light-receiving electrode PCE and the second light-receiving electrode PAE are not particularly limited as long as the first light-receiving electrode PCE and the second light-receiving electrode PAE are at least partially spaced apart from each other so that the light-receiving element PD may be disposed in the space between the first light-receiving electrode PCE and the second light-receiving electrode PAE.

The light-receiving element PD may be disposed between the first light-receiving electrode PCE and the second light-receiving electrode PAE. One end of the light-receiving element PD may be electrically connected to the first light-receiving electrode PCE, and the other end thereof may be electrically connected to the second light-receiving electrode PAE. The light-receiving elements PD may be spaced apart from one another. The light-receiving elements PD may be arranged or disposed substantially in parallel.

The light-receiving contact electrode 176 may include a first contact electrode 176*a* and a second contact electrode 176*b*. The first contact electrode 176*a* and the second contact electrode 176*b* of the light-receiving contact electrode 176 are identical to the first contact electrode 174*a* and the second contact electrode 174*b* of the light-emitting contact electrode 174; and, therefore, the redundant description will be omitted.

Figure 43:
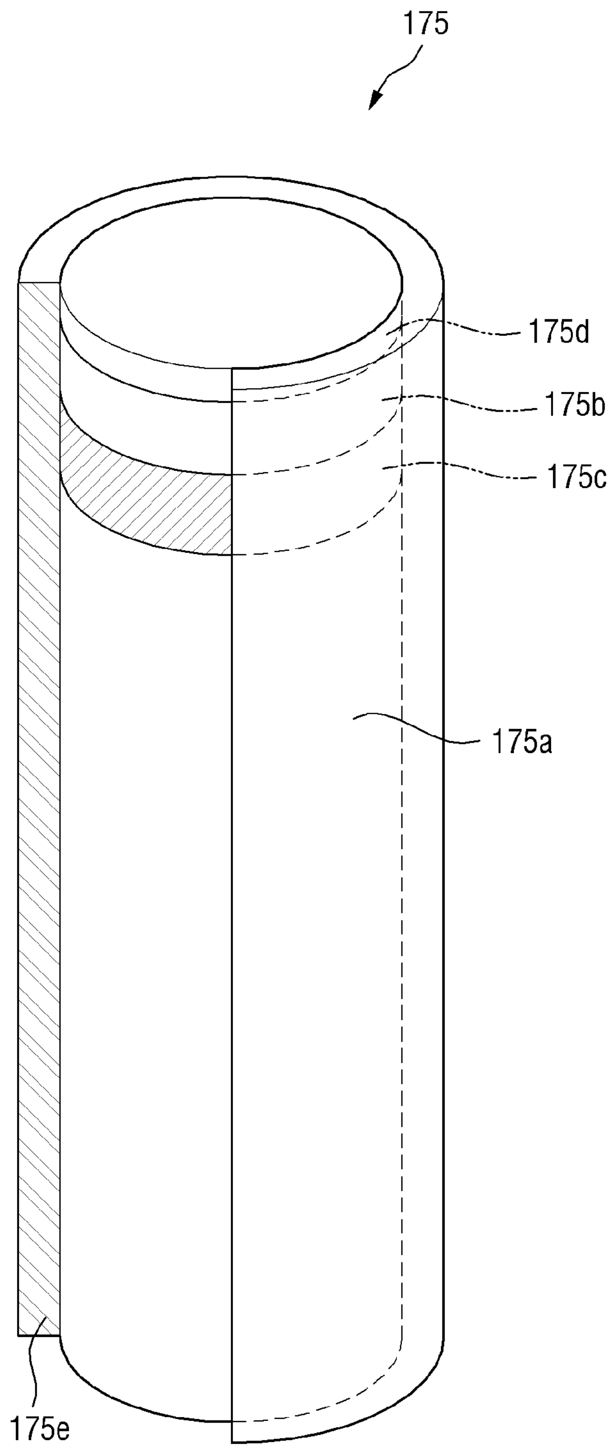
FIG. 43 is a perspective view showing an example of the light-emitting element of FIG. 39 in detail.

FIG. 43 is a perspective view showing an example of the light-emitting element of FIG. 39 in detail.

Referring to FIG. 43, each of the light-emitting elements 175 may include a first semiconductor layer 175*a*, a second semiconductor layer 175*b*, an active layer 175*c*, an electrode layer 175*d*, and an insulating layer 175*e*.

The first semiconductor layer 175*a* may be, for example, an n-type semiconductor having a first conductivity type. The first semiconductor layer 175*a* may be one or more of n-type doped AlGaInN, GaN, AlGaN, InGaN, AlN and InN. For example, in a case that the light-emitting element 175 emits light of a blue wavelength band, the first semiconductor layer 175*a* may include a semiconductor material having Chemical Formula below: $Al_xGa_yIn_{1-x-y}N$ ($0 \leq x \leq 1$, $0 \leq y \leq 1$, $0 \leq x+y \leq 1$). The first semiconductor layer 175*a* may be doped with a first conductivity-type dopant such as Si, Ge and Sn. For example, the first semiconductor layer 175*a* may be n-GaN doped with n-type Si.

The second semiconductor layer 175*b* may be a second conductive-type semiconductor, for example, a p-type semiconductor. The second semiconductor layer 175*b* may be one or more of p-type doped AlGaInN, GaN, AlGaN, InGaN, AlN and InN. For example, in a case that the light-emitting element 175 emits light of a blue or green wavelength band, the second semiconductor layer 175*b* may include a semiconductor material having Chemical Formula below: $Al_xGa_yIn_{1-x-y}N$ ($0 \leq x \leq 1$, $0 \leq y \leq 1$, $0 \leq x+y \leq 1$). The second semiconductor layer 175*b* may be doped with a second conductivity-type dopant such as Mg, Zn, Ca, Se and Ba. According to an embodiment, the second semiconductor layer 175*b* may be p-GaN doped with p-type Mg.

The active layer 175*c* is disposed between the first semiconductor layer 175*a* and the second semiconductor layer 175*b*. The active layer 175*c* may include a material having a single or multiple quantum well structure. In a case that the active layer 175*c* includes a material having the multiple quantum well structure, quantum layers and well layers may be alternately stacked in the structure. Alternatively, the active layer 175*c* may have a structure in which a semiconductor material having a large band gap energy and a semiconductor material having a small band gap energy are alternately stacked one on another, and may include other Group III to Group V semiconductor materials depending on the wavelength range of the emitted light.

The active layer 175*c* can emit light as electron-hole pairs are combined therein in response to an electrical signal applied through the first semiconductor layer 175*a* and the second semiconductor layer 175*b*. The light emitted from the active layer 175*c* is not limited to light in the blue wavelength band. The active layer 175*c* may emit light in the red or green wavelength band. For example, in a case that the active layer 175*c* emits light of the blue wavelength band, it may include a material such as AlGaN and AlGaInN. In a case that the active layer 175*c* has a multi-quantum well structure in which quantum layers and well layers are alternately stacked one on another, the quantum layers may include AlGaN or AlGaInN, and the well layers may include a material such as GaN and AlGaN. For example, the active layer 175*c* includes AlGaInN as the quantum layer and AlInN as the well layer, and as described above, the active layer 175*c* may emit blue light having a center wavelength band of 450 nm to 495 nm.

The light emitted from the active layer 175*c* may exit not only through the outer surfaces of the light-emitting element 175 in the radial direction but also through both side surfaces. For example, the direction in which the light emitted from the active layer 175*c* may propagate is not limited to one direction.

The electrode layer 175*d* may be an ohmic contact electrode or a schottky contact electrode. The light-emitting element 175 may include at least one electrode layer 175*d*. In a case that the light-emitting element 175 is electrically connected to the first light-emitting electrode 171 or the second light-emitting electrode 173, the resistance between the light-emitting element 175 and the first light-emitting electrode 171 or between the light-emitting element 175 and the second light-emitting electrode 173 may be reduced due to the electrode layer 175*d*. The electrode layer 175*d* may include a conductive metal material such as at least one of aluminum (Al), titanium (Ti), indium (In), gold (Au), silver (Ag), indium tin oxide (ITO), indium zinc oxide (IZO) and indium tin-zinc oxide (ITZO). The electrode layer 175*d* may include a semiconductor material doped with n-type or p-type impurities. The electrode layer 175*d* may include the same or similar material or may include different materials. It is, however, to be understood that the disclosure is not limited thereto.

The insulating layer 175*e* is disposed to surround the outer surfaces of the first semiconductor layer 175*a*, the second semiconductor layer 175*b*, the active layer 175*c*, and the electrode layer 175*d*. The insulating layer 175*e* serves to protect the first semiconductor layer 175*a*, the second semiconductor layer 175*b*, the active layer 175*c*, and the electrode layer 175*d*. The insulating layer 175*e* may be formed to expose both ends of the light-emitting element 175 in the longitudinal direction. For example, one end of the first semiconductor layer 175*a* and one end of the electrode layer 175*d* may not be covered or overlapped by the insulating layer 175*e* but may be exposed. The insulating layer 175*e* may cover or overlap only the outer surface of a part of the first semiconductor layer 175*a* and a part of the second semiconductor layer 175*b*, or may cover or overlap only the outer surface of a part of the electrode layer 175*d*.

The insulating layer 175*e* may include materials having an insulating property such as silicon oxide ($SiO_x$), silicon nitride ($SiN_x$), silicon oxynitride ($SiO_xN_y$), aluminum nitride (AlN) and aluminum oxide ($Al_2O_3$). Accordingly, it may be possible to prevent an electrical short-circuit that may be created in a case that the active layer 175*c* is brought into contact with the first light-emitting electrode 171 and the second light-emitting electrode 173 to which an electrical signal is transmitted. Since the insulating layer 175*e* protects the outer surface of the light-emitting element 175 including the active layer 175*c*, it may be possible to avoid a decrease in luminous efficiency.

The light-receiving element PD may be substantially identical to the light-emitting element 175; and, therefore, the redundant description will be omitted.

Figure 44:
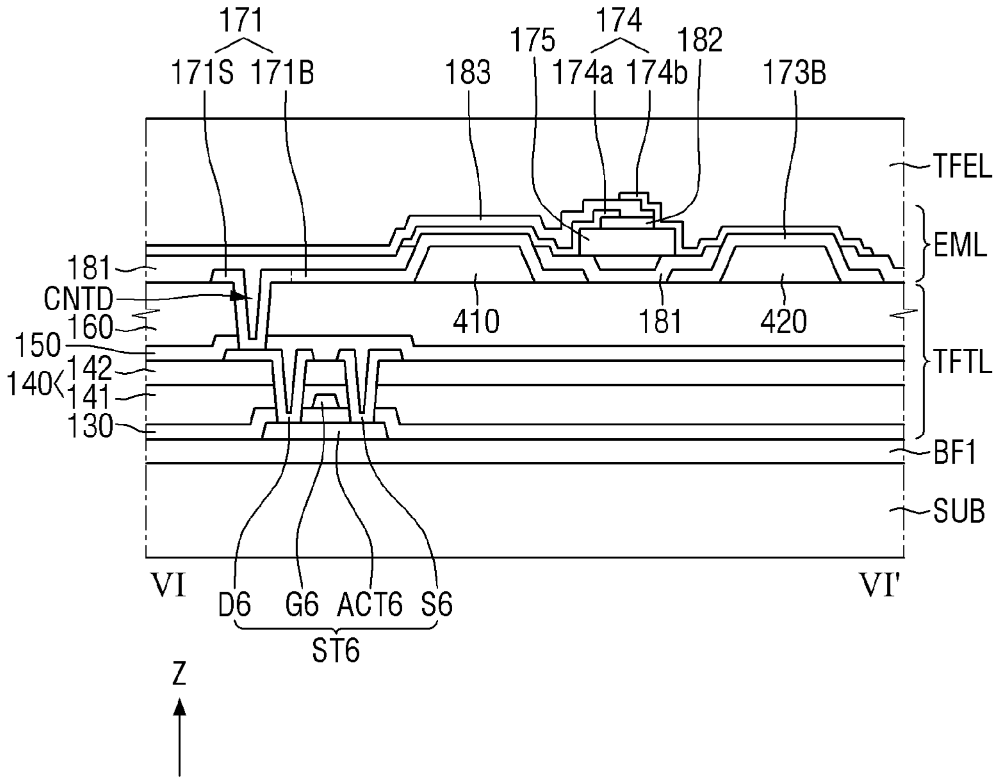
FIG. 44 is a schematic cross-sectional view showing an example of the display pixel of FIG. 39.
Figure 45:
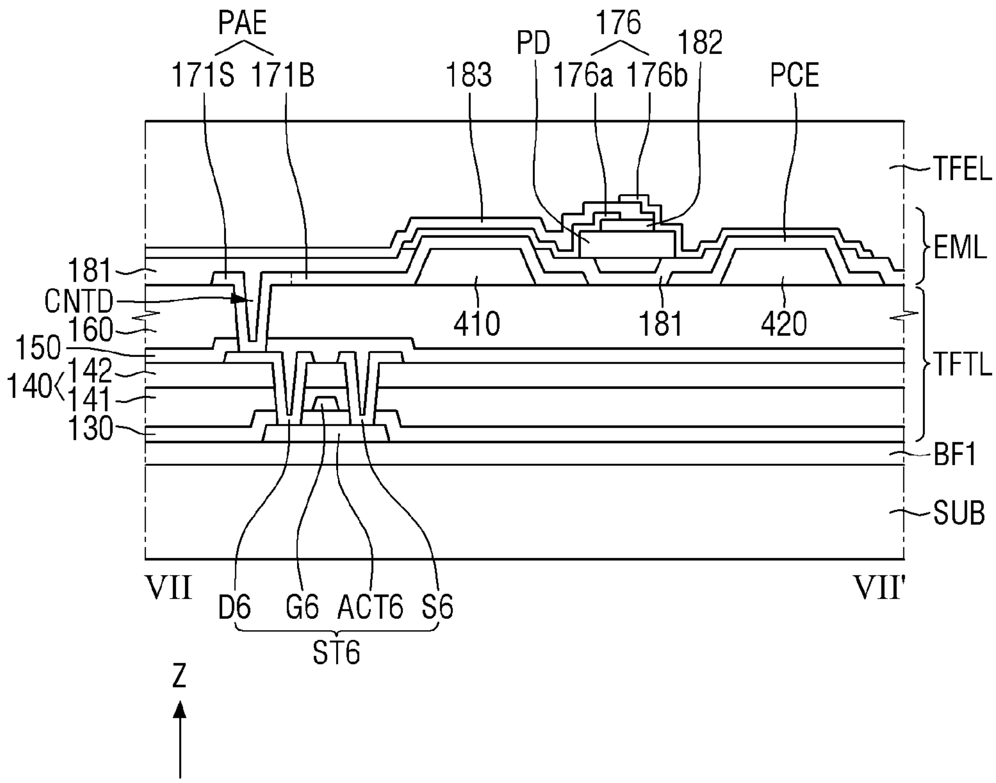
FIG. 45 is a schematic cross-sectional view showing an example of the sensor pixel of FIG. 40.

FIG. 44 is a schematic cross-sectional view showing an example of the display pixel of FIG. 39. FIG. 45 is a schematic cross-sectional view showing an example of the sensor pixel of FIG. 40. FIG. 44 shows a schematic cross section of the first display pixel DP1, taken along line VI-VI' of FIG. 39. FIG. 45 shows a schematic cross section of a part of the sensor pixel SP, taken along line VII-VII' of FIG. 40.

Referring to FIGS. 44 and 45, the display layer DISL may include a thin-film transistor layer TFTL, an emission material layer EML, and an encapsulation layer TFEL disposed on a substrate SUB. The thin-film transistor layer TFTL of FIGS. 44 and 45 may be substantially identical to that described above with reference to FIG. 15.

The emission material layer EML may include a first inner bank 410, a second inner bank 420, a first light-emitting electrode 171, a second light-emitting electrode 173, a light-emitting contact electrode 174, a light-emitting element 175, a light-receiving elements PD, a first light-receiving electrode PCE, a second light-receiving electrode PAE, a light-receiving contact electrode 176, a first insulating layer 181, a second insulating layer 182 and a third insulating layer 183.

The first inner bank 410, the second inner bank 420 and the outer bank 430 may be disposed on a second organic layer 160. The first inner bank 410, the second inner bank 420 and the outer bank 430 may protrude from the upper surface of the second organic layer 160. The first inner bank 410, the second inner bank 420 and the outer bank 430 may have, but is not limited to, a substantially trapezoidal cross-sectional shape. Each of the first inner bank 410, the second inner bank 420 and the outer bank 430 may include a lower surface in contact with the upper surface of the second organic layer 160, an upper surface opposed to the lower surface, and side surfaces between the upper surface and the lower surface. The side surfaces of the first inner bank 410, the side surfaces of the second inner bank 420, and the side surfaces of the outer bank 430 may be inclined.

The first inner bank 410 may be spaced apart from the second inner bank 420. The first inner bank 410 and the second inner bank 420 may be implemented as an organic layer such as an acrylic resin layer, an epoxy resin layer, a phenolic resin layer, a polyamide resin layer, and a polyimide resin layer.

The first electrode branch 171B may be disposed on the first inner bank 410, and the second electrode branch 173B may be disposed on the second inner bank 420. The first electrode branch 171B may be electrically connected to the first electrode stem 171S, and the first electrode stem 171S may be electrically connected to the second electrode D6 of the sixth transistor ST6 in the first electrode contact hole CNTD. Therefore, the first light-emitting electrode 171 may receive a voltage from the second electrode D6 of the sixth transistor ST6.

The first light-emitting electrode 171 and the second light-emitting electrode 173 may include a conductive material having high reflectance. For example, the first light-emitting electrode 171 and the second light-emitting electrode 173 may include a metal such as silver (Ag), copper (Cu) and aluminum (Al). Therefore, some of the lights that are emitted from the light-emitting element 175 and travel toward the first light-emitting electrode 171 and the second light-emitting electrode 173 are reflected off the first light-emitting electrode 171 and the second light-emitting electrode 173, so that they may travel toward the upper side of the light-emitting element 175.

The first insulating layer 181 may be disposed on the first light-emitting electrode 171, the second light-receiving electrode PAE, and the second electrode branch 173B. The first insulating layer 181 may cover or overlap a first electrode stem 171S, a first electrode branch 171B disposed on the side surfaces of the first inner bank 410, and a second electrode branch 173B disposed on the side surfaces of the second inner bank 420. The first electrode branch 171B disposed on the upper surface of the first inner bank 410 and the second electrode branch 173B disposed on the upper surface of the second inner bank 420 may not be covered or overlapped by the first insulating layer 181 but may be exposed. The first insulating layer 181 may be disposed on the outer bank 430. The first insulating layer 181 may be formed of an inorganic layer, for example, a silicon nitride layer, a silicon oxynitride layer, a silicon oxide layer, a titanium oxide layer, or an aluminum oxide layer.

The light-emitting element 175 and the light-receiving element PD may be disposed on the first insulating layer 181 disposed between the first inner bank 410 and the second inner bank 420. One end of the light-emitting element 175 and the light-receiving element PD may be disposed adjacent to the first inner bank 410, while the other end thereof may be disposed adjacent to the second inner bank 420.

The second insulating layer 182 may be disposed on the light-emitting element 175 and the light-receiving element PD. The second insulating layer 182 may be formed of an inorganic layer, for example, a silicon nitride layer, a silicon oxynitride layer, a silicon oxide layer, a titanium oxide layer, or an aluminum oxide layer.

The first contact electrode 174*a* may be disposed on the first electrode branch 171B that may not be covered or overlapped by the first insulating layer 181 but may be exposed and may be in electrical contact with one end of the light-emitting element 175. The first contact electrode 174*a* may also be disposed on the second insulating layer 182.

The first contact electrode 176*a* may be disposed on the first electrode branch 171B that may not be covered or overlapped by the first insulating layer 181 but may be exposed and may be in electrical contact with one end of the light-receiving element PD. The first contact electrode 176*a* may also be disposed on the second insulating layer 182.

The third insulating layer 183 may be disposed on the first contact electrode 174*a* and the first contact electrode 176*a*. The third insulating layer 183 may cover or overlap the first contact electrode 174*a* to electrically separate the first contact electrode 174*a* from the second contact electrode 174*b*. The third insulating layer 183 may cover or overlap the first contact electrode 176*a* to electrically separate the first contact electrode 176*a* from the second contact electrode 176*b*. The third insulating layer 183 may be formed of an inorganic layer, for example, a silicon nitride layer, a silicon oxynitride layer, a silicon oxide layer, a titanium oxide layer, or an aluminum oxide layer.

The second contact electrode 174*b* may be disposed on the second electrode branch 173B that may not be covered or overlapped by the first insulating layer 181 but may be exposed and may be in electrical contact with the other or another end of the light-emitting element 175. The second contact electrode 174*b* may also be disposed on the second insulating layer 182 and the third insulating layer 183.

The second contact electrode 176*b* may be disposed on the second electrode branch 173B that may not be covered or overlapped by the first insulating layer 181 but may be exposed and may be in electrical contact with the other or another end of the light-receiving element PD. The second contact electrode 176*b* may also be disposed on the second insulating layer 182 and the third insulating layer 183.

As shown in FIGS. 37 to 45, the sensor area SA of the display panel 300 may include sensor pixels SP in addition to the display pixels DP1, DP2 and DP3. Therefore, light incident on the upper surface of the display panel 300 may be sensed by the sensor pixels SP of the display panel 300.

Figure 46:
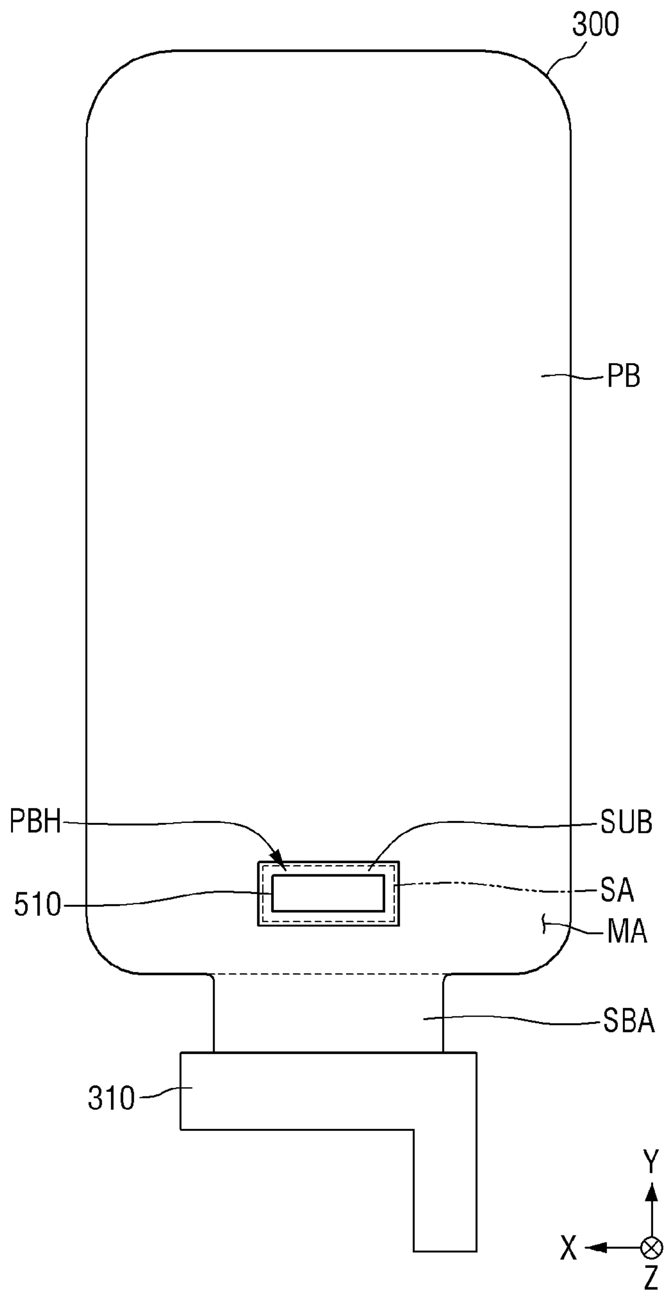
FIGS. 46 and 47 are bottom views showing a display panel according to an embodiment.
Figure 47:
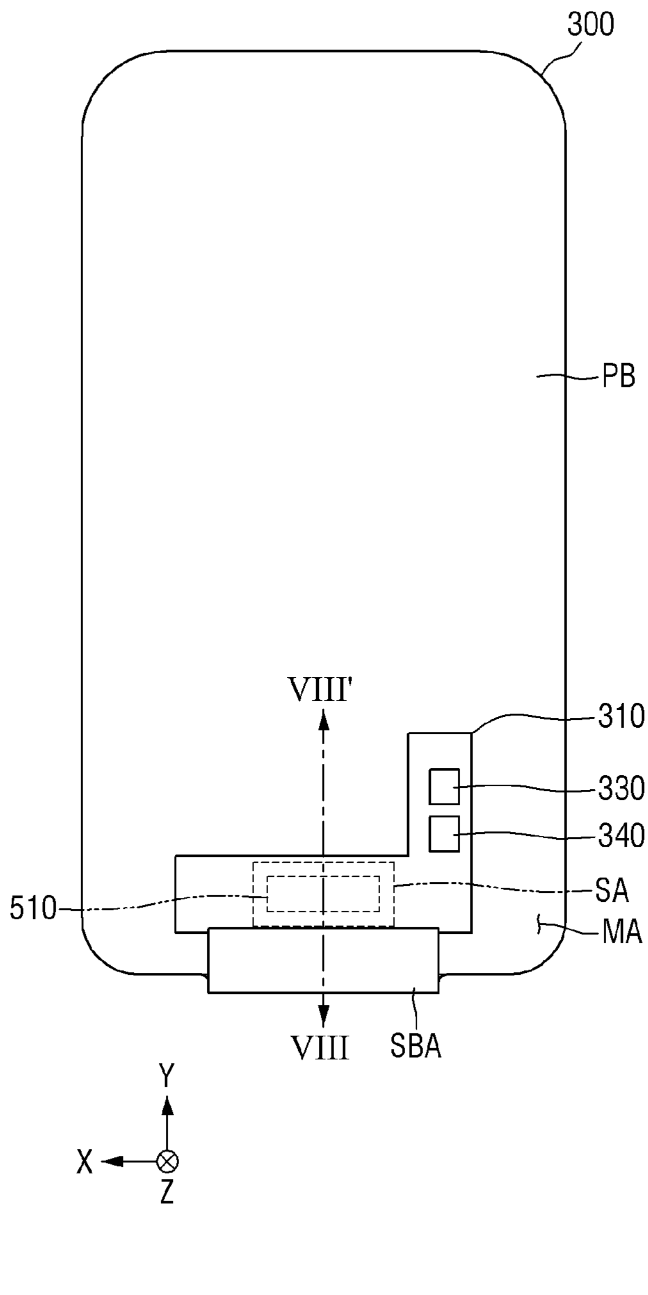
Figure 48:
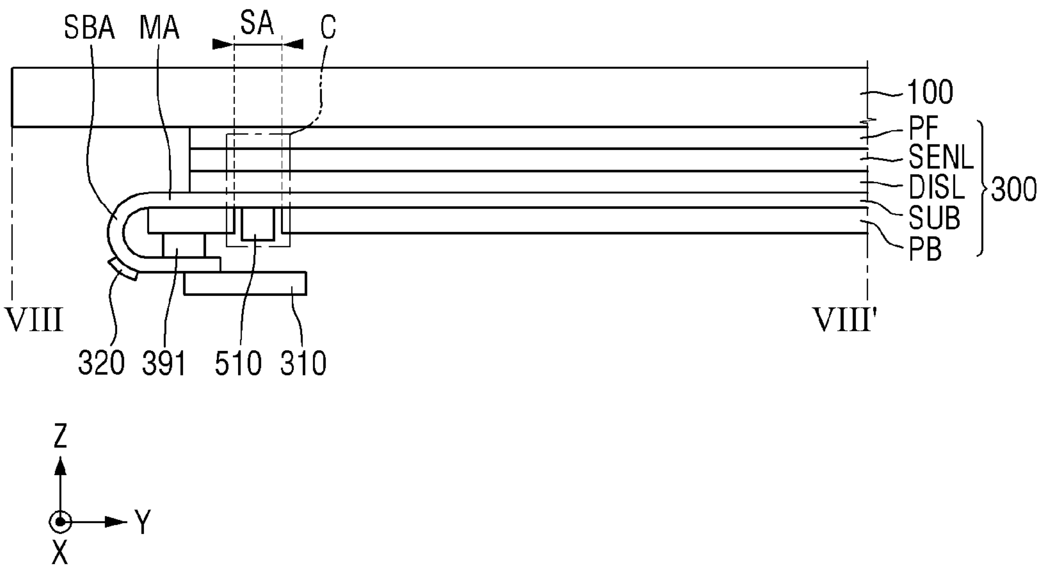
FIG. 48 is a schematic cross-sectional view showing a cover window and a display panel of a display device according to an embodiment.

FIGS. 46 and 47 are bottom views showing a display panel according to an embodiment. FIG. 48 is a schematic cross-sectional view showing a cover window and a display panel of a display device according to an embodiment.

The bottom view of FIG. 46 shows the display panel 300 and a display circuit board 310 in a case that a subsidiary area SBA of a display panel 300 is not bent but is unfolded. The bottom view of FIG. 47 shows the display panel 300 and the display circuit board 310 in a case that the subsidiary area SBA of the display panel 300 is bent so that it is disposed under or below the lower surface of the display panel 300. The schematic cross-sectional view of FIG. 48 shows an example of the cover window 100 and the display panel 300, taken along line VIII-VIII' of FIG. 47.

Referring to FIGS. 46 to 48, a panel bottom cover PB of the display panel 300 includes a cover hole PBH that penetrates through the panel bottom cover PB to expose the substrate SUB of the display panel 300. The panel bottom cover PB may include an opaque material that may not transmit light, such as a heat dissipation unit, and thus an optical sensor 510 may be disposed on the lower surface of the substrate SUB in the cover hole PBH so that the light above the display panel 300 can reach the optical sensor 510 disposed under or below the display panel 300.

The optical sensor 510 may include sensor pixels each including a light-receiving element that detects light. For example, the optical sensor 510 may be an optical fingerprint sensor, an illuminance sensor, or an optical proximity sensor. The sensor pixels of the optical sensor 510 may be substantially identical to those described above with reference to FIG. 14.

In the example shown in FIGS. 46 to 48, in a case that the subsidiary area SBA of the display panel 300 is bent and disposed under or below the lower surface of the display panel 300, the optical sensor 510 overlaps the display circuit board 310 in the thickness direction of the display panel 300 (the z-axis direction). It is, however, to be understood that the disclosure is not limited thereto. In a case that the subsidiary area SBA of the display panel 300 is bent and disposed under or below the lower surface of the display panel 300, the optical sensor 510 may not overlap the display circuit board 310 in the thickness direction of the display panel 300 (the z-axis direction). In other words, the position of the optical sensor 510 is not limited to that shown in FIGS. 46 to 48, and may be disposed anywhere under or below the display panel 300.

As shown in FIGS. 46 to 48, in a case that the optical sensor 510 is disposed in the cover hole PBH of the panel bottom cover PB of the display panel 300 in the sensor area SA, the light incident on the display panel 300 to pass through it is not blocked by the panel bottom cover PB. Therefore, even if the optical sensor 510 is disposed under or below the display panel 300, the light incident on the display panel 300 and passing through the display panel 300 may be sensed.

Figure 49:
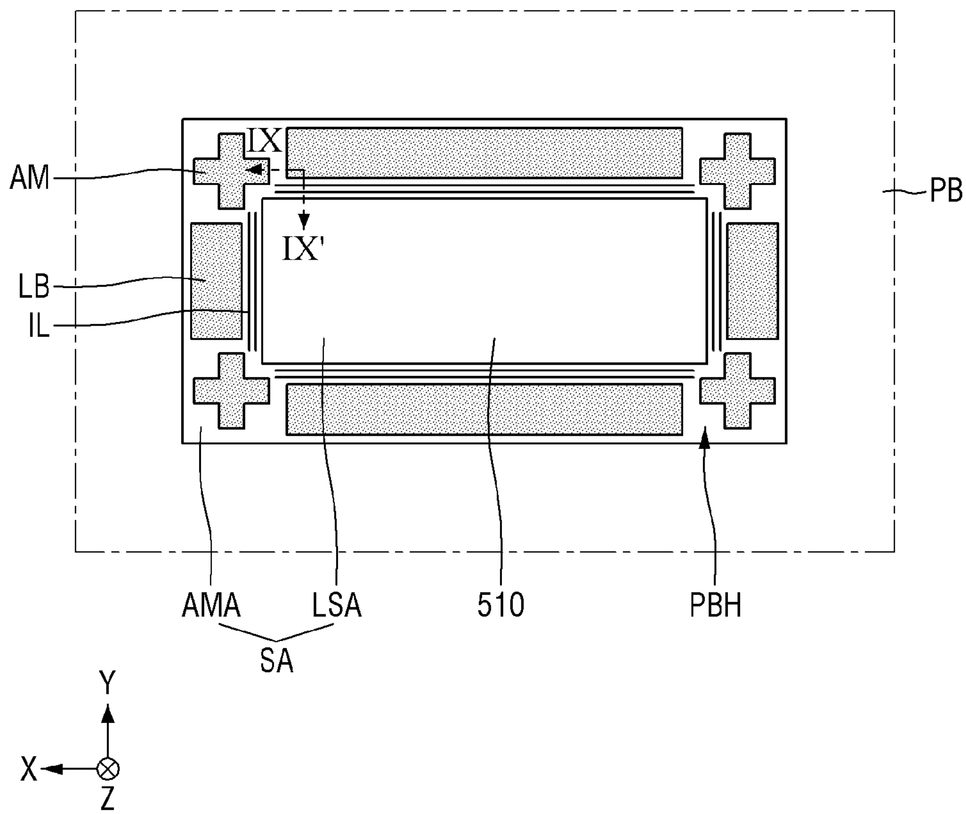
FIG. 49 is an enlarged bottom view showing an example of the sensor area of the display panel of FIG. 46.

FIG. 49 is an enlarged bottom view showing an example of the sensor area of the display panel of FIG. 46.

Referring to FIG. 49, the sensor area SA may include a light sensor area LSA where the optical sensor 510 is disposed, and an alignment pattern area AMA disposed around the light sensor area LSA.

The light sensor area LSA may have a shape substantially conforming to the shape of the optical sensor 510 when viewed from the bottom. For example, in a case that the optical sensor 510 has a substantially quadrangular shape when viewed from the bottom as shown in FIG. 49, the light sensor area LSA may also have a substantially quadrangular shape. Alternatively, when the optical sensor 510 has a shape of other polygonal shape than a quadrangular shape, a circular shape or an elliptical shape when viewed from the bottom, the light sensor area LSA may also have a shape of other polygonal shape than a quadrangular shape, a circular shape or an elliptical shape.

The alignment pattern area AMA may be disposed to surround the light sensor area LSA. For example, the alignment pattern area AMA may have a window frame shape as shown in FIG. 49. The alignment pattern area AMA may include alignment patterns AM, light-blocking patterns LB, and inspection patterns IL. The alignment patterns AM, the light-blocking patterns LB and the inspection patterns IL may be, but is not limited to, opaque metal patterns.

The alignment patterns AM may be used to align the optical sensor 510 to attach the optical sensor 510 to light sensor area LSA. For example, the alignment patterns AM may be recognized by alignment detection means such as a camera so that the optical sensor 510 may be accurately aligned in a case that the optical sensor 510 is attached to the lower surface of the substrate SUB.

The alignment patterns AM may be disposed around or may be adjacent to the optical sensor 510. For example, as shown in FIG. 49, the alignment patterns AM may be disposed at the corners of the sensor area SA, respectively. It is, however, to be understood that the disclosure is not limited thereto. The alignment patterns AM may be disposed at two of the corners of the sensor area SA, respectively.

Each of the alignment patterns AM may not overlap the optical sensor 510 in the third direction (z-axis direction), but the disclosure is not limited thereto. For example, a part of each of the alignment patterns AM may overlap the optical sensor 510 in the third direction (z-axis direction).

Figure 50:
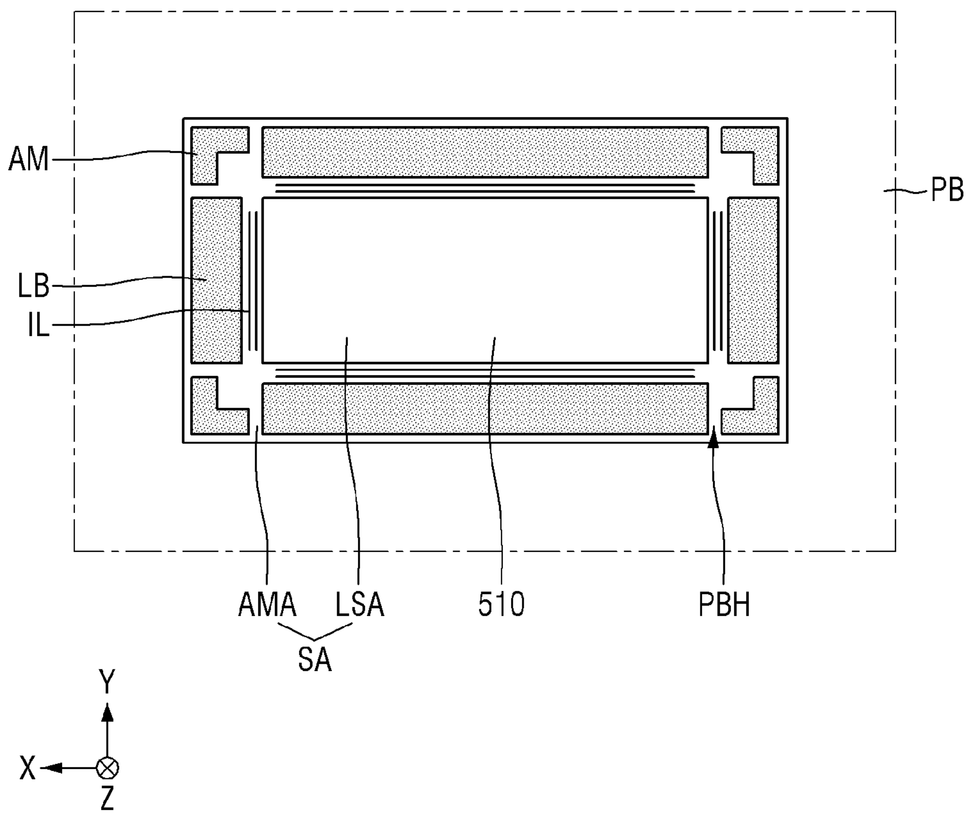
FIG. 50 is an enlarged bottom view showing another example of the sensor area of the display panel of FIG. 46.

In FIG. 49, each of the alignment patterns AM may have a substantially cross shape, but the shape of each of the alignment patterns AM is not limited thereto. For example, each of the alignment patterns AM may have an L-shape that may be bent at least once when viewed from the bottom as shown in FIG. 50.

The light-blocking patterns LB may be disposed between the alignment patterns AM in the first direction (x-axis direction) and may be disposed between the alignment patterns AM in the second direction (y-axis direction). Since the sensor area SA corresponds to the cover hole PBH formed by removing a part of the panel bottom cover PB, light may be introduced into the display layer DISL of the display panel 300 through the cover hole PBH. For example, in a case that light is incident on the alignment pattern area AMA where the optical sensor 510 is not disposed in the cover hole PBH, the optical sensor 510 may be perceived as a stain from above the display panel 300. Therefore, by blocking the light incident on the alignment pattern area AMA by the light-blocking patterns LB, it may be possible to prevent the optical sensor 510 from being seen as a stain from above the display panel 300. As shown in FIG. 49, the light-blocking patterns LB may be spaced apart from the alignment patterns AM, respectively.

The inspection patterns IL may be used to inspect whether the optical sensor 510 is correctly attached. The inspection patterns IL may include longer-side inspection patterns extended in the longer side direction of the optical sensor 510, i.e., in the first direction (x-axis direction), and shorter-side inspection patterns extended in the shorter side direction of the optical sensor 510, i.e., in the second direction (y-axis direction). Alternatively, the longer-side inspection patterns may be arranged or disposed in the second direction (y-axis direction), and the shorter-side inspection patterns may be arranged or disposed in the first direction (x-axis direction).

Some or a predetermined number of the longer-side inspection patterns and some or a predetermined number of the shorter-side inspection patterns may overlap the optical sensor 510 in the third direction (z-axis direction). Accordingly, it may be possible to determine whether the optical sensor 510 is correctly attached to the sensor area SA by checking the number of the longer-side inspection patterns that do not overlap the optical sensor 510 and the number of the shorter-side inspection patterns that do not overlap the optical sensor 510 by using a camera inspection module such as a vision inspection module.

For example, after the optical sensor 510 is attached, it may be determined whether the optical sensor 510 is skewed to either the left side or the right side by comparing the number of shorter-side inspection patterns seen on the left side of the optical sensor 510 with the number of shorter-side inspection patterns seen on the right side of the optical sensor 510. For example, if the number of shorter-side inspection patterns seen on the left side of the optical sensor 510 is three while the number of shorter-side inspection patterns seen on the right side of the optical sensor 510 is one, it may be determined that the optical sensor 510 is skewed to the right side.

After the optical sensor 510 is attached, it may be determined whether the optical sensor 510 is skewed to either the upper side or the lower side by comparing the number of longer-side inspection patterns seen on the upper side of the optical sensor 510 with the number of longer-side inspection patterns seen on the lower side of the optical sensor 510. For example, if the number of longer-side inspection patterns seen on the upper side of the optical sensor 510 is three while the number of longer-side inspection patterns seen on the lower side of the optical sensor 510 is one, it may be determined that the optical sensor 510 is skewed to the lower side.

Figure 51:
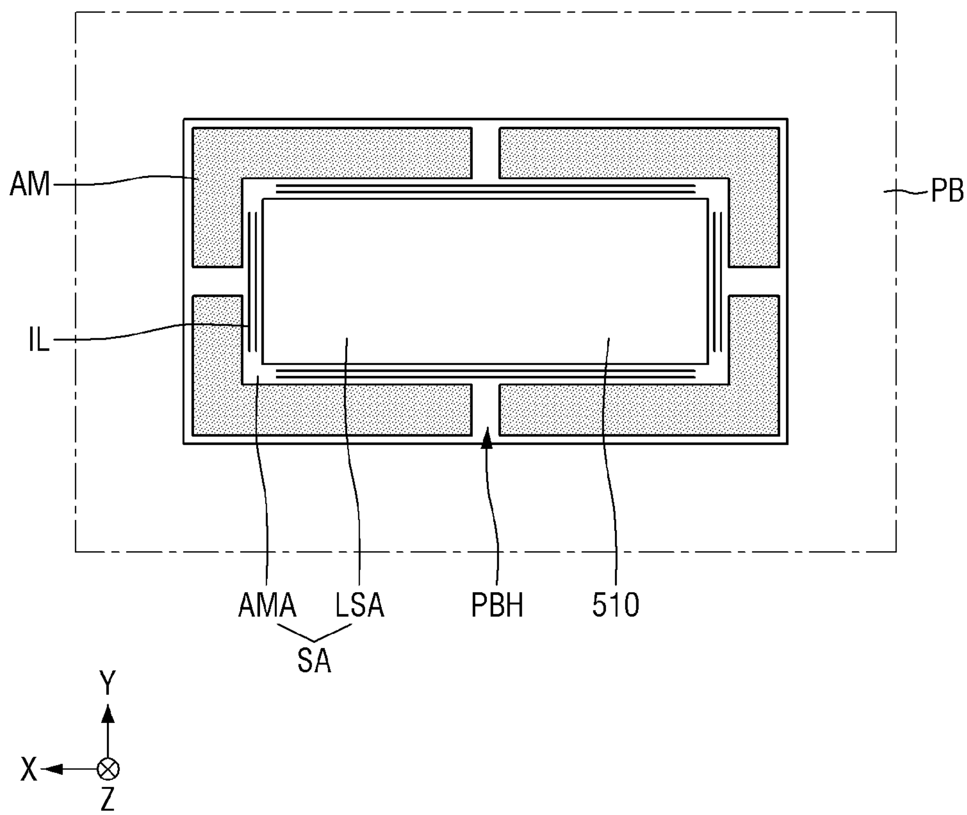
FIG. 51 is an enlarged bottom view showing another example of the sensor area of the display panel of FIG. 46.

FIG. 51 is an enlarged bottom view showing another example of the sensor area of the display panel of FIG. 46.

Referring to FIG. 51, each of the alignment patterns AM may have an L-shape that may be bent at least once when viewed from the top. The alignment patterns AM may be disposed on the outer side of at least two sides of the optical sensor 510.

As shown in FIG. 51, the alignment patterns AM may cover or overlap most of the alignment pattern area AMA, and thus it may be possible to block the light incident on the alignment pattern area AMA by the alignment patterns AM. Therefore, it may be possible to prevent the optical sensor 510 from being perceived as a stain from above the display panel 300. The light-blocking patterns LB may be spaced apart from one another.

Figure 52:
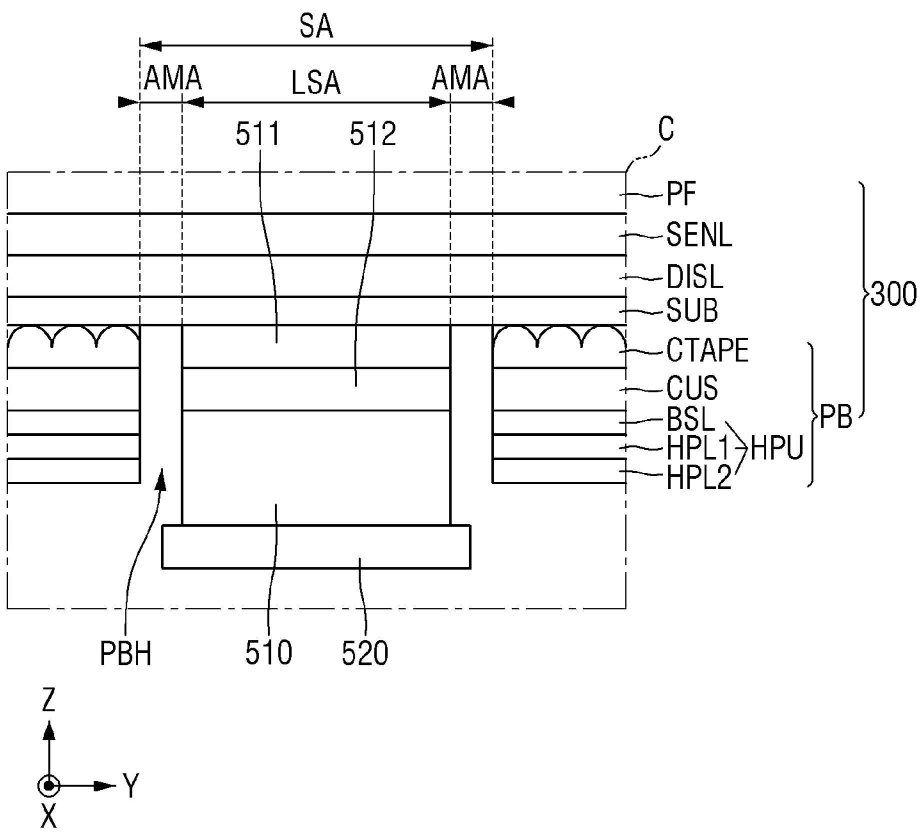
FIG. 52 is a schematic cross-sectional view showing an example of the display panel and the optical sensor of FIG. 48.

FIG. 52 is a schematic cross-sectional view showing an example of the display panel and the optical sensor of FIG. 48. FIG. 52 is an enlarged schematic cross-sectional view showing area C of FIG. 48.

Referring to FIG. 52, a panel bottom cover PB may be disposed on the lower surface of the substrate SUB. The panel bottom cover PB may include an adhesive member CTAPE, a cushion member CUS, and a heat dissipation unit HPU.

The adhesive member CTAPE may be attached to the lower surface of the substrate SUB. In a case that the upper surface of the adhesive member CTAPE facing the lower surface of the substrate SUB may be embossed as shown in FIG. 52, the adhesive member CTAPE may have a shock-absorbing effect. The adhesive member CTAPE may be a pressure-sensitive adhesive.

The cushion member CUS may be disposed on the lower surface of the adhesive member CTAPE. The cushion member CUS may be attached to the lower surface of the adhesive member CTAPE. The cushion member CUS can absorb an external impact to prevent the display panel 300 from being damaged. The cushion member CUS may be formed of a polymer resin such as polyurethane, polycarbonate, polypropylene and polyethylene, or may be formed of a material having elasticity such as a rubber and a sponge obtained by foaming a urethane-based material or an acrylic-based material.

The heat dissipation unit HPU may be disposed on the lower surface of the cushion member CUS. The heat dissipation unit HPU may be attached to the lower surface of the cushion member CUS. The heat dissipation unit HPU may include a base layer BSL, a first heat-dissipating layer HPL1 and a second heat-dissipating layer HPL2. The base layer BSL may be made of a plastic film or glass. The first heat-dissipating layer HPL1 may include graphite or carbon nanotubes to block electromagnetic waves. The second heat-dissipating layer HPL2 may be formed as a metal thin film, such as copper thin film, nickel thin film, ferrite thin film and silver thin film, which have excellent thermal conductivity in order to dissipate heat.

The panel bottom cover PB may include the cover hole PBH that penetrates the adhesive member CTAPE, the cushion member CUS and the heat dissipation unit HPU to expose the lower surface of the substrate SUB. The optical sensor 510 may be disposed in the cover hole PBH. Therefore, the optical sensor 510 may not overlap the panel bottom cover PB in the third direction (z-axis direction).

The transparent adhesive member 511 may be disposed between the optical sensor 510 and the substrate SUB to attach the optical sensor 510 to the lower surface of the substrate SUB. The transparent adhesive member 511 may be either an optically clear adhesive (OCA) layer or an optically clear resin (OCR). In a case that the transparent adhesive member 511 is a transparent adhesive resin, it may be a thermosetting resin that may be coated on the lower surface of the substrate SUB and then may be cured by thermal curing. Alternatively, the transparent adhesive member 511 may be an ultraviolet curable resin.

A pin hole array 512 may be formed between the optical sensor 510 and the transparent adhesive member 511. The pin hole array 512 may include pin holes respectively overlapping with the light-receiving areas LE of the optical sensor 510 in the third direction (z-axis direction). In each of the light-receiving areas LE of the optical sensor 510, the light-receiving element FD of the sensor pixel FP may be disposed. The light-receiving areas LE of the optical sensor 510 receive light having passed through the pin holes of the pin hole array 512, and thus it may be possible to suppress noise light from being incident on the light-receiving areas LE of the optical sensor 510. The pin hole array 512 may be eliminated.

The optical sensor 510 may be disposed on the lower surface of the pin hole array 512. The optical sensor 510 may be attached to the lower surface of the pin hole array 512, and an adhesive member may be disposed between the pin hole array 512 and the optical sensor 510.

A sensor circuit board 520 may be disposed on the lower surface of the optical sensor 510. The optical sensor 510 may be attached to the upper surface of the sensor circuit board 520 and may be electrically connected to lines of the sensor circuit board 520. The sensor circuit board 520 may be electrically connected to the display circuit board 310. Therefore, the optical sensor 510 may be electrically connected to the sensor driver 340 disposed on the display circuit board 310 through the sensor circuit board 520. The sensor circuit board 520 may be a flexible printed circuit board.

Figure 53:
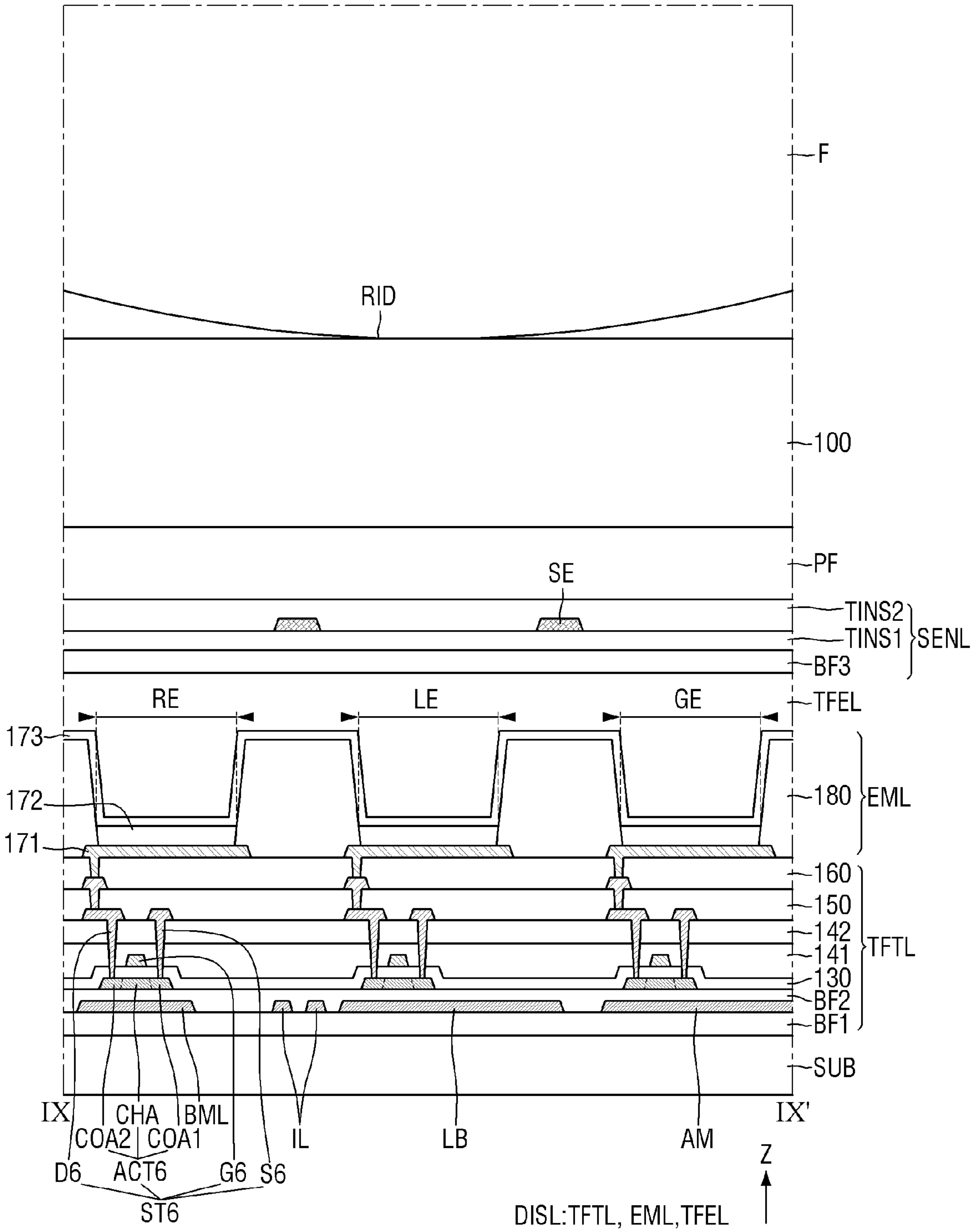
FIG. 53 is a schematic cross-sectional view showing an example of a substrate, a display layer, and a sensor electrode layer of the display panel, and a light-receiving area of the optical sensor of FIG. 52.

FIG. 53 is a schematic cross-sectional view showing an example of a substrate, a display layer and a sensor electrode layer of the display panel, and a light-receiving area of the optical sensor of FIG. 52. FIG. 53 shows an example of the substrate SUB, the display layer DISL and the sensor electrode layer SENL of the display panel 300 and the light-receiving area LE of the optical sensor 510, taken along line IX-IX' of FIG. 49.

Referring to FIG. 53, the alignment pattern AM, the inspection pattern IL and the light-blocking pattern LB may be disposed on the same layer and may be made of the same or similar material as the first light-blocking layer BML. For example, the alignment pattern AM, the inspection pattern IL and the light-blocking pattern LB may be disposed on the first buffer layer BF1. The alignment pattern AM, the inspection pattern IL and the light-blocking pattern LB may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. Alternatively, the first light-blocking layer BML may be an organic layer including a black pigment.

Each of the alignment pattern AM, the inspection pattern IL and the light-blocking pattern LB in the alignment pattern area AMA may overlap the respective active layers ACT6 in the third direction (z-axis direction). Accordingly, the light incident through the substrate SUB may be blocked by the alignment pattern AM, the inspection pattern IL and the light-blocking pattern LB in the alignment pattern area AMA, so that it may be possible to prevent a leakage current from flowing in the active layers ACT6 due to the light incident through the substrate SUB.

Alternatively, the alignment pattern AM, the inspection pattern IL and the light-blocking pattern LB may be disposed on the same layer and may be made of the same or similar material as one of the first light-blocking layer BML, the active layer ACT6, a gate electrode G6, a first electrode S6, a first connection electrode ANDE1 and a first light-emitting electrode 171. Alternatively, the alignment pattern AM, the inspection pattern IL and the light-blocking pattern LB may be disposed on the substrate SUB, and the first buffer layer BF1 may be disposed on the alignment pattern AM, the inspection pattern IL and the light-blocking pattern LB.

A predetermined voltage may be applied to the first light-blocking layer BML, the alignment pattern AM, the inspection pattern IL, and the light-blocking pattern LB. For example, the first supply voltage of the first supply voltage line VDDL shown in FIG. 13 may be applied to the first light-blocking layer BML, the alignment pattern AM, the inspection pattern IL, and the light-blocking pattern LB. In such case, the voltage applied to the first light-blocking layer BML, the alignment pattern AM, the inspection pattern IL and the light-blocking pattern LB may be approximately 4.6V.

As shown in FIG. 53, in a case that the alignment pattern AM, the inspection pattern IL and the light-blocking pattern LB are disposed on the same layer as one of the first light-blocking layer BML, the active layer ACT6, the gate electrode G6, the first electrode S6, the first connection electrode ANDE1 and the first light-emitting electrode 171, the alignment pattern AM, the inspection pattern IL and the light-blocking pattern LB may be formed without any additional process.

Figure 54:
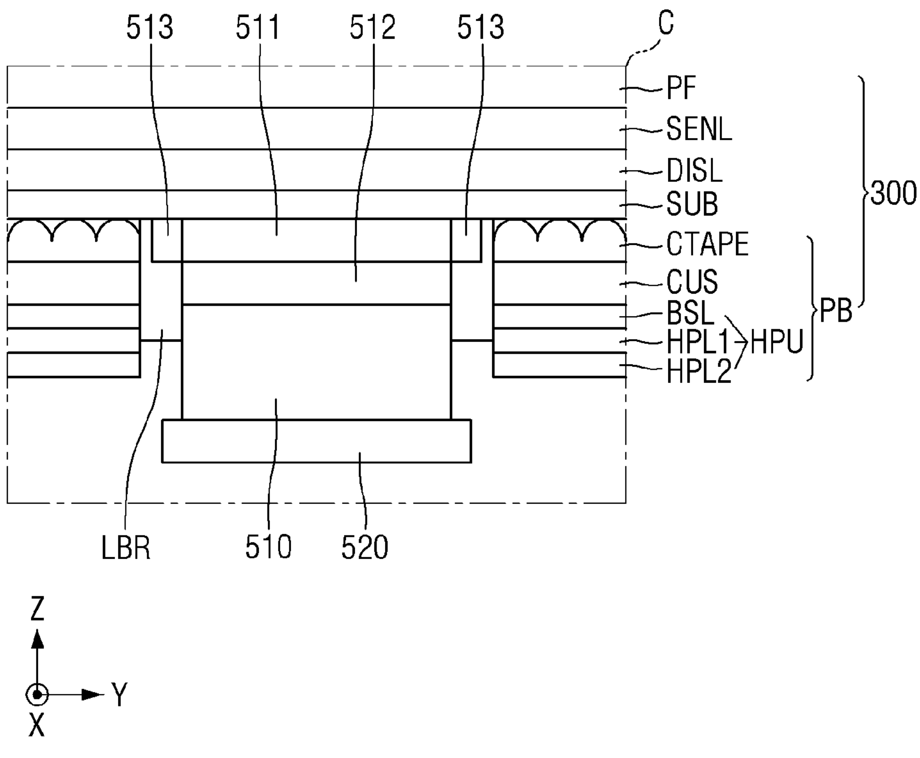
FIG. 54 is an enlarged, schematic cross-sectional view showing another example of the display panel and the optical sensor of FIG. 48.

FIG. 54 is an enlarged, schematic cross-sectional view showing another example of the display panel and the optical sensor of FIG. 48. The schematic cross-sectional view of FIG. 54 shows another example of the area C of FIG. 48.

An embodiment of FIG. 54 may be different from an embodiment of FIG. 52 in that a light-blocking adhesive member 513 may be attached to the alignment pattern area AMA. The light-blocking adhesive member 513 may be a light-blocking adhesive layer 513.

Referring to FIG. 54, the light-blocking adhesive member 513 may be attached to the lower surface of the substrate SUB in the alignment pattern area AMA. The light-blocking adhesive member 513 may not overlap the optical sensor 510 in the third direction (z-axis direction). The light-blocking adhesive member 513 may include a black dye or a black pigment that can block light. The light-blocking adhesive member 513 may be a pressure-sensitive adhesive and may be a black tape.

Although the light-blocking adhesive member 513 is extended from the edge of the transparent adhesive member 511 in the example shown in FIG. 54, the disclosure is not limited thereto. The light-blocking adhesive member 513 may be spaced apart from the transparent adhesive member 511.

A light-blocking resin LBR may be disposed on the lower surface of the light-blocking adhesive member 513. The light-blocking resin LBR may be a resin including a black dye or a black pigment that can block light. The light-blocking resin LBR may be an ultraviolet curable resin or a heat curable resin. The light-blocking resin LBR may be formed by jetting a light-blocking resin material through a spray nozzle. Alternatively, the light-blocking resin LBR may be formed by dispensing a light-blocking resin material through applying a nozzle.

The light-blocking resin LBR may be disposed in a space between the light-blocking adhesive member 513 and the panel bottom cover PB. The light-blocking resin LBR may be in contact with the lower surface of the substrate SUB in the space between the light-blocking adhesive member 513 and the panel bottom cover PB. The light-blocking resin LBR may be in contact with the side surfaces of the pin hole array 512 and the optical sensor 510. The light-blocking resin LBR may be in contact with the side surfaces of the adhesive member CTAPE, the cushion member CUS and the heat dissipation unit HPU of the panel bottom cover PB.

As shown in FIG. 54, since the light incident on the alignment pattern area AMA may be completely blocked by the light-blocking adhesive member 513 and the light-blocking resin LBR, it may be possible to prevent the light sensor 510 from being perceived from above the display panel 300.

In a case that the light-blocking adhesive member 513 and the light-blocking resin LBR are disposed in the alignment pattern area AMA, the light-blocking pattern LB shown in FIGS. 49 and 50 may be eliminated.

Figure 55:
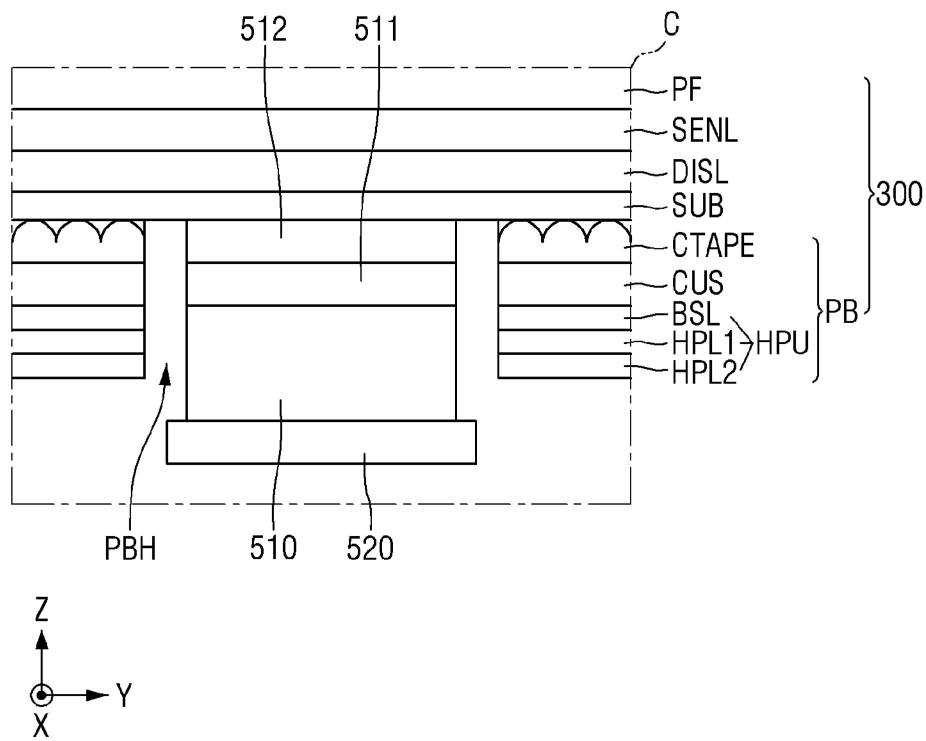
FIG. 55 is an enlarged, schematic cross-sectional view showing another example of the display panel and the optical sensor of FIG. 48.

FIG. 55 is an enlarged, schematic cross-sectional view showing another example of the display panel and the optical sensor of FIG. 48. The schematic cross-sectional view of FIG. 55 shows another example of the area C of FIG. 48.

An embodiment of FIG. 55 may be different from an embodiment of FIG. 52 in that a pin hole array 512 may be formed on the lower surface of the substrate SUB, and a transparent adhesive member 511 may be disposed on the lower surface of the pin hole array 512. In such case, an adhesive member for attaching the pin hole array 512 on the lower surface of the substrate SUB may be added.

Figure 56:
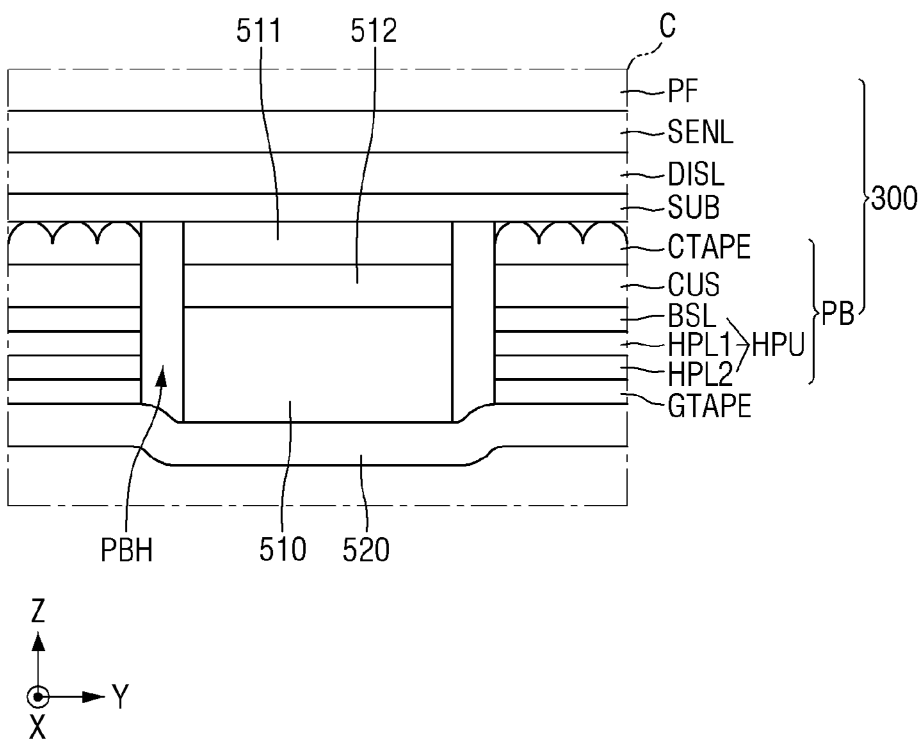
FIG. 56 is an enlarged, schematic cross-sectional view showing another example of the display panel and the optical sensor of FIG. 48.

FIG. 56 is an enlarged, schematic cross-sectional view showing another example of the display panel and the optical sensor of FIG. 48. The schematic cross-sectional view of FIG. 56 shows another example of the area C of FIG. 48.

An embodiment of FIG. 56 may be different from an embodiment of FIG. 52 in that a sensor circuit board 520 may be disposed to cover or overlap the alignment pattern area AMA.

Referring to FIG. 56, the sensor circuit board 520 may be disposed to cover or overlap the cover hole PBH of the panel bottom cover PB. For example, the length of the sensor circuit board 520 may be greater than the length of the cover hole PBH in the first direction (x-axis direction), and the length of the sensor circuit board 520 may be greater than the length of the cover hole PBH in the second direction (y-axis direction). As a result, the sensor circuit board 520 may block light from being incident on the alignment pattern area AMA. Therefore, it may be possible to prevent the optical sensor 510 from being perceived as a stain from above the display panel 300.

The sensor circuit board 520 may be disposed on the lower surface of the heat dissipation unit HPU. The sensor circuit board 520 may be attached to the lower surface of the heat dissipation unit HPU via an adhesive member GTAPE. In a case that the sensor circuit board 520 is a flexible printed circuit board, the sensor circuit board 520 may be attached to the lower surface of the heat dissipation unit HPU by bending the end of the sensor circuit board 520 as shown in FIG. 56. In such case, the sensor circuit board 520 can more effectively prevent light from being incident into the space between the panel bottom cover PB and the optical sensor 510.

Figure 57:
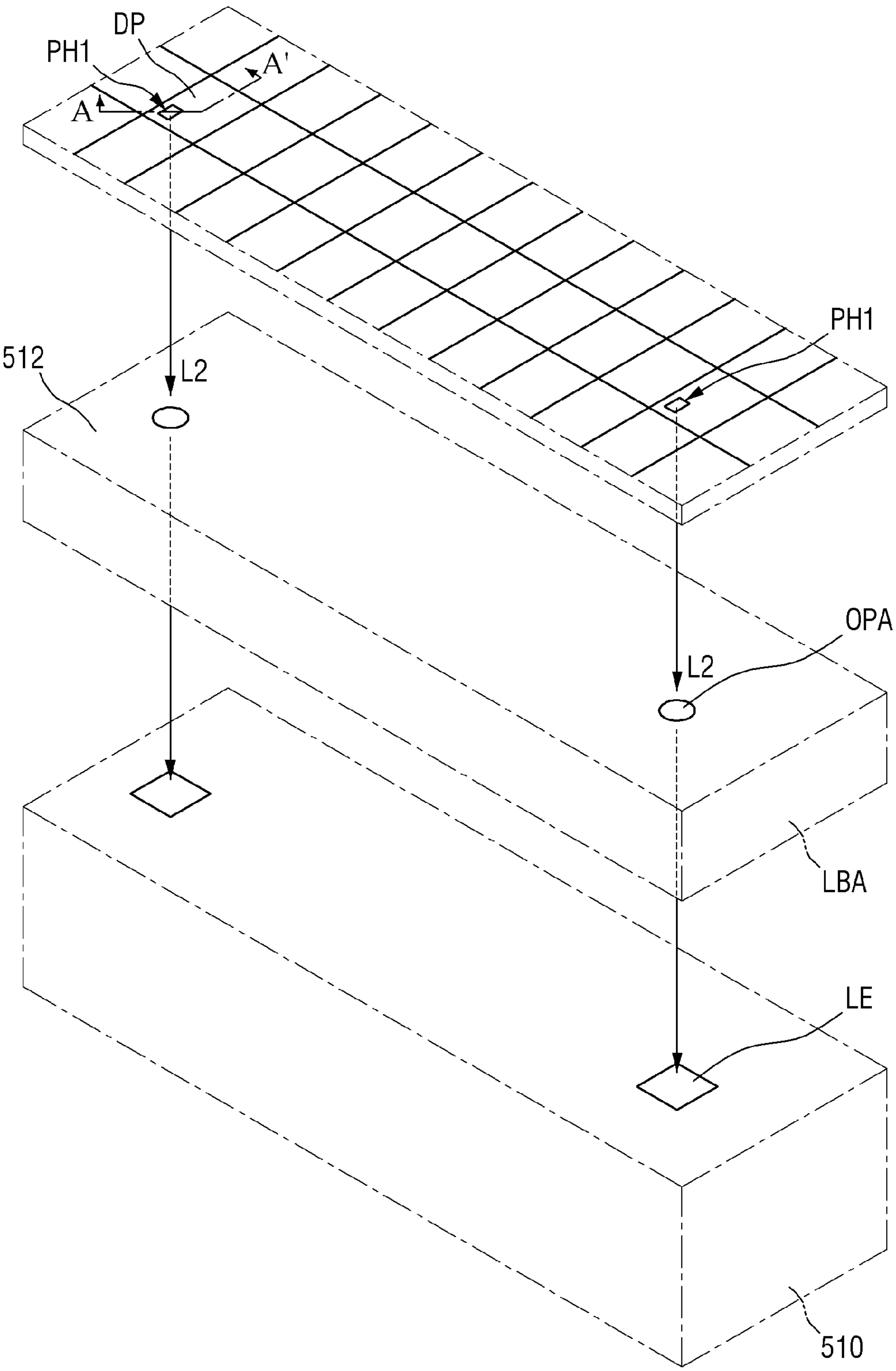
FIG. 57 is a view showing display pixels of a sensor area of a display panel, openings of a pin hole array, and light-receiving areas of an optical sensor according to an embodiment.

FIG. 57 is a view showing display pixels of a sensor area of a display panel, openings of a pin hole array, and light-receiving areas of an optical sensor according to an embodiment.

Referring to FIG. 57, display pixels DP disposed in the sensor area SA of the display panel 300 may be arranged or disposed in a matrix in the first direction (x-axis direction) and the second direction (y-axis direction). However, the arrangement of the display pixels DP is not limited thereto and may be altered in a variety of ways depending on the size and shape of the display device 10.

Some or a predetermined number of the display pixels DP may include first pin holes PH1. In other words, the display pixels DP may be divided into display pixels DP including the first pin holes PH1 and display pixels DP including no first pin hole PH1. The number of the display pixels DP including the first pin holes PH1 may be less than the number of the display pixels DP including no first pin hole PH1. For example, the display pixels DP including the first pin holes PH1 may be disposed every M display pixels in the first direction (x-axis direction), where M is a positive integer equal to or greater than two. As shown in FIG. 57, one out of every ten sub-pixels arranged or disposed in the first direction (x-axis direction) may include the first pin hole PH1. The display pixels DP including the first pin holes PH1 may be disposed every N sub-pixels in the second direction (y-axis direction), where N is a positive integer equal to or greater than two. N may be equal to or different from M. The first pin holes PH1 may be spaced apart from one another in a range of about 100 μm to about 450 μm in the first direction (x-axis direction). The first pin holes PH1 may be spaced apart from one another in a range of about 100 μm to about 450 μm in the second direction (y-axis direction).

The first pin holes PH1 of the display pixels DP may be optical holes that work as paths of light since no element that may reflect light or hinder the progress of light is disposed therein. It is, however, to be understood that the disclosure is not limited thereto. The first pin holes PH1 of the display pixels DP may be physical holes that penetrate the display pixels DP. Alternatively, the first pin holes PH1 of the display pixels DP may include optical holes and physical holes mixed together.

The pin hole array 512 may include openings OPA and light-blocking areas LBA. The openings OPA may be transparent organic layers, and the light-blocking areas LBA may be opaque organic layers. The openings OPA and the light-blocking areas LBA may be formed as organic layers such as an acryl resin layer, an epoxy resin layer, a phenolic resin layer, a polyamide resin layer and a polyimide resin layer. The light-blocking areas LBA may include a black dye or a black pigment to block light.

The openings OPA of the pin hole array 512 may overlap the first pin holes PH1 of the display pixels DP in the third direction (z-axis direction). The area of the openings OPA of the pin hole array 512 may be larger than the area of the first pin holes PH1 of the display pixels DP, respectively. The openings OPA of the pin hole array 512 may overlap the light-receiving areas LE of the optical sensor 510 in the third direction (z-axis direction), respectively. The area of the openings OPA of the pin hole array 512 may be smaller than the area of the light-receiving areas LE of the optical sensor 510, respectively. The first pin holes PH1 of the display pixels DP may overlap the light-receiving areas LE of the optical sensor 510 in the third direction (z-axis direction), respectively.

As shown in FIG. 57, the first pin holes PH1 of the display pixels DP, the openings OPA of the pin hole array 512, and the light-receiving areas LE of the optical sensor 510 may overlap one another in the third direction (z-axis direction). Accordingly, the light L2 may pass through the first pin holes PH1 of the display pixels DP and the openings OPA of the pin hole array 512 to reach the light-receiving areas LE of the optical sensor 510. Therefore, the optical sensor 510 may detect light incident from above the display panel 300.

In FIG. 57, each of the openings OPA of the pin hole array 512 may have a substantially circular shape when viewed from the top, and the first pin holes PH1 of the display pixels DP and the light-receiving areas LE of the optical sensor 510 may have a substantially quadrangular shape when viewed from the top. It is, however, to be understood that the disclosure is not limited thereto. Each of the openings OPA of the pin hole array 512, the first pin holes PH1 of the display pixels DP and the light-receiving areas LE of the optical sensor 510 may have a substantially polygonal shape, a circular shape or an elliptical shape when viewed from the top.

Figure 58:
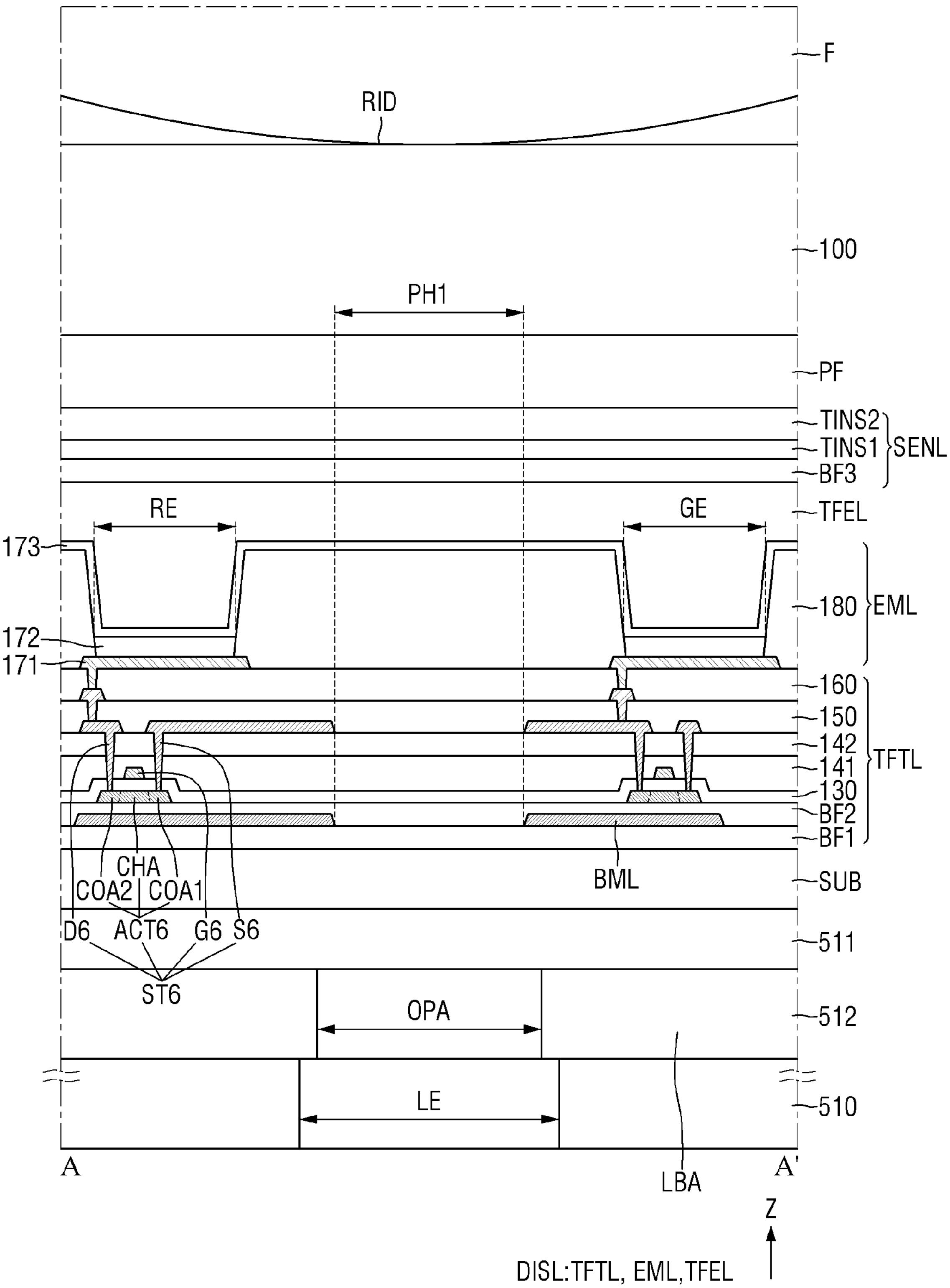
FIG. 58 is a schematic cross-sectional view showing an example of a substrate, a display layer and a sensor electrode layer of the display panel, the pin hole array and the optical sensor of FIG. 57.

FIG. 58 is a schematic cross-sectional view showing an example of a substrate, a display layer and a sensor electrode layer of the display panel, the pin hole array and the light-receiving area of the optical sensor of FIG. 57. FIG. 58 shows an example of the substrate SUB, the display layer DISL and the sensor electrode layer SENL of the display panel 300 and the light-receiving area LE of the optical sensor 510, taken along line A-A' of FIG. 57.

Referring to FIG. 58, the first pin hole PH1 may be defined by at least one of the first light-blocking layer BML, the active layer ACT6, the gate electrode G6, the first electrode S6, the second electrode D6, the first connection electrode ANDE1, the second connection electrode ANDE2, and the first light-emitting electrode 171 of the thin-film transistor layer TFTL as shown in FIG. 15. For example, as shown in FIG. 58, the first pin hole PH1 may be defined by the first electrode S6 of the sixth thin-film transistor (i.e., the sixth transistor) ST6 of the thin-film transistor layer TFTL or the first light-blocking layer BML. The first pin hole PH1 may be defined by two of the first light-blocking layer BML, the active layer ACT6, the gate electrode G6, the first electrode S6, the second electrode D6, the first connection electrode ANDE1, the second connection electrode ANDE2, and the first light-emitting electrode 171 of the thin-film transistor layer TFTL. For example, the first pin hole PH1 may be defined by the first electrode S6 of the sixth thin-film transistor ST6 and the first light-blocking layer BML of the thin-film transistor layer TFTL.

The first pin hole PH1 may not overlap the sensor electrode SE (see FIG. 15) in the third direction (z-axis direction). By doing so, it may be possible to prevent the light incident into the first pin hole PH1 from being blocked by the sensor electrode SE.

The first pin hole PH1 may overlap the opening OPA of the pin hole array 512 in the third direction (z-axis direction). The first pin hole PH1 may overlap the light-receiving area LE of the optical sensor 510 in the third direction (z-axis direction). Therefore, the light passing through the first pin hole PH1 of the display layer DISL and the opening OPA of the pin hole array 512 may reach the light-receiving area LE of the optical sensor 510. Therefore, the optical sensor 510 can detect light incident from above the display panel 300.

In a case that the optical sensor 510 is a fingerprint sensor, light emitted from the emission areas RE and GE may be reflected at the fingerprint of the finger F placed on the cover window 100. The reflected light may pass through the first pin hole PH1 and the opening OPA of the pin hole array 512 and may be detected in the light-receiving area LE of the optical sensor 510. Therefore, the optical sensor 510 can recognize the fingerprint of a person's finger F based on the amount of light detected in the light-receiving areas LE.

Figure 59:
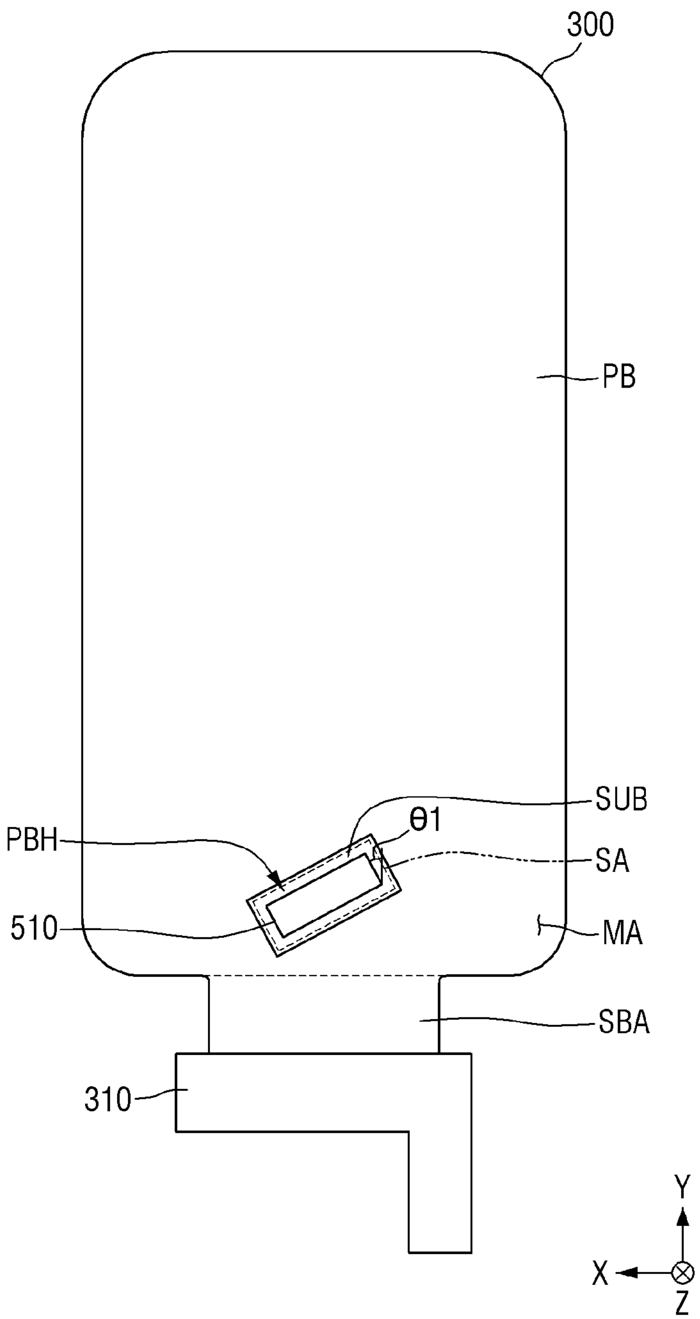
FIG. 59 is a bottom view showing a display panel according to another embodiment.

FIG. 59 is a bottom view showing a display panel according to another embodiment.

An embodiment of FIG. 59 may be different from an embodiment of FIG. 46 in that one or a side of the optical sensor 510 may be inclined with respect to the direction in which one or a side of the substrate SUB may be extended (y-axis direction) by a predetermined angle.

Referring to FIG. 59, the shorter sides of the optical sensor 510 may be inclined with respect to the second direction (y-axis direction) by a first angle θ1. The first angle θ1 may be approximately 200 to 45°.

If the line pattern of the display layer DISL of the display panel 300 overlaps with the line pattern of the optical sensor 510, a moiré pattern may be perceived by a user due to the line pattern of the display layer DISL of the display panel 300 and the line pattern of the optical sensor 510. If a moiré pattern is added in a case that the optical sensor 510 detects light reflected from a person's fingerprint, it may be difficult to recognize the pattern of the fingerprint. In contrast, in a case that the shorter sides of the optical sensor 510 are inclined with respect to the second direction (y-axis direction) by the first angle θ1, the optical sensor 510 can recognize the pattern of the fingerprint, with the moiré pattern reduced.

Figure 60:
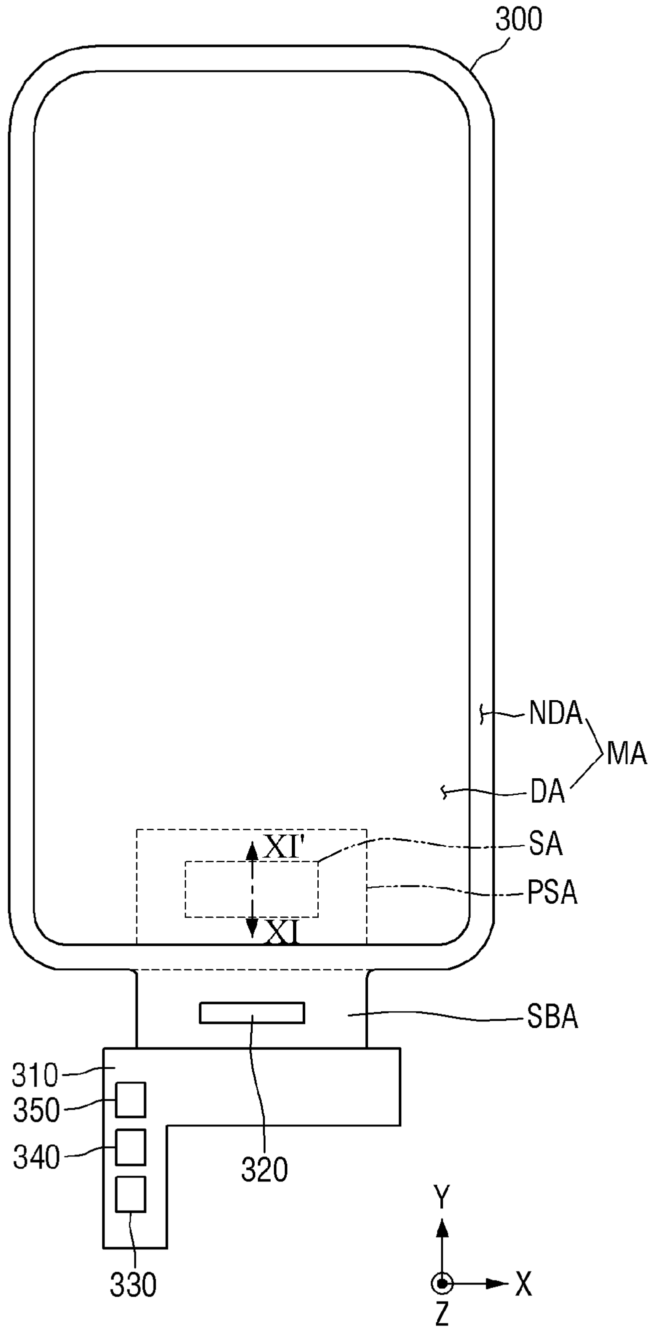
FIG. 60 is a plan view showing a display area, a non-display area and a sensor area and a pressure sensing area of a display panel of a display device according to an embodiment.

FIG. 60 is a plan view showing a display area, a non-display area and a sensor area and a pressure sensing area of a display panel of a display device according to an embodiment.

An embodiment of FIG. 60 may be different from an embodiment of FIG. 4 in that the display panel 300 may include a pressure sensing area PSA.

Referring to FIG. 60, in the pressure sensing area PSA, pressure sensor electrodes are disposed to sense a force applied by a user.

The pressure sensing area PSA may overlap the display area DA. The pressure sensing area PSA may be defined as at least a part of the display area DA. For example, the pressure sensing area PSA may be disposed on one side of the display panel 300 as shown in FIG. 60. It is, however, to be understood that the disclosure is not limited thereto. The pressure sensing area PSA may be disposed distant from the side of the display panel 300 or may be disposed in the center area of the display panel 300.

The area of the pressure sensing area PSA may be, but is not limited to being, smaller than the area of the display area DA. The area of the pressure sensing area PSA may be substantially equal to the area of the display area DA. In such case, a pressure applied by a user may be detected at every position of the display area DA.

The pressure sensing area PSA may overlap the sensor area SA. The sensor area SA may be defined as at least a part of the pressure sensing area PSA. The area of the pressure sensing area PSA may be, but is not limited to being, larger than the area of the sensor area SA. The area of the pressure sensing area PSA may be substantially equal to the area of the sensor area SA. Alternatively, the area of the pressure sensing area PSA may be smaller than the area of the sensor area SA.

Figure 61:
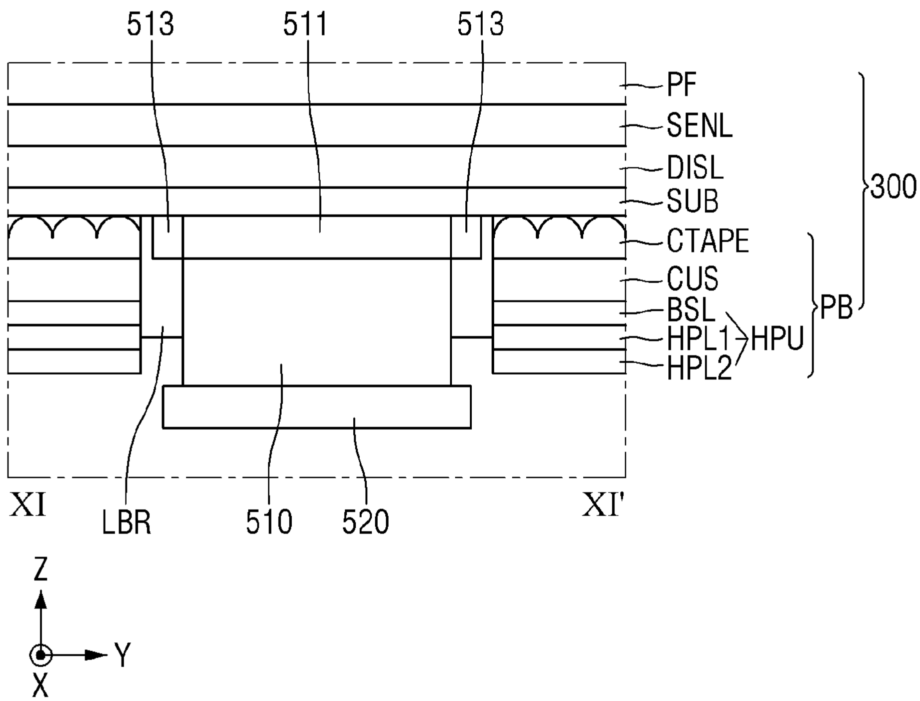
FIG. 61 is an enlarged, schematic cross-sectional view showing an example of the display panel and the optical sensor of FIG. 60.

FIG. 61 is an enlarged, schematic cross-sectional view showing another example of the display panel and the optical sensor of FIG. 60. The schematic cross-sectional view of FIG. 61 shows an example of the display panel 300 and the optical sensor 510, taken along line XI-XI' of FIG. 60.

Figure 62:
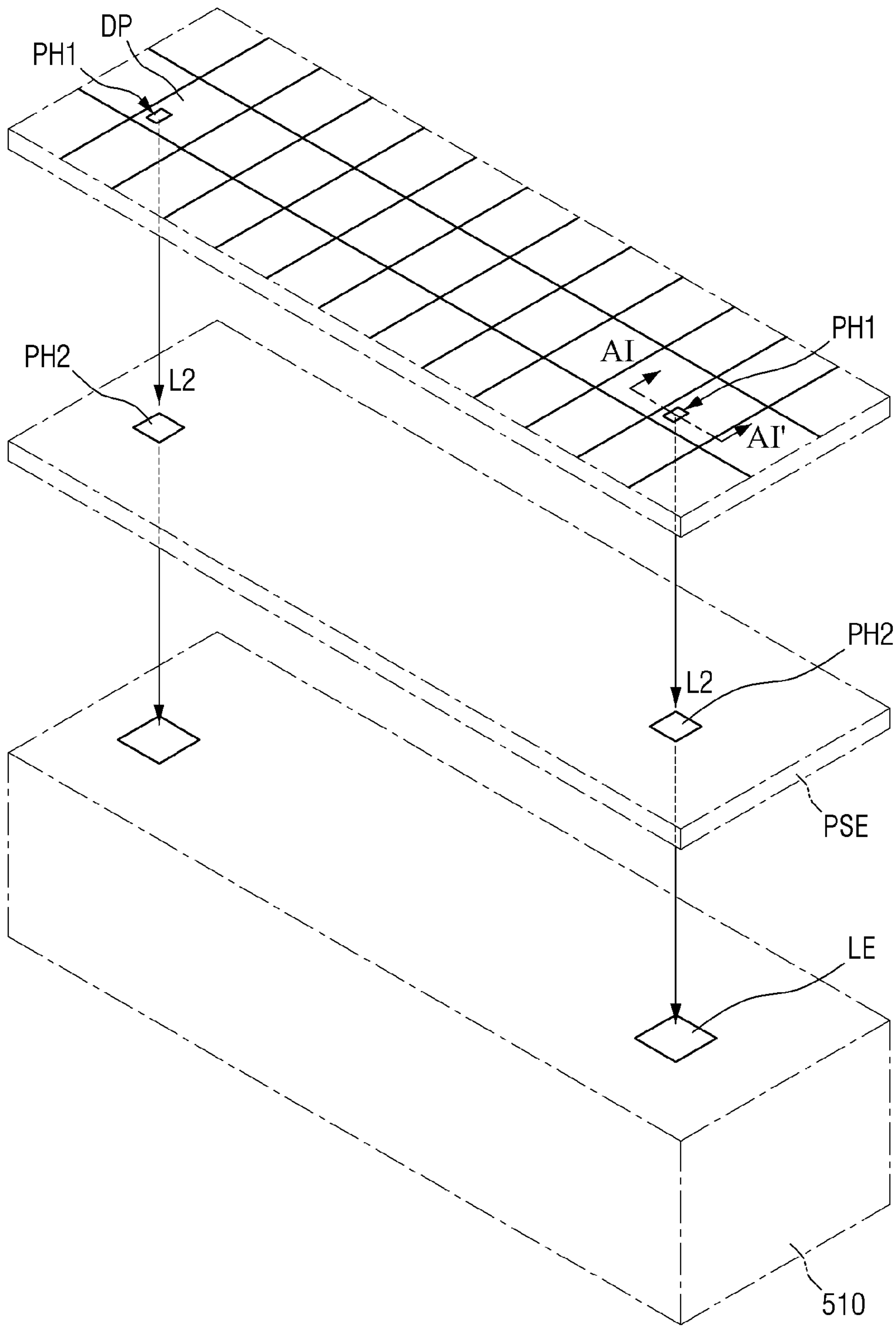
FIG. 62 is a view showing display pixels in a sensor area of a display panel, a pressure sensor electrode and light-receiving areas of an optical sensor.

An embodiment of FIG. 61 may be different from an embodiment of FIG. 54 in that a pressure sensor electrode of a pressure sensing area PSA may include second pin holes PH2 which may work substantially the same as the openings OPA of the pin hole array 512 as shown in FIG. 62 so that the pin hole array 512 may be eliminated.

FIG. 62 is a view showing display pixels in a sensor area of a display panel, a pressure sensor electrode and sensor pixels of an optical sensor.

An embodiment of FIG. 62 may be different from an embodiment of FIG. 57 in that a pressure sensor electrode PSE may be disposed instead of the pin hole array 512.

Referring to FIG. 62, the pressure sensor electrode PSE may include at least one second pin hole PH2 that may be a physical hole penetrating through the pressure sensor electrode PSE. The pressure sensor electrode PSE may include an opaque metal material.

The second pin holes PH2 of the pressure sensor electrode PSE may overlap the first pin holes PH1 of the display pixels DP in the third direction (z-axis direction), respectively. The area of the second pin holes PH2 of the pressure sensor electrode PSE may be larger than the area of the first pin holes PH1 of the display pixels DP. The second pin holes PH2 of the pressure sensor electrode PSE may overlap the light-receiving areas LE of the optical sensor 510 in the third direction (z-axis direction), respectively. The area of the second pin holes PH2 of the pressure sensor electrode PSE may be smaller than the area of the light-receiving area LE of the optical sensor 510. The first pin holes PH1 of the display pixels DP may overlap the light-receiving areas LE of the optical sensor 510 in the third direction (z-axis direction), respectively.

As shown in FIG. 62, the first pin holes PH1 of the display pixels DP, the second pin holes PH2 of the pressure sensor electrode PSE and the light-receiving areas LE of the optical sensor 510 overlap one another in the third direction (z-axis direction). Accordingly, the light L2 can pass through the first pin holes PH1 of the display pixels DP and the second pin holes PH2 of the pressure sensor electrode PSE to reach the light-receiving areas LE of the optical sensor 510. Therefore, the optical sensor 510 can detect light incident from above the display panel 300.

In FIG. 62, each of the second pin holes PH2 of the pressure sensor electrode PSE, the first pin holes PH1 of the display pixels DP and the light-receiving areas LE of the optical sensor 510 has a substantially quadrangular shape when viewed from the top. It is, however, to be understood that the disclosure is not limited thereto. Each of the second pin holes PH2 of the pressure sensor electrode PSE, the first pin holes PH1 of the display pixels DP and the light-receiving areas LE of the optical sensor 510 may have a polygonal shape, a circular shape or an elliptical shape when viewed from the top.

Figure 63:
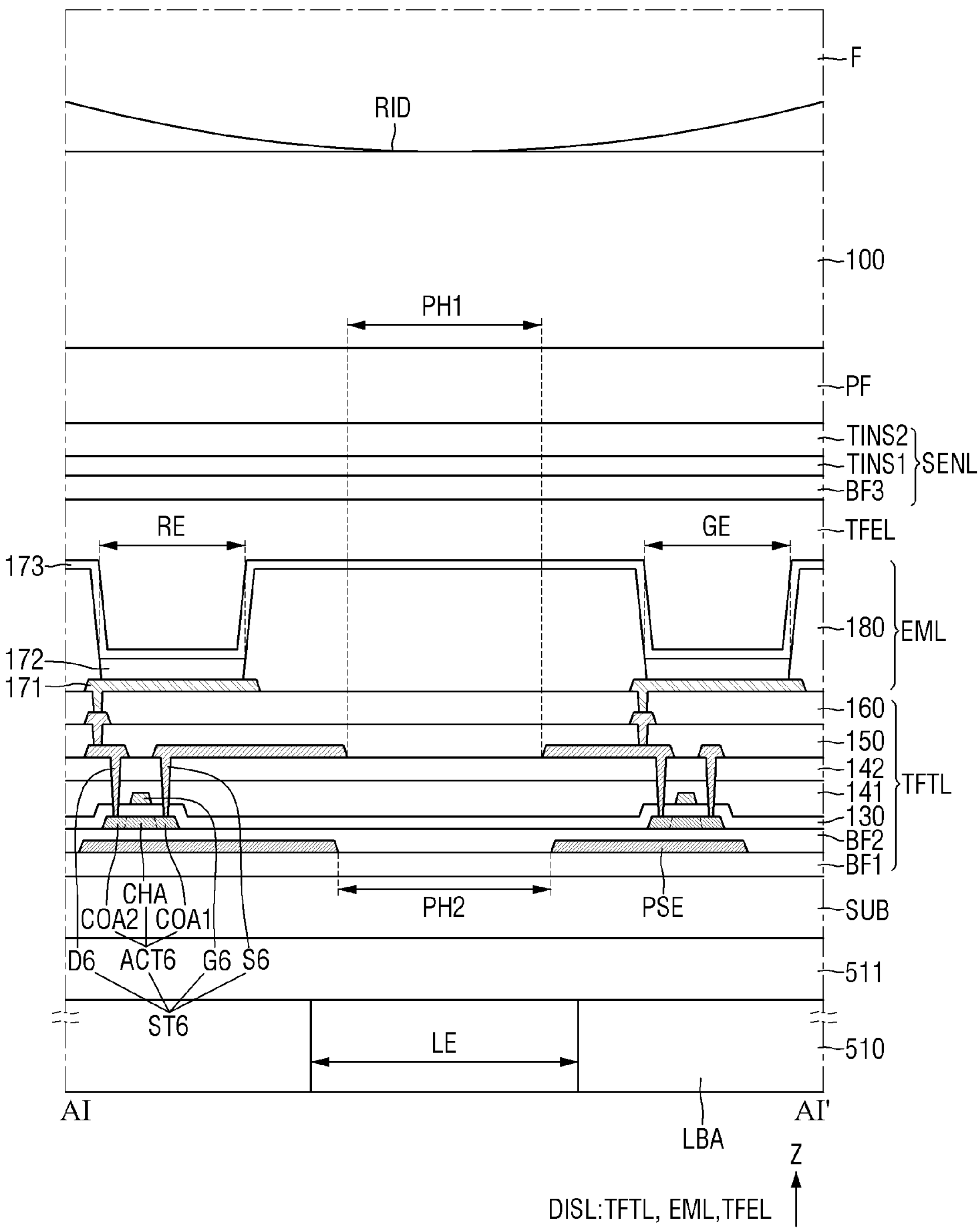
FIG. 63 is a schematic cross-sectional view showing an example of a substrate, a display layer and a sensor electrode layer of the display panel, and the optical sensor of FIG. 62.

FIG. 63 is a schematic cross-sectional view showing an example of a substrate, a display layer and a sensor electrode layer of the display panel, and the optical sensor of FIG. 62. FIG. 63 shows an example of the substrate SUB, the display layer DISL and the sensor electrode layer SENL of the display panel 300 and the light-receiving area LE of the optical sensor 510, taken along line AI-AI' of FIG. 62.

Referring to FIG. 63, the first pin hole PH1 may be defined by at least one of the active layer ACT6, the gate electrode G6, the first electrode S6, the second electrode D6, the first connection electrode ANDE1, the second connection electrode ANDE2, and the first light-emitting electrode 171 of the thin-film transistor layer TFTL as shown in FIG. 15. For example, as shown in FIG. 63, the first pin hole PH1 may be defined by the first electrode S6 of the sixth thin-film transistor ST6 of the thin-film transistor layer TFTL. The first pin hole PH1 may be defined by two of the active layer ACT6, the gate electrode G6, the first electrode S6, the second electrode D6, the first connection electrode ANDE1, the second connection electrode ANDE2, and the first light-emitting electrode 171 of the thin-film transistor layer TFTL.

The first pin hole PH1 may not overlap the sensor electrode SE (see FIG. 15) in the third direction (z-axis direction). By doing so, it may be possible to prevent the light incident into the first pin hole PH1 from being blocked by the sensor electrode SE.

The first pin hole PH1 may overlap the second pin hole PH2 of the pressure sensor electrode PSE in the third direction (z-axis direction). The first pin hole PH1 may overlap the light-receiving area LE of the optical sensor 510 in the third direction (z-axis direction). Therefore, the light passing through the first pin hole PH1 of the display layer DISL and the second pin hole PH2 of the pressure sensor electrode PSE may reach the light-receiving area LE of the optical sensor 510. Therefore, the optical sensor 510 can detect light incident from above the display panel 300.

For example, in a case that the optical sensor 510 is a fingerprint sensor, light emitted from the emission areas RE and GE may be reflected off the fingerprint of the finger F placed on the cover window 100. The reflected light may pass through the first pin hole PH1 of the display layer DISL and the second pin hole PH2 of the pressure sensor electrode PSE and may be detected in the light-receiving area LE of the optical sensor 510. Therefore, the optical sensor 510 can recognize the fingerprint of a person's finger F based on the amount of light detected in the light-receiving areas LE.

Figure 64:
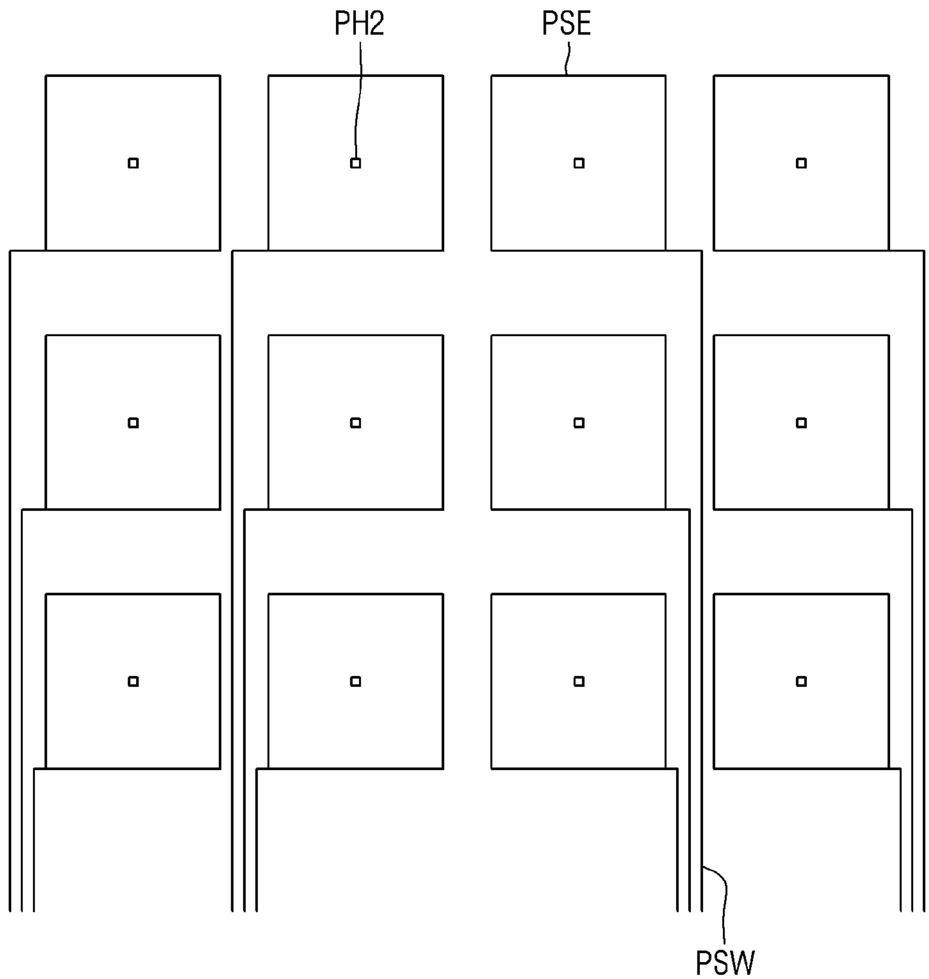
FIG. 64 is a view showing an example of a layout of pressure sensor electrodes of a display panel according to an embodiment.

FIG. 64 is a view showing an example of a layout of pressure sensor electrodes of a display panel according to an embodiment.

Referring to FIG. 64, the pressure sensor electrodes PSE may be electrically connected to pressure sensing lines PSW, respectively. Each of the pressure sensor electrodes PSE may be electrically connected to the respective pressure sensing line PSW. The pressure sensor electrodes PSE and the pressure sensing line PSW may not overlap each other in the third direction (z-axis direction).

The pressure sensing lines PSW may be electrically connected to display pads disposed in the subsidiary area SBA of the substrate SUB. Since the display pads are electrically connected to the display circuit board 310, the pressure sensing lines PSW may be electrically connected to a pressure sensing driver 350 disposed on the display circuit board 310 shown in FIG. 60.

The pressure sensing driver 350 may determine whether a pressure is applied by the user by detecting a change in capacitance of the pressure sensor electrodes PSE. For example, the pressure sensing driver 350 may output a pressure driving signal to the pressure sensor electrodes PSE to charge the capacitance formed by the pressure sensor electrodes PSE. Subsequently, the pressure sensing driver 350 may determine whether a pressure is applied by the user by detecting the voltage charged in the capacitance formed by the pressure sensor electrodes PSE.

Each of the pressure sensor electrodes PSE may have, but is not limited to, a substantially quadrangular shape when viewed from the top. Each of the pressure sensor electrodes PSE may have other polygonal shapes than a quadrangular shape, a circular shape, or an elliptical shape when viewed from the top.

Each of the pressure sensor electrodes PSE may include at least one second pin hole PH2 penetrating through the pressure sensor electrode PSE. Although each of the pressure sensor electrodes PSE includes one second pin hole PH2 in the example shown in FIG. 64 for convenience of illustration, the disclosure is not limited thereto. Each of the pressure sensor electrodes PSE may include second pin holes PH2.

Figure 65A:
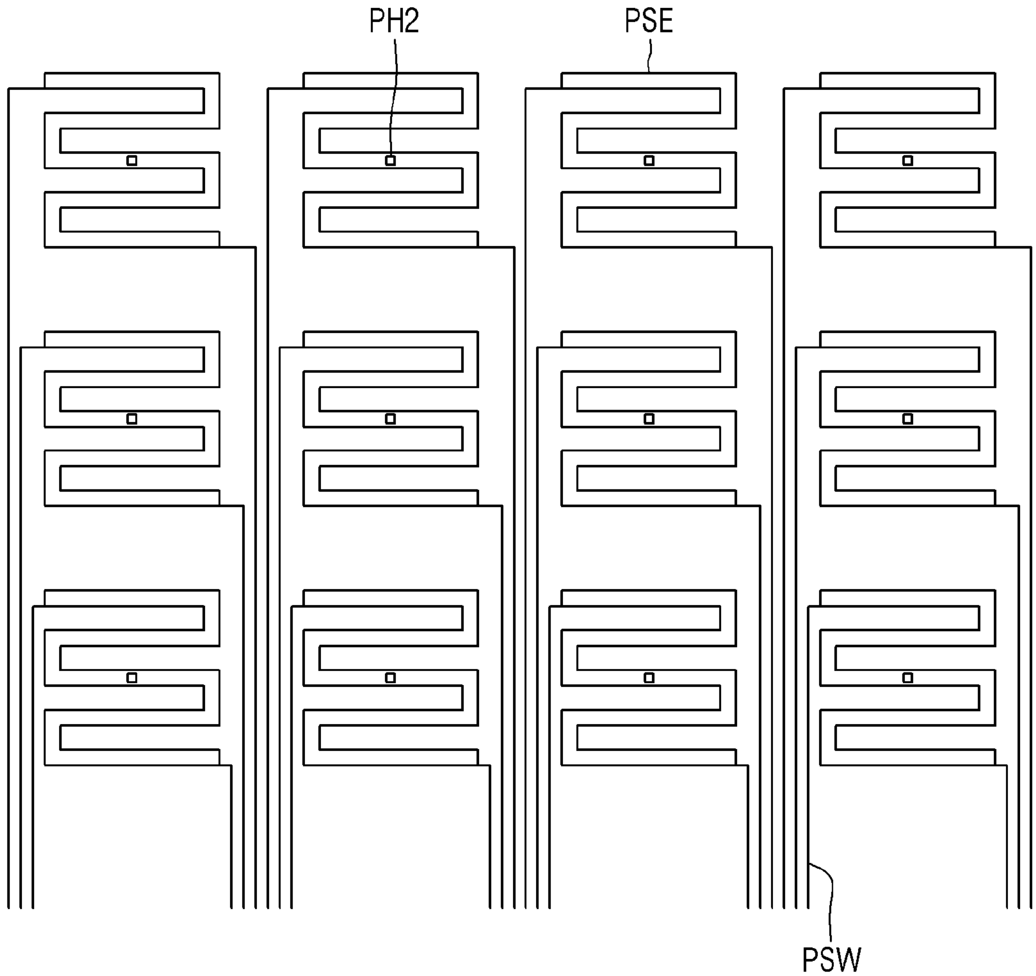
FIGS. 65A and 65B are layout views illustrating other examples of pressure sensor electrodes of a display panel according to an embodiment.
Figure 65B:
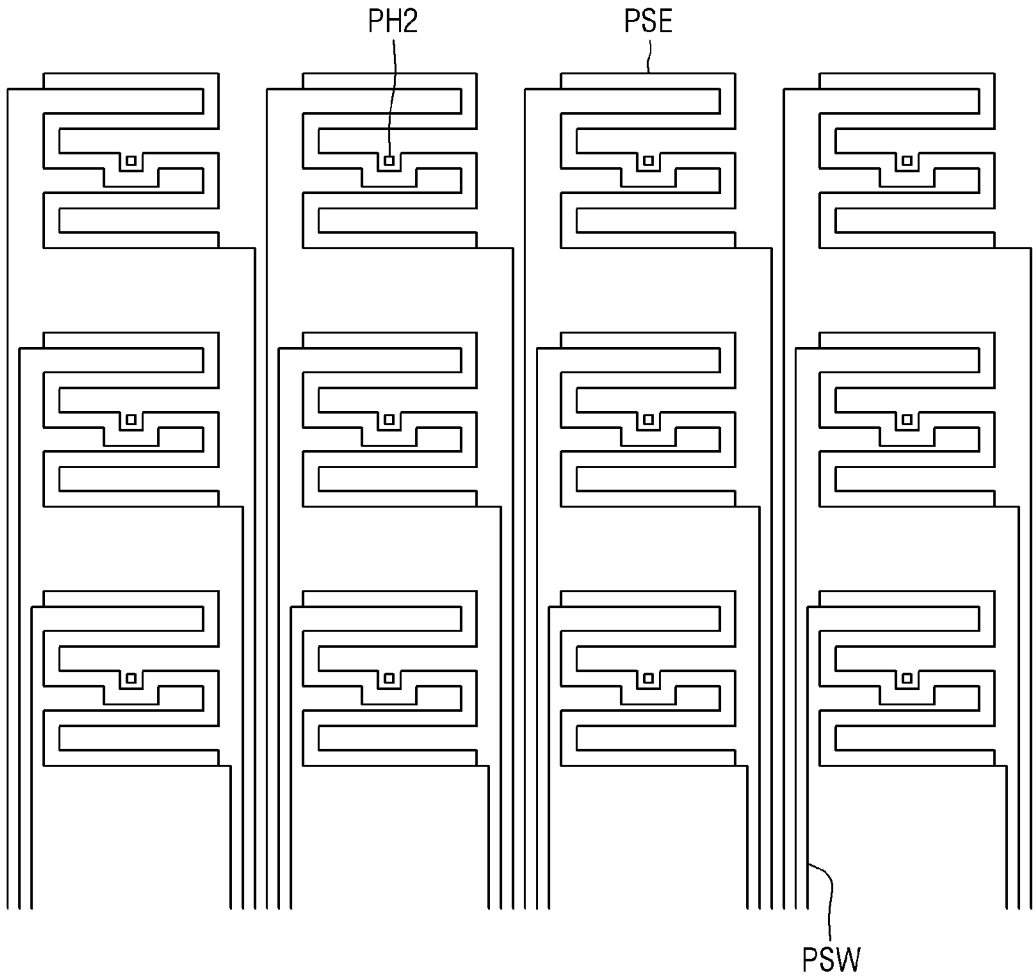

FIGS. 65A and 65B are layout views illustrating other examples of pressure sensor electrodes of a display panel according to an embodiment.

Referring to FIGS. 65A and 65B, each of the pressure sensor electrodes PSE may have a substantially serpentine shape including bent portions to work as a strain gauge. For example, each of the pressure sensor electrodes PSE may be extended in a first direction and then may be bent in the direction perpendicular to the first direction, and may be extended in the direction opposite to the first direction and then may be bent in the direction perpendicular to the first direction. Since each of the pressure sensor electrodes PSE may have a substantially serpentine shape including bent portions, the shape of the pressure sensor electrodes PSE may be changed according to the pressure applied by the user. Therefore, it may be possible to determine whether or not a pressure is applied by the user based on a change in resistance of the pressure sensor electrode PSE.

The pressure sensor electrodes PSE and the pressure sensing line PSW may not overlap each other in the third direction (z-axis direction). Each of one end and the other end of the pressure sensor electrode PSE may be electrically connected to the pressure sensing line PSW. The pressure sensing lines PSW electrically connected to the pressure sensor electrodes PSE may be electrically connected to a Wheatstone bridge circuit WB of the pressure sensing driver 350 as shown in FIG. 65C.

Each of the pressure sensor electrodes PSE may include at least one second pin hole PH2 penetrating through the pressure sensor electrode PSE, as shown in FIG. 65A. Alternatively, each of the pressure sensor electrodes PSE may be extended around the second pin hole PH2 as shown in FIG. 65B.

Figure 65C:
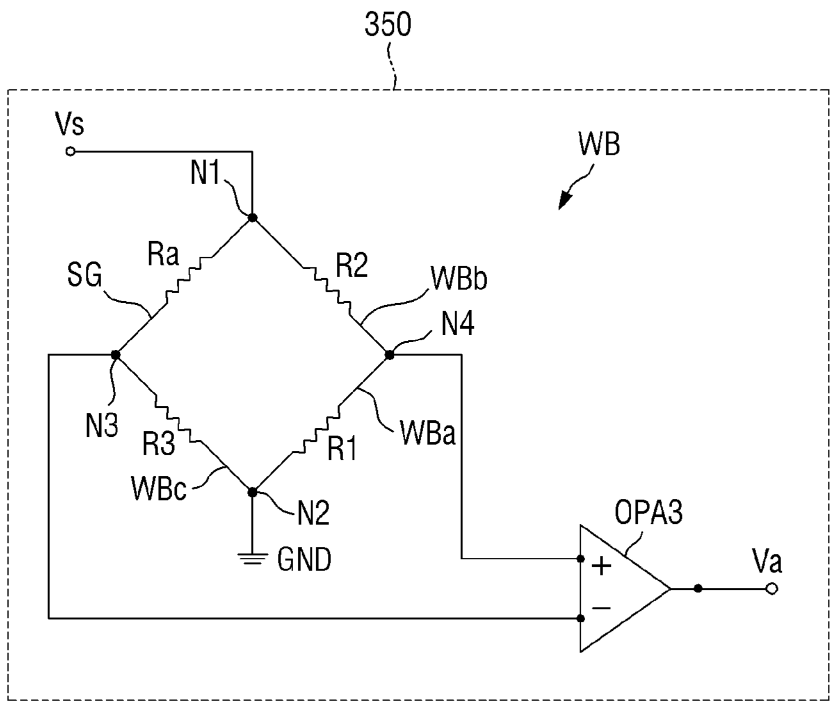
FIG. 65C is an equivalent circuit diagram showing a pressure sensor electrode and a pressure sensing driver according to an embodiment.

FIG. 65C is an equivalent circuit diagram showing a pressure sensor electrode and a pressure sensing driver according to an embodiment.

Referring to FIG. 65C, the pressure sensor electrodes PSE may be connected together and may work as a strain gauge SG. The pressure sensing driver 350 may include a Wheatstone bridge circuit WB. The pressure sensing driver 350 may include an analog-to-digital converter and a processor for detecting a first voltage Va output from the Wheatstone bridge circuit WB.

The Wheatstone bridge circuit WB includes a first node N1, a second node N2, a first output node N3, and a second output node N4. The driving voltage Vs may be applied to the first node N1, and the second node N2 may be connected to the ground GND.

The Wheatstone bridge circuit WB may include a first resistor WBa electrically connected to the second node N2 and the second output node N4, a second resistor WBb electrically connected to the first node N1 and the second output node N4, and a third resistor WBc electrically connected to the second node N2 and first output node N3.

The resistance R1 of the first resistor WBa, the resistance R2 of the second resistor WBb, and the resistance R3 of the third resistor WBc may each have a predetermined value. In other words, the first resistor WBa to the third resistor WBc may be fixed resistors.

The Wheatstone bridge circuit WB may include an amplifier circuit OPA3, such as an operational amplifier. The amplifier circuit OPA3 may include an inverting input terminal, a non-inverting input terminal, and an output terminal. An electrical flow between the first output node N3 and the second output node N4 may be detected through the amplifier circuit OPA3. In other words, the amplifier circuit OPA3 can operate as a current or voltage measuring element.

One of the first output node N3 and the second output node N4 may be electrically connected to one of the input terminals of the amplifier circuit OPA3, and the other one of the first output node N3 and the second output node N4 may be electrically connected to the other input terminal of the amplifier circuit OPA3. For example, the first output node N3 may be electrically connected to the inverting input terminal of the amplifier circuit OPA3, and the second output node N4 may be electrically connected to the non-inverting input terminal of the amplifier circuit OPA3.

The output terminal of the amplifier circuit OPA3 may output a first voltage Va proportional to the difference between the voltages input to the two input terminals.

One end of the strain gauge SG formed by the pressure sensor electrodes PSE may be electrically connected to the first node N1, and the other end of the strain gauge SG formed by the pressure sensor electrodes PSE may be electrically connected to the first output node N3.

According to the embodiment, the strain gauge SG, the first resistor WBa, the second resistor WBb and the third resistor WBc may be electrically connected with each other to implement the Wheatstone bridge circuit WB.

In a case that no pressure is applied, the product of the resistance Ra of the strain gauge SG and the resistance R1 of the first resistor WBa may be substantially equal to the product of the resistance R2 of the second resistor WBb and the third resistance R3 of the third resistor WBc. In a case that the product of the resistance Ra of the strain gauge SG and the resistance R1 of the first resistor WBa is equal to the product of the resistance R2 of the second resistor WBb and the third resistance R3 of the third resistor WBc, the voltage of the first output node N3 may be equal to the voltage of the second output node N4. In a case that the voltage of the first output node N3 is equal to the voltage of the second output node N4, the voltage difference between the first output node N3 and the second output node N4 may be about 0V, and the first voltage Va output by the amplifier circuit OPA3 may be about 0V.

In a case that a pressure of is applied to the pressure sensing area PSA by a user, the pressure sensor electrode PSE may be deformed depending on the strength of the pressure, and the resistance Ra of the strain gauge SG may be changed by the deformation. Therefore, a voltage difference is made between the first output node N3 and the second output node N4. In a case that a voltage difference is made between the first output node N3 and the second output node N4, the amplifier circuit OPA3 outputs a value other than 0V as the first voltage Va. Therefore, it may be possible to detect the pressure exerted by the user based on the first voltage Va output from the amplifier circuit OPA3.

Figure 66:
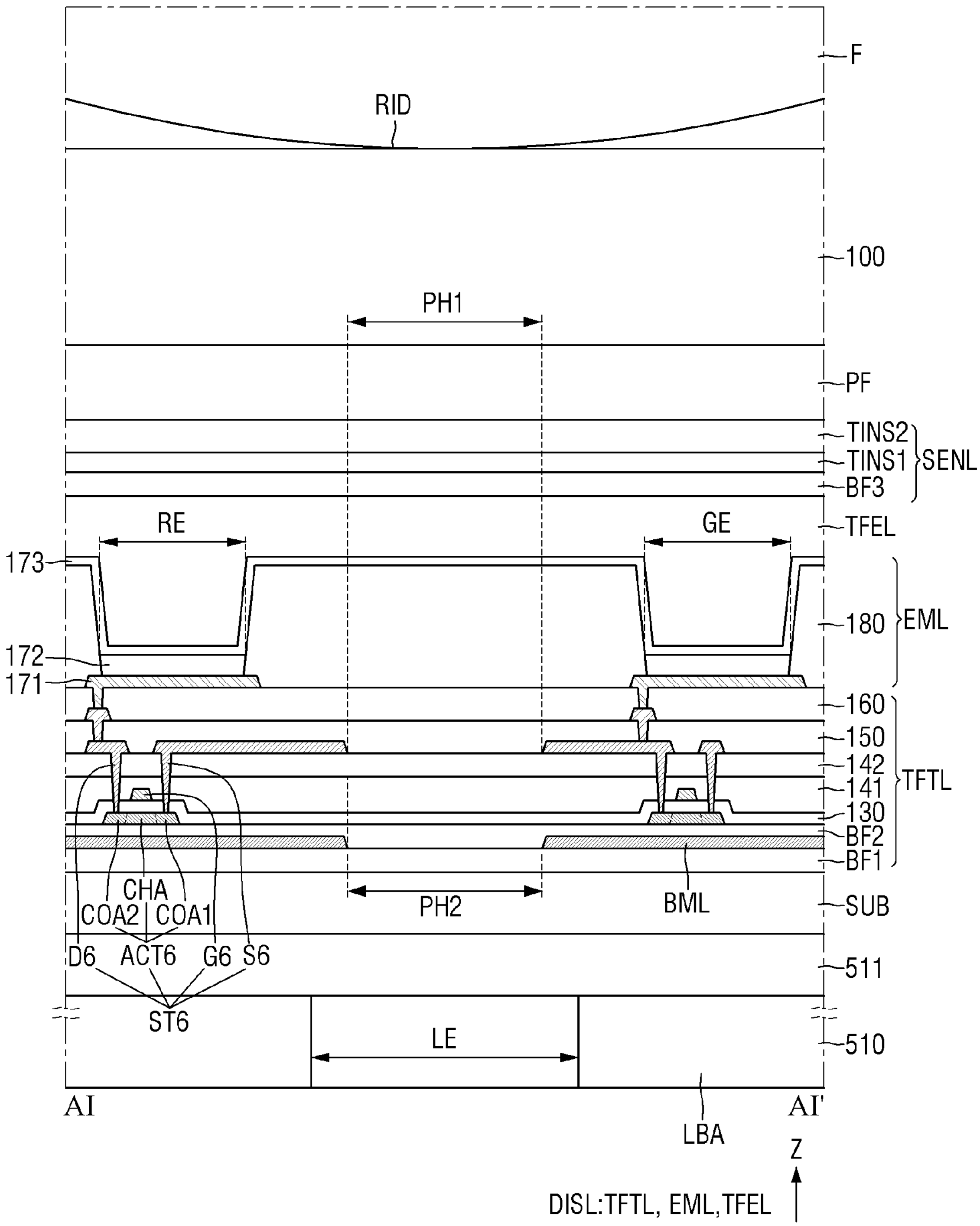
FIG. 66 is a schematic cross-sectional view showing an example of a substrate, a display layer, and a sensor electrode layer of the display panel, and a light-receiving area of the optical sensor of FIG. 62.

FIG. 66 is a schematic cross-sectional view showing an example of a substrate, a display layer and a sensor electrode layer of the display panel, and a light-receiving area of the optical sensor of FIG. 62. FIG. 66 shows another example of the substrate SUB, the display layer DISL and the sensor electrode layer SENL of the display panel 300 and the light-receiving area LE of the optical sensor 510, taken along line AI-AI' of FIG. 62.

An embodiment of FIG. 66 may be different from an embodiment of FIG. 63 in that a pressure sensor electrode PSE may be eliminated and a first light-blocking layer BML may include second pin holes PH2. The pressure sensor electrode PSE and the first light-blocking layer BML may be disposed on the same layer, and may include the same material.

Referring to FIG. 66, the first light-blocking layer BML may be disposed on the entire area except for the second pin holes PH2. For example, the first light-blocking layer BML may block light from passing through it in the entire area except for the second pin holes PH2. Noise light incident on the light-receiving areas LE of the optical sensor 510 may be greatly reduced by virtue of the first light-blocking layer BML.

Figure 67:
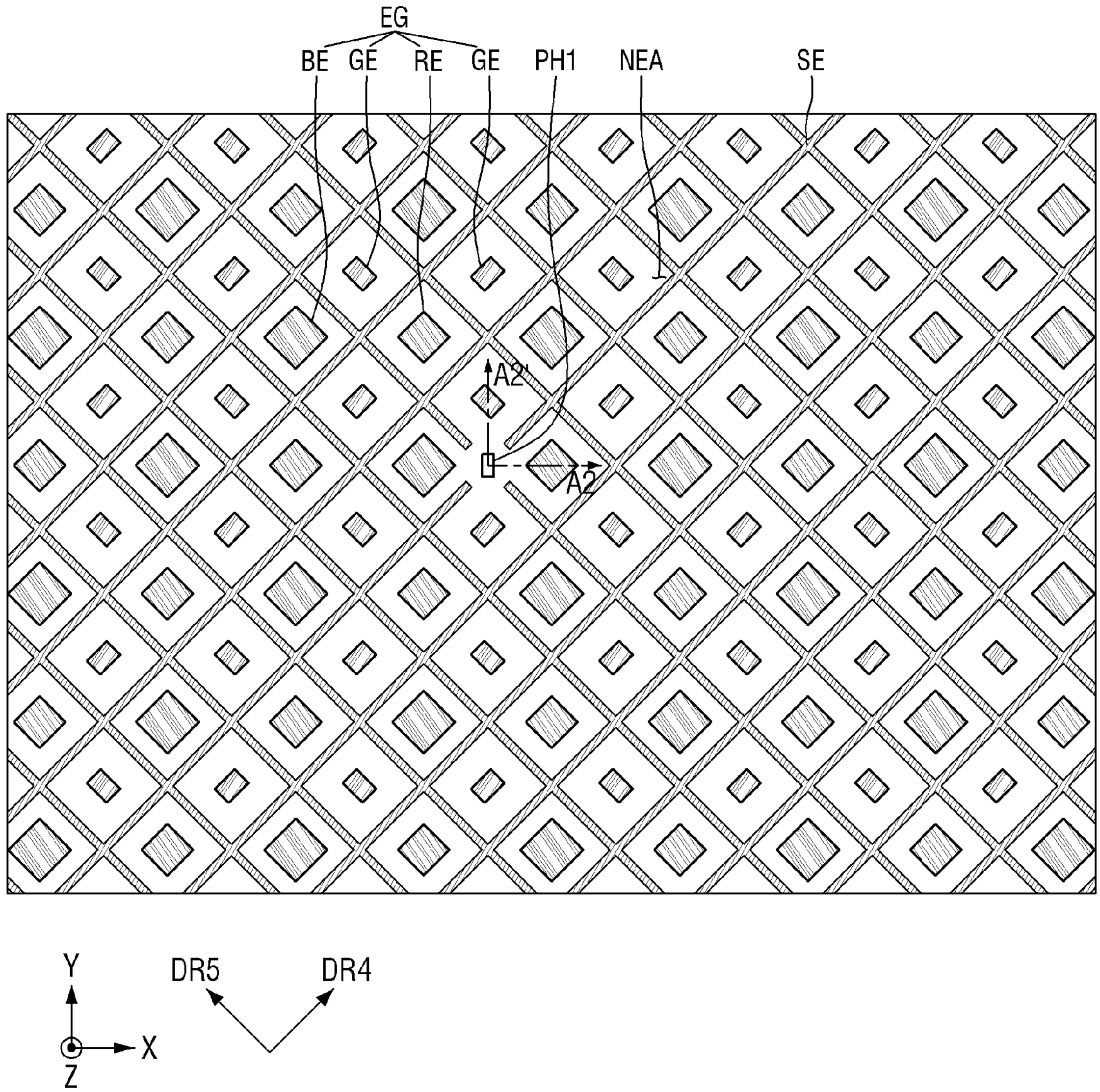
FIG. 67 is a view showing a layout of a sensor electrode, emission areas and pin holes in a sensor area of a display panel according to an embodiment.

FIG. 67 is a view showing a layout of a sensor electrode, emission areas and pin holes in a sensor area of a display panel according to an embodiment.

Referring to FIG. 67, the sensor electrode SE may have a mesh structure when viewed from the top. The sensor electrode SE may be disposed between the first emission area RE and the second emission area GE, between the first emission area RE and the third emission area BE, between the second emission area GE and the third emission area BE, and between the second emission areas GE. Since the sensor electrode SE has a mesh structure when viewed from the top, the emission areas RE, GE and BE may not overlap the sensor electrode SE in the third direction (z-axis direction). Therefore, the light emitted from the emission areas RE, GE and BE may not be covered or overlapped by the sensor electrode SE, and thus it may be possible to prevent the luminance of the light from being reduced.

The sensor electrodes SE may be extended in the fourth direction DR4 and the fifth direction DR5. The fourth direction DR4 may be inclined with respect to the first direction (x-axis direction) by approximately 45°. It is, however, to be understood that the disclosure is not limited thereto. The fifth direction DR5 may be inclined with respect to the second direction (y-axis direction) by approximately 45°. It is, however, to be understood that the disclosure is not limited thereto.

One first pin hole PH1 may be disposed every M sub-pixels in the first direction (x-axis direction) and the second direction (y-axis direction). For example, as shown in FIG. 67, one first pin hole PH1 may be disposed every ten sub-pixels in the first direction (x-axis direction). In such case, the first pin hole PH1 may be spaced apart from another one by approximately 100 μm to 450 μm in the first direction (x-axis direction).

In a case that the first pin hole PH1 overlaps the sensor electrode SE in the third direction (z-axis direction), light to be incident on the first pin hole PH1 may be blocked by the sensor electrode SE. Therefore, the sensor electrode SE may not overlap the first pin hole PH1 in the third direction (z-axis direction). For example, the sensor electrodes SE overlapping the first pin hole PH1 in the third direction (z-axis direction) may be removed.

Since the schematic cross-sectional view taken along line A2-A2' shown in FIG. 67 may be substantially identical to the schematic cross-sectional view taken along line A-A' shown in FIG. 57; and, therefore, the redundant description will be omitted.

Figure 68:
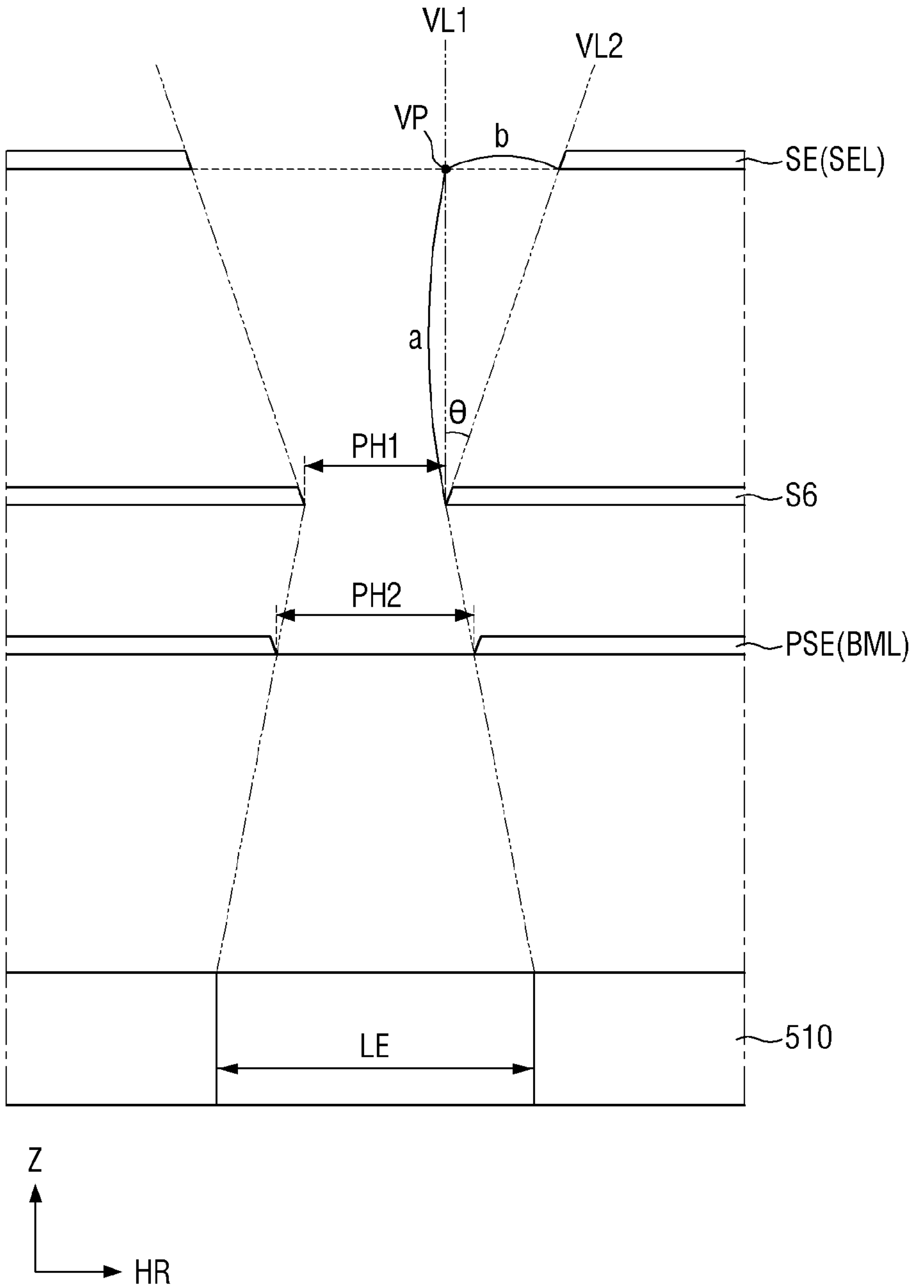
FIG. 68 is a view showing an example of a light-receiving area of the optical sensor, a first pin hole, a second pin hole and the sensor electrode of FIG. 67.

FIG. 68 is a view showing an example of a light-receiving area of the optical sensor, a first pin hole, a second pin hole and the sensor electrode of FIG. 67.

In the example shown in FIG. 68, the first pin hole PH1 is defined by the first electrode S6 of the sixth thin-film transistor ST6 of the thin-film transistor layer TFTL for convenience of illustration. It is, however, to be understood that the disclosure is not limited thereto. The first pin hole PH1 may be defined by at least one of the active layer ACT6, the gate electrode G6, the first electrode S6, the second electrode D6, the first connection electrode ANDE1, the second connection electrode ANDE2, and the first light-emitting electrode 171 of the thin-film transistor layer TFTL. FIG. 68 shows that the second pin hole PH2 is defined by the pressure sensor electrode PSE or the first light-blocking layer BML.

Referring to FIG. 68, a virtual vertical line VL1 extended from an end of the first electrode S6 of the thin-film transistor layer TFTL defining the first pin hole PH1 in the third direction (z-axis direction) may be defined. The distance a may be defined as the distance from the first electrode S6 of the thin-film transistor layer TFTL to the layer SEL in which the sensor electrode SE is disposed along the virtual vertical line VL1. As shown in FIG. 68, the layer SEL in which the sensor electrode SE is disposed may be an upper layer of the first sensor insulating layer TINS1.

The distance b may be defined as the distance from a virtual point VP to the sensor electrode SE in a horizontal direction HR, where the virtual point VP denotes a contact point at which the virtual vertical line VL1 meets the layer SEL in which the sensor electrode SE is disposed. The horizontal direction HR refers to a direction perpendicular to the third direction (z-axis direction), and may include the first direction (x-axis direction), the second direction (y-axis direction), one direction DR4, and the other direction DR5.

A virtual line VL2 may be defined as the shortest distance connecting the end of the first electrode S6 of the thin-film transistor layer TFTL defining the first pin hole PH1 with the sensor electrode SE. An angle formed between the virtual vertical line VL1 and the virtual line VL2 may be defined as θ.

In such case, the distance b from the virtual point VP to the sensor electrode SE in the horizontal direction HR may be calculated as in Equation 2 below:

$$b = a \times \tan\theta \quad \text{[Equation 2]}$$

The angle θ formed between the virtual vertical line VL1 and the virtual line VL2 may be 330 in consideration of a path in which the light L2 reflected from the fingerprint of a finger F is incident. The distance a from at least one layer of the thin-film transistor layer TFTL to the layer SEL in which the sensor electrode SE is disposed may be approximately 13.3 μm along the virtual vertical line VL1. In such case, the distance b from the virtual point VP to the sensor electrode SE in the horizontal direction HR may be calculated as approximately 8.6 μm.

As shown in FIG. 68, once at least one layer of the thin-film transistor layer TFTL defining the first pin hole PH1 is determined, it may be possible to calculate the spacing between the sensor electrode SE and the end of the first electrode S6 in the horizontal direction HR. By doing so, the light L2 reflected from the user's fingerprint may not be blocked by the sensor electrode SE but can propagate toward the first pin hole PH1. As a result, the light L2 reflected from the user's fingerprint can reach the light-receiving area LE of the optical sensor 510 overlapping the first pin hole PH1 in the third direction (z-axis direction) through the first pin hole PH1 and the second pin hole PH2.

Figure 69:
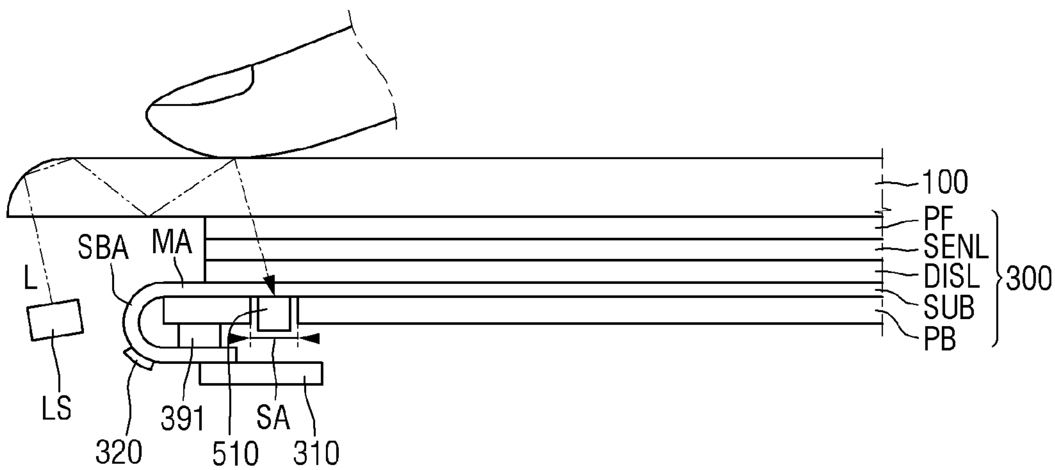
FIG. 69 is a schematic cross-sectional view showing a cover window and a display panel according to an embodiment.
Figure 70:
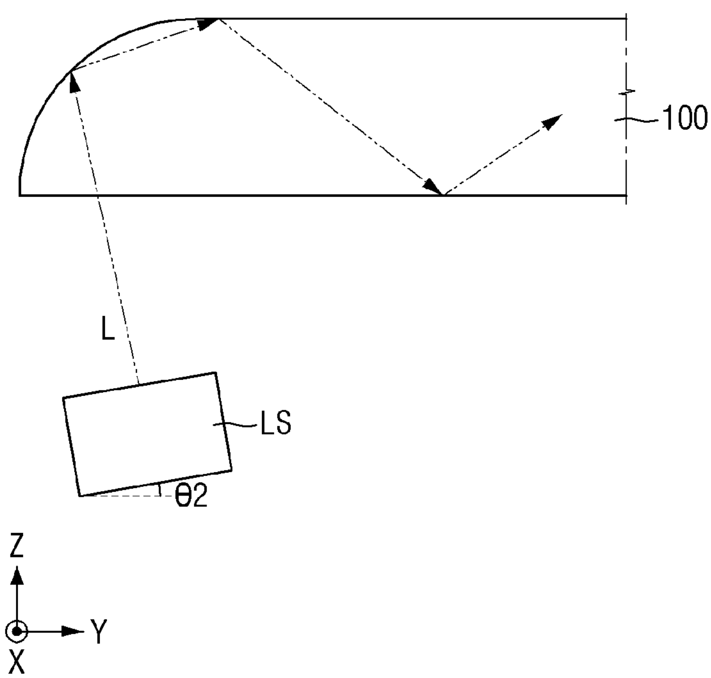
FIG. 70 is a schematic cross-sectional view showing an example of an edge of the cover window of FIG. 69.

FIG. 69 is a schematic cross-sectional view showing a cover window and a display panel according to another embodiment. FIG. 70 is a schematic cross-sectional view showing an example of an edge of the cover window of FIG. 69.

According to the embodiment of FIGS. 69 and 70, an optical fingerprint sensor is used as the optical sensor 510 so that light L from a light source LS is irradiated onto a person's finger F and the light reflected from the person's finger F is sensed by the optical sensor 510.

Referring to FIGS. 69 and 70, the light source LS may be disposed on an outer side of the display panel 300. For example, the light source LS may be disposed on the lower outer side of the display panel 300 where the subsidiary area SBA of the display panel 300 is disposed.

The light source LS may be disposed to overlap one edge of the cover window 100 in the third direction (z-axis direction). The light source LS may be disposed below the lower edge of the cover window 100. Although FIGS. 69 and 70 show that the light source LS is disposed distant from the cover window 100, the disclosure is not limited thereto. The upper surface of the light source LS may be in contact with the lower surface of the cover window 100.

The light source LS may emit infrared light or red light. Alternatively, the light source LS may emit white light. The light source LS may be a light-emitting diode package or a light-emitting diode chip including a light-emitting diode.

The light source LS may be disposed to emit light toward one side of the cover window 100. For example, the lower surface of the light source LS may be inclined with respect to the second direction (y-axis direction) by a second angle θ2 as shown in FIG. 70.

One side surface of the cover window 100 may be formed as a curved surface having a predetermined curvature. In a case that the side surface of the cover window 100 is formed as a curved surface, it may be possible to increase the ratio of light totally reflected from the side surface of the cover window 100 to the light L output from the light source LS may be increased, compared to a cover window having a square surface.

Some of the light L output from the light source LS may be totally reflected off the side of the cover window 100 to travel toward the upper surface of the cover window 100. Some of the light traveling to the upper surface of the cover window 100 may be totally reflected from the upper surface of the cover window 100 to travel toward the lower surface of the cover window 100. Some of the light traveling to the lower surface of the cover window 100 may be totally reflected to travel back to the upper surface of the cover window 100. Some of the light traveling to the upper surface of the cover window 100 may be reflected by a person's finger F placed in the sensor area SA and detected in the light-receiving areas LE of the optical sensor 510. Therefore, the optical sensor 510 can recognize the fingerprint of a person's finger F based on the amount of light detected in the light-receiving areas LE.

Figure 71:
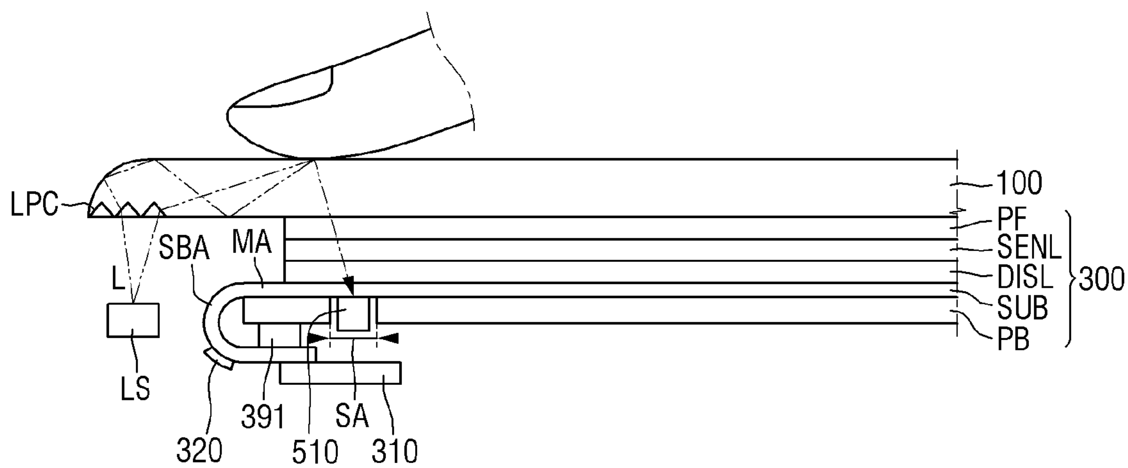
FIG. 71 is a schematic cross-sectional view showing a cover window and a display panel according to an embodiment.
Figure 72:
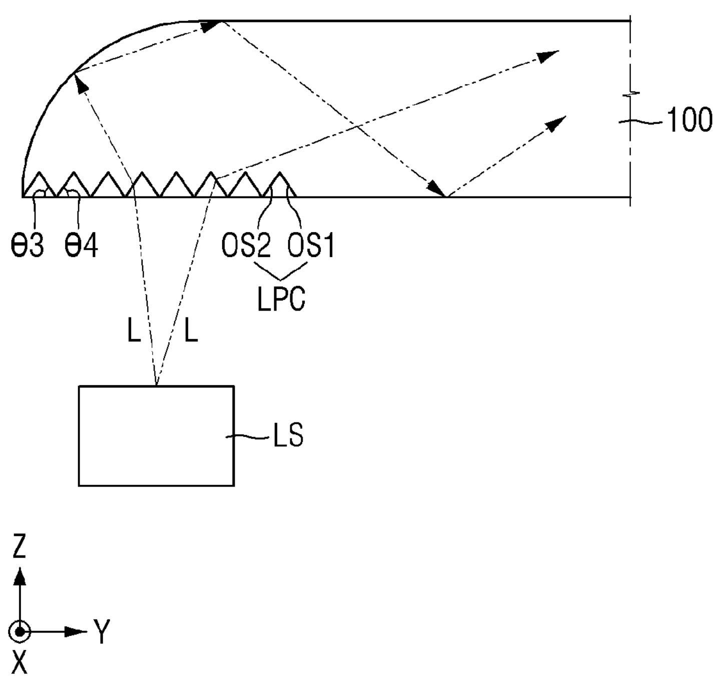
FIG. 72 is a schematic cross-sectional view showing an example of an edge of the cover window of FIG. 71.

FIG. 71 is a schematic cross-sectional view showing a cover window and a display panel according to another embodiment. FIG. 72 is a schematic cross-sectional view showing an example of an edge of the cover window of FIG. 71.

An embodiment of FIGS. 71 and 72 may be different from an embodiment of FIGS. 69 and 70 in that a light path conversion pattern LPC may be formed on the lower surface of the cover window 100 overlapping the light source LS in the third direction (z-axis direction).

Referring to FIGS. 71 and 72, the light path conversion pattern LPC may include first exit surfaces OS1 and second exit surfaces OS2. For example, the light path conversion pattern LPC may have a cross section of triangles each including a first exit surface OS1 and a second exit surface OS2. It is, however, to be understood that the disclosure is not limited thereto. The light path conversion pattern LPC may have a cross section of trapeziums each including three exit surfaces. An angle θ3 of the first exit surface OS1 with respect to the second direction (y-axis direction) may be substantially equal to an angle θ4 of the second exit surface OS2 with respect to the second direction (y-axis direction). The triangle defined by the first exit surface OS1 and the second exit surface OS2 may be an isosceles triangle. It is, however, to be understood that the disclosure is not limited thereto.

The lower surface of the light source LS may be disposed in parallel with the second direction (y-axis direction). Among the light L from the light source LS, the light directed toward the first exit surface OS1 may be refracted at the first exit surface OS1 to travel toward the upper side of the cover window 100. Some of the light traveling to the upper side of the cover window 100 may be reflected by a person's finger F placed in the sensor area SA and detected in the light-receiving areas LE of the optical sensor 510.

Among the light L from the light source LS, the light directed toward the second exit surface OS2 may be refracted at the second exit surface OS2 to travel toward the lower side of the cover window 100. Some of the light traveling to the lower side of the cover window 100 may be totally reflected off the side surface of the cover window 100 to travel toward the upper surface of the cover window 100. Some of the light traveling to the upper surface of the cover window 100 may be totally reflected from the upper surface of the cover window 100 to travel toward the lower surface of the cover window 100. Some of the light traveling to the lower surface of the cover window 100 may be totally reflected to travel back to the upper surface of the cover window 100. Some of the light traveling to the upper surface of the cover window 100 may be reflected by a person's finger F placed in the sensor area SA and detected in the light-receiving areas LE of the optical sensor 510.

As shown in FIGS. 71 and 72, in a case that the light path conversion pattern LPC is formed on the lower surface of the cover window 100 overlapping the light source LS in the third direction (z-axis direction), most of the light L output from the light source LS can travel toward a person's finger F placed in the sensor area SA, so that the fingerprint of the person's finger F may be recognized more accurately by the optical sensor 510.

Figure 73:
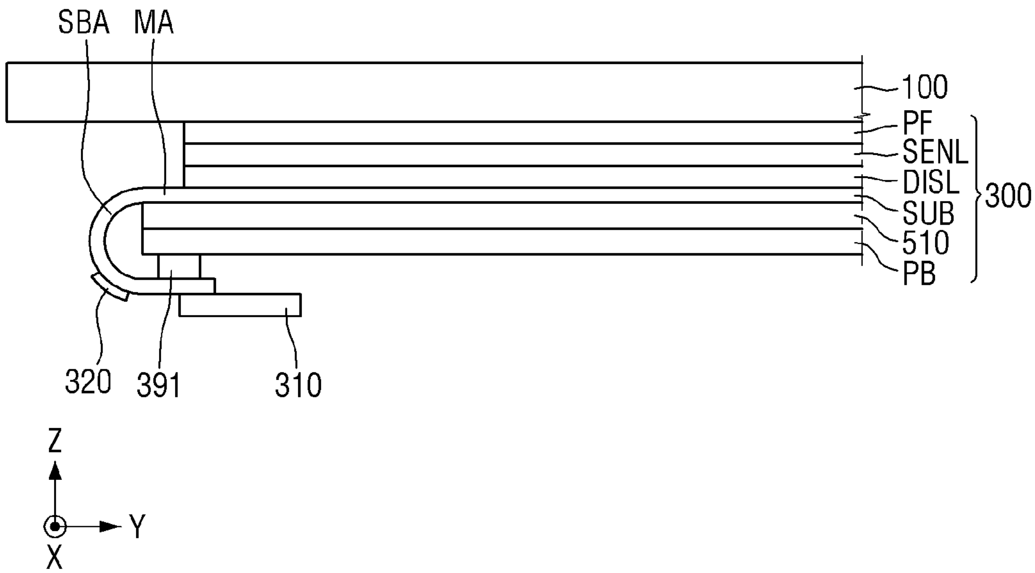
FIG. 73 is a schematic cross-sectional view showing a cover window and a display panel according to an embodiment.

FIG. 73 is a schematic cross-sectional view showing a cover window and a display panel according to another embodiment.

An embodiment of FIG. 73 may be different from an embodiment of FIG. 48 in that an optical sensor 510 may be disposed between the substrate SUB and the panel bottom cover PB in the entire display area DA of the display panel 300.

Referring to FIG. 73, the optical sensor 510 may be disposed in the entire display area DA of the display panel 300. The sensor area SA may be substantially identical to the display area DA as shown in FIG. 5, and light may be detected in anywhere of the display area DA.

The optical sensor 510 may be disposed between the substrate SUB and the panel bottom cover PB. The optical sensor 510 may include a semiconductor wafer and optical sensor chips disposed on the semiconductor wafer. Each of the optical sensor chips may include at least one sensor pixel. The sensor pixel may be substantially identical to that described above with reference to FIG. 14.

Figure 74:
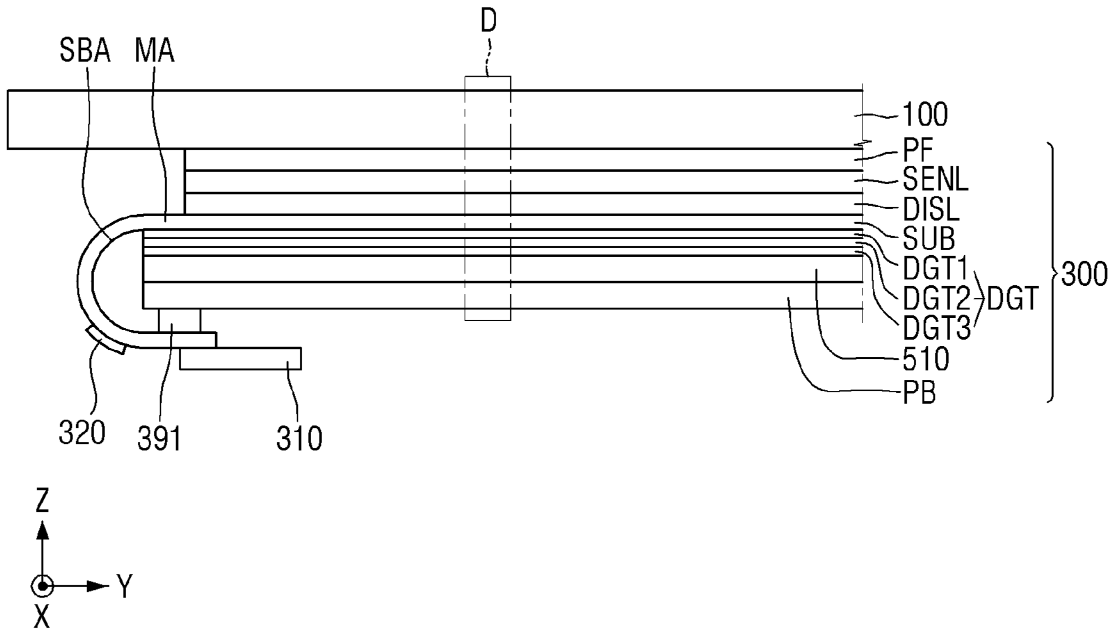
FIG. 74 is a schematic cross-sectional view showing a cover window and a display panel according to an embodiment.
Figure 75:
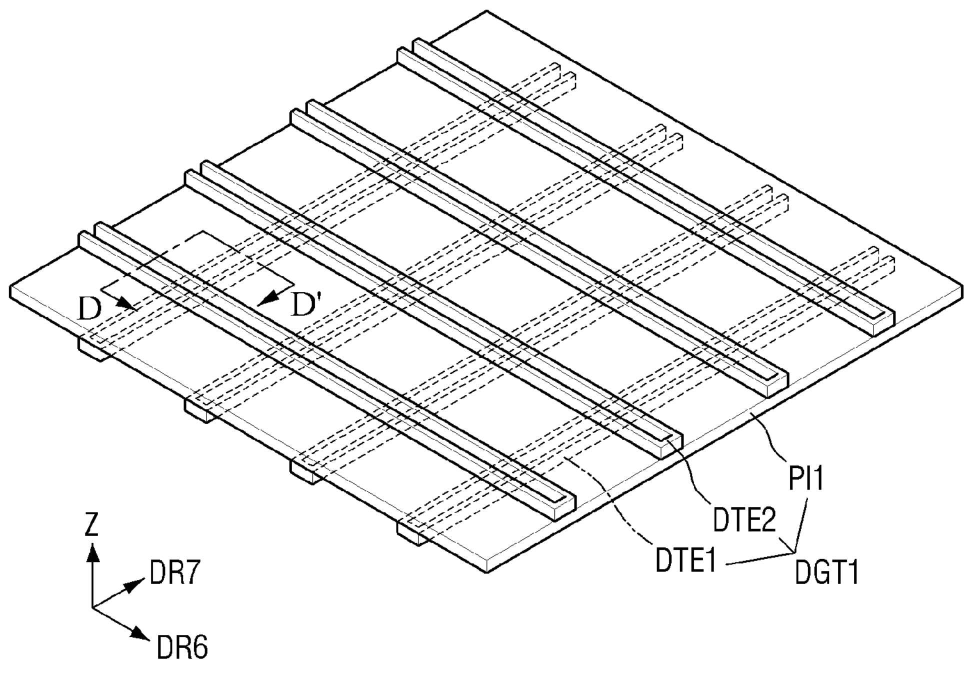
FIG. 75 is a perspective view showing an example of a digitizer layer of FIG. 74.
Figure 76:
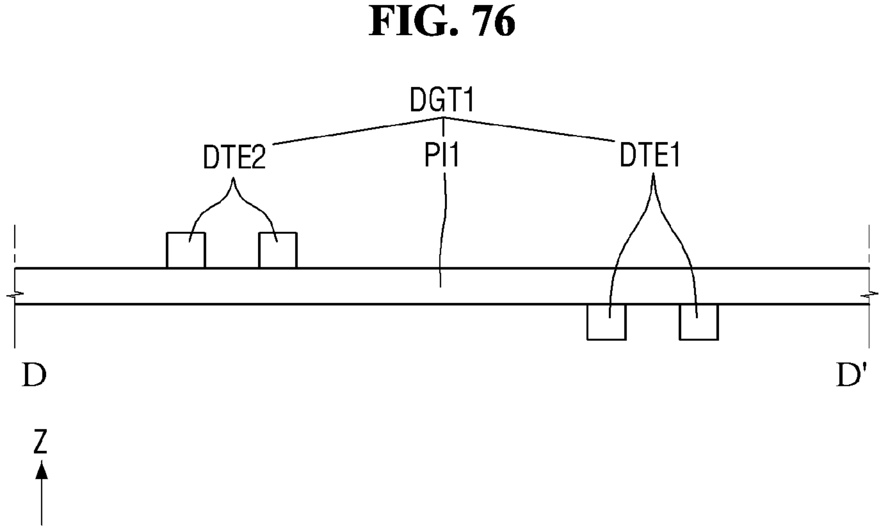
FIG. 76 is a schematic cross-sectional view showing an example of the digitizer layer of FIG. 74.

FIG. 74 is a schematic cross-sectional view showing a cover window and a display panel according to another embodiment. FIG. 75 is a perspective view showing an example of a digitizer layer of FIG. 74. FIG. 76 is a schematic cross-sectional view showing an example of the digitizer layer of FIG. 74. FIG. 76 shows an example of a schematic cross section of the digitizer layer, taken along line D-D' of FIG. 75.

Referring to FIGS. 74 to 76, the digitizer layer DGT is an electromagnetic (EM) touch panel and includes a loop electrode layer DGT1, a magnetic field blocking layer DGT2, and a conductive layer DGT3.

The loop electrode layer DGT1 may include first loop electrodes DTE1 and second loop electrodes DTE2 as shown in FIGS. 75 and 76. Each of the first loop electrodes DTE1 and the second loop electrodes DTE2 may be operated under the control of the touch driver 330, and may output detected signals to the touch driver 330.

The magnetic field or electromagnetic signal emitted by a digitizer input unit may be absorbed by the first loop electrodes DTE1 and the second loop electrodes DTE2, so that it may be possible to determine which position of the digitizer layer DGT the digitizer input unit is close to.

Alternatively, the first loop electrodes DTE1 and the second loop electrodes DTE2 may generate a magnetic field in response to an input current, and the generated magnetic field may be absorbed by the digitizer input unit. The digitizer input unit may emit the absorbed magnetic field again, and the magnetic field emitted by the digitizer input unit may be absorbed by the first loop electrodes DTE1 and the second loop electrodes DTE2.

The first loop electrodes DTE1 and the second loop electrodes DTE2 may be arranged or disposed so that they may be substantially perpendicular to each other. The first loop electrodes DTE1 may be extended in a seventh direction DR7 and may be spaced apart from one another in a sixth direction DR6 crossing or intersecting the seventh direction DR7. The second loop electrodes DTE2 may be extended in the sixth direction DR6 and may be spaced apart from one another in the seventh direction DR7. The seventh direction DR7 may be a direction perpendicular to the sixth direction DR6. The sixth direction DR6 may be substantially identical to the first direction (x-axis direction), and the seventh direction DR7 may be substantially identical to the second direction (y-axis direction). The first loop electrodes DTE1 may be used to detect a first axis coordinate of the digitizer input unit, and the second loop electrodes DTE2 may be used to detect a second axis coordinate of the digitizer input unit.

The digitizer input unit may generate an electromagnetic signal according to an operation of a resonant circuit including a coil and a capacitor to output it. The first loop electrodes DTE1 and the second loop electrodes DTE2 may convert an electromagnetic signal output from the digitizer input unit into an electrical signal and output it to the touch driver 330.

As shown in FIG. 76, the loop electrode layer DGT1 may include a first base substrate (or referred to as a base film) PI1, first loop electrodes DTE1 disposed on the lower surface of the first base substrate PI1, and the second loop electrodes DTE2 disposed on the upper surface of the first base substrate PI1. The first base substrate PI1 may be made of glass or plastic. The first loop electrodes DTE1 and the second loop electrodes DTE2 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The magnetic field blocking layer DGT2 may be disposed on the lower surface of the loop electrode layer DGT1. By flowing most of the magnetic field having passed through the loop electrode layer DGT1 in the magnetic field blocking layer DGT2, the strength of the magnetic field passing through the magnetic field blocking layer DGT2 to reach the conductive layer DGT3 may be significantly reduced.

The conductive layer DGT3 may be disposed on the lower surface of the magnetic field blocking layer DGT2. The conductive layer DGT3 can prevent the loop electrode layer DGT1 and the circuit board disposed under or below the conductive layer DGT3 from interfering with each other. The conductive layer DGT3 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

Figure 77:
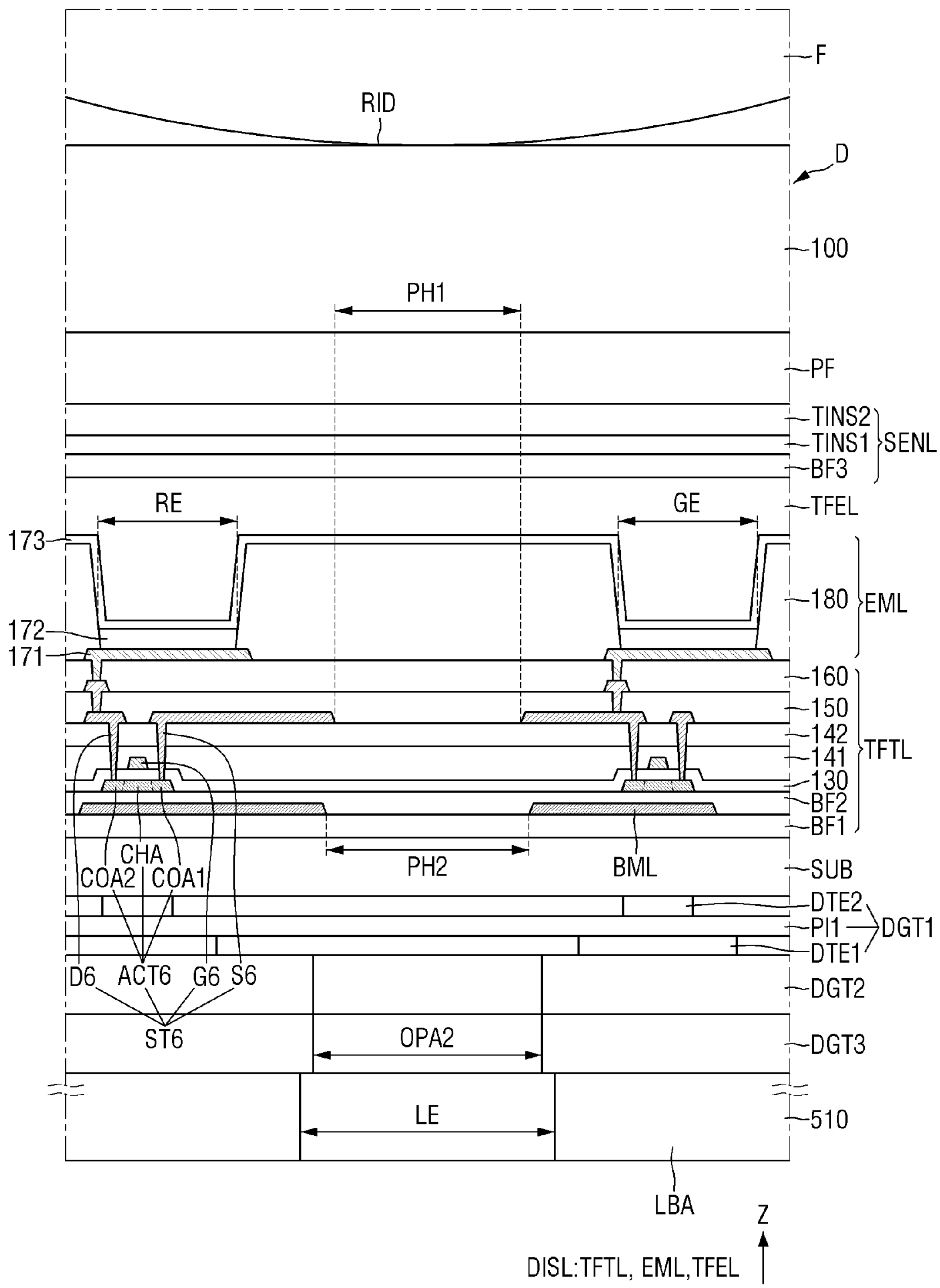
FIG. 77 is a schematic cross-sectional view showing an example of a substrate, a display layer and a sensor electrode layer of the display panel of FIG. 74, a digitizer layer and an optical sensor.

FIG. 77 is a schematic cross-sectional view showing an example of a substrate, a display layer and a sensor electrode layer of the display panel of FIG. 74, a digitizer layer and an optical sensor. FIG. 77 is an enlarged schematic cross-sectional view showing area D of FIG. 76.

An embodiment of FIG. 77 may be different from an embodiment of FIG. 63 or the embodiment of FIG. 66 in that a digitizer layer DGT may be added between the substrate SUB and the optical sensor 510.

Referring to FIG. 77, the first loop electrodes DTE1 and the second loop electrodes DTE2 of the digitizer layer DGT may not overlap the light-receiving areas LE of the optical sensor 510 in the third direction (z-axis direction). The magnetic field blocking layer DGT2 and the conductive layer DGT3 of the digitizer layer DGT may include an opening OPA2 overlapping with the light-receiving areas LE of the optical sensor 510 in the third direction (z-axis direction). Therefore, the light passing through the first pin hole PH1 of the display layer DISL and the second pin hole PH2 of the pressure sensor electrode PSE or the first light-blocking layer BML may not be blocked by the digitizer layer DGT but may reach the light-receiving areas LE of the optical sensor 510. Therefore, the optical sensor 510 can detect light incident from above the display panel 300.

For example, In a case that the optical sensor 510 is a fingerprint sensor, light emitted from the emission areas RE and GE may be reflected off the fingerprint of the finger F placed on the cover window 100. The reflected light may pass through the first pin hole PH1 of the display layer DISL, the second pin hole PH2 of the pressure sensor electrode PSE and the opening OPA2 of the digitizer layer DGT, and may be detected in the light-receiving area LE of the optical sensor 510. Therefore, the optical sensor 510 can recognize the fingerprint of a person's finger F based on the amount of light detected in the light-receiving areas LE.

Figure 78:
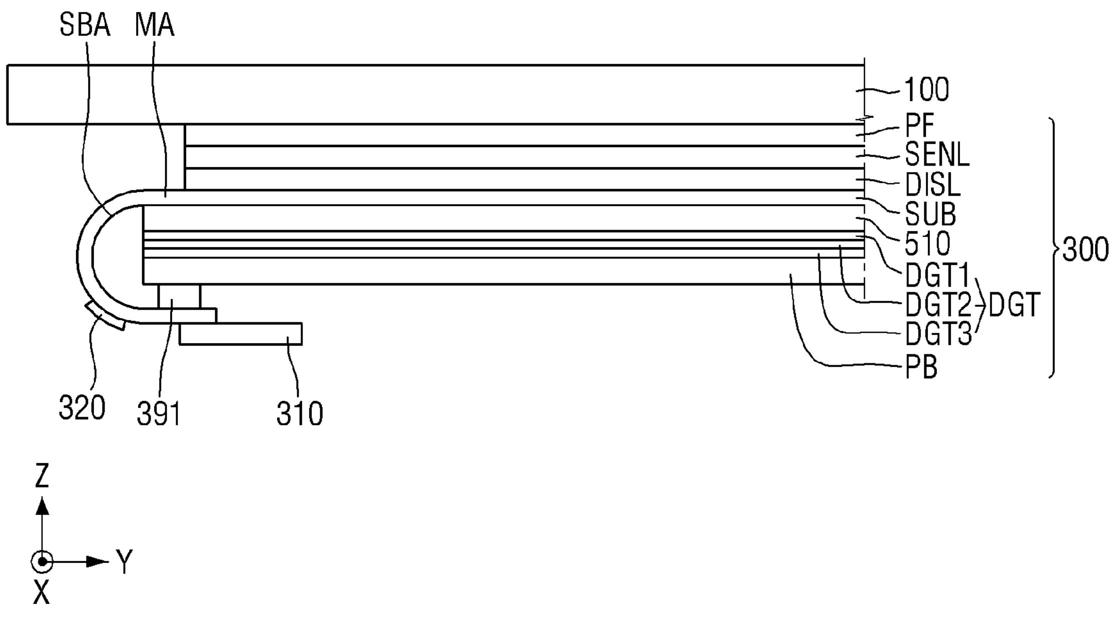
FIG. 78 is a schematic cross-sectional view showing a cover window and a display panel according to an embodiment.

FIG. 78 is a schematic cross-sectional view showing a cover window and a display panel according to another embodiment.

An embodiment of FIG. 78 may be different from an embodiment of FIG. 74 in that a digitizer layer DGT may be disposed on the lower surface of the optical sensor 510.

Referring to FIG. 78, the digitizer layer DGT may be substantially identical to that described above with reference to FIGS. 75 and 76. Since the digitizer layer DGT is disposed on the lower surface of the optical sensor 510, the digitizer layer DGT does not block light incident on the light-receiving areas LE of the optical sensor 510. Therefore, the first loop electrodes DTE1 and the second loop electrodes DTE2 of the digitizer layer DGT may or may not overlap the light-receiving areas LE of the optical sensor 510 in the third direction (z-axis direction). The magnetic field blocking layer DGT2 and the conductive layer DGT3 of the digitizer layer DGT may not include an opening.

Figure 79:
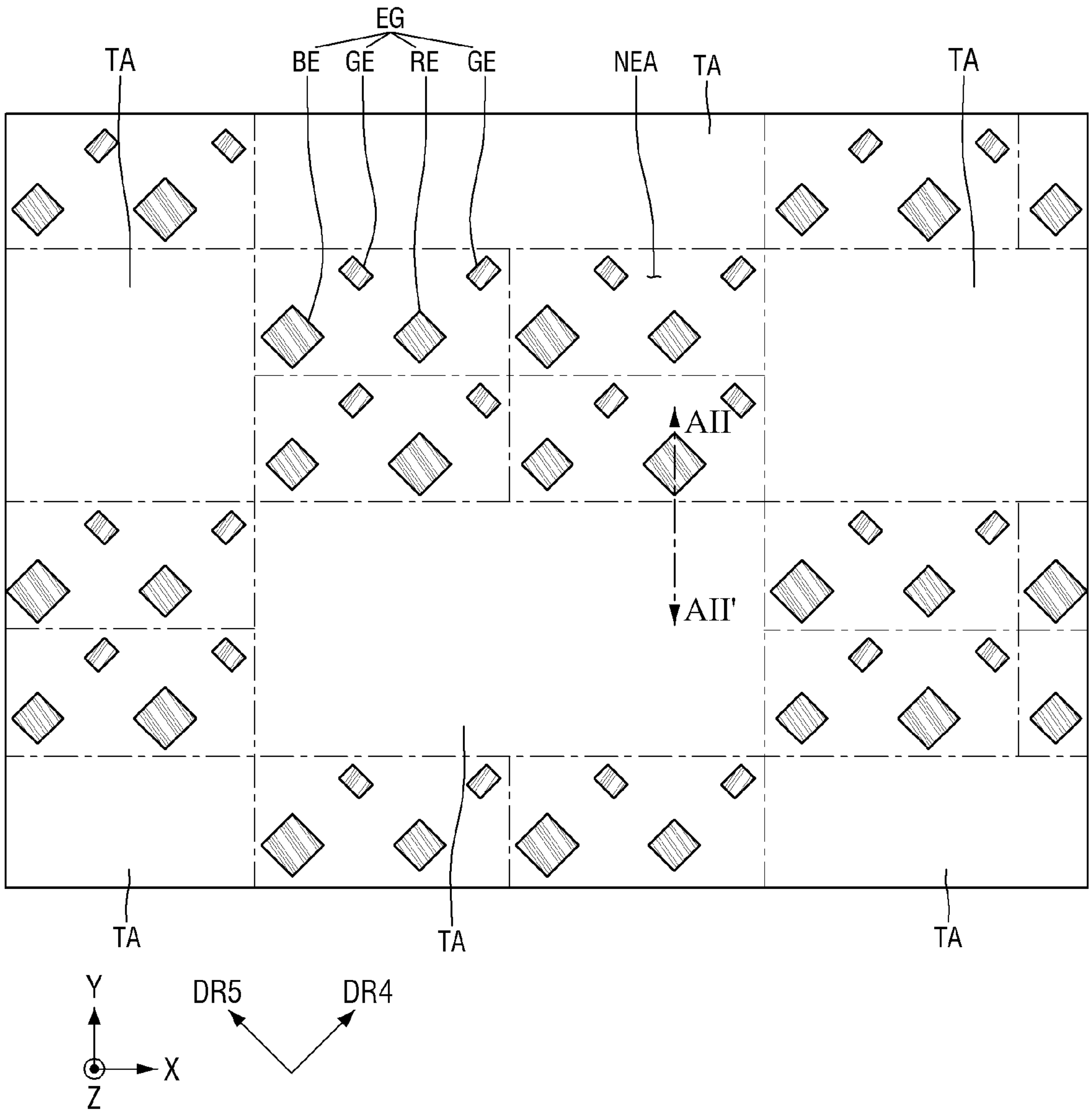
FIG. 79 is a view showing an example of a layout of emission areas of display pixels in a sensor area.

FIG. 79 is a view showing an example of a layout of emission areas of display pixels in a sensor area.

According to an embodiment of FIG. 79, the optical sensor 510 may be an illuminance sensor that senses light incident from the outside to determine an illuminance of an environment in which the display device 10 may be placed, or an optical proximity sensor that irradiates light onto the display device 10 and senses light reflected by an object to determine whether the object is disposed in proximity to the optical proximity sensor.

Referring to FIG. 79, the sensor area SA may include first to third emission areas RE, GE and BE, and transmissive areas TA. The first emission areas RE, the second emission areas GE and the third emission areas BE may be substantially identical to those described above with reference to FIGS. 7 and 8. Therefore, the first emission areas RE, the second emission areas GE and the third emission areas BE will not be described again.

The transmissive areas TA may transmit light incident on the display panel 300. Each of the transmissive areas TA may be surrounded by the emission areas RE, GE and BE. Alternatively, the emission areas RE, GE and BE may be adjacent to the transmissive areas TA. Each of the transmissive areas TA may be substantially equal to the area where I emission groups EG may be disposed, where I is a positive integer. The transmissive areas TA and the I emission groups EG may be alternately arranged or disposed in the first direction (x-axis direction) and the second direction (y-axis direction). The transmissive areas TA and the four emission groups EG may be alternately arranged or disposed in the first direction (x-axis direction) and the second direction (y-axis direction).

Due to the transmissive areas TA, the number of the emission areas RE, GE and BE per unit area in the sensor area SA may be smaller than the number of the emission areas RE, GE and BE per unit area in the display area DA. Due to the transmissive areas TA, the area of the emission areas RE, GE and BE with respect to the sensor area SA may be smaller than the area of the emission areas RE, GE and BE with respect to the display area DA.

As shown for example in FIG. 71 even in a case that the optical sensor 510 is disposed on the lower surface of the display panel 300, the optical sensor 510 may sense light incident on the upper surface of the display panel 300 due to the transmissive areas TA.

Figure 80:
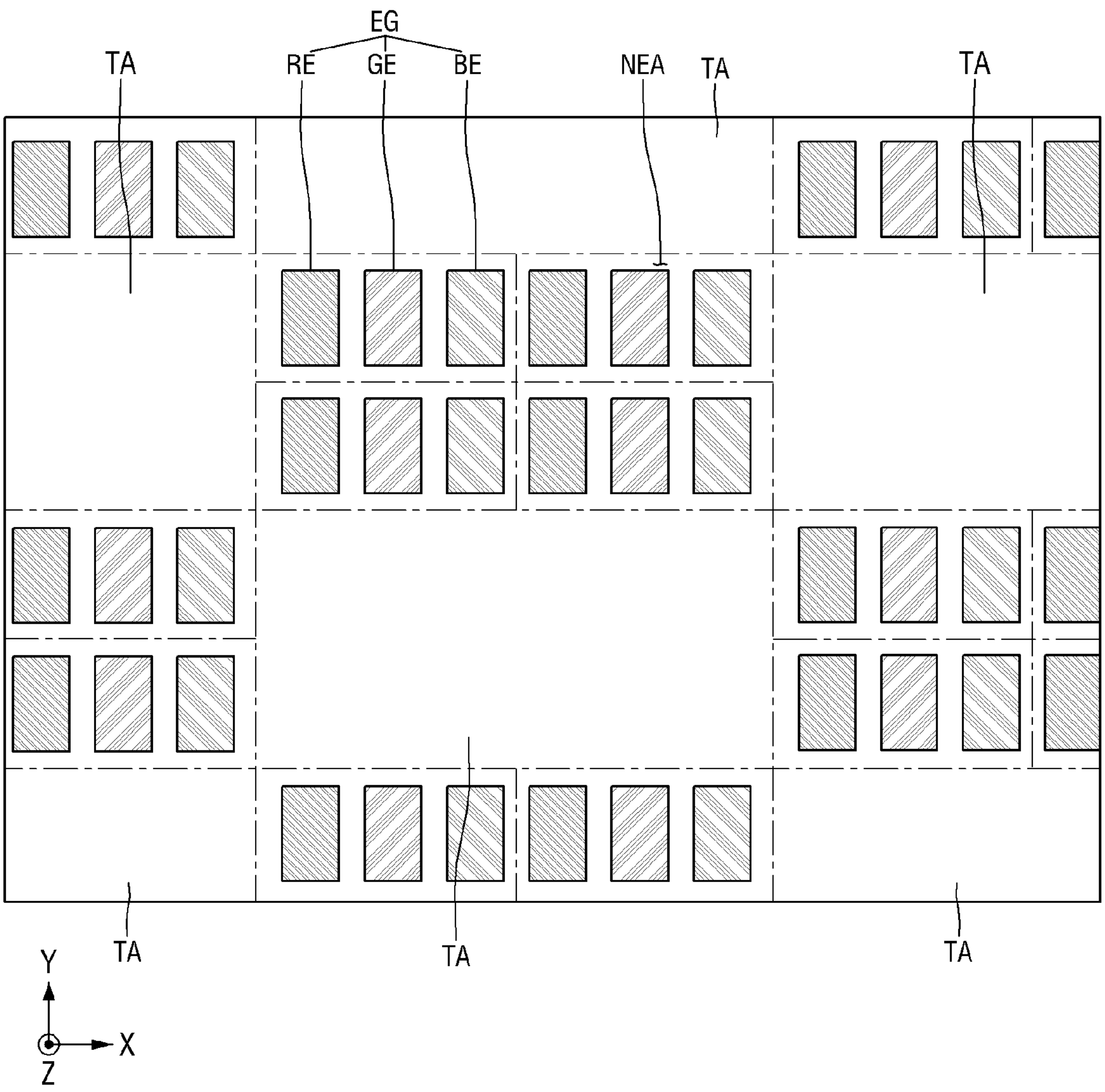
FIG. 80 is a view showing another example of a layout of emission areas of display pixels in a sensor area.

FIG. 80 is a view showing another example of a layout of emission areas of display pixels in a sensor area.

An embodiment of FIG. 80 may be different from an embodiment of FIG. 79 in that the first to third emission areas RE, GE and BE may be arranged or disposed sequentially and repeatedly in the first direction (x-axis direction) while the first to third emission areas RE, GE and BE, respectively, may be arranged or disposed side by side in the second direction (y-axis direction), and that each of the first emission areas RE, the second emission areas GE and the third emission areas BE may have a substantially rectangular shape when viewed from the top.

Figure 81:
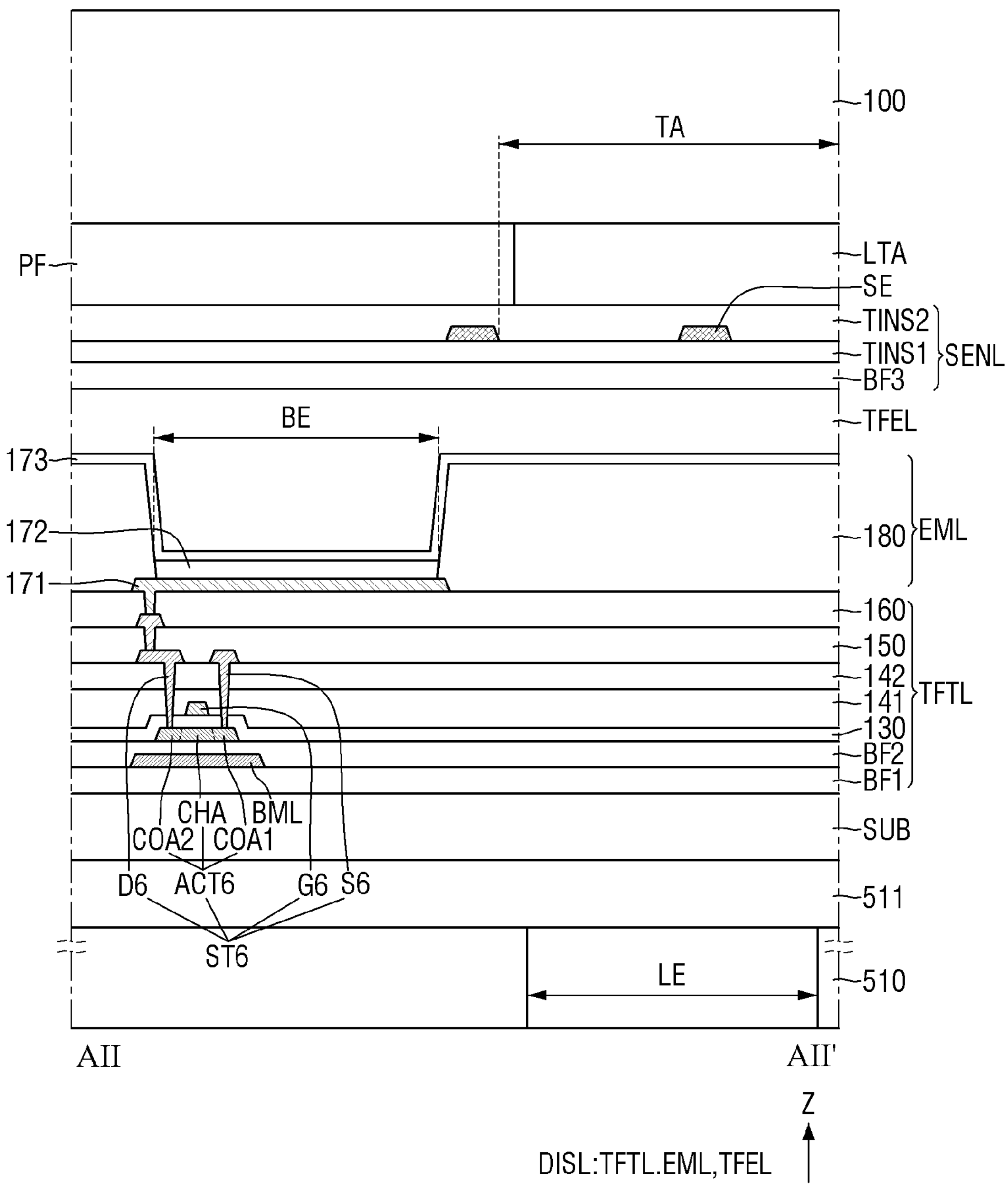
FIG. 81 is a schematic cross-sectional view showing a substrate, a display layer and a sensor electrode layer of the display panel, and the optical sensor of FIG. 79.

FIG. 81 is a schematic cross-sectional view showing a substrate, a display layer and a sensor electrode layer of the display panel, and the optical sensor of FIG. 79. FIG. 81 shows an example of the substrate SUB, the display layer DISL and the sensor electrode layer SENL of the display panel 300 and the optical sensor 510, taken along line AII-AII' of FIG. 79.

Referring to FIG. 81, since the display pixels DP1, DP2 and DP3 including the emission areas RE, GE and BE are not disposed in the transmissive area TA, the active layer ACT6, the gate electrode G6, the first electrode S6 and the second electrode D6 of the sixth thin-film transistor ST6, the first connection electrode ANDE1, the second connection electrode ANDE2, the first light-blocking layer BML, and the first light-emitting electrode 171 may not be disposed in the transmissive areas TA. Therefore, it may be possible to prevent the amount of the light passing through the transmissive areas TA from being reduced which may occur in a case that the light may be covered or overlapped by the active layer ACT6, the gate electrode G6, the first electrode S6 and the second electrode D6 of the sixth thin-film transistor ST6, the first connection electrode ANDE1, the second connection electrode ANDE2, the first light-blocking layer BML and the first light-emitting electrode 171.

The light-transmitting area LTA of the polarizing film PF may overlap the transmissive area TA in the third direction (z-axis direction). In this manner, it may be possible to prevent the amount of light passing through the transmissive area TA from decreasing due to the polarizing film PF.

Figure 82:
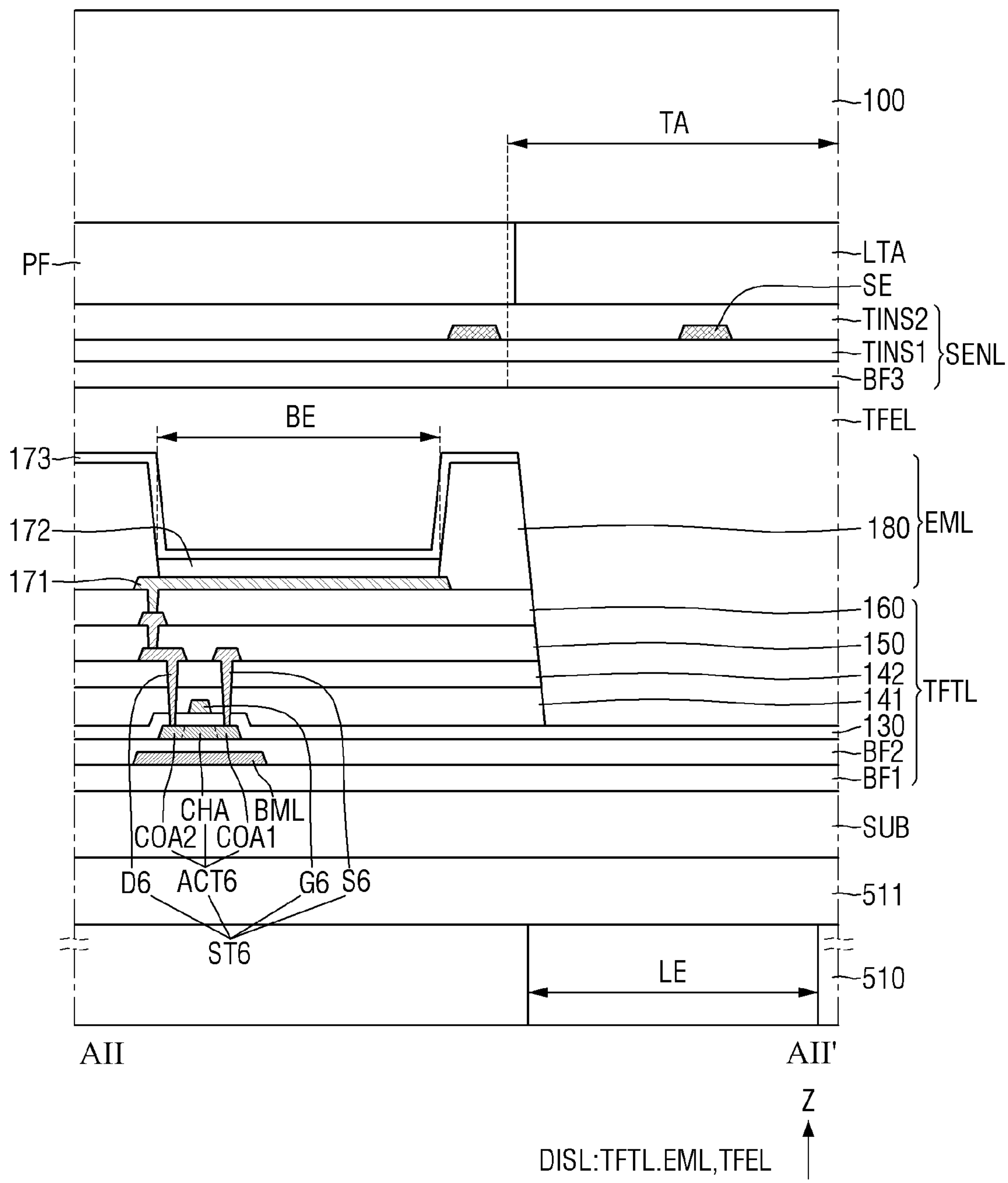
FIG. 82 is a schematic cross-sectional view showing a substrate, a display layer and a sensor electrode layer of the display panel, and the optical sensor of FIG. 79.

FIG. 82 is a schematic cross-sectional view showing a substrate, a display layer and a sensor electrode layer of the display panel, and the optical sensor of FIG. 79.

An embodiment of FIG. 82 may be different from an embodiment of FIG. 81 in that at least one electrode and insulating layer may be eliminated from the transmissive area TA.

Referring to FIG. 82, a first interlayer dielectric layer 141, a second interlayer dielectric layer 142, a first organic layer 150, a second organic layer 160, a bank 180, and a second light-emitting electrode 173 may be made of a material that transmits light, with different refractive indexes. Therefore, by eliminating the first interlayer dielectric layer 141, the second interlayer dielectric layer 142, the first organic layer 150, the second organic layer 160, the bank 180 and the second light-emitting electrode 173 from the transmissive area TA, it may be possible to further increase the transmittance of the transmissive area TA.

Although the first buffer layer BF1, the second buffer layer BF2 and the gate insulating layer 130 are not eliminated from the transmissive area TA in the example shown in FIG. 82, the disclosure is not limited thereto. At least one of the first buffer layer BF1, the second buffer layer BF2 and the gate insulating layer 130 may be eliminated from the transmissive area TA.

Figure 83:
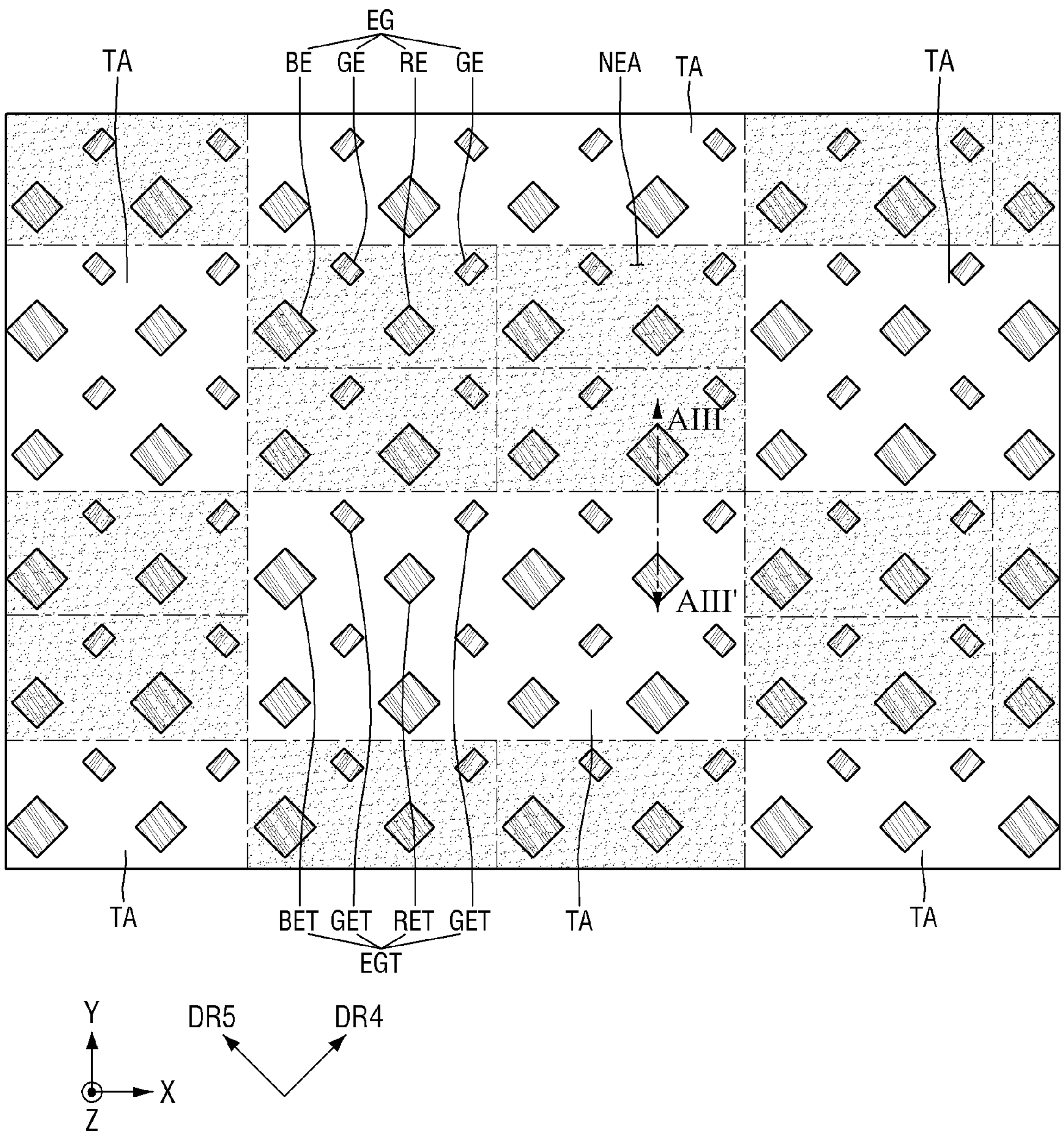
FIG. 83 is a view showing another example of a layout of emission areas of display pixels in a sensor area.

FIG. 83 is a view showing another example of a layout of emission areas of display pixels in a sensor area.

An embodiment of FIG. 83 may be different from an embodiment of FIG. 79 in that transparent emission areas RET, GET and BET may be disposed in the transmissive areas TA.

Referring to FIG. 83, each of the first transparent emission areas RET may emit light of a first color and also transmit light. Each of the second transparent emission areas GET may emit light of a second color and also transmit light. Each of the third transparent emission areas BET may emit light of a third color and also transmit light. The arrangement and shapes of the first transparent emission areas RET, the second transparent emission areas GET and the third transparent emission areas BET may be substantially the same as those of the first emission areas RE and the second emission areas GE and the third emission areas BE. The first transparent emission areas RET, the second transparent emission areas GET, and the third transparent emission areas BET, may be collectively referred to as transparent emission area RET, GET and BET.

For example, in the example shown in FIG. 83, each of the first transparent emission areas RET, the second transparent emission areas GET and the third transparent emission areas BET may have a substantially diamond shape or a substantially rectangular shape when viewed from the top. It is, however, to be understood that the disclosure is not limited thereto. Each of the first transparent emission areas RET, the second transparent emission areas GET and the third transparent emission areas BET may have other polygonal shape than a quadrangular shape, a circular shape or an elliptical shape when viewed from the top. Although the area of the third transparent emission areas BET is the largest while the area of the second transparent emission areas GET is the smallest in the example shown in FIG. 83, the disclosure is not limited thereto.

One first transparent emission area RET, two second transparent emission areas GET and one third transparent emission area BET may be defined as a single transparent emission group EGT for representing black-and-white or grayscale. In other words, the black-and-white or grayscale may be represented by a combination of light emitted from one first transparent emission area RET, light emitted from two second transparent emission areas GET, and light emitted from one third transparent emission area BET.

The second transparent emission areas GET may be disposed in odd rows. The second transparent emission areas GET may be arranged or disposed side by side in each of the odd rows in the first direction (x-axis direction). For every two adjacent, second transparent emission areas GET arranged or disposed in the first direction (x-axis direction) in each of the odd rows, one may have longer sides in the fourth direction DR4 and shorter sides in the fifth direction DR5, while the other may have longer sides in the fifth direction DR5 and shorter sides in the fourth direction DR4.

The first transparent emission areas RET and the third transparent emission areas BET may be arranged or disposed in even rows. The first transparent emission areas RET and the third transparent emission areas BET may be disposed side by side in each of the even rows in the first direction (x-axis direction). The first transparent emission areas RET and the third transparent emission areas BET may be arranged or disposed alternately in each of the even rows.

The second transparent emission areas GET may be disposed in even columns. The second transparent emission areas GET may be arranged or disposed side by side in each of the even columns in the second direction (y-axis direction). For every two adjacent, second transparent emission areas GET arranged or disposed in the second direction (y-axis direction) in each of the even columns, one may have longer sides in the fourth direction DR4 and shorter sides in the fifth direction DR5, while the other may have longer sides in the fifth direction DR5 and shorter sides in the fourth direction DR4.

The first transparent emission areas RET and the third transparent emission areas BET may be arranged or disposed in odd columns. The first transparent emission areas RET and the third transparent emission areas BET may be disposed side by side in each of the odd columns in the second direction (y-axis direction). The first transparent emission areas RET and the third transparent emission areas BET may be arranged or disposed alternately in each of the odd columns.

As shown in FIG. 83, the transparent emission areas RET, GET and BET that may emit light and also transmit light may be disposed in the transmissive area TA, and thus the light incident from the upper surface of the display panel 300 may be provided to the optical sensor 510 through the transparent emission areas RET, GET and BET. For example, even if the optical sensor 510 is disposed on the lower surface of the display panel 300, the optical sensor 510 may detect light incident on the upper surface of the display panel 300.

Figure 84:
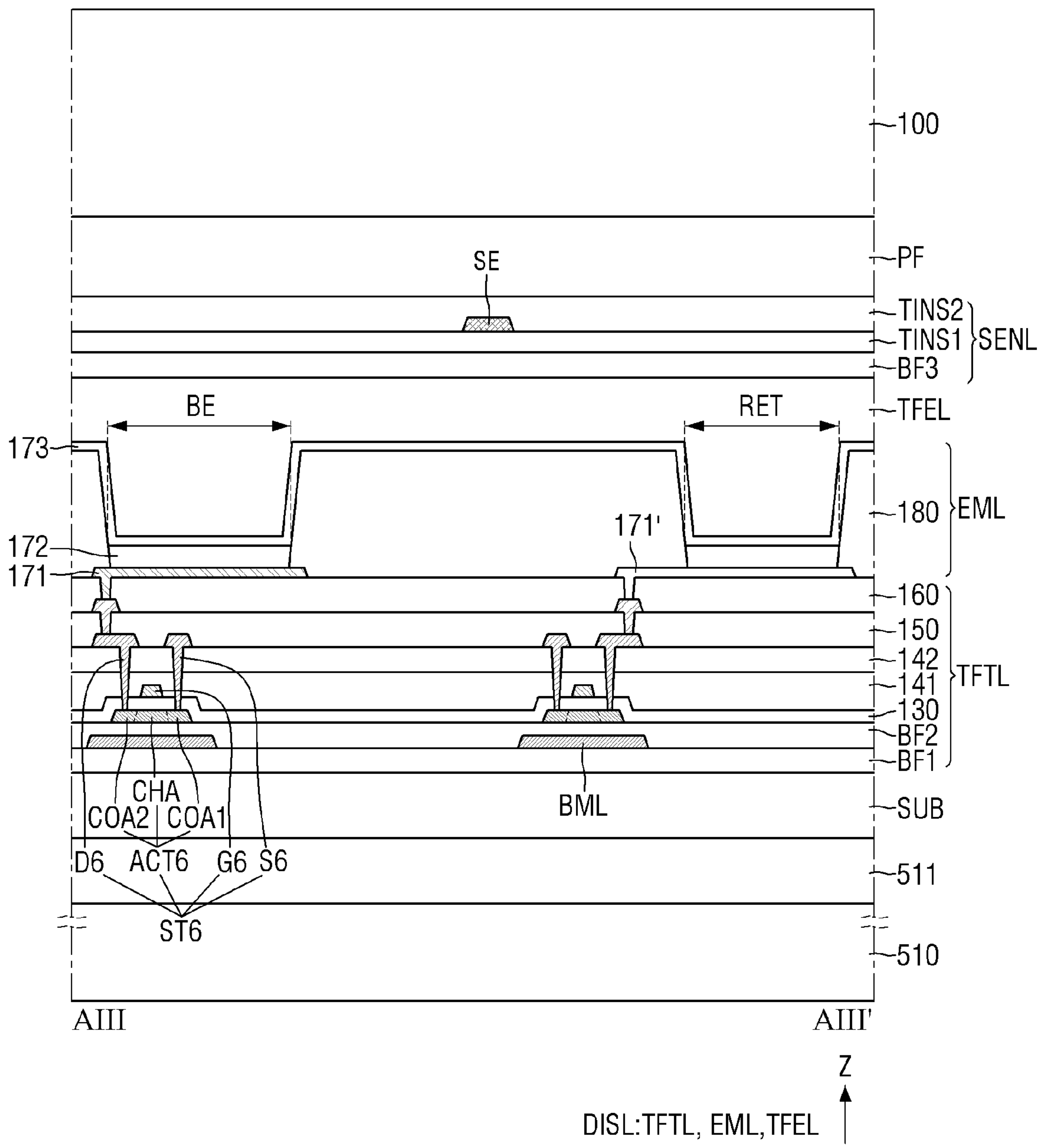
FIG. 84 is a schematic cross-sectional view showing a substrate, a display layer and a sensor electrode layer of the display panel, and the optical sensor of FIG. 83.

FIG. 84 is a schematic cross-sectional view showing a substrate, a display layer and a sensor electrode layer of the display panel, and the optical sensor of FIG. 83. FIG. 84 shows an example of the substrate SUB, the display layer DISL and the sensor electrode layer SENL of the display panel 300 and the optical sensor 510, taken along line AIII-AIII' of FIG. 83.

Referring to FIG. 84, a first transparent light-emitting electrode 171' of the first transparent emission area RET may be formed of a transparent conductive material TCO that can transmit light, such as ITO and IZO. The thin-film transistors may not be disposed in the first transparent emission area RET. Therefore, light incident from the upper surface of the display panel 300 may not be blocked in the first transparent emission area RET. Accordingly, even if the optical sensor 510 is disposed on the lower surface of the display panel 300, the optical sensor 510 can detect light incident on the upper surface of the display panel 300.

The second transparent emission area GET and the third transparent emission area BET may also be substantially identical to the first transparent emission area RET described above with reference to FIG. 84.

Figure 85A:
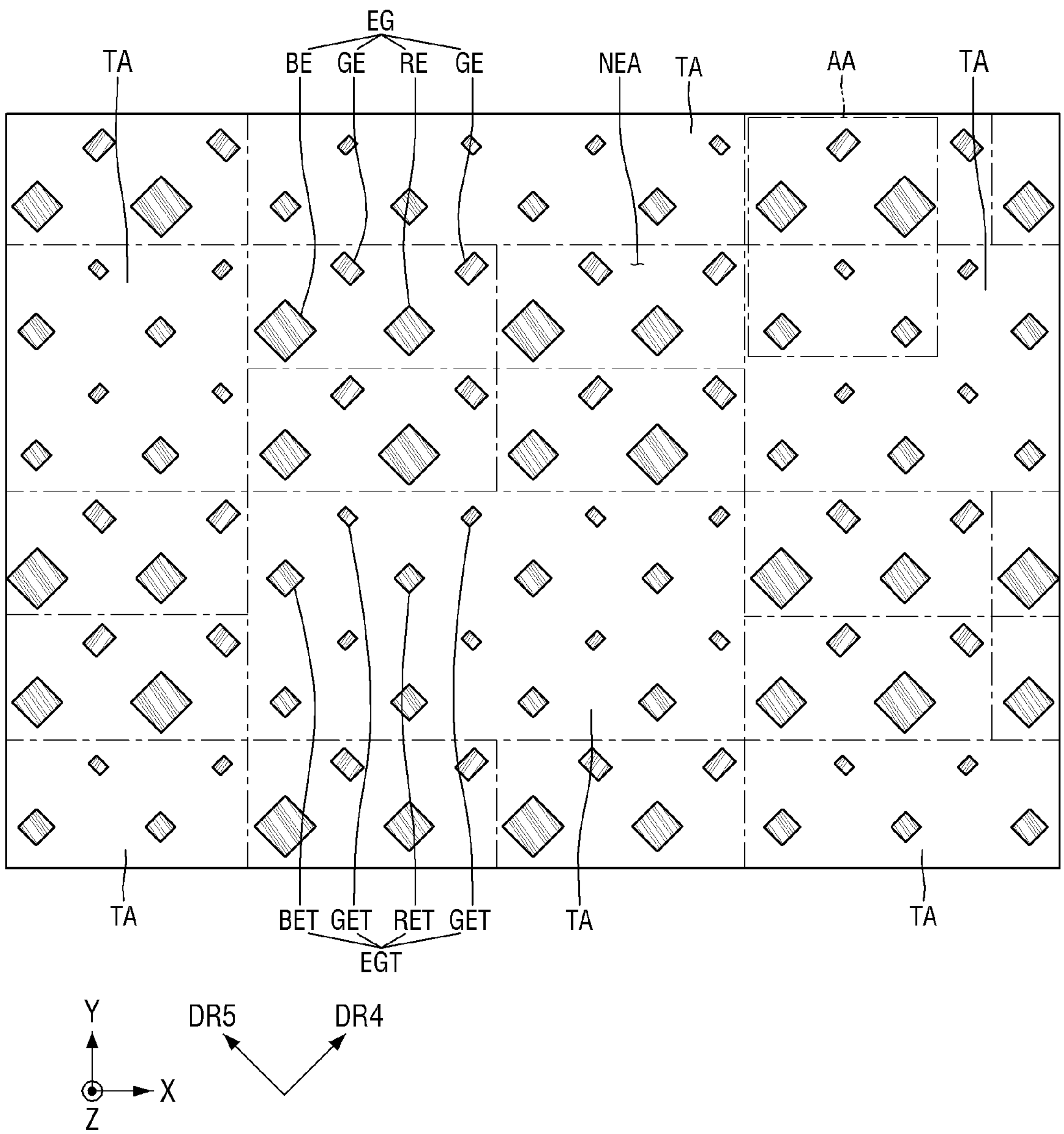
FIG. 85A is a view showing another example of a layout of emission areas of display pixels of a sensor area.
Figure 85B:
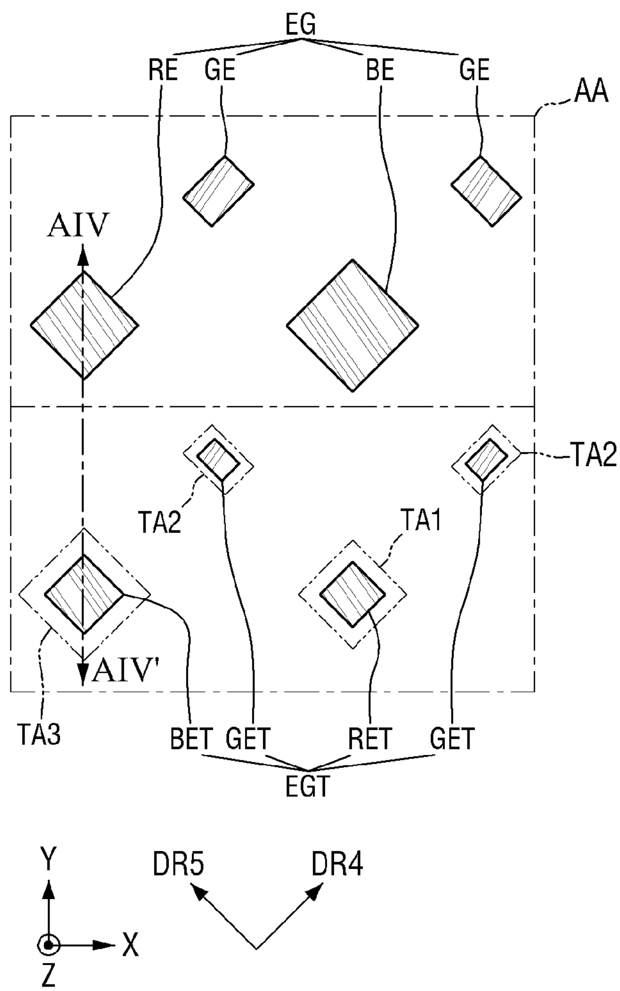
FIG. 85B is an enlarged view showing a layout of area AA of FIG. 85A.

FIG. 85A is a view showing another example of a layout of emission areas of display pixels of a sensor area. FIG. 85B is an enlarged view showing a layout of area AA of FIG. 85A.

An embodiment of FIG. 85A may be different from an embodiment of FIG. 83 in that the area of the first transparent emission area RET may be smaller than that of the first emission area RE, the area of the second transparent emission area GET may be smaller than that of the second emission area GE, and the area of the third transparent emission area BET may be smaller than that of the third emission area BE.

Referring to FIG. 85B, the transmissive areas TA may include first transmissive areas TA1, second transmissive areas TA2, and third transmissive areas TA3. Each of the first transmissive areas TA1 may include the first transparent emission area RET that emits light of the first color and also transmits light. Each of the second transmissive areas TA2 may include the second transparent emission area GET that emits light of the second color and also transmits light. Each of the third transmissive areas TA3 may include the third transparent emission area BET that emits light of the third color and also transmits light.

The area of the first transparent emission area RET may be approximately 50% of the area of the first emission area RE, the area of the second transparent emission area GET may be approximately 50% of the area of the second emission area GE, and the area of the third transparent emission area BET may be approximately 50% of the area of the third emission area BE. In such case, the first transparent light-emitting electrode 171' and the emissive layer 172 are not disposed in the area of the first transmissive area TA1 other than the first transparent emission area RET, and thus it may have a higher transmittance than the first transparent emission area RET. The first transparent light-emitting electrode 171' and the emissive layer 172 are not disposed in the area of the second transmissive area TA2 other than the second transparent emission area GET, and thus it may have a higher transmittance than the second transparent emission area GET. The first transparent light-emitting electrode 171' and the emissive layer 172 are not disposed in the area of the third transmissive area TA3 other than the third transparent emission area BET, and thus it may have a higher transmittance than the third transparent emission area BET.

As shown in FIG. 85B, the transparent emission areas RET, GET and BET that can emit light and also transmit light are disposed in the first to third transmissive areas TA1, TA2 and TA3, the light incident from the upper surface of the display panel 300 may be provided to the optical sensor 510 through the transparent emission areas RET, GET and BET. In this manner, the amount of light incident on the optical sensor 510 may be increased, so that the light may be sensed more accurately by the optical sensor 510.

Figure 86:
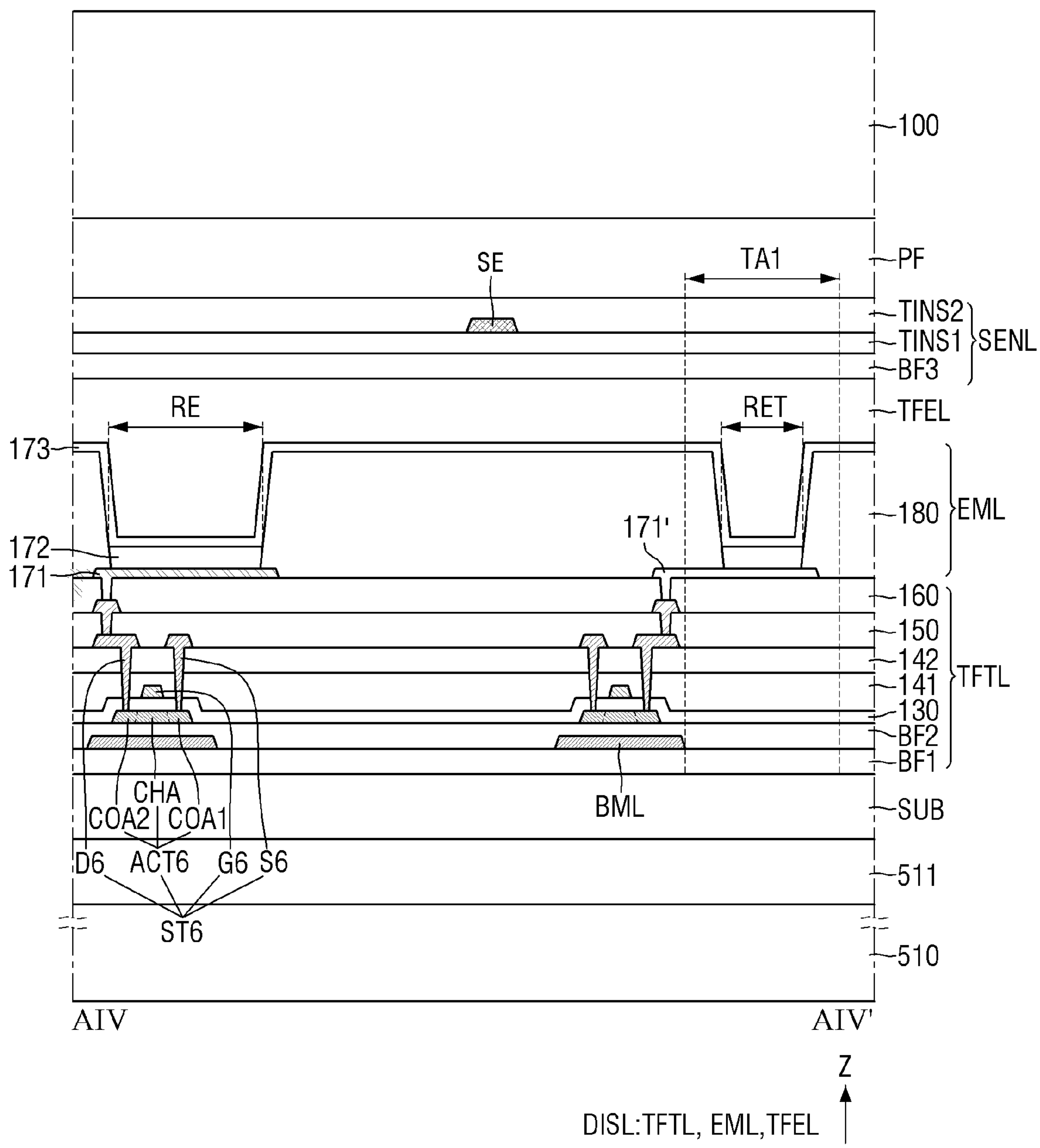
FIG. 86 is a schematic cross-sectional view showing a substrate, a display layer and a sensor electrode layer of the display panel, and the optical sensor of FIG. 85B.

FIG. 86 is a schematic cross-sectional view showing a substrate, a display layer and a sensor electrode layer of the display panel, and the optical sensor of FIG. 85B. FIG. 86 shows an example of the substrate SUB, the display layer DISL and the sensor electrode layer SENL of the display panel 300 and the optical sensor 510, taken along line AIV-AIV' of FIG. 85B.

Referring to FIG. 86, a first transparent light-emitting electrode 171' of the first transparent emission area RET may be formed of a transparent conductive material TCO that can transmit light, such as ITO and IZO. The thin-film transistors may not be disposed in the first transparent emission area RET. Therefore, light incident from the upper surface of the display panel 300 may not be blocked in the first transparent emission area RET. The thin-film transistors disposed in the first transmissive area TA1 may be reduced. Therefore, light incident from the upper surface of the display panel 300 can transmit the first transmissive area TA1 substantially without being blocked. Accordingly, even if the optical sensor 510 is disposed on the lower surface of the display panel 300, the optical sensor 510 can detect light incident on the upper surface of the display panel 300.

The second transparent emission area GET and the second transmissive area TA2, the third transparent emission area BET and the third transmissive area TA3 may be substantially identical to the first transparent emission area RET and the first transmissive area TA1 described above with reference to FIG. 86.

Figure 87:
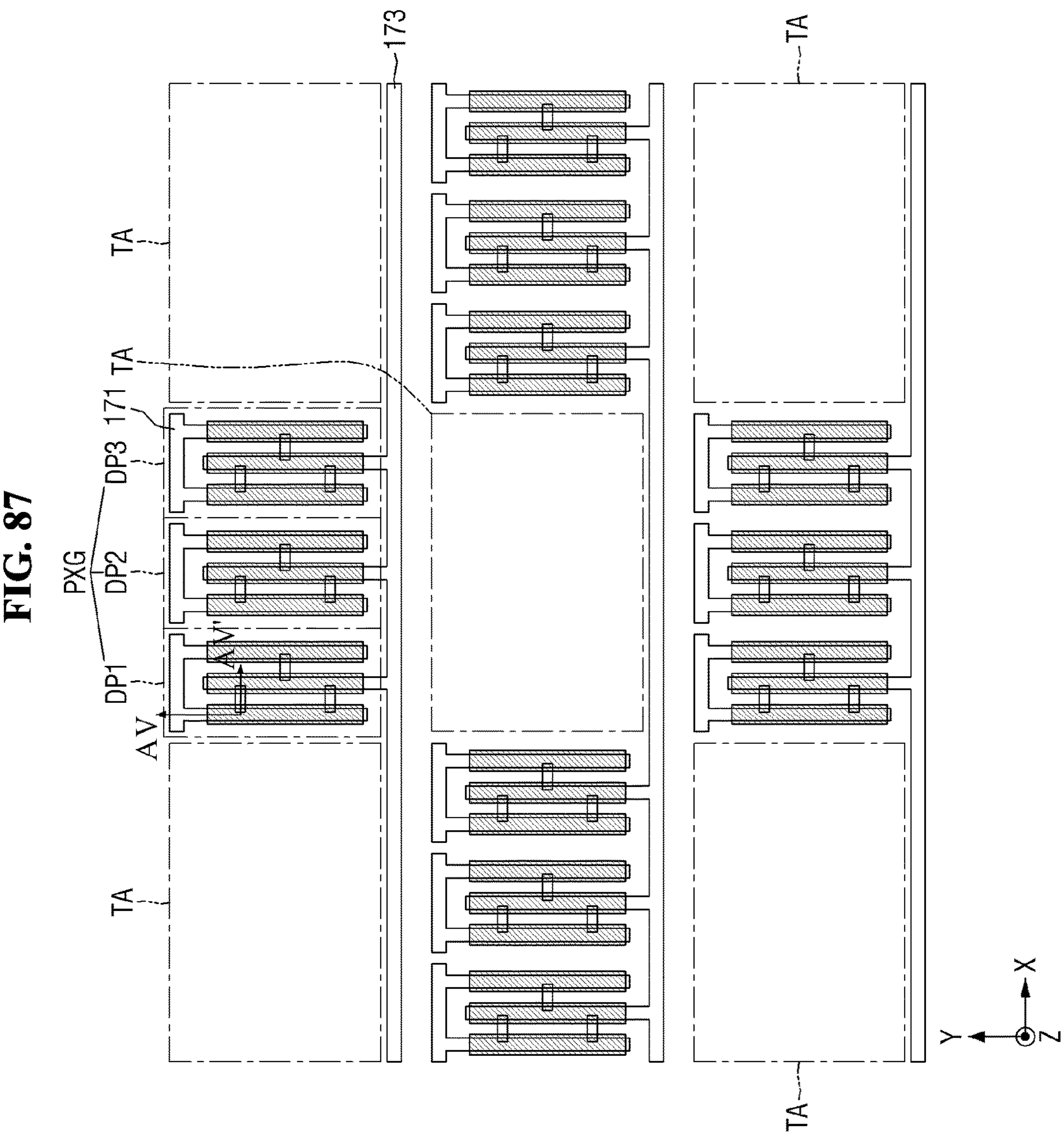
FIG. 87 is a view showing an example of a layout of display pixels in a sensor area.

FIG. 87 is a view showing an example of a layout of display pixels in a sensor area.

According to the embodiment of FIG. 87, the optical sensor 510 may be an optical fingerprint sensor, an illuminance sensor that senses light incident from the outside to determine an illuminance of an environment in which the display device 10 is placed, or an optical proximity sensor that irradiates light onto the display device 10 and senses light reflected by an object to determine whether the object is disposed in proximity to it.

Referring to FIG. 87, the sensor area SA may include first to third display pixels DP1, DP2 and DP3, and transmissive areas TA. The first display pixels DP1, the second display pixels DP2 and the third display pixels DP3 are substantially identical to those described above with reference to FIGS. 37 and 39. Therefore, the first display pixels DP1, the second display pixels DP2 and the third display pixels DP3 will not be described.

The second electrode stem 173S may be electrically connected to the second electrode branch 173B of each of the display pixels DP1, DP2 and DP3 arranged or disposed in the first direction (x-axis direction). Therefore, the second electrode stem 173S may be extended in the first direction (x-axis direction) regardless of whether the display pixels DP1, DP2 and DP3 are eliminated from the transmissive areas TA.

The transmissive areas TA transmit light incident on the display panel 300 as it is. Each of the transmissive areas TA may be surrounded by the display pixels DP1, DP2 and DP3. The area of each of the transmissive areas TA may be substantially equal to the area of the area where I display pixel groups PXG are disposed. The transmissive areas TA and the I display pixel groups PXG may be alternately arranged or disposed in the first direction (x-axis direction) and the second direction (y-axis direction). For example, the area of each of the transmissive areas TA may be substantially equal to the area of the area where one display pixel group PXG is disposed. The transmissive areas TA and the display pixel groups PXG may be arranged or disposed one after another in the first direction (x-axis direction) and the second direction (y-axis direction).

As shown in FIG. 87, even in a case that the optical sensor 510 is disposed on the lower surface of the display panel 300, the optical sensor 510 can sense light incident on the upper surface of the display panel 300 due to the transmissive areas TA.

Figure 88:
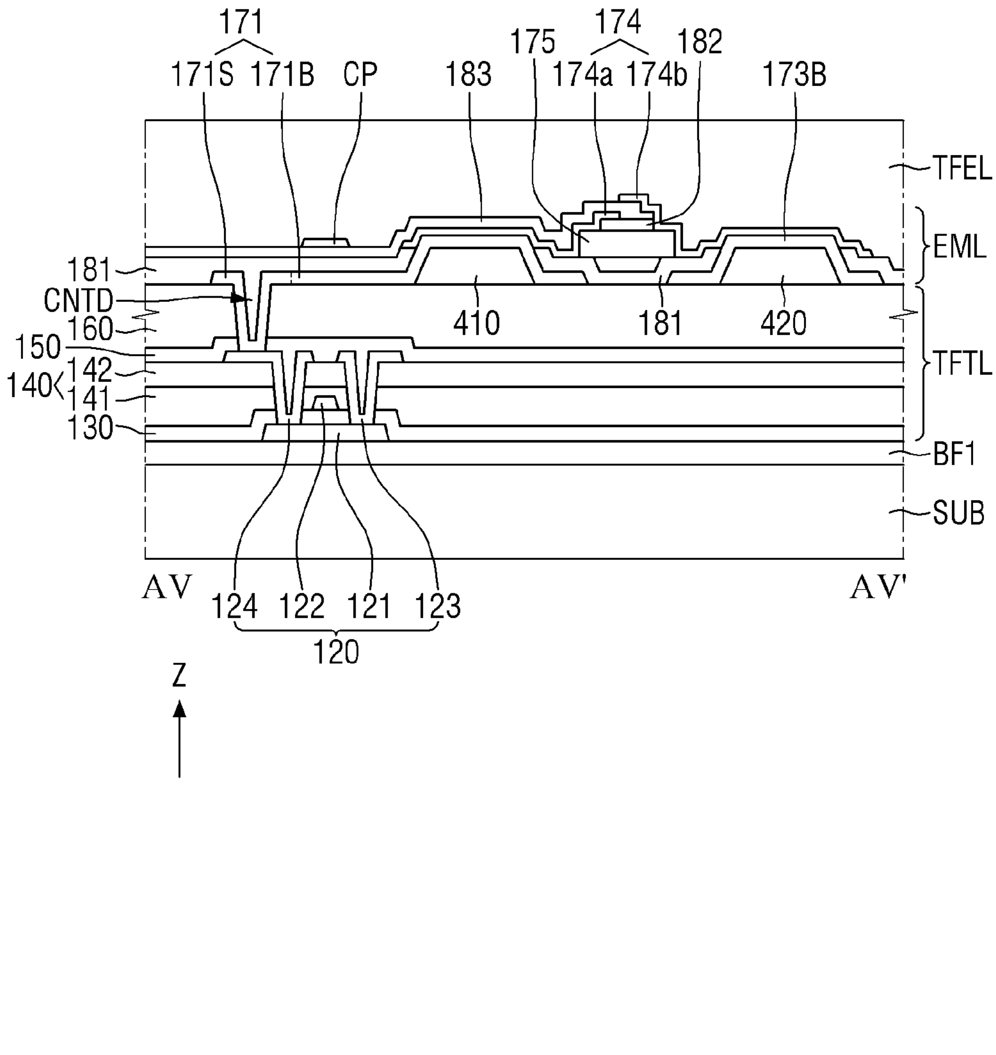
FIG. 88 is a schematic cross-sectional view showing a substrate, a display layer and a sensor electrode layer of the display panel, and the optical sensor of FIG. 87.

FIG. 88 is a schematic cross-sectional view showing a substrate, a display layer and a sensor electrode layer of the display panel, and the optical sensor of FIG. 87. FIG. 88 shows a schematic cross section of the first display pixel DP1, taken along line AV-AV' of FIG. 87.

An embodiment of FIG. 88 may be different from an embodiment of FIG. 87 in that a conductive pattern CP used as an antenna may be further disposed.

Referring to FIG. 88, the conductive pattern CP may be disposed on the third insulating layer 183. The conductive pattern CP may be made of the same or similar material and formed on the same layer as the second contact electrode 174*b*. The conductive pattern CP may not overlap the first contact electrode 174*a* and the second contact electrode 174*b* in the third direction (z-axis direction). The conductive pattern CP may overlap the first electrode branch 171B in the third direction (z-axis direction).

The sensor electrode layer SENL may be disposed on the encapsulation layer TFEL. The sensor electrode layer SENL may include sensor electrodes SE, a third buffer layer BF3, a first sensor insulating layer TINS1, and a second sensor insulating layer TINS2. The sensor electrodes SE, the third buffer layer BF3, the first sensor insulating layer TINS1 and the second sensor insulating layer TINS2 of the sensor electrode layer SENL may be substantially identical to those described above with reference to FIG. 15.

As shown in FIG. 88, a conductive pattern CP, which may be used as a patch antenna for mobile communications or as an antenna for an RFID tag for near-field communications, may be disposed on the same layer and made of the same or similar material as the second contact electrode 174*b*. Therefore, the conductive pattern CP may be formed without any additional process.

Figure 89:
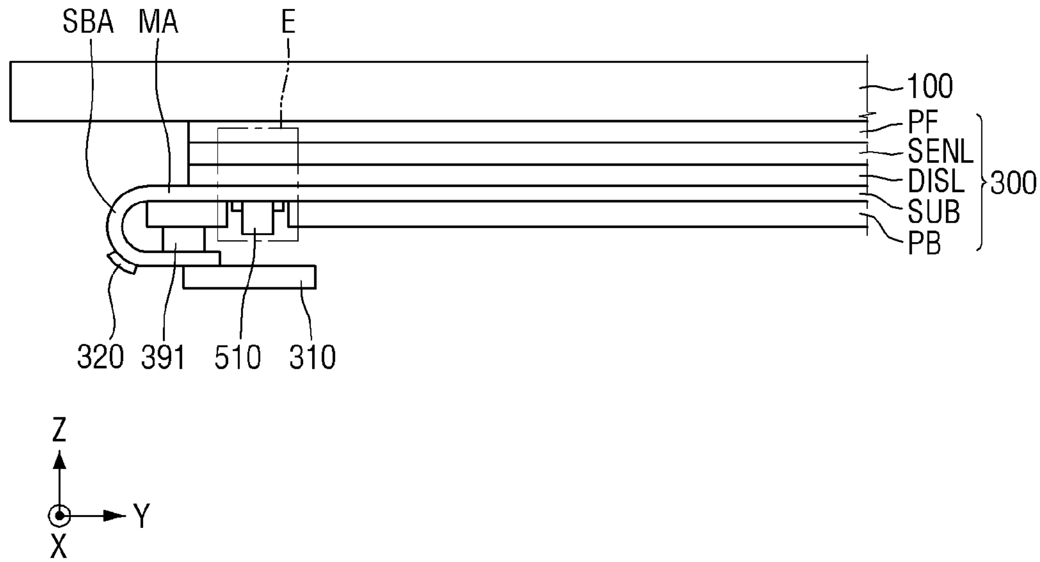
FIG. 89 is a schematic cross-sectional view showing a cover window and a display panel of a display device according to an embodiment.
Figure 90:
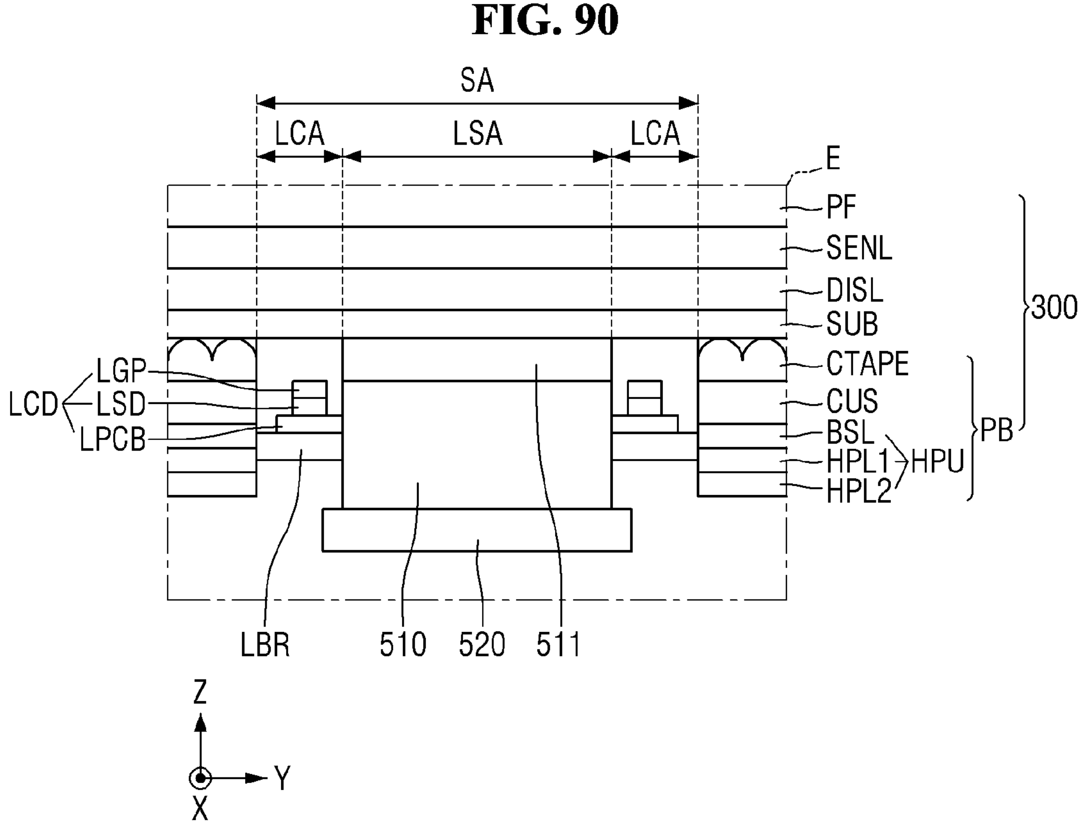
FIG. 90 is an enlarged schematic cross-sectional view showing an example of a display panel, an optical sensor and a light compensation device of FIG. 89.
Figure 91:
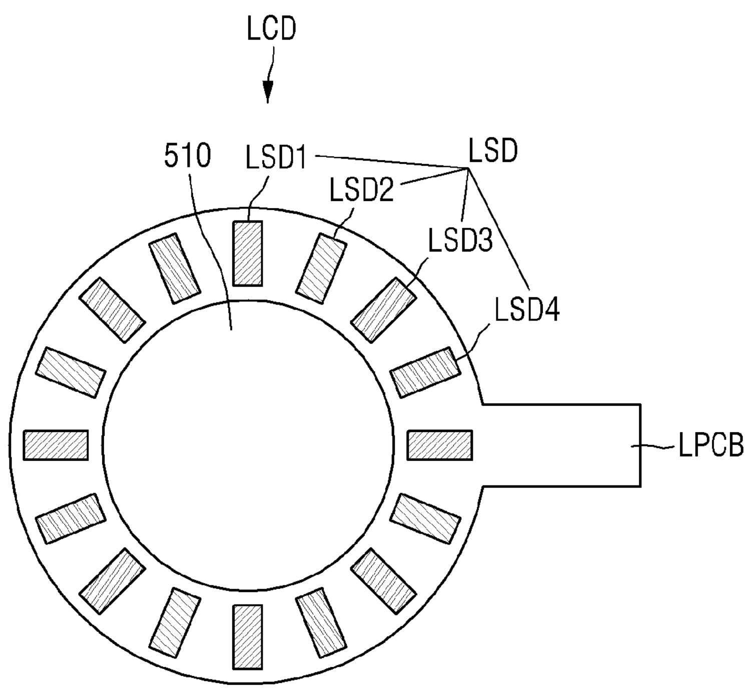
FIG. 91 is a view showing an example of a layout of the optical sensor and light compensation device of FIG. 90.
Figure 92:
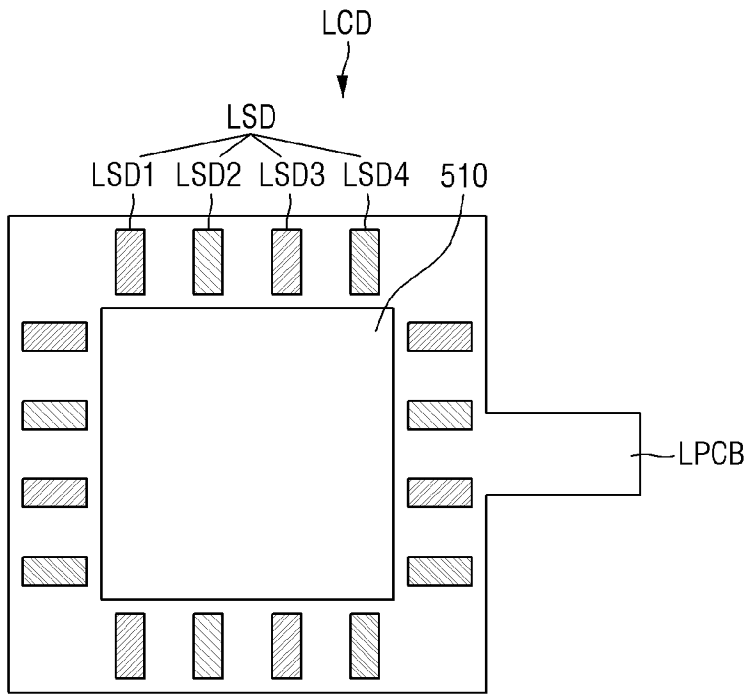
FIG. 92 is a view showing another example of a layout of the optical sensor and the light compensation device of FIG. 90.

FIG. 89 is a schematic cross-sectional view showing a cover window and a display panel of a display device according to another embodiment. FIG. 90 is an enlarged schematic cross-sectional view showing an example of a display panel, an optical sensor and a light compensation device of FIG. 89. FIG. 91 is a view showing an example of a layout of the optical sensor and light compensation device of FIG. 90. FIG. 92 is a view showing another example of a layout of the optical sensor and the light compensation device of FIG. 90. FIG. 90 is an enlarged, schematic cross-sectional view of area E of FIG. 89.

Referring to FIGS. 89 to 92, the sensor area SA may include a light sensor area LSA where the optical sensor 510 is disposed, and a light compensation area LCA disposed around the light sensor area LSA.

The light sensor area LSA may have a shape substantially conforming to the shape of the optical sensor 510 when viewed from the top. For example, in a case that the optical sensor 510 may have a substantially a circular shape when viewed from the top as shown in FIG. 91, the light sensor area LSA may also have a substantially circular shape. Alternatively, when the optical sensor 510 has a substantially quadrangular shape when viewed from the top as shown in FIG. 92, the light sensor area LSA may also have a substantially quadrangular shape. Alternatively, in a case that the optical sensor 510 has a shape of other polygonal shape than a quadrangular shape or an elliptical shape when viewed from the top, the light sensor area LSA may also have a shape of other polygonal shape than a quadrangular shape, or an elliptical shape.

The light compensation area LCA may surround the light sensor area LSA. For example, the light compensation area LCA may have a circular or quadrangular window frame shape when viewed from the top.

The light compensation device LCD may be disposed in the light compensation area LCA. The light compensation device LCD may include a light-emitting circuit board LPCB, light source devices LSD, and a light guide member LGP.

The light-emitting circuit board LPCB may be a flexible printed circuit board or a flexible film. The light-emitting circuit board LPCB may be disposed to surround side surfaces of the optical sensor 510. The light-emitting circuit board LPCB may have a circular window frame shape as shown in FIG. 91 or a quadrangular window frame shape as shown in FIG. 92.

The light-emitting circuit board LPCB may be electrically connected to the display circuit board 310. In such case, an emission driver for driving the light source device LSD may be disposed on the display circuit board 310.

The light source devices LSD may include first light source devices LSD1 that emit light of a first color, second light source devices LSD2 that emit light of a second color, third light source devices LSD3 that emit light of a third color, and fourth light source devices LSD4 that emit light of a fourth color. The fourth color may be white. The fourth light source devices LSD4 may be omitted. Each of the first light source devices LSD1, the second light source devices LSD2, the third light source devices LSD3 and the fourth light source devices LSD4 may be a light-emitting diode.

The number of first light source devices LSD1, the number of second light source devices LSD2, the number of third light source devices LSD3 and the number of fourth light source devices LSD4 may be all equal. The first light source devices LSD1, the second light source devices LSD2, the third light source devices LSD3 and the fourth light source devices LSD4 may be arranged or disposed to surround the side surfaces of the optical sensor 510 in this order. It is, however, to be understood that the disclosure is not limited thereto.

Each of the first light source devices LSD1, the second light source devices LSD2, the third light source devices LSD3 and the fourth light source devices LSD4 may be disposed on the light-emitting circuit board LPCB. Each of the first light source devices LSD1, the second light source devices LSD2, the third light source devices LSD3 and the fourth light source devices LSD4 may be attached to the light-emitting circuit board LPCB.

The light guide member LGP may be disposed on each of the light source devices LSD1, LSD2, LSD3 and LSD4. The light guide member LGP serves to guide a path of light output from each of the light source devices LSD1, LSD2, LSD3 and LSD4. The light guide member LGP may include the light path conversion pattern LPC as described above with reference to FIGS. 71 and 72.

Referring to FIGS. 89 to 92, the light compensation device LCD provides light to the sensor area SA, so that it may be possible to compensate for the luminance of the sensor area SA which may be lower than the luminance of display area DA.

Figure 93:
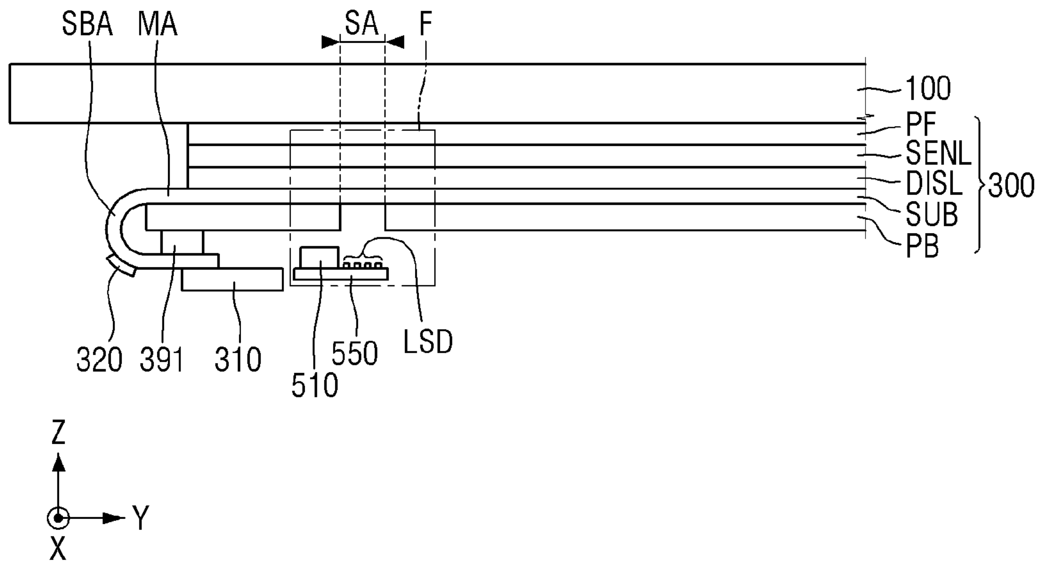
FIGS. 93 and 94 are schematic cross-sectional views showing a cover window and a display panel of a display device according to an embodiment.
Figure 94:
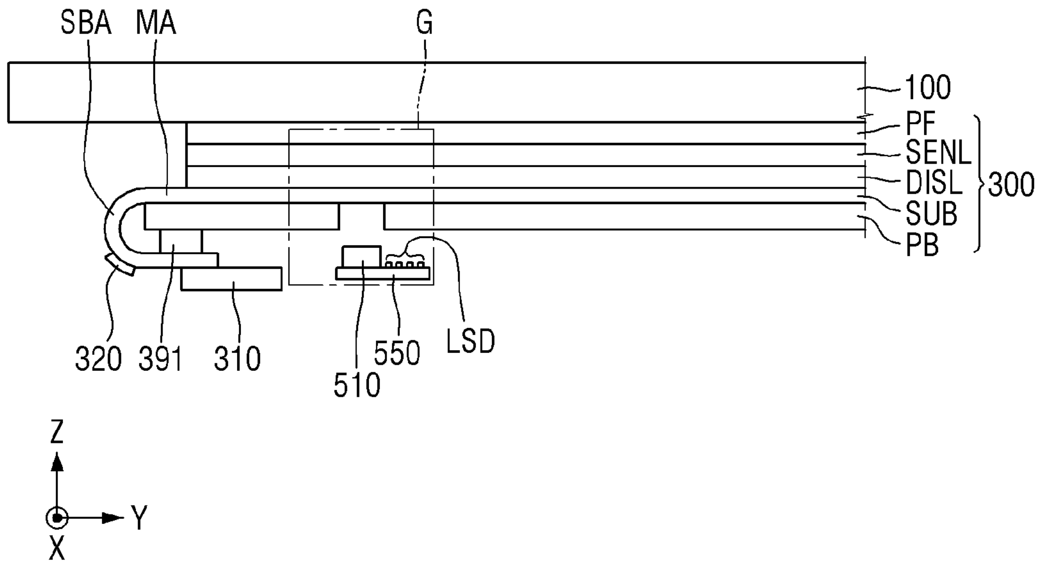
Figure 95:
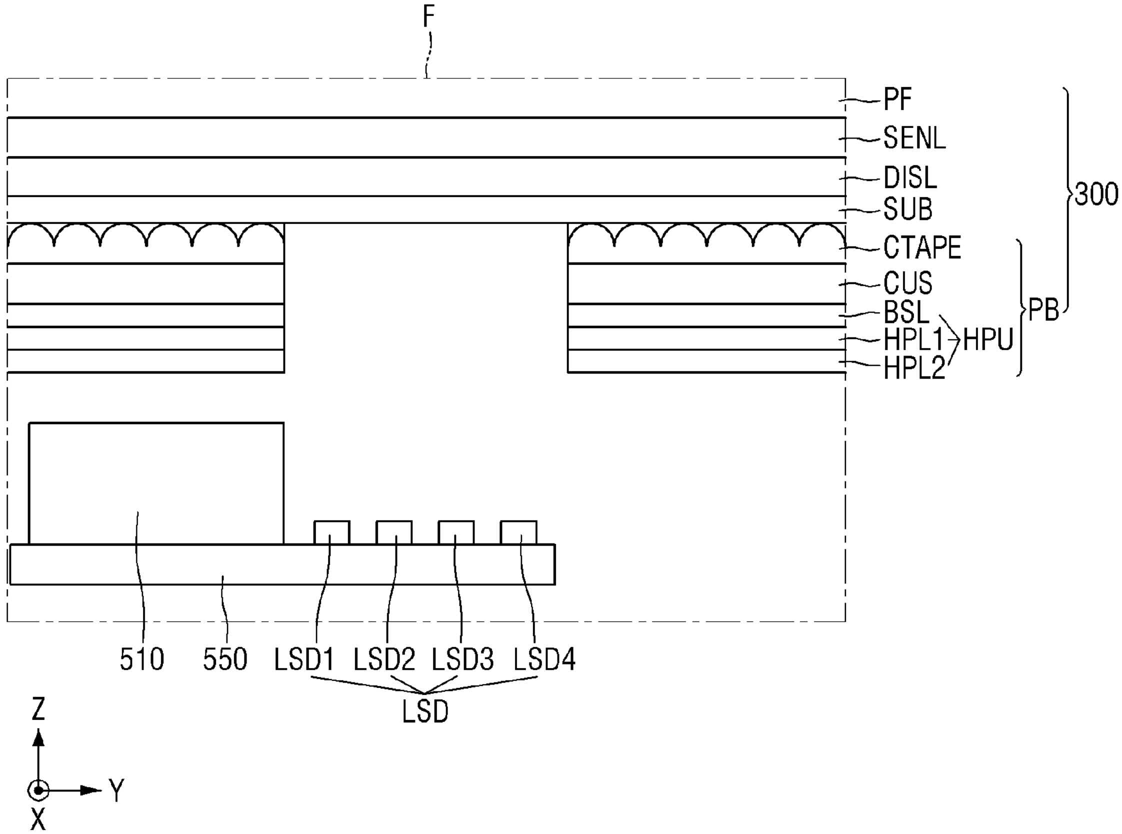
FIGS. 95 and 96 are enlarged schematic cross-sectional views showing an example of the display panel and the first and second optical sensors of FIGS. 93 and 94.
Figure 96:
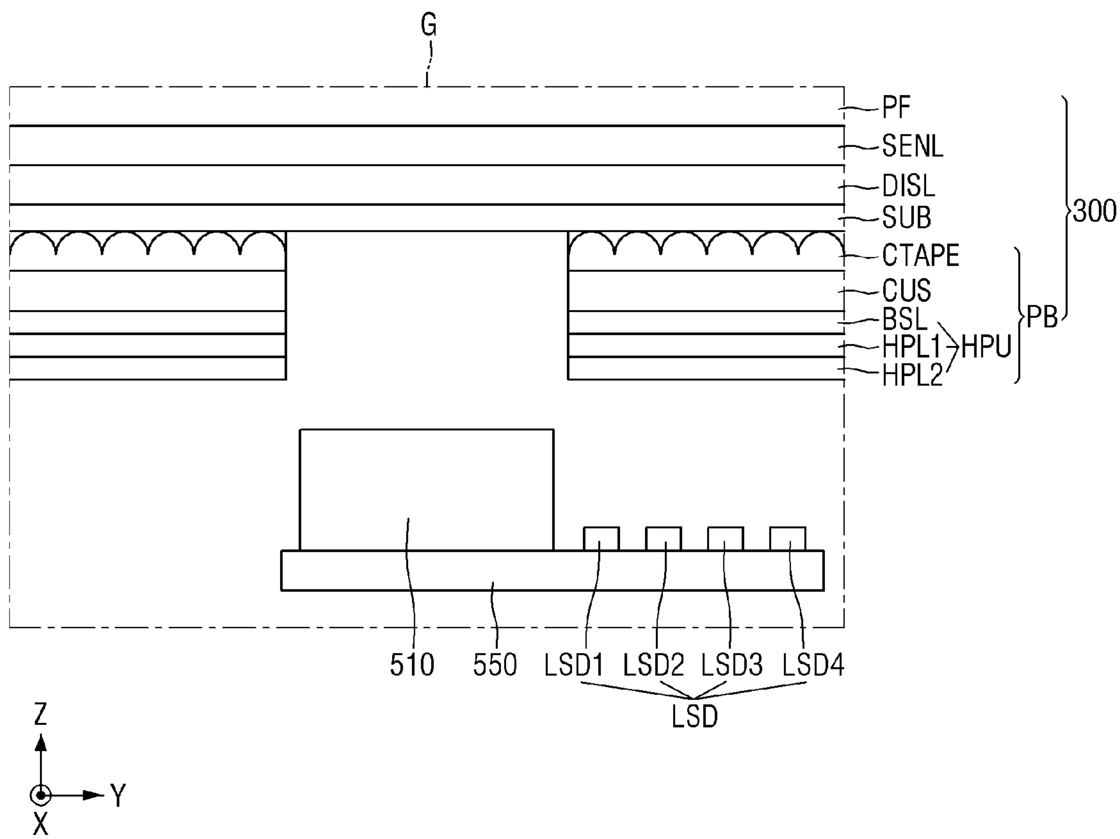
Figure 97:
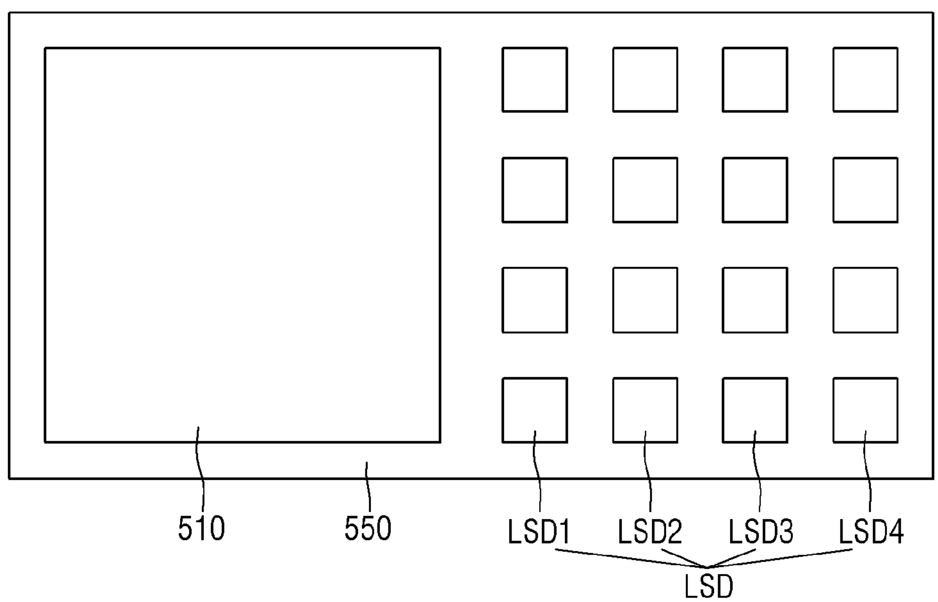
FIG. 97 is a view showing an example of a layout of the optical sensor and the light compensation device of FIGS. 95 and 96.

FIGS. 93 and 94 are schematic cross-sectional views showing a cover window and a display panel of a display device according to an embodiment. FIGS. 95 and 96 are enlarged schematic cross-sectional views showing an example of the display panel and the optical sensor of FIGS. 93 and 94. FIG. 97 is a view showing an example of a layout of the optical sensor and the light compensating device of FIGS. 95 and 96. FIG. 95 is an enlarged, schematic cross-sectional view of area F of FIG. 93. FIG. 96 is an enlarged, schematic cross-sectional view of area G of FIG. 94.

Referring to FIGS. 93 to 97, the display device 10 includes an optical sensor 510, a light compensation device LCD', and a moving member 550.

As shown in FIG. 97, the light source devices LSD may include first light source devices LSD1 that emit light of a first color, second light source devices LSD2 that emit light of a second color, third light source devices LSD3 that emit light of a third color, and fourth light source devices LSD4 that emit light of a fourth color. The fourth light source devices LSD4 may be eliminated. Each of the first light source devices LSD1, the second light source devices LSD2, the third light source devices LSD3 and the fourth light source devices LSD4 may be a light-emitting diode.

The optical sensor 510 and the light source devices LSD may be disposed on the moving member 550. The moving member 550 may be movable in one direction. The moving member 550 may be designed to be movable by sliding or other mechanical mechanism.

Although the moving member 550 moves in the second direction (y-axis direction) in the example shown in FIGS. 93 to 97, the disclosure is not limited thereto. The moving member 550 may move in the first direction (x-axis direction) or may move in the horizontal directions. The horizontal directions may be orthogonal to the third direction (z-axis direction) and may include the first direction (x-axis direction) and the second direction (y-axis direction). In the following description, the moving member 550 moves in the second direction (y-axis direction) for convenience of illustration.

Although the optical sensor 510 and the light source devices LSD are disposed on the moving member 550 in FIGS. 93 to 97, the disclosure is not limited thereto. The optical sensor 510 and the light source devices LSD may be disposed on the circuit board, and the circuit board may be attached to the moving member 550. Alternatively, the moving member 550 may serve as a circuit board.

The optical sensor 510 and the light source devices LSD may be arranged or disposed side by side in the second direction (y-axis direction). For example, the optical sensor 510 may be disposed on one side of the moving member 550 in the second direction (y-axis direction), and the light source devices LSD may be disposed on the other side of the moving member 550 in the second direction (y-axis direction).

As shown in FIGS. 93 to 97, at least one of the optical sensor 510 and the light source devices LSD may be disposed in the sensor area SA by the movement of the moving member 550. Although not shown, the light compensation device LCD may be provided on the moving member 550 instead of the light source devices LSD. As the moving member 550 moves toward the upper side of the display panel 300, the light compensation device LCD may be located or disposed in the sensor area SA. By doing so, the light source devices LSD of the light compensation device LCD provides light to the sensor area SA, so that it may be possible to compensate for the luminance of the sensor area SA which may be lower than the luminance of display area DA because of the transmissive areas TA of the sensor area SA. As the moving member 550 moves toward the lower side of the display panel 300, the optical sensor 510 may be located or disposed in the sensor area SA. Therefore, the optical sensor 510 may sense the light passing through the transmissive areas TA of the sensor area SA.

Figure 98:
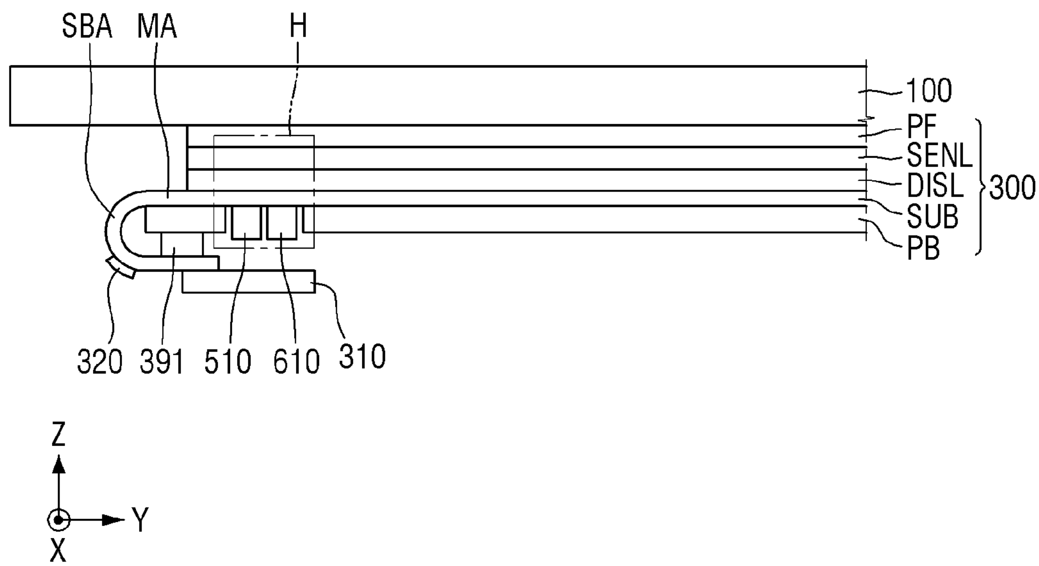
FIG. 98 is a schematic cross-sectional view showing a cover window and a display panel of a display device according to an embodiment.
Figure 99:
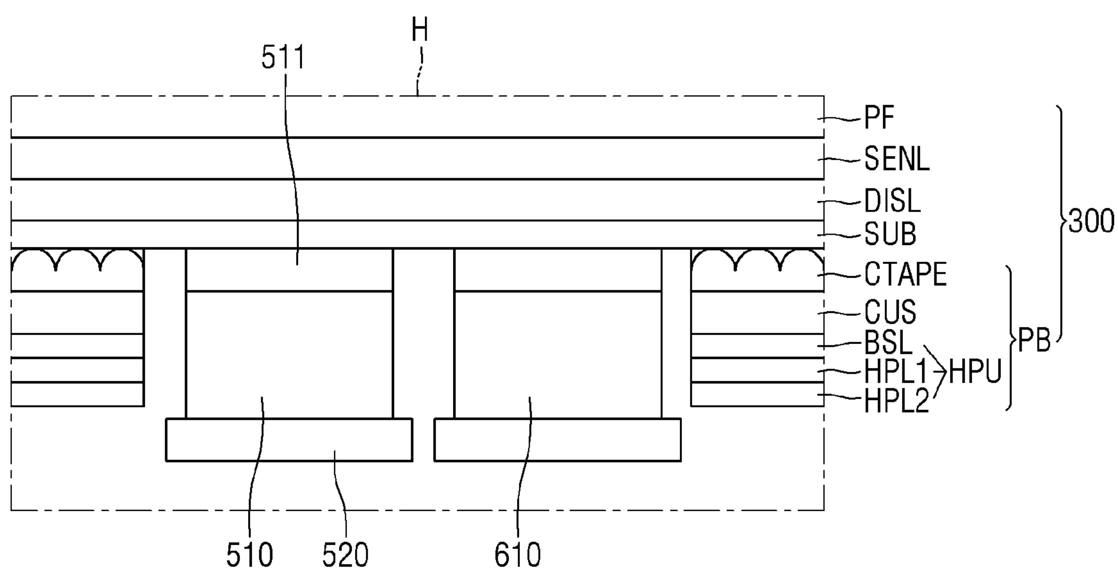
FIG. 99 is an enlarged schematic cross-sectional view showing an example of the display panel, the first optical sensor and the second optical sensor of FIG. 98.

FIG. 98 is a schematic cross-sectional view showing a cover window and a display panel of a display device according to another embodiment. FIG. 99 is an enlarged schematic cross-sectional view showing an example of the display panel, the first optical sensor and the second optical sensor of FIG. 98. FIG. 99 is an enlarged, schematic cross-sectional view of area H of FIG. 98.

Referring to FIGS. 98 and 99, the display device 10 may include a first optical sensor 510 and a second optical sensor 610. Each of the first optical sensor 510 and the second optical sensor 610 may include sensor pixels each including a light-receiving element that senses light. For example, each of the first optical sensor 510 and the second optical sensor 610 may be one of an optical fingerprint sensor, a solar cell, an illuminance sensor, an optical proximity sensor, and a camera sensor. The first optical sensor 510 and the second optical sensor 610 may be sensors having the same function or sensors having different functions.

In a case that one of the first optical sensor 510 and the second optical sensor 610 is an optical fingerprint sensor, the sensor pixels may be substantially identical to those described above with reference to FIG. 14. In a case that one of the first optical sensor 510 and the second optical sensor 610 is an illuminance sensor, it may include a light-receiving area including the light-receiving element described above with reference to FIG. 14. An example where one of the first optical sensor 510 and the second optical sensor 610 is a solar cell will be described later with reference to FIG. 100. An example where one of the first optical sensor 510 and the second optical sensor 610 is an optical proximity sensor will be described later with reference to FIG. 101.

The first optical sensor 510 and the second optical sensor 610 may be arranged or disposed side by side in the second direction (y-axis direction). For example, the first optical sensor 510 may be disposed on one side of the sensor area SA in the second direction (y-axis direction), and the second optical sensor 610 may be disposed on the other side of the sensor area SA in the second direction (y-axis direction).

Alternatively, the first optical sensor 510 and the second optical sensor 610 may be arranged or disposed side by side in the first direction (x-axis direction). For example, the first optical sensor 510 may be disposed on one side of the sensor area SA in the first direction (x-axis direction), and the second optical sensor 610 may be disposed on the other side of the sensor area SA in the first direction (x-axis direction).

As shown in FIGS. 98 and 99, since the optical sensors 510 and 610 may be disposed in the sensor area SA, each of the optical sensors 510 and 610 may sense the light passing through the transmissive areas TA of the sensor area SA.

Figure 100:
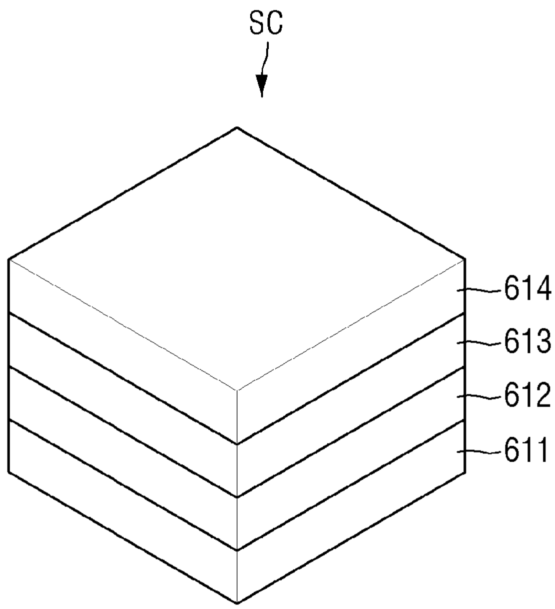
FIG. 100 is a perspective view showing an example where one of the first and second optical sensors of FIG. 99 is a solar cell.

FIG. 100 is a perspective view showing an example where one of the first and second optical sensors of FIG. 99 is a solar cell.

Referring to FIG. 100, the solar cell SC includes a substrate 611, a back electrode 612, a semiconductor layer 613, and a front electrode 614.

The substrate 611 may be transparent glass or transparent plastic.

The back electrode 612 may be disposed on the substrate 611. The back electrode 612 may be made of a transparent conductive oxide such as ZnO, ZnO:B, ZnO:Al, $SnO_2$, $SnO_2$:F, and indium tin oxide (ITO).

The semiconductor layer 613 may be disposed on the back electrode 612. The semiconductor layer 613 may be disposed on the surface of the back electrode 612 that may be opposite to the surface in contact with the substrate 611.

The semiconductor layer 613 may include a silicon-based semiconductor material. Although the second optical sensor 610 may include the single semiconductor layer 613 in FIG. 100, the disclosure is not limited thereto. For example, the second optical sensor 610 may be formed in a tandem structure including semiconductor layers 613.

The semiconductor layer 613 may be formed in a PIN structure in which a p-type semiconductor layer PL, an i-type semiconductor layer IL, and an n-type semiconductor layer NL are stacked one on another sequentially as shown in FIG. 15. In a case that the semiconductor layer 613 is formed in a PIN structure, the i-type semiconductor layer IL is depleted by the p-type semiconductor layer PL and the n-type semiconductor layer NL. As a result, an electric field may be generated therein, and holes and electrons may be drifted by the electric field. Then, the holes may be collected to the front electrode 614 through the p-type semiconductor layer PL, and the electrons may be collected to the back electrode 612 through the n-type semiconductor layer NL.

The p-type semiconductor layer PL may be located or disposed close to the front electrode 614, the n-type semiconductor layer NL may be located or disposed close to the back electrode 612, and the i-type semiconductor layer IL may be located or disposed between the p-type semiconductor layer PL and the n-type semiconductor layer NL. For example, the p-type semiconductor layer PL may be formed at a position close to the incident surface of sunlight, and the n-type semiconductor layer NL may be formed at a position distant from the incident surface of sunlight. Since the drift mobility of the holes may be lower than that of the electrons, the p-type semiconductor layer may be formed close to the incident surface of sunlight to increase the collection efficiency by the incident light.

The p-type semiconductor layer PL may be formed by doping amorphous silicon (a-Si: H) with a p-type dopant, the i-type semiconductor layer IL may be formed with amorphous silicon (a-Si: H), and the n-type semiconductor layer NL may be formed by doping amorphous silicon (a-Si: H) with a n-type dopant. It is, however, to be understood that the disclosure is not limited thereto.

The front electrode 614 may be disposed on the semiconductor layer 613. The front electrode 614 is formed on the surface of the semiconductor layer 613 opposite to the surface in contact with the back electrode 612. The front electrode 614 may be made of a transparent conductive oxide such as ZnO, ZnO: B, ZnO: Al, $SnO_2$, $SnO_2$: F, and Indium Tin Oxide (ITO).

As shown in FIG. 100, in a case that one of the first optical sensor 510 and the second optical sensor 610 is the solar cell SC, the power for driving the display device 10 may be generated with the light incident on the sensor area SA.

Figure 101:
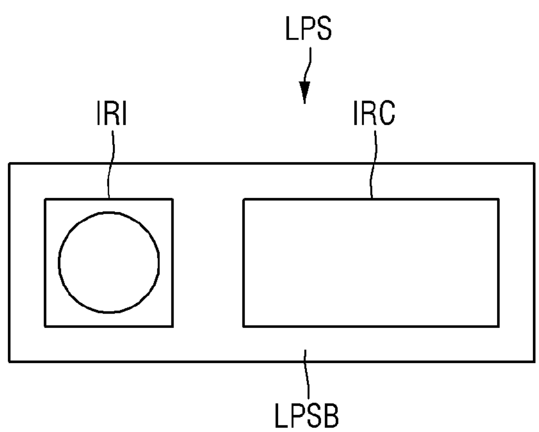
FIG. 101 is a view showing an example of a layout in a case that one of the first optical sensor and the second optical sensor of FIG. 99 is an optical proximity sensor.

FIG. 101 is a view showing an example of a layout in a case that one of the first optical sensor and the second optical sensor of FIG. 99 is an optical proximity sensor.

Referring to FIG. 101, an optical proximity sensor LPS includes a proximity sensor substrate LPSB, a light output unit IRI, and a light sensing unit IRC.

The light output unit IRI may be disposed on the proximity sensor substrate LPSB. The light output unit IRI may emit infrared light or red light. Alternatively, the light output unit IRI may emit white light. The light output unit IRI may be a light-emitting diode package or a light-emitting diode chip which includes a light-emitting diode.

The light sensing unit IRC may sense light incident through the transmissive areas TA of the sensor area SA. The light sensing unit IRC may output a light sensing signal according to the amount of incident light. The light sensing unit IRC may include light-receiving elements each including a photodiode or a phototransistor. Alternatively, the light sensing unit IRC may be a camera sensor.

The proximity sensor substrate LPSB may be a rigid printed circuit board or a flexible printed circuit board. The proximity sensor substrate LPSB may be electrically connected to the main processor 710 of the main circuit board 700 of FIG. 2. Accordingly, the light output unit IRI may emit light under the control of the main processor 710, and the light sensing unit IRC may emit light sensing signal to the main processor 710 according to the amount of light incident through the transmissive areas TA of the sensor area SA.

As shown in FIG. 101, light output from the light output unit IRI may be reflected off an object placed on the display device 10 through the transmissive areas TA of the sensor area SA of the display panel 300. The light reflected off the object placed on the display device 10 may pass through the transmissive areas TA of the sensor area SA of the display panel 300 and may be sensed by the light sensing unit IRC. Therefore, the optical proximity sensor LPS can determine whether there is an object proximate to the upper surface of the display device 10 based on the amount of light reflected off the object.

Figure 102:
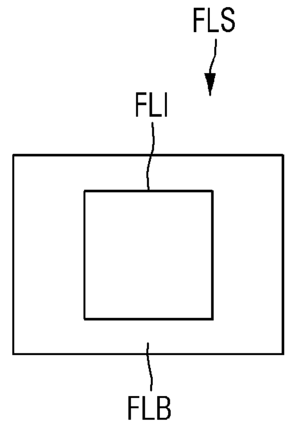
FIG. 102 is a view showing an example of a layout in a case that one of the first and second optical sensors of FIG. 99 is a flash.

FIG. 102 is a view showing an example of a layout in a case that one of the first and second optical sensors of FIG. 99 is a flash.

Referring to FIG. 102, the flash FLS may include a flash substrate FLB and a flash light output unit FLI.

The flash light output unit FLI may be disposed on the flash substrate FLB. The flash light output unit FLI may emit white light. The flash light output unit FLI may be a light-emitting diode package or a light-emitting diode chip including a light-emitting diode.

The flash substrate FLB may be a rigid printed circuit board or a flexible printed circuit board. The flash substrate FLB may be electrically connected to the main processor 710 of the main circuit board 700 of FIG. 2. Thus, the flash substrate FLB may emit light under the control of the main processor 710.

As shown in FIG. 102, light output from the flash light output unit FLI may be output toward the upper side of the display device 10 through the transmissive areas TA of the sensor area SA of the display panel 300.

Figure 103:
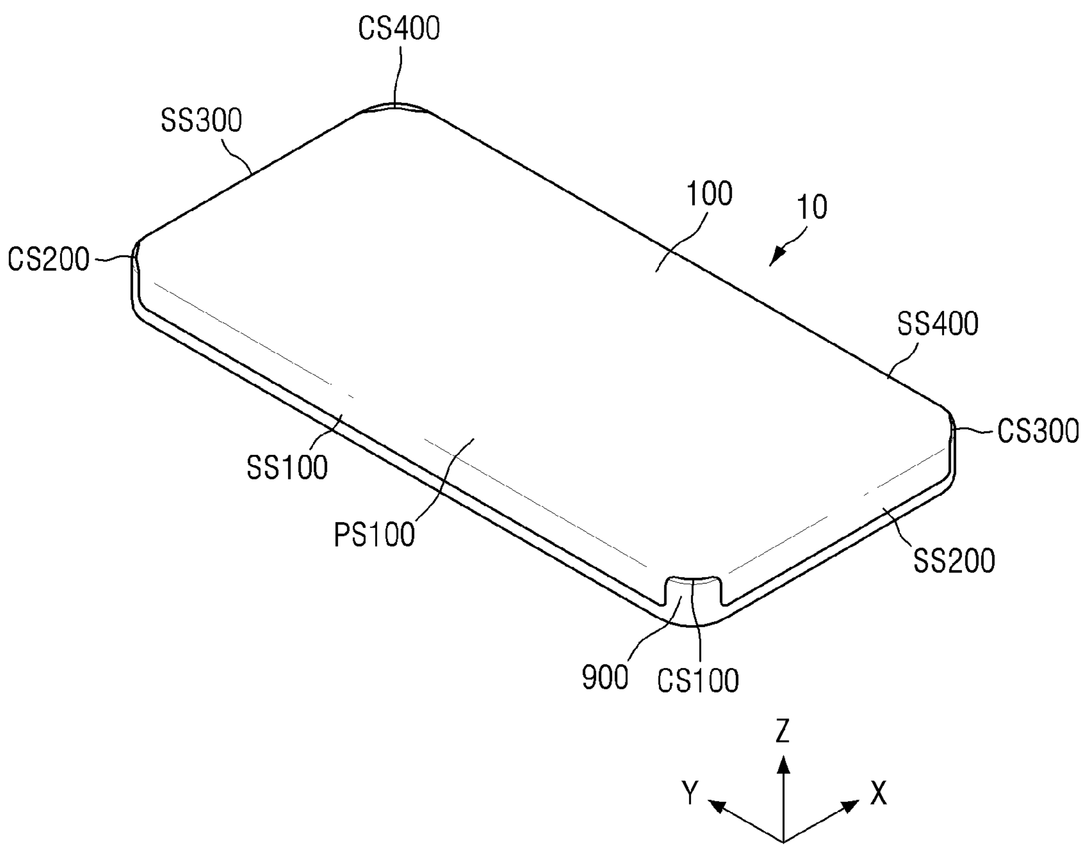
FIG. 103 is a perspective view of a display device according to an embodiment.
Figure 104:
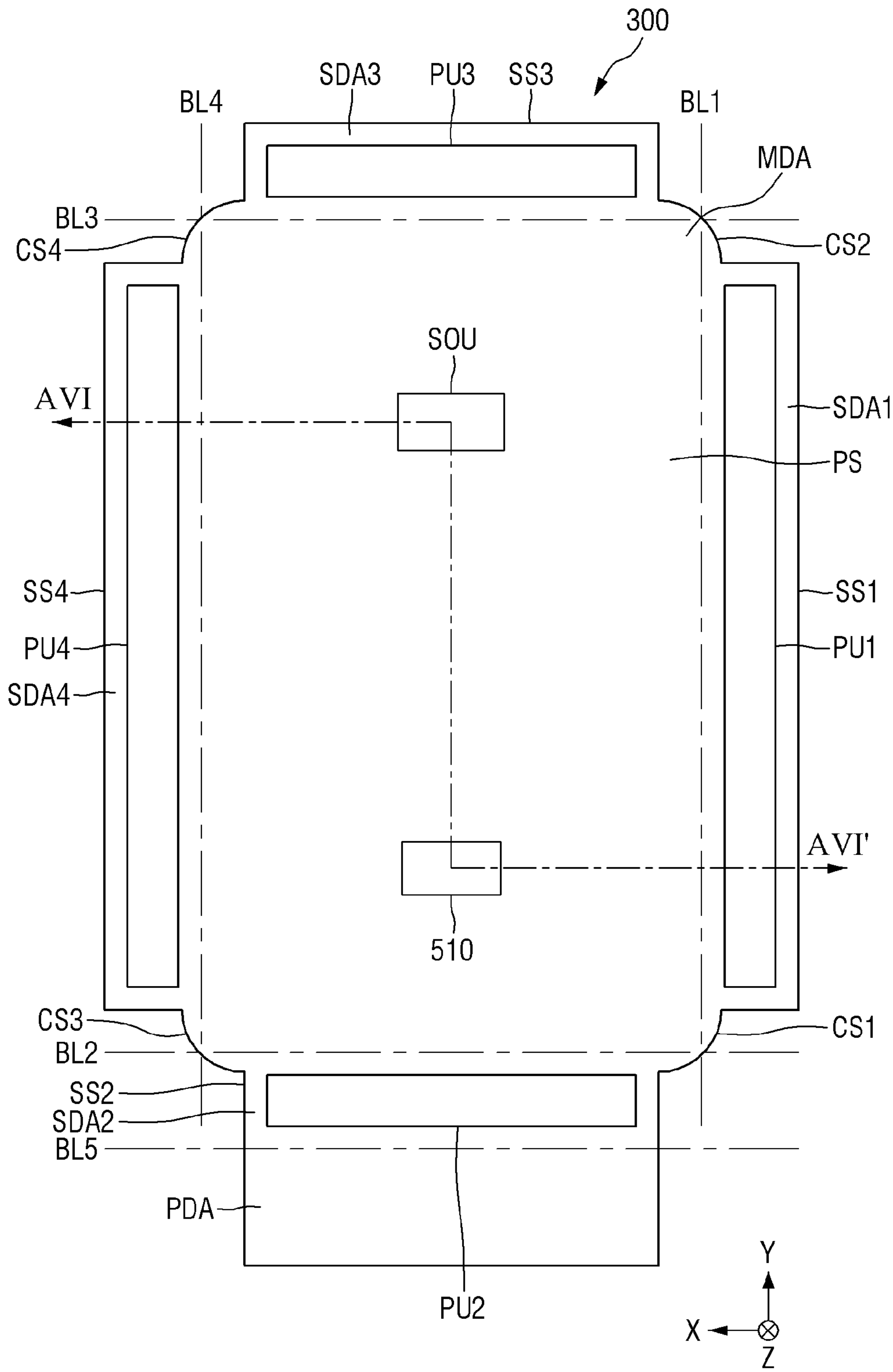
FIG. 104 is a development view showing a display panel according to an embodiment.
Figure 105:
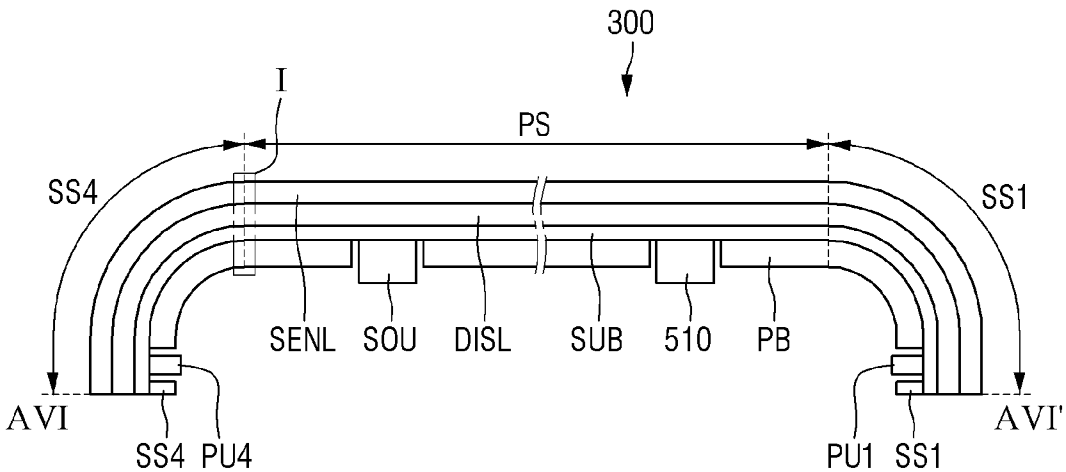
FIG. 105 is a schematic cross-sectional view showing a cover window and a display panel according to an embodiment.
Figure 106:
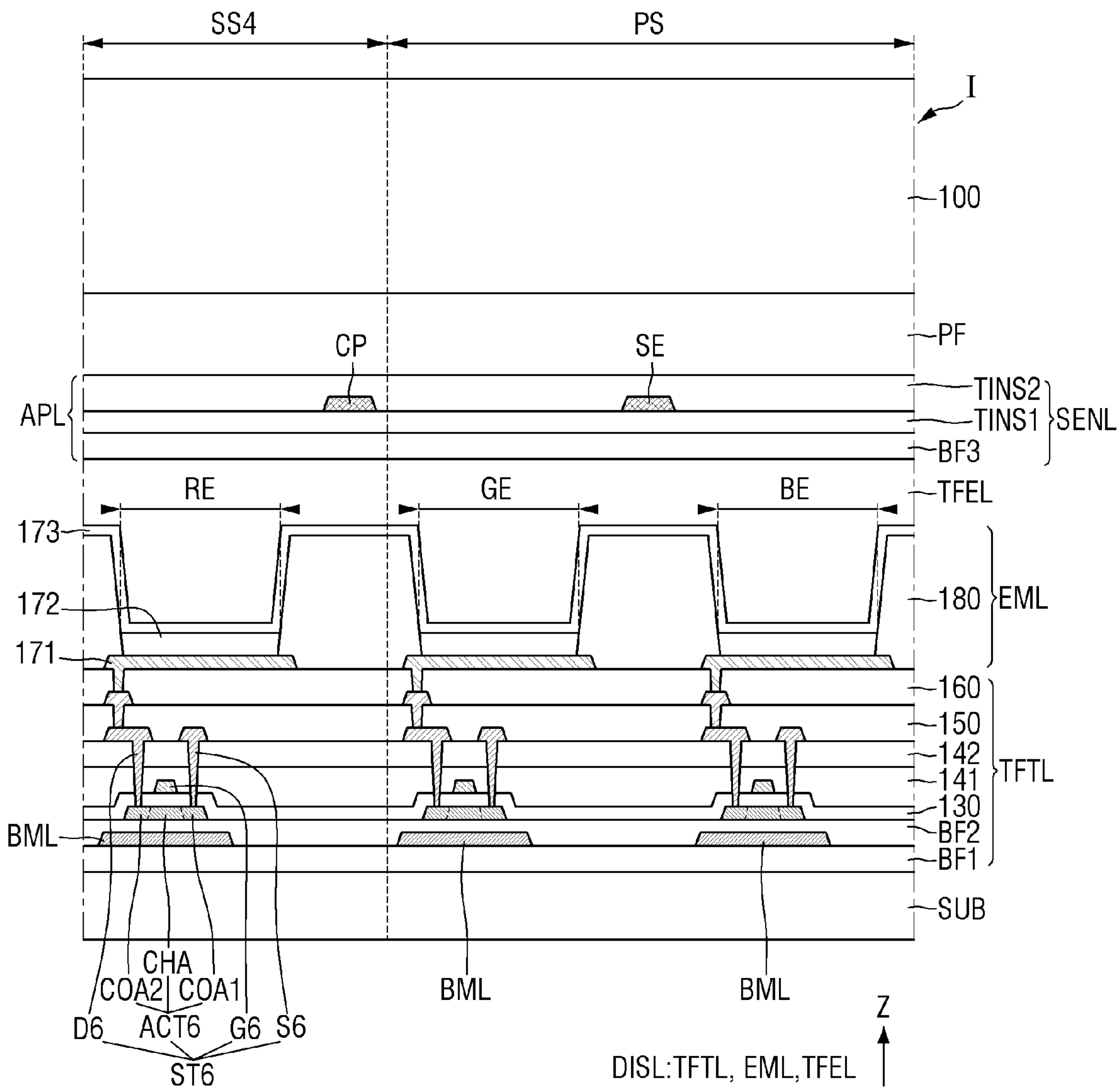
FIG. 106 is a schematic cross-sectional view showing a top portion and a fourth side portion of the display panel of FIG. 105.

FIG. 103 is a perspective view of a display device according to an embodiment. FIG. 104 is a development view showing a display panel according to an embodiment. FIG. 105 is a schematic cross-sectional view showing a cover window and a display panel according to an embodiment. FIG. 106 is a schematic cross-sectional view showing a top portion and a fourth side portion of the display panel of FIG. 105. FIG. 105 is a schematic cross-sectional view of the display panel, taken along line AVI-AVI' of FIG. 104. FIG. 106 is an enlarged view of area I of FIG. 105.

Referring to FIGS. 103 to 106, a cover window 100 may include a top portion PS100, a first side portion SS100, a second side portion SS200, a third side portion SS300, a fourth side portion SS400, a first corner portion CS100, a second corner portion CS200, a third corner portion CS300, and a fourth corner portion CS400.

The top portion PS100 of the cover window 100 may have, but is not limited to, a substantially rectangular shape having shorter sides in the first direction (x-axis direction) and longer sides in the second direction (y-axis direction) when viewed from the top. The top portion PS100 may have other substantially polygonal shapes, a substantially circular shape or a substantially oval shape when viewed from the top. The corners where the shorter sides and the longer side meet on the top portion PS100 may be bent with a certain or predetermined curvature. Although the top portion PS100 is flat in the example shown in FIG. 103, the disclosure is not limited thereto. The top portion PS100 may include a curved surface.

The first side portion SS100 of the cover window 100 may be extended from a first side of the top portion PS100. For example, the first side portion SS100 may be extended from the left side of the top portion PS100 and may be the left side surface of the cover window 100.

The second side portion SS200 of the cover window 100 may be extended from a second side of the top portion PS100. For example, the second side portion SS200 may be extended from the lower side of the top portion PS100 and may be the lower side surface of the cover window 100.

The third side portion SS300 of the cover window 100 may be extended from a third side of the top portion PS100. For example, the third side portion SS300 may be extended from the upper side of the top portion PS100 and may be the upper side surface of the cover window 100.

The fourth side portion SS400 of the cover window 100 may be extended from a fourth side of the top portion PS100. For example, the fourth side portion SS400 may be extended from the right side of the top portion PS100 and may be the right side surface of the cover window 100.

The first corner portion CS100 of the cover window 100 may be extended from the first corner where the first side and the second side of the top portion PS100 meet. The first corner portion CS100 may be located or disposed between the first side portion SS100 and the second side portion SS200.

The second corner portion CS200 of the cover window 100 may be extended from the second corner where the first side and the third side of the top portion PS100 meet. The second corner portion CS200 may be located or disposed between the first side portion SS100 and the third side portion SS300.

The third corner portion CS300 of the cover window 100 may be extended from the third corner where the second side and the fourth side of the top portion PS100 meet. The third corner CS300 may be located or disposed between the second side portion SS200 and the fourth side portion SS400.

The fourth corner portion CS400 of the cover window 100 may be extended from the fourth corner where the third side and the fourth side of the top portion PS100 meet. The fourth corner portion CS400 may be located or disposed between the third side portion SS300 and the fourth side portion SS400.

The top portion PS100, the first side portion SS100, the second side portion SS200, the third side portion SS300 and the fourth side portion SS400 of the cover window 100 may be formed as transmissive portions that may transmit light. The first corner portion CS100, the second corner portion CS200, the third corner portion CS300 and the fourth corner portion CS400 may be, but are not limited to, light-blocking portions that may not transmit light. The first corner portion CS100, the second corner portion CS200, the third corner portion CS300 and the fourth corner portion CS400 of the cover window 100 may also be formed as transmissive portions.

As shown in FIG. 104, the display panel 300 may include a substrate having a top portion PS, a first side portion SS1, a second side portion SS2, a third side portion SS3, a fourth side portion SS4, a first corner portion CS1, a second corner portion CS2, a third corner portion CS3, and a fourth corner portion CS4.

The top portion PS of the display panel 300 may have, but is not limited to, a substantially rectangular shape having shorter sides in the first direction (x-axis direction) and longer sides in the second direction (y-axis direction) when viewed from the top. The top portion PS may have other substantially polygonal shapes, a substantially circular shape or a substantially oval shape when viewed from the top. The corners where the shorter sides and the longer side meet on the top portion PS may be bent with a certain or predetermined curvature. Although the top portion PS may be flat in the example shown in FIGS. 104 and 105, the disclosure is not limited thereto. The top portion PS may include a curved surface.

The first side portion SS1 of the display panel 300 may be extended from the first side of the top portion PS. For example, the first side portion SS1 may be extended from the right side of the top portion PS. The first side portion SS1 may be bent over a first bending line BL1. The first bending line BL1 may be the boundary between the top portion PS and the first side portion SS1. The first side portion SS1 may be the left side surface of the display panel 300.

The second side portion SS2 of the display panel 300 may be extended from the second side of the top portion PS. For example, the second side portion SS2 may be extended from the lower side of the top portion PS. The second side portion SS2 may be bent over a second bending line BL2. The second bending line BL2 may be the boundary between the top portion PS and the second side portion SS2. The second side portion SS2 may be the lower side surface of the display panel 300.

The third side portion SS3 of the display panel 300 may be extended from the third side of the top portion PS. For example, the third side portion SS3 may be extended from the upper side of the top portion PS. The third side portion SS3 may be bent over a third bending line BL3. The third bending line BL3 may be the boundary between the top portion PS and the third side portion SS3. The third side portion SS3 may be the upper side surface of the display panel 300.

The fourth side portion SS4 of the display panel 300 may be extended from the fourth side of the top portion PS. For example, the fourth side portion SS4 may be extended from the left side of the top portion PS. The fourth side portion SS4 may be bent over a fourth bending line BL4. The fourth bending line BL4 may be the boundary between the top portion PS and the fourth side portion SS4. The fourth side portion SS4 may be the right side surface of the display panel 300.

The first corner portion CS1 of the display panel 300 may be extended from the first corner where the first side and the second side of the top portion PS meet. The first corner portion CS1 may be located or disposed between the first side portion SS1 and the second side portion SS2.

The second corner portion CS2 of the display panel 300 may be extended from the second corner where the first side and the third side of the top portion PS meet. The second corner portion CS2 may be located or disposed between the first side portion SS1 and the third side portion SS3.

The third corner portion CS3 of the display panel 300 may be extended from the third corner where the second side and the fourth side of the top portion PS meet. The third corner portion CS3 may be located or disposed between the second side portion SS2 and the fourth side portion SS4.

The fourth corner portion CS4 of the display panel 300 may be extended from the fourth corner where the third side and the fourth side of the top portion PS meet. The fourth corner portion CS4 may be located or disposed between the third side portion SS3 and the fourth side portion SS4.

A pad area PDA of the display panel 300 may be extended from one or a side of the second side portion SS2. For example, the pad area PDA may be extended from the lower side of the second side portion SS2. The pad area PDA may be bent over a fifth bending line BL5. The fifth bending line BL5 may be the boundary between the second side portion SS2 and the pad area PDA. The pad area PDA of the display panel 300 may be bent over the fifth bending line BL5 to face the top portion PS of the display panel 300.

The top portion PS, the first side portion SS1, the second side portion SS2, the third side portion SS3 and the fourth side portion SS4 of the display panel 300 may be display areas where images may be displayed. For example, the top portion PS of the display panel 300 may include a main display area MDA where a main image may be displayed. The first to fourth side portions SS1 SS2, SS3 and SS4 may include first to fourth subsidiary display areas SDA1 to SDA4 where subsidiary images may be displayed, and non-display areas, respectively. The first subsidiary display area SDA1 may be extended from the right side of the main display area MDA, and the first non-display area may be disposed on the right side of the first subsidiary display area SDA1. The fourth subsidiary display area SDA4 may be extended from the left side of the main display area MDA, and the fourth non-display area may be disposed on the left side of the fourth subsidiary display area SDA4.

The top portion PS of the display panel 300 may overlap the top portion PS100 of the cover window 100 in the third direction (z-axis direction), and may be disposed, for example, under or below the top portion PS100 of the cover window 100. The first side portion SS1 of the display panel 300 may overlap the first side portion SS100 of the cover window 100 in the first direction (x-axis direction), and may be disposed, for example, under or below the first side portion SS100 of the cover window 100. The second side portion SS2 of the display panel 300 may overlap the second side portion SS200 of the cover window 100 in the second direction (y-axis direction), and may be disposed, for example, under or below the second side portion SS200 of the cover window 100. The third side portion SS3 of the display panel 300 may overlap the third side portion SS3 of the cover window 100 in the second direction (y-axis direction), and may be disposed, for example, under or below the third side portion SS300 of the cover window 100. The fourth side portion SS4 of the display panel 300 may overlap the fourth side portion SS4 of the cover window 100 in the first direction (x-axis direction), and may be disposed, for example, under or below the fourth side portion SS400 of the cover window 100.

The first corner portion CS1 of the display panel 300 may overlap the first corner portion CS100 of the cover window 100 in the third direction (z-axis direction). The second corner portion CS2 of the display panel 300 may overlap the second corner portion CS200 of the cover window 100 in the third direction (z-axis direction). The third corner portion CS3 of the display panel 300 may overlap the third corner portion CS300 of the cover window 100 in the third direction (z-axis direction). The fourth corner portion CS4 of the display panel 300 may overlap the fourth corner portion CS400 of the cover window 100 in the third direction (z-axis direction).

The optical sensor 510 and a sound generator SOU may be disposed on the top portion PS of the display panel 300. Pressure sensors PU1 to PU4 may be disposed on the side surfaces SS1 to SS4 of the display panel 300, respectively. For example, the first pressure sensor PU1 may be disposed on the lower surface of the first side portion SS1 of the display panel 300, and the second pressure sensor PU2 may be disposed on the lower surface of the second side portion SS2 of the display panel 300. The third pressure sensor PU3 may be disposed on the lower surface of the third side portion SS3 of the display panel 300, and the fourth pressure sensor PU4 may be disposed on the lower surface of the fourth side portion SS4 of the display panel 300.

The position of the optical sensor 510, the position of the sound generator SOU and the position of each of the pressure sensors PU1 to PU4 are not limited to those shown in FIGS. 104 and 105. Each of the optical sensor 510 and the sound generator SOU may be disposed under or below any one of the side portions SS1 to SS4, instead of the top portion PS of the display panel 300. Alternatively, each of the optical sensor 510 and the sound generator SOU may be disposed under or below at least one of the side portions SS1 to SS4, in addition to the top portion PS of the display panel 300.

At least one of the pressure sensors PU1 to PU4 may be disposed on the top portion PS of the display panel 300, instead of the side portions SS1 to SS4 of the display panel 300. Alternatively, at least one of the pressure sensors PU1 to PU4 may be disposed on the top portion PS of the display panel 300, in addition to the side portions SS1 to SS4 of the display panel 300.

As described above, the sensor area SA of the display panel 300 may include pin holes or transmissive areas through which light may pass. The optical sensor 510 may be disposed in the sensor area SA and may sense light incident through the pin holes or the transmissive areas. The optical sensor 510 may include sensor pixels each including a light-receiving element that may detect light. For example, the optical sensor 510 may be an optical fingerprint sensor, an illuminance sensor, or an optical proximity sensor. The sensor pixels of the optical sensor 510 may be substantially identical to those described above with reference to FIG. 14.

The sound generator SOU may be attached to the lower surface of the substrate SUB of the display panel 300 through a pressure sensitive adhesive. The sound generator SOU may be disposed in a cover hole PBH of the panel bottom cover PB. The sound generator SOU may not overlap the panel bottom cover PB in the third direction (z-axis direction).

The sound generator SOU may be an exciter or a linear resonance actuator which vibrates in the third direction (z-axis direction) by generating a magnetic force using a voice coil, or may be a piezoelectric element or a piezoelectric actuator which vibrates using a piezoelectric material that contracts or expands according to an electrical signal. Therefore, sound may be generated by vibrating the display panel 300 as a diaphragm by the sound generator SOU, and thus, the sound may be output toward the upper surface of the display device 10. In this manner, it may be possible to increase the sound quality compared to existing speakers.

The pressure sensors PU1 to PU4 may sense a force applied by a user. Each of the pressure sensors PU1 to PU4 may be attached to the lower surface of the substrate SUB of the display panel 300 through a pressure sensitive adhesive. Each of the pressure sensors PU1 to PU4 may be disposed in a cover hole PBH of the panel bottom cover PB. Each of the pressure sensors PU1 to PU4 may not overlap the panel bottom cover PB in the third direction (z-axis direction). Alternatively, each of the pressure sensors PU1 to PU4 may be attached to an upper surface of a bracket 600 disposed under or below the display panel 300 through a pressure sensitive adhesive as shown in FIG. 2. The bracket 600 may work as a support member for supporting the first pressure sensors PU1.

Each of the pressure sensors PU1 to PU4 may include a strain-gauge pressure sensor, a capacitive pressure sensor, a gap-cap type pressure sensor, or a pressure sensor including metal microparticles such as quantum tunneling composite (QTC) pressure sensor. The strain-gauge pressure sensor may be substantially identical to the described above with reference to FIGS. 65A to 65C. The capacitive pressure sensor may be substantially identical to that described above with reference to FIG. 64. A pressure sensor including a pressure sensing layer including fine metal particles, such as quantum tunneling composite (QTC), will be described later with reference to FIG. 107, and a gap-cap type pressure sensor will be described below with reference to FIG. 108.

The sensor electrode layer SENL including the sensor electrodes SE may be disposed on the display layer DISL of the top portion PS of the display panel 300. An antenna layer APL including conductive patterns CP used as an antenna may be disposed on the display layer DISL of each of the side portions SS1 to SS4 of the display panel 300, instead of the sensor electrode layer SENL.

The antenna layer APL may include conductive patterns CP, the third buffer layer BF3, the first sensor insulating layer TINS1, and the second sensor insulating layer TINS2.

The conductive patterns CP may be disposed on the first sensor insulating layer TINS1. The conductive patterns CP may be disposed on the same layer and may be made of the same or similar material as the sensor electrodes SE of the sensor electrode layer SENL.

In a case that the conductive patterns CP are disposed in the first subsidiary display area SDA1 and the fourth subsidiary display area SDA4, the conductive patterns CP may have a mesh pattern when viewed from the top so as not to overlap the emission areas RE, GE and BE in the third direction (z-axis direction). Alternatively, in a case that the conductive patterns CP are disposed in the first non-display area and the fourth non-display area, the conductive patterns CP may have a patch shape or a loop shape when viewed from the top. It is, however, to be understood that the disclosure is not limited thereto. In such case, the conductive patterns CP may be used as a patch antenna for mobile communications or an antenna for an RFID tag for near-field communications.

The third buffer layer BF3, the first sensor insulating layer TINS1 and the second sensor insulating layer TINS2 of the antenna layer APL may be substantially identical to the third buffer layer BF3, the first sensor insulating layer TINS1 and the second sensor insulating layer TINS2 of the sensor electrode layer SENL described above with reference to FIG. 15.

As shown in FIG. 105, in a case that the pressure sensors PU1 to PU4 are disposed on the side portions SS1 to SS4 of the display panel 300, respectively, it may be possible to sense the pressure applied by the user and also to sense the user's touch input using the pressure sensors PU1 to PU4. Therefore, the sensor electrodes SE of the sensor electrode layer SENL for detecting a user's touch input may be eliminated from the side portions SS1 to SS4 of the display panel 300.

Instead of the sensor electrodes SE of the sensor electrode layer SENL, the antenna layer APL including the conductive patterns CP used as an antenna may be formed in the side portions SS1 to SS4 of the display panel 300. Since the conductive patterns CP are disposed on the same layer and made of the same or similar material as the sensor electrodes SE of the sensor electrode layer SENL, the conductive patterns CP may be formed without any additional process.

Furthermore, since the conductive patterns CP disposed on the side portions SS1 to SS4 of the display panel 300 are disposed on the top layer of the display panel 300, even if the wavelengths of the electromagnetic waves transmitted or received by the conductive patterns CP is short, like those for 5G mobile communications, they do not need to pass through the metal layers of the display panel 300. Therefore, electromagnetic waves transmitted or received by the conductive patterns CP may be stably radiated toward the upper side of the display device 10 or may be stably received by the display device 10.

Figure 107:
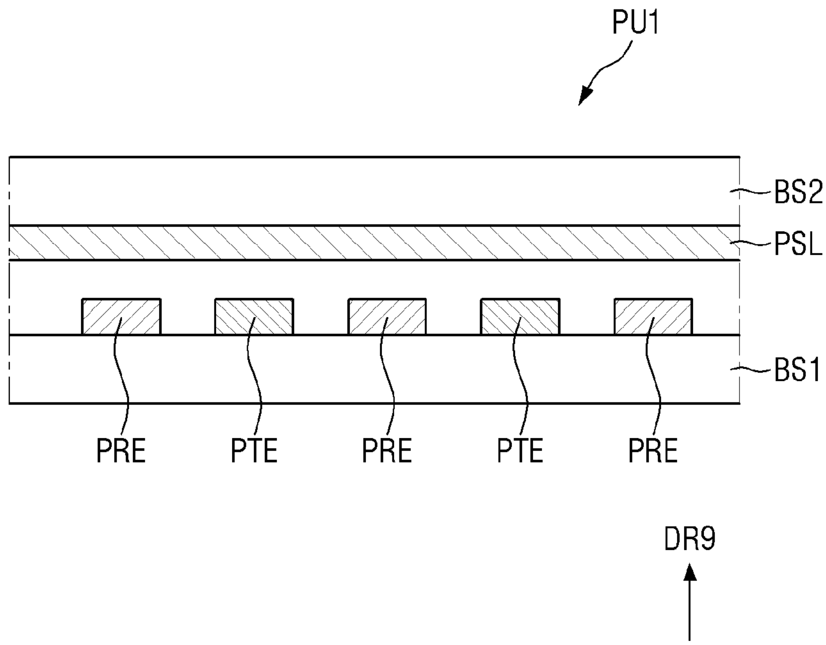
FIG. 107 is a schematic cross-sectional view showing an example of the first pressure sensor of FIG. 105.

FIG. 107 is a schematic cross-sectional view showing an example of the first pressure sensor of FIG. 105.

Referring to FIG. 107, the first pressure sensor PU1 may include a first base member BS1, a second base member BS2, pressure driving electrodes PTE, a pressure sensing electrode PRE, and a pressure sensing layer PSL.

The first base member BS1 and the second base member BS2 are disposed to face each other. Each of the first base member BS1 and the second base member BS2 may be made of a polyethylene terephthalate (PET) film or a polyimide film.

The pressure driving electrodes PTE and the pressure sensing electrodes PRE may be disposed adjacent to each other but may not be connected to each other. The pressure driving electrodes PTE and the pressure sensing electrodes PRE may be arranged or disposed side by side. The pressure driving electrodes PTE and the pressure sensing electrodes PRE may be arranged or disposed alternately. For example, the pressure driving electrodes PTE and the pressure sensing electrodes PRE may be repeatedly arranged or disposed in the order of the pressure driving electrode PTE, the pressure sensing electrode PRE, the pressure driving electrode PTE, the pressure sensing electrode PRE and so on within the spirit and the scope of the disclosure.

The pressure driving electrodes PTE and the pressure sensing electrodes PRE may include a conductive material such as silver (Ag) and copper (Cu). The pressure driving electrodes PTE and the pressure sensing electrodes PRE may be formed or disposed on the first base member BS1 by screen printing.

The pressure sensing layer PSL is disposed on the surface of the second base member BS2 facing the first base member BS1. The pressure sensing layer PSL may be disposed so that that it overlaps with the pressure driving electrodes PTE and the pressure sensing electrodes PRE.

The pressure sensing layer PSL may include a polymer resin having a pressure sensitive material. The pressure sensitive material may be metal microparticles (or metal nanoparticles) such as nickel, aluminum, titanium, tin and copper. For example, the pressure sensing layer PSL may include a quantum tunneling composite (QTC).

In a case that no pressure is applied to the second base member BS2 in the height direction DR9 of the first pressure sensor PU1, there may be a gap between the pressure sensing layer PSL and the pressure driving electrode PTE and between the pressure sensing layer PSL and the pressure sensing electrodes PRE. For example, in a case that no pressure is applied to the second base member BS2, the pressure sensing layer PSL may be spaced apart from the pressure driving electrodes PTE and the pressure sensing electrodes PRE.

In a case that a pressure is applied to the second base member BS2 in the height direction DR9 of the first pressure sensor PU1, the pressure sensing layer PSL may come in contact with the pressure driving electrodes PTE and the pressure sensing electrodes PRE. In this case, at least one of the pressure driving electrodes PTE and at least one of the pressure sensing electrodes PRE may be physically connected with one another through the pressure sensing layer PSL, and the pressure sensing layer PSL may work as an electrical resistance.

Therefore, since the area of the first pressure sensor PU1 in which the pressure sensing layer PSL is brought into contact with the pressure driving electrodes PTE and the pressure sensing electrodes PRE varies depending on the applied pressure, the resistance of the pressure sensing electrodes PRE may vary. For example, as the pressure applied to the first pressure sensor PU1 increases, the resistance of the pressure sensing electrodes PRE may decrease. A pressure sensor driver may sense a change in current value or a voltage value from the pressure sensing electrodes PRE based on a change in the resistance of the pressure sensing electrodes PRE, thereby determining the magnitude of the pressure applied by a user's finger F. Therefore, the first pressure sensor PU1 may be used as an input device for sensing a user's input.

One of the first base member BS1 and the second base member BS2 of the first pressure sensor PU1 may be attached to the other side of the first side portion SS1 of the substrate SUB via a pressure sensitive adhesive, while the other one may be attached to the bracket 600 via a pressure sensitive adhesive.

Alternatively, one of the first base member BS1 and the second base member BS2 of the first pressure sensor PU1 may be eliminated. For example, in a case that the first base member BS1 of the first pressure sensor PU1 is eliminated, the pressure driving electrodes PTE and the pressure sensing electrodes PRE may be disposed on one or the other side of the first side portion SS1. For example, the first pressure sensor PU1 may use the first side portion SS1 of the display panel 300 as the base member. If the pressure driving electrodes PTE and the pressure sensing electrodes PRE are disposed on one side of the first side portion SS1, the pressure driving electrodes PTE and the pressure sensing electrodes PRE may be disposed on the same layer and made of the same or similar material as the first light-blocking layer BML1 of the display layer DISL.

Alternatively, in a case that the first base member BS1 of the first pressure sensor PU1 is eliminated, the pressure driving electrodes PTE and the pressure sensing electrodes PRE may be disposed on the bracket 600. For example, the first pressure sensor PU1 may use the bracket 600 as the base member.

Alternatively, if the second base member BS2 of the first pressure sensor PU1 is eliminated, the pressure sensing layer PSL may be disposed on the other side of the first side portion SS1. For example, the first pressure sensor PU1 may use the first side portion SS1 of the display panel 300 as the base member.

Alternatively, if the second base member BS2 of the first pressure sensor PU1 is eliminated, the pressure sensing layer PSL may be disposed on the bracket 600. For example, the first pressure sensor PU1 may use the bracket 600 as the base member.

Figure 108:
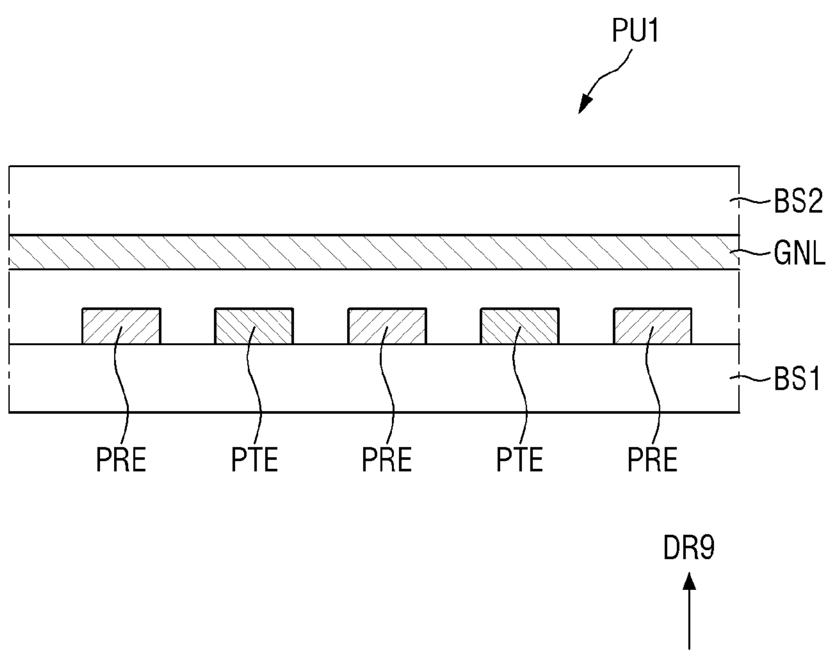
FIG. 108 is a schematic cross-sectional view showing another example of the first pressure sensor of FIG. 105.

FIG. 108 is a schematic cross-sectional view showing another example of the first pressure sensor of FIG. 105.

In the example shown in FIG. 108, a ground potential layer GNL may be disposed in place of the pressure sensing layer PSL, in which case, the first pressure sensor PU1 can sense a user's touch pressure by gap-cap manner. For example, according to the gap-cap manner, the first base member BS1 and the second base member BS2 may be bent according to the pressure applied from the user, and thus the distance between the ground potential layer GNL and the pressure driving electrodes PTE or the pressure sensing electrodes PRE may be decreased. As a result, the voltage charged in the capacitance between the pressure driving electrodes PTE and the pressure sensing electrodes PRE may be reduced due to the ground potential layer GNL. Therefore, according to the gap-cap manner, the pressure of the user's touch may be sensed by receiving the voltage charged in the capacitance through the pressure sensing electrodes PRE.

In a case that the first pressure sensor PU1 to fourth pressure sensor PU4 of the gap-cap manner is respectively disposed on four side portions SS1, SS2, SS3 and SS4 as shown in FIGS. 105 and 106, the first base member BS1 and the second base member BS2 of the first pressure sensor PU1 to fourth pressure sensor PU4 may be bent less in the four side portions SS1, SS2, SS3 and SS4. Accordingly, in order to more effectively sense the pressure of a user's touch, a first pressure sensor PU1 of the gap-cap manner disposed in the first side portion SS1 may operate together with a fourth pressure sensor PU4 of the gap-cap manner disposed in the fourth side portion SS4 facing the first side portion SS1. According to the gap-cap manner, a second pressure sensor PU2 disposed in the second side portion SS2 may operate together with a third pressure sensor PU3 disposed in the third side portion SS3 facing the second side portion SS2.

Each of the second to fourth pressure sensors PU2 to PU4 shown in FIG. 105 may be substantially identical to the first pressure sensor PU1 described above with reference to FIG. 107 or FIG. 108; and, therefore, the redundant description will be omitted.

Figure 109:
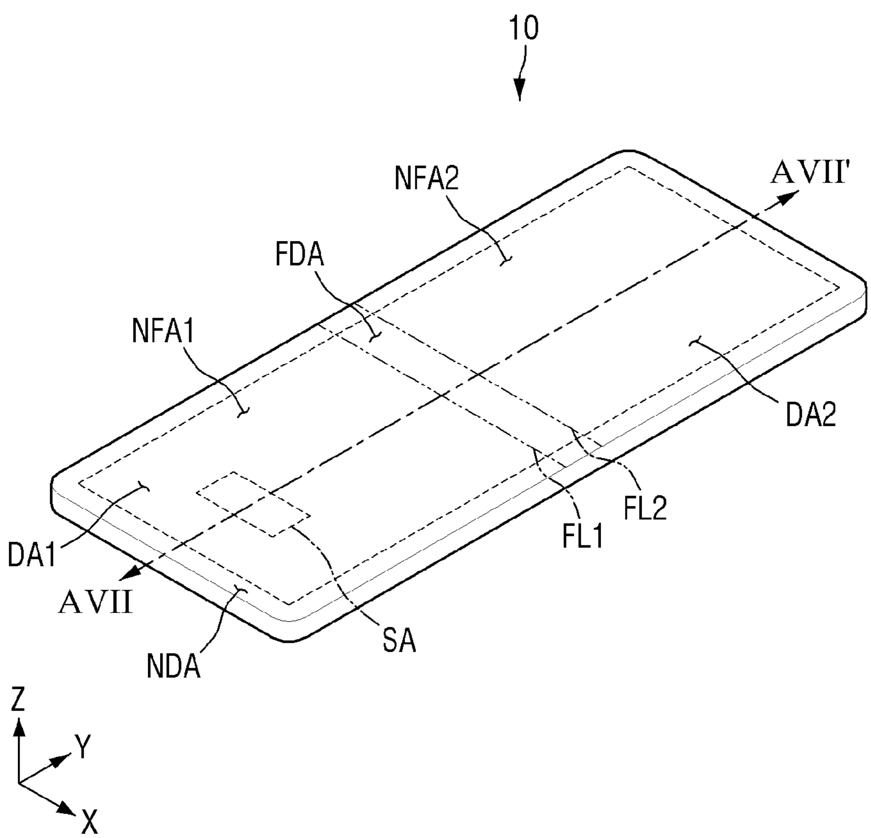
FIGS. 109 and 110 are perspective views showing a display device according to an embodiment.
Figure 110:
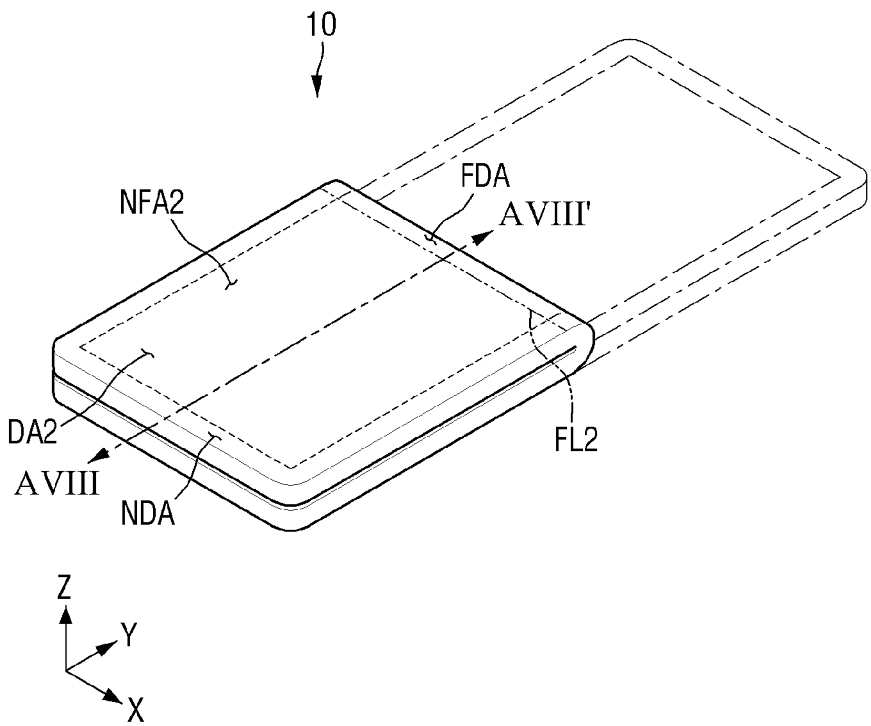
Figure 111:
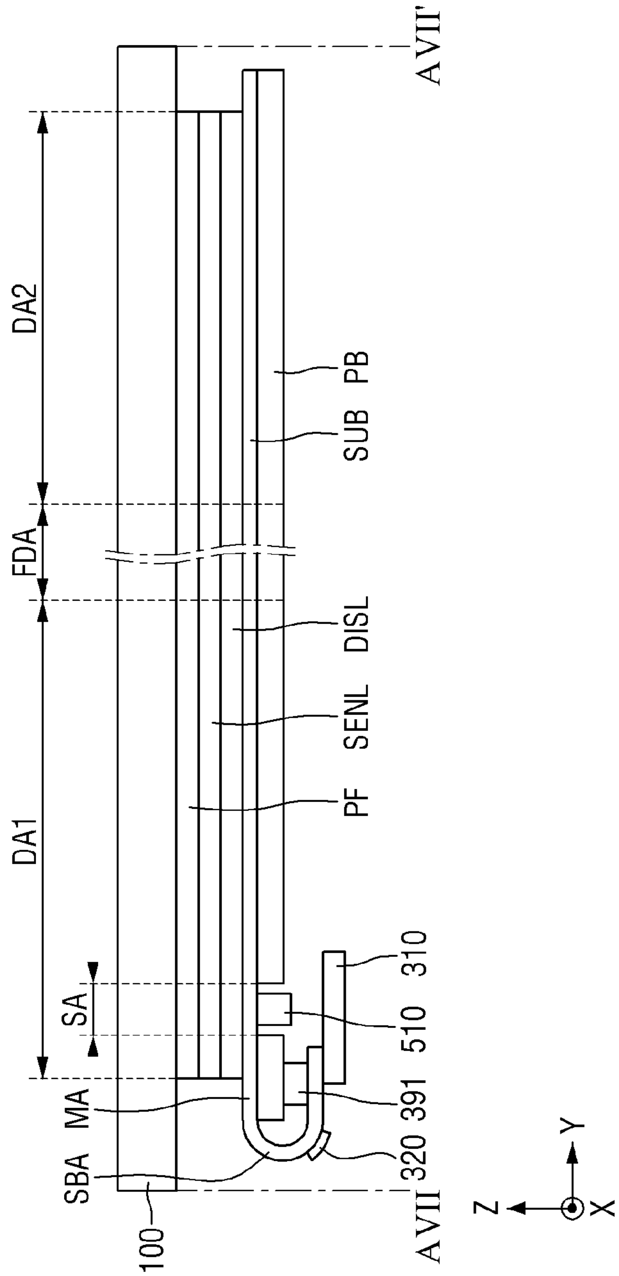
FIG. 111 is a schematic cross-sectional view showing an example of a display panel and an optical sensor of a display device according to an embodiment in a case that it is unfolded.
Figure 112:
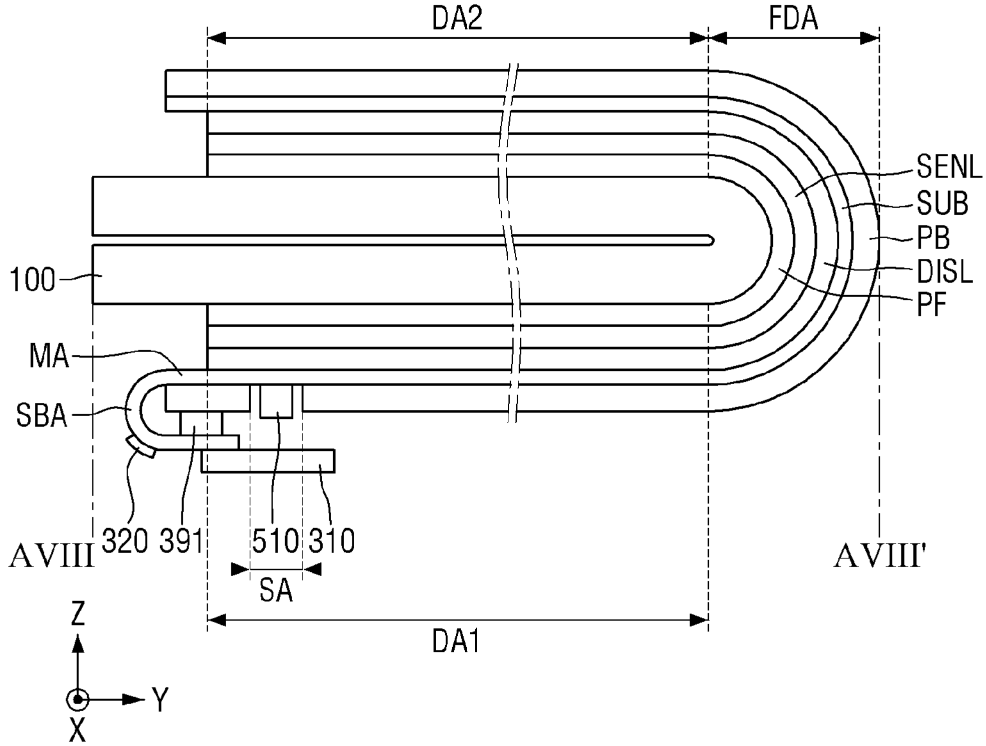
FIG. 112 is a side view showing an example of the display panel and the optical sensor of the display device in a case that it is folded.

FIGS. 109 and 110 are perspective views showing a display device according to an embodiment. FIG. 111 is a schematic cross-sectional view showing an example of a display panel and an optical sensor of a display device according to an embodiment in a case that it is unfolded. FIG. 112 is a schematic cross-sectional view showing an example of the display panel and the optical sensor of the display device in a case that it is folded.

In the example shown in FIGS. 109 to 112, a display device 10 may be a foldable display device that may be bent or folded at a folding area FDA. FIG. 111 is a schematic cross-sectional view of the display panel and the optical sensor, taken along line AVII-AVII' of FIG. 109. FIG. 112 is a schematic cross-sectional view of the display panel and the optical sensor, taken along line AVIII-AVIII' of FIG. 110.

Referring to FIGS. 109 to 112, the display device 10 may stay folded and unfolded. The display device 10 may be folded inward (in-folding manner) in which the upper surface of the display device 10 may be located or disposed inside. In a case that the display device 10 may be bent or folded in the in-folding manner, the upper surfaces of the display device 10 may face each other.

Although the display device 10 may be folded inward in the example shown in FIGS. 109 to 112, the disclosure is not limited thereto. The display device 10 may be folded outward (out-folding manner) in which the upper surface of the display device 10 may be located or disposed outside. In a case that the display device 10 may be bent or folded in the out-folding manner, the lower surfaces of the display device 10 may face each other.

The display device 10 may include a folding area FDA, a first non-folding area NFA1, and a second non-folding area NFA2. The display device 10 may be folded at the folding area FDA, while it may not be folded at the first non-folding area NFA1 and the second non-folding area NFA2.

The first non-folding area NFA1 may be disposed on one or a side, for example, the lower side of the folding area FDA. The second non-folding area NFA2 may be disposed on the other or another side, for example, the upper side of the folding area FDA. The folding area FDA may be an area bent with a predetermined curvature over the first folding line FL1 and the second folding line FL2. Therefore, the first folding line FL1 may be a boundary between the folding area FDA and the first non-folding area NFA1, and the second folding line FL2 may be a boundary between the folding area FDA and the second non-folding area NFA2.

The first folding line FL1 and the second folding line FL2 may be extended in the first direction (x-axis direction) as shown in FIGS. 109 and 110, and the display device 10 may be folded in the second direction (y-axis direction). As a result, the length of the display device 10 in the second direction (the y-axis direction) may be reduced to about half, so that the display device 10 is easy to carry.

The direction in which the first folding line FL1 and the second folding line FL2 are extended is not limited to the first direction (x-axis direction). For example, the first folding line FL1 and the second folding line FL2 may be extended in the second direction (y-axis direction), and the display device 10 may be folded in the first direction (x-axis direction). In such case, the length of the display device 10 in the first direction (x-axis direction) may be reduced to about half. Alternatively, the first folding line FL1 and the second folding line FL2 may be extended in a diagonal direction of the display device 10 between the first direction (x-axis direction) and the second direction (y-axis direction). In such case, the display device 10 may be folded in a triangle or triangular shape.

In a case that the first folding line FL1 and the second folding line FL2 may be extended in the first direction (x-axis direction) as shown in FIG. 109 the length of the folding area FDA in the second direction (y-axis direction) may be smaller than the length in the first direction (x-axis direction). The length of the first non-folding area NFA1 in the second direction (y-axis direction) may be larger than the length of the folding area FDA in the second direction (y-axis direction). The length of the second non-folding area NFA2 in the second direction (y-axis direction) may be larger than the length of the folding area FDA in the second direction (y-axis direction).

The display area DA may be disposed on the upper surface of display device 10. As shown in FIG. 109, the display area DA may include a first display area DA1 and a second display area DA2 disposed on the upper surface of the display device 10. In FIGS. 109 and 110, each of the display area DA and the non-display area NDA may overlap the folding area FDA, the first non-folding area NFA1 and the second non-folding area NFA2. It is, however, to be understood that the disclosure is not limited thereto. For example, each of the display area DA and the non-display area NDA may overlap at least one of the folding area FDA, the first non-folding area NFA1, and the second non-folding area NFA2.

The sensor area SA may overlap the first non-folding area NFA1. The sensor area SA may be disposed close to one or a side of the display panel 300 in the first non-folding area NFA1. The sensor area SA may not be exposed to the outside in a case that the display device 10 is folded. The sensor area SA may be exposed to the outside in a case that the display device 10 is unfolded.

The optical sensor 510 may be disposed in the sensor area SA. The optical sensor 510 may be disposed in the cover hole PBH penetrating through the panel bottom cover PB to expose the substrate SUB of the display panel 300. The panel bottom cover PB may include an opaque material that may not transmit light, such as a heat dissipation unit, and thus an optical sensor 510 may be disposed on the lower surface of the substrate SUB in the cover hole PBH so that the light above the display panel 300 may reach the optical sensor 510 disposed under or below the display panel 300.

The optical sensor 510 may include sensor pixels each including a light-receiving element that detects light. For example, the optical sensor 510 may be an optical fingerprint sensor, an illuminance sensor, or an optical proximity sensor. The sensor pixels of the optical sensor 510 may be substantially identical to those described above with reference to FIG. 14.

In a case that the display device 10 is unfolded, the first display area DA1 of the display panel 300 may include pin holes or transmissive areas overlapping the light-receiving areas LE where the light-receiving elements of the optical sensor 510 may be disposed in the third direction (z-axis direction) as described above. Therefore, in a case that the display device 10 is unfolded as shown in FIG. 111, the optical sensor 510 may detect light incident on the display panel 300 and passing through the sensor area SA of the display panel 300.

In a case that the display device 10 is folded, the second display area DA2 of the display panel 300 as well as the first display area DA1 may include pin holes or transmissive areas overlapping the light-receiving areas LE where the light-receiving elements of the optical sensor 510 may be disposed in the third direction (z-axis direction) as described above. Therefore, in a case that the display device 10 is folded as shown in FIG. 112, the optical sensor 510 may detect light incident on the display panel 300 and passing through the sensor area SA of the display panel 300.

Figure 113:
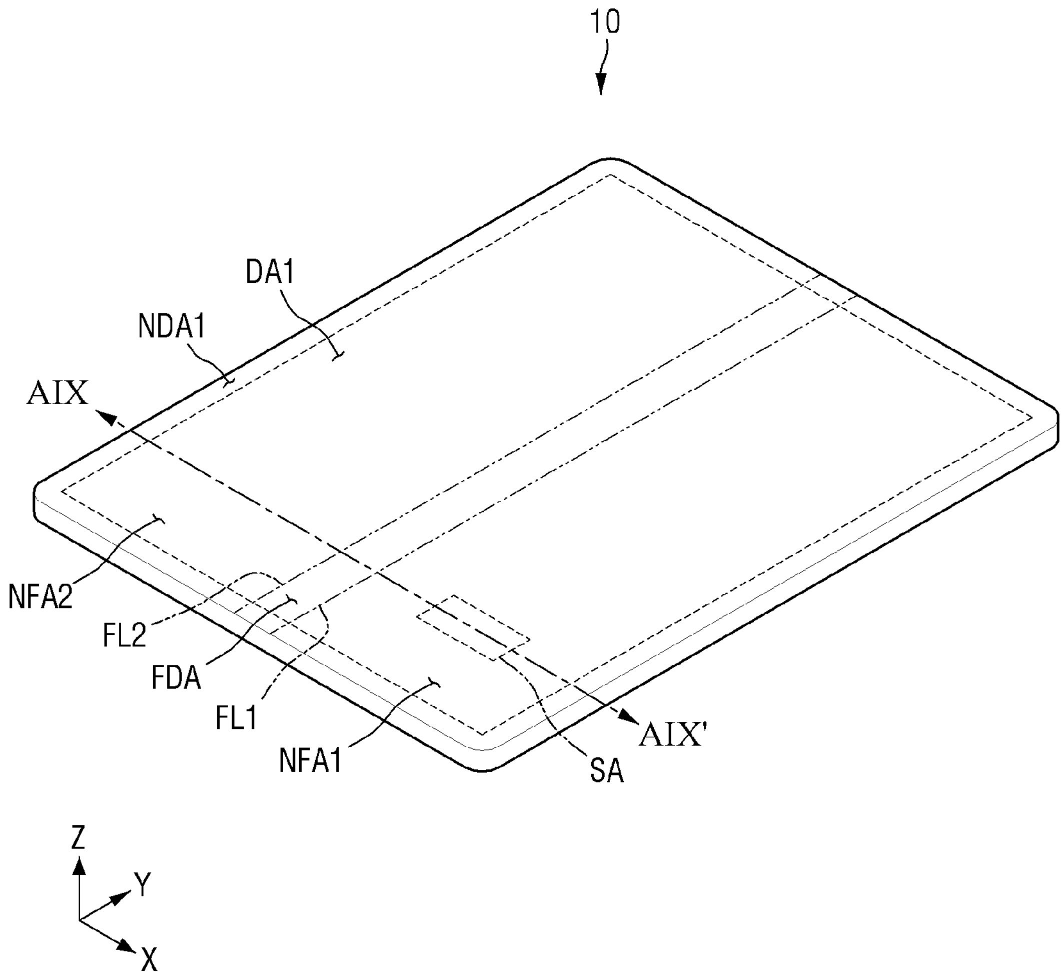
FIGS. 113 and 114 are perspective views showing a display device according to an embodiment.
Figure 114:
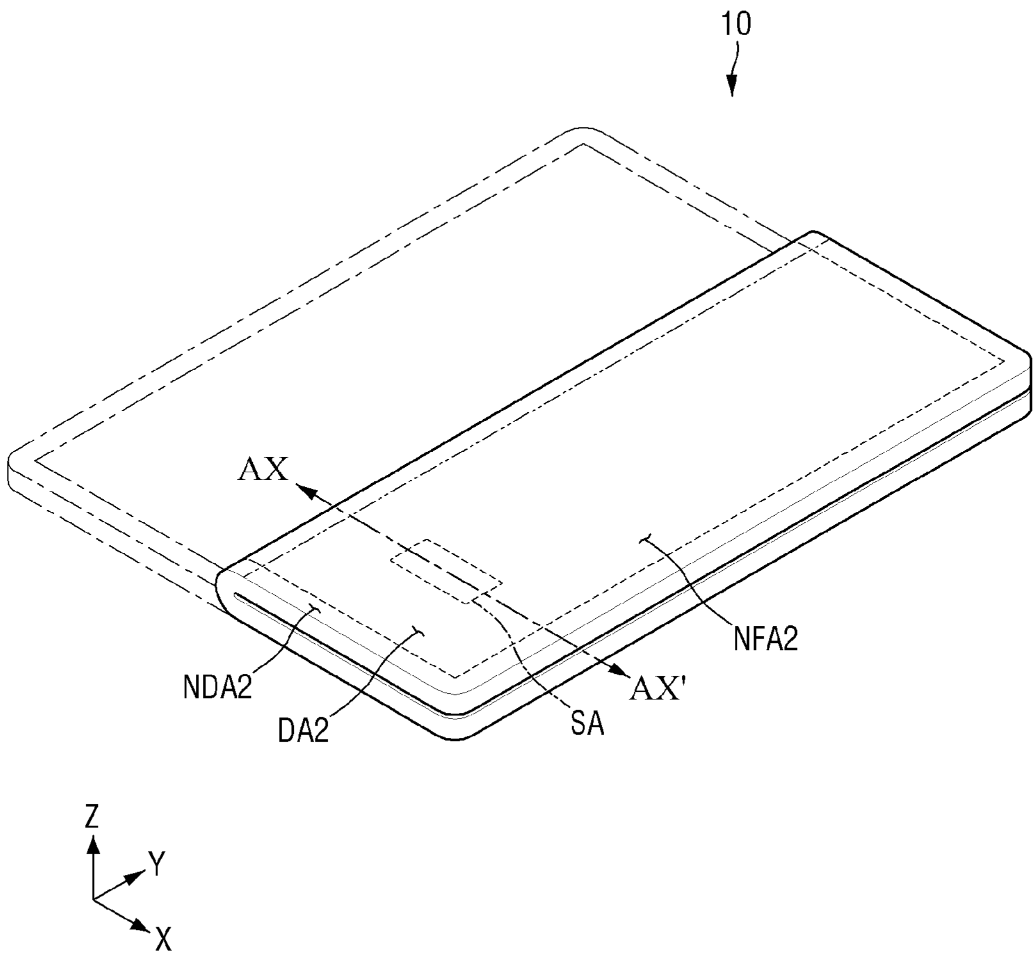
Figure 115:
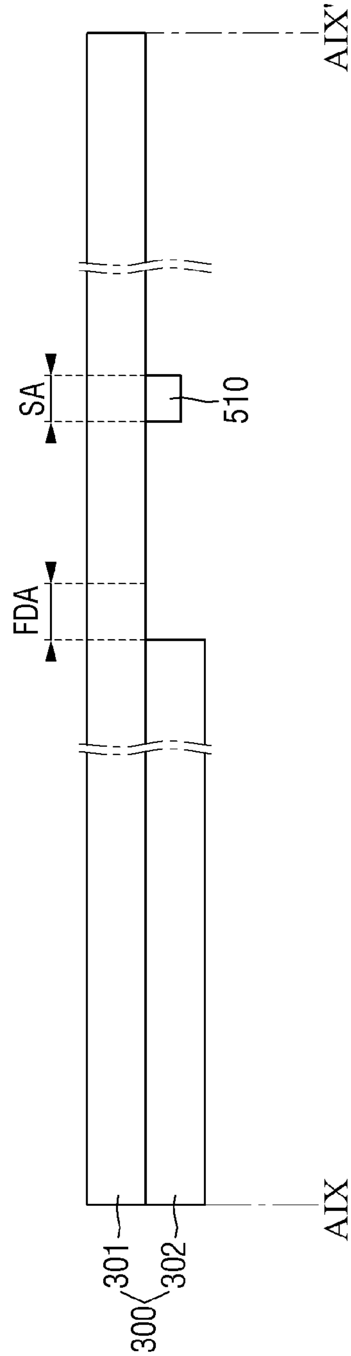
FIG. 115 is a schematic cross-sectional view showing an example of a first display panel, a second display panel and an optical sensor of a display device according to an embodiment in a case that the display device is unfolded.
Figure 116:
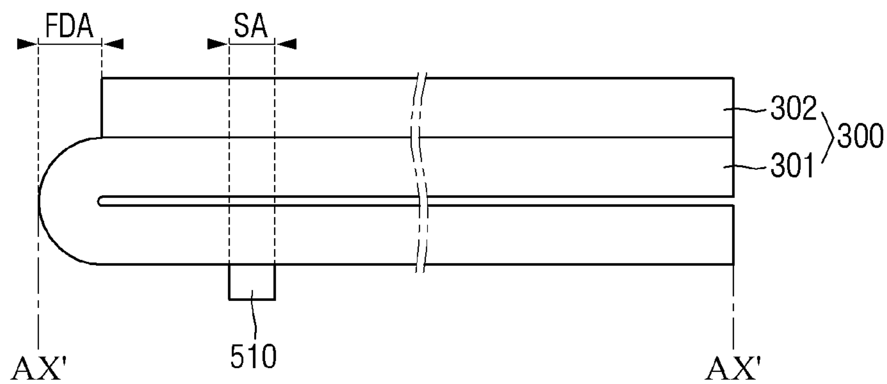
FIG. 116 is a side view showing an example of a first display panel, a second display panel and an optical sensor of a display device according to an embodiment in a case that the display device is folded.

FIGS. 113 and 114 are perspective views showing a display device according to an embodiment. FIG. 115 is a schematic cross-sectional view showing an example of a first display panel, a second display panel and an optical sensor of a display device according to an embodiment in a case that the display device is unfolded. FIG. 116 is a side view showing an example of a first display panel, a second display panel and an optical sensor of a display device according to an embodiment in a case that the display device is folded.

In the example shown in FIGS. 113 to 116, a display device 10 may be a foldable display device that may be bent or folded at a folding area FDA. FIG. 115 shows the display panel and the optical sensor, taken along line AIX-AIX' of FIG. 113. FIG. 116 shows the display panel and the optical sensor, taken along line AX-AX' of FIG. 114.

An embodiment of FIGS. 113 to 116 may be different from an embodiment of FIGS. 109 to 111 in that the display device 10 may be folded in the first direction (x-axis direction), and the display device 10 may include a second display area DA2 disposed on the lower surface of the display device 10 in addition to the first display area DA1 disposed on the upper surface of the display device 10.

Referring to FIGS. 113 to 116, the first non-folding area NFA1 may be disposed on one or a side, for example, the right side of the folding area FDA. The second non-folding area NFA2 may be disposed on the other or another side, for example, the left side of the folding area FDA.

The first folding line FL1 and the second folding line FL2 may be extended in the second direction (y-axis direction), and the display device 10 may be folded in the first direction (x-axis direction). As a result, the length of the display device 10 in the first direction (the x-axis direction) may be reduced to about half, so that the display device 10 may be conveniently carried.

The direction in which the first folding line FL1 and the second folding line FL2 may be extended is not limited to the second direction (y-axis direction). For example, the first folding line FL1 and the second folding line FL2 may be extended in the first direction (x-axis direction), and the display device 10 may be folded in the second direction (y-axis direction). In such case, the length of the display device 10 in the second direction (y-axis direction) may be reduced to about half. Alternatively, the first folding line FL1 and the second folding line FL2 may be extended in a diagonal direction of the display device 10 between the first direction (x-axis direction) and the second direction (y-axis direction). In such case, the display device 10 may be folded in a triangle or triangular shape.

In a case that the first folding line FL1 and the second folding line FL2 are extended in the second direction (y-axis direction), the length of the folding area FDA in the first direction (x-axis direction) may be smaller than the length in the second direction (y-axis direction). The length of the first non-folding area NFA1 in the first direction (x-axis direction) may be larger than the length of the folding area FDA in the first direction (x-axis direction). The length of the second non-folding area NFA2 in the first direction (x-axis direction) may be larger than the length of the folding area FDA in the first direction (x-axis direction).

The display device 10 may include a first display area DA1, a second display area DA2, a first non-display area NDA1, and a second non-display area NDA2. The first display area DA1 and the first non-display area NDA1 may be disposed on the upper surface of the display device 10. The first display area DA1 and the first non-display area NDA1 may overlap the folding area FDA, the first non-folding area NFA1, and the second non-folding area NFA2. Therefore, in a case that the display device 10 is unfolded, images may be displayed on upper surfaces of the folding area FDA, the first non-folding area NFA1 and the second non-folding area NFA2 of the display device 10.

The second display area DA2 and the second non-display area NDA2 may be disposed on the lower surface of the display device 10. The second display area DA2 and the second non-display area NDA2 may overlap the second non-folding area NFA2. Therefore, in a case that the display device 10 is folded, images may be displayed on the lower surface of the second non-folding area NFA2 of the display device 10.

The sensor area SA may be disposed close to one or a side of the display panel 300 in the first non-folding area NFA1. In a case that the display device 10 is unfolded, the sensor area SA may overlap the first non-folding area NFA1. In a case that the display device 10 is folded, the sensor area SA may overlap the first non-folding area NFA1 and the second non-folding area NFA2.

The display panel 300 may include a first display panel 301 and a second display panel 302.

In a case that the display panel 300 is unfolded as shown in FIG. 115, the first display panel 301 may form the upper surface of the display panel 300. In a case that the display panel 300 is folded as shown in FIG. 116, the first display panel 301 may be disposed inside the display panel 300 and may not be exposed to the outside of the display panel 300. The first display panel 301 may include the first display area DA1 and the first non-display area NDA1.

In a case that the display panel 300 is unfolded as shown in FIG. 115, the second display panel 302 may form a part of the lower surface of the display panel 300. In a case that the display panel 300 is folded as shown in FIG. 116, the second display panel 302 may form the upper surface of the display panel 300. The second display panel 302 may include the second display area DA2 and the second non-display area NDA2.

The optical sensor 510 may be disposed in the sensor area SA. The optical sensor 510 may be disposed on the lower surface of the first non-folding area NFA1 of the first display panel 301. The optical sensor 510 may be attached to or disposed on the lower surface of the first non-folding area NFA1 of the first display panel 301.

In a case that the display panel 300 is unfolded, the optical sensor 510 may detect light passing through the sensor area SA of the first non-folding area NFA1 of the first display panel 301. In a case that the display panel 300 is folded, the optical sensor 510 may detect the light passing through the sensor area SA of the second display panel 302, the sensor area SA of the second non-folding area NFA2 of the first display panel 301, and the sensor area SA of the first non-folding area NFA1 of the first display panel 301.

The sensor area SA of the first non-folding area NFA1 of the first display panel 301, the sensor area SA of the second non-folding area NFA2 of the first display panel 301 and the sensor area SA of the second display panel 302 may include pin holes or transmissive areas through which light may pass, as described above. Therefore, in a case that the display panel 300 is unfolded, the optical sensor 510 may detect light incident through the pinholes or transmissive areas of the sensor area SA of the first non-folding area NFA1 of the first display panel 301. In a case that the display panel 300 is folded, the optical sensor 510 may detect the light passing through the pin hole or transmissive area of each of the sensor area SA of the second display panel 302, the sensor area SA of the second non-folding area NFA2 of the first display panel 301, and the sensor area SA of the first non-folding area NFA1 of the first display panel 301.

The optical sensor 510 may include sensor pixels each including a light-receiving element that detects light. For example, the optical sensor 510 may be an optical fingerprint sensor, an illuminance sensor, or an optical proximity sensor. The sensor pixels of the optical sensor 510 may be substantially identical to those described above with reference to FIG. 14.

In a case that the optical sensor 510 is an optical fingerprint sensor, light may be emitted from the first display area DA1 of the first display panel 301 in case that the display panel 300 may be unfolded, and the optical sensor 510 may detect light that is reflected from a person's finger F and passes through the sensor area SA of the first non-folding area NFA1 of the first display panel 301. In a case that the display panel 300 is folded, the light may be emitted from the second display area DA2 of the second display panel 302, and the optical sensor 510 may detect the light that may be reflected from a person's fingerprint and passes through the sensor area SA of the second display panel 302, the sensor area SA of the second non-folding area NFA2 of the first display panel 301, and the sensor area SA of the first non-folding area NFA1 of the first display panel 301.

Figure 117:
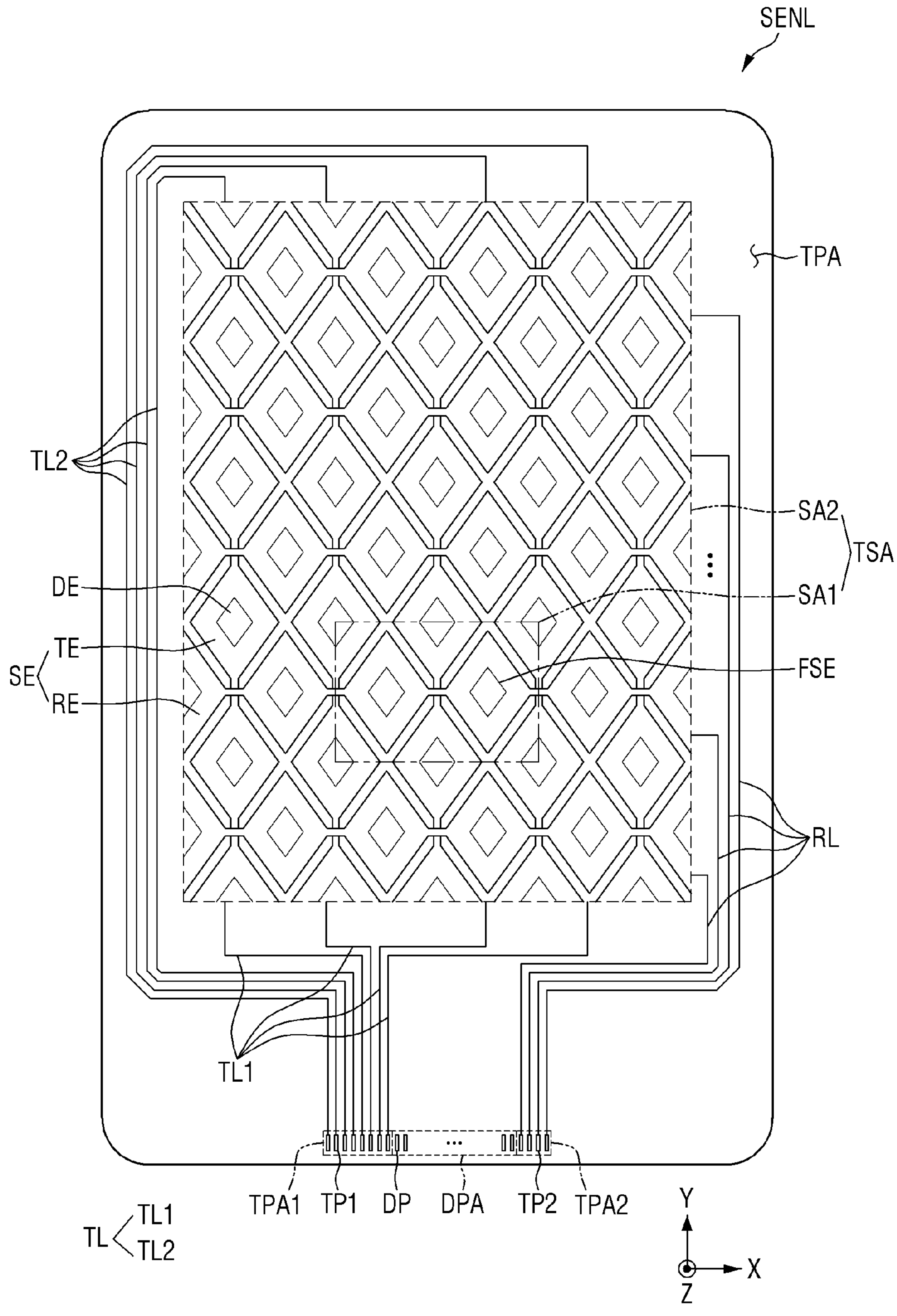
FIG. 117 is a view showing a layout of a sensor electrode layer of a display panel according to an embodiment.

FIG. 117 is a view showing a layout of a sensor electrode layer of a display panel according to an embodiment.

In the example shown in FIG. 117, the sensor electrodes SE of the sensor electrode layer SENL include two kinds of electrodes, for example, the driving electrodes TE and the sensing electrodes RE, and the mutual capacitive sensing may be carried out by using two layers, for example, driving signals may be applied to the driving electrodes TE and then the voltages charged at the mutual capacitances may be sensed through the sensing electrodes RE. It is, however, to be understood that the disclosure is not limited thereto. The sensor electrode layer SENL may be driven by mutual capacitance sensing using one layer or by self-capacitance sensing.

For convenience of illustration, FIG. 117 shows sensor electrodes SE, fingerprint sensor electrodes FSE, dummy patterns DE, sensor lines TL and RL, and sensor pads TP1 and TP2. Sensor lines TL may include driving lines TL1 and driving lines TL2.

Referring to FIG. 117, the sensor electrode layer SENL may include a touch sensor area TSA for sensing a user's touch, and a touch sensor peripheral area TPA disposed around the touch sensor area TSA. The touch sensor area TSA may overlap the display area DA of the display layer DISL, and the touch sensor peripheral area TPA may overlap the non-display area NDA of the display layer DISL.

The touch sensor area TSA may include a first sensor area SA1 for detecting a touch of an object and a person's fingerprint, and a second sensor area SA2 for detecting a touch of an object but not detecting a person's fingerprint. The second sensor area SA2 may be the other area of the touch sensor area TSA other than the first sensor area SA1.

The first sensor area SA1 may include sensor electrodes SE, fingerprint sensor electrodes FSE, and dummy patterns DE. The second sensor area SA2 may include sensor electrodes SE and dummy patterns DE.

The sensor electrodes SE may include driving electrodes TE and sensing electrodes RE. The sensing electrodes RE may be electrically connected to one another in the first direction (x-axis direction). The sensing electrodes RE may be extended in the first direction (x-axis direction). The sensing electrodes RE may be arranged or disposed in the second direction (y-axis direction). The sensing electrodes RE adjacent to one another in the second direction (y-axis direction) may be electrically separated from one another.

The driving electrodes TE may be electrically connected to one another in the second direction (y-axis direction). The driving electrodes TE may be extended in the second direction (y-axis direction). The driving electrodes TE may be arranged or disposed in the first direction (x-axis direction). The driving electrodes TE adjacent to one another in the first direction (x-axis direction) may be electrically separated from one another.

Figure 118:
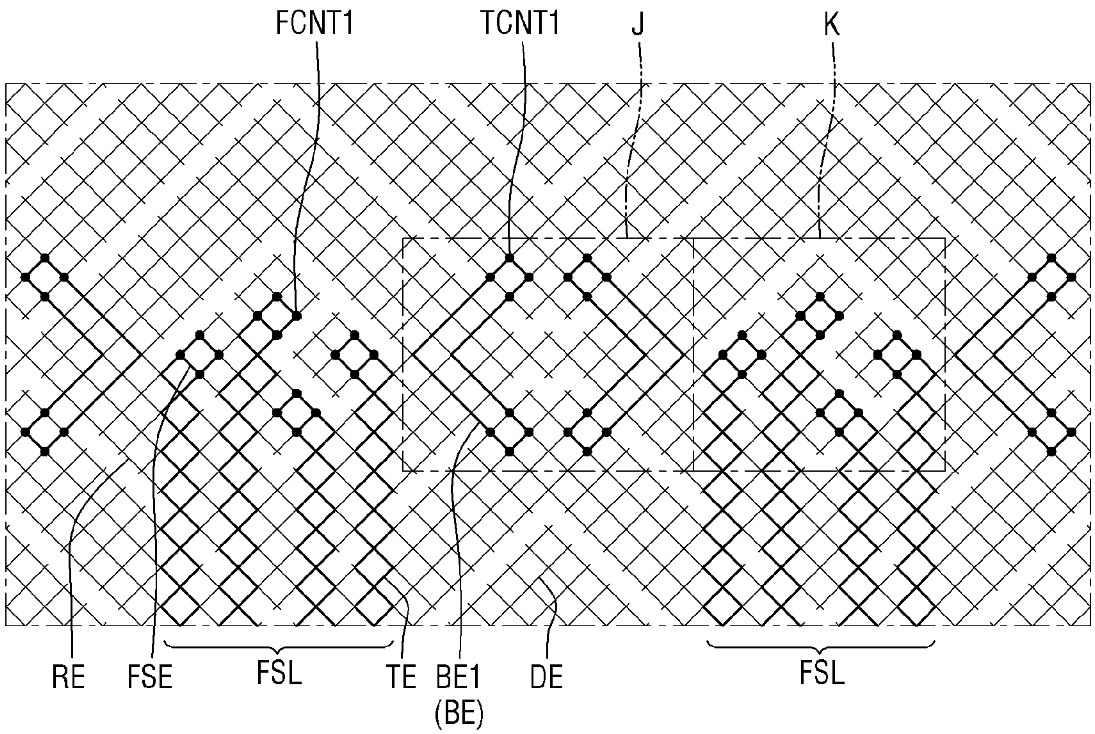
FIG. 118 is a view showing a layout of a first sensor area of the sensor electrode layer of FIG. 117.

In order to electrically separate the sensing electrodes RE from the driving electrodes TE at their intersections, the driving electrodes TE adjacent to one another in the second direction (y-axis direction) may be connected through the first connection portions BE1 (see FIG. 118). Although each of the driving electrodes TE and the sensing electrodes RE may have a substantially diamond shape when viewed from the top in FIG. 117, the disclosure is not limited thereto.

The fingerprint sensor electrodes FSE may be surrounded by the sensing electrode RE. For example, in FIG. 118, four fingerprint sensor electrodes FSE may be surrounded by the sensing electrode RE. It is, however, to be understood that the disclosure is not limited thereto. The fingerprint sensor electrodes FSE may be surrounded by the driving electrode RE.

The fingerprint sensor electrodes FSE may be electrically separated from one another. The fingerprint sensor electrodes FSE may be spaced apart from one another. Although each of the fingerprint sensor electrodes FSE may have a substantially diamond shape when viewed from the top in FIG. 117, the disclosure is not limited thereto.

Each of the dummy patterns DE may be surrounded by the driving electrode TE or the sensing electrode RE. Each of the dummy patterns DE may be electrically separated from the driving electrode TE or the sensing electrode RE. The driving electrodes TE and the dummy patterns DE adjacent to each other may be spaced apart from each other, and the sensing electrode RE and the dummy pattern DE adjacent to each other may be spaced apart from each other. Each of the dummy patterns DE may be electrically floating.

Due to the fingerprint sensor electrodes FSE or the dummy patterns DE, the parasitic capacitance between the second light-emitting electrode 173 of the emission material layer EML and the driving electrode TE, and between the second light-emitting electrode 173 and the sensing electrode RE may become smaller. In a case that the parasitic capacitance is reduced, there is an advantage in that the mutual capacitance between the driving electrode TE and the sensing electrode RE may be charged more quickly. However, as the area of the driving electrode TE and the sensing electrode RE is reduced due to the fingerprint sensor electrodes FSE or the dummy patterns DE, the mutual capacitance between the driving electrode TE and the sensing electrode RE may become smaller. In a case that this happens, the voltage charged in the mutual capacitance may be easily affected by noise. Therefore, it may be desirable to determine the area of the fingerprint sensor electrode FSE and the area of the dummy patterns DE by the trade-off between the parasitic capacitance and the mutual capacitance.

The sensor lines TL1, TL2 and RL may be disposed in the touch sensor peripheral area TPA. The sensor lines TL1, TL2 and RL may include sensing lines RL electrically connected to the sensing electrodes RE, and first driving lines TL1 and second driving lines TL2 electrically connected to the driving electrodes TE.

The sensing electrodes RE disposed on one or a side of the touch sensor area TSA may be electrically connected to the sensing lines RL. For example, some or a predetermined number of the sensing electrodes RE electrically connected in the first direction (x-axis direction) that may be disposed at the right end may be electrically connected to the sensing lines RL as shown in FIG. 117. The sensing lines RL may be electrically connected to second sensor pads TP2. Therefore, the touch driver 330 may be electrically connected to the sensing electrodes RE.

The driving electrodes TE disposed on the one or a side of the touch sensor area TSA may be electrically connected to the first driving lines TL1, while the driving electrodes TE disposed on the other or another side of the touch sensor area TSA may be electrically connected to the second driving lines TL2. For example, some or a predetermined number of the driving electrodes TE electrically connected to one another in the second direction (y-axis direction) on the lowermost side may be electrically connected to the first driving line TL1, while some or a predetermined number of the driving electrodes TE disposed on the uppermost side may be electrically connected to the second driving line TL2, as shown in FIG. 117. The second driving lines TL2 may be electrically connected to the driving electrodes TE on the upper side of the touch sensor area TSA via the left outer side of the touch sensor area TSA. The first driving lines TL1 and the second driving lines TL2 may be electrically connected to the first sensor pads TP1. Therefore, the touch driver 330 may be electrically connected to the driving electrodes TE. The driving electrodes TE may be electrically connected to the driving lines TL1 and TL2 on both sides of the touch sensor area TSA, and may receive the sensing driving signal. Therefore, it may be possible to prevent a difference between the sensing driving voltage applied to the driving electrodes TE disposed on the lower side of the touch sensor area TSA and the sensing driving voltages applied to the driving electrodes TE disposed on the upper side of the touch sensor area TSA which occurs due to the RC delay of the sensing driving signal.

The first sensor pad area TPA1 in which the first sensor pads TP1 may be disposed may be disposed on one or a side of the display pad area DPA in which the display pads DP may be disposed. The second sensor pad area TPA2 in which the second sensor pads TP2 may be disposed may be disposed on the other side of the display pad area DPA. The display pads DP may be electrically connected to data lines electrically connected to display pixels of the display panel 300.

The display circuit board 310 may be disposed on the display pads DP, the first sensor pads TP1, and the second sensor pads TP2 as shown in FIG. 4. The display pads DP, the first sensor pads TP1 and the second sensor pads TP2 may be electrically connected to the display circuit board 310 through an anisotropic conductive film or an anisotropic conductive adhesive. Therefore, the display pads DP, the first sensor pads TP1 and the second sensor pads TP2 may be electrically connected to the touch driver 330 disposed on the display circuit board 310. The area where display pads DP are located may be collectively referred to as a display pad area DPA.

As shown in FIG. 117, the touch sensor area TSA includes the fingerprint sensor electrodes FSE, in addition to the driving electrodes TE and the sensing electrodes RE. Therefore, it may be possible to sense a touch of an object using the mutual capacitance between the driving electrodes TE and the sensing electrodes RE, and it may also possible to sense a person's fingerprint using the capacitance of the fingerprint sensor electrodes FSE.

FIG. 118 is a view showing a layout of a first sensor area of the sensor electrode layer of FIG. 117.

Referring to FIG. 118, each of the driving electrodes TE, the sensing electrodes RE, the first connection portions BE1, the fingerprint sensor electrodes FSE and the dummy patterns DE may have a mesh structure or a net structure when viewed from the top. Sizes of mesh openings (or mesh holes) of each of the driving electrodes TE, the sensing electrodes RE, the first connection portions BE1, the fingerprint sensor electrodes FSE and the dummy patterns DE may be substantially all equal. It is, however, to be understood that the disclosure is not limited thereto. Connection portions BE may include, by way of non-limiting example, first connection portions, BE1.

In order to electrically separate the sensing electrodes RE from the driving electrodes TE at their intersections, the driving electrodes TE adjacent to one another in the second direction (y-axis direction) may be connected through the first connection portions BE1. The first connection portions BE1 may be disposed on a different layer from the driving electrodes TE and the sensing electrode RE. Each of the first connection portions BE1 may overlap the driving electrode TE and the sensing electrode RE in the third direction (z-axis direction).

Although not illustrated, each of the first connection portions BE1 may be bent at least once. Connection portions BE may include, by way of non-limiting example, first connection portions, BE1.

In FIG. 118, the first connection portions BE1 have the shape of angle brackets "<" or ">", but the shape of the first connection portions BE1 when viewed from the top is not limited thereto. Since the driving electrodes TE adjacent to each other in the second direction (y-axis direction) may be electrically connected by the first connection portions BE1, even if any of the first connection portions BE1 is disconnected, the driving electrodes TE may still be stably electrically connected with each other. Although two adjacent ones of the driving electrodes TE may be electrically connected by two first connection portions BE1 in the example shown in FIG. 118, but the number of first connection portions BE1 is not limited thereto.

Figure 124:
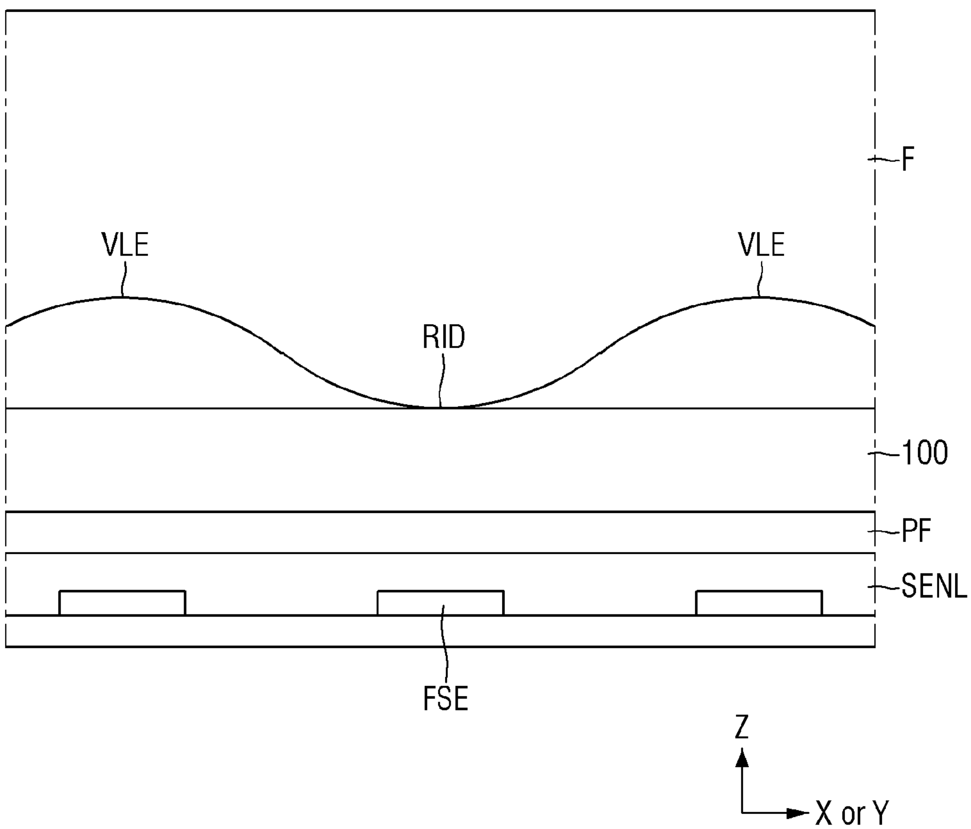

The fingerprint sensor electrodes FSE may be electrically connected to the fingerprint sensor lines FSL, respectively. Each of the fingerprint sensor electrodes FSE may be electrically connected to one of the fingerprint sensor lines FSL. The fingerprint sensor electrode FSE may be driven by self-capacitance sensing. According to the self-capacitance sensing scheme, a self-capacitance formed by the fingerprint sensor electrode FSE is charged with a driving signal applied through a fingerprint sensor line FSL, and the amount of change in the voltage charged in the self-capacitance may be detected. As shown in FIG. 124, the sensor driver 340 may recognize a person's fingerprint by sensing a difference between the value of the self-capacitance of the fingerprint sensor electrodes FSE at the ridges RID of the person's fingerprint and the value of the self-capacitance of the fingerprint sensor electrodes FSE at the valleys VLE of the person's fingerprint.

The fingerprint sensor lines FSL may be extended in the second direction (y-axis direction). The fingerprint sensor lines FSL may be arranged or disposed in the first direction (x-axis direction). The fingerprint sensor lines FSL may be electrically separated from one another.

The fingerprint sensor lines FSL may be electrically connected to the sensor pads TP1 and TP2 shown in FIG. 117. Therefore, the fingerprint sensor lines FSL may be electrically connected to the sensor driver 340 of the display circuit board 310 shown in FIG. 4.

As shown in FIG. 118, a person's fingerprint may be detected by driving each of the fingerprint sensor electrodes FSE by self-capacitance sensing. For example, a self-capacitance of each of the fingerprint sensor electrodes FSE may be formed by applying a driving signal through a fingerprint sensor line FSL, and the amount of a change in the self-capacitance may be measured.

Figure 119:
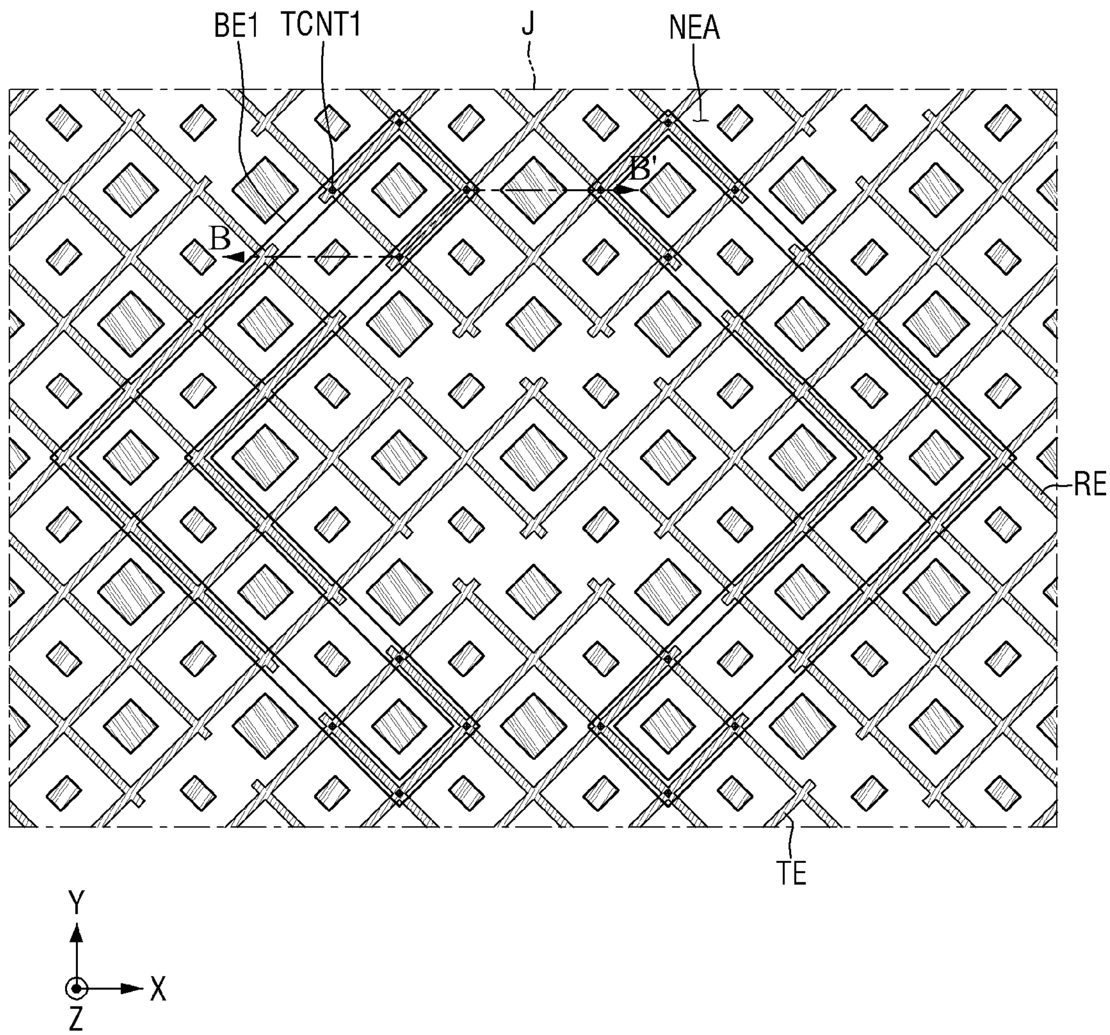
FIG. 119 is a view showing an example of a layout of the driving electrodes, the sensing electrodes and the connection portions of FIG. 118.
Figure 120:
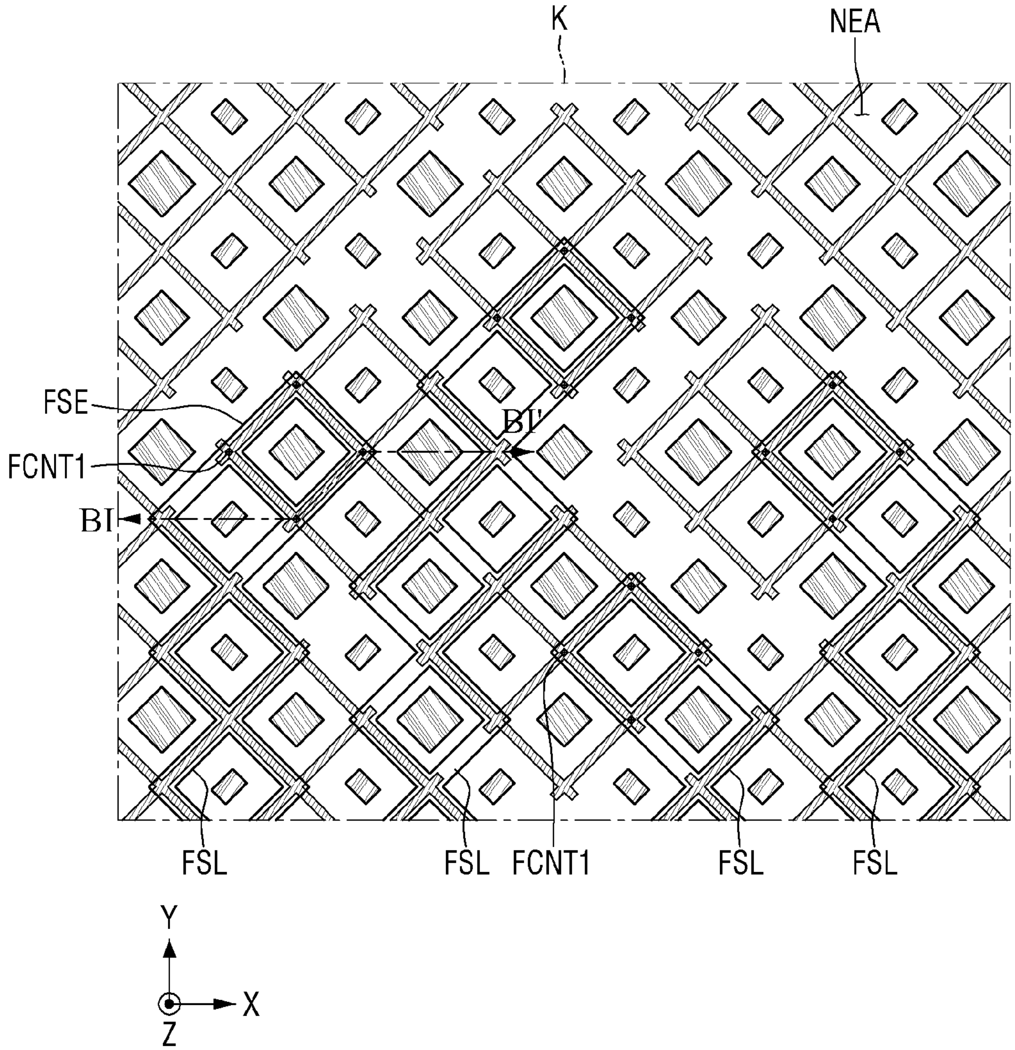
FIG. 120 is a view showing an example of a layout of the fingerprint sensor electrodes of FIG. 118.

FIG. 119 is a view showing an example of a layout of the driving electrodes, the sensing electrodes and the connection portions of FIG. 118. FIG. 120 is a view showing an example of a layout of the fingerprint sensor electrodes of FIG. 118.

FIG. 119 is an enlarged view showing a layout of area J of FIG. 118. FIG. 120 is an enlarged view showing a layout of area K of FIG. 118.

Referring to FIGS. 119 and 120, each of the fingerprint sensor lines FSL may be formed in a mesh structure or a net structure when viewed from the top, in addition to the driving electrodes TE, the sensing electrodes RE, the first connection portions BE1, the fingerprint sensor electrodes FSE and the dummy patterns DE. Accordingly, each of the driving electrodes TE, the sensing electrodes RE, the first connection portions BE1, the fingerprint sensor electrodes FSE, the fingerprint sensor lines FSL and the dummy patterns DE may not overlap the emission areas RE, GE and BE in the third direction (z-axis direction). Therefore, it may be possible to prevent the luminance of the light emitted from the emission areas RE, GE and BE from being reduced which may occur in a case that the emission areas RE, GE and BE may be covered or overlapped by the driving electrodes TE, the sensing electrodes RE, the first connection portions BE1, the fingerprint sensor electrodes FSE, the fingerprint sensor lines FSL and the dummy patterns DE.

Since the driving electrodes TE, the sensing electrodes RE, the fingerprint sensor electrodes FSE and the dummy patterns DE are formed on the same layer, they may be spaced apart from one another. A gap may be formed between the driving electrode TE and the sensing electrode RE, between the sensing electrode RE and the fingerprint sensor electrode FSE, and between the fingerprint sensor electrodes FSE. A gap may also be formed between the driving electrode TE and the dummy pattern DE and between the sensing electrode RE and the dummy pattern DE.

One side of the first connection portion BE1 may be electrically connected to one of the driving electrodes TE adjacent to one another in the second direction (y-axis direction) through first touch contact holes TCNT1. The other side of the first connection portion BE1 may be electrically connected to another one of the driving electrodes TE adjacent to one another in the second direction (y-axis direction) through the first touch contact holes TCNT1.

The fingerprint sensor lines FSL may be disposed on a different layer from the fingerprint sensor electrodes FSE. A part of the fingerprint sensor line FSL may overlap a part of the fingerprint sensor electrode FSE in the third direction (z-axis direction). Each of the fingerprint sensor lines FSL may overlap the driving electrode TE or the sensing electrode RE in the third direction (z-axis direction). One side of the fingerprint sensor line FSL may be electrically connected to the fingerprint sensor electrode FSE through the first fingerprint contact holes FCNT1.

Figure 121:
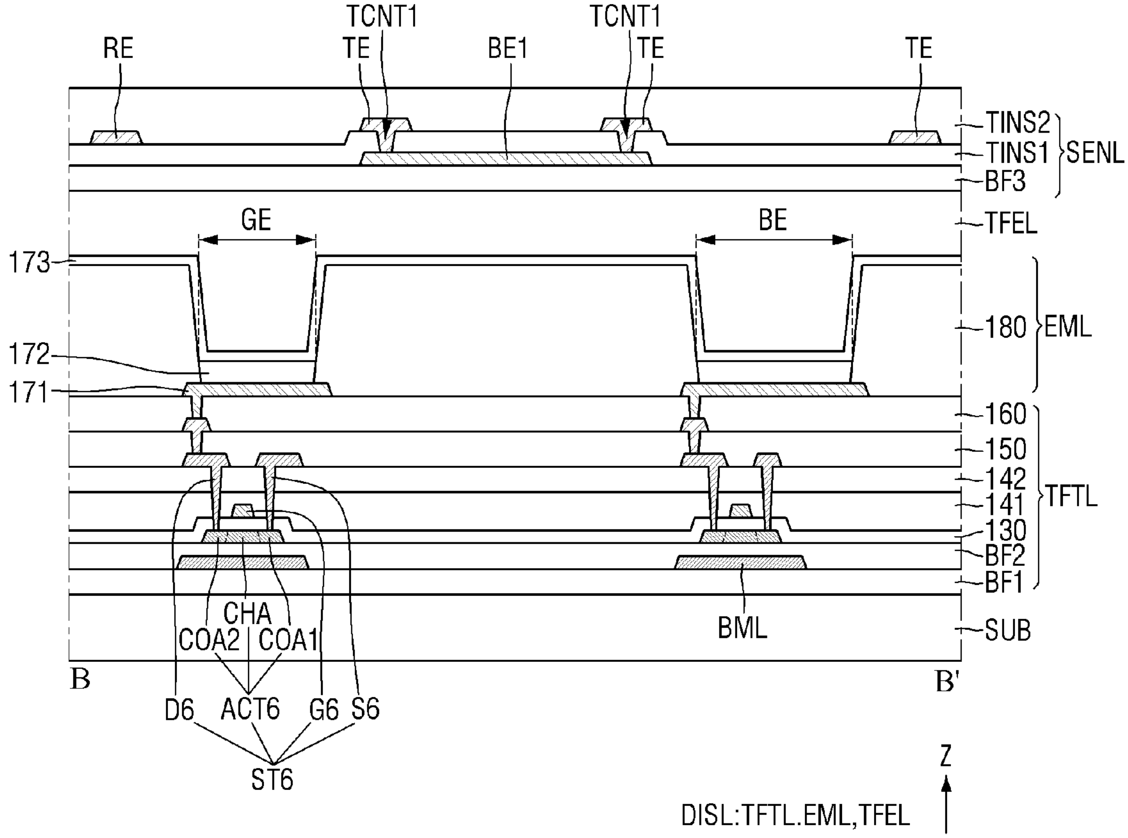
Figure 122:
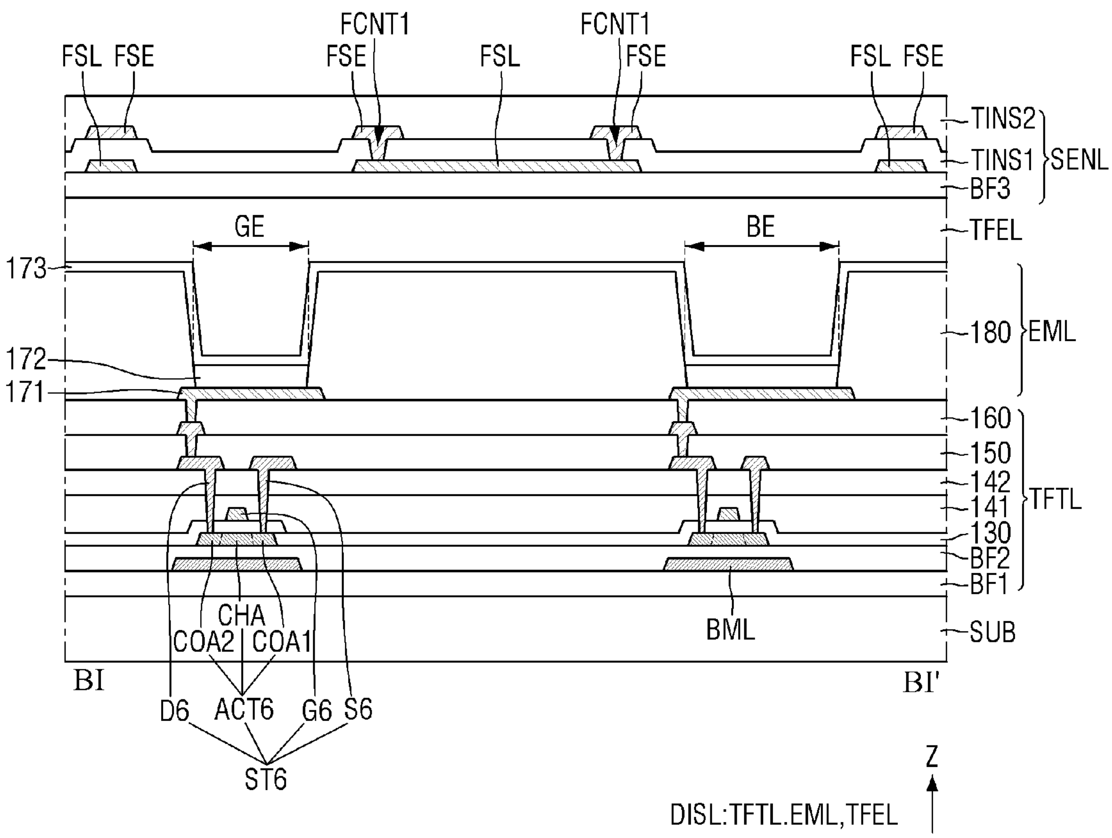

FIG. 121 is a schematic cross-sectional view showing an example of the driving electrode, the sensing electrode and the connection portion of FIG. 119. FIG. 122 is a schematic cross-sectional view showing an example of the fingerprint sensor electrode of FIG. 120. FIG. 121 shows an example of a schematic cross section of the display panel 300, taken along line B-B' of FIG. 119. FIG. 122 shows an example of a schematic cross section of the display panel 300, taken along line BI-BI' of FIG. 120.

Since the substrate SUB, the display layer DISL and the emission material layer EML shown in FIGS. 121 and 122 are substantially identical to those described above with reference to FIG. 15; and, therefore, the redundant description will be omitted.

Referring to FIGS. 121 and 122, the sensor electrode layer SENL is disposed on the encapsulation layer TFEL. The sensor electrode layer SENL may include first connection portions BE1, fingerprint sensor lines FSL, driving electrodes TE, sensing electrodes RE, and fingerprint sensor electrodes FSE.

The third buffer layer BF3 may be disposed on the encapsulation layer TFEL. The third buffer layer BF3 may include at least one inorganic layer. For example, the third buffer layer BF3 may be made up of multiple layers in which one or more inorganic layers of a silicon nitride layer, a silicon oxynitride layer, a silicon oxide layer, a titanium oxide layer and an aluminum oxide layer are alternately stacked one on another. The third buffer layer BF3 may be eliminated.

The first connection portions BE1 and the fingerprint sensor lines FSL may be disposed on the third buffer layer BF3. Each of the first connection portions BE1 and the fingerprint sensor lines FSL may not overlap the emission areas RE, GE and BE, and may overlap the bank 180 in the third direction (z-axis direction). Each of the first connection portions BE1 and the fingerprint sensor lines FSL may be made up of a single layer of molybdenum (Mo), titanium (Ti), copper (Cu) or aluminum (Al), or may be made up of a stack structure of aluminum and titanium (Ti/Al/Ti), a stack structure of aluminum and ITO (ITO/Al/ITO), an APC alloy and a stack structure of an APC alloy and ITO (ITO/APC/ITO).

The first sensor insulating layer TINS1 may be disposed on the first connection portions BE1 and the fingerprint sensor lines FSL. The first sensor insulating layer TINS1 may be formed of an inorganic layer, for example, a silicon nitride layer, a silicon oxynitride layer, a silicon oxide layer, a titanium oxide layer, or an aluminum oxide layer.

The driving electrodes TE, the sensing electrodes RE and the fingerprint sensor electrodes FSE may be formed on the first sensor insulating layer TINS1. Each of the driving electrodes TE, the sensing electrodes RE and the fingerprint sensor electrodes FSE may not overlap the emission areas RE, GE and BE but may overlap the bank 180 in the third direction (z-axis direction). Each of the driving electrodes TE, the sensing electrodes RE and the fingerprint sensor electrodes FSE may be made up of a single layer of molybdenum (Mo), titanium (Ti), copper (Cu) or aluminum (Al), or may be made up of a stack structure of aluminum and titanium (Ti/Al/Ti), a stack structure of aluminum and ITO (ITO/Al/ITO), an APC alloy and a stack structure of an APC alloy and ITO (ITO/APC/ITO).

The driving electrode TE may be electrically connected to the first connection portion BE1 through a first touch contact hole TCNT1 that may penetrate the first sensor insulating layer TINS1 and expose the first connection portion BE1. The first sensor insulating layer TINS1 may include a first fingerprint contact holes FCNT1. The fingerprint sensor electrode FSE may be electrically connected to the fingerprint sensor line FSL through a first fingerprint contact hole FCNT1 that may penetrate the first sensor insulating layer TINS1 and expose the fingerprint sensor line FSL.

The value of the self-capacitance of the fingerprint sensor electrode FSE may be smaller than the value of the mutual capacitance between the driving electrode TE and the sensing electrode RE. For example, as shown in FIG. 124, the polarizing film PF and the cover window 100 are disposed on the sensor electrode layer SENL, a difference between the value of the self-capacitance of the fingerprint sensor electrodes FSE at the ridges RID of the person's fingerprint and the value of the self-capacitance of the fingerprint sensor electrodes FSE at the valleys VLE of the person's fingerprint may be very small. For example, the difference in capacitance value between the ridges RID and the valleys VLE of the person's fingerprint may be approximately 0.2 to 0.5 femtofarad (fF). In a case that the sensitivity of the sensor driver 340 is about 0.01 femtofarad (fF), the sensor driver 340 may detect a difference in the capacitance values between the ridges RID and the valleys VLE of a person's fingerprint. A difference between the value of the mutual capacitance between the driving electrode TE and the sensing electrode RE in a case that a touch of an object occurs and the value of the mutual capacitance between the driving electrode TE and the sensing electrode RE in a case that no touch of the object occurs may be approximately 60 to 80 femtofarad (fF).

The second sensor insulating layer TINS2 may be disposed over the driving electrodes TE, the sensing electrodes RE, and the fingerprint sensor electrodes FSE. The second sensor insulating layer TINS2 may include at least one of an inorganic layer and an organic layer. The inorganic layer may be a silicon nitride layer, a silicon oxynitride layer, a silicon oxide layer, a titanium oxide layer, or an aluminum oxide layer. The organic layer may be an acryl resin layer, an epoxy resin layer, a phenolic resin layer, a polyamide resin layer and a polyimide resin layer.

As shown in FIGS. 121 and 122, the fingerprint sensor electrodes FSE may be disposed on the same layer and made of the same or similar material as the driving electrodes TE and the sensing electrodes RE, and the fingerprint sensor lines FSL may be disposed on the same layer and made of the same or similar material as the first connection portions BE1. Therefore, the fingerprint sensor electrodes FSE and the fingerprint sensor lines FSL may be formed without any additional process.

Figure 123:
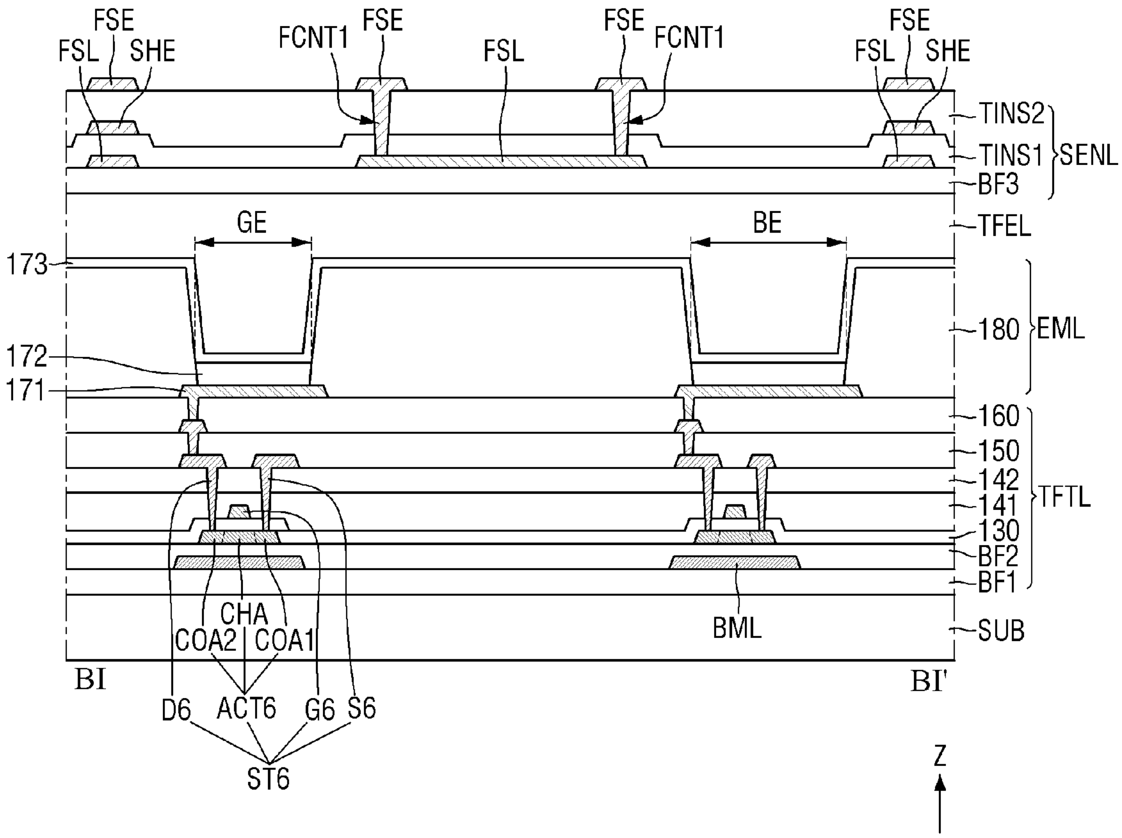

FIG. 123 is a schematic cross-sectional view showing another example of the fingerprint sensor electrodes of FIG. 120. FIG. 123 shows another example of a schematic cross section of the display panel 300, taken along line BI-BI' of FIG. 120. FIG. 124 is a view showing a method of recognizing a fingerprint by fingerprint sensor electrodes driven by self-capacitance sensing.

An embodiment of FIG. 123 may be different from an embodiment of FIG. 122 in that the fingerprint sensor electrodes FSE may be disposed on the second sensor insulating layer TINS2.

Referring to FIG. 123, driving electrodes TE, sensing electrodes RE and shielding electrodes SHE may be disposed on the first sensor insulating layer TINS1. Each of the driving electrodes TE, the sensing electrodes RE and the shielding electrodes SHE may not overlap the emission areas RE, GE and BE but may overlap the bank 180 in the third direction (z-axis direction). Each of the driving electrodes TE, the sensing electrodes RE and the shielding electrodes SHE may be made up of a single layer of molybdenum (Mo), titanium (Ti), copper (Cu) or aluminum (Al), or may be made up of a stack structure of aluminum and titanium (Ti/Al/Ti), a stack structure of aluminum and ITO (ITO/Al/ITO), an APC alloy and a stack structure of an APC alloy and ITO (ITO/APC/ITO).

Each of the shielding electrodes SHE may be electrically floating. Alternatively, a ground voltage may be applied to each of the shielding electrodes SHE. The shielding electrodes SHE may be omitted.

The second sensor insulating layer TINS2 may be disposed over the driving electrodes TE, the sensing electrodes RE, and the fingerprint sensor electrodes FSE.

The fingerprint sensor electrodes FSE may be disposed on the second sensor insulating layer TINS2. As shown in FIG. 124, the difference in capacitance between the ridges RID and the valleys VLE of a person's fingerprint may increase as the distance between the fingerprint sensor electrodes FSE and the person's finger F is closer. Therefore, in a case that the fingerprint sensor electrodes FSE are disposed on the second sensor insulating layer TINS2, the difference in capacitance between the ridges RID and the valleys VLE of the person's fingerprint may increase. Therefore, the person's fingerprint may be recognized more accurately.

Each of the fingerprint sensor electrodes FSE may not overlap the emission areas RE, GE and BE, and may overlap the bank 180 in the third direction (z-axis direction). The fingerprint sensor electrodes FSE may be electrically connected to the fingerprint sensor lines FSL through first fingerprint contact holes FCNT1 penetrating through the first sensor insulating layer TINS1 and the second sensor insulating layer TINS2 to expose the fingerprint sensor lines FSL. Each of the fingerprint sensor electrodes FSE may be made up of a single layer of molybdenum (Mo), titanium (Ti), copper (Cu) or aluminum (Al), or may be made up of a stack structure of aluminum and titanium (Ti/Al/Ti), a stack structure of aluminum and ITO (ITO/Al/ITO), an APC alloy and a stack structure of an APC alloy and ITO (ITO/APC/ITO).

The fingerprint sensor electrodes FSE may overlap the shielding electrodes SHE in the third direction (z-axis direction). By doing so, it may be possible to suppress the self-capacitance of the fingerprint sensor electrode FSE from being affected by the voltage change of the sensing electrode RE adjacent to the fingerprint sensor electrode FSE by virtue of by the shielding electrode SHE. Therefore, the person's fingerprint may be recognized more accurately.

Figure 125:
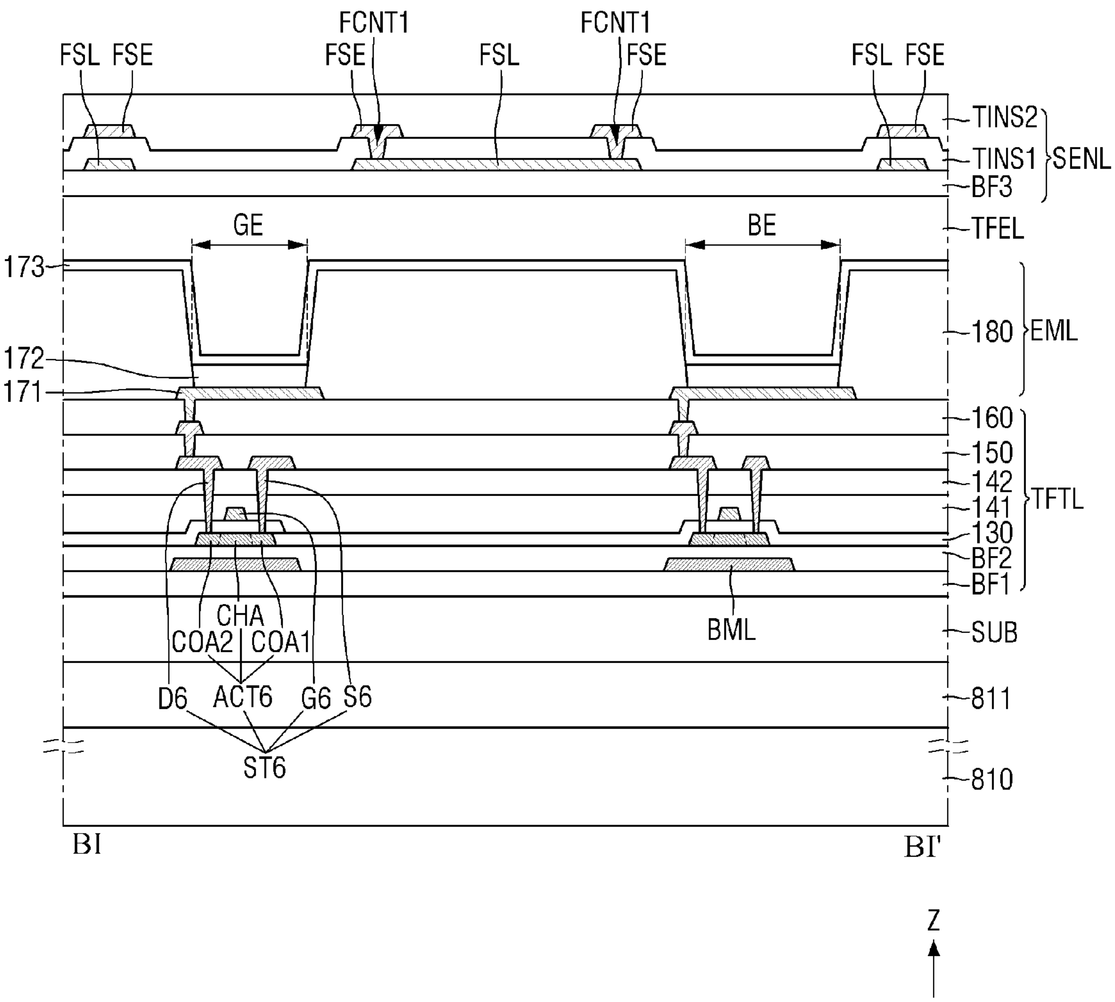

FIG. 125 is a schematic cross-sectional view showing another example of the fingerprint sensor electrodes of FIG. 120.

An embodiment of FIG. 125 may be different from an embodiment of FIG. 122 in that a fingerprint sensor 810 may be added on the lower surface of the substrate SUB.

Referring to FIG. 125, the fingerprint sensor 810 may be disposed on the lower surface of the substrate SUB. The fingerprint sensor 810 may be attached to the lower surface of the substrate SUB through an adhesive member 811. The fingerprint sensor 810 may be either an optical fingerprint sensor or an ultrasonic fingerprint sensor. In a case that the fingerprint sensor 810 is an optical fingerprint sensor, the adhesive member 811 may be a transparent adhesive member such as an optically clear adhesive film or an optically clear resin. In a case that the fingerprint sensor 810 is an ultrasonic fingerprint sensor, the adhesive member 811 may be a pressure sensitive adhesive.

As shown in FIG. 125, in a case that the fingerprint sensor 810 may be disposed on the lower surface of the substrate SUB, it may be possible to recognize a person's fingerprint by capacitive sensing using the self-capacitance of each of the fingerprint sensor electrodes FSE as well as by using the fingerprint sensor 810. For example, since it may be possible to recognize a person's fingerprint by capacitive sensing as well as optical sensing or ultrasonic sensing, the person's fingerprint may be recognized more accurately.

Figure 126:
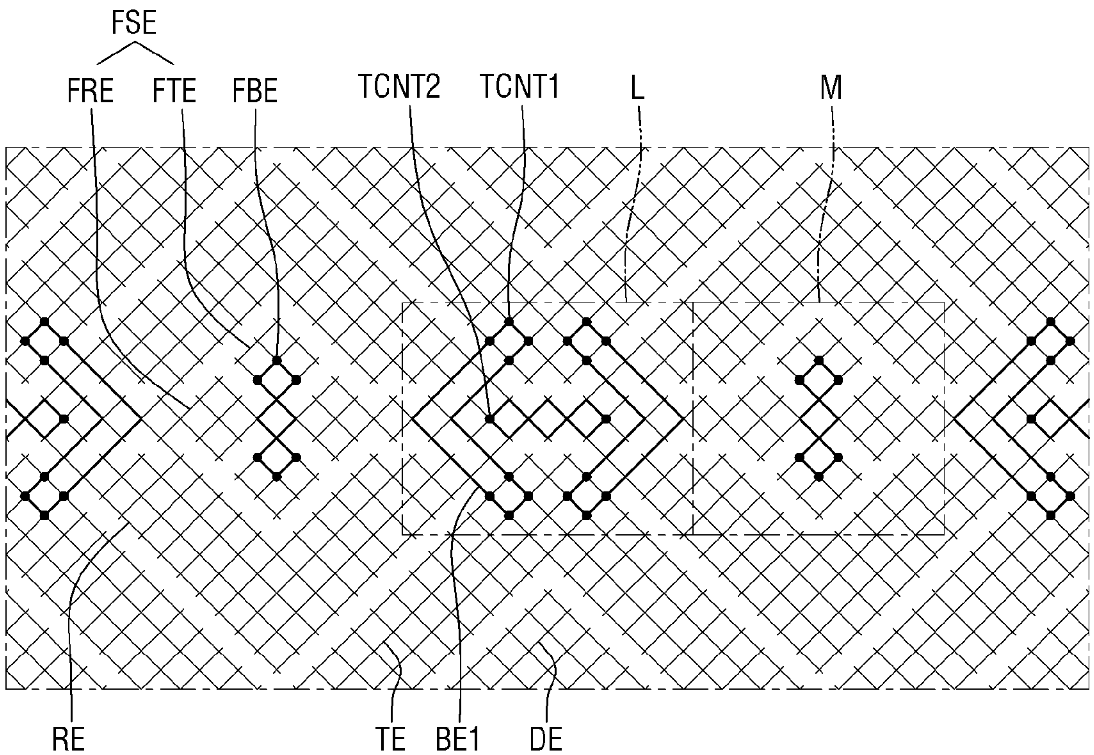

FIG. 126 is a view showing a layout of a first sensor area of the sensor electrode layer of FIG. 117.

An embodiment of FIG. 126 may be different from an embodiment of FIG. 118 in that fingerprint sensor electrodes FSE may include fingerprint driving electrodes FTE, fingerprint sensing electrodes FRE and fingerprint connection portions FBE, and second connection portions BE2 (see FIG. 127) for connecting between the fingerprint sensing electrode FRE may be added.

Referring to FIG. 126, each of the fingerprint driving electrodes FTE, the fingerprint sensing electrodes FRE and the fingerprint connection portions FBE may be formed in a mesh structure or a net structure when viewed from the top. The sizes of mesh openings (or mesh holes) of the fingerprint driving electrodes FTE, the fingerprint sensing electrodes FRE and the fingerprint connection portions FBE may be substantially all equal. It is, however, to be understood that the disclosure is not limited thereto.

In order to electrically separate the fingerprint driving electrodes FTE from the fingerprint sensing electrodes FRE at their intersections, the fingerprint driving electrodes FTE adjacent to one another in the second direction (y-axis direction) may be electrically connected through the fingerprint connection portions FBE. The fingerprint connection portions FBE may be extended in the second direction (y-axis direction). The fingerprint connection portions FBE may be disposed on a different layer from the fingerprint driving electrodes FTE and the fingerprint sensing electrodes FRE.

Figure 130:
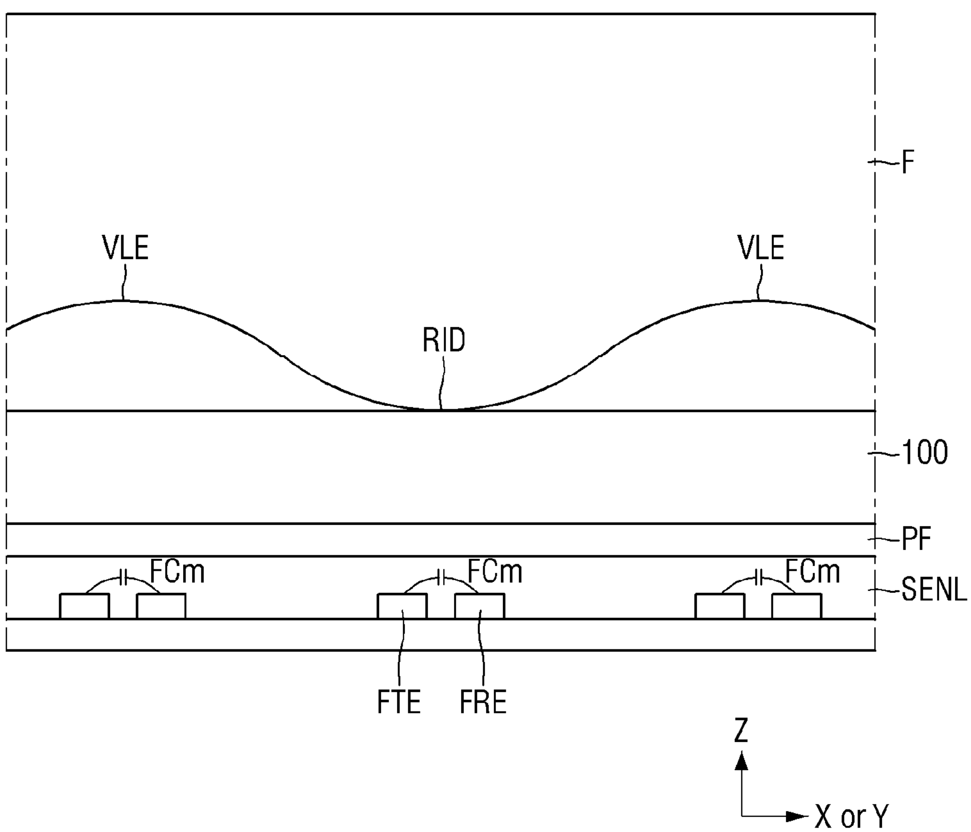

The fingerprint driving electrodes FTE and the fingerprint sensing electrodes FRE may be driven by mutual capacitance sensing. According to the mutual capacitance scheme, the mutual capacitance between the fingerprint driving electrodes FTE and the fingerprint sensing electrodes FRE is formed with a driving signal applied to the fingerprint driving electrodes FTE, and the amount of a change in the mutual capacitance may be detected based on the fingerprint sensing electrodes FRE. As shown in FIG. 130, a person's fingerprint may be detected by sensing a difference between the value of the mutual capacitance FCm between the fingerprint driving electrodes FTE and the fingerprint sensing electrodes FRE at the ridges RID of the person's fingerprint and the value of the mutual capacitance FCm between the fingerprint driving electrodes FTE and the fingerprint sensing electrodes FRE at the valleys VLE of the person's fingerprint.

One of the fingerprint sensing electrodes FRE surrounded by one of the adjacent sensing electrodes RE may be electrically connected to one of the fingerprint sensing electrodes FRE surrounded by another sensing electrode RE through the second connection portion BE2. The second connection portions BE2 may be extended in the first direction (x-axis direction). The second connection portions BE2 may be electrically separated from the driving electrodes TE and the sensing electrodes RE.

One of the fingerprint driving electrodes FTE surrounded by one of the adjacent sensing electrodes RE may be electrically connected to one of the fingerprint driving electrodes FTE surrounded by another sensing electrode RE through the third connection portion (not shown). The third connection portions may be extended in the second direction (y-axis direction). The third connection portions may be electrically separated from the driving electrodes TE and the sensing electrodes RE.

The fingerprint sensing line may be disposed on one side of the touch sensor area TSA, for example, on the left side or the right side of the touch sensor area TSA to be electrically connected to the fingerprint sensing electrodes FRE. The fingerprint driving line may be disposed on another side of the touch sensor area TSA, for example, on the lower side of the touch sensor area TSA to be electrically connected to the fingerprint driving electrodes FRE. The fingerprint driving line and the fingerprint sensing line may be electrically connected to the sensor pads TP1 and TP2 shown in FIG. 117. Therefore, the fingerprint driving line and the fingerprint sensing line may be electrically connected to the sensor driver 340 of the display circuit board 310 shown in FIG. 4.

As shown in FIG. 126, a person's fingerprint may be detected by mutual capacitance sensing. For example, the mutual capacitance FCm may be formed between the fingerprint driving electrodes FTE and the fingerprint sensing electrodes FRE by applying a driving signal, and the amount of a change in the mutual capacitance FCm may be measured.

Figure 127:
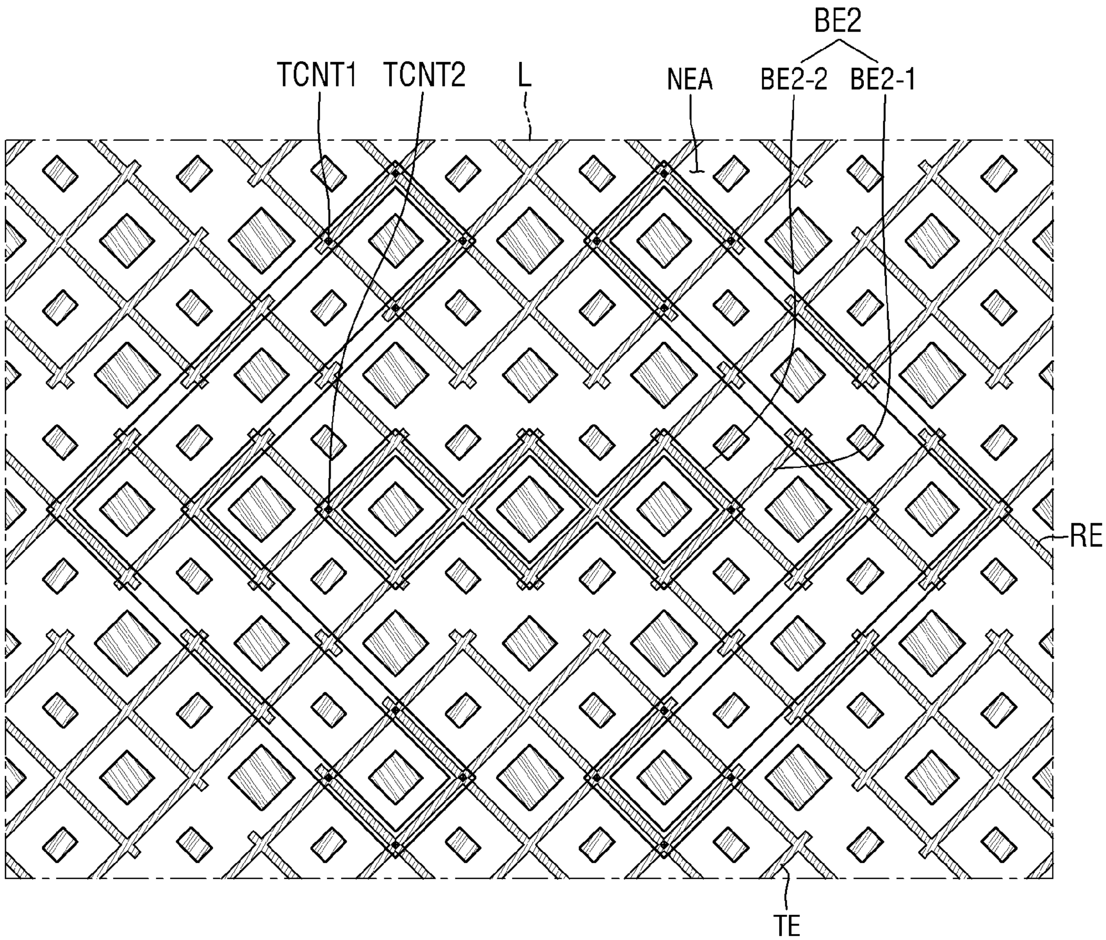

FIG. 127 is a view showing an example of a layout of the driving electrodes, the sensing electrodes and the connection portions of FIG. 126. FIG. 127 shows an enlarged view showing a layout of area L of FIG. 126.

An embodiment of FIG. 127 may be different from an embodiment of FIG. 119 in that a sensor electrode layer SENL may include second connection portions BE2.

Referring to FIG. 127, each of the second connection portions BE2 may include a first subsidiary connection portion BE2-1 and a second subsidiary connection portion BE2-2. Each of the first subsidiary connection portion BE2-1 and the second subsidiary connection portions BE2-2 may be formed in a mesh structure or a net structure when viewed from the top. Thus, each of the first subsidiary connection portion BE2-1 and the second subsidiary connection portion BE2-2 may not overlap the emission areas RE, GE and BE in the third direction (z-axis direction). Therefore, it may be possible to prevent the luminance of the light emitted from the emission areas RE, GE and BE from being reduced which may occur in a case that the emission areas RE, GE and BE may be covered or overlapped by the first subsidiary connection portion BE2-1 and the second subsidiary connection portion BE2-2.

Since the first subsidiary connection portion BE2-1 is formed on the same layer as the sensing electrode RE, the first subsidiary connection portion BE2-1 may be spaced apart from it. A gap may be formed between the first subsidiary connection portion BE2-1 and the sensing electrode RE. A part of the first subsidiary connection portion BE2-1 may overlap a part of the first connection portion BE1 in the third direction (z-axis direction).

One side of the second subsidiary connection portion BE2-2 may be electrically connected to one of the first subsidiary connection portions BE2-1 adjacent to one another in the first direction (x-axis direction) through at least one second touch contact hole TCNT2. The other side of the second subsidiary connection portion BE2-2 may be electrically connected to another one of the first subsidiary connection portions BE2-1 adjacent to one another in the first direction (x-axis direction) through at least one second touch contact hole TCNT2.

As shown in FIG. 127, one of the fingerprint sensing electrodes FRE surrounded by one of the adjacent sensing electrodes RE may be electrically connected to one of the fingerprint sensing electrodes FRE surrounded by another sensing electrode RE through the second connection portion BE2.

Figure 128:
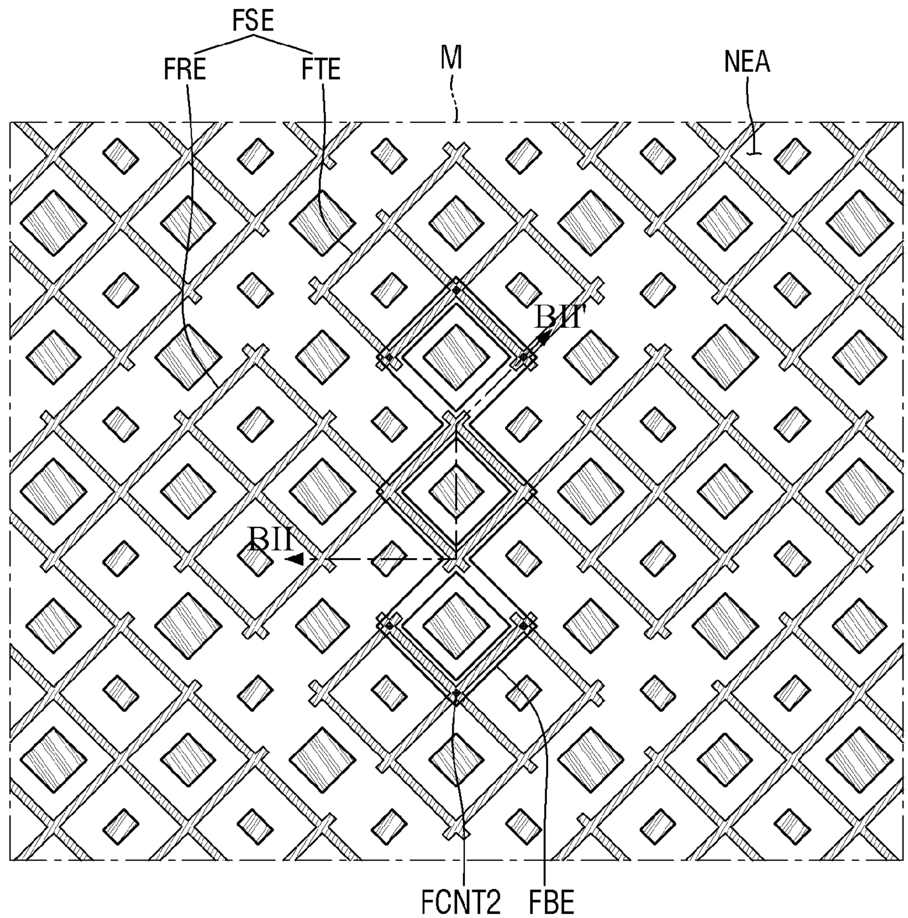

FIG. 128 is a view showing an example of a layout of the fingerprint driving electrode and the fingerprint sensing electrode of FIG. 126. FIG. 128 shows an enlarged view showing a layout of area M of FIG. 126.

Referring to FIG. 128, each of the fingerprint driving electrodes FTE, the fingerprint sensing electrodes FRE, the fingerprint connection portions FBE, the first subsidiary connection portions BE2-1 of the second connection portions BE2 and the third connection portions may be formed in a mesh structure or a net structure when viewed from the top. Thus, each of the fingerprint driving electrodes FTE, the fingerprint sensing electrodes FRE, the fingerprint connection portions FBE, the first subsidiary connection portions BE2-1 of the second connection portions BE2 and the third connection portions may not overlap the emission areas RE, GE and BE in the third direction (z-axis direction). Therefore, it may be possible to prevent the luminance of the light emitted from the emission areas RE, GE and BE from being reduced which may occur in a case that the emission areas RE, GE and BE may be covered or overlapped by the fingerprint driving electrodes FTE, the fingerprint sensing electrodes FRE, the fingerprint connection portions FBE, the first subsidiary connection portions BE2-1 of the second connection portions BE2 and the third connection portions.

The fingerprint sensing electrodes FRE and the fingerprint driving electrodes FTE are formed on the same layer and may be spaced apart from one another. Since the third connection portion is formed on the same layer as the sensing electrode RE and the driving electrode TE, the third connection portion may be spaced apart from them. A gap may be formed between the fingerprint sensing electrode FRE and the fingerprint driving electrode FTE, between the third connection portion and the sensing electrode RE, and between the third connection portion and the driving electrode TE. A part of the fingerprint sensing electrode FRE may overlap a part of the fingerprint connection portion FBE in the third direction (z-axis direction).

One side of the fingerprint connection portion FBE may be electrically connected to one of the fingerprint driving electrodes FTE through at least one second fingerprint contact hole FCNT2. The other side of the fingerprint connection portion FBE may be electrically connected to another one of the fingerprint driving electrodes FTE through at least one second fingerprint contact hole FCNT2.

As shown in FIG. 128, since the fingerprint driving electrodes FTE and the fingerprint sensing electrodes FRE may be electrically separated from each other at their intersections due to the fingerprint connection portion FBE so that they can intersect with each other, a mutual capacitance may be formed between the fingerprint driving electrodes FTE and the fingerprint sensing electrodes FRE.

One of the fingerprint driving electrodes FTE surrounded by one of the adjacent sensing electrodes RE may be electrically connected to one of the fingerprint driving electrodes FTE surrounded by another sensing electrode RE through the third connection portion.

Figure 129:
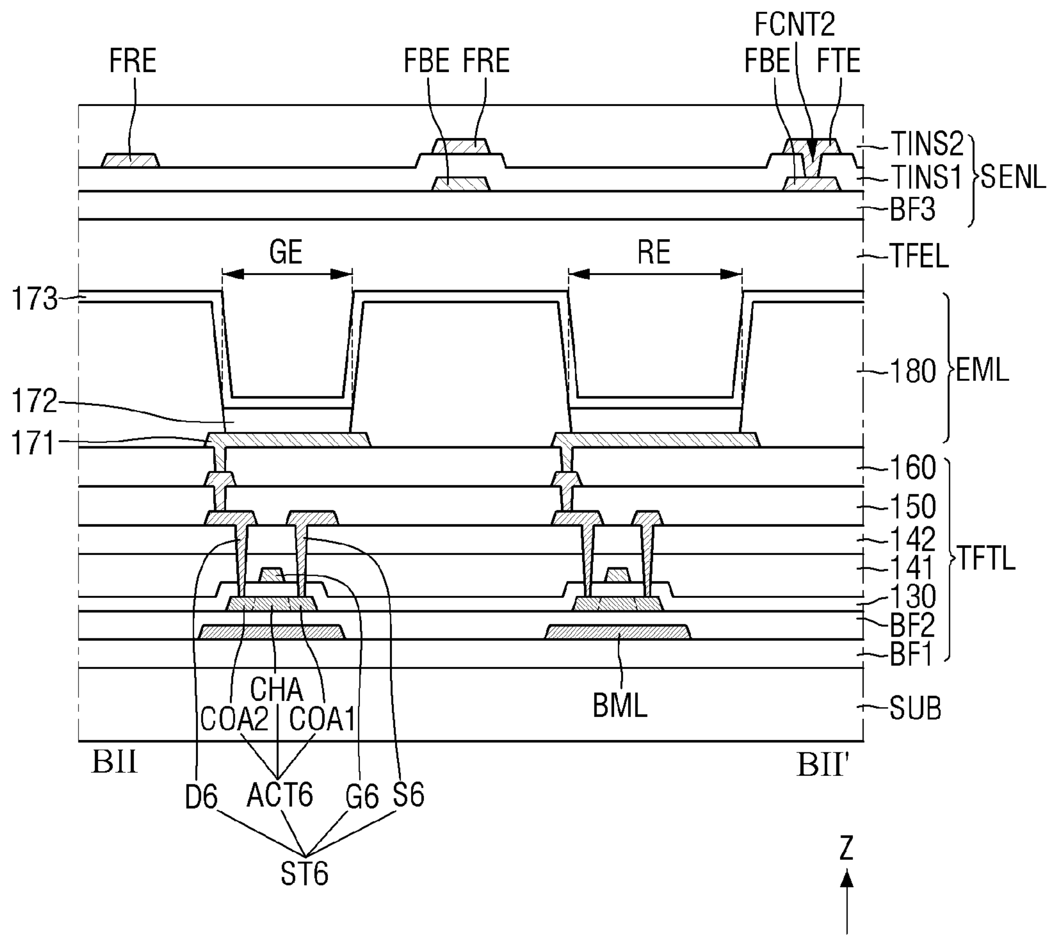

FIG. 129 is a schematic cross-sectional view showing an example of the fingerprint driving electrode, the fingerprint sensing electrode and the fingerprint connection portion of FIG. 128. FIG. 129 shows a schematic cross section of the display panel 300, taken along line BII-BII' of FIG. 128. FIG. 130 is a view showing an example of a method of recognizing a fingerprint by fingerprint sensor electrodes driven by mutual capacitance sensing.

An embodiment of FIG. 129 may be different from an embodiment of FIG. 122 in that a fingerprint connection portion FBE may be additionally disposed on a third buffer layer BF3, and fingerprint driving electrodes FTE and fingerprint sensing electrodes FRE may be disposed on the first sensor insulating layer TINS1 instead of the fingerprint sensor electrode FSE.

Referring to FIG. 129, fingerprint connection portions FBE may be disposed on the third buffer layer BF3. Although not shown in FIG. 129, a second subsidiary connection portion BE2-2 of a second connection portion BE2 may be disposed on the third buffer layer BF3. The fingerprint connection portions FBE and the second subsidiary connection portion BE2-2 of the second connection portion BE2 do not overlap the emission area RE, GE and BE, and may overlap the bank 180 in the third direction (z-axis direction). The fingerprint connection portions FBE and the second subsidiary connection portion BE2-2 of the second connection portion BE2 may be made up of a single layer of molybdenum (Mo), titanium (Ti), copper (Cu) or aluminum (Al), or may be made up of a stack structure of aluminum and titanium (Ti/Al/Ti), a stack structure of aluminum and ITO (ITO/Al/ITO), an APC alloy and a stack structure of an APC alloy and ITO (ITO/APC/ITO).

The first sensor insulating layer TINS1 may be disposed on the fingerprint connection portions FBE and the second subsidiary connection portion BE2-2 of the second connection portion BE2.

The fingerprint driving electrodes FTE and the fingerprint sensing electrodes FRE may be disposed on the first sensor insulating layer TINS1. Although not shown in FIG. 129, the first subsidiary connection portion BE2-1 of the second connection portion BE2 and the third connection portion may be disposed on the first sensor insulating layer TINS1. Each of the fingerprint driving electrodes FTE, the fingerprint sensing electrodes FRE, the first subsidiary connection portion BE2-1 of the second connection portion BE2 and the third connection portion do not overlap the emission area RE, GE and BE, and may overlap the bank 180 in the third direction (z-axis direction). Each of the fingerprint driving electrodes FTE, the fingerprint sensing electrodes FRE, the first subsidiary connection portion BE2-1 of the second connection portion BE2 and the third connection portion may be made up of a single layer of molybdenum (Mo), titanium (Ti), copper (Cu) or aluminum (Al), or may be made up of a stack structure of aluminum and titanium (Ti/Al/Ti), a stack structure of aluminum and ITO (ITO/Al/ITO), an APC alloy and a stack structure of an APC alloy and ITO (ITO/APC/ITO).

The fingerprint driving electrode FTE may be electrically connected to the fingerprint connection portion FBE through a second fingerprint contact hole FCNT2 that penetrates through the first sensor insulating layer TINS1 and exposes the fingerprint connection portion FBE.

The value of the mutual capacitance between the fingerprint driving electrodes FTE and the fingerprint sensing electrodes FRE is smaller than the value of the mutual capacitance between the driving electrode TE and the sensing electrode RE. Since the polarizing film PF and the cover window 100 may be disposed on the sensor electrode layer SENL, there may be a very small difference between the value of the mutual capacitance FCm between the fingerprint driving electrodes FTE and the fingerprint sensing electrodes FRE at the ridges RID of a person's fingerprint and the value of the mutual capacitance FCm between the fingerprint driving electrodes FTE and the fingerprint sensing electrodes FRE at the valleys VLE of the person's fingerprint, as shown in FIG. 130. For example, the difference in capacitance value between the ridges RID and the valleys VLE of the person's fingerprint may be approximately 0.2 to 0.5 femtofarad (fF). In a case that the sensitivity of the sensor driver 340 is about 0.01 femtofarad (fF), the sensor driver 340 can detect a difference in the capacitance values between the ridges RID and the valleys VLE of a person's fingerprint. A difference between the value of the mutual capacitance between the driving electrode TE and the sensing electrode RE in a case that a touch of an object occurs and the value of the mutual capacitance between the driving electrode TE and the sensing electrode RE in a case that no touch of the object occurs may be approximately 60 to 80 femtofarad (fF).

The second sensor insulating layer TINS2 may be disposed on the fingerprint driving electrodes FTE, the fingerprint sensing electrodes FRE, the first subsidiary connection portion BE2-1 of the second connection portion BE2, and the third connection portion.

As shown in FIG. 129, the fingerprint driving electrodes FTE, the fingerprint sensing electrodes FRE, the first subsidiary connection portion BE2-1 of the second connection portion BE2, and the third connection portion may be disposed on the same layer and made of the same or similar material as the driving electrodes TE and the sensing electrodes RE. The fingerprint connection portions FBE and the second subsidiary connection portion BE2-2 of the second connection portion BE2 may be disposed on the same layer and made of the same or similar material as the first connection portions BE1. Therefore, the fingerprint driving electrodes FTE, the fingerprint sensing electrodes FRE, the fingerprint connection portions FBE, the first subsidiary connection portion BE2-1 of the second connection portion BE2, and the third connection portion may be formed without any additional process.

FIG. 131 is a view showing a layout of a sensor electrode layer of a display panel according to an embodiment.

An embodiment of FIG. 131 may be different from an embodiment of FIG. 117 in that each of the first sensor areas SA1 of the touch sensor area TSA may include fingerprint sensor electrodes FSE, and each of the second sensor areas SA2 may include driving electrodes TE and sensing electrodes RE.

Referring to FIG. 131, the touch sensor area TSA may include first sensor areas SA1 and second sensor area SA2. The second sensor areas SA2 may be the other areas of the touch sensor area TSA than the first sensor areas SA1. Each of the first sensor areas SA1 may be surrounded by or adjacent to the second sensor areas SA2. The total area of the first sensor areas SA1 may be smaller than or equal to the total area of the second sensor areas SA2.

Each of the first sensor areas SA1 may include fingerprint sensor electrodes FSE, and each of the second sensor areas SA2 may include the driving electrodes TE, the sensing electrodes RE, the first connection portions BE1 and the dummy patterns DE. The area of each of the fingerprint sensor electrodes FSE may be smaller than the area of each of the driving electrodes TE, the area of each of the sensing electrodes RE, or the area of each of the dummy patterns DE. For example, the maximum length of the driving electrode TE in the first direction (x-axis direction) and the maximum length in the second direction (y-axis direction) may be approximately 4 mm. The maximum length of the sensing electrode RE in the first direction (x-axis direction) and the maximum length in the second direction (y-axis direction) may be approximately 4 mm. In contrast, since the distance between the ridges RID of a person's fingerprint is in a range from about 100 μm to about 200 μm, the maximum length of the fingerprint sensor electrode FSE in the first direction (x-axis direction) and the maximum length in the second direction (y-axis direction) may be in a range from about 100 μm to about 150 μm.

As shown in FIG. 131, the touch sensor area TSA includes the first sensor area SA1 in which the fingerprint sensor electrodes FSE are disposed, as well as the second sensor area SA2 in which the driving electrodes TE and the sensing electrodes RE are disposed. Therefore, it may be possible to sense a touch of an object using the mutual capacitance between the driving electrodes TE and the sensing electrodes RE, and it is also possible to sense a person's fingerprint using the capacitance of the fingerprint sensor electrodes FSE.

Figure 132:
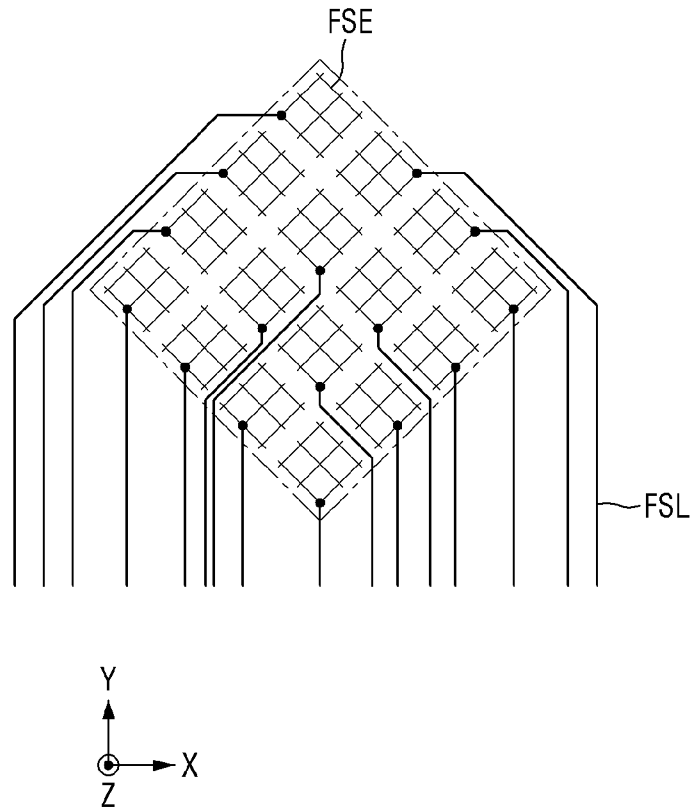

FIG. 132 is a view showing an example of a layout of the fingerprint sensor electrodes of the first sensor area of FIG. 131.

An embodiment of FIG. 132 may be different from an embodiment of FIG. 118 in that the first sensor area SA1 may include the fingerprint sensor electrodes FSE, and may not include the driving electrodes TE, the sensing electrodes RE, the first connection portions BE1, and the dummy patterns DE.

Referring to FIG. 132, each of the fingerprint sensor electrodes FSE may be formed in a mesh structure or a net structure when viewed from the top. The size of the mesh openings (or mesh holes) of each of the fingerprint sensor electrodes FSE may be substantially all equal. It is, however, to be understood that the disclosure is not limited thereto. In FIG. 132, sixteen fingerprint sensor electrodes FSE of the first sensor area SA are depicted for convenience of illustration.

The fingerprint sensor electrodes FSE may be electrically connected to the fingerprint sensor lines FSL, respectively. Each of the fingerprint sensor electrodes FSE may be electrically connected to one of the fingerprint sensor lines FSL. The fingerprint sensor electrode FSE may be driven by self-capacitance sensing. According to the self-capacitance sensing scheme, a self-capacitance of the fingerprint sensor electrode FSE is charged with a driving signal applied through a fingerprint sensor line FSL, and the amount of change in the voltage charged in the self-capacitance may be detected. As shown in FIG. 124, the sensor driver 340 can recognize a person's fingerprint by sensing a difference between the value of the self-capacitance formed by the fingerprint sensor electrodes FSE at the ridges RID of the person's fingerprint and the value of the self-capacitance of the fingerprint sensor electrodes FSE at the valleys VLE of the person's fingerprint.

The fingerprint sensor lines FSL may be extended in the second direction (y-axis direction). The fingerprint sensor lines FSL may be arranged or disposed in the first direction (x-axis direction). The fingerprint sensor lines FSL may be electrically separated from one another.

The fingerprint sensor lines FSL may be disposed on a different layer from the fingerprint sensor electrodes FSE as shown in FIGS. 120 and 122. A part of the fingerprint sensor line FSL may overlap a part of the fingerprint sensor electrode FSE in the third direction (z-axis direction). Each of the fingerprint sensor lines FSL may overlap the driving electrode TE or the sensing electrode RE in the third direction (z-axis direction). One side of the fingerprint sensor line FSL may be electrically connected to the fingerprint sensor electrode FSE through the first fingerprint contact holes FCNT1.

The fingerprint sensor lines FSL may be electrically connected to the sensor pads TP1 and TP2 shown in FIG. 117. Therefore, the fingerprint sensor lines FSL may be electrically connected to the sensor driver 340 of the display circuit board 310 shown in FIG. 4.

As shown in FIG. 132, each of the fingerprint sensor electrodes FSE can detect a person's fingerprint by charging a self-capacitance of the fingerprint sensor electrode FSE with a driving signal applied through the fingerprint sensor line FSL, and by driving by self-capacitance sensing to sense the amount of a change in the voltage charged in the self-capacitance.

FIG. 133 is a view showing another example of a layout of the fingerprint sensor electrodes of the first sensor area of FIG. 131.

An embodiment of FIG. 133 may be different from an embodiment of FIG. 126 in that the first sensor area SA1 may include the fingerprint driving electrodes FTE, the fingerprint sensing electrode FRE and the fingerprint connection portions FBE, and may not include the driving electrodes TE, the sensing electrodes RE, the first connection portions BE1, and the dummy patterns DE.

Referring to FIG. 133, each of the fingerprint driving electrodes FTE, the fingerprint sensing electrodes FRE and the fingerprint connection portions FBE may be formed in a mesh structure or a net structure when viewed from the top. The sizes of mesh openings (or mesh holes) of the fingerprint driving electrodes FTE, the fingerprint sensing electrodes FRE and the fingerprint connection portions FBE may be substantially all equal. It is, however, to be understood that the disclosure is not limited thereto.

The fingerprint driving electrodes FTE may be electrically connected with one another in the first direction (x-axis direction). The fingerprint driving electrodes FTE may be extended in the first direction (x-axis direction). The fingerprint driving electrodes FTE may be arranged or disposed in the second direction (y-axis direction).

The fingerprint sensing electrodes FRE may be electrically connected to one another in the second direction (y-axis direction). The fingerprint sensing electrodes FRE may be extended in the second direction (y-axis direction). The fingerprint sensing electrodes FRE may be arranged or disposed in the first direction (x-axis direction).

In order to electrically separate the fingerprint driving electrodes FTE from the fingerprint sensing electrodes FRE at their intersections, the fingerprint sensing electrodes FRE adjacent to one another in the second direction (y-axis direction) may be connected through the fingerprint connection portions FBE. The fingerprint connection portions FBE may be extended in the second direction (y-axis direction). The fingerprint connection portions FBE may be disposed on a different layer from the fingerprint driving electrodes FTE and the fingerprint sensing electrodes FRE.

The fingerprint driving electrodes FTE and the fingerprint sensing electrodes FRE may be driven by mutual capacitance sensing. According to the mutual capacitance scheme, the mutual capacitance is formed between the fingerprint driving electrodes FTE and the fingerprint sensing electrodes FRE by applying a driving signal applied to the fingerprint driving electrodes FTE, and the amount of a change in the mutual capacitance is measured through the fingerprint sensing electrodes FRE. As shown in FIG. 130, a person's fingerprint may be recognized by sensing a difference between the value of the mutual capacitance FCm between the fingerprint driving electrodes FTE and the fingerprint sensing electrodes FRE at the ridges RID of the person's fingerprint and the value of the mutual capacitance FCm between the fingerprint driving electrodes FTE and the fingerprint sensing electrodes FRE at the valleys VLE of the person's fingerprint.

The fingerprint sensing electrode FRE disposed on one side of the fingerprint sensing electrodes FRE electrically connected in the second direction (y-axis direction) may be electrically connected to the fingerprint sensing line FRL. The fingerprint sensing lines FRL may be extended in the second direction (y-axis direction). The fingerprint sensing lines FRL may be arranged or disposed in the first direction (x-axis direction). The fingerprint sensing lines FRL may be electrically separated from one another.

The fingerprint driving electrode FTE disposed on one side of the fingerprint driving electrodes FTE in the first direction (x-axis direction) may be electrically connected to the fingerprint driving line FTL. The fingerprint driving lines FTL may be extended in the first direction (x-axis direction). The fingerprint driving lines FTL may be arranged or disposed in the second direction (y-axis direction). The fingerprint driving lines FTL may be electrically separated from one another.

The fingerprint driving lines FTL may be disposed on a different layer from the fingerprint driving electrodes FTE. A part of the fingerprint driving line FTL may overlap a part of the fingerprint driving electrode FTE in the third direction (z-axis direction). The fingerprint driving line FTL may be electrically connected to the fingerprint driving electrode FTE through at least one third fingerprint contact hole.

The fingerprint sensing lines FRL may be disposed on a different layer from the fingerprint sensing electrodes FRE. A part of the fingerprint sensing line FRL may overlap a part of the fingerprint sensing electrode FRE in the third direction (z-axis direction). The fingerprint sensing line FRL may be electrically connected to the fingerprint sensing electrode FRE through at least one third fingerprint contact hole.

The fingerprint driving lines FTL and the fingerprint sensing lines FRL may be electrically connected to the sensor pads TP1 and TP2 shown in FIG. 117. Therefore, the fingerprint sensor lines FSL may be electrically connected to the sensor driver 340 of the display circuit board 310 shown in FIG. 4.

As shown in FIG. 133, a person's fingerprint may be detected by mutual capacitance sensing. For example, the mutual capacitance may be formed between the fingerprint driving electrodes FTE and the fingerprint sensing electrodes FRE by applying a driving signal, and the amount of a change in the mutual capacitance may be measured.

FIGS. 134A and 134B are views showing other examples of the layout of the fingerprint sensor electrodes of the first sensor area of FIG. 131. FIGS. 135A and 135B are views showing an example of a layout of the fingerprint driving electrode and the fingerprint sensing electrode of FIGS. 134A and 134B.

FIGS. 134A and 135A show the fingerprint driving electrodes FTE but do not show the fingerprint sensing electrodes FRE for convenience of illustration. FIGS. 134B and 135B show the fingerprint sensing electrodes FRE but do not show the fingerprint driving electrodes FTE for convenience of illustration.

An embodiment of FIGS. 134A and 134B may be different from an embodiment of FIG. 126 in that the first sensor area SA1 may include fingerprint driving electrodes FTE and fingerprint sensing electrodes FRE, but may not include driving electrodes TE, sensing electrodes RE, first connection portions BE1 and dummy patterns DE.

Referring to FIGS. 134A, 134B, 135A and 135B, the fingerprint driving electrodes FTE and the fingerprint sensing electrodes FRE may completely overlap each other in the third direction (z-axis direction). Therefore, only the fingerprint sensing electrodes FRE disposed on the fingerprint driving electrodes FTE are shown in FIGS. 134A, 134B, 135A and 135B.

Each of the fingerprint driving electrodes FTE and the fingerprint sensing electrodes FRE may be formed in a mesh structure or a net structure when viewed from the top. The sizes of mesh openings (or mesh holes) of the fingerprint driving electrodes FTE and the fingerprint sensing electrodes FRE may be substantially all equal. It is, however, to be understood that the disclosure is not limited thereto.

In the example shown in FIGS. 134A and 134B, three fingerprint driving lines FTL and the three fingerprint sensing lines FRL of the first sensor area SA1 are depicted for convenience of illustration.

The fingerprint driving electrodes FTE may be disposed on a different layer from the fingerprint sensing electrodes FRE. The fingerprint driving electrodes FTE may overlap the fingerprint sensing electrodes FRE in the third direction (z-axis direction). A mutual capacitance may be formed between the fingerprint driving electrodes FTE and the fingerprint sensing electrodes FRE. According to the mutual capacitance scheme, the mutual capacitance is formed between the fingerprint driving electrodes FTE and the fingerprint sensing electrodes FRE by applying a driving signal applied to the fingerprint driving electrodes FTE, and the amount of a change in the mutual capacitance is measured through the fingerprint sensing electrodes FRE. As shown in FIG. 130, a person's fingerprint may be recognized by sensing a difference between the value of the mutual capacitance FCm between the fingerprint driving electrodes FTE and the fingerprint sensing electrodes FRE at the ridges RID of the person's fingerprint and the value of the mutual capacitance FCm between the fingerprint driving electrodes FTE and the fingerprint sensing electrodes FRE at the valleys VLE of the person's fingerprint.

The fingerprint driving electrode FTE disposed on one side of the fingerprint driving electrodes FTE electrically connected in the first direction (x-axis direction) or the second direction (y-axis direction) may be electrically connected to the fingerprint driving line FTL. The fingerprint driving lines FTL may be extended in the second direction (y-axis direction). The fingerprint driving lines FTL may be arranged or disposed in the first direction (x-axis direction). The fingerprint driving lines FTL may be electrically separated from one another.

The fingerprint sensing electrode FRE disposed on one side of the fingerprint sensing electrodes FRE electrically connected in the first direction (x-axis direction) or the second direction (y-axis direction) may be electrically connected to the fingerprint sensing line FRL. The fingerprint sensing lines FRL may be extended in the first direction (x-axis direction). The fingerprint sensing lines FRL may be arranged or disposed in the second direction (y-axis direction). The fingerprint sensing lines FRL may be electrically separated from one another.

The fingerprint driving lines FTL may be disposed on the same layer as the fingerprint driving electrodes FTE, and may be disposed on a different layer from the fingerprint sensing electrodes FRE and the fingerprint sensing lines FRL. The fingerprint sensing lines FRL may be disposed on the same layer as the fingerprint sensing electrodes FRE, and may be disposed on a difference layer from the fingerprint driving electrodes FTE and the fingerprint driving lines FTL.

The fingerprint driving lines FTL may overlap the fingerprint sensing lines FRL in the third direction (z-axis direction). It is, however, to be understood that the disclosure is not limited thereto. The fingerprint driving lines FTL may not overlap the fingerprint sensing lines FRL in the third direction (z-axis direction).

The fingerprint driving lines FTL and the fingerprint sensing lines FRL may be electrically connected to the sensor pads TP1 and TP2 shown in FIG. 117. Therefore, the fingerprint sensor lines FSL may be electrically connected to the sensor driver 340 of the display circuit board 310 shown in FIG. 4.

As shown in FIGS. 134A, 134B, 135A and 135B, a person's fingerprint may be detected by mutual capacitance sensing. For example, the mutual capacitance may be formed between the fingerprint driving electrodes FTE and the fingerprint sensing electrodes FRE by applying a driving signal, and the amount of a change in the mutual capacitance may be measured.

FIG. 136 is a schematic cross-sectional view showing an example of the fingerprint driving electrodes and the fingerprint sensing electrodes of FIGS. 135A and 135B. FIG. 136 shows a schematic cross section of the display panel 300, taken along line BIII-BIII' of FIG. 135A.

An embodiment of FIG. 136 may be different from an embodiment of FIG. 122 in that fingerprint driving electrodes FTE may be disposed on the third buffer layer BF3, and fingerprint sensing electrodes FRE may be disposed on the first sensor insulating layer TINS1.

Referring to FIG. 136, fingerprint driving electrodes FTE may be disposed on the third buffer layer BF3. Although not shown in FIG. 136, the fingerprint driving lines FTL may be disposed on the third buffer layer BF3. The fingerprint driving electrodes FTE and the fingerprint driving lines FTL may not overlap the emission areas RE, GE and BE, and may overlap the bank 180 in the third direction (z-axis direction). The fingerprint driving electrodes FTE and the fingerprint driving lines FTL may be made up of a single layer of molybdenum (Mo), titanium (Ti), copper (Cu) or aluminum (Al), or may be made up of a stack structure of aluminum and titanium (Ti/Al/Ti), a stack structure of aluminum and ITO (ITO/Al/ITO), an APC alloy and a stack structure of an APC alloy and ITO (ITO/APC/ITO).

The first sensor insulating layer TINS1 may be disposed on the fingerprint driving electrodes FTE and the fingerprint driving lines FTL.

The fingerprint sensing electrodes FRE may be disposed on the first sensor insulating layer TINS1. Although not shown in FIG. 136, the fingerprint sensing lines FRL may be disposed on the first sensor insulating layer TINS1. The fingerprint sensing electrodes FRE and the fingerprint sensing lines FRL may not overlap the emission areas RE, GE and BE, and may overlap the bank 180 in the third direction (z-axis direction). Each of the fingerprint sensing electrodes FRE and the fingerprint sensing lines FRL may be made up of a single layer of molybdenum (Mo), titanium (Ti), copper (Cu) or aluminum (Al), or may be made up of a stack structure of aluminum and titanium (Ti/Al/Ti), a stack structure of aluminum and ITO (ITO/Al/ITO), an APC alloy and a stack structure of an APC alloy and ITO (ITO/APC/ITO).

The second sensor insulating layer TINS2 may be disposed on the fingerprint sensing electrodes FRE and the fingerprint sensing lines FRL.

As shown in FIG. 136, the fingerprint driving electrodes FTE may overlap the fingerprint sensing electrodes FRE in the third direction (z-axis direction), respectively. A mutual capacitance may be formed between the fingerprint driving electrodes FTE and the fingerprint sensing electrodes FRE. A person's fingerprint may be detected by mutual capacitance sensing. For example, the mutual capacitance may be formed between the fingerprint driving electrodes FTE and the fingerprint sensing electrodes FRE by applying a driving signal, and the amount of a change in the mutual capacitance may be measured.

FIG. 137 is a view showing another example of a layout of the fingerprint sensor electrodes of the first sensor area of FIG. 131. FIG. 138 is a view showing an example of a layout of the fingerprint driving electrodes and the fingerprint sensing electrodes of FIG. 137.

An embodiment of FIGS. 137 and 138 may be different from an embodiment of FIGS. 134A, 134B, 135A and 135B in that the fingerprint driving electrode FTE and the fingerprint sensing electrode FRE may cross or intersect several or a predetermined number of times.

Referring to FIGS. 137 and 138, each of the fingerprint driving electrodes FTE includes first mesh lines MSL1 extended in an eighth direction DR8 and second mesh lines MSL2 extended in a ninth direction DR9 crossing or intersecting the eighth direction DR8. The first mesh lines MSL1 may be arranged or disposed in the ninth direction DR9, and the second mesh lines MSL2 may be arranged or disposed in the eighth direction DR8. The eighth direction DR8 may refer to the direction between the first direction (x-axis direction) and the second direction (y-axis direction), and the ninth direction DR9 may refer to the direction crossing or intersecting the eighth direction DR8. For example, the ninth direction DR9 may be substantially perpendicular to the eighth direction DR8. Each of the fingerprint driving electrodes FTE may be formed in a mesh structure or a net structure when viewed from the top as the first mesh lines MSL1 intersect the second mesh lines MSL2.

Each of the fingerprint sensing electrodes FRE includes third mesh lines MSL3 extended in the eighth direction DR8 and fourth mesh lines MSL4 extended in the ninth direction DR9. The third mesh lines MSL3 may be arranged or disposed in the ninth direction DR9, and the fourth mesh lines MSL4 may be arranged or disposed in the eighth direction DR8. Each of the fingerprint sensing electrodes FRE may be formed in a mesh structure or a net structure when viewed from the top as the third mesh lines MSL3 intersect the fourth mesh lines MSL4.

Each of the third mesh lines MSL3 may be disposed between two first mesh lines MSL1 adjacent to each other in the ninth direction DR9. The third mesh lines MSL3 may cross or intersect the second mesh lines MSL2.

Each of the fourth mesh lines MSL4 may be disposed between two second mesh lines MSL2 adjacent to each other in the eighth direction DR8. The fourth mesh lines MSL4 may cross or intersect the first mesh lines MSL1.

As shown in FIGS. 134A, 134B, 135A, and 135B, in a case that the fingerprint driving electrodes FTE and the fingerprint sensing electrodes FRE completely overlap each other in the third direction (z-axis direction), the mutual capacitance between the fingerprint driving electrodes FTE and the fingerprint sensing electrodes FRE may be blocked by the fingerprint sensing electrodes FRE. Accordingly, the difference between the value of the mutual capacitance FCm between the fingerprint driving electrodes FTE and the fingerprint sensing electrodes FRE at the ridges RID of a person's fingerprint and the value of the mutual capacitance FCm between the fingerprint driving electrodes FTE and the fingerprint sensing electrodes FRE at the valleys VLE of the person's fingerprint may become small.

However, as shown in FIGS. 137 and 138, in a case that the mesh lines MSL1 and MSL2 of the fingerprint driving electrodes FTE and the mesh lines MSL3 and MSL4 of the fingerprint sensing electrodes FRE cross or intersect several or a predetermined number of times, the mutual capacitance between the fingerprint driving electrodes FTE and the fingerprint sensing electrodes FRE may not be blocked by the fingerprint sensing electrodes FRE. In this manner, the difference between the value of the mutual capacitance FCm between the fingerprint driving electrodes FTE and the fingerprint sensing electrodes FRE at the ridges RID of a person's fingerprint and the value of the mutual capacitance FCm between the fingerprint driving electrodes FTE and the fingerprint sensing electrodes FRE at the valleys VLE of the person's fingerprint may become large. Therefore, the person's fingerprint may be recognized more accurately.

On the other hand, as shown in FIG. 133, in a case that the fingerprint driving electrodes FTE and the fingerprint sensing electrodes FRE are disposed on the same layer, the area where mutual capacitance is formed by the fingerprint driving electrodes FTE and the fingerprint sensing electrodes FRE is increased, and thus a difference between the capacitance value at the ridges RID of a person's fingerprint and the capacitance value at the valleys VLE of the person's fingerprint may be small.

In contrast, in the example shown in FIGS. 137 and 138 where the fingerprint driving electrodes FTE and the fingerprint sensing electrodes FRE are disposed on different layers and may cross or intersect several or predetermined number of times, the area where mutual capacitance may be formed by the fingerprint driving electrodes FTE and the fingerprint sensing electrodes FRE may be reduced. Therefore, a difference between the capacitance value at the ridges RID of a person's fingerprint and the capacitance value at the valleys VLE of the person's fingerprint may be increased. Therefore, the person's fingerprint may be recognized more accurately.

FIG. 139 is a schematic cross-sectional view showing an example of the fingerprint driving electrodes and the fingerprint sensing electrodes of FIG. 137. FIG. 139 shows a schematic cross section of the display panel, taken along line BIV-BIV' of FIG. 138.

An embodiment of FIG. 139 may be different from an embodiment of FIG. 136 in that the fingerprint driving electrode FTE and the fingerprint sensing electrode FRE may cross or intersect several or a predetermined number of times.

Referring to FIG. 139, at the intersections where the fingerprint driving electrode FTE and the fingerprint sensing electrode FRE may cross or intersect, the fingerprint driving electrode FTE and the fingerprint sensing electrode FRE may overlap each other in the third direction (z-axis direction). However, the fingerprint driving electrode FTE and the fingerprint sensing electrode FRE may not overlap each of in the third direction (z-axis direction) except for the intersections where the fingerprint driving electrode FTE and the fingerprint sensing electrode FRE may cross or intersect.

FIG. 140 is a view showing an example of a layout of fingerprint sensor lines electrically connected to fingerprint sensor electrodes and a multiplexer according to an embodiment.

Referring to FIG. 140, since the distance between the ridges RID of a person's fingerprint is in a range from about 100 μm to about 200 μm, the maximum length of the fingerprint sensor electrode FSE in the first direction (x-axis direction) and the maximum length in the second direction (y-axis direction) may be approximately in a range from about 100 μm to about 150 μm. For example, since the area of the fingerprint sensor electrode FSE is small, more fingerprint sensor electrodes FSE may be disposed in the first sensor area SA1. Since the number of the fingerprint sensor lines FSL1 to FSLq electrically connected to the respective fingerprint sensor electrodes FSE is proportional to the number of the fingerprint sensor electrodes FSE, the number of the fingerprint sensor lines FSL1 to FSLq may be greatly increased. As a result, the number of sensor pads TP1 and TP2 electrically connected to the respective fingerprint sensor lines FSL1 to FSLq may also be increased greatly.

A multiplexer (mux) may be disposed between the fingerprint sensor lines FSL1 to FSLq and the main fingerprint sensor line MFSL electrically connected to the sensor driver 340. The multiplexer may include q mux transistors MT1, MT2, . . . , MTq−1 and MTq, where q is a positive integer equal to or greater than four. For example, the multiplexer may include a first mux transistor MT1 that may be switched by a first control signal from a first control line CL1, a second mux transistor MT2 that may be switched by a second control signal from a second control line CL2, a $(q-1)^{th}$ mux transistor MTq−1 that may be switched by a (q−1) control signal from a $(q-1)^{th}$ control line CLq−1, and a $q^{th}$ mux transistor MTq that may be switched by a $q^{th}$ control signal from a $q^{th}$ control line CLq.

The first mux transistor MT1 may be disposed between the main fingerprint sensor line MFSL and the first fingerprint sensor line FSL1. In a case that the first mux transistor MT1 is turned on, the main fingerprint sensor line MFSL is electrically connected to the first fingerprint sensor line FSL1, so that the driving signal of the main fingerprint sensor line MFSL is applied to the first fingerprint sensor line FSL1.

The second mux transistor MT2 may be disposed between the main fingerprint sensor line MFSL and the second fingerprint sensor line FSL2. In a case that the second mux transistor MT2 is turned on, the main fingerprint sensor line MFSL may be electrically connected to the second fingerprint sensor line FSL2, so that the driving signal of the main fingerprint sensor line MFSL is applied to the second fingerprint sensor line FSL2.

The $(q-1)^{th}$ mux transistor MTq−1 may be disposed between the main fingerprint sensor line MFSL and the $(q-1)^{th}$ fingerprint sensor line FSLq−1. In a case that the $(q-1)^{th}$ mux transistor MTq−1 is turned on, the main fingerprint sensor line MFSL is electrically connected to the $(q-1)^{th}$ fingerprint sensor line FSLq−1, so that the driving signal of the main fingerprint sensor line MFSL is applied to the $(q-1)^{th}$ fingerprint sensor line FSLq−1.

The $q^{th}$ mux transistor MTq may be disposed between the main fingerprint sensor line MFSL and the $q^{th}$ fingerprint sensor line FSLq. In a case that the $q^{th}$ mux transistor MTq is turned on, the main fingerprint sensor line MFSL is electrically connected to the $q^{th}$ fingerprint sensor line FSLq, so that the driving signal of the main fingerprint sensor line MFSL may be applied to the $q^{th}$ fingerprint sensor line FSLq.

Although the first mux transistor MT1, the second mux transistor MT2, the $(q-1)^{th}$ mux transistor MTq−1, and the $q^{th}$ mux transistor MTq are implemented as p-type MOSFETs in the example shown in FIG. 140, the disclosure is not limited thereto. They may also be implemented as n-type MOSFETs.

As shown in FIG. 140, since the q fingerprint sensor lines FSL1 to FSLq may be electrically connected to the single main fingerprint sensor line MFSL using the multiplexer, the number of the fingerprint sensor lines FSL1 to FSLq may be reduced to 1/q, so that it may be possible to avoid the number of sensor pads TP1 and TP2 from increasing due to the fingerprint sensor electrodes FSE.

FIG. 141 is a view showing an example of a layout of fingerprint sensor lines electrically connected to fingerprint sensor electrodes and a multiplexer according to an embodiment.

An embodiment of FIG. 141 may be different from an embodiment of FIG. 140 in that odd-numbered mux transistors MT1 to MTq−1 may be implemented as p-type MOSFETs, while even-numbered mux transistors MT2 to MTq may be implemented as n-type MOSFETs.

Referring to FIG. 141, a first mux transistor MT1 and a second mux transistor MT2 may be switched by a first control signal from the first control line CL1. In a case that the first control signal of a first level voltage is applied to the first control line CL1, the first mux transistor MT1 is a p-type MOSFET, and the second mux transistor MT2 is an n-type MOSFET, so that the first mux transistor MT1 may be turned on whereas the second mux transistor MT2 may be turned off. In a case that the first control signal of a second level voltage higher than the first level voltage is applied to the first control line CL1, the first mux transistor MT1 may be turned off whereas the second mux transistor MT2 may be turned on. In a case that the first control signal of a third level voltage between the first level voltage and the second level voltage is applied to the first control line CL1, the first mux transistor MT1 and the second mux transistor MT2 may be turned off.

The $(q-1)^{th}$ mux transistor MTq−1 and the $q^{th}$ mux transistor MTq may be switched by a second control signal from the second control line CL2. In a case that the second control signal of the first level voltage is applied to the second control line CL2, the $(q-1)^{th}$ mux transistor MTq−1 is a p-type MOSFET, and the $q^{th}$ mux transistor MTq is an n-type MOSFET, so that the $(q-1)^{th}$ mux transistor MTq−1 may be turned on whereas the $q^{th}$ mux transistor MTq may be turned off. In a case that the first control signal of the second level voltage higher than the first level voltage is applied to the second control line CL2, the $(q-1)^{th}$ mux transistor MTq−1 may be turned off whereas the $q^{th}$ mux transistor MTq may be turned on. In a case that the first control signal of the third level voltage between the first level voltage and the second level voltage is applied to the second control line CL2, the $(q-1)^{th}$ mux transistor MTq−1 and the $q^{th}$ mux transistor MTq may be turned off.

As shown in FIG. 141, in a case that the odd-numbered mux transistors MT1 to MTq−1 are implemented as p-type MOSFETs and the even-numbered mux transistors MT2 to MTq are implemented as n-type MOSFETs, the odd-numbered mux transistors and the even mux transistors are adjacent to each other may be controlled by one control line, so that the number of control lines may be reduced to the half.

FIG. 142 is a plan view showing a display area, a non-display area and sensor areas of a display panel of a display device according to an embodiment e.

Referring to FIG. 142, the touch sensor area TSA may include first sensor areas SA1 and second sensor area SA2. The display area DA may be substantially identical to the touch sensor area TSA.

Each of the first sensor areas SA1 may include fingerprint sensor electrodes FSE to recognize a user's fingerprint, and each of the second sensor areas SA2 may include driving electrodes TE and the sensing electrode RE to sensing a touch of an object.

The first sensor areas SA1 may be surrounded by the second sensor areas SA2, respectively. The area of each of the first sensor areas SA1 may be substantially all equal. The total area of the first sensor areas SA1 may be smaller than or equal to the total area of the second sensor areas SA2.

The first sensor areas SA1 may be uniformly distributed throughout the display area DA. The distance between the adjacent first sensor areas SA1 in the first direction (x-axis direction) may be substantially equal to the distance between the adjacent first sensor areas SA1 in the second direction (y-axis direction). It is, however, to be understood that the disclosure is not limited thereto.

In FIG. 142, the length of each of the first sensor areas SA1 in the first direction (x-axis direction) is larger than the length thereof in the second direction (y-axis direction). It is, however, to be understood that the disclosure is not limited thereto. For example, the length of each of the first sensor areas SA1 in the first direction (x-axis direction) may be smaller than the length thereof in the second direction (y-axis direction). Alternatively, the length of each of the first sensor areas SA1 in the first direction (x-axis direction) may be substantially equal to the length thereof in the second direction (y-axis direction).

Although each of the first sensor areas SA1 may be formed in a substantially quadrangular shape when viewed from the top in FIG. 142, the disclosure is not limited thereto. Each of the first sensor areas SA1 may have other polygonal shapes than a quadrangular shape, a circular shape, or an elliptical shape when viewed from the top. Alternatively, each of the first sensor areas SA1 may have an amorphous shape when viewed from the top.

As shown in FIG. 142, in a case that the first sensor areas SA1 are uniformly distributed throughout the display area DA, the fingerprint of a person's finger F may be recognized by the first sensor areas SA1 wherever the person's finger F is placed in the display area DA. Even in a case that a number of fingers F are disposed in the display area DA, fingerprints of The fingers F may be recognized by the first sensor areas SA1. In a case that the display device 10 is applied to a medium-large display device such as a television, a laptop computer and a monitor, the lines of the person's palm may be recognized by the first sensor areas SA1 as well as the fingerprint of the person's finger F.

Although the multiplexer is applied to the fingerprint sensor lines FSL electrically connected to the self-capacitance fingerprint sensor electrodes FSE in the example shown in FIGS. 141 and 142, the disclosure is not limited thereto. The multiplexer may also be applied to the fingerprint driving lines FTL electrically connected to the mutual capacitance fingerprint driving electrodes FTE. The multiplexer may also be applied to the fingerprint sensing lines FRL electrically connected to the mutual capacitance fingerprint sensing electrodes FRE.

FIG. 143 is a view showing the first sensor areas of FIG. 142 and a person's fingerprint.

Referring to FIG. 143, four first sensor areas SA1 may be disposed in an area equal to the size of a person's finger F. It is known that the length of the person's finger F in the first direction (x-axis direction) is approximately 16 mm, and the length thereof in the second direction (y-axis direction) is approximately 20 mm.

Some or a predetermined number of areas of the fingerprint of the person's finger F corresponding to the first sensor areas SA1 may be recognized, rather than the entire fingerprint of the person's finger F is recognized through the first sensor areas SAL. In this manner, the area of each of the first sensor areas SA1 may be reduced, and thus the number of fingerprint sensor electrodes FSE disposed in each of the first sensor areas SA1 may be reduced. Therefore, the number of fingerprint sensor lines FSL electrically connected to the fingerprint sensor electrodes FSE may be reduced. Incidentally, to recognize a person's fingerprint, a part of the person's fingerprint may be stored, and it may be determined whether the stored part of the person's fingerprint matches the recognized person's fingerprint.

FIG. 144 is a view showing the first sensor areas of FIG. 142 and a person's fingerprint.

An embodiment of FIG. 144 may be different from an embodiment of FIG. 143 in that ten first sensor areas SA1 may be disposed in an area equal to the size of the person's finger F. It is to be noted that the number of the first sensor areas SA1 disposed in the area corresponding to the size of the person's finger F is not limited to that the number illustrated in FIGS. 143 and 144.

Referring to FIG. 144, as the number of the first sensor areas SA1 disposed in the area corresponding to the size of the person's finger F increases, the area of each of the first sensor areas SA1 may decrease. For example, the area of each of the four first sensor areas SA1 arranged or disposed in the area equal to the size of the person's finger F as shown in FIG. 143 may be larger than the area of each of the ten first sensor areas SA1 arranged or disposed in the area equal to the size of the person's fingerprint for as shown in FIG. 144.

FIG. 145 is a view showing a layout of a sensor electrode layer of a display panel according to an embodiment. FIG. 146 is a view showing a layout of sensor electrodes of the sensor electrode layer of FIG. 145.

An embodiment of FIGS. 145 and 146 may be different from an embodiment of FIGS. 117 and 118 in that the first sensor area SA1 may include pressure sensor electrodes PSE instead of the dummy pattern DE.

Referring to FIGS. 145 and 146, the first sensor area SA1 may include sensor electrodes TE and RE for sensing a touch of an object, fingerprint sensor electrodes FSE for sensing a person's fingerprint, and conductive patterns for sensing a force applied by a user.

Each of the conductive patterns may be a pressure-sensor electrode PSE having a substantially serpentine shape including bent portions to work as a strain gauge. For example, each of the pressure sensor electrodes PSE may be extended in a first direction and then may be bent in the direction perpendicular to the first direction, and may be extended in the direction opposite to the first direction and then may be bent in the direction perpendicular to the first direction. Since each of the pressure sensor electrodes PSE may have a substantially serpentine shape including bent portions, the shape of the pressure sensor electrodes PSE may be changed according to the pressure applied by the user. Therefore, it may be possible to determine whether or not a pressure is applied by the user based on a change in resistance of the pressure sensor electrodes PSE.

Each of the pressure sensor electrodes PSE may be surrounded by the respective driving electrodes TE. It is, however, to be understood that the disclosure is not limited thereto. Each of the pressure sensor electrodes PSE may be surrounded by the respective sensing electrode RE. Each of the pressure sensor electrodes PSE may be electrically separated from the driving electrode TE and the sensing electrode RE. Each of the pressure sensor electrodes PSE may be spaced apart from the driving electrode TE and the sensing electrode RE. In order to prevent the pressure sensor electrode PSE from being affected by the driving voltage applied to the driving electrode TE, a shielding electrode may be disposed between the pressure sensor electrode PSE and the driving electrode TE.

The pressure sensor electrodes PSE may be extended in the first direction (x-axis direction). The pressure sensor electrodes PSE may be electrically connected with one another in the first direction (x-axis direction). The pressure sensor electrodes PSE may be arranged or disposed in the second direction (y-axis direction).

The pressure sensor electrodes PSE adjacent to one another in the first direction (x-axis direction) may be electrically connected by the fourth connection portions BE4 as shown in FIG. 146. The fourth connection portions BE4 may be extended in the first direction (x-axis direction). The fourth connection portions BE4 may be electrically separated from the driving electrodes TE and the sensing electrodes RE.

The pressure sensor electrodes PSE disposed on one side and/or the other side of the touch sensor area TSA may be electrically connected to the pressure sensing lines PSW. For example, as shown in FIG. 145, the rightmost one of the pressure sensor electrodes PSE electrically connected in the first direction (x-axis direction) may be electrically connected to the pressure sensing line PSW as shown in FIG. 145. The pressure sensing lines PSW may be electrically connected to the first and second sensor pads TP1 and TP2. Therefore, the pressure sensing lines PSW electrically connected to the pressure sensor electrodes PSE may be electrically connected to a Wheatstone bridge circuit WB of a pressure sensing driver 350 as shown in FIG. 65C. Although FIG. 146 illustrates that the fingerprint sensor electrodes FSE are driven by self-capacitance sensing, the disclosure is not limited thereto. The fingerprint sensor electrodes FSE may be driven by mutual capacitance sensing as shown in FIG. 126.

As shown in FIGS. 145 and 146, the touch sensor area TSA includes the driving electrodes TE, the sensing electrodes RE, the fingerprint sensor electrodes FSE, and the pressure sensor electrodes PSE. Therefore, it may be possible to sense a touch of an object using the mutual capacitance between the driving electrodes TE and the sensing electrodes RE, it is also possible to sense a person's fingerprint using the self capacitance of the fingerprint sensor electrodes FSE, and it may be possible to sense a pressure (force) applied by a user using the resistance of the pressure sensor electrode PSE.

FIG. 147 is a view showing a layout of a sensor electrode layer of a display panel according to an embodiment. FIG. 148 is a view showing a layout of sensor electrodes of the sensor electrode layer of FIG. 147.

An embodiment of FIGS. 147 and 148 may be different from an embodiment of FIGS. 117 and 118 in that a first sensor area SA1 may include conductive patterns CP instead of the dummy pattern DE.

Referring to FIGS. 147 and 148, the first sensor area SA1 may include sensor electrodes TE and RE for sensing a touch of an object, fingerprint sensor electrodes FSE for sensing a person's fingerprint, and conductive patterns CP utilized as an antenna for lineless communications.

Each of the conductive patterns CP may have a substantially loop shape or a substantially coil shape when viewed from the top if used as an antenna for an RFID tag. Each of the conductive patterns CP may have a substantially quadrangular patch shape when viewed from the top if used as a patch antenna for 5G communications.

Each of the conductive patterns CP may be surrounded by the respective driving electrodes TE. It is, however, to be understood that the disclosure is not limited thereto. Each of the conductive patterns CP may be surrounded by the respective sensing electrode RE. Each of the conductive patterns CP may be electrically separated from the driving electrode TE and the sensing electrode RE. Each of the conductive patterns CP may be spaced apart from the driving electrode TE and the sensing electrode RE. In order to prevent the conductive pattern CP from being affected by the driving voltage applied to the driving electrode TE, a shielding electrode may be disposed between the conductive pattern CP and the driving electrode TE.

The conductive patterns CP may be extended in the first direction (x-axis direction). The conductive patterns CP may be electrically connected to one another in the first direction (x-axis direction). The conductive patterns CP may be arranged or disposed in the second direction (y-axis direction).

The conductive patterns CP adjacent to one another in the first direction (x-axis direction) may be connected by a fifth connection portion BE5 as shown in FIG. 148. The fifth connection portion BE5 may be extended in the first direction (x-axis direction). The fifth connection portion BE5 may be electrically separated from the driving electrodes TE and the sensing electrodes RE.

The conductive patterns CP disposed on one side of the touch sensor area TSA may be electrically connected to antenna driving lines ADL. For example, the rightmost one of the conductive patterns CP electrically connected in the first direction (x-axis direction) may be electrically connected to the antenna driving line ADL as shown in FIG. 147. The antenna driving lines ADL may be electrically connected to second sensor pads TP2. Therefore, the antenna driving lines ADL electrically connected to the conductive patterns CP may be electrically connected to an antenna driver of the display circuit board 310.

The antenna driver may change the phase and amplify the amplitude of a received RF signal by the conductive patterns CP. The antenna driver may transmit the RF signal that has the changed phase and the amplified amplitude to a mobile communications module 722 or a near-field communications module 724 of the main circuit board 700. Alternatively, the antenna driver may change the phase and amplify the amplitude of the RF signal transmitted from the mobile communications module 722 or the near field communications module 724 of the main circuit board 700. The antenna driver may transmit the RF signal with changed phase and amplified amplitude to the conductive patterns CP.

Although FIG. 148 illustrates that the fingerprint sensor electrodes FSE are driven by self-capacitance sensing, the disclosure is not limited thereto. The fingerprint sensor electrodes FSE may be driven by mutual capacitance sensing as shown in FIG. 126.

As shown in FIGS. 147 and 148, the touch sensor area TSA includes the driving electrodes TE, the sensing electrodes RE, the fingerprint sensor electrodes FSE, and the conductive patterns CP. Therefore, it may be possible to sense a touch of an object using the mutual capacitance between the driving electrodes TE and the sensing electrodes RE, it is also possible to sense a person's fingerprint using the self-capacitance of the fingerprint sensor electrodes FSE, and it may be possible to conduct lineless communications using the conductive patterns CP.

FIG. 149 is a view showing a layout of a sensor electrode layer of a display panel according to an embodiment. FIG. 150 is a schematic cross-sectional view showing an example of the fingerprint driving electrodes and the fingerprint sensing electrodes of FIG. 149. FIG. 150 shows a schematic cross section of the display panel 300, taken along line BV BV' of FIG. 149.

An embodiment of FIGS. 149 and 150 may be different from an embodiment of FIGS. 117 and 122 in that the first sensor area SA1 may include fingerprint sensor electrodes FSE driven by mutual capacitance sensing, and may not include the driving electrodes TE and the sensing electrodes RE.

Referring to FIGS. 149 and 150, the touch sensor area TSA may include a first sensor area SA1 and a second sensor area SA2. The second sensor area SA2 may be the other area of the touch sensor area TSA than the first sensor area SA1. The first sensor area SA1 may be disposed on one side of the touch sensor area TSA. For example, the first sensor area SA1 may be disposed on the lower side of the touch sensor area TSA.

Although the first sensor area SA1 may be formed in a substantially triangular shape when viewed from the top in FIG. 149, the disclosure is not limited thereto. The first sensor area SA1 may have other polygonal shapes than a triangular shape, a circular shape, or an elliptical shape when viewed from the top. Alternatively, each of the first sensor areas SA1 may have an amorphous shape when viewed from the top.

The fingerprint sensor electrodes FSE of the first sensor area SA1 may include fingerprint driving electrodes FTE and fingerprint sensing electrodes FRE.

The fingerprint driving electrodes FTE may cross or intersect the fingerprint sensing electrodes FRE. In order to prevent short-circuit between the fingerprint driving electrodes FTE and the fingerprint sensing electrodes FRE at their intersections, the fingerprint driving electrodes FTE and the fingerprint sensing electrode FRE may be disposed on different layers. For example, the fingerprint driving electrodes FTE may be disposed on the third buffer layer BF3, and the fingerprint sensing electrodes FRE may be disposed on the first sensor insulating layer TINS1. Mutual capacitance may be formed at the intersections between the fingerprint driving electrodes FTE and the fingerprint sensing electrodes FRE.

The fingerprint driving electrodes FTE and the fingerprint sensing electrodes FRE may not overlap the emission areas RE, GE and BE in the third direction (z-axis direction). Therefore, the emission areas RE, GE and BE may not be covered or overlapped by the fingerprint driving electrodes FTE and the fingerprint sensing electrodes FRE, thereby preventing the luminance of light emitted from the emission areas RE, GE and BE from being reduced.

The fingerprint driving electrodes FTE may be electrically connected to the fingerprint driving lines FTL, respectively. The fingerprint sensing electrodes FRE may be electrically connected to the fingerprint sensing lines FRL, respectively. The fingerprint driving lines FTL and the fingerprint sensing lines FRL may be extended in the second direction (y-axis direction).

As shown in FIGS. 149 and 150, a person's fingerprint may be recognized and the person's touch may be detected by mutual capacitance sensing. For example, the mutual capacitance may be formed between the fingerprint driving electrodes FTE and the fingerprint sensing electrodes FRE in the first sensor area SA1 by applying a driving signal, and the amount of a change in the mutual capacitance may be measured.

FIG. 151 is a view showing a layout of a sensor electrode layer of a display panel according to an embodiment.

In the embodiment shown in FIG. 151, the sensor electrodes SE of the sensor electrode layer SENL include one kind of electrodes, and the self-capacitive sensing is carried out by using one layer, i.e., driving signals are applied to the sensor electrode SE and then the voltage charged in the self-capacitance of the sensor electrode SE is sensed According to the embodiment of FIG. 151, the first sensor area SA includes fingerprint sensor electrodes FSE driven by self-capacitance sensing.

Referring to FIG. 151, the touch sensor area TSA may include a first sensor area SA1 and a second sensor area SA2. The second sensor area SA2 may be the other area of the touch sensor area TSA than the first sensor area SAL. The first sensor area SA1 may be disposed on one side of the touch sensor area TSA. For example, the first sensor area SA1 may be disposed on the lower side of the touch sensor area TSA.

Although the first sensor area SA1 may be formed in a substantially quadrangular shape when viewed from the top in FIG. 151, the disclosure is not limited thereto. The first sensor area SA1 may have other polygonal shapes than a substantially quadrangular shape, a circular shape, or an elliptical shape when viewed from the top. Alternatively, each of the first sensor areas SA1 may have an amorphous shape when viewed from the top.

The fingerprint sensor electrodes FSE of the first sensor area SA1 may be electrically separated from one another. The sensor electrodes SE may be spaced apart from one another. Each of the fingerprint sensor electrodes FSE may be electrically connected to the fingerprint sensor line FSL. Although each of the fingerprint sensor electrodes FSE may have a substantially quadrangular shape when viewed from the top in FIG. 151, the disclosure is not limited thereto. Each of the fingerprint sensor electrodes FSE may have other polygonal shapes than a quadrangular shape, a circular shape, or an elliptical shape when viewed from the top.

The sensor electrodes SE of the second sensor area SA2 may be electrically separated from one another. The sensor electrodes SE may be spaced apart from one another. Each of the sensor electrodes SE may be electrically connected to the sensor line SEL. Although each of the sensor electrodes SE may be formed in a substantially quadrangular shape when viewed from the top in FIG. 151, the disclosure is not limited thereto. Each of the sensor electrodes SE may have other polygonal shapes than a quadrangular shape, a circular shape, or an elliptical shape when viewed from the top.

The dummy patterns DE may be surrounded by the sensor electrodes SE, respectively. The sensor electrodes SE may be electrically separated from the dummy patterns DE. The sensor electrodes SE may be spaced apart from the dummy patterns DE. Each of the dummy patterns DE may be electrically floating.

Since the distance between the valleys VLE of a person's fingerprint is approximately 100 to 200 μm, the area of the fingerprint sensor electrode FSE may be smaller than the area of the sensor electrode SE. The maximum length of the fingerprint sensor electrode FSE in the first direction (x-axis direction) may be smaller than the maximum length of the sensor electrode SE in the first direction (x-axis direction). The maximum length of the fingerprint sensor electrode FSE in the second direction (y-axis direction) may be smaller than the maximum length of the sensor electrode SE in the second direction (y-axis direction).

Each of the sensor electrodes SE, the dummy patterns DE, the sensor lines SEL, the fingerprint sensor electrodes FSE and the fingerprint sensor lines FSL may be formed in a mesh structure or a net structure when viewed from the top.

As shown in FIG. 151, a person's fingerprint may be recognized and the person's touch can also be detected by forming the self-capacitance of the fingerprint sensor electrode FSE by applying a driving signal applied through the fingerprint sensor line FSL in the first sensor area SA1, and by measuring the amount of a change in the self-capacitance.

FIG. 152 is a schematic cross-sectional view showing a display panel and a cover window according to an embodiment. FIG. 152 is a schematic cross-sectional view of the display panel 300 with the subsidiary area SBA of FIG. 4 bent and disposed on the lower surface of the display panel 300.

An embodiment of FIG. 152 may be different from an embodiment of FIG. 6 in that a display device 10 may include a fingerprint sensor layer FSENL including capacitive sensor pixels on the cover window 100.

Referring to FIG. 152, the fingerprint sensor layer FSENL may be disposed on the cover window 100. The fingerprint sensor layer FSENL may be attached to the upper surface of the cover window 100 through a transparent adhesive member such as an optically clear adhesive film or an optically clear resin.

A protection window 101 may be disposed on the fingerprint sensor layer FSENL. The protection window 101 may protect the upper surface of the fingerprint sensor layer FSENL. The protection window 101 may be made of a transparent material and may include glass or plastic. For example, the protection window 101 may include ultra thin glass (UTG) having a thickness of about 0.1 mm or less. The cover window 100 may include a transparent polyimide film.

As shown in FIG. 152, by disposing the fingerprint sensor layer FSENL including capacitive sensor pixels on the cover window 100, it may be possible to recognize a person's fingerprint by capacitive sensing.

FIG. 153 is a schematic cross-sectional view showing a display panel and a cover window according to another embodiment.

An embodiment of FIG. 153 may be different from an embodiment of FIG. 6 in that the display device 10 may include a fingerprint sensor layer FSENL including capacitive sensor pixels disposed between the display panel 300 and the cover window 100.

Referring to FIG. 153, the fingerprint sensor layer FSENL may be disposed between the polarizing film PF of the display panel 300 and the cover window 100. The fingerprint sensor layer FSENL may be attached to the upper surface of the polarizing film PF of the display panel 300 through a transparent adhesive member such as an optically clear adhesive film or an optically clear resin. The fingerprint sensor layer FSENL may be attached to the lower surface of the cover window 100 through a transparent adhesive member.

As shown in FIG. 153, by disposing the fingerprint sensor layer FSENL including capacitive sensor pixels between the display panel 300 and the cover window 100, it may be possible to recognize a person's fingerprint by capacitive sensing.

FIG. 154 is a view showing an example of a layout of the fingerprint sensor layer of FIG. 152.

Referring to FIG. 154, the fingerprint sensor layer FSENL may include sensor scan lines SS1 to SSn, output lines O1 to Om, and sensor pixels SP. FIG. 154 depicts the first sensor transistor SET1, the second sensor transistor SET2 and the fingerprint sensor electrode FSE of each of the sensor pixels SP.

The sensor pixels SP may be electrically connected to the sensor scan lines SS1 to SSn and the output lines O1 to Om. Each of the sensor pixels SP may receive sensor scan signals through two of the sensor scan lines SS1 to SSn. The sensor pixels SP may output a predetermined current corresponding to the fingerprint of a person's finger to the output lines O1 to Om during a period in which the sensor scan signal is applied.

The sensor scan lines SS1, SS2, SS3, SS4, SS5 . . . SSn−2, SSn−1, and SSn may be disposed on the base substrate of the fingerprint sensor layer FSENL. The sensor scan lines SS1 to SSn may be extended in the first direction (x-axis direction).

The output lines O1 to Om may be disposed on the base substrate of the fingerprint sensor layer FSENL. The output lines O1 to Om may be extended in the second direction (y-axis direction).

The sensor pixels SP may be electrically connected to the reference voltage lines as shown in FIG. 155, through which the reference voltage may be supplied. The reference voltage lines may be extended in the second direction (y-axis direction). For example, the reference voltage lines may be arranged or disposed in parallel with the output lines O1 to Om. It is, however, to be understood that the arrangement direction of the reference voltage lines is not limited thereto. For example, the reference voltage lines may be arranged or disposed parallel with the sensor scan lines SS1 to SSn. The reference voltage lines may be electrically connected to each other to maintain the same level.

The fingerprint sensor layer FSENL may include a sensor scan driver for driving the sensor pixels SP, a read-out circuit, and a power supply.

The sensor scan driver may supply sensor scan signals to the sensor pixels SP through the sensor scan lines SS1 to SSn. For example, the sensor scan driver may sequentially output the sensor scan signals to the sensor scan lines SS1 to SSn. The sensor scan signal may have a voltage level for turning on a transistor that receives the sensor scan signal.

The read-out circuit may receive a signal (for example, current) output from the sensor pixels SP through the output lines O1 to Om. For example, in a case that the sensor scan driver sequentially supplies the sensor scan signal, the sensor pixels SP may be selected line-by-line, and the read-out circuit may sequentially receive the current output from the sensor pixels SP line-by-line. The read-out circuit can recognize the ridges RID and valleys VLE of the fingerprint of the person's finger F by sensing the amount of change in current.

The power supply may supply the reference voltage to the sensor pixels SP through the reference voltage lines.

Each of the sensor scan driver, the read-out circuit and the power supply may be disposed directly on the base substrate of the fingerprint sensor layer FSENL, and may be connected to the base substrate of the fingerprint sensor layer FSENL through a separate element such as a flexible printed circuit board. Each of the sensor scan driver, the read-out circuit and the power supply may be an integrated circuit.

FIG. 155 is an equivalent circuit diagram showing an example of a sensor pixel of the fingerprint sensor layer of FIG. 154. The sensor pixel SP shown in FIG. 155 may be electrically connected to the $(i-1)^{th}$ sensor scan line SSi−1, the $i^{th}$ sensor scan line SSi, the $j^{th}$ output line Oj, and a $j^{th}$ reference voltage line Pj.

Referring to FIG. 155, the sensor pixel SP may include a fingerprint sensor electrode FSE, a sensor capacitor electrode 251, a sensing transistor DET, a first sensor transistor SET1, and a second sensor transistor SET2. The fingerprint sensor electrode FSE and the sensor capacitor electrode 251 may form a first sensor capacitor SEC1.

A second sensor capacitor SEC2 is a variable capacitor, and may be a capacitor formed between the fingerprint sensor electrode FSE and a user's finger F. The capacitance of the second sensor capacitor SEC2 may vary depending on the distance between the fingerprint sensor electrode FSE and the finger F, whether the ridges RID or valley VLE of the fingerprint is located or disposed on the fingerprint sensor electrode FSE, and the magnitude of a pressure applied by the person.

The sensing transistor DET may control a current flowing to the $j^{th}$ output line Oj. The sensing transistor DET may be electrically connected between the $j^{th}$ output line Oj and the first sensor transistor SET1. The sensing transistor DET may be electrically connected between the $j^{th}$ output line Oj and the first node N1, and the gate electrode thereof may be electrically connected to a second node N2. For example, the sensing transistor DET may include a first electrode electrically connected to the second electrode of the first sensor transistor SET1, the second electrode electrically connected to the $j^{th}$ output line Oj, and the gate electrode electrically connected to the fingerprint sensor electrode FSE.

The first sensor transistor SET1 may be electrically connected between the $j^{th}$ reference voltage line Pj and the sensing transistor DET. The first sensor transistor SET1 may be electrically connected between the $j^{th}$ reference voltage line Pj and the first node N1, and the gate electrode thereof may be electrically connected to the $i^{th}$ sensor scan line SSi. For example, the first sensor transistor SET1 may include a first electrode electrically connected to the $j^{th}$ reference voltage line Pj, a second electrode electrically connected to the first electrode of the sensing transistor DET, and a gate electrode electrically connected to the $i^{th}$ sensor scan line SSi. Therefore, the first sensor transistor SET1 may be turned on in a case that the sensor scan signal is supplied to the $i^{th}$ sensor scan line SSi. In a case that the first sensor transistor SET1 is turned on, a reference voltage may be applied to the first electrode of the sensing transistor DET.

The second sensor transistor SET2 may be electrically connected between the $j^{th}$ reference voltage line Pj and the fingerprint sensor electrode FSE. The second sensor transistor SET2 may be electrically connected between the second node N2 and the $j^{th}$ reference voltage line Pj, and the gate electrode thereof may be electrically connected to the $(i-1)^{th}$ sensor scan line SSi−1. For example, the second sensor transistor SET2 may include a first electrode electrically connected to the $j^{th}$ reference voltage line Pj, a second electrode electrically connected to the fingerprint sensor electrode FSE, and a gate electrode electrically connected to the $(i-1)^{th}$ sensor scan line SSi−1. Therefore, the second sensor transistor SET2 may be turned on in a case that the sensor scan signal is supplied to the $(i-1)^{th}$ sensor scan line SSi−1. In a case that the second sensor transistor SET2 is turned on, the voltage of the fingerprint sensor electrode FSE may be initialized to the reference voltage.

The sensor capacitor electrode 251 may be disposed to overlap the fingerprint sensor electrode FSE, and accordingly may form the first sensor capacitor SEC1 together with the fingerprint sensor electrode FSE. The sensor capacitor electrode 251 may be electrically connected to the $i^{th}$ sensor scan line SSi. Therefore, the first sensor capacitor SEC1 may be electrically connected between the second node N2 and the $i^{th}$ sensor scan line SSi.

The second sensor capacitor SEC2 may be electrically connected to the second node N2.

To the first node N1, the first electrode of the sensing transistor DET and the second electrode of the first sensor transistor SET1 may be commonly connected. To the second node N2, the fingerprint sensor electrode FSE, the gate electrode of the sensing transistor DET and the second electrode of the second sensor transistor SET2 may be commonly connected.

The first electrode of each of the sensing transistor DET and the sensor transistors SET1 and SET2 may be the source electrode or the drain electrode, and the second electrode thereof may be the other one. For example, in a case that the first electrode is the source electrode, the second electrode may be the drain electrode.

Although the sensing transistor DET and the sensor transistors SET1 and SET2 are p-type MOSFETs in the example shown in FIG. 155, this is merely illustrative. In other embodiments, the sensing transistor DET and the sensor transistors SET1 and SET2 are n-type MOSFETs.

FIG. 156 is a view showing an example of a layout of a sensor pixel of the fingerprint sensor layer of FIG. 155.

The sensor pixel SP shown in FIG. 155 may be electrically connected to the $(i-1)^{th}$ sensor scan line SSi−1, the $i^{th}$ sensor scan line SSi, the $j^{th}$ output line Oj, and the $j^{th}$ reference voltage line Pj.

Referring to FIG. 156, the sensing transistor DET may include a gate electrode DEG, an active layer DEA, a first electrode DES and a second electrode DED.

The gate electrode DEG of the sensing transistor DET may be electrically connected to a sensing connection electrode EN through a first sensing contact hole DCT1. The sensing connection electrode EN may be electrically connected to the fingerprint sensor electrode FSE through a second sensing contact hole DCT2.

A part of an active layer DEA of the sensing transistor DET may overlap a part of a gate electrode DEG of the sensing transistor DET in the third direction (z-axis direction). The active layer DEA of the sensing transistor DET may be electrically connected to the first electrode DES of the sensing transistor DET through a fourth sensing contact hole DCT4. The second electrode DED of the sensing transistor DET may protrude from the $j^{th}$ output line Oj in the first direction (x-axis direction). The active layer DEA of the sensing transistor DET may be electrically connected to the second electrode DED of the sensing transistor DET through a third sensing contact hole DCT3.

The first sensor transistor SET1 may include a gate electrode SEG1, an active layer SEA1, a first electrode SES1, and a second electrode SED1.

The gate electrode SEG1 of the first sensor transistor SET1 may protrude from the $i^{th}$ sensor scan line SSi in the second direction (y-axis direction). The gate electrode SEG1 of the first sensor transistor SET1 may be electrically connected to the sensor capacitor electrode 251. The sensor capacitor electrode 251 may overlap a part of the fingerprint sensor electrode FSE in the third direction (z-axis direction).

A part of the active layer SEA1 of the first sensor transistor SET1 may overlap a part of the gate electrode SEG1 of the first sensor transistor SET1 in the third direction (z-axis direction). The active layer SEA1 of the first sensor transistor SET1 may be electrically connected to the first electrode SES1 of the first sensor transistor SET1 through a first sensor contact hole SCT1. The first electrode SES1 of the first sensor transistor SET1 may protrude from the $j^{th}$ reference voltage line Pj in the first direction (x-axis direction). The active layer SEA1 of the first sensor transistor SET1 may be electrically connected to the second electrode SED1 of the first sensor transistor SET1 through a second sensor contact hole SCT2. The second electrode SED1 of the first sensor transistor SET1 may be electrically connected to the first electrode DES of the sensing transistor DET.

The second sensor transistor SET2 may include a gate electrode SEG2, an active layer SEA2, a first electrode SES2, and a second electrode SED2.

The gate electrode SEG2 of the second sensor transistor SET2 may protrude from the $(i-1)^{th}$ sensor scan line SSi−1 in the second direction (y-axis direction).

A part of the active layer SEA2 of the second sensor transistor SET2 may overlap a part of the gate electrode SEG2 of the second sensor transistor SET2 in the third direction (z-axis direction). The active layer SEA2 of the second sensor transistor SET2 may be electrically connected to the first electrode SES2 of the second sensor transistor SET2 through a third sensor contact hole SCT3. The first electrode SES2 of the second sensor transistor SET2 may be a part of the $j^{th}$ reference voltage line Pj. The active layer SEA2 of the second sensor transistor SET2 may be electrically connected to the second electrode SED2 of the second sensor transistor SET2 through a fourth sensor contact hole SCT4. The second electrode SED2 of the second sensor transistor SET2 may be electrically connected to a fingerprint sensor electrode FSE through a fifth sensor contact hole SCT5.

The first sensor capacitor SEC1 may include the sensor capacitor electrode 251 and the fingerprint sensor electrode FSE.

FIG. 157 is an equivalent circuit diagram showing another example of a sensor pixel of the fingerprint sensor layer of FIG. 154.

Referring to FIG. 157, the sensor pixel SP may include a sensing capacitor Cx, a peak detector diode D1, an input/amplification transistor Q1, a reset transistor Q2, and a pixel (row/column) read transistor Q3. The sensor capacitor Sc1 is the parasitic capacitance of a variety of circuit elements and lines. Row and column addressing is carried out by a row control line Gn, and column reading is carried out by a column read line Dn. The voltage applied to a terminal Gn+1 RESET may be used to forming a short-circuit through the reset transistor Q2 to thereby reset the peak detector circuit. A control line RBIAS is used to apply a voltage to turn on and bias the input/amplification transistor Q1. The voltage applied through a DIODE BIAS line may be used to turn on and bias the peak detector diode D1.

In operation of the sensor pixel SP, the voltage at the control line RBIAS is raised to turn on the input/amplification transistor Q1, an active signal is applied to the DIODE BIAS line to turn on the peak detector diode D1, and the control line RBIAS may be biased for initial charging across the sensing capacitor Cx. In a case that an object such as a finger is placed at the position of the sensing capacitor Cx, the voltage across the sensing capacitor Cx may change. The voltage is sensed as a peak by the peak detector diode D1 and may be read by the input/amplification transistor Q1. The control signals applied to the column read line Dn and the row control line Gn read out the output of the input/amplification transistor Q1 using the pixel (row/column) read transistor Q3. In such case, the output from the input/amplification transistor Q1 may be subjected to analog-to-digital conversion. Once the charges at the peak detector diode D1 has been read out, the control line RBIAS and the DIODE BIAS line may return to an inactive signal, and a reset signal may be applied to the terminal Gn+1 RESET in order to remove the charged accumulated by the reset transistor Q2. FIG. 158 is an equivalent circuit diagram showing another example of a sensor pixel of the fingerprint sensor layer of FIG. 154.

Referring to FIG. 158, each of the sensor pixels SP may include a sensing electrode 1102, a first sensor transistor 1112, a second sensor transistor 1116, and a sensing capacitor CR.

The sensing electrode 1102 may be electrically connected to an enable line 1110 through the first sensor transistor 1112. The sensing electrode 1102 may be electrically connected to the gate of the second sensor transistor 1116. The drain of the second sensor transistor 1116 may be electrically connected to a supply line 1104, and the source thereof may be electrically connected to an output line 1108.

The sensor pixels SP arranged or disposed in the same row may share the same enable line 1110 and the same row select line 1106. The sensor pixels SP arranged or disposed in the same row may share the same supply line 1104 and the same output line 1108. Alternatively, the supply line 1104 may be eliminated, and the drain of the second sensor transistor 1116 may be electrically connected to the row select line 1106.

The capacitance formed between the sensing electrode 1102 of the sensor pixel SP and the fingerprint of the finger F controls a steady-state current output from the second sensor transistor 1116. By measuring the capacitance between the sensing electrode 1102 and the fingerprint based on the output current of the sensor pixel SP, it may be possible to distinguish between the ridges RID and valleys VLE of the finger's fingerprint.

FIG. 159 is a view showing a layout of emission areas and second light-emitting electrodes of a display panel according to an embodiment.

Referring to FIG. 159, the display panel 300 may include first to third emission areas RE, GE, and BE. The first to third emission areas RE, GE and BE may be substantially identical to those described above with reference to FIG. 7.

The display panel 300 may include second light-emitting electrodes CAT1 and CAT2 rather than one second light-emitting electrode 173. In such case, the light-emitting elements LEL disposed in the emission areas RE, GE and BE may not be commonly electrically connected to one second light-emitting electrode 173.

The second light-emitting electrodes CAT1 and CAT2 may be electrically separated from each other. The second light-emitting electrodes CAT1 and CAT2 may be spaced apart from each other. Although FIG. 159 shows the two second light-emitting electrodes CAT1 and CAT2, the number of the second light-emitting electrodes CAT1 and CAT2 is not limited thereto.

Each of the second light-emitting electrodes CAT1 and CAT2 may overlap the emission regions RE, GE, and BE. The number of emission areas RE, GE and BE overlapping the second light-emitting electrodes CAT1 may be equal to the number of emission areas RE, GE and BE overlapping the second light-emitting electrodes CAT2.

One side of the second light-emitting electrode CAT1 may be in parallel with one side of the second light-emitting electrode CAT2, as shown in FIG. 159. In addition, one side of one second light-emitting electrode CAT1 and one side of the other second light-emitting electrode CAT2 may be formed in zigzag in the second direction (y-axis direction) to bypass the emission areas RE, GE, and BE.

FIGS. 160 and 161 are schematic cross-sectional views showing an example of the emission areas and second light-emitting electrodes of the display panel of FIG. 159. FIG. 160 is a schematic cross-sectional view of the display panel 300, taken along line BVI-BVI' of FIG. 159. FIG. 161 is a schematic cross-sectional view of the display panel 300, taken along line BVII-BVII' of FIG. 159.

Referring to FIGS. 160 and 161, the second light-emitting electrodes CAT1 and CAT2 may be disposed on the bank 180 and the emissive layers 172. The second light-emitting electrodes CAT1 and CAT2 may be formed of a transparent conductive material (TCP) such as ITO and IZO that may transmit light, or a semi-transmissive conductive material such as magnesium (Mg), silver (Ag) and an alloy of magnesium (Mg) and silver (Ag).

Each of the second light-emitting electrodes CAT1 and CAT2 may be electrically connected to a cathode auxiliary electrode VSAE through a cathode contact hole CCT penetrating through the bank 180. The cathode auxiliary electrode VSAE may be disposed on a second organic layer 160. The cathode auxiliary electrode VSAE may be made up of a single layer of molybdenum (Mo), titanium (Ti), copper (Cu) or aluminum (Al), or may be made up of a stack structure of aluminum and titanium (Ti/Al/Ti), a stack structure of aluminum and ITO (ITO/Al/ITO), an APC alloy and a stack structure of an APC alloy and ITO (ITO/APC/ITO). The cathode auxiliary electrode VSAE may be disposed on the same layer and made of the same or similar material as the first light-emitting electrode 171.

The cathode auxiliary electrode VSAE may be electrically connected to a cathode connection electrode VSCE through a contact hole penetrating through the second organic layer 160. The cathode connection electrode VSCE may be disposed on a first organic layer 150. The cathode connection electrode VSCE may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. The cathode connection electrode VSCE may be disposed on the same layer and made of the same or similar material as a first connection electrode ANDE1.

The cathode connection electrode VSCE may be electrically connected to a second supply voltage line VSSL through a contact hole penetrating through the first organic layer 150. The second supply voltage line VSSL may be disposed on a second interlayer dielectric layer 142. The second supply voltage line VSSL may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. The second supply voltage line VSSL may be disposed on the same layer and made of the same or similar material as the first electrode S6 and the second electrode D6 of the sixth transistor ST6.

Alternatively, the second supply voltage line VSSL may be disposed on the first organic layer 150, in which case the cathode connection electrode VSCE may be eliminated.

Alternatively, the second supply voltage line VSSL may be disposed on the second organic layer 160 and may be electrically connected directly to one of the second light-emitting electrodes CAT1 and CAT2 through the cathode contact hole CCT penetrating through the bank 180, and the cathode auxiliary electrode VSAE and the cathode connection electrode VSCE may be eliminated.

As shown in FIGS. 160 and 161, each of the second light-emitting electrodes CAT1 and CAT2 may receive a second supply voltage through the second supply voltage line VSSL.

FIG. 162 is a waveform diagram showing cathode voltages applied to the second light-emitting electrodes during an active period and a blank period of a single frame.

Referring to FIG. 162, a single frame may include an active period ACT in which data voltages may be applied to display pixels DP1, DP2 and DP3 of the display panel 300, and a blank period VBI that may be an idle period.

During the active period ACT, the second supply voltage may be applied to the second light-emitting electrodes CAT1 and CAT2. In a case that the second supply voltage is applied to the second light-emitting electrodes CAT1 and CAT2, the emissive layer 172 of each of the light-emitting elements LEL may emit light as holes from the first light-emitting electrode 171 and electrons from the second light-emitting electrodes CAT1 and CAT2 combine in the emissive layer 172.

During the blank period VBI, fingerprint driving signals FSS1 and FSS2 may be sequentially applied to the second light-emitting electrodes CAT1 and CAT2. Each of the fingerprint driving signals FSS1 and FSS2 may include pulses. During the blank period VBI, the first fingerprint driving signal FSS1 may be applied to the second light-emitting electrode CAT1 and then the second fingerprint driving signal FSS2 may be applied to the second light-emitting electrode CAT2.

During the blank period VBI, the self-capacitance of each of the second light-emitting electrodes CAT1 and CAT2 may be sensed by self-capacitance sensing. Initially, in a case that the first fingerprint driving signal FSS1 is applied to one of the second light-emitting electrodes CAT1 and CAT2, i.e., the second light-emitting electrode CAT1, the self-capacitance of the second light-emitting electrode CAT1 may be charged by the first fingerprint driving signal FSS1 and the amount of a change in the voltage charged in the self-capacitance may be sensed. Subsequently, in a case that the second fingerprint driving signal FSS2 is applied to the other one of the second light-emitting electrodes CAT1 and CAT2, i.e., the second light-emitting electrode CAT2, the self-capacitance of the second light-emitting electrode CAT2 may be charged by the second fingerprint driving signal FSS2 and the amount of a change in the voltage charged in the self-capacitance may be sensed. In such case, as shown in FIG. 124, a person's fingerprint may be recognized by sensing a difference between the value of the self-capacitance of the second light-emitting electrodes CAT1/CAT2 at the ridges RID of the person's fingerprint and the value of the self-capacitance of the second light-emitting electrodes CAT1/CAT2 at the valleys VLE of the person's fingerprint.

FIG. 163 is a view showing a layout of emission areas and the light-emitting electrodes of a display panel according to another embodiment.

Referring to FIG. 163, the display panel 300 may include first to third emission areas RE, GE and BE, a second light-emitting electrode CAT overlapping the first to third emission areas RE, GE and BE, and a fingerprint sensor electrode FSE.

The second light-emitting electrode CAT may overlap the first to third emission areas RE, GE, and BE. The light-emitting elements LEL disposed in the first to third emission areas RE, GE and BE may be commonly connected to the single second light-emitting electrode CAT.

The fingerprint sensor electrode FSE may be electrically separated from the second light-emitting electrode CAT. The fingerprint sensor electrode FSE may be spaced apart from the second light-emitting electrode CAT.

The fingerprint sensor electrode FSE may be driven by self-capacitance sensing. For example, the self-capacitance of the fingerprint sensor electrode FSE may be charged by the fingerprint driving signal, and the amount of a change in the voltage charged in the self-capacitance may be sensed. In such case, a person's fingerprint may be recognized by sensing a difference between the value of the self-capacitance of the fingerprint sensor electrodes FSE at the ridges RID of the person's fingerprint and the value of the self-capacitance of the fingerprint sensor electrodes FSE at the valleys VLE of the person's fingerprint.

In order to prevent the second light-emitting electrode CAT from being affected by the fingerprint driving signal applied to the fingerprint sensor electrode FSE, a shielding electrode may be disposed between the fingerprint sensor electrode FSE and the second light-emitting electrode CAT. The shielding electrode may surround the fingerprint sensor electrode FSE. A ground voltage or the second driving voltage may be applied to the shielding electrode. Alternatively, no voltage may be applied to the shielding electrode. In other words, the shielding electrode may be floating.

FIG. 164 is a schematic cross-sectional view showing an example of the emission areas and the light-emitting electrodes of the display panel of FIG. 163. FIG. 164 shows a schematic cross section of the display panel 300, taken along line BVIII-BVIII' of FIG. 163.

Referring to FIG. 164, the fingerprint sensor electrode FSE may be disposed on the bank 180 and a fingerprint auxiliary electrode FAE. The fingerprint sensor electrode FSE may be formed of a transparent conductive material (TCP) such as ITO and IZO that can transmit light, or a semi-transmissive conductive material such as magnesium (Mg), silver (Ag) and an alloy of magnesium (Mg) and silver (Ag). The fingerprint sensor electrode FSE may be disposed on the same layer and made of the same or similar material as the second light-emitting electrode CAT.

The fingerprint sensor electrode FSE may be electrically connected to the fingerprint auxiliary electrode FAE through a fingerprint sensor area FSA penetrating through the bank 180. The fingerprint auxiliary electrode FAE may be disposed on the second organic layer 160. The fingerprint auxiliary electrode FAE may be made up of a single layer of molybdenum (Mo), titanium (Ti), copper (Cu) or aluminum (Al), or may be made up of a stack structure of aluminum and titanium (Ti/Al/Ti), a stack structure of aluminum and ITO (ITO/Al/ITO), an APC alloy and a stack structure of an APC alloy and ITO (ITO/APC/ITO).

The fingerprint auxiliary electrode FAE may be disposed on the same layer and made of the same or similar material as the first light-emitting electrode 171.

The fingerprint auxiliary electrode FAE may be electrically connected to a fingerprint connection electrode FCE through a contact hole penetrating through the second organic layer 160. The fingerprint connection electrode FCE may be disposed on the first organic layer 150. The fingerprint connection electrode FCE may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. The fingerprint connection electrode FCE may be disposed on the same layer and made of the same or similar material as a first connection electrode ANDE1.

The fingerprint connection electrode FCE may be electrically connected to a fingerprint sensor line FSL through a contact hole penetrating through the first organic layer 150. The fingerprint sensor line FSL may be disposed on the second interlayer dielectric layer 142. The fingerprint sensor line FSL may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. The fingerprint sensor line FSL may be disposed on the same layer and made of the same or similar material as the first electrode S6 and the second electrode D6 of the sixth transistor ST6.

Alternatively, the fingerprint sensor line FSL may be disposed on the first organic layer 150, in which case the fingerprint connection electrode FCE may be eliminated. Alternatively, the fingerprint sensor line FSL may be disposed on the second organic layer 160, and in which case may be electrically connected directly to the fingerprint sensor electrode FSE in the fingerprint sensor area FSA penetrating through the bank 180, while the fingerprint auxiliary electrode FAE and the fingerprint connection electrode FCE may be eliminated.

As shown in FIG. 164, the fingerprint sensor electrode FSE may receive a fingerprint driving signal through the fingerprint sensor line FSL, and may detect a change in voltage charged in the self-capacitance of the fingerprint sensor electrode FSE.

FIG. 165 is a view showing a layout of a display area and a non-display area of a display panel and an ultrasonic sensor according to an embodiment.

An embodiment shown in FIG. 165 may be different from an embodiment of FIG. 4 in that a display panel 300 may include an ultrasonic sensor 530.

Referring to FIG. 165, the display panel 300 may include the ultrasonic sensor 530 that may output and detect ultrasonic waves. The ultrasonic sensor 530 may include a first ultrasonic sensor 531 disposed on a first side of the display panel 300, a second ultrasonic sensor 532 disposed on a second side of the display panel 300, a third ultrasonic sensor 533 disposed on a third side of the display panel 300, and a fourth ultrasonic sensor 534 disposed on a fourth side of the display panel 300. The first side of the display panel 300 may be the left side, the second side thereof may be the right side, the third side thereof may be the upper side, and the fourth side thereof may be the lower side. However, the disclosure is not limited thereto.

The first ultrasonic sensor 531 and the second ultrasonic sensor 532 may be disposed such that they may face each other in the first direction (x-axis direction). The third ultrasonic sensor 533 and the fourth ultrasonic sensor 534 may be disposed such that they face each other in the second direction (y-axis direction).

Although the first to fourth ultrasonic sensors 531, 532, 533 and 534 may be disposed on the first to fourth sides of the display panel 300, respectively, in the example shown in FIG. 165, the disclosure is not limited thereto. The ultrasonic sensors 530 may be disposed only on two sides of the display panel 300 opposed to each other. For example, only the first ultrasonic sensor 531 and the second ultrasonic sensor 532 opposed to each other in the first direction (x-axis direction) may be disposed, while the third ultrasonic sensor 533 and the fourth ultrasonic sensor 534 may be eliminated. Alternatively, only the third ultrasonic sensor 533 and the fourth ultrasonic sensor 534 opposed to each other in the second direction (y-axis direction) may be disposed, while the first ultrasonic sensor 531 and the second ultrasonic sensor 532 may be eliminated.

Although the first to fourth ultrasonic sensors 531, 532, 533 and 534 are disposed in the non-display area NDA in the example shown in FIG. 165, the disclosure is not limited thereto. The first to fourth ultrasonic sensors 531, 532, 533 and 534 may be disposed in the display area DA.

Each of the first to fourth ultrasonic sensors 531, 532, 533 and 534 may include sound converters 5000. Each of the sound converters 5000 may be a piezoelectric element or a piezoelectric actuator including a piezoelectric material that contracts or expands according to the voltage applied thereto. The sound converters 5000 may output ultrasonic waves or sound by vibration. The sound converters 5000 may output a sensing voltage according to ultrasonic driving signals input thereto.

The sound converters 5000 of each of the first to fourth ultrasonic sensors 531, 532, 533 and 534 may be electrically connected to the sensor driver 340. Alternatively, the sound converters 5000 of each of the first to fourth ultrasonic sensors 531, 532, 533 and 534 may be electrically connected to a separate ultrasonic driver disposed on the display circuit board 310. In a case that the sound converters 5000 output ultrasonic waves, the sensor driver 340 or a separate ultrasonic driver may convert the ultrasonic driving data input from the main processor 710 into ultrasonic driving signals, to output them to the sound converters 5000. In a case that the sound converters 5000 output sensing voltages according to ultrasonic driving signals, the sensor driver 340 or a separate ultrasonic driver may convert the sensing voltages into sensing data to output it to the main processor 710.

Since the length of the first side and the length of the second side of the display panel 300 may be longer than the length of the third side and the length of the fourth side, the number of the sound converters 5000 disposed in each of the first ultrasonic sensor 531 and the second ultrasonic sensor 532 may be larger than the number of the sound converters 5000 disposed in each of the third ultrasonic sensor 533 and the fourth ultrasonic sensor 534. The number of the sound converters 5000 disposed in the first ultrasonic sensor 531 may be equal to the number of the second ultrasonic sensor 532, which may face the first ultrasonic sensor 531 in the first direction (x-axis direction). The number of the sound converters 5000 disposed in the third ultrasonic sensor 533 may be equal to the number of the fourth ultrasonic sensor 534, which may face the third ultrasonic sensor 533 in the second direction (y-axis direction).

At the sensor area SA, a person's finger F may be located or disposed in order to recognize the fingerprint of the person's finger F. The sensor area SA may overlap the display area DA. The sensor area SA may be defined as at least a part of the display area DA. The sensor area SA may be, but is not limited to, the central area of the display area DA.

As shown in FIG. 165, the sound converters 5000 of the ultrasonic sensor 530 may output ultrasonic waves to a person's finger F placed at the sensor area SA, and detect ultrasonic waves reflected from the fingerprint of the person's finger F. Hereinafter, a method of recognizing the fingerprint of a person's finger F using the sound converters 5000 of the ultrasonic sensor 530 will be described with reference to FIG. 166.

FIG. 166 is a view showing an example of a method of sensing ultrasonic waves using ultrasonic signals of the sound converts of FIG. 165.

Referring to FIG. 166, the sound converters 5000 of the second ultrasonic sensor 532 may output ultrasonic signals US toward the sensor area SA. For example, the sound converters 5000 of the second ultrasonic sensor 532 may output ultrasonic signals US so that they are inclined by a fifth angle θ5 from the first direction (x-axis direction). The plane of each of the ultrasonic signals US may have a direction DR13 perpendicular to the direction in which the ultrasonic signals US are propagated, but the disclosure is not limited thereto. The direction D12 may be substantially perpendicular to the direction DR13.

In a case that the ultrasonic signals US output from the sound converters 5000 of the second ultrasonic sensor 532 reach the sensor area SA, the amount of pulses of the ultrasonic signal US attenuated at the ridges RID of the fingerprint of a person's finger F placed in the sensor area SA may be larger than the amount of pulses of the ultrasonic signal US attenuated at the valleys VLE of the fingerprint. Therefore, the magnitude of the pulses of ultrasonic signals US' passing through the sensor area SA may be different from one another For the ultrasonic signals US' passed through the sensor area SA, they may be detected by the sound converters 5000 of the first ultrasonic sensor 531. Each of the sound converters 5000 of the first ultrasonic sensor 531 may output a voltage according to the magnitude of the pulses of the ultrasonic signal US'.

In FIG. 166, the sound converters 5000 of the second ultrasonic sensor 532 output ultrasonic signals US, and the sound converters 5000 of the first ultrasonic sensor 531 detect ultrasonic signals US' having passed through the sensor area SA. It is, however, to be understood that the disclosure is not limited thereto. For example, the sound converters 5000 of the first ultrasonic sensor 531 may output ultrasonic signals US, and the sound converters 5000 of the second ultrasonic sensor 532 may detect ultrasonic signals US' having passed through the sensor area SA.

The sound converters 5000 of one of the third ultrasonic sensor 533 and the fourth ultrasonic sensor 534 may output ultrasonic signals US, and the sound converters 5000 of the other one may detect the ultrasonic signals US'. Each of the sound converters 5000 of the other one of the third ultrasonic sensor 533 and the fourth ultrasonic sensor 534 may output a voltage according to the magnitude of the pulses of the ultrasonic signal US'.

The sensor driver 340 or the ultrasonic driver may convert voltages output from the sound converters 5000 of the first ultrasonic sensor 531 into first sensing data. The sensor driver 340 may convert voltages output from the sound converters 5000 of the other one of the third ultrasonic sensor 533 and the fourth ultrasonic sensor 534 into second sensing data. The main processor 710 may analyze the first sensing data and the second sensing data to infer a person's fingerprint. For example, the main processor 710 may calculate the cumulative attenuation amount of the ultrasonic signals according to the numbers of ridges RID of a person's fingerprint provided in a certain or a given path, thereby inferring the person's fingerprint.

FIG. 167 is a schematic cross-sectional view showing the display panel and the sound converters of FIG. 165. FIG. 167 shows a schematic cross section of the display panel 300, taken along line BIX-BIX' of FIG. 165.

Referring to FIG. 167, a panel bottom cover PB of the display panel 300 includes a cover hole PBH that penetrates through the panel bottom cover PB to expose the substrate SUB of the display panel 300. Since the panel bottom cover PB includes an elastic buffer member, the sound converters 5000 of the ultrasonic sensor 530 may be disposed on the lower surface of the substrate SUB in the cover hole PBH to output the ultrasonic wave or sound by vibration.

FIG. 168 is a schematic cross-sectional view showing an example of the sound converters of FIG. 165. FIG. 169 is a view showing an example of a method of vibrating a vibration layer disposed between a first branch electrode and a second branch electrode of the sound converter of FIG. 168.

Referring to FIGS. 168 and 169, the sound converter 5000 may be a piezoelectric element or a piezoelectric actuator including a piezoelectric material that contracts or expands according to an electrical signal. The sound converter 5000 may include a first sound electrode 5001, a second sound electrode 5002, and a vibration layer 5003.

The first sound electrode 5001 may be disposed on a surface of the vibration layer 5003, and the second sound electrode 5002 may be disposed on the other surface of the vibration layer 5003. For example, the first sound electrode 5001 may be disposed on the lower surface of the vibration layer 5003, while the second sound electrode 5002 may be disposed on the upper surface of the vibration layer 5003.

The vibration layer 5003 may be a piezoelectric element that may be deformed according to a driving voltage applied to the first sound electrode 5001 and a driving voltage applied to the second sound electrode 5002. In such case, the vibration layer 5003 may include one of poly vinylidene fluoride (PVDF), a polarized fluoropolymer, a PVDF-TrFE copolymer, plumbum zirconate titanate (PZT), and an electroactive polymer. The vibration layer 5003 contracts or expands according to a difference between the driving voltage applied to the first sound electrode 5001 and the driving voltage applied to the second sound electrode 5002.

Because the vibration layer 5003 is produced at a high temperature, the first sound electrode 5001 and the second sound electrode 5002 may be made of silver (Ag) having a high melting point or an alloy of silver (Ag) and palladium (Pd). In order to increase the melting point of the first sound electrode 5001 and the second sound electrode 5002, in a case that the first sound electrode 5001 and the second sound electrode 5002 are made of an alloy of silver (Ag) and palladium (Pd), the content of silver (Ag) may be higher than the content of palladium (Pd).

As shown in FIG. 169, the vibration layer 5003 may have the negative polarity in the lower region adjacent to the first sound electrode 5001, and the positive polarity in the upper region adjacent to the second sound electrode 5002. The polarity direction of the vibration layer 5003 may be determined via a poling process of applying an electric field to the vibration layer 5003 using the first sound electrode 5001 and the second sound electrode 5002.

If the lower region of the vibration layer 5003 that may be adjacent to the first sound electrode 5001 has the negative polarity while the upper region of the vibration layer 5003 that may be adjacent to the second sound electrode 5002 has the positive polarity, the vibration layer 5003 may contract under a first force F1 in a case that the driving voltage of negative polarity may be applied to the first sound electrode 5001 and the driving voltage of the positive polarity may be applied to the second sound electrode 5002. The first force F1 may be a contractive force. In a case that the driving voltage of the positive polarity may be applied to the first sound electrode 5001 while the driving voltage of the negative polarity may be applied to the second sound electrode 5002, the vibration layer 5003 may expand under a second force F2. The second force F2 may be an expanding force.

As shown in FIGS. 168 and 169, the sound converters 5000 may contract or expand the vibration layer 5003 according to driving voltages applied to the first sound electrode 5001 and the second sound electrode 5002. The sound converter 5000 may vibrate as the vibration layer 5003 contracts and expands repeatedly, thereby vibrating the display panel 300 to output sound or ultrasonic waves. In a case that the display panel 300 is vibrated by the sound converter 5000 to output ultrasonic waves, the frequencies of the driving voltages applied to the first sound electrode 5001 and the second sound electrode 5002 may be higher than those in a case that sound is output.

FIGS. 170 and 171 are bottom views showing a display panel according to an embodiment. The bottom view of FIG. 170 shows a display panel 300, a flexible film 313 and a display circuit board 310 in a case that a subsidiary area SBA of a substrate SUB is not bent but is unfolded. The bottom view of FIG. 171 shows the display panel 300, the flexible film 313 and the display circuit board 310 in a case that the subsidiary area SBA of the substrate SUB is bent so that it may be disposed on the lower surface of the display panel 300.

Referring to FIGS. 170 to 171, a panel bottom cover PB of the display panel 300 may include a first cover hole PBH1 and a second cover hole PBH2 that penetrate through the panel bottom cover PB to expose the substrate SUB of the display panel 300. Since the panel bottom cover PB may include an elastic buffer member, the ultrasonic sensor 530 may be disposed on the lower surface of the substrate SUB in the first cover hole PBH1 to output the ultrasonic waves by vibration. A sound generator 540 may be disposed on the lower surface of the substrate SUB in the second cover hole PBH2 to output sound by vibration.

The ultrasonic sensor 530 may be an ultrasonic fingerprint sensor that may output ultrasonic waves and may sense ultrasonic waves reflected from the fingerprints of a person's finger F. Alternatively, the ultrasonic sensor 530 may be a proximity sensor that may irradiate ultrasonic waves onto the display device 10 and sense ultrasonic waves reflected by an object to determine whether an object is disposed close to the display device 10.

The sound generator 540 may be a piezoelectric element or a piezoelectric actuator including a piezoelectric material that contracts or expands according to the voltage applied thereto as shown in FIG. 168. Alternatively, the sound generator 540 may be a linear resonant actuator (LRA) that vibrates the display panel 300 by generating magnetic force using a voice coil as shown in FIG. 172. In a case that the sound generator 540 is a linear resonant actuator, it may include a lower chassis 541, a flexible circuit board 542, a voice coil 543, a magnet 544, a spring 545, and an upper chassis 546.

Each of the lower chassis 541 and the upper chassis 546 may be formed of a metal material. The flexible circuit board 542 may be disposed on a surface of the lower chassis 541 facing the upper chassis 546 and may be connected to the second flexible circuit board 547. The voice coil 543 may be connected to a surface of the flexible circuit board 542 facing the upper chassis 546. Accordingly, one end of the voice coil 543 may be electrically connected to one of the lead lines of the second flexible circuit board 547, and the other end of the voice coil 543 may be electrically connected to another one of the lead lines. The magnet 544 is a permanent magnet, and a voice coil groove 544*a* in which the voice coil 543 is accommodated may be formed in a surface facing the voice coil 543. An elastic body such as a spring 545 is disposed between the magnet 544 and the upper chassis 546.

The direction of the current flowing through the voice coil 543 may be controlled by a first driving voltage applied to one end of the voice coil 543 and a second driving voltage applied to the other end thereof. An induced magnetic field may be formed around the voice coil 543 according to the current flowing through the voice coil 543. For example, the direction in which current flows through the voice coil 543 in a case that the first driving voltage is a positive voltage and the second driving voltage is a negative voltage is opposite to the direction in which current flows through the voice coil 543 in a case that the first driving voltage is a negative voltage and the second driving voltage is a positive voltage. As the first driving voltage and the second driving voltage induce AC currents, an attractive force and a repulsive force act on the magnet 544 and the voice coil 543 alternately. Therefore, the magnet 544 can reciprocate between the voice coil 543 and the upper chassis 546 by the spring 545.

The flexible film 313 may be attached to the subsidiary area SBA of the display panel 300. One side of the flexible film 313 may be attached to the display pads in the subsidiary area SBA of the display panel 300 using an anisotropic conductive film. The flexible film 313 may be a flexible circuit board that may be bent.

The flexible film 313 may include a film hole USH penetrating through the flexible film 313. The film hole USH of the flexible film 313 may overlap the ultrasonic sensor 530 in the third direction (z-axis direction) in a case that the subsidiary area SBA of the display panel 300 is bent and disposed on the lower surface of the display panel 300 Accordingly, in a case that the subsidiary area SBA of the display panel 300 is bent and disposed on the lower surface of the display panel 300, it may be possible to prevent the ultrasonic sensor 530 from being disturbed by the flexible film 313.

The display circuit board 310 may be attached to the other side of the flexible film 313 using an anisotropic conductive film. The other side of the flexible film 313 may be the opposite side to the side of the flexible film 313.

A pressure sensor PU may be formed on the display circuit board 310 as well as the touch driver 330 and the sensor driver 340. One surface of the pressure sensor PU may be disposed on the display circuit board 310 and the other surface thereof may be disposed on the bracket 600. In a case that a pressure is applied by a user, the pressure sensor PU can sense the pressure. As shown in FIG. 173, the pressure sensor PU may include a first base member BS1, a second base member BS2, a pressure driving electrode PTE, a pressure sensing electrode PRE, and a cushion layer CSL.

The first base member BS1 and the second base member BS2 are disposed to face each other. Each of the first base member BS1 and the second base member BS2 may be made of a polyethylene terephthalate (PET) film or a polyimide film.

The pressure driving electrode PTE may be disposed on a surface of the first base member BS1 facing the second base member BS2, and the pressure sensing electrode PRE may be disposed on a surface of the second base member BS2 facing the first base member BS1. The pressure driving electrode PTE and the pressure sensing electrode PRE may include a conductive material such as silver (Ag) and copper (Cu). The pressure driving electrode PTE may be formed on the first base member BS1 by screen printing, and the pressure sensing electrode PRE may be formed on the second base member BS2 by screen printing.

The cushion layer CSL may include a material having elasticity including a polymer resin such as polycarbonate, polypropylene and polyethylene, a rubber, a sponge obtained by foaming a urethane-based material or an acrylic-based material, for example, within the spirit and the scope of the disclosure.

In a case that a pressure is applied by a user, the height of the cushion layer CSL may be reduced, and accordingly the distance between the pressure driving electrode PTE and the pressure sensing electrode PRE may become closer. As a result, the capacitance formed between the pressure driving electrode PTE and the pressure sensing electrode PRE may be changed. Accordingly, the pressure sensor driver connected to the pressure sensor PU may detect a change in the capacitance value based on a current value or a voltage value sensed through the pressure sensing electrode PRE. Therefore, it may be possible to determine whether or not a pressure is applied by the user.

One of the first base member BS1 and the second base member BS2 of the pressure sensor PU may be attached to one surface of the display circuit board 310 via a pressure sensitive adhesive, while the other one thereof may be attached to the bracket 600 via a pressure sensitive adhesive. Alternatively, at least one of the first base member BS1 and the second base member BS2 of the pressure sensor PU may be eliminated. For example, in a case that the first base member BS1 of the pressure sensor PU is eliminated, the pressure driving electrode PTE may be disposed on the display circuit board 310. For example, the pressure sensor PU may use the display circuit board 310 as a base member. In a case that the second base member BS2 of the pressure sensor PU is eliminated, the pressure sensing electrode PRE may be disposed on the bracket 600. In other words, the pressure sensor PU may use the bracket 600 as the base member.

FIG. 174 is a schematic cross-sectional view showing an example of the display panel of FIGS. 170 and 171. FIG. 174 shows an example of a schematic cross section of the display panel 300, taken along line C-C' of FIG. 170.

Referring to FIG. 174, the ultrasonic sensor 530 may be disposed on the lower surface of the display panel 300. The ultrasonic sensor 530 may be attached to or disposed on the lower surface of the display panel 300 through an adhesive member 511'.

The sensor electrode layer SENL may include sensor electrodes SE and conductive patterns (or referred to as first conductive patterns) CP. The sensor electrodes SE and the conductive patterns CP may be substantially identical to those described above with reference to FIGS. 147 and 148.

The sensor electrodes SE may be disposed on the first sensor insulating layer TINS1, and the conductive patterns CP may be disposed on the second sensor insulating layer TINS2. Since the conductive patterns CP may be disposed on the top layer of the display panel 300, even if the wavelengths of the electromagnetic waves transmitted or received by the conductive patterns CP are short, like those for 5G mobile communications, they do not need to pass through the metal layers of the display panel 300. Therefore, electromagnetic waves transmitted/received by the conductive patterns CP may be stably radiated toward the upper side of the display device 10. Electromagnetic waves received on the display device 10 may be stably received by the conductive patterns CP.

Alternatively, the conductive patterns CP may be disposed on the first sensor insulating layer TINS1. In such case, the conductive patterns CP may be disposed on the same layer and may be made of the same or similar material as the sensor electrodes SE. The conductive patterns CP may be formed on the sensor electrode layer SENL without any additional process.

FIG. 175 is a schematic cross-sectional view showing another example of the display panel of FIGS. 170 and 171. FIG. 175 shows another example of a schematic cross section of the display panel 300, taken along line C-C' of FIG. 170.

An embodiment of FIG. 175 may be different from an embodiment of FIG. 174 in that a sensor electrode layer SENL may include pressure driving electrodes PTE, pressure sensing electrodes PRE, and pressure sensing layers PSL instead of sensor electrodes SE.

Referring to FIG. 175, the ultrasonic sensor 530 may be disposed on the lower surface of the display panel 300. The ultrasonic sensor 530 may be attached to the lower surface of the display panel 300 through an adhesive member 511'.

The sensor electrode layer SENL may include a pressure sensing layer PSL, pressure driving electrodes PTE, pressure sensing electrodes PRE, and conductive patterns CP.

The pressure driving electrodes PTE and the pressure sensing electrodes PRE may be disposed on the third buffer layer BF3. The pressure driving electrodes PTE and the pressure sensing electrodes PRE may be alternately arranged or disposed in one direction.

Each of the pressure driving electrodes PTE and the pressure sensing electrodes PRE may not overlap the emission areas RE, GE and BE. Each of the pressure driving electrodes PTE and the pressure sensing electrodes PRE may overlap the bank 180 in the third direction (z-axis direction).

The pressure sensing layer PSL may be disposed on the pressure driving electrodes PTE and the pressure sensing electrodes PRE. The pressure sensing layer PSL may include a polymer resin having a pressure sensitive material. The pressure sensitive material may be metal microparticles (or metal nanoparticles) such as nickel, aluminum, titanium, tin and copper. For example, the pressure sensing layer PSL may be a quantum tunneling composite (QTC).

In a case that the user's pressure is applied to the pressure sensing layer PSL in the third direction (z-axis direction), the thickness of the pressure sensing layer PSL may be reduced. As a result, the resistance of the pressure sensing layer PSL may be changed. A pressure sensor driver may sense a change in current value or a voltage value from the pressure sensing electrodes PRE based on a change in the resistance of the pressure sensing layer PSL, thereby determining the magnitude of the pressure that the user presses by a finger.

The sensor insulating layer TINS may be disposed on the pressure sensing layer PSL. The sensor insulating layer TINS may be formed of an inorganic layer, for example, a silicon nitride layer, a silicon oxynitride layer, a silicon oxide layer, a titanium oxide layer, or an aluminum oxide layer.

The conductive patterns CP may be disposed on the sensor insulating layer TINS. Each of the conductive patterns CP may not overlap the emission areas RE, GE and BE. Each of the conductive patterns CP may overlap the bank 180 in the third direction (z-axis direction). Each of the conductive patterns CP may be made up of a single layer of molybdenum (Mo), titanium (Ti), copper (Cu) or aluminum (Al), or may be made up of a stack structure of aluminum and titanium (Ti/Al/Ti), a stack structure of aluminum and ITO (ITO/Al/ITO), an APC alloy and a stack structure of an APC alloy and ITO (ITO/APC/ITO).

As shown in FIG. 175, the sensor electrode layer SENL may include the pressure driving electrodes PTE, the pressure sensing electrodes PRE and the pressure sensing layers PSL instead of the sensor electrodes SE, and can sense a pressure applied by a user.

FIG. 176 is a schematic cross-sectional view showing another example of the display panel of FIGS. 170 and 171. FIG. 176 shows another example of a schematic cross section of the display panel 300, taken along line C-C' of FIG. 170.

An embodiment of FIG. 176 may be different from an embodiment of FIG. 174 in that a sensor electrode layer SENL may include no sensor electrode SE and that a digitizer layer DGT may be further disposed on the lower surface of the display panel 300.

Referring to FIG. 176, a digitizer layer DGT may be disposed on the lower surface of the display panel 300. The digitizer layer DGT may be disposed on the lower surface of the ultrasonic sensor 530. The digitizer layer DGT may be attached to or disposed on the lower surface of the ultrasonic sensor 530 through an adhesive member such as a pressure sensitive adhesive. The digitizer layer DGT is substantially identical to that described above with reference to FIGS. 75 to 77; and, therefore, the redundant description will be omitted.

It may be possible to determine which position of the digitizer layer DGT the digitizer input unit may be close to by detecting the magnetic field or electromagnetic signal emitted from a digitizer input unit by the digitizer layer DGT. For example, since the touch input of the digitizer input unit may be sensed by the digitizer layer DGT, the sensor electrodes SE of the sensor electrode layer SENL may be eliminated.

The sensor insulating layer TINS may be disposed on the third buffer layer BF3. The sensor insulating layer TINS may be formed of an inorganic layer, for example, a silicon nitride layer, a silicon oxynitride layer, a silicon oxide layer, a titanium oxide layer, or an aluminum oxide layer.

The conductive patterns CP may be disposed on the sensor insulating layer TINS. Each of the conductive patterns CP may not overlap the emission areas RE, GE and BE. Each of the conductive patterns CP may overlap the bank 180 in the third direction (z-axis direction). Each of the conductive patterns CP may be made up of a single layer of molybdenum (Mo), titanium (Ti), copper (Cu) or aluminum (Al), or may be made up of a stack structure of aluminum and titanium (Ti/Al/Ti), a stack structure of aluminum and ITO (ITO/Al/ITO), an APC alloy and a stack structure of an APC alloy and ITO (ITO/APC/ITO).

As shown in FIG. 176, the display panel 300 may include a digitizer layer DGT that senses a touch input of the digitizer input unit on the lower surface of the display panel 300 instead of the sensor electrodes SE.

FIG. 177 is a perspective view showing an example of the ultrasonic sensor of FIGS. 170 and 171. FIG. 178 is a view showing an arrangement of vibration elements of the ultrasonic sensor of FIG. 177. FIG. 177 shows a first support substrate 5301, first ultrasound electrodes 5303 and vibration elements 5305 of the ultrasound sensor 530 for convenience of illustration.

Referring to FIGS. 177 and 178, the ultrasonic sensor 530 may include a first support substrate 5301, a second support substrate 5302, first ultrasound electrodes 5303, second ultrasound electrodes 5304, vibration elements 5305, and a filler 5306.

The first support substrate 5301 and the second support substrate 5302 may be disposed so that they face each other. each of the first support substrate 5301 and the second support substrate 5302 may be formed as a plastic film or glass.

The first ultrasound electrodes 5303 may be disposed on a surface of the first support substrate 5301 facing the second support substrate 5302. The first ultrasonic electrodes 5303 may be spaced apart from one another. The vibration elements 5305 arranged or disposed in the first direction (x-axis direction) may be electrically connected to the same first ultrasonic electrode 5303. The first ultrasonic electrodes 5303 may be arranged or disposed in the second direction (y-axis direction).

The second ultrasound electrodes 5304 may be disposed on a surface of the second support substrate 5302 facing the first support substrate 5301. The second ultrasonic electrodes 5304 may be spaced apart from one another. The vibration elements 5305 arranged or disposed in the second direction (y-axis direction) may be electrically connected to the same second ultrasonic electrode 5304. The second ultrasonic electrodes 5304 may be arranged or disposed in the first direction (x-axis direction).

The vibration elements 5305 may be arranged or disposed in a matrix. The vibration elements 5305 may be spaced apart from one another. Each of the vibration elements 5305 may have a substantially quadrangular column shape or a substantially cuboid shape extended in the third direction (z-axis direction). It is, however, to be understood that the disclosure is not limited thereto. For example, each of the vibration elements 5305 may have a substantially cylindrical or substantially elliptical column shape. The thickness of the vibration elements 5305 in the third direction (z-axis direction) may be approximately 100 μm. Each of the vibration elements 5305 may be a piezoelectric element that vibrates using a piezoelectric material that contracts or expands according to an electrical signal. For example, each of the vibration elements 5305 may include one of poly vinylidene fluoride (PVDF), a polarized fluoropolymer, a PVDF-TrFE copolymer, plumbum zirconate titanate (PZT), and an electroactive polymer.

The spaces between the vibration elements 5305 may be filled with the filler 5306 in the first direction (x-axis direction) and the second direction (y-axis direction). The filler 5306 may be made of a flexible material so that each of the vibration elements 5305 can contract or expand. The filler 5306 may include an insulating material to insulate the vibration elements 5305 from one another.

FIG. 179 is a view showing an example a method of vibrating a vibration element of the ultrasonic sensor of FIG. 177.

Referring to FIG. 179, the vibration element 5305 may include a first surface, a second surface, a third surface, and a fourth surface. The first surface may be the upper surface of the vibration element 5305, the second surface may be the lower surface of the vibration element 5305, the third surface may be the right surface of the vibration element 5305, and the fourth surface may be the left surface of the vibration element 5305.

Similarly to FIG. 169, if the lower region of the vibration element 5305 that may be adjacent to the second surface has the negative polarity and the upper region of the vibration element 5305 that may be adjacent to the first surface has the positive polarity, the vibration element 5305 may expand in a case that the driving voltage of negative polarity may be applied to the second ultrasonic electrode 5304 and the driving voltage of the positive polarity may be applied to the first ultrasonic electrode 5303. In a case that the driving voltage having the negative polarity may be applied to the first ultrasonic electrode 5303 and the driving voltage having the positive polarity may be applied to the second ultrasonic electrode 5304, the vibration element 5305 may contract.

In a case that a pressure (force) is applied to the first surface and the second surface of the vibration element 5305, the vibration element 5305 contracts, and a voltage proportional to the applied pressure (force) may be detected by the second ultrasonic electrode 5304 in contact with the first surface and the first ultrasonic electrode 5303 in contact with the second surface.

As shown in FIG. 179, each of the vibration elements 5305 of the ultrasonic sensor 530 vibrates by an AC voltage, and thus the ultrasonic sensor 530 may output ultrasonic waves of 20 MHz or higher.

FIG. 180 is a view showing the first ultrasound electrodes, the second ultrasound electrodes and vibration elements of the ultrasound sensor of FIG. 177.

Referring to FIG. 180, the first ultrasound electrodes 5303 may be extended the first direction (x-axis direction) and may be arranged or disposed in the second direction (y-axis direction). The first ultrasonic electrodes 5303 may be arranged or disposed side by side in the first direction (x-axis direction). The first ultrasonic electrodes 5303 may be electrically connected to the second surface of each of the vibration elements 5305 arranged or disposed in the first direction (x-axis direction). The second surface of each of the vibration elements 5305 may be the lower surface thereof.

The second ultrasonic electrodes 5304 may be extended in the second direction (y-axis direction) and may be arranged or disposed in the first direction (x-axis direction). The second ultrasonic electrodes 5304 may be arranged or disposed side by side in the second direction (y-axis direction). The second ultrasonic electrodes 5304 may be electrically connected to the first surface of each of the vibration elements 5305 arranged or disposed in the second direction (y-axis direction). The first surface of the vibration element 5305 may be the upper surface thereof.

A first ultrasonic voltage is applied to the first ultrasonic electrode 5303 disposed in the $M^{th}$ row, and a second ultrasonic voltage is applied to the second ultrasonic electrode 5304 disposed in the Nth column, so that the vibration element 5305 disposed in the $M^{th}$ row and $N^{th}$ column may vibrate, where M and N are positive integers. At this time, the first ultrasonic electrodes 5303 disposed in other rows and the second ultrasonic electrodes 5304 disposed in other columns may be grounded or opened to have a high impedance.

FIG. 181 is a view showing an example of a finger placed to overlap an ultrasonic sensor in order to recognize a fingerprint of the finger.

Referring to FIG. 181, the fingerprint of a finger F may include ridges RID and valleys VLE. In a case that a person touches the cover window 100 with the finger F for fingerprint recognition, the ridges RID may be in direct contact with the cover window 100 whereas the valleys VLE may not.

The ultrasonic sensor 530 may operate in an impedance mode, an attenuation voltage mode, a pressure sensing mode, an echo mode, or a Doppler shift mode.

The operation of the ultrasonic sensor 530 in the impedance mode will be described with reference to FIGS. 182 and 183.

FIGS. 182 and 183 are graphs showing the impedance of a vibration element according to frequency acquired from the ridges and valleys of a person's fingerprint.

As shown in FIG. 182, the impedance of the vibration element 5305 overlapping the valleys VLE of the fingerprint in the third direction (z-axis direction) may be approximately 800Ω at a frequency of approximately 19.8 MHz, and approximately 80,000Ω at a frequency of approximately 20.2 MHz. As shown in FIG. 183, the impedance of the vibration element 5305 overlapping the ridges RID of the fingerprint in the third direction (z-axis direction) may be approximately 2,000Ω at a frequency of approximately 19.8 MHz, and approximately 40,000Ω at a frequency of approximately 20.2 MHz. For example, the impedance of the vibration element 5305 may vary between a frequency of approximately 19.8 MHz and a frequency of approximately 20.2 MHz depending on the vibration element 5305 overlap in the third direction (z-axis direction) whether the ridges RID or the valleys VLE of the fingerprint. Therefore, by calculating the impedance according to the fingerprint of the finger F at least two frequencies, it may be possible to determine whether the vibration element 5305 overlaps the ridges RID or valleys VLE of the fingerprint in the third direction (z-axis direction).

The operation of the ultrasonic sensor 530 in the attenuation voltage mode will be described with reference to FIG. 184.

As shown in FIG. 184, the ultrasonic sensing signal output from the vibration element 5305 may become weak over time. Therefore, the voltage of the ultrasonic sensing signal output from the vibration element 5305 may be smaller than the voltage of the ultrasonic driving signal applied to the vibration element 5305 for the vibration element 5305 to output ultrasonic waves.

The ultrasonic waves output from the vibration elements 5305 overlapping with the ridges RID of the fingerprint in the third direction (z-axis direction) may be absorbed by the finger F, whereas ultrasonic waves output from the vibration elements 5305 overlapping with the valleys VLE of the fingerprint in the third direction (z-axis direction) may be reflected at the boundary between the cover window 100 and the air because the air between the valleys VLE and the cover window 100 works as a barrier. Therefore, the ultrasonic energy detected by the vibration elements 5305 overlapping with the ridges RID of the fingerprint in the third direction (z-axis direction) may be smaller than the ultrasonic energy detected by the vibration elements 5305 overlapping with the valleys VLE of the fingerprint in the third direction (z-axis direction).

As a result, the ratio of the voltage of the ultrasonic sensing signal detected by the vibration elements 5305 to the voltage of the ultrasonic driving signal applied to the vibration elements 5305 overlapping the ridges RID of the fingerprint in the third direction (z-axis direction) may be smaller than the ratio of the voltage of the ultrasonic sensing signal detected by the vibration elements 5305 to the voltage of the ultrasonic driving signal applied to the vibration elements 5305 overlapping the valleys VLE of the fingerprint in the third direction (z-axis direction). For example, the ratio of the voltage of the ultrasonic sensing signal detected by the vibration elements 5305 to the voltage of the ultrasonic driving signal applied to the vibration elements 5305 overlapping the ridges RID of the fingerprint in the third direction (z-axis direction) may be 1/10, while the ratio of the voltage of the ultrasonic sensing signal detected by the vibration elements 5305 to the voltage of the ultrasonic driving signal applied to the vibration elements 5305 overlapping the valleys VLE of the fingerprint in the third direction (z-axis direction) may be 1/2. Therefore, by calculating the ratio of the voltage of ultrasonic sensing signal detected by the vibration elements 5305 to the voltage of the ultrasonic driving signal applied to the vibration elements 5305, it may be possible to determine whether the vibration elements 5305 overlap the ridges RID or the valleys VLE of the fingerprint in the third direction (z-axis direction).

FIG. 185 is a view showing an example of an ultrasonic sensor in a pressure sensing mode. The operation of the ultrasonic sensor 530 in the pressure sensing mode will be described with reference to FIG. 185.

Referring to FIG. 185, the sensor driver 340 electrically connected to the ultrasonic sensor 530 may include a diode 1341 electrically connected to second ultrasonic electrodes 5304 of the vibration elements 5305, a capacitor 1342 disposed between an anode of the diode 1341 and first ultrasound electrodes 5303 of the vibration elements 5305, a switch 1343 that outputs a positive voltage (+) according to the voltage at the anode of the diode 1341, and a voltage source 1344 that outputs the positive voltage (+) and the ground voltage.

In a case that a user applies pressure to the vibration elements 5305 using a finger or the like, a voltage may be generated in the second ultrasonic electrodes 5304 electrically connected to the first surfaces of the vibration elements 5305, so that charges are accumulated in the capacitor 1342. In a case that a sufficient amount of charges may be accumulated in the capacitor 1342, the switch 1343 may be turned on. In a case that the switch 1343 is turned on, a positive voltage (+) of the voltage source 1344 may be output.

As shown in FIG. 185, in a case that the positive voltage (+) is output by the switch 1343, the sensor driver 340 may determine that pressure is applied from a user to the ultrasonic sensor 530. Therefore, the ultrasonic sensor 530 can work as a pressure sensor in the pressure sensing mode.

FIG. 186 is a waveform diagram showing an ultrasonic sensing signal sensed by a vibration element in an echo mode and a Doppler shift mode. FIG. 187 is a view showing an example of an ultrasound sensor and bones of a person's finger in the echo mode. FIG. 188 is a view showing an example of an ultrasound sensor and arterioles of a person's finger in the Doppler shift mode. The operation of the ultrasonic sensor 530 in the echo mode will be described with reference to FIGS. 186 and 187. In a case that the ultrasonic sensor 530 operates in the echo mode, biometric data such as a profile of the lower portion of the bones BN of the finger F may be obtained.

Referring to FIG. 186, the ultrasonic sensor 530 vibrates by an ultrasonic driving signal and outputs ultrasonic waves. While the ultrasonic waves propagate through the finger F, they may be reflected by a variety of features of the finger F, such as the bone BN of the finger F, the nail of the finger F, and blood flowing through the finger F. The ultrasonic waves reflected by the features of the finger F and detected by the ultrasonic sensor 530 may be output as echo signals ECHO from the ultrasonic sensor 530 as shown in FIG. 186.

Referring to FIG. 187, ultrasonic waves output from the vibration elements 5305 of the ultrasonic sensor 530 may be reflected by the bone BN of the finger F and then detected by the vibration elements 5305. The echo period PECHO from the time in a case that ultrasonic waves are output from the vibration elements 5305 of the ultrasonic sensor 530 to the time in a case that the ultrasonic waves reflected from the bone BN of the finger F is detected by the vibration elements 5305 may be proportional to the minimum distance DECHO from the vibration elements 5305 of the ultrasonic sensor 530 to the bone BN of the finger F. Therefore, the profile of the lower portions of the bones BN of the finger F over different echo periods PECHO of the vibration elements 5305 may be obtained.

The operation of the ultrasonic sensor 530 in the Doppler shift mode will be described with reference to FIGS. 186 and 188. In a case that the ultrasonic sensor 530 operates in the Doppler shift mode, biometric data such as arterioles ARTE blood flow of the finger F may be obtained. Biometric data such as arterial blood flow may be used to determine a user's emotional state or mental state.

Referring to FIG. 188, the finger F may include arterioles ARTE extended in the horizontal direction HR and capillaries CAPI branching from the arterioles ARTE. To receive the backscattered Doppler shift signals from red blood cells flowing through the arterioles ARTE, the directional beam patterns transmitted/received by the vibration elements 5305 of the ultrasonic sensor 530 should form at least one overlapping area OVL. To this end, the ultrasonic sensor 530 may include a transmission opening and a reception opening.

The spacing between the transmission opening and the reception opening may be approximately 300 μm. In a case that the ultrasonic waves output from the vibration elements 5305 of the ultrasonic sensor 530 passes through the transmission opening, they may be inclined by a sixth angle θ6 from the horizontal direction HR toward the third direction (z-axis direction). After passing through the transmission opening, some of the ultrasonic waves may be reflected off the arterioles ARTE and incident on the reception opening that may be inclined by the sixth angle θ6 from the horizontal direction HR toward the third direction (z-axis direction). In this manner, the ultrasonic waves reflected off the arterioles ARTE may be detected by the ultrasound sensor 530 through the reception opening.

The ultrasonic waves traveling obliquely through the transmission opening may be scattered by red blood cells flowing through the arterioles ARTE and then received by the vibration elements 5305 of the ultrasonic sensor 530 disposed in the reception opening. The ultrasonic driving signal provided to the vibration elements 5305 of the ultrasonic sensor 530 disposed in the reception opening may include high voltage pulses. The ultrasonic driving signal may be provided as a reference signal for a Doppler shift detector. The Doppler shift detector may acquire Doppler shift information by combining the ultrasonic driving signal with the ultrasonic sensing signal output from the vibration elements 5305 of the ultrasonic sensor 530 disposed in the receiving opening. Any circuit for implementing the Doppler shift detector known in the art may be employed.

FIG. 189 is a view showing an example of a lineless biometric device including the ultrasonic sensor of FIG. 177. FIG. 189 shows an application of a lineless biometric device for electronic commerce transactions.

Referring to FIG. 189, the lineless biometric device including an ultrasonic sensor 530 may be powered by a battery and may include an antenna for lineless communications with other devices. The lineless biometric device may transmit information to other devices through the antenna and receive information from the other devices.

Initially, a user's fingerprint who wants to purchase goods is acquired using the lineless biometric device. Subsequently, the lineless biometric device transmits the user's fingerprint to a cash register, and the cash register transmits the user's fingerprint to a third-party verification service. The third-party verification service compares the received fingerprint data with fingerprint data stored in the database to identify the buyer. The buyer's identification number may be sent to the cash register or to a credit card service. The credit card service may use the data transmitted from the third-party verification service to approve the transaction information received from the cash register to thereby prevent illegal use of the credit card. Once the cash register receives the buyer's identity and authentication that buyer is authorized for the credit card service, the cash register may notify the lineless biometric device that it may transmit the credit card number. Subsequently, the cash register may send the credit card number to the credit card service, and the credit card service may transfer the money to the seller's bank account to complete the transaction.

FIG. 189 shows an application of the lineless biometric device used as an electronic signature device. It is to be understood that the disclosure is not limited thereto.

FIG. 190 is a view showing applications of a lineless biometric device including the ultrasonic sensor of FIG. 177.

Referring to FIG. 190, the lineless biometric device may be used for building access control, law enforcement, e-commerce, financial transaction security, attendance monitoring, access control to legal staff and/or medical records, transportation security, email signature, credit and ATM card use control, file security, computer network security, alarm control, individual identification, recognition and verification, by way of non-limiting example, within the spirit and the scope of the disclosure.

FIG. 190 shows some useful applications of the lineless biometric device, and the disclosure is not limited thereto.

FIG. 191 is a side view showing another example of the ultrasonic sensor of FIGS. 170 and 171. FIG. 192 is a schematic cross-sectional view showing an example of the ultrasonic sensor of FIG. 191.

Referring to FIGS. 191 and 192, an ultrasonic sensor 530' may include an ultrasonic output unit 1531, an ultrasonic sensing unit 1532, a lens unit 1533, a first ultrasonic transmission medium 1534, and a second ultrasonic transmission medium 1535.

The ultrasonic output unit 1531 may include a piezoelectric element that vibrates using a piezoelectric material that contracts or expands according to an electrical signal to output ultrasonic waves. The ultrasonic output unit 1531 may vibrate the piezoelectric element to output ultrasonic waves. The ultrasonic waves output from the ultrasonic output unit 1531 may be plane waves.

The ultrasonic sensing unit 1532 may include ultrasonic sensing elements 1532A that may sense reflected ultrasonic waves US. The ultrasonic sensing elements 1532A may be arranged or disposed in a matrix. Each of the ultrasonic sensing elements 1532A of the ultrasonic sensing unit 1532 may output an ultrasonic sensing signal according to the energy of the incident ultrasonic waves US.

Each of the piezoelectric elements of the ultrasonic output unit 1531 and the ultrasonic sensing elements 1532A of the ultrasonic sensing unit 1532 may include one of poly vinylidene fluoride (PVDF), a polarized fluoropolymer, a PVDF-TrFE copolymer, plumbum zirconate titanate (PZT), and an electroactive polymer.

The lens unit 1533 may include small lenses LEN. The small lenses LEN may be arranged or disposed in a matrix. The small lenses LEN may overlap the ultrasonic sensing elements 1532A in the third direction (z-axis direction), respectively. Each of the small lenses LEN may include a convex lens and a concave lens. Each of the small lenses LENS may focus the reflected ultrasound US on the ultrasound sensing elements 1532A. The lens unit 1533 may include polystyrene, acrylic resin, or silicone rubber, for example.

The first ultrasound transmission medium 1534 may be disposed between the ultrasound output unit 1531 and the lens unit 1533. The second ultrasound transmission medium 1535 may be disposed between the ultrasound sensing unit 1532 and the lens unit 1533. The first ultrasound transmission medium 1534 and the second ultrasound transmission medium 1535 may be oil, gel, or plastisol.

As shown in FIGS. 191 and 192, ultrasonic waves US output from the ultrasound output unit 1531 may propagate toward a person's finger F placed on the cover window 100. Since the ridges RID of the fingerprint of the finger F are in contact with the cover window 100, most of the ultrasonic energy is absorbed by the finger F, and a part of the ultrasonic energy may be reflected from the finger F. On the other hand, since the valleys VLE of the fingerprint of the finger F are not in contact with the cover window 100, the air between the valleys VLE of the fingerprint and the cover window 100 works as a barrier. Therefore, most of the ultrasonic energy may be reflected at the boundary between the cover window 100 and the air. Therefore, the reflected ultrasonic energy detected by the ultrasonic sensing element 1532A overlapping with the ridges RID of the fingerprint in the third direction (z-axis direction) may be smaller than the reflected ultrasonic energy detected by the ultrasonic sensing element 1532A overlapping with the valleys VLE of the fingerprint in the third direction (z-axis direction).

FIG. 193 is a schematic cross-sectional view showing another example of the ultrasonic sensor of FIG. 191.

The embodiment of FIG. 193 may be different from the embodiment of FIG. 192 in that a lens unit 1533 may not include small lenses LENS associated with the ultrasonic sensing elements 1532A of the ultrasonic sensing unit 1532 but may include a first lens 1533A and a second lens 1533B.

Referring to FIG. 193, the ultrasonic waves US output from the ultrasound output unit 1531 may be reflected off a person's finger F. In a case that the ultrasonic waves US reflected from the person's finger F propagate from the first lens 1533A toward the first ultrasound transmission medium 1534, they may be refracted at the first lens 1533A so that they are focused on the focal length of the first lens 1533A. The interface between the first lens 1533A and the first ultrasound transmission medium 1534 may be a convex surface that may be convex upward. The distance between the first lens 1533A and the second lens 1533B may be smaller than the focal length of the first lens 1533A. The ultrasonic waves US refracted by the first lens 1533A may propagate toward the second lens 1533B.

In a case that the ultrasonic waves US propagate from the second lens 1533B toward the second ultrasound transmission medium 1535, they may be refracted at the second lens 1533B so that they are focused on the focal length of the second lens 1533B. The interface between the second lens 1533B and the second ultrasound transmission medium 1535 may be a convex surface that may be convex upward. The distance between the second lens 1533B and the ultrasonic sensing unit 1532 may be smaller than the focal length of the second lens 1533B. The ultrasonic waves US refracted by the second lens 1533B may propagate toward the ultrasonic sensing unit 1532.

Incidentally, since the ultrasonic waves US reflected from the person's finger F is concentrated at the first lens 1533A and the second lens 1533B of the lens unit 1533, the length of the ultrasonic sensing unit 1532 in the horizontal direction HR may be smaller than the length of the ultrasonic output unit 1531.

FIG. 194 is a schematic cross-sectional view showing another example of the ultrasonic sensor of FIG. 191.

An embodiment of FIG. 194 may be different from an embodiment of FIG. 192 in that an ultrasonic output unit 1531 and an ultrasonic sensing unit 1532 may be disposed on the upper surface of the ultrasonic sensor 530', and that the ultrasonic sensor 530' may include an elliptical reflecting member 1536 instead of the lens unit 1533.

Referring to FIG. 194, the elliptical reflecting member 1536 may include a polystyrene surface layer that has been processed with a reflective finish or a metal surface layer such as aluminum or steel. Alternatively, the surface layer of the elliptical reflecting member 1536 may include glass or acrylic resin that has been processed with a reflective finish.

As shown in FIG. 194, the ultrasound output unit 1531 may be located or disposed at a first focus of the ellipsoid formed by the elliptical reflecting member 1536, and the ultrasound sensing unit 1532 may be located or disposed at a second focus of the ellipsoid. Accordingly, the ultrasonic waves US output from the ultrasound output unit 1531 may be reflected by the finger F, and the reflected ultrasonic waves US may be reflected by the elliptical reflecting member 1536 and propagate toward the ultrasound sensing unit 1532.

FIG. 195 is a schematic cross-sectional view showing another example of the ultrasonic sensor of FIG. 191.

An embodiment of FIG. 195 may be different from an embodiment of FIG. 192 in that an ultrasonic sensing unit 1532 may be disposed on a side surface of the ultrasonic sensor 530' rather than the lower surface, and that the ultrasonic sensor 530' may include an inclined reflecting member 1537 inclined by a predetermined angle instead of the lens unit 1533.

Referring to FIG. 195, the inclined reflecting member 1537 may be inclined by a seventh angle θ7 with respect to the fourteenth direction DR14. The fourteenth direction DR14 may be a horizontal direction HR perpendicular to the third direction (z-axis direction).

The inclined reflecting member 1537 may include a polystyrene surface layer that has been process with a reflective finish or a metal surface layer such as aluminum or steel. Alternatively, the surface layer of the inclined reflecting member 1537 may include glass or acrylic resin that has been processed with a reflective finish.

As shown in FIG. 195, the ultrasonic output unit 1531 may overlap the inclined reflecting member 1537 in the third direction (z-axis direction). The ultrasonic sensing unit 1532 may overlap the inclined reflecting member 1537 in the fourteenth direction DR14. Accordingly, the ultrasonic waves US output from the ultrasonic output unit 1531 may be reflected by the finger F, and the ultrasonic waves US incident on the inclined reflecting member 1537 in the third direction (z-axis direction) may be reflected by the inclined reflecting member 1537 to propagate toward the ultrasonic sensing unit 1532.

FIG. 196 is a schematic cross-sectional view showing another example of the ultrasonic sensor of FIG. 191.

An embodiment of FIG. 196 may be different from an embodiment of FIG. 193 in that a lens unit 1533 may include a first lens 1533A' and a second lens 1533B'.

Referring to FIG. 196, the first lens 1533A' and the second lens 1533B' of the lens unit 1533 may have the same focal length FL. The maximum distance between the first lens 1533A' and the second lens 1533B' of the lens unit 1533 may be twice the focal length FL. The interface between the first lens 1533A' and the first ultrasonic transmission medium 1534 may be a convex surface that may be convex upward, while the interface surface between the second lens 1533B' and the first ultrasonic transmission medium 1534 may be a convex surface that may be convex downward.

The ultrasonic waves US which are output from the ultrasound output unit 1531 and reflected by the finger F may be focused on the focal length FL from the first lens 1533A', and then may propagate in a direction parallel to the third direction (z-axis direction) by the second lens 1533B'. Accordingly, an inverted fingerprint of the fingerprint of the finger F may be detected by the ultrasonic sensing unit 1532.

FIG. 197 is a schematic cross-sectional view showing another example of the ultrasonic sensor of FIG. 191.

An embodiment of FIG. 197 may be different from an embodiment of FIG. 196 in that a lens unit 1533 may include a single lens 1533A".

Referring to FIG. 197, the distance between the lens 1533A" and the ultrasonic sensing unit 1532 may be smaller than the focal length of the lens 1533A". The ultrasonic waves US which are output from the ultrasound output unit 1531 and reflected by the finger F may be focused on the focal length FL from the first lens 1533A". Accordingly, the length of the ultrasonic sensing unit 1532 in one of the horizontal directions HR may be smaller than the length of the ultrasonic output unit 1531 in the direction.

FIG. 198 is a schematic cross-sectional view showing another example of the ultrasonic sensor of FIG. 191.

An embodiment of FIG. 198 may be different from an embodiment of FIG. 197 in that the distance between the lens 1533A" and the ultrasonic sensing unit 1532 may be longer than the focal length FL of the lens 1533A".

Referring to FIG. 198, the distance between the lens 1533A" and the ultrasonic sensing unit 1532 may be longer than the focal length FL of the lens 1533A" and shorter than twice the focal length FL. Accordingly, an inverted fingerprint of the fingerprint of the finger F may be detected by the ultrasonic sensing unit 1532. The length of the ultrasonic sensing unit 1532 in one of the horizontal directions HR may be smaller than the length of the ultrasonic output unit 1531 in the direction.

FIG. 199 is a schematic cross-sectional view showing another example of the ultrasonic sensor of FIG. 191.

An embodiment of FIG. 199 may be different from an embodiment of FIG. 196 in that a lens unit 1533 may include a single lens 1533A2.

Referring to FIG. 199, the ultrasonic waves US output from the ultrasound output unit 1531 may be reflected off a person's finger F. In a case that the ultrasonic waves US reflected from the person's finger F propagate from the first ultrasound transmission medium 1534 toward the lens 1533A2, they may be refracted at the lens 1533A2 so that they are focused on the focal length of the lens 1533A2. The interface between the first ultrasound transmission medium 1534 and the lens 1533A2 may be a convex surface that may be convex downward.

In a case that the ultrasonic waves US propagate from the lens 1533A2 toward the second ultrasound transmission medium 1535, they may be refracted at the lens 1533A2 so that they propagate in a direction parallel to the third direction (z-axis direction). The interface between the lens 1533A2 and the second ultrasound transmission medium 1535 may be a convex surface that may be convex upward. Accordingly, an inverted fingerprint of the fingerprint of the finger F may be detected by the ultrasonic sensing unit 1532.

The focal length formed by the interface between the first ultrasound transmission medium 1534 and the lens 1533A2 may be substantially equal to the focal length formed by the interface between the lens 1533A2 and the second ultrasound transmission medium 1535. The distance between the interface between the first ultrasound transmission medium 1534 and the lens 1533A2 and the interface between the lens 1533A2 and the second ultrasound transmission medium 1535 may be shorter than the focal length FL of the lens 1533A2.

FIG. 200 is a schematic cross-sectional view showing another example of the ultrasonic sensor of FIG. 191.

An embodiment of FIG. 200 may be different from an embodiment of FIG. 192 in that an ultrasonic output unit 1531 may be disposed on a side surface of the ultrasonic sensor 530' rather than the upper surface, and that the ultrasonic sensor 530' may include a half mirror 1538 instead of the lens unit 1533.

Referring to FIG. 200, the half mirror 1538 may be inclined by an eighth angle θ8 with respect to the eighteenth direction DR18. The eighteenth direction DR18 may be a horizontal direction HR perpendicular to the third direction (z-axis direction).

The half mirror 1538 may be a semi-transmissive plate that transmits a part of ultrasonic waves US. The half mirror 1538 may be glass, polystyrene, or acrylic resin having a semi-transmissive metal film formed on one surface. The semi-transmissive metal film may be formed as a semi-transmissive conductive material such as magnesium (Mg), silver (Ag), or an alloy of magnesium (Mg) and silver (Ag).

As shown in FIG. 200, the ultrasonic output unit 1531 may overlap the half mirror 1538 in the eighteenth direction DR18. The ultrasound output unit 1531 may output ultrasonic waves US in the eighteenth direction DR18, and the ultrasonic waves US are reflected off the half mirror 1538 and may propagate toward the upper side of the ultrasound sensor 530'. Subsequently, the ultrasonic waves US reflected off the half mirror 1538 may be reflected off the finger F placed on the ultrasound sensor 530'. The ultrasonic waves US reflected off the finger F may pass through the half mirror 1538 to propagate toward the ultrasonic sensing unit 1532.

FIG. 201 is a schematic cross-sectional view showing another example of the ultrasonic sensor of FIG. 191.

An embodiment of FIG. 201 may be different from an embodiment of FIG. 200 in that an ultrasonic sensor 530' may include a lens unit 1533 including a first lens 1533A and a second lens 1533B in the third direction (z-axis direction).

The first lens 1533A and the second lens 1533B of the lens unit 1533 shown in FIG. 201 are substantially identical to those described above with reference to FIG. 193.

Referring to FIG. 201, the ultrasonic waves US which have been reflected by the finger F and passed through the half mirror 1538 may be refracted at the first lens 1533A to be focused on the focal length of the first lens 1533A. The ultrasonic waves US refracted at the first lens 1533A may propagate toward the second lens 1533B.

Subsequently, the ultrasonic waves US may be refracted at the second lens 1533B to be focused on the focal length of the second lens 1533B. The ultrasonic waves US refracted at the second lens 1533B may propagate toward the ultrasonic sensing unit 1532.

As shown in FIG. 201, since the ultrasonic waves US reflected from the person's finger F is concentrated at the first lens 1533A and the second lens 1533B of the lens unit 1533, the length of the ultrasonic sensing unit 1532 in one of the horizontal directions HR may be smaller than the length of the ultrasonic output unit 1531 in the third direction (z-axis direction).

FIG. 202 is a schematic cross-sectional view showing another example of the ultrasonic sensor of FIG. 191.

An embodiment shown in FIG. 202 may be different from an embodiment of FIG. 196 in that an ultrasonic sensor 530' may not include the lens unit 1533.

Referring to FIG. 202, the ultrasonic output unit 1531 may be inclined by a ninth angle θ9 from a nineteenth direction DR19, while the ultrasonic sensing unit 1532 may be inclined by a tenth angle θ10 from the nineteenth direction DR19. The ultrasound output unit 1531 may output ultrasonic waves US at an eleventh angle θ11 from the third direction (z-axis direction). The ultrasonic waves US output from the ultrasound output unit 1531 may be reflected by the finger F. The ultrasonic waves US reflected by the finger F may be inclined by a twelfth angle θ12 from the third direction (z-axis direction), and thus may be incident on the ultrasound sensing unit 1532. The ninth angle θ9 may be an obtuse angle, whereas each of the tenth angle θ10, the eleventh angle θ11 and the twelfth angle θ12 may be an acute angle.

As shown in FIG. 202, the ultrasound output unit 1531 may output ultrasonic waves US obliquely to the third direction (z-axis direction), and the ultrasound sensing unit 1532 may sense the ultrasonic waves US incident obliquely to the third direction (z-axis direction), and thus the ultrasound sensor 530' may not include the lens unit 1533.

FIG. 203 is a perspective view showing another example of the ultrasonic sensor of FIGS. 170 and 171.

Referring to FIG. 203, the ultrasonic sensor 530" may include an ultrasonic sensor unit 530A for outputting ultrasonic waves and a sound output unit 530B for outputting sound. In such case, the ultrasonic sensor 530" may output not only ultrasonic waves but also sound.

The ultrasonic sensor unit 530A may be substantially identical to the ultrasonic sensor 530 described above with reference to FIGS. 177 to 190 or the ultrasonic sensor 530' described above with reference to FIGS. 191 to 202. The sound output unit 530B may be similar to the sound converters 5000 described above with reference to FIGS. 168 and 169. While the ultrasonic sensor unit 530A may include vibration elements 5305, the sound output unit 530B may include one vibration layer 5003.

FIG. 204 is a flowchart illustrating a method of recognizing a fingerprint and sensing blood flow using an ultrasonic sensor according to an embodiment of the. The method according to the embodiment shown in FIG. 204 will be described by using the ultrasonic sensor 530 described above with reference to FIGS. 177 to 190.

Referring initially to FIG. 204, an ultrasonic signal may be emitted through the vibration elements 5305 of the ultrasonic sensor 530 (step S600).

The ultrasonic sensor 530 may output ultrasonic waves by applying AC voltage having a certain frequency to the first ultrasonic electrodes 5303 disposed on the lower surface of each of the vibration elements 5305 and the second ultrasonic electrodes 5304 disposed on the upper surface of each of the vibration elements 5305 to thereby vibrating the vibration elements 5305. Since the ultrasonic sensor 530 includes a filler 5306 disposed between the vibration elements 5305 as shown in FIG. 177, ultrasonic waves generated and output from the vibration elements 5305 may overlap each other. Therefore, the energy of the ultrasonic waves output from the vibration elements 5305 may be increased toward the center of the ultrasonic sensor 530.

Secondly, the ultrasonic sensor 530 detects ultrasonic waves reflected from the fingerprint of the finger F (step S610).

The ultrasonic waves output from the vibration elements 5305 overlapping the valleys VLE of the fingerprint are mostly reflected at the interface between the cover window 100 and the air. In contrast, ultrasonic waves output from the vibration elements 5305 overlapping the ridges RID of the fingerprint may propagate into the finger F in contact with the cover window 100.

Thirdly, the fingerprint of the finger F is sensed based on the ultrasonic sensing voltages (step S620).

Each of the vibration elements 5305 of the ultrasonic sensor 530 may output an ultrasonic sensing voltage associated with the reflected ultrasonic waves. The ultrasonic sensing voltage may be increased with increasing the energy of the ultrasonic waves. Therefore, in a case that the ultrasonic sensing voltage output from each of the vibration elements 5305 is greater than a first threshold value, it may be determined that the vibration elements 5305 are in the positions overlapping the valleys VLE of the fingerprint. In a case that the ultrasonic sensing voltage output from each of the vibration elements 5305 is less than the first threshold value, it may be determined that the vibration elements 5305 are in the positions overlapping the ridges RID of the fingerprint.

Fourthly, after sensing the fingerprint of the finger F, the sensor driver 340 senses blood flow in the first area of the sensor area SA to determine whether the detected fingerprint is a biometric fingerprint (step S630).

As shown in FIG. 188, blood flow may be detected using the Doppler shift mode. In doing so, blood flow may be detected in the first area where the energy of ultrasonic waves output from the vibration elements 5305 of the ultrasonic sensor 530 is the largest. The first area may be the center of the sensor area SA.

Fifthly, if blood flow is detected in the first area, the fingerprint sensing unit generates biometric information, and determines whether the detected fingerprint matches user's fingerprint previously registered and authenticates the fingerprint (steps S640 and S650).

Sixthly, if no blood flow is detected in the first area, it is determined whether blood flow is detected in the second area larger than the first area (step S660).

If blood flow is detected in the second area, biometric information may be generated and the fingerprint may be authenticated (steps S640 and S650).

Seventhly, if no blood flow is detected in the second area, it may be determined that the detected fingerprint is not a biometric fingerprint, thereby terminating the authentication process and operating in a secure mode (step S670).

However, in order to accurately determine whether the fingerprint is a biometric fingerprint, if no blood flow is detected in the second area, it may be determined s whether blood flow is detected in the third, fourth and fifth areas one after another.

As shown in FIG. 204, it may be possible to sense a user's fingerprint and also to determine whether the user's fingerprint is a biometric fingerprint based on the blood flow of the finger F. For example, it may be possible to increase the security level of the display device 10 by determining the blood flow of the finger together with fingerprint recognition.

What is claimed is:

1. A display device comprising:

a display panel comprising a substrate and a display layer disposed on a surface of the substrate; and an optical sensor disposed on another surface of the substrate, wherein the display layer comprises:

a first pin hole transmitting light, and a second pin hole transmitting the light and overlapping the first pin hole in a thickness direction of the substrate, the second pin hole formed in a pressure sending electrode of the display layer, and the optical sensor comprises a light-receiving area overlapping the first pin hole and the second pin hole in the thickness direction of the substrate.

2. The display device of claim 1, wherein the display layer comprises:

a light-blocking layer disposed on the substrate;

a buffer layer disposed on the light-blocking layer;

an active layer of a thin-film transistor disposed on the buffer layer and overlapping the light-blocking layer of the thin-film transistor in a thickness direction of the substrate;

a gate insulating layer disposed on the active layer;

a gate electrode of the thin-film transistor disposed on the gate insulating layer;

an interlayer dielectric layer disposed on the gate electrode; and a source electrode and a drain electrode of the thin-film transistor disposed on the interlayer dielectric layer, wherein at least one of the light-blocking layer, the gate electrode, the source electrode and the drain electrode form the first pin hole.

3. The display device of claim 2, wherein an area of the second pin hole is larger than an area of the first pin hole.

4. The display device of claim 2, wherein the pressure sensing electrode and the light-blocking layer are disposed on a same layer and comprise a same material.

5. The display device of claim 2, further comprising a pressure sensing unit that detects a change in resistance or capacitance of the pressure sensing electrode upon an application of pressure upon the pressure sensing electrode.

6. The display device of claim 1, further comprising a transparent adhesive layer that attaches the optical sensor to the another surface of the substrate.

7. The display device of claim 6, further comprising:

a light-blocking adhesive layer attached to the another surface of the substrate, the light-blocking adhesive layer being disposed on an edge of the transparent adhesive layer, wherein the light-blocking adhesive layer does not overlap the optical sensor in the thickness direction of the substrate.

8. The display device of claim 7, further comprising a light-blocking resin disposed on the light-blocking adhesive layer.

9. The display device of claim 1, further comprising:

a panel bottom cover disposed on the another surface of the substrate and comprising a cover hole where the optical sensor is disposed; and a sensor circuit board disposed on a lower surface of the optical sensor.

10. The display device of claim 9, wherein the sensor circuit board overlaps the cover hole.

11. The display device of claim 1, further comprising a pin hole array disposed between the substrate and the optical sensor and comprising an opening overlapping the first pin hole in the thickness direction of the substrate.

12. The display device of claim 1, further comprising:

a cover window disposed on the display layer; and a light source disposed below an edge of the cover window and irradiating light onto the cover window.

13. The display device of claim 12, wherein a side surface of the cover window has a rounded predetermined curvature.

14. The display device of claim 13, wherein a lower surface of the cover window comprises a light path conversion pattern that overlaps the light source in the thickness direction of the substrate and converts a path of light output from the light source.

15. The display device of claim 1, further comprising:
a digitizer layer disposed between the substrate and the optical sensor, wherein
the digitizer layer comprises:
a base film;
first electrodes disposed on a surface of the base film; and
second electrodes disposed on an opposite surface of the base film, and
the first pin hole does not overlap the first electrodes and the second electrodes in the thickness direction of the substrate.

16. A display device comprising:
a display panel comprising a substrate and a display layer disposed on a surface of the substrate; and
an optical sensor disposed on another surface of the substrate, wherein
the display layer comprises a first pin hold transmitting light, and
the optical sensor comprises a light-receiving area overlapping the first pin hole in a thickness direction of the substrate, wherein
the display layer further comprises;
alignment patterns that do not overlap the optical sensor in the thickness direction of the substrate;
a light-blocking pattern disposed between two adjacent alignment patterns in one direction in plan view; and
inspection patterns extending in the one direction and disposed between the optical sensor and the light-blocking pattern in view.

17. The display device of claim 16, wherein the alignment patterns, the light-blocking pattern, and the inspection patterns are disposed on a same layer and comprise a same material.

18. A display device comprising:
a display panel comprising a substrate and a display layer disposed on a surface of the substrate; and
an optical sensor disposed on another surface of the substrate, wherein
the display layer comprises a first pin hold transmitting light, and
the optical sensor comprises a light-receiving area overlapping the first pin hole in a thickness direction of the substrate, wherein
a side of the optical sensor is inclined by an acute angle with respect to a direction in which a side of the substrate is extended in plan view.

19. A display device comprising:
a display panel comprising a substrate and a display layer disposed on a surface of the substrate; and
an optical sensor disposed on another surface of the substrate, wherein
the display layer comprises a first pin hold transmitting light, and
the optical sensor comprises a light-receiving area overlapping the first pin hole in a thickness direction of the substrate,
the display layer further comprises:
a light-blocking layer disposed on the substrate;
a buffer layer disposed on the light-blocking layer; and
an active layer of a thin-film transistor disposed on the buffer layer and overlapping the light-blocking layer of the thin-film transistor in a thickness direction of the substrate,
the light-blocking layer forms the first pin hole, and
the display device further comprises a pin hold array disposed between the substrate and the optical sensor and comprising an opening overlapping the first pin hole in the thickness direction of the substrate.

* * * * *